US011985841B2

(12) United States Patent
Helander et al.

(10) Patent No.: US 11,985,841 B2
(45) Date of Patent: May 14, 2024

(54) PATTERNING A CONDUCTIVE DEPOSITED LAYER USING A NUCLEATION INHIBITING COATING AND AN UNDERLYING METALLIC COATING

(71) Applicant: OTI Lumionics, Inc., Mississauga (CA)

(72) Inventors: Michael Helander, Mississauga (CA); Zhibin Wang, Mississauga (CA)

(73) Assignee: OTI Lumionics Inc., Mississauga (CA)

( * ) Notice: Subject to any disclaimer, the term of this patent is extended or adjusted under 35 U.S.C. 154(b) by 0 days.

(21) Appl. No.: 18/265,634

(22) PCT Filed: Dec. 7, 2021

(86) PCT No.: PCT/IB2021/061385

§ 371 (c)(1),
(2) Date: Jun. 6, 2023

(87) PCT Pub. No.: WO2022/123431

PCT Pub. Date: Jun. 16, 2022

(65) Prior Publication Data

US 2023/0345757 A1 Oct. 26, 2023

Related U.S. Application Data

(60) Provisional application No. 63/122,421, filed on Dec. 7, 2020, provisional application No. 63/129,163, filed (Continued)

(51) Int. Cl.
*H01L 51/50* (2006.01)
*H10K 50/824* (2023.01)
(Continued)

(52) U.S. Cl.
CPC .......... *H10K 50/824* (2023.02); *H10K 71/60* (2023.02); *H10K 50/852* (2023.02)

(58) Field of Classification Search
CPC ..... H10K 50/824; H10K 71/60; H10K 50/852
See application file for complete search history.

(56) References Cited

U.S. PATENT DOCUMENTS 2,876,247 A 3/1959 Ratz et al.
3,094,536 A 6/1963 Kenney et al.
(Continued)

FOREIGN PATENT DOCUMENTS

CA 2074331 A1 1/1993
CA 2544380 C 1/2014
(Continued)

OTHER PUBLICATIONS

International Search Report and Witten Opinion for PCT Application No. PCT/IB2022/000066 dated Jun. 30, 2022.
(Continued)

*Primary Examiner* — Anthony Ho
(74) *Attorney, Agent, or Firm* — Foley & Lardner LLP

(57) ABSTRACT

A semiconductor device having a plurality of layers deposited on a substrate and extending in a first portion and a second portion of at least one lateral aspect defined by a lateral axis thereof, comprises an orientation layer comprising an orientation material, disposed on a first exposed layer surface of the device in at least the first portion; at least one patterning layer comprising a patterning material, disposed on a first exposed layer surface of the orientation layer; and at least one deposited layer comprising a deposited material, disposed on a second exposed layer surface of the device in the second portion; wherein the first portion is substantially devoid of a closed coating of the deposited material.

82 Claims, 76 Drawing Sheets

Related U.S. Application Data on Dec. 22, 2020, provisional application No. 63/141,857, filed on Jan. 26, 2021.

(51) Int. Cl.
*H10K 71/60* (2023.01)
*H10K 50/852* (2023.01)

(56) References Cited

U.S. PATENT DOCUMENTS 3,169,933 A 2/1965 Kenney
3,597,457 A 8/1971 Robinson et al.
3,928,480 A 12/1975 Tabushi et al.
3,978,030 A 8/1976 Resnick
4,022,928 A 5/1977 Piwcyzk
4,119,635 A 10/1978 Omodei-Sale et al.
4,188,486 A 2/1980 Tsukamoto et al.
4,379,155 A 4/1983 Omodei-Sale et al.
4,431,786 A 2/1984 Squire
4,594,399 A 6/1986 Anderson et al.
4,622,179 A 11/1986 Eda
4,749,637 A 6/1988 Hayashida et al.
4,803,005 A 2/1989 Juhlke et al.
4,832,983 A 5/1989 Nagatomi et al.
4,927,735 A 5/1990 Era et al.
4,960,538 A 10/1990 Itoh et al.
5,009,986 A 4/1991 Kawaguchi et al.
5,015,758 A 5/1991 Pilgrim et al.
5,034,309 A 7/1991 Tai et al.
5,061,596 A 10/1991 Albert et al.
5,075,203 A 12/1991 Katayose et al.
5,219,706 A 6/1993 Tai et al.
5,232,635 A 8/1993 Van Moer et al.
5,260,435 A 11/1993 Sawada et al.
5,378,589 A 1/1995 Sawada et al.
5,399,936 A 3/1995 Namiki et al.
5,420,301 A 5/1995 Ackermann et al.
5,428,152 A 6/1995 Hayashida et al.
5,446,142 A 8/1995 Itoh et al.
5,512,095 A 4/1996 Sens et al.
5,484,685 A 6/1996 Tai et al.
5,550,290 A 8/1996 Mizuta et al.
5,652,285 A 7/1997 Coggio et al.
5,824,799 A 10/1998 Buechler et al.
5,883,177 A 3/1999 Colaianna et al.
5,895,228 A 4/1999 Biebuyck et al.
5,916,481 A 6/1999 Willey
5,935,721 A 8/1999 Shi et al.
5,997,754 A 12/1999 Yamaha et al.
6,016,033 A 1/2000 Jones et al.
6,171,715 B1 1/2001 Sato et al.
6,251,687 B1 6/2001 Buechler et al.
6,285,039 B1 9/2001 Kobori et al.
6,329,490 B1 12/2001 Yamashita et al.
6,361,886 B2 3/2002 Shi et al.
6,407,408 B1 6/2002 Zhou et al.
6,465,115 B2 10/2002 Shi et al.
6,468,590 B2 10/2002 Biebuyck et al.
6,472,468 B1 10/2002 Omura
6,517,958 B1 2/2003 Sellinger et al.
6,538,374 B2 3/2003 Hosokawa
6,608,009 B2 8/2003 Akada et al.
6,635,364 B1 10/2003 Igarashi
6,638,644 B2 10/2003 Zheng
6,682,785 B2 1/2004 Wingen et al.
6,787,468 B2 9/2004 Kim et al.
6,794,061 B2 9/2004 Liao et al.
6,835,950 B2 12/2004 Brown et al.
6,852,429 B1 2/2005 Li et al.
6,878,469 B2 4/2005 Yoon et al.
6,899,963 B1 5/2005 Zheng et al.
6,900,470 B2 5/2005 Kobayashi et al.
6,927,270 B2 8/2005 Lichtenhan et al.
6,995,035 B2 2/2006 Cok et al.
7,018,713 B2 3/2006 Padiyath
7,053,255 B2 5/2006 Ikeda et al.
7,056,601 B2 6/2006 Cosimbescu et al.
7,099,299 B2 8/2006 Liang et al.
7,105,298 B2 9/2006 Liu et al.
7,115,684 B2 10/2006 Vanspeybroeck et al.
7,166,240 B2 1/2007 Ishida et al.
7,169,482 B2 1/2007 Aziz
7,173,276 B2 2/2007 Choi et al.
7,175,815 B2 2/2007 Yamasaki et al.
7,192,659 B2 3/2007 Ricks et al.
7,193,015 B1 3/2007 Mabry et al.
7,217,683 B1 5/2007 Blanski et al.
7,252,893 B2 8/2007 Ricks et al.
7,259,267 B2 8/2007 Pleschke et al.
7,280,731 B2 10/2007 Rantala
7,319,129 B2 1/2008 Yoshida et al.
7,326,371 B2 2/2008 Conley et al.
7,361,796 B2 4/2008 Ikeda et al.
7,363,308 B2 4/2008 Dillon et al.
7,373,060 B2 5/2008 Satake et al.
7,402,948 B2 7/2008 Yamazaki et al.
7,427,783 B2 9/2008 Lee et al.
7,449,509 B2 11/2008 Marks et al.
7,449,539 B2 11/2008 Morimoto et al.
7,470,315 B2 12/2008 Vonwiller et al.
7,479,462 B2 1/2009 Rantala et al.
7,491,975 B2 2/2009 Kubota
7,495,389 B2 2/2009 Noguchi et al.
7,504,526 B2 3/2009 Kubota et al.
7,579,304 B2 8/2009 Liu et al.
7,651,787 B2 1/2010 Seo et al.
7,670,695 B2 3/2010 Wakabayashi et al.
7,674,914 B2 3/2010 Egawa et al.
7,701,132 B2 4/2010 Oh
7,728,510 B2 6/2010 Oh
7,733,009 B2 6/2010 Kondakov et al.
7,776,457 B2 8/2010 Lee et al.
7,790,892 B2 9/2010 Ikeda et al.
7,816,667 B2 10/2010 Park et al.
7,816,861 B2 10/2010 Choi et al.
7,820,864 B2 10/2010 Umemoto
7,833,632 B2 11/2010 Kawamura et al.
7,839,074 B2 11/2010 Ikeda et al.
7,839,083 B2 11/2010 Kubota
7,851,071 B2 12/2010 Yamamoto et al.
7,867,629 B2 1/2011 Yamamoto et al.
7,887,931 B2 2/2011 Cosimbescu
7,897,667 B2 3/2011 Mabry et al.
7,910,687 B2 3/2011 Busing et al.
7,919,196 B2 4/2011 Kim et al.
7,947,519 B2 5/2011 Lee et al.
7,947,974 B2 5/2011 Kondakov
7,956,351 B2 6/2011 Choi
7,973,306 B2 7/2011 Kim et al.
7,986,672 B2 7/2011 Tiedemann et al.
7,998,540 B2 8/2011 Goulding et al.
7,999,459 B2 8/2011 Chun et al.
8,004,180 B2 8/2011 Seo
8,025,815 B2 9/2011 Kawamura et al.
8,030,838 B2 10/2011 Kwak et al.
8,044,580 B2 10/2011 Yamazaki et al.
8,071,226 B2 12/2011 Je et al.
8,076,839 B2 12/2011 Kuma et al.
8,089,066 B2 1/2012 Yamazaki et al.
8,097,349 B2 1/2012 Yamamoto et al.
8,115,376 B2 2/2012 Fujioka et al.
8,174,185 B2 5/2012 Park et al.
8,217,570 B2 7/2012 Kawamura et al.
8,222,634 B2 7/2012 Lee
8,232,350 B2 7/2012 Fujita et al.
8,237,351 B2 8/2012 Sung et al.
8,257,620 B2 9/2012 Cranor et al.
8,278,378 B2 10/2012 Jung et al.
8,310,149 B2 11/2012 Lifka et al.
8,318,878 B2 11/2012 Sudo et al.
8,318,995 B2 11/2012 Kubota et al.
8,319,095 B2 11/2012 Sharma
8,343,637 B2 1/2013 Parham et al.
8,346,024 B2 1/2013 Vonwiller et al.

(56) References Cited

U.S. PATENT DOCUMENTS 8,362,469 B2 1/2013 Suh
8,399,720 B2 3/2013 Umemoto
8,518,489 B2 8/2013 Shin et al.
8,530,596 B2 9/2013 Sano et al.
8,541,113 B2 9/2013 Je et al.
8,568,902 B2 10/2013 Kubota et al.
8,568,965 B2 10/2013 Kitamura et al.
8,586,202 B2 11/2013 Imai et al.
8,586,689 B2 11/2013 Jung et al.
8,586,703 B2 11/2013 Yang et al.
8,592,053 B2 11/2013 Kawakami
8,618,595 B2 12/2013 Korgel et al.
8,629,222 B2 1/2014 Takizawa et al.
8,653,302 B2 2/2014 Umemoto
8,679,647 B2 3/2014 Pflumm et al.
8,679,656 B2 3/2014 Kobayashi et al.
8,703,303 B2 4/2014 Yamamoto et al.
8,729,530 B2 5/2014 Nagao et al.
8,759,818 B2 6/2014 LeCloux
8,766,306 B2 7/2014 Lifka et al.
8,779,655 B2 7/2014 Nishimura
8,785,006 B2 7/2014 Ikeda et al.
8,795,422 B2 8/2014 Ganapathiappan et al.
8,795,847 B2 8/2014 Heil et al.
8,795,855 B2 8/2014 Klubek et al.
8,809,838 B2 8/2014 Jeong et al.
8,816,117 B2 8/2014 Marciniec et al.
8,852,756 B2 10/2014 Vestweber et al.
8,853,675 B2 10/2014 Kubota et al.
8,859,111 B2 10/2014 Parham et al.
8,872,206 B2 10/2014 Chung et al.
8,877,356 B2 11/2014 Spindler et al.
8,883,324 B2 11/2014 Yabunouchi et al.
8,895,972 B2 11/2014 Chung et al.
8,921,840 B2 12/2014 Kim et al.
8,940,568 B2 1/2015 Mohan et al.
8,957,413 B2 2/2015 Song et al.
8,963,137 B2 2/2015 Lee et al.
8,963,414 B2 2/2015 Sawabe
8,986,852 B2 3/2015 Stoessel et al.
8,987,516 B2 3/2015 Umemoto
8,993,123 B2 3/2015 Buesing et al.
8,994,010 B2 3/2015 Choi et al.
8,999,534 B2 4/2015 Shimokawa et al.
9,006,565 B2 4/2015 Abusleme et al.
9,018,621 B2 4/2015 Park et al.
9,024,301 B2 5/2015 Kawamura et al.
9,024,307 B2 5/2015 Lee
9,040,962 B2 5/2015 Adamovich et al.
9,051,344 B2 6/2015 Lin et al.
9,064,755 B2 6/2015 Park et al.
9,076,993 B2 7/2015 Kim et al.
9,088,004 B2 7/2015 Chung et al.
9,093,403 B2 7/2015 Kim et al.
9,093,669 B2 7/2015 Park et al.
9,105,865 B2 8/2015 Chung et al.
9,105,867 B2 8/2015 Verschuuren et al.
9,113,536 B2 8/2015 Oka et al.
9,117,402 B2 8/2015 Lee et al.
9,126,970 B2 9/2015 Pflumm
9,169,274 B2 10/2015 Mizuki et al.
9,214,636 B2 12/2015 Takashima et al.
9,219,234 B2 12/2015 Kubota et al.
9,231,030 B2 1/2016 Choi et al.
9,245,934 B2 1/2016 Chung et al.
9,246,105 B2 1/2016 Sun
9,246,123 B2 1/2016 Kim et al.
9,257,654 B2 2/2016 Kawakami
9,276,220 B2 3/2016 Kim et al.
9,287,339 B2 3/2016 Lee et al.
9,293,515 B2 3/2016 Choi
9,312,312 B1 4/2016 Tsai et al.
9,331,308 B2 5/2016 Choi et al.
9,353,027 B2 5/2016 Kawamura et al.
9,444,064 B2 9/2016 Kaiser et al.
9,450,027 B2 9/2016 Pang et al.
9,450,033 B2 9/2016 Suh et al.
9,471,172 B2 10/2016 Sirois
9,478,591 B2 10/2016 Nam et al.
9,487,724 B2 11/2016 Xu et al.
9,508,957 B2 11/2016 Forrest et al.
9,515,280 B2 12/2016 Yun
9,537,116 B2 1/2017 Lamansky et al.
9,548,456 B2 1/2017 Lee et al.
9,570,471 B2 2/2017 Heo et al.
9,583,716 B2 2/2017 Ikeda
9,595,681 B2 3/2017 Mujica-Fernaud
9,608,207 B2 3/2017 Takaku et al.
9,624,193 B2 4/2017 Aihara
9,627,645 B2 4/2017 Cui et al.
9,647,042 B2 5/2017 Li et al.
9,660,195 B2 5/2017 Kawamura et al.
9,666,812 B2 5/2017 Lee et al.
9,680,108 B2 6/2017 Ito et al.
9,711,734 B2 7/2017 Kim
9,711,751 B2 7/2017 Prushinskiy et al.
9,728,726 B2 8/2017 Takaku
9,748,318 B2 8/2017 Shim et al.
9,755,165 B2 9/2017 Nishide et al.
9,776,983 B2 10/2017 Marchionni et al.
9,786,846 B2 10/2017 Kubota
9,791,760 B2 10/2017 Garcia et al.
9,793,491 B2 10/2017 Hwang et al.
9,812,657 B2 11/2017 Kravchuk et al.
9,831,457 B2 11/2017 Kang et al.
9,859,520 B2 1/2018 Kim
9,882,140 B2 1/2018 Han et al.
9,890,181 B2 2/2018 Jiang et al.
9,892,672 B2 2/2018 Lee et al.
9,896,621 B2 2/2018 Kim et al.
9,954,039 B2 4/2018 Im et al.
9,960,216 B2 5/2018 Lee et al.
9,960,386 B2 5/2018 Thompson et al.
9,966,554 B2 5/2018 Lee et al.
10,022,951 B2 7/2018 Liu et al.
10,026,906 B2 7/2018 Jung et al.
10,032,843 B2 7/2018 Lee et al.
10,062,850 B2 8/2018 Jung et al.
10,084,019 B2 9/2018 Shim et al.
10,084,150 B1 9/2018 Lou
10,090,370 B2 10/2018 Lee et al.
10,147,769 B2 12/2018 Lee et al.
10,153,450 B2 12/2018 Kawamura
10,174,059 B2 1/2019 Warner et al.
10,177,206 B2 1/2019 Jung et al.
10,181,573 B2 1/2019 Im
10,186,568 B2 1/2019 Kim et al.
10,205,101 B2 2/2019 Kubota et al.
10,224,386 B2 3/2019 Rieutort-Louis et al.
10,240,084 B2 3/2019 Molaire
10,263,185 B2 4/2019 Matsueda et al.
10,269,879 B2 4/2019 Shim et al.
10,276,641 B2 4/2019 Lou
10,297,762 B2 5/2019 Zeng et al.
10,361,375 B2 7/2019 Zeng et al.
10,442,823 B2 10/2019 Warner et al.
10,501,583 B2 12/2019 Song et al.
10,683,313 B2 1/2020 Choi et al.
10,550,226 B2 2/2020 Valsecchi et al.
10,584,137 B2 3/2020 Warner
10,700,304 B2 6/2020 Helander et al.
10,707,531 B1 7/2020 Harrup et al.
11,008,350 B2 5/2021 Diao et al.
11,040,991 B2 6/2021 Hayashi et al.
11,046,885 B2 6/2021 Kim et al.
11,145,702 B2 10/2021 Chang et al.
11,222,929 B2 1/2022 Wang et al.
11,634,578 B2 4/2023 Eckel et al.
2001/0051447 A1 12/2001 Usami
2002/0090811 A1 7/2002 Kim et al.
2002/0189392 A1 12/2002 Molstad
2003/0196987 A1 10/2003 Kung et al.
2003/0219625 A1 11/2003 Wolk et al.
2004/0018383 A1 1/2004 Aziz et al.

(56) References Cited

U.S. PATENT DOCUMENTS

2004/0058193 A1 3/2004 Hatwar
2004/0152910 A1 8/2004 Fukuoka et al.
2004/0249027 A1 12/2004 Lim et al.
2004/0249070 A1 12/2004 Lim et al.
2005/0052118 A1 3/2005 Lee et al.
2005/0070196 A1 3/2005 Colombo et al.
2005/0168140 A1 8/2005 Nakamura et al.
2005/0175770 A1 8/2005 Liao et al.
2005/0181232 A1 8/2005 Ricks et al.
2005/0211958 A1 9/2005 Conley et al.
2005/0245648 A1 11/2005 Lim et al.
2005/0261389 A1 11/2005 Bratolavsky et al.
2005/0271899 A1 12/2005 Brown et al.
2006/0019116 A1 1/2006 Conley et al.
2006/0043858 A1 3/2006 Ikeda et al.
2006/0125390 A1 6/2006 Oh
2006/0154105 A1 7/2006 Yamamoto et al.
2006/0182993 A1 8/2006 Ogata et al.
2006/0210830 A1 9/2006 Funahashi et al.
2006/0246315 A1 11/2006 Begley et al.
2007/0003785 A1 1/2007 Slusarek et al.
2007/0077349 A1 4/2007 Newman et al.
2007/0178405 A1 8/2007 Kanda et al.
2007/0252517 A1 11/2007 Owczarczyk et al.
2007/0252521 A1 11/2007 Kondakov et al.
2008/0001123 A1 1/2008 Inoue et al.
2008/0012475 A1 1/2008 Oyamada et al.
2008/0093986 A1 4/2008 Inoue et al.
2008/0103315 A1 5/2008 Egawa et al.
2008/0105865 A1 5/2008 Oyamada et al.
2008/0166593 A1 7/2008 Stoessel et al.
2008/0203905 A1 8/2008 Je et al.
2008/0265216 A1 10/2008 Hartmann et al.
2008/0286607 A1 11/2008 Nomura et al.
2008/0286610 A1 11/2008 Deaton et al.
2008/0303422 A1 12/2008 Vestweber et al.
2009/0033208 A1 2/2009 Nagayama et al.
2009/0066239 A1 3/2009 Yabunouchi
2009/0093641 A1 4/2009 Dolbier et al.
2009/0145483 A1 6/2009 Kim et al.
2009/0179196 A1 7/2009 Adachi et al.
2009/0199903 A1 8/2009 Oyamada et al.
2009/0233125 A1 9/2009 Choi et al.
2009/0236973 A1 9/2009 Yabe et al.
2009/0239986 A1 9/2009 Kim et al.
2010/0052526 A1 3/2010 Je et al.
2010/0078628 A1 4/2010 Chi et al.
2010/0080903 A1 4/2010 Tamitsuji et al.
2010/0108997 A1 5/2010 Kim et al.
2010/0113767 A1 5/2010 Gessner et al.
2010/0117028 A1 5/2010 Takeshima et al.
2010/0151180 A1 6/2010 Bravet et al.
2010/0193768 A1 8/2010 Habib
2010/0239821 A1 9/2010 Nagao et al.
2010/0244197 A1 9/2010 Arena et al.
2010/0286407 A1 11/2010 Kimura et al.
2010/0314615 A1 12/2010 Mizuki et al.
2010/0327240 A1 12/2010 Cranor et al.
2011/0006289 A1 1/2011 Mizuki et al.
2011/0091508 A1 4/2011 Esfand et al.
2011/0094889 A1 4/2011 Shin et al.
2011/0102308 A1 5/2011 Nakamura et al.
2011/0121271 A1 5/2011 Jeon et al.
2011/0156016 A1 6/2011 Kawamura et al.
2011/0175031 A1 7/2011 Matsunami et al.
2011/0186820 A1 8/2011 Kim et al.
2011/0198582 A1 8/2011 Horiuchi et al.
2011/0204772 A1 8/2011 Egawa
2011/0220886 A1 9/2011 Takeshima et al.
2011/0285276 A1 11/2011 Kadoma et al.
2011/0297923 A1 12/2011 Mizuki et al.
2011/0309307 A1 12/2011 Zeika et al.
2012/0003484 A1 1/2012 Roehrig et al.
2012/0018770 A1 1/2012 Lu et al.
2012/0032138 A1 2/2012 Kim et al.
2012/0043533 A1 2/2012 Mizuki et al.
2012/0049228 A1 3/2012 Walter et al.
2012/0056165 A1 3/2012 Kawamura et al.
2012/0091885 A1 4/2012 Kim et al.
2012/0104422 A1 5/2012 Lee et al.
2012/0112169 A1 5/2012 Mizuki et al.
2012/0126274 A1 5/2012 Jagt et al.
2012/0146030 A1 6/2012 You et al.
2012/0181520 A1 7/2012 Kim et al.
2012/0181922 A1 7/2012 Kawamura et al.
2012/0187541 A1 7/2012 Arena et al.
2012/0235561 A1 9/2012 Ikeda et al.
2012/0266939 A1 10/2012 Fortmann et al.
2013/0020561 A1 1/2013 Suzuki et al.
2013/0026526 A1 1/2013 Lahijani
2013/0049024 A1 2/2013 Choi et al.
2013/0056784 A1 3/2013 Lee et al.
2013/0112952 A1 5/2013 Adamovich et al.
2013/0153878 A1 6/2013 Mizuki et al.
2013/0175509 A1 7/2013 Kim et al.
2013/0187143 A1 7/2013 Nishimura et al.
2013/0200780 A1 8/2013 Lee
2013/0221338 A1 8/2013 Kawamura et al.
2014/0014925 A1 1/2014 Jung et al.
2014/0070236 A1 3/2014 Chen et al.
2014/0103306 A1 4/2014 Moon et al.
2014/0110680 A1 4/2014 Choe
2014/0148877 A1 5/2014 Pan et al.
2014/0159011 A1 6/2014 Suzuki et al.
2014/0168742 A1 6/2014 Hashimura et al.
2014/0183500 A1 7/2014 Ikeda et al.
2014/0186983 A1 7/2014 Kim et al.
2014/0225085 A1 8/2014 Hayashi et al.
2014/0231761 A1 8/2014 Kim et al.
2014/0239273 A1 8/2014 Mizutani et al.
2014/0246657 A1 9/2014 Kim et al.
2014/0291653 A1 10/2014 Ikeda et al.
2014/0299866 A1 10/2014 Ruske et al.
2014/0319511 A1 10/2014 Mizuki et al.
2014/0326985 A1 11/2014 Mizuki et al.
2014/0332772 A1 11/2014 Han et al.
2014/0346406 A1 11/2014 Lee et al.
2014/0346482 A1 11/2014 Mizuki et al.
2014/0353601 A1 12/2014 Cho et al.
2014/0367654 A1 12/2014 Kim et al.
2015/0036234 A1 2/2015 Ben-Yakar et al.
2015/0090989 A1 4/2015 Matsumoto et al.
2015/0097171 A1 4/2015 Kim et al.
2015/0123086 A1 5/2015 Lee et al.
2015/0144902 A1 5/2015 Do et al.
2015/0171337 A1 6/2015 Jung et al.
2015/0184104 A1 7/2015 Xu et al.
2015/0194614 A1 7/2015 Kravchuk et al.
2015/0200312 A1 7/2015 Watanabe et al.
2015/0228923 A1 8/2015 Schicktanz et al.
2015/0284580 A1 10/2015 Kawakami et al.
2015/0287846 A1 10/2015 Helander et al.
2015/0303336 A1 10/2015 Lefebvre et al.
2015/0333266 A1 11/2015 Ito et al.
2015/0376768 A1 12/2015 Veres et al.
2016/0005976 A1 1/2016 Mizuki et al.
2016/0013438 A1 1/2016 Im et al.
2016/0043325 A1 2/2016 Gorohmaru et al.
2016/0079543 A1 3/2016 Park et al.
2016/0099411 A1 4/2016 Kim et al.
2016/0104859 A1 4/2016 Kim et al.
2016/0116696 A1 4/2016 Modavis et al.
2016/0133846 A1 5/2016 Ishii et al.
2016/0149156 A1 5/2016 Kim et al.
2016/0155952 A1 6/2016 Hwang et al.
2016/0163770 A1 6/2016 Kim et al.
2016/0180763 A1 6/2016 Park et al.
2016/0181527 A1 6/2016 Mizuki et al.
2016/0181543 A1 6/2016 Ito et al.
2016/0211454 A1 7/2016 Kim et al.
2016/0211458 A1 7/2016 Ito et al.
2016/0211459 A1 7/2016 Ito et al.
2016/0222295 A1 8/2016 Lo et al.
2016/0225992 A1 8/2016 Ito et al.

(56) References Cited

U.S. PATENT DOCUMENTS

| | | | |
|---|---|---|---|
| 2016/0233437 | A1 | 8/2016 | Suzuki et al. |
| 2016/0260901 | A1 | 9/2016 | Kim et al. |
| 2016/0268520 | A1 | 9/2016 | Mizuki et al. |
| 2016/0284998 | A1 | 9/2016 | Kawamura et al. |
| 2016/0293888 | A1 | 10/2016 | Shim et al. |
| 2016/0308137 | A1 | 10/2016 | Park et al. |
| 2016/0329521 | A1 | 11/2016 | Kim et al. |
| 2016/0333137 | A1 | 11/2016 | Pan |
| 2016/0351114 | A1 | 12/2016 | Lee |
| 2016/0351638 | A1 | 12/2016 | Im et al. |
| 2016/0351818 | A1 | 12/2016 | Kim et al. |
| 2016/0372524 | A1 | 12/2016 | Yun et al. |
| 2016/0380198 | A1 | 12/2016 | Mizuki et al. |
| 2016/0380235 | A1 | 12/2016 | Kim et al. |
| 2017/0012221 | A1 | 1/2017 | Buesing et al. |
| 2017/0018733 | A1 | 1/2017 | Jin et al. |
| 2017/0033166 | A1 | 2/2017 | Shim et al. |
| 2017/0062755 | A1 | 3/2017 | Im et al. |
| 2017/0090082 | A1 | 3/2017 | Cheah et al. |
| 2017/0090083 | A1 | 3/2017 | Takishita et al. |
| 2017/0100607 | A1 | 4/2017 | Pan et al. |
| 2017/0104166 | A1 | 4/2017 | Jeong et al. |
| 2017/0117469 | A1 | 4/2017 | Ito et al. |
| 2017/0125495 | A1 | 5/2017 | Lee et al. |
| 2017/0125506 | A1 | 5/2017 | Kim |
| 2017/0125687 | A1 | 5/2017 | Ikeda et al. |
| 2017/0125703 | A1 | 5/2017 | Suzuki et al. |
| 2017/0155078 | A1 | 6/2017 | Lee |
| 2017/0170246 | A1 | 6/2017 | Im et al. |
| 2017/0179397 | A1 | 6/2017 | Kim et al. |
| 2017/0179402 | A1 | 6/2017 | Kim et al. |
| 2017/0183291 | A1 | 6/2017 | Ito et al. |
| 2017/0186831 | A1 | 6/2017 | Nam et al. |
| 2017/0197998 | A1 | 7/2017 | Pan |
| 2017/0222155 | A1 | 8/2017 | Cha et al. |
| 2017/0222188 | A1 | 8/2017 | Lee et al. |
| 2017/0237023 | A1 | 8/2017 | Kim et al. |
| 2017/0256722 | A1 | 9/2017 | Shim et al. |
| 2017/0256747 | A1 | 9/2017 | Lee et al. |
| 2017/0309822 | A1 | 10/2017 | Mizuki et al. |
| 2017/0313650 | A1 | 11/2017 | Stoessel et al. |
| 2017/0317154 | A1 | 11/2017 | Heo |
| 2017/0317284 | A1 | 11/2017 | Mizuki et al. |
| 2017/0324045 | A1 | 11/2017 | Takahashi et al. |
| 2017/0338438 | A1 | 11/2017 | Kwon et al. |
| 2017/0342318 | A1 | 11/2017 | Kim et al. |
| 2017/0357139 | A1 | 12/2017 | Smith et al. |
| 2018/0006239 | A1 | 1/2018 | Yokoyama et al. |
| 2018/0006264 | A1 | 1/2018 | Lee et al. |
| 2018/0018838 | A1 | 1/2018 | Fankhauser et al. |
| 2018/0019398 | A1 | 1/2018 | Mizuki et al. |
| 2018/0019408 | A1 | 1/2018 | Ko |
| 2018/0033362 | A1 | 2/2018 | Yamazaki et al. |
| 2018/0040685 | A1 | 2/2018 | Yeo et al. |
| 2018/0061323 | A1 | 3/2018 | Kwon et al. |
| 2018/0062088 | A1 | 3/2018 | Cho et al. |
| 2018/0062104 | A1 | 3/2018 | Kwon et al. |
| 2018/0083217 | A1 | 3/2018 | Chung et al. |
| 2018/0090063 | A1 | 3/2018 | Ying et al. |
| 2018/0102499 | A1 | 4/2018 | Pyo et al. |
| 2018/0123054 | A1 | 5/2018 | Gorohmaru et al. |
| 2018/0123055 | A1 | 5/2018 | Park et al. |
| 2018/0123078 | A1 | 5/2018 | Byun et al. |
| 2018/0127385 | A1 | 5/2018 | Jung et al. |
| 2018/0130949 | A1 | 5/2018 | Kim et al. |
| 2018/0145262 | A1 | 5/2018 | Zeng et al. |
| 2018/0148586 | A1 | 5/2018 | Reichert et al. |
| 2018/0158881 | A1 | 6/2018 | Lim et al. |
| 2018/0166518 | A1 | 6/2018 | Kim |
| 2018/0197927 | A1 | 7/2018 | Tan et al. |
| 2018/0198076 | A1 | 7/2018 | Takahashi et al. |
| 2018/0198080 | A1 | 7/2018 | Noh et al. |
| 2018/0212060 | A1 | 7/2018 | Kang et al. |
| 2018/0219058 | A1 | 8/2018 | Xiang et al. |
| 2018/0226455 | A1 | 8/2018 | Kim et al. |
| 2018/0240990 | A1 | 8/2018 | Choi et al. |
| 2018/0261797 | A1 | 9/2018 | Lee |
| 2018/0265777 | A1 | 9/2018 | Ambrosek et al. |
| 2018/0273563 | A1 | 9/2018 | Choi et al. |
| 2018/0294436 | A1 | 10/2018 | Choi et al. |
| 2018/0309071 | A1 | 10/2018 | Jeon et al. |
| 2018/0309073 | A1 | 10/2018 | Nakamura et al. |
| 2018/0309085 | A1 | 10/2018 | Park et al. |
| 2018/0315934 | A1 | 11/2018 | Nakata et al. |
| 2018/0315936 | A1 | 11/2018 | Hirade et al. |
| 2018/0323377 | A1 | 11/2018 | Mizuki et al. |
| 2018/0337219 | A1 | 11/2018 | Rhee et al. |
| 2018/0340032 | A1 | 11/2018 | Campbell et al. |
| 2018/0342682 | A1 | 11/2018 | Park et al. |
| 2018/0366678 | A1 | 12/2018 | Chi et al. |
| 2019/0013342 | A1 | 1/2019 | Kato et al. |
| 2019/0036032 | A1 | 1/2019 | Denker et al. |
| 2019/0081111 | A1 | 3/2019 | Lee et al. |
| 2019/0088204 | A1 | 3/2019 | Zhang et al. |
| 2019/0127328 | A1 | 5/2019 | Orimoto et al. |
| 2019/0130822 | A1 | 5/2019 | Jung et al. |
| 2019/0131365 | A1 | 5/2019 | Jung |
| 2019/0135827 | A1 | 5/2019 | Altenbach et al. |
| 2019/0157620 | A1 | 5/2019 | Forrest et al. |
| 2019/0207132 | A1 | 7/2019 | Park et al. |
| 2019/0207156 | A1 | 7/2019 | Gil |
| 2019/0237517 | A1 | 8/2019 | Hack |
| 2019/0250450 | A1 | 8/2019 | Li |
| 2019/0253591 | A1 | 8/2019 | Chen et al. |
| 2019/0273125 | A1 | 9/2019 | Takechi |
| 2019/0280026 | A1 | 9/2019 | Takeuchi |
| 2019/0317629 | A1 | 10/2019 | Jung et al. |
| 2019/0325805 | A1 | 10/2019 | Moon et al. |
| 2019/0340980 | A1 | 11/2019 | Yum et al. |
| 2019/0341435 | A1 | 11/2019 | Chang et al. |
| 2019/0341575 | A1 | 11/2019 | Chung et al. |
| 2019/0348627 | A1 | 11/2019 | Lee et al. |
| 2019/0355288 | A1 | 11/2019 | Choi et al. |
| 2019/0386242 | A1 | 12/2019 | Choi et al. |
| 2020/0035951 | A1 | 1/2020 | Cheon et al. |
| 2020/0044197 | A1 | 2/2020 | Shedletsky et al. |
| 2020/0064968 | A1 | 2/2020 | Kim et al. |
| 2020/0075683 | A1 | 3/2020 | Polyakov et al. |
| 2020/0075693 | A1 | 3/2020 | Polyakov et al. |
| 2020/0075864 | A1 | 3/2020 | Helander et al. |
| 2020/0099836 | A1 | 3/2020 | Chao |
| 2020/0105843 | A1 | 4/2020 | Baek et al. |
| 2020/0111401 | A1 | 4/2020 | Zhao et al. |
| 2020/0124927 | A1 | 4/2020 | Kim et al. |
| 2020/0133040 | A1 | 4/2020 | Bang et al. |
| 2020/0136077 | A1 | 4/2020 | Lee et al. |
| 2020/0159284 | A1 | 5/2020 | Mathew et al. |
| 2020/0176530 | A1 | 6/2020 | Baek |
| 2020/0194676 | A1 | 6/2020 | Chang et al. |
| 2020/0194730 | A1 | 6/2020 | Park et al. |
| 2020/0209729 | A1 | 7/2020 | Chen et al. |
| 2020/0212130 | A1 | 7/2020 | Kim et al. |
| 2020/0212131 | A1 | 7/2020 | Kim et al. |
| 2020/0219915 | A1 | 7/2020 | Kim et al. |
| 2020/0265798 | A1 | 8/2020 | Choi et al. |
| 2020/0280017 | A1 | 9/2020 | Helander et al. |
| 2020/0286972 | A1 | 9/2020 | Seo et al. |
| 2020/0295093 | A1 | 9/2020 | Thompson et al. |
| 2020/0295293 | A1 | 9/2020 | Menon et al. |
| 2020/0295307 | A1 | 9/2020 | Fusella et al. |
| 2020/0312926 | A1 | 10/2020 | Bae et al. |
| 2020/0328366 | A1 | 10/2020 | Layton et al. |
| 2020/0357871 | A1 | 11/2020 | Chung et al. |
| 2020/0363894 | A1 | 11/2020 | Park et al. |
| 2020/0365664 | A1 | 11/2020 | Jeon et al. |
| 2020/0365667 | A1 | 11/2020 | Jo et al. |
| 2020/0365674 | A1 | 11/2020 | Jeon et al. |
| 2020/0381489 | A1 | 12/2020 | Hwang et al. |
| 2020/0394964 | A1 | 12/2020 | Hyun et al. |
| 2020/0395430 | A1 | 12/2020 | Jeong et al. |
| 2020/0403024 | A1 | 12/2020 | Lin et al. |
| 2020/0409412 | A1 | 12/2020 | Kim et al. |
| 2020/0411605 | A1 | 12/2020 | Moon et al. |
| 2020/0411606 | A1 | 12/2020 | Kim et al. |

(56) References Cited

U.S. PATENT DOCUMENTS

| | | | |
|---|---|---|---|
| 2021/0013273 | A1 | 1/2021 | Jeong et al. |
| 2021/0018805 | A1 | 1/2021 | Baek et al. |
| 2021/0020704 | A1 | 1/2021 | Kim |
| 2021/0028244 | A1 | 1/2021 | Jeong et al. |
| 2021/0028248 | A1 | 1/2021 | Kim et al. |
| 2021/0036070 | A1 | 2/2021 | Jeon et al. |
| 2021/0043875 | A1 | 2/2021 | Lee et al. |
| 2021/0056884 | A1 | 2/2021 | Choi et al. |
| 2021/0057494 | A1 | 2/2021 | Chung et al. |
| 2021/0057496 | A1 | 2/2021 | Bae et al. |
| 2021/0065620 | A1 | 3/2021 | Yang et al. |
| 2021/0066648 | A1 | 3/2021 | Chung et al. |
| 2021/0066661 | A1 | 3/2021 | Kim et al. |
| 2021/0083019 | A1 | 3/2021 | Jang et al. |
| 2021/0091157 | A1 | 3/2021 | Oh et al. |
| 2021/0118961 | A1 | 4/2021 | Lee et al. |
| 2021/0126059 | A1 | 4/2021 | Chang et al. |
| 2021/0134901 | A1 | 5/2021 | Sung et al. |
| 2021/0134926 | A1 | 5/2021 | Song |
| 2021/0143231 | A1 | 5/2021 | Chae et al. |
| 2021/0143244 | A1 | 5/2021 | Kim et al. |
| 2021/0151544 | A1 | 5/2021 | Kim et al. |
| 2021/0167320 | A1 | 6/2021 | Kim et al. |
| 2021/0175297 | A1 | 6/2021 | Kim |
| 2021/0175298 | A1 | 6/2021 | Park |
| 2021/0183983 | A1 | 6/2021 | Bang et al. |
| 2021/0183986 | A1 | 6/2021 | Shin et al. |
| 2021/0183991 | A1 | 6/2021 | Shin et al. |
| 2021/0184155 | A1 | 6/2021 | Chae et al. |
| 2021/0191552 | A1 | 6/2021 | Bok et al. |
| 2021/0193688 | A1 | 6/2021 | Shin et al. |
| 2021/0193765 | A1 | 6/2021 | Kim et al. |
| 2021/0193769 | A1 | 6/2021 | Bok et al. |
| 2021/0193781 | A1 | 6/2021 | Shim et al. |
| 2021/0200366 | A1 | 7/2021 | Bok et al. |
| 2021/0202532 | A1 | 7/2021 | Kim et al. |
| 2021/0202595 | A1 | 7/2021 | Lee et al. |
| 2021/0202617 | A1 | 7/2021 | Cho |
| 2021/0202628 | A1 | 7/2021 | Kim et al. |
| 2021/0202641 | A1 | 7/2021 | Shin et al. |
| 2021/0202680 | A1 | 7/2021 | Shin et al. |
| 2021/0202683 | A1 | 7/2021 | Lee et al. |
| 2021/0202880 | A1 | 7/2021 | Kim et al. |
| 2021/0210564 | A1 | 7/2021 | Chae et al. |
| 2021/0210584 | A1 | 7/2021 | Youn et al. |
| 2021/0225292 | A1 | 7/2021 | Park et al. |
| 2021/0225958 | A1 | 7/2021 | Ko et al. |
| 2021/0225970 | A1 | 7/2021 | Ryu et al. |
| 2021/0233976 | A1 | 7/2021 | Lee |
| 2021/0240026 | A1 | 8/2021 | Yeke Yazdandoost et al. |
| 2021/0241671 | A1 | 8/2021 | Lee et al. |
| 2021/0241719 | A1 | 8/2021 | Choi et al. |
| 2021/0249492 | A1 | 8/2021 | Choi et al. |
| 2021/0249633 | A1 | 8/2021 | Fusella et al. |
| 2021/0249635 | A1 | 8/2021 | Cho et al. |
| 2021/0257419 | A1 | 8/2021 | Jang et al. |
| 2021/0257594 | A1 | 8/2021 | Kim et al. |
| 2021/0265431 | A1 | 8/2021 | Yun et al. |
| 2021/0280825 | A1 | 9/2021 | Beon et al. |
| 2021/0313410 | A1 | 10/2021 | Kim et al. |
| 2021/0320278 | A1 | 10/2021 | Chung et al. |
| 2021/0351261 | A1 | 11/2021 | Kim et al. |
| 2021/0359025 | A1 | 11/2021 | Jung et al. |
| 2021/0376007 | A1 | 12/2021 | Choi et al. |
| 2021/0376300 | A1 | 12/2021 | Moon et al. |
| 2021/0376301 | A1 | 12/2021 | Kim et al. |
| 2021/0408167 | A1 | 12/2021 | Kim et al. |
| 2022/0013749 | A1 | 1/2022 | Kim et al. |
| 2022/0025134 | A1 | 1/2022 | Wehrmann et al. |
| 2022/0045144 | A1 | 2/2022 | Lee et al. |
| 2022/0045160 | A1 | 2/2022 | Lee et al. |
| 2022/0052125 | A1 | 2/2022 | Choi et al. |
| 2022/0052291 | A1 | 2/2022 | Lee et al. |
| 2022/0068830 | A1 | 3/2022 | Lee et al. |
| 2022/0069048 | A1 | 3/2022 | Bok et al. |
| 2022/0085326 | A1 | 3/2022 | Chai et al. |
| 2022/0093697 | A1 | 3/2022 | Hong et al. |
| 2022/0102446 | A1 | 3/2022 | Baek et al. |
| 2022/0106477 | A1 | 4/2022 | Lee et al. |
| 2022/0123081 | A1 | 4/2022 | Park et al. |
| 2022/0123260 | A1 | 4/2022 | Chung et al. |
| 2022/0149316 | A1 | 5/2022 | Kim et al. |
| 2022/0223667 | A1 | 7/2022 | Choi et al. |
| 2022/0225006 | A1 | 7/2022 | Allec et al. |
| 2022/0271254 | A1 | 8/2022 | Ran et al. |
| 2022/0382067 | A1 | 12/2022 | Mermillod-Anselme et al. |
| 2022/0392963 | A1 | 12/2022 | Chen et al. |
| 2022/0398759 | A1 | 12/2022 | Schindler et al. |
| 2022/0415871 | A1 | 12/2022 | Steckel |
| 2023/0008148 | A1 | 1/2023 | Hyun et al. |
| 2023/0043940 | A1 | 2/2023 | Bae et al. |
| 2023/0048617 | A1 | 2/2023 | Kim et al. |
| 2023/0053320 | A1 | 2/2023 | Park et al. |
| 2023/0057334 | A1 | 2/2023 | Yang et al. |
| 2023/0065135 | A1 | 3/2023 | Kim et al. |
| 2023/0087411 | A1 | 3/2023 | Niu et al. |
| 2023/0087691 | A1 | 3/2023 | Chen et al. |
| 2023/0094087 | A1 | 3/2023 | Ji et al. |
| 2023/0094620 | A1 | 3/2023 | Lee et al. |
| 2023/0103050 | A1 | 3/2023 | Lee et al. |
| 2023/0105374 | A1 | 4/2023 | Jeong et al. |
| 2023/0112955 | A1 | 4/2023 | Lee et al. |
| 2023/0113586 | A1 | 4/2023 | Hong et al. |
| 2023/0117800 | A1 | 4/2023 | Kim et al. |
| 2023/0143745 | A1 | 5/2023 | Lee et al. |
| 2023/0152640 | A1 | 5/2023 | Woo et al. |
| 2023/0157052 | A1 | 5/2023 | Kim et al. |
| 2023/0157103 | A1 | 5/2023 | Lee et al. |
| 2023/0165050 | A1 | 5/2023 | Bok et al. |
| 2023/0172026 | A1 | 6/2023 | Lee |
| 2023/0172053 | A1 | 6/2023 | Ko et al. |
| 2023/0172553 | A1 | 6/2023 | An et al. |
| 2023/0276675 | A1 | 8/2023 | Jing |

FOREIGN PATENT DOCUMENTS

| | | | |
|---|---|---|---|
| CA | 2890253 | A1 | 5/2014 |
| CN | 1460682 | A | 12/2003 |
| CN | 101299419 | A | 11/2008 |
| CN | 100526288 | C | 8/2009 |
| CN | 101617064 | A | 12/2009 |
| CN | 101730938 | A | 6/2010 |
| CN | 101932618 | A | 12/2010 |
| CN | 1625552 | B | 9/2011 |
| CN | 1696124 | B | 2/2012 |
| CN | 1784388 | B | 2/2012 |
| CN | 102456713 | A | 5/2012 |
| CN | 102618042 | | 8/2012 |
| CN | 102738409 | A | 10/2012 |
| CN | 101812021 | B | 12/2012 |
| CN | 102352090 | B | 4/2013 |
| CN | 101267022 | B | 8/2014 |
| CN | 103992481 | A | 8/2014 |
| CN | 104037359 | A | 9/2014 |
| CN | 104103766 | A | 10/2014 |
| CN | 104769149 | A | 7/2015 |
| CN | 101503393 | B | 8/2015 |
| CN | 204651324 | U | 9/2015 |
| CN | 105094451 | A | 11/2015 |
| CN | 105097877 | A | 11/2015 |
| CN | 105206650 | A | 12/2015 |
| CN | 105206753 | A | 12/2015 |
| CN | 103843153 | B | 7/2016 |
| CN | 106206995 | A | 12/2016 |
| CN | 106317025 | A | 1/2017 |
| CN | 104672458 | B | 2/2017 |
| CN | 103788087 | B | 5/2017 |
| CN | 104558016 | B | 6/2017 |
| CN | 106992267 | A | 7/2017 |
| CN | 107021986 | A | 8/2017 |
| CN | 107522744 | A | 12/2017 |
| CN | 107564945 | A | 1/2018 |
| CN | 107573485 | A | 1/2018 |
| CN | 107573582 | A | 1/2018 |

(56) References Cited

FOREIGN PATENT DOCUMENTS

CN 107808895 A 3/2018
CN 105849930 B 6/2018
CN 105671525 B 8/2018
CN 108364967 A 8/2018
CN 108376019 A 8/2018
CN 108389878 A 8/2018
CN 108418928 A 8/2018
CN 105359289 B 9/2018
CN 108630830 A 10/2018
CN 108767136 A 11/2018
CN 108881531 A 11/2018
CN 108900659 A 11/2018
CN 106189093 B 12/2018
CN 109299631 A 2/2019
CN 106046688 B 3/2019
CN 109461758 A 3/2019
CN 109585663 A 4/2019
CN 109599030 A 4/2019
CN 109742132 A 5/2019
CN 109817672 A 5/2019
CN 109817694 A 5/2019
CN 109830495 A 5/2019
CN 109920931 A 6/2019
CN 109950293 A 6/2019
CN 110061014 A 7/2019
CN 110112182 A 8/2019
CN 110144551 A 8/2019
CN 110265474 A 9/2019
CN 110275358 A 9/2019
CN 110277505 A 9/2019
CN 110323259 A 10/2019
CN 110365819 A 10/2019
CN 110391348 A 10/2019
CN 110416269 A 11/2019
CN 110429117 A 11/2019
CN 110444125 A 11/2019
CN 110459175 A 11/2019
CN 110473898 A 11/2019
CN 110473988 A 11/2019
CN 110491917 A 11/2019
CN 110491918 A 11/2019
CN 110492018 A 11/2019
CN 110518034 A 11/2019
CN 110570774 A 12/2019
CN 110619813 A 12/2019
CN 110620129 A 12/2019
CN 110634930 A 12/2019
CN 110649179 A 1/2020
CN 110660823 A 1/2020
CN 110718580 A 1/2020
CN 110727142 A 1/2020
CN 110752249 A 2/2020
CN 110767662 A 2/2020
CN 110767682 A 2/2020
CN 110767708 A 2/2020
CN 110767709 A 2/2020
CN 110767713 A 2/2020
CN 110767720 A 2/2020
CN 110767736 A 2/2020
CN 110767739 A 2/2020
CN 110767830 A 2/2020
CN 110767835 A 2/2020
CN 110767836 A 2/2020
CN 110767844 A 2/2020
CN 110780375 A 2/2020
CN 110782807 B 2/2020
CN 110783384 A 2/2020
CN 110783390 A 2/2020
CN 110783394 A 2/2020
CN 110783484 A 2/2020
CN 110783485 A 2/2020
CN 110783486 A 2/2020
CN 110828533 A 2/2020
CN 110828699 A 2/2020
CN 110854176 A 2/2020
CN 210052743 U 2/2020
CN 110867523 A 3/2020
CN 110867527 A 3/2020
CN 110890412 A 3/2020
CN 110914891 A 3/2020
CN 110923625 A 3/2020
CN 110928453 A 3/2020
CN 110931538 A 3/2020
CN 110943116 A 3/2020
CN 107887404 B 4/2020
CN 110956925 A 4/2020
CN 110970480 A 4/2020
CN 110989861 A 4/2020
CN 111009619 A 4/2020
CN 111020489 A 4/2020
CN 111028678 A 4/2020
CN 111029381 A 4/2020
CN 111029382 A 4/2020
CN 111029391 A 4/2020
CN 111046599 A 4/2020
CN 111048564 A 4/2020
CN 210272432 U 4/2020
CN 111129100 A 5/2020
CN 111129102 A 5/2020
CN 111142180 A 5/2020
CN 111155055 A 5/2020
CN 111180490 A 5/2020
CN 111192902 A 5/2020
CN 210467844 U 5/2020
CN 210575958 U 5/2020
CN 111046599 B 6/2020
CN 111223908 A 6/2020
CN 111261641 A 6/2020
CN 111292617 A 6/2020
CN 111293233 A 6/2020
CN 111293235 A 6/2020
CN 111293236 A 6/2020
CN 111312795 A 6/2020
CN 111341936 A 6/2020
CN 112928147 A 6/2020
CN 210668382 U 6/2020
CN 111383543 A 7/2020
CN 111383579 A 7/2020
CN 111403621 A 7/2020
CN 111435952 A 7/2020
CN 111435953 A 7/2020
CN 111490069 A 8/2020
CN 111524460 A 8/2020
CN 111524469 A 8/2020
CN 111554716 A 8/2020
CN 111584725 A 8/2020
CN 111584748 A 8/2020
CN 109449178 B 9/2020
CN 111640882 A 9/2020
CN 111668240 A 9/2020
CN 111682055 A 9/2020
CN 111682120 A 9/2020
CN 111710798 A 9/2020
CN 111725288 A 9/2020
CN 111739921 A 10/2020
CN 111739924 A 10/2020
CN 111755493 A 10/2020
CN 111755623 A 10/2020
CN 111799374 A 10/2020
CN 111834547 A 10/2020
CN 111862875 A 10/2020
CN 111863900 A 10/2020
CN 111863911 A 10/2020
CN 110783484 B 11/2020
CN 111883559 A 11/2020
CN 111883560 A 11/2020
CN 111900190 A 11/2020
CN 111987120 A 11/2020
CN 112002749 A 11/2020
CN 110783386 B 12/2020
CN 112037704 A 12/2020
CN 112054048 A 12/2020
CN 112071886 A 12/2020
CN 112071887 A 12/2020

(56) References Cited

FOREIGN PATENT DOCUMENTS

| | | | |
|---|---|---|---|
| CN | 112103318 | A | 12/2020 |
| CN | 112159594 | A | 1/2021 |
| CN | 112234082 | A | 1/2021 |
| CN | 112271263 | A | 1/2021 |
| CN | 112310325 | A | 2/2021 |
| CN | 112382651 | A | 2/2021 |
| CN | 112420618 | A | 2/2021 |
| CN | 108807487 | B | 3/2021 |
| CN | 109728048 | B | 3/2021 |
| CN | 109860237 | B | 3/2021 |
| CN | 112436029 | A | 3/2021 |
| CN | 112436030 | A | 3/2021 |
| CN | 112436031 | A | 3/2021 |
| CN | 112436032 | A | 3/2021 |
| CN | 112562518 | A | 3/2021 |
| CN | 112635533 | A | 4/2021 |
| CN | 112687193 | A | 4/2021 |
| CN | 112838115 | A | 5/2021 |
| CN | 112861763 | A | 5/2021 |
| CN | 112864186 | A | 5/2021 |
| CN | 112864211 | A | 5/2021 |
| CN | 112864216 | A | 5/2021 |
| CN | 112864338 | A | 5/2021 |
| CN | 112885876 | A | 6/2021 |
| CN | 112885976 | A | 6/2021 |
| CN | 112928149 | A | 6/2021 |
| CN | 112928225 | A | 6/2021 |
| CN | 112951878 | A | 6/2021 |
| CN | 112952021 | A | 6/2021 |
| CN | 112992991 | A | 6/2021 |
| CN | 113013360 | A | 6/2021 |
| CN | 113053978 | A | 6/2021 |
| CN | 113053985 | A | 6/2021 |
| CN | 113054133 | A | 6/2021 |
| CN | 113054134 | A | 6/2021 |
| CN | 113066940 | A | 7/2021 |
| CN | 113077749 | A | 7/2021 |
| CN | 113078199 | A | 7/2021 |
| CN | 113096581 | A | 7/2021 |
| CN | 113126825 | A | 7/2021 |
| CN | 111341817 | B | 8/2021 |
| CN | 113241367 | A | 8/2021 |
| CN | 113327972 | A | 8/2021 |
| CN | 113327973 | A | 8/2021 |
| CN | 113383611 | A | 9/2021 |
| CN | 113394261 | A | 9/2021 |
| CN | 113416925 | A | 9/2021 |
| CN | 113497206 | A | 10/2021 |
| CN | 113629205 | A | 11/2021 |
| CN | 113629207 | A | 11/2021 |
| CN | 113629208 | A | 11/2021 |
| CN | 113745271 | A | 12/2021 |
| CN | 113745433 | A | 12/2021 |
| CN | 109970981 | B | 4/2022 |
| CN | 110265702 | B | 6/2022 |
| DE | 19748109 | A1 | 5/1999 |
| EP | 0 375 967 | B1 | 3/1994 |
| EP | 0 357 360 | B1 | 6/1994 |
| EP | 0 464 959 | B1 | 1/1995 |
| EP | 1 299 913 | B1 | 4/2003 |
| EP | 1 465 874 | A2 | 10/2004 |
| EP | 1 213 337 | B1 | 11/2005 |
| EP | 1 816 114 | A1 | 8/2007 |
| EP | 1 834 945 | B1 | 9/2007 |
| EP | 1 850 368 | A1 | 10/2007 |
| EP | 1 873 162 | A1 | 1/2008 |
| EP | 2 180 029 | A1 | 4/2010 |
| EP | 2 202 283 | A1 | 6/2010 |
| EP | 2 248 849 | B1 | 11/2010 |
| EP | 1 602 648 | B1 | 4/2013 |
| EP | 2 028 249 | B1 | 5/2013 |
| EP | 1 621 597 | B1 | 9/2013 |
| EP | 2 722 350 | A1 | 4/2014 |
| EP | 2 270 897 | B1 | 12/2014 |
| EP | 1 009 044 | B1 | 7/2015 |
| EP | 2 473 564 | B1 | 2/2016 |
| EP | 2 998 997 | A1 | 3/2016 |
| EP | 2 197 979 | B1 | 12/2016 |
| EP | 3 182 477 | A1 | 6/2017 |
| EP | 3 185 325 | A1 | 6/2017 |
| EP | 3 240 036 | A1 | 11/2017 |
| EP | 3 316 311 | A1 | 5/2018 |
| EP | 3 331 045 | A1 | 6/2018 |
| EP | 3 336 899 | A1 | 6/2018 |
| EP | 2 434 558 | B1 | 7/2018 |
| EP | 3 396 728 | A1 | 10/2018 |
| EP | 3 406 752 | A1 | 11/2018 |
| EP | 3 499 576 | A1 | 6/2019 |
| EP | 3 703 147 | A1 | 9/2020 |
| EP | 3 149 012 | B1 | 10/2020 |
| EP | 3 731 293 | A1 | 10/2020 |
| GB | 1 096 600 | A | 12/1967 |
| GB | 1 188 212 | A | 4/1970 |
| IN | 229083 | B | 8/2007 |
| JP | 2002-212163 | A | 7/2002 |
| JP | 3588978 | B2 | 11/2004 |
| JP | 2004-352815 | A | 12/2004 |
| JP | 2005-041843 | A | 2/2005 |
| JP | 2006-202872 | A | 8/2006 |
| JP | 2006-277973 | A | 10/2006 |
| JP | 2007-188854 | A | 7/2007 |
| JP | 2007-245113 | A | 9/2007 |
| JP | 4025111 | B2 | 12/2007 |
| JP | 4025136 | B2 | 12/2007 |
| JP | 4025137 | B2 | 12/2007 |
| JP | 2008-133263 | A | 6/2008 |
| JP | 4185097 | B2 | 11/2008 |
| JP | 2008-291006 | A | 12/2008 |
| JP | 2009-065220 | A | 3/2009 |
| JP | 2009-182354 | | 8/2009 |
| JP | 4308663 | B2 | 8/2009 |
| JP | 2009-535813 | A | 10/2009 |
| JP | 2010-258410 | A | 11/2010 |
| JP | 4655790 | B2 | 3/2011 |
| JP | 2011-173972 | A | 9/2011 |
| JP | 4846982 | B2 | 12/2011 |
| JP | 2012-044125 | A | 3/2012 |
| JP | 4970934 | B2 | 7/2012 |
| JP | 4972844 | B2 | 7/2012 |
| JP | 2012-531426 | A | 12/2012 |
| JP | 5093879 | B2 | 12/2012 |
| JP | 5166961 | B2 | 3/2013 |
| JP | 5198657 | B2 | 5/2013 |
| JP | 5233074 | B2 | 7/2013 |
| JP | 2013-173771 | A | 9/2013 |
| JP | 2013-219278 | A | 10/2013 |
| JP | 5381748 | B2 | 1/2014 |
| JP | 5572134 | B2 | 8/2014 |
| JP | 2014-240374 | A | 12/2014 |
| JP | 5645849 | B2 | 12/2014 |
| JP | 2015-159164 | A | 9/2015 |
| JP | 2017-503317 | A | 1/2017 |
| JP | 6786081 | B2 | 11/2020 |
| JP | 7135919 | B2 | 9/2022 |
| JP | 7222320 | B2 | 2/2023 |
| KR | 100691543 | B1 | 3/2007 |
| KR | 100826364 | B1 | 5/2008 |
| KR | 100858816 | B1 | 9/2008 |
| KR | 20090128427 | A | 12/2009 |
| KR | 20100041043 | A | 4/2010 |
| KR | 20100054630 | A | 5/2010 |
| KR | 20100066424 | A | 6/2010 |
| KR | 20100069216 | A | 6/2010 |
| KR | 20100123735 | A | 11/2010 |
| KR | 100998838 | B1 | 12/2010 |
| KR | 101020350 | B1 | 3/2011 |
| KR | 101036391 | B1 | 5/2011 |
| KR | 20110123701 | A | 11/2011 |
| KR | 20130077276 | A | 7/2013 |
| KR | 101317511 | B1 | 10/2013 |
| KR | 20140062258 | A | 5/2014 |
| KR | 20140126108 | A | 10/2014 |
| KR | 101530266 | B1 | 6/2015 |
| KR | 20150103510 | A | 9/2015 |

(56) References Cited

FOREIGN PATENT DOCUMENTS

| | | | |
|---|---|---|---|
| KR | 101561479 | B1 | 10/2015 |
| KR | 20150120906 | A | 10/2015 |
| KR | 20150127368 | A | 11/2015 |
| KR | 101640772 | B1 | 7/2016 |
| KR | 101661925 | B1 | 10/2016 |
| KR | 20170024182 | A | 3/2017 |
| KR | 20170030168 | A | 3/2017 |
| KR | 20170075865 | A | 7/2017 |
| KR | 20180115655 | A | 10/2018 |
| KR | 20180121304 | A | 11/2018 |
| KR | 20190020930 | A | 3/2019 |
| KR | 20200126463 | A | 11/2020 |
| KR | 20210002829 | A | 1/2021 |
| KR | 20210075549 | A | 6/2021 |
| KR | 20210079850 | A | 6/2021 |
| KR | 20210083043 | A | 7/2021 |
| KR | 20210084869 | A | 7/2021 |
| KR | 20210085263 | A | 7/2021 |
| KR | 20210086033 | A | 7/2021 |
| TW | I227655 | B | 2/2005 |
| TW | 201105775 | A | 2/2011 |
| TW | I363054 | B | 5/2012 |
| TW | I485137 | B | 5/2015 |
| TW | I499653 | B | 9/2015 |
| TW | 201929219 | A | 7/2019 |
| WO | WO-98/18804 | A1 | 5/1998 |
| WO | WO-99/17892 | A1 | 4/1999 |
| WO | WO-02/096913 | A1 | 12/2002 |
| WO | WO-2004/083295 | A1 | 9/2004 |
| WO | WO-2006/070711 | A1 | 7/2006 |
| WO | WO-2006/070712 | A1 | 7/2006 |
| WO | WO-2008/069586 | A1 | 6/2008 |
| WO | WO-2008/105294 | A1 | 9/2008 |
| WO | WO-2009/102054 | A1 | 8/2009 |
| WO | WO-2010/094378 | A1 | 8/2010 |
| WO | WO-2010/114256 | A2 | 10/2010 |
| WO | WO-2010/114263 | A2 | 10/2010 |
| WO | WO-2010/122810 | A1 | 10/2010 |
| WO | WO-2010/134350 | A1 | 11/2010 |
| WO | WO-2010/151006 | A1 | 12/2010 |
| WO | WO-2011/012212 | A1 | 2/2011 |
| WO | WO-2011/027276 | A1 | 3/2011 |
| WO | WO-2011/042374 | A1 | 4/2011 |
| WO | WO-2011/049284 | A1 | 4/2011 |
| WO | WO-2011/074252 | A1 | 6/2011 |
| WO | WO-2011/074253 | A1 | 6/2011 |
| WO | WO-2011/107417 | A1 | 9/2011 |
| WO | WO-2011/115378 | A1 | 9/2011 |
| WO | WO-2011/129096 | A1 | 10/2011 |
| WO | WO-2011/136379 | A1 | 11/2011 |
| WO | WO-2012/070535 | A1 | 5/2012 |
| WO | WO-2013/109030 | A1 | 7/2013 |
| WO | WO-2013/100724 | A4 | 10/2013 |
| WO | WO-2013/180456 | A1 | 12/2013 |
| WO | WO-2013/183851 | A1 | 12/2013 |
| WO | WO-2013/187007 | A1 | 12/2013 |
| WO | WO-2014/024880 | A1 | 2/2014 |
| WO | WO-2014/031360 | A1 | 2/2014 |
| WO | WO-2014/071518 | A1 | 5/2014 |
| WO | WO-2014/104144 | A1 | 7/2014 |
| WO | WO-2014/163228 | A1 | 10/2014 |
| WO | WO-2015/005440 | A1 | 1/2015 |
| WO | WO-2015/033559 | A1 | 3/2015 |
| WO | WO-2015/041352 | A1 | 3/2015 |
| WO | WO-2016/042781 | A1 | 3/2016 |
| WO | WO-2016/056364 | A1 | 4/2016 |
| WO | WO-2017/072678 | A1 | 5/2017 |
| WO | WO-2018/100559 | A1 | 6/2018 |
| WO | WO-2018/198052 | A1 | 11/2018 |
| WO | WO-2018/211460 | A1 | 11/2018 |
| WO | WO-2019/113490 | A1 | 6/2019 |
| WO | WO-2019/150327 | A1 | 8/2019 |
| WO | WO-2020/092266 | A1 | 5/2020 |
| WO | WO-2020/105015 | A1 | 5/2020 |
| WO | WO-2020/178804 | A | 9/2020 |

OTHER PUBLICATIONS

International Search Report and Written Opinion for PCT Application No. PCT/IB2021/052980 dated Aug. 2, 2021 (10 pages).

International Search Report and Written Opinion for PCT Application No. PCT/IB2021/054230 dated Aug. 2, 2021 (9 pages).

International Search Report and Written Opinion for PCT Application No. PCT/IB2021/055232 dated Sep. 22, 2021 (12 pages).

International Search Report and Written Opinion for PCT Application No. PCT/IB2021/056685 dated Oct. 26, 2021 (7 pages).

International Search Report and Written Opinion for PCT Application No. PCT/IB2021/058323 dated Dec. 8, 2021 (12 pages).

International Search Report and Written Opinion for PCT Application No. PCT/IB2021/059300 dated Dec. 23, 2021 (15 pages).

International Search Report and Written Opinion for PCT Application No. PCT/IB2021/060062 dated Feb. 18, 2022 (12 pages).

Kachan et al., "High-absorbing Gradient Multilayer Coatings with Silver Nanoparticles," Applied Physics B, 2006, 84, pp. 281-287.

Malonowski, P. et al., "71-3: Organic Photolithography for Displays with Integrated Fingerprint Scanner," SID Symposium Digest of Technical Papers, vol. 50, Issue 1, 2019, pp. 107-1010, ISSN: 0097-996X/19/4802-1007. Retrieved from the internet https://lirias.kuleuven.be/retrieve/550644.

Rycenga et al., "Controlling the Synthesis and Assembly of Silver Nanostructures for Plasmonic Applications," Chemical Reviews, 2011, 111(6), pp. 3669-3712.

International Search Report and Written Opinion on PCT PCT/IB2022/062254 dated Mar. 13, 2023 (10 pages).

Murcur, S.P., et al., "Charge Carrier Performance of Phosphazene-based Ionic Liquids Doped Hole Transport Layer in Organic Light-emitting Diodes," Applied Physics A, Material Science & Processing, (2020), vol. 126:923, pp. 1-14.

Abraham, Michael H., et al. "Determination of molar refractions and Abraham descriptors for tris(acetylacetonato)chromium(III), tris(acetylacetonato)iron(III) and tris(acetylacetonato)cobalt(III)." New Journal of Chemistry 41.23 (2017): 14259-14265.

Abroshan, H. et al. "66-3: Active Learning for the Design of Novel OLED Materials." SID Symposium Digest of Technical Papers. 53.1 (2022).

Adams, R. O., A. Digiallonardo, and C. W. Nordin. "Films of rare earth oxides formed by electron beam evaporation." Thin Solid Films 154.1-2 (1987): 101-108.

Aftab, Alina. "Sintering Behavior, Structural, and Catalytic Properties of Ytterbium Oxide (Yb2O3)." (2019).

Ai, Lianghui, et al. "Synthesis and flame retardant properties of cyclophosphazene derivatives containing boron." Polymer Degradation and Stability 155 (2018): 250-261.

Alaaeddine, Ali, et al. "Synthesis and characterization of novel alternating fluorinated copolymers bearing oligo (ethylene oxide) side chains." Journal of Polymer Science Part A: Polymer Chemistry 51.4 (2013): 977-986.

Alexandra, M. Z. "Lanthanide ß-diketonate glyme complexes exhibiting unusual co-ordination modes." Journal of the Chemical Society, Dalton Transactions 15 (1993): 2379-2386.

Alhadid A. et al., "Design of Deep Eutectic Systems: A Simple Approach for Preselecting Eutectic Mixture Constituents", Molecules, 25.5 (2020): 1077.

Alipour, Mojtaba, and Zahra Safari. "Photophysics of OLED materials with emitters exhibiting thermally activated delayed fluorescence and used in hole/electron transporting layer from optimally tuned range-separated density functional theory." The Journal of Physical Chemistry C 123.1 (2018): 746-761.

Allcock, H. R. "Recent advances in phosphazene (phosphonitrilic) chemistry." chemical Reviews 72.4 (1972): 315-356.

Allcock, H. R., and D. B. Patterson. "Phosphorus-nitrogen compounds. 27. Ring-ring and ring-chain equilibration of dimethylphosphazenes. Relation to phosphazene polymerization." Inorganic Chemistry 16.1 (1977): 197-200.

Allcock, H. R., and L. A. Siegel. "Phosphonitrilic compounds. III. 1 Molecular inclusion compounds of tris (o-phenylenedioxy) phosphonitrile trimer." Journal of the American Chemical Society 86.23 (1964): 5140-5144.

(56) References Cited

OTHER PUBLICATIONS

Allcock, H. R., J. L. Schmutz, and Karen M. Kosydar. "A new route for poly (organophosphazene) synthesis. Polymerization, copolymerization, and ring-ring equilibration of trifluoroethoxy-and chloro-substituted cyclotriphosphazenes1, 2." Macromolecules 11.1 (1978): 179-186.
Allcock, H. R., R. L. Kugel, and K. J. Valan. "Phosphonitrilic compounds. VI. High molecular weight poly (alkoxy-and aryloxyphosphazenes)." Inorganic Chemistry 5.10 (1966): 1709-1715.
Allcock, H. R., W. J. Cook, and D. P. Mack. "Phosphonitrilic compounds. XV. High molecular weight poly [bis (amino) phosphazenes] and mixed-substituent poly (aminophosphazenes)." Inorganic Chemistry 11.11 (1972): 2584-2590.
Allcock, H.R. "Phosphorus-nitrogen Compounds", pp. 400-407, Academic Press (1972).
Allcock, H.R. and Walsh, E.J., "Phosphonitrilic Compounds. XIV. Basic Hydrolysis of Aryloxy- and Spiroarylenedioxycyclophosphazenes", J. Amer. Chem. Soc., 94.13 (1972):4538-4545.
Allcock, Harry R. "The expanding field of polyphosphazene high polymers." Dalton Transactions 45.5 (2016): 1856-1862.
Allcock, Harry R., and Chen Chen. "Polyphosphazenes: phosphorus in inorganic-organic polymers." The Journal of Organic Chemistry 85.22 (2020): 14286-14297.
Allcock, Harry R., and Dawn E. Smith. "Surface studies of poly (organophosphazenes) containing dimethylsiloxane grafts." Chemistry of materials 7.8 (1995): 1469-1474.
Allcock, Harry R., and Dennis C. Ngo. "Synthesis of poly [bis (phosphazo) phosphazenes] bearing aryloxy and alkoxy side groups." Macromolecules 25.11 (1992): 2802-2810.
Allcock, Harry R., and Michael L. Turner. "Ring expansion and polymerization of transannular bridged cyclotriphosphazenes and their spirocyclic analogs." Macromolecules 26.1 (1993): 3-10.
Allcock, Harry R., and R. L. Kugel. "Synthesis of high polymeric alkoxy-and aryloxyphosphonitriles." Journal of the American Chemical Society 87.18 (1965): 4216-4217.
Allcock, Harry R., and Young Baek Kim. "Synthesis, characterization, and modification of poly (organophosphazenes) with both 2, 2, 2-trifluoroethoxy and phenoxy side groups." Macromolecules 27.14 (1994): 3933-3942.
Allcock, Harry R., et al. "Controlled refractive index polymers: polyphosphazenes with chlorinated-and fluorinated-, aryloxy-and alkoxy-side-groups." Chemistry of materials 15.2 (2003): 473-477.
Allcock, Harry R., et al. "Hydrophobic and superhydrophobic polyphosphazenes." Journal of adhesion science and technology 23.3 (2009): 435-445.
Allcock, Harry R., et al. "Plasma surface functionalization of poly [bis (2, 2, 2-trifluoroethoxy) phosphazene] films and nanofibers." Langmuir 23.15 (2007): 8103-8107.
Allcock, Harry R., et al. "Poly (monophosphazophosphazenes): New polymers with N: PR3 side groups." Macromolecules 27.26 (1994): 7556-7564.
Allcock, Harry R., et al. "Syntheses and structures of cyclic and short-chain linear phosphazenes bearing 4-phenylphenoxy side groups." Journal of the American Chemical Society 113.7 (1991): 2628-2634.
Allcock, Harry R., Gayann S. McDonnell, and James L. Desorcie. "Ring expansion and equilibration in organophosphazenes and the relationship to polymerization." Inorganic chemistry 29.19 (1990): 3839-3844.
Allcock, Harry R., Lee B. Steely, and Anurima Singh. "Hydrophobic and superhydrophobic surfaces from polyphosphazenes." Polymer international 55.6 (2006): 621-625.
Allcock, Harry R., Michael L. Turner, and Karyn B. Visscher. "Synthesis of transannular-and spiro-substituted cyclotriphosphazenes: x-ray crystal structures of 1, 1-[N3P3 (OCH2CF3) 4 {O2C12H8}], 1, 3-[N3P3 (OCH2CF3) 4 {O2C12H8}], 1, 1-[N3P3 (OCH2CF3) 4 {0OC10H6}], and 1, 3-[N3P3 (OCH2CF3) 4} O2C10H6}]." Inorganic chemistry 31.21 (1992): 4354-4364.
Amano, Akio, et al. "49.4 L: Late-News Paper: Highly Transmissive One Side Emission OLED Panel for Novel Lighting Applications." SID Symposium Digest of Technical Papers. vol. 44. No. 1. Oxford, UK: Blackwell Publishing Ltd, 2013.
Amat, Miguel A., and Gregory C. Rutledge. "Liquid-vapor equilibria and interfacial properties of n-alkanes and perfluoroalkanes by molecular simulation." The Journal of chemical physics 132.11 (2010): 114704.
Aqra, Fathi, and Ahmed Ayyad. "Surface free energy of alkali and transition metal nanoparticles." Applied surface science 314 (2014): 308-313.
Araki, H. and Naka, K., "Syntheses and Properties of Dumbbell-Shaped POSS Derivatives Linked by Luminescent p-Conjugated Units", Polymer Chemistry, 50.20 (2012):4170-4181.
Araki, H. and Naka, K., "Syntheses and Properties of Star- and Dumbbell-Shaped POSS Derivatives Containing Isobutyl Groups", Polymer Journal, 44 (2012):340-346.
Araki, H. and Naka, K., "Syntheses of Dumbbell-Shaped Trifluoropropyl-Substituted POSS Derivatives Linked by Simple Aliphatic Chains and Their Optical Transparent Thermoplastic Films", Macromolecules, 44.15 (2011):6039-6045.
Asuncion, M.Z. et al., "Synthesis, Functionalization and Properties of Incompletely Condensed 'Half Cube' Silsesquioxanes as a Potential Route to Nanoscale Janus Particles", C. R. Chimie, 13.1-2 (2010):270-281.
Aubouy, Miguel, Manoel Manghi, and Elie Rapha?l. "Interfacial properties of polymeric liquids." Physical Review Letters 84.21 (2000): 4858.
Azimi, Gisele, et al. "Hydrophobicity of rare-earth oxide ceramics." Nature materials 12.4 (2013): 315-320.
Azimi, Gisele, et al. Supplementary material for "Hydrophobicity of rare-earth oxide ceramics." Nature materials 12.4 (2013): 315-320.
B?hm, E., et al. "Novel transport materials for high-performance fluorescent and phosphorescent OLEDs." Journal of Information Display 12.3 (2011): 141-144.
Bae, J. et al. "Optically recoverable, deep ultraviolet (UV) stable and transparent sol-gel fluoro siloxane hybrid material for a UV LED encapsulant." RSC advances 6.32 (2016): 26826-26834.
Baek, Jang-Yeol, et al. "New asymmetrical limb structured blue emitting material for OLED." Optical Materials Express 4.6 (2014): 1151-1158.
Baek, Seungin, et al. "74-2: Diffracted Image Retrieving with Deep Learning."?SID Symposium Digest of Technical Papers. Vol. 51. No. 1. 2020.
Balague, J., et al. "Synthesis of fluorinated telomers. Part 1. Telomerization of vinylidene fluoride with perfluoroalkyl iodides." Journal of Fluorine Chemistry 70.2 (1995): 215-223.
Baradie, B. et al. "Synthesis and characterization of novel polysiloxane-grafted fluoropolymers." Canadian journal of chemistry 83.6-7 (2005): 553-558.
Barrett, Eric W., et al. "Patterning poly (organophosphazenes) for selective cell adhesion applications." Biomacromolecules 6.3 (2005): 1689-1697.
Barry, B., "Routes to Silsesquioxanes Functionalization - Capping of DDSQs for the Synthesis of Asymmetric POSS Compounds", Masters Thesis, Michigan State University (2019).
Batsanov, S. S., G. N. Grigor'eva, and N. P. Sokolova. "Optical properties of oxides of the rare-earth metals." Journal of Structural Chemistry 3.3 (1962): 323-325.
Bechtolsheim, C. V., V. Zaporojtchenko, and F. Faupel. "Interface structure and formation between gold and trimethylcyclohexane polycarbonate." Journal of materials research 14.9 (1999): 3538-3543.
Becke-Goehring, Margot, and Ekkehard Fluck. "Phosphonitrilic chlorides from phosphorus pentachloride." Angewandte Chemie International Edition in English 1.6 (1962): 281-285.
Beier, Petr, et al. "Preparation of SF5 Aromatics by Vicarious Nucleophilic Substitution Reactions of Nitro(pentafluorosulfanyl)benzenes with Carbanions." Journal of Organic Chemistry 76.11 (2011): 4781-4786.

(56) References Cited

OTHER PUBLICATIONS

Ben'kovskii, V. G., T. M. Bogoslovskaya, and M. Kh Nauruzov. "Density, surface tension and refractive index of aromatic hydrocarbons at low temperatures." Chemistry and Technology of Fuels and Oils 2.1 (1966): 23-26.

Bernstein, M.P., et al. "Ultraviolet irradiation of the polycyclic aromatic hydrocarbon (PAH) naphthalene in H2O. Implications for meteorites and biogenesis." Advances in Space Research 30.6 (2002): 1501-1508.

Bertolucci, M. et al. "Wetting Behavior of Films of New Fluorinated Styrene—Siloxane Block Copolymers." Macromolecules 37.10 (2004): 3666-3672.

Bes, li, Serap, et al. "Regiochemical control in the substitution reactions of cyclotriphosphazene derivatives with secondary amines." Inorganic Chemistry 57.19 (2018): 12066-12077.

Besli, S. et al., "Bridged Cyclophosphazenes Resulting From Deprotonation Reactions of Cyclotriphophazenes Bearing a P-NH Group", 40.19 (2011): 5307.

Bézière, Nicolas, and Ntziachristos, Vasilis. "Optoacoustic Imaging of Naphthalocyanine: Potential for Contrast Enhancement and Therapy Monitoring." Naphthalocyanine In Optoacoustic Imaging 56.2 (2015): 323-328.

Biddlestone, M., and R. A. Shaw. "A two-ring assembly phosphazene." Chemical Communications (London) 7 (1968): 407-408.

Biederman, H. and Holland, L., "Metal Doped Fluorocarbon Polymer Films Prepared by Plasma Polymerization Using an RF Planar Magnetron Target", Nuclear Instruments and Methods, 212.1-3 (1983):497-503.

Biederman, H. et al., "The Properties of Fluorocarbon Films Prepared by R.F. Sputtering and Plasma Polymerization in Inert and Active Gas", Thin Solid Films, 41.3 (1977): 329-339.

Bierwagen, Oliver, et al. "Oxygen-deficient oxide growth by subliming the oxide source material: The cause of silicide formation in rare earth oxides on silicon." Crystal growth & design 13.8 (2013): 3645-3650.

Blanchet, G.B., "Deposition of Amorphous Fluoropolymers Thin Films by Laser Ablation", Appl. Phys. Lett. 62 (1993):479-481.

Blanco, I., "The Rediscovery of Poss: A Molecule Rather than a Filler", Polymers, 10.8 (2018):904-914.

Boyne, D. et al., "Vacuum Thermal Evaporation of Polyaniline Doped with Camphor Sulfonic Acid", Journal of Vacuum Science & Technology A, 33.3 (2015):031510.

Breu, Josef, et al. "Crystal Structure of fac- Ir (ppy) 3 and Emission Properties under Ambient Conditions and at High Pressure." Chemistry of materials 17.7 (2005): 1745-1752.

Brickley, J.F. et al., "Supramolecular Variations on a Molecular Theme: the Structural Diversity of Phosphazenes (RNH)6P3N3 in the Solid State", Dalton Trans., 7 (2003): 1235-1244.

Brown, Douglas E., et al. "Poly[(vinyloxy)cyclophosphazenes]." Macromolecules 34.9 (2001), 2870-2875.

Buckley, D.H. and Johnson, R.L., "Degradation of Polymeric Compositions in Vacuum to 10-9 mm Hg in Evaporation and Sliding Friction Experiments", Polymer Engineering and Science, 4.4 (1964):306-314.

Buzin, M. I., et al. "Solid-state polymerization of hexaphenylcyclotrisiloxane." Journal of Polymer Science Part A: Polymer Chemistry 35.10 (1997): 1973-1984.

Cai, J. et al. "P-13.10: A New Color Space Model for AMOLED Display Based on IR Drop" SID Symposium Digest of Technical Papers 54 (2023).

Calhoun, Harry P. Studies on the ligand properties of phosphonitrilic derivatives. Diss. University of British Columbia, 1973.

Camino, G. et al., "Polydimethylsiloxane Thermal Degradation Part 1. Kinetic Aspects", Polymer, 42.6 (2001): 2395-2402.

Carolina Mart?nez Ceballos, Evelyn, et al. "Synthesis and characterization of polyphosphazenes modified with hydroxyethyl methacrylate and lactic acid." International Journal of Polymer Science 2013 (2013).

Carriedo, Gabino A., et al. "Preparation of a new type of phosphazene high polymers containing 2, 2 '-dioxybiphenyl groups." Macromolecules 29.16 (1996): 5320-5325.

Casas-Solvas, Juan M., Joshua D. Howgego, and Anthony P. Davis. "Synthesis of substituted pyrenes by indirect methods." Organic & Biomolecular Chemistry 12.2 (2014): 212-232.

Chaiprasert, T. et al. "Vinyl-functionalized Janus ring siloxane: potential precursors to hybrid functional materials." Materials 14.8 (2021): 2014.

Chambrier, Isabelle, et al. "Synthesis of Porphyrin-CdSe Quantum Dot Assemblies: Controlling Ligand Binding by Substituent Effects." Inorganic chemistry 54.15 (2015): 7368-7380.

Chan, E.P. et al., "Viscoelastic Properties of Confined Polymer Films Measured via Thermal Wrinkling", Soft Matter, 5.23 (2009):4638-4641.

Chan, K.L. et al., "Cubic Silsesquioxanes for Use in Solution Processable Organic Light Emitting Diodes (OLED)", Journal of Materials Chemistry, 19.48 (2009):9103-9120.

Chandrasekhar, V. et al., "Cyclophosphazene-Based Multi-Site Coordination Ligands", Coordination Chemistry Reviews, 251.9-10 (2007): 1045-1074.

Chang, Li, et al. "A smart surface with switchable wettability by an ionic liquid." Nanoscale?9.18 (2017): 5822-5827.

Charpentier, P. A., et al. "Continuous polymerizations in supercritical carbon dioxide: chain-growth precipitation polymerizations." Macromolecules 32.18 (1999): 5973-5975.

Chen, B. J., X. W. Sun, and S. C. Tan. "Transparent organic light-emitting devices with LiF/Mg: Ag cathode." Optics express 13.3 (2005): 937-941.

Chen, G. K. J., and J. Chen. "Flexible displays: Flexible AMOLED manufacturing." Handbook of Visual Display Technology; Chen, J., Cranton, W., Fihn, M., Eds (2016).

Chen, Hsiao-Fan, et al. "1,3,5-Triazine derivatives as new electron transport-type host materials for highly efficient green phosphorescent OLEDs." Journal of Materials Chemistry 19.43 (2009): 8112-8118.

Chen, W. et al., "Highly Thermal Stable Phenolic Resin Based on Double-Decker-Shaped POSS Nanocomposites for Supercapacitors", Polymers, 12.9 (2020):2151-2165.

Chen, Yu-Hung, et al. "58.2: High-Performance Large-Size OLED Tv with Ultra Hd Resolution." SID Symposium Digest of Technical Papers. Vol. 46. No. 1. 2015.

Cheng, Yu, et al. "Delivery and efficacy of a cancer drug as a function of the bond to the gold nanoparticle surface." Langmuir 26.4 (2010): 2248-2255.

Chevir, Francois, Franck Tessier, and Roger Marchand. "Optical properties of rare-earth oxides and oxynitrides, . . . towards" second generation" UV absorbers." Silicates industriels 69.5-6 (2004): 159-163.

Ching, Suet Ying. Plasmonic properties of silver-based alloy thin films. Diss. Hong Kong Baptist University, 2015.

Cho, H.U. et al. "17-1: Invited Paper: Enhancement of Current Efficiency for OLED Devices Using Meta-Heuristic Algorithm." SID Symposium Digest of Technical Papers. 52.1 (2021).

Cho, Song Yun, and Harry R. Allcock. "Novel highly fluorinated perfluorocyclobutane-based phosphazene polymers for photonic applications." Chemistry of Materials 19.25 (2007): 6338-6344.

Choi, B. K. et al. "48-1: Invited Paper: Next Generation Highly Efficient and Stable Phosphorescent Emitting Materials For OLEDs." SID Symposium Digest of Technical Papers 51.1 (2020).

Choi, J. et al., "Light Extraction Enhancement in Flexible Organic Light-Emitting Diodes by a Light- Scattering Layer of Dewetted Ag Nanoparticles at Low Temperatures", App. Mater. Interfaces, 10 (2018):32373-32379.

Çiftçi, Gönül Yenilmez, et al. "Investigation of the structural properties of 2-naphthylamine substituted cyclotetraphosphazenes." Polyhedron 77 (2014): 1-9.

Condorelli, Guglielmo G., Graziella Malandrino, and Ignazio L. Fragalà. "Engineering of molecular architectures of ß-diketonate precursors toward new advanced materials." Coordination chemistry reviews 251.13-14 (2007): 1931-1950.

(56) References Cited

OTHER PUBLICATIONS

Cordes, D.B. et al., "Recent Developments in the Chemistry of Cubic Polyhedral Oligosilsesquioxanes", Chem. Rev., 110 (2010):2081-2173.
Crowder, Gene A., et al. "Vapor pressures and triple point temperatures for several pure fluorocarbons." Journal of Chemical and Engineering Data 12.4 (1967): 481-485.
Cuny, Philippe, Monique Acquaviva, and Michèle Gilewicz. "Phenanthrene degradation, emulsification and surface tension activities of a Pseudomonas putida strain isolated from a coastal oil contaminated microbial mat." Ophelia 58.3 (2004): 283-287.
Dalvi, V.H. and Rossky, P.J., "Molecular Origins of Fluorocarbon Hydrophobicity", PNAS, 107.31 (2010): 13603-13607.
Dams, Rudy, and Klaus Hintzer. "Industrial aspects of fluorinated oligomers and polymers." (2016): 1- 31.
Das, Prajwalita, et al. "Recent advancements in the synthesis of pentafluorosulfanyl (SF5)-containing heteroaromatic compounds." Tetrahedron Letters 58.52 (2017): 4803-4815.
Dash, P. and Y. C.H. "How much battery does dark mode save? An accurate OLED display power profiler for modern smartphones." Proceedings of the 19th Annual International Conference on Mobile Systems, Applications, and Services (2021).
David, Robert, Neumann, A. Wilhelm. "A Theory for the Surface Tensions and Contact Angles of HydrogenBonding Liquids." Langmuir 30.39 (2014): 11634-11639.
Dawood, Kamal M. "Electrolytic fluorination of organic compounds." Tetrahedron 7.60 (2004): 1435-1451.
Dayneko, Sergey, et al. "Effect of surface ligands on the performance of organic light-emitting diodes containing quantum dots." Optoelectronic Devices and Integration V. vol. 9270. SPIE, 2014.
De Wilde, W., "Evaporation of Polytetrafluoroethylene by Electron Bombardment of the Bulk Material", Thin Solid Films, 24.1 (1974): 101-111.
Devaux, Didier, et al. "Crosslinked perfluoropolyether solid electrolytes for lithium ion transport." Solid State Ionics 310 (2017): 71-80.
Di Nicola, Giovanni, Gianluca Coccia, and Mariano Pierantozzi. "Surface tension of silanes: A new equation." Fluid Phase Equilibria 418 (2016): 88-93.
Dikarev, Evgeny V., Haitao Zhang, and Bo Li. "Heterometallic bismuth-transition metal homoleptic ß- diketonates." Journal of the American Chemical Society 127.17 (2005): 6156-6157.
Dolbier, William R. Jr., and Kanishchev, Oleksandr S. "Chapter One - SF5-Substituted Aromatic Heterocycles." Advances in Heterocyclic Chemistry 120 (2016): 1-42.
Dolbier, William R. Jr., and Zheng, Zhaoyun. "Use of 1,3-Dipolar Reactions for the Preparation of SF5-Substituted Five-Membered Ring Heterocycles. Pyrroles and Thiophenes." / Journal of Fluorine Chemistry 132.6(2011): 389-393.
Dong, H. et al., "Surface Properties and Thermal Stability of a Novel Low-Surface-Energy Polybenzoxazine/Clay Nanocomposites", Polymer Composites, 33.8 (2012): 1313-1320.
Drelich, J. et al., "Hydrophilic and Superhydrophilic Surfaces and Materials", Soft Matter, 7.21 (2011): 9804-9828.
Du, Libin, et al. "Fluoropolymer synthesis in supercritical carbon dioxide." The Journal of Supercritical Fluids 47.3 (2009): 447-457.
Dubrovskii, Vladimir. "Fundamentals of Nucleation Theory." Nucleation Theory and Growth of Nanostructures. Springer, Berlin, Heidelberg, 2014. 1-73.
Dudziec, B. and Marciniec, B., "Double-decker Silsesquioxanes: Current Chemistry and Applications", Current Organic Chemistry, 21.28 (2017):2794-2813.
Dudziec, B. et al., "Synthetic Routes to Silsesquioxane-Based Systems as Photoactive Materials and Their Precursors", Polymers, 11.3 (2019): 504-542.
Dutkiewicz, M. et al., "New Fluorocarbofunctional Spherosilicates: Synthesis and Characterization", Organometallics, 30.8 (2011):2149-2153.
Ebnesajjad, S. "Fluoroplastics: vol. 1: Non-Melt Processible Fluoroplastics. 2000."Plastics Design Library: United States of America, Norwich, NY, Chapter 11.
Ebnesajjad, Sina. "Introduction to fluoropolymers." Applied Plastics Engineering Handbook. William Andrew Publishing, 2011. 49-60.
Edrissi, M., et al. "Novel Method for the Preparation of Copper Phthalocyanin Blue Nanoparticles in an Electrochemical Cell Irradiated by Microwave (Research Note)". International Journal of Engineering, 20.3 (2007): 257-262.
Eguchi, Shingo, et al. "35-1: Strategy for Developing an Ultra-High-Luminance AMOLED Display." SID Symposium Digest of Technical Papers. Vol. 49. No. 1. 2018.
Eilers, H., et al. "Teflon AF/Ag nanocomposites with tailored optical properties." Journal of materials research 21.9 (2006): 2168-2171.
Ellis, David A., et al. "Degradation of Fluorotelomer Alcohols :? A Likely Atmospheric Source of Perfluorinated Carboxylic Acids." Environmental science & technology 38.12 (2004): 3316-3321.
Ellis, David A., et al. "Partitioning of organofluorine compounds in the environment." Organofluorines. Springer, Berlin, Heidelberg, 2002. 63-83.
Ellison, A. H., H. W. Fox, and W. A. Zisman. "Wetting of fluorinated solids by hydrogen-bonding liquids." The Journal of Physical Chemistry 57.7 (1953): 622-627.
Elmas, Gamze, et al. "Phosphorus-nitrogen compounds. Part 52. The reactions of octachlorocyclotetraphosphazene with sodium 3-(N-ferrocenylmethylamino)-1-propanoxide: Investigations of spectroscopic, crystallographic and stereogenic properties." Inorganica Chimica Acta 497 (2019): 119106.
Emerton, Neil, David Ren, and Tim Large. "28-1: Image Capture Through TFT Arrays." SID Symposium Digest of Technical Papers. Vol. 51. No. 1. 2020.
Endo, Ayataka, et al. "Measurement of photoluminescence efficiency of Ir (III) phenylpyridine derivatives in solution and solid-state films." Chemical Physics Letters 460.1-3 (2008): 155-157.
Evers, Robert C. "Low glass transition temperature fluorocarbon ether bibenzoxazole polymers." Journal of Polymer Science: Polymer Chemistry Edition 16.11 (1978): 2833-2848.
Farrow, Darcie A., et al. "Polarized pump-probe measurements of electronic motion via a conical intersection." The Journal of Chemical Physics 128.14 (2008): 144510.
Faupel, F., et al. "Nucleation, growth, interdiffusion, and adhesion of metal films on polymers."?AIP Conference Proceedings. Vol. 491. No. 1. American Institute of Physics, 1999.
Feher, F.J. and Budzichowski, T.A., "Silasesquioxanes as Ligands in Inorganic and Organometallic Chemistry", Polyhedron, 14.22 (1995):3239-3253.
Feistel, G. R., and T. Moeller. "The geminal structure of the compound N3P3CI4 (NH2) 2." Journal of Inorganic and Nuclear Chemistry 29.11 (1967): 2731-2737.
Feng, Zhengyu, et al. "28-3: Pixel Design for Transparent MicroLED Display with Low Blurring."?SID Symposium Digest of Technical Papers. Vol. 51. No. 1. 2020.
Finkenzeller, Walter J., and Hartmut Yersin. "Emission of Ir (ppy) 3. Temperature dependence, decay dynamics, and magnetic field properties." Chemical physics letters 377.3-4 (2003): 299-305.
Flaningam, Ora L. "Vapor pressures of poly (dimethylsiloxane) oligomers." Journal of Chemical and engineering Data 31.3 (1986): 266-272.
Flores-Camacho, Jose Manuel, et al. "Growth and optical properties of Ag clusters deposited on poly (ethylene terephthalate)." Nanotechnology 22.27 (2011): 275710.
Formica, Nadia, et al. "Ultrastable and Atomically Smooth Ultrathin Silver Films Grown on a Copper Seed Layer." ACS Applied Materials & Interfaces 5.8 (2013): 3048-3053.
Forrest, James A."Reductions of the glass transition temperature in thin polymer films: Probing the length scale of cooperative dynamics." Physical Review E 61.1 (2000): R53-6.
Fowkes, Frederick M. "Attractive Forces at Interfaces." Industrial and Engineering Chemistry 56.12 (1964): 40-52.
Fox, H.W. et al., "Polyorganosiloxanes . . . Surface Active Properties", Ind. Eng. Chem., 39.11 (1947): 1401-1409.

(56) References Cited

OTHER PUBLICATIONS

Freire, Mara G., et al. "Surface Tension of Liquid Fluorocompounds." Journal of Chemical & Engineering Data 51.5 (2006): 1820-1824.
Frey, Kurt, et al. "Implications of coverage-dependent O adsorption for catalytic NO oxidation on the late transition metals." Catalysis Science & Technology 4.12 (2014): 4356-4365.
Fryer, David S., et al. "Dependence of the glass transition temperature of polymer films on interfacial energy and thickness."? Macromolecules?34. 16 (2001): 5627-5634.
Furukawa, Yutaka, et al. "Fluorosilicone elastomer based on the poly [(3, 3, 3-trifluoropropyl) methyl-siloxane-co-(3, 3, 4, 4, 5, 5, 6, 6, 6-nonafluorohexyl) methylsiloxane]." Polymers for Advanced Technologies 13.1 (2002): 60-65.
Furukawa, Yutaka, et al. "Reactivity of cyclosiloxane with 3, 3, 4, 4, 5, 5, 6, 6, 6-nonafluorohexyl group and its application to fluorosilicone synthesis." Journal of applied polymer science 82.13 (2001): 3333-3340.
Fusella, Michael A., et al. "Plasmonic enhancement of stability and brightness in organic light-emitting devices." Nature 585.7825 (2020): 379-382.
Fushimi, Toshiki, and Harry R. Allcock. "Synthesis and optical properties of sulfur-containing monomers and cyclomatrix polyphosphazenes." Dalton transactions 39.22 (2010): 5349-5355.
Gabler, D.G. and Haw, J.F., "Hydrolysis Chemistry of the Chlorophosphazene Cyclic Trimer", Inorganic Chemistry, 29.20 (1990):4018-4021.
Gali, Sai Manoj, et al. "Ambipolarity and dimensionality of charge transport in crystalline group 14 phthalocyanines: A computational study." The Journal of Physical Chemistry C 122.5 (2018): 2554-2563.
Gan, Y. et al., "Self-Wrinkling Patterned Surface of Photocuring Coating Induced by the Fluorinated POSS Containing Thiol Groups (F-POSS-SH) as the Reactive Nanoadditive", Macromolecules, 45.18 (2012):7520-7526.
Gao Y., "Microphase Separation of Stimulus-Responsive Block-co-Polypeptides on Surfaces", Master's thesis, Duke University (2018).
Gao, Lichao, and Thomas J. McCarthy. "Teflon is hydrophilic. Comments on definitions of hydrophobic, shear versus tensile hydrophobicity, and wettability characterization." Langmuir 24.17 (2008): 9183-9188.
Garrick, Lloyd M. "Novel , New Aromatic SF 5 Derivatives ! Prepared in High Yield via Highly Versatile & Cost Competitive Methods." (2019).
Gavrilenko, V. V., et al. "Synthesis of yttrium, lanthanum, neodymium, praseodymium, and lutetium alkoxides and acetylacetonates." Bulletin of the Russian Academy of Sciences, Division of chemical science 41.11 (1992): 1957-1959.
Giebink, C. "Catastrophic OLED failure and pathways to address it" Department of Energy, url:https://www.energy.gov/sites/prod/files/2018/02/f48/giebink_oled-failure_nashville18_0.pdf (2018).
Glüge, J. et al., An Overview of the Uses of Per- and Polyfluoroalkyl Substances (PFAS), Environmental Science: Processes & Impacts, 20.12 (2020):2345-2373.
Gogoi, N. et al., "Low-Surface-Energy Materials Based on Polybenzoxazines for Surface Modification of Textiles", The Journal of The Textile Institute, 105.11 (2014): 1212-1220.
Golemme, Gianni, and Anna Santaniello. "Perfluoropolymer/molecular sieve mixed-matrix membranes." Membranes 9.2 (2019): 19.
Golovin, K. et al., "Low-Interfacial Toughness Materials for Effective Large-Scale Deicing", Science, 364.6438 (2019):371-375.
Golovin, K. et al., Supplementary Materials for "Low-Interfacial Toughness Materials for Effective Large-Scale Deicing", Science, 364.6438 (2019): 371-375.
Goyal, S. et al. "Fundamentals of Organic-Glass Adhesion", Handbook of Materials Modeling, edited by Andreoni W. and Yip S., Springer Nature Switzerland AG (2020): 2049-2089.
Graham, Paul, et al. "Fluoropolymers with very low surface energy characteristics." Journal of Fluorine Chemistry 104.1 (2000): 29-36.
Grant Norton, M. et al., "Pulsed Laser Ablation and Deposition of Fluorocarbon Polymers", Applied Surface Science, 96-98 (1996):617-620.
Grant, Trevor M., et al. "Multifunctional ternary additive in bulk heterojunction OPV: increased device performance and stability." Journal of Materials Chemistry A 5.4 (2017): 1581-1587.
Gray, Victor, et al. "Photophysical characterization of the 9,10-disubstituted anthracene chromophore and its applications in triplet-triplet annihilation photon upconversion."Journal of Materials Chemistry C 3.42 (2015): 11111-11121.
Green, Mark. "The nature of quantum dot capping ligands." Journal of Materials Chemistry 20.28 (2010): 5797-5809.
Gritsenko, K.P. and Krasovsky, A.M., "Thin-Film Deposition of Polymers by Vacuum Degradation", Chem. Rev., 103.9 (2003):3607-3649.
Grytsenko, K. "Vacuum-deposited fluoropolymer films for organic electronics" International Symphosium on Plastics Electronics (Part of Semicon Europe—2015) at Dresden, Germany (2015).
Grytsenko, K.P. et al., "Protective Applications of Vacuum-Deposited Perfluoropolymer Films", Semiconductor Physics, Quantum Electronics & Optoelectronics, 19.2 (2016): 139-148.
Grzyll, Lawrence R., Charlie Ramos, and Dwight D. Back. "Density, viscosity, and surface tension of liquid quinoline, naphthalene, biphenyl, decafluorobiphenyl, and 1, 2-diphenylbenzene from 300 to 400 C." Journal of Chemical & Engineering Data 41.3 (1996): 446-450.
Guo, X. Andrew, Allen D. Hunter, and Jie Chen. "Preparation and characterization of acrylates and polyacrylates having variable fluorine contents and distributions." Journal of Polymer Science Part A: Polymer Chemistry 32.1 (1994): 47-56.
Hammer, Nathan I., Todd Emrick, and Michael D. Barnes. "Quantum dots coordinated with conjugated organic ligands: new nanomaterials with novel photophysics." Nanoscale Research Letters 2.6 (2007): 282-290.
Han, Yoon Deok, et al. "Quantum dot and p-conjugated molecule hybrids: nanoscale luminescence and application to photoresponsive molecular electronics." NPG Asia Materials 6.6 (2014): e103-e103.
Handke, Bartosz, Lukasz Klita, and Wiktor Niemiec. "Self-assembly of dodecaphenyl POSS thin films." Surface Science 666 (2017): 70-75.
Hashimoto, A. "Evaporation kinetics of oxides of rare earth and refractory trace elements, and the chemical fractionation of hibonite by evaporation." Lunar and Planetary Science Conference. vol. 22. 1991.
Hashimoto, A. "Evaporation kinetics of REE oxides." Lunar and Planetary Science Conference. vol. 19. 1988.
Heaney, James B. "Evaluation of commercially supplied silver coated Teflon for spacecraft temperature control usage." (1974).
Hedley, Gordon J., Arvydas Ruseckas, and Ifor DW Samuel. "Ultrafast luminescence in Ir (ppy) 3." Chemical Physics Letters 450.4-6 (2008): 292-296.
Heinrich, Darina, Axel Haupt, and Dieter Lentz. "Synthesis of Cyclopentadiene Ligands with Fluorinated Substituents by Reaction of Cobaltocene with Fluoroalkenes." European Journal of Inorganic Chemistry 2014.30 (2014): 5103-5106.
Herzog, Axel, et al. "A Perfluorinated Nanosphere: Synthesis and Structure of Perfluoro-deca-B- methyl-para-carborane." Angewandte Chemie International Edition 40.11 (2001): 2121-2123.
Hiroto, Satoru, et al. "Synthetic protocol for diarylethenes through Suzuki-Miyaura coupling." Chemical communications 47.25 (2011): 7149-7151.
Ho, P. S. "Chemistry and adhesion of metal-polymer interfaces." Applied surface science 41 (1990): 559-566.
Ho, P. S., et al. "Chemical bonding and reaction at metal/polymer interfaces." Journal of Vacuum Science & Technology A: Vacuum, Surfaces, and Films 3.3 (1985): 739-745.
Hodges, A. M., et al. "New pentafluoro -?6-sulfanyl (SF5) perfluoroalkyl benzene derivatives." Journal of fluorine chemistry 114.1 (2002): 3-8.
Hoene, Joan Von, Robert G. Charles, and William M. Hickam. "Thermal decomposition of metal acetylacetonates: mass spectrometer studies." The Journal of Physical Chemistry 62.9 (1958): 1098-1101.

(56) References Cited

OTHER PUBLICATIONS

Hofbeck, Thomas, and Hartmut Yersin. "The triplet state of fac-Ir (ppy) 3." Inorganic chemistry 49.20 (2010): 9290-9299.
Hoge, J. "Novel Benzoxazine Resin System for Flame Retardant Aircraft Interior Applications" The Sixth Triennial International Aircraft Fire and Cabin Safety Research (2010).
Holland, L. et al., "Sputtered and Plasma Polymerized Fluorocarbon Films", Thin Solid Films, 35 (1976): L19-L21.
Hopkin, Hywel T., Edward A. Boardman, and Tim M. Smeeton. "36-4: Solution-Processed Transparent Top Electrode for Qd-Led." SID Symposium Digest of Technical Papers. vol. 51. No. 1. 2020.
Hughes, Russell P., and Hernando A. Trujillo. "Selective solubility of organometallic complexes in saturated fluorocarbons. Synthesis of cyclopentadienyl ligands with fluorinated ponytails." Organometallics 15.1 (1996): 286-294.
Hwang, Hyeon-Deuk, and Hyun-Joong Kim. "UV-curable low surface energy fluorinated polycarbonate-based polyurethane dispersion." Journal of colloid and interface science 362.2 (2011): 274-284.
Hwang, S. et al., "ChemInform Abstract: Dendritic Macromolecules for Organic Light-Emitting Diodes", Chemical Society Reviews, 37.11 (2008):2543-2557.
Hyre, Ariel S., and Linda H. Doerrer. "A structural and spectroscopic overview of molecular lanthanide complexes with fluorinated O-donor ligands." Coordination Chemistry Reviews 404 (2020): 213098.
Iacono, S. T. et al. "Fluorinated polyhedral oligomeric silsesquioxanes (F-POSS), and pathways to address it", Defense Technical Information Center, url:https://apps.dtic.mil/sti/citations/ADA533422 (2010).
Iacono, S.T. et al., "Preparation of Composite Fluoropolymers with Enhanced Dewetting Using Fluorinated Silsesquioxanes as Drop-In Modifiers", J. Mater. Chem., 20.15 (2010): 2979-2984.
Iacono, Scott T., et al. "Facile synthesis of hydrophobic fluoroalkyl functionalized silsesquioxane nanostructures." Chemical communications 47 (2007): 4992-4994.
Ibisoglu, H. et al., "Formation of Novel Spiro, Spiroansa and Dispiroansa Derivatives of Cyclotetraphosphazene From the Reactions of Polyfunctional Amines with Octachlorocyclotetraphosphazatetraene", J. Chem. Sci., 121.2 (2009): 125-135.
Ikonnikov, D.A., "Controlling Multiple Diffraction with Quasiperiodic Gratings", Laser Phys. Lett., 16.12 (2019): 126202.
Im, Yirang, et al. "Recent progress in high-efficiency blue-light-emitting materials for organic light-emitting diodes." Advanced Functional Materials 27.13 (2017): 1603007.
Imoto, H. et al., "Corner- and Side-Opened Cage Silsesquioxanes: Structural Effects on the Materials Properties", European Journal of Inorganic Chemistry, 2020.9 (2020): 737-742.
Imoto, H. et al., "Tripodal Polyhedral Oligomeric Silsesquioxanes as a Novel Class of Three-Dimensional Emulsifiers", Polymer Journal, 47 (2015):609-615.
Ito, Hitoshi, et al. "Synthesis and Thermal Properties of Fully Aromatic Polysilarylenesiloxanes." Polymer Journal 38.2 (2006): 109-116.
Ivleva, E.A. et al., "Synthesis of Adamantane Functional Derivatives Basing on N-[(Adamantan-1-yl)alkyl]acetamides", Russian Journal of Organic Chemistry, 52.11 (2016): 1558-1564.
Iwamori, S. et al., "Adsorption Properties of Fluorocarbon Thin Films Prepared by Physical Vapor Deposition Methods", Surface & Coatings Technology, 204: 16-17 (2010):2803-2807.
Iwamori, S., "Adhesion and Friction Properties of Fluorocarbon Polymer Thin Films Coated onto Metal Substrates", Key Engineering Materials, 384 (2008):311-320.
Jain, Akash, Gang Yang, and Samuel H. Yalkowsky. "Estimation of melting points of organic compounds." Industrial & engineering chemistry research 43.23 (2004): 7618-7621.
Jang, Sang Eok, et al. "Thermally stable fluorescent blue organic light-emitting diodes using spirobifluorene based anthracene host materials with different substitution position." Synthetic metals 160.11-12 (2010): 1184-1188.
Jarvis, N.L. and Zisman, W.A., "Surface Chemistry of Fluorochemicals", Defense Technical Information Center (1965): 1-37.
Jiao, Zhiqiang, et al. "61-2: Weakening Micro-Cavity Effects in White Top-Emitting WOLEDs with Semitransparent Metal Top Electrode."?SID Symposium Digest of Technical Papers. vol. 49. No. 1. 2018.
Jin, Y. et al. "Two-Tier Ensemble Deep Learning Model for Anomaly Detection in OLED Encapsulation Process" The 21st International Meeting on Information Display, Seoul, Korea (2021).
Johnson, P. G., and B. Tittle. "The preparation of perfluorinated carboxylic esters and perfluoro carbonates." Journal of Fluorine Chemistry 3.1 (1973): 1-6.
Joliton, Adrien, and Carreira, Erick M. "Ir-Catalyzed Preparation of SF5-Substituted Potassium Aryl Trifluoroborates via C-H Borylation and Their Application in the Suzuki-Miyaura Reaction." Organic Letters 15.20 (2013): 5147-5149.
Josefsen, Leanne B., and Ross W. Boyle. "Photodynamic therapy and the development of metal- based photosensitisers." Metal-based drugs 2008 (2008).
Jung, W. et al. "High-precision laser glass cutting for future display" Journal of the Society for Information Display 30.5 (2022): 462-470.
Kaesler, K., "The hidden defenders : Silane and siloxane impregnation protects construction materials", European coatings journal, 3 (2006):36-41.
Kanzow, J., et al. "Formation of a metal/epoxy resin interface." Applied surface science 239.2 (2005): 227-236.
Karabacak, Tansel. "Thin-film growth dynamics with shadowing and re-emission effects." Journal of Nanophotonics 5.1 (2011): 052501.
Kaspaul, A. F., and E. E. Kaspaul. "Application of molecular amplification to microcircuitry." Trans. 10th National Vacuum Symposium. 1963. pp.422-427.
Kato, Daimotsu, et al. "52.4 L Transmissive One-Side-Emission OLED Panel using Alignment-Free Cathode Patterning." SID Symposium Digest of Technical Papers. vol. 46. No. 1. 2015.
Ke, L., et al. "Panchromatic ternary/quaternary polymer/fullerene BHJ solar cells based on novel silicon naphthalocyanine and silicon phthalocyanine dye sensitizers." Journal of Materials Chemistry A 5.6 (2017): 2550-2562.
Khan, Sami. Hydrophobicity of rare-earth oxide ceramics and their application in promoting sustained drop-wise condensation. Diss. Massachusetts Institute of Technology, 2016.
Khanin, D.A., et al. "New hybrid materials based on cyclophosphazene and polysiloxane precursors: Synthesis and properties." Polymer 186 (2020): 122011.
Khetubol, Adis, et al. "Ligand exchange leads to efficient triplet energy transfer to CdSe/ZnS Q-dots in a poly(N-vinylcarbazole) matrix nanocomposite." Journal of Applied Physics 113.8 (2013): 083507.
Khetubol, Adis, et al. "Triplet Harvesting in Poly(9-vinylcarbazole) and Poly(9-(2,3-epoxypropyl)carbazole) Doped with CdSe/ZnS Quantum Dots Encapsulated with 16-(N-Carbazolyl) Hexadecanoic Acid Ligands." Journal of Polymer Science Part B: Polymer Physics 52.7 (2014): 539-551.
Kim, Beomjin, et al. "Synthesis and electroluminescence properties of highly efficient blue fluorescence emitters using dual core chromophores." Journal of Materials Chemistry C 1.3 (2013): 432-440.
Kim, Chiwoo, et al. "Fine metal mask material and manufacturing process for high-resolution active- matrix organic light-emitting diode displays." Journal of the Society for Information Display 28.8 (2020): 668-679.
Kim, G. et al. "Multiscale Calculation of Carrier Mobility in Organic Solids Through the Fine-Tuned Kinetic Monte Carlo Method" The 21st International Meeting on Information Display, Seoul, Korea (2021).
Kim, H. et al. "83-2: Reliability Characterization of Luminance Degradation of OLED Mobile Display Considering Color Difference Index Based on Usage Patterns." SID Symposium Digest of Technical Papers 51.1 (2020).
Kim, Haewon, et al. "Analysis of Semi-Transparent Cathode Performance Based on Fabrication Methods." IDW '19. 2019.

(56) References Cited

OTHER PUBLICATIONS

Kim, Hyun-Chang, et al. "39-4: A Method of Panel-Current Limitation for Automotive OLED Displays."?SID Symposium Digest of Technical Papers. vol. 51. No. 1. 2020.
Kim, J. et al. "Design of Stable Blue Phosphorescent OLEDs Using State Interaction between Exciplex and Component Host" The 21st International Meeting on Information Display, Seoul, Korea (2021).
Kim, J.H. et al., "Thickness and Composition Dependence of the Glass Transition Temperature in Thin Homogeneous Polymer Blend Films", Macromolecules, 35.1 (2002):311-313.
Kim, J.H. et al., "Thickness Dependence of the Glass Transition Temperature in Thin Polymer Films", Langmuir, 17.9 (2001):2703-2710.
Kim, J.H. et al., "Thickness Dependence of the Melting Temperature of Thin Polymer Films", Macromol. Rapid Commun. 22.6 (2001): 386-389.
Kim, Kwon-Hyeon, and Jang-Joo Kim. "Origin and Control of Orientation of Phosphorescent and TADF Dyes for High-Efficiency OLEDs." Advanced Materials 30.42 (2018): 1705600.
Kim, Kyu-Sung, et al. "Blue light-emitting OLED using new spiro [fluorene-7, 9'-benzofluorene] host and dopant materials." Organic Electronics 9.5 (2008): 797-804.
Kim, S. et al. "25-3: Machine-Learning-Assisted Materials Discovery of Blue Emitter for More Efficient and Durable OLED Device." SID Symposium Digest of Technical Papers. 52.1 (2021).
Kim, S. "40-2: Invited Paper: Prolonging Device Lifetime of Blue Organic Light-Emitting Diodes." SID Symposium Digest of Technical Papers 53.1 (2022).
Kim, S. et al. "Autonomous Materials Design for More Efficient OLED Devices using Machine Learning" The 21st International Meeting on Information Display, Seoul, Korea (2021).
Kim, S. et al., "Origin of Macroscopic Adhesion in Organic Light-Emitting Diodes Analyzed at Different Length Scales", Scentific Reports, 8.6391 (2018): 1-7.
Kim, S.K., et al. "5-4: High Efficiency Top-Emission Organic Light Emitting Diodes Realized Using Newly Developed Low Absorption Pure Ag cathode Configuration." SID Symposium Digest of Technical Papers, 50: 50-53. 2019.
Kim, Sinheui, et al. "Degradation of blue-phosphorescent organic light-emitting devices involves exciton-induced generation of polaron pair within emitting layers." Nature communications 9.1 (2018): 1-11.
Kim, T. et al., "Electrical Injection and Transport in Teflon-Diluted Hole Transport Materials", Organic Electronics, 83 (2020): 105754.
Kim, Y. "Ai & Simulation Technology for Displays", SID 2021 Short Course, SID Display Week, virtual (2021).
Kim, Y. et al. "17-2: Invited Paper: Simulation Based Artificial Intelligence for Displays." SID Symposium Digest of Technical Papers. 52.1 (2021).
King, Allison, et al. "Semicrystalline polyphosphazenes: A comparative study of topology, morphology, and contact angles for three fluorous and one aryl polyphosphazene." Polymer 54.3 (2013): 1123-1129.
Kireev, Vyacheslav V., V. I. Astrina, and Eugeny A. Chernyshev. "Oligomeric Alkoxyphosphazens." Russian Chemical Reviews 50.12 (1981): 1186.
Kisin, Srdjan. Adhesion changes at metal-polymer interfaces: Study of the copper-(acrylonitrile-butadiene-styrene) system. Diss. Dissertation, Technische Universiteit Eindhoven, 2007.
Kiskan, B., "Adapting Benzoxazine Chemistry for Unconventional Applications", Reactive and Functional Polymers, 129 (2018):76-88.
Knight Jr, L. B., et al. "Unusual behavior of vaporized magnesium under low pressure conditions."?The Journal of Physical Chemistry? 79.12 (1975): 1183-1190.
Kobayashi, Hideki, and Michael J. Owen. "Surface tension of liquid polysiloxanes having fluorinated alkyl side-chains." Die Makromolekulare Chemie: Macromolecular Chemistry and Physics 194.6 (1993): 1785-1792.
Kober, Ehrenfried, Henry Lederle, and Gerhard Ottmann. "Fluoroalkylphosphonitrilates: A New Class of Potential Fire-Resistant Hydraulic Fluids and Lubricants. I." ASLE Transactions 7.4 (1964): 389-397.
Koh, K. et al., "Precision Synthesis of a Fluorinated Polyhedral Oligomeric Silsesquioxane-Terminated Polymer and Surface Characterization of Its Blend Film with Poly(methyl methacrylate)", Macromolecules, 38.4 (2005): 1264-1270.
Kohonenko, V. I., et al. "Density and surface tension of liquid rare earth metals, scandium, and yttrium." physica status solidi (a) 84.2 (1984): 423-432.
Koma, N. et al. "44.2: Novel Front-light System Using Fine-pitch Patterned Oled." SID Symposium Digest of Technical Papers, 39: 655-658. 2008.
Korich, Andrew L., and Peter M. lovine. "Boroxine chemistry and applications: A perspective." Dalton Transactions 39.6 (2010): 1423-1431.
Kota, Arun K., Gibum Kwon, and Anish Tuteja. "The design and applications of superomniphobic surfaces." NPG Asia Materials 6.7 (2014): e109-e109.
Kovacik, P. et al., "Vacuum-Deposited Planar Heterojunction Polymer Solar Cells", ACS Appl. Mater. Interfaces, 3.1 (2011): 11-15.
Kovacina, T. A., et al. "Syntheses and characterizations of poly(pentafluorosulfur diacetylenes)." Industrial & Engineering Chemistry Product Research and Development 22.2 (1983): 170-172.
Kovalchuk, N.M., et al. "Fluoro- vs hydrocarbon surfactants: Why do they differ in wetting performance?" Advances in Colloid and Interface Science 210 (2014): 65-71.
Krishnamurthy, S. S., P. M. Sundaram, and Michael Woods. "Studies of phosphazenes. 12. Reactions of N4P4CI8 with dibenzylamine-isolation of an unusual" bicyclic" phosphazene, N4P4 [N (CH2Ph) 2] 6 (NCH2Ph)." Inorganic Chemistry 21.1 (1982): 406-410.
Krishnan, S. et al., "Fluorinated Polymers: Liquid Crystalline Properties and Applications in Lithography", The Chemical Record, 4.5 (2004):315-330.
Kunthom, R. et al., "Synthesis and Characterization of Unsymmetrical Double-Decker Siloxane (Basket Cage)", Molecules, 24.23 (2019):4252.
Kuo, S. et al., "Preparing Low-Surface-Energy Polymer Materials by Minimizing Intermolecular Hydrogen-Bonding Interactions", J. Phys. Chem. C, 113.48 (2009):20666-20673.
Kwak, Sang Woo, et al. "Synthesis and Electroluminescence Properties of 3-(Trifluoromethyl)phenyl-Substituted 9, 10-Diarylanthracene Derivatives for Blue Organic Light-Emitting Diodes." Applied Sciences 7.11 (2017): 1109-1120.
Kwon, Sun-kap, et al. "Efficient micro-cavity top emission OLED with optimized Mg: Ag ratio cathode." Optics Express 25.24 (2017): 29906-29915.
Lanoux, S. and Mas, R.H., "Reactions of the Hydrolyzed Phosphazene N3P3(OCH2CF3)5ONa", Phosphorus and Sulfur and the Related Elements, 26.2 (1986): 139-142.
Lederle, Henry, Ehrenfried Kober, and Gerhard Ottmann. "Fluoroaklyl Phosphonitrilates: A New Class of Potential Fire-Resistant Hydraulic Fluids and Lubricants." Journal of Chemical and Engineering Data 11.2 (1966): 221-228.
Lee, Chang-Jun, et al. "Microcavity effect of top-emission organic light-emitting diodes using aluminum cathode and anode." Bulletin of the Korean Chemical Society 26.9 (2005): 1344-1346.
Lee, Chia-Tse, et al. "58.3: A Novel Highly Transparent 6-in. AMOLED Display Consisting of IGZO TFTs."?SID Symposium Digest of Technical Papers. vol. 46. No. 1. 2015.
Lee, David KY, et al. "Synthesis and inclusion behavior of cyclotriphosphazene molecules with asymmetric spiro rings." Dalton Transactions 39.22 (2010): 5341-5348.
Lee, Donggu, et al. "The influence of sequential ligand exchange and elimination on the performance of P3HT: CdSe quantum dot hybrid solar cells." Nanotechnology 26.46 (2015): 465401.
Lee, J. et al. "55-2: Methods for Overcoming the Trade-off between Efficiency and Lifetime of Organic Light-Emitting Diodes: OLED Lifetime Simulation." SID Symposium Digest of Technical Papers 51.1 (2020).

(56) References Cited

OTHER PUBLICATIONS

Lee, J.Y. and Saito, R., "Transparency and Water Vapor Barrier Properties of Polybenzoxazine-Silica Nanocomposites Provided with Perhydropolysilazane", J. Appl. Polym. Sci., 133.47 (2016):44238.
Lee, Jiun-Haw, et al. "Blue organic light-emitting diodes: current status, challenges, and future outlook." Journal of Materials Chemistry C 7.20 (2019): 5874-5888.
Lee, S. et al. "20-2: High Efficiency and Long Device Lifetime Green Organic Light Emitting Diodes using a Pt Complex." SID Symposium Digest of Technical Papers 51.1 (2020).
Lee, Sangwha, Joon-Seo Park, and T. Randall Lee. "The wettability of fluoropolymer surfaces: Influence of surface dipoles." Langmuir 24.9 (2008): 4817-4826.
Lei, Hui, et al. "Fluorine-free low surface energy organic coating for anti-stain applications." Progress in Organic Coatings 103 (2017): 182-192.
Lei, Ying Duan, Frank Wania, and Dan Mathers. "Temperature-dependent vapor pressure of selected cyclic and linear polydimethylsiloxane oligomers." Journal of Chemical & Engineering Data 55.12 (2010): 5868-5873.
Lenton, M. V., and B. Lewis. "Preparation and properties of some novel diaminotetra (fluoroalkoxy)-triphosphonitriles." Journal of the Chemical Society A: Inorganic, Physical, Theoretical (1966): 665- 667.
Li, Chong, et al. "Photocontrolled Intramolecular Charge/Energy Transfer and Fluorescence Switching of Tetraphenylethene-Dithienylethene-Perylenemonoimide Triad with Donor—Bridge—Acceptor Structure." Chemistry—An Asian Journal 9.1 (2014): 104-109.
Li, L. et al., "Synthesis and Properties of Microporous Organic Polymers Based on Adamantane", Progress in Chemistry, 32 (2020): 190-203.
Li, Lu, et al. "Fluorinated anthracene derivatives as deep-blue emitters and host materials for highly efficient organic light-emitting devices." RSC Advances 5.73 (2015): 59027-59036.
Li, P. et al. "Preparation and application of fluorinated-siloxane protective surface coating material for stone inscriptions." Journal of Polymer Engineering 35.6 (2015): 511-522.
Li. J, et al. "40-4: Invited Paper: Self-Aligned Top-Gate Amorphous In—Ga—Zn—O Thin-Film Transistors with Hafnium-Induced Source/Drain Regions." SID Symposium Digest of Technical Papers. 54.1 (2023).
Lifka, H. et al. "P-169: Single Side Emitting Transparent OLED Lamp." SID Symposium Digest of Technical Papers, 42: 1737-1739. 2011.
Lim, Sehoon, et al. "74-1: Image Restoration for Display-Integrated Camera." SID Symposium Digest of Technical Papers. vol. 51. No. 1. 2020.
Lin, Rong Jie, Chi Jui Cheng, and Hoang Yan Lin. "P-165: An Optimized Algorithm to Reconstruct the Structure of Transparent OLED Display Based on Monte Carlo Method." SID Symposium Digest of Technical Papers. vol. 51. No. 1. 2020.
Liu, C. et al., "Mechanistic Studies on Ring-Opening Polymerization of Benzoxazines: A Mechanistically Based Catalyst Design", Macromolecules, 44.12 (2011): 4616-4622.
Liu, F. et al. "Syntheses and structure of the first eight-membered fluoro and chloro hafnium siloxane complexes" Zeitschrift für anorganische und allgemeine Chemie 622.5 (1996): 819-822.
Liu, Meng, et al. "Facile fabrication of superhydrophobic surface from fluorinated poss acrylate copolymer via one-step breath figure method and its anti-corrosion property." Polymers 11.12 (2019): 1953.
Liu, Xiao, et al. "Substituent exchange reactions of linear oligomeric aryloxyphosphazenes with sodium 2, 2, 2-trifluoroethoxide." Inorganic chemistry 51.21 (2012): 11910-11916.
Liu, Xiao, et al. "Substituent exchange reactions with high polymeric organophosphazenes." Macromolecules 45.22 (2012): 9100-9109.
Liu, Yang, et al. "P-168: Top Emission WOLED for High Resolution OLED TV." SID Symposium Digest of Technical Papers. vol. 49. No. 1. 2018.
Liu, Yunfei, et al. "P-202: High Transmittance Top Conductive Electrodes of OLEDs by Using Conductive Interface Layer." SID Symposium Digest of Technical Papers. vol. 51. No. 1. 2020.
Liu, Z. et al., "Two-Dimensional Gratings of Hexagonal Holes for High Order Diffraction Suppression", Optics Express, 25.2 (2017): 1339-1349.
Lo, Angel SW, and István T. Horváth. "Fluorous ethers." Green Chemistry 17.10 (2015): 4701-4714.
Lowe, R.D. et al., "Deposition of Dense Siloxane Monolayers from Water and Trimethoxyorganosilane Vapor", Langmuir, 27.16 (2011):9928-9935.
Lu, Changqing, Jae-Ho Kim, and Darryl D. DesMarteau. "Synthesis of perfluoro-t-butyl trifluorovinyl ether and its copolymerization with TFE." Journal of Fluorine Chemistry 131.1 (2010): 17-20.
Lu, H. and Nutt, S., "Restricted Relaxation in Polymer Nanocomposites near the Glass Transition", Macromolecules, 36.11 (2003):4010-4016.
Lu, T. et al., "Blended Hybrids Based on Silsesquioxane-OH and Epoxy Resins", Journal of Applied Polymer Science, 106.6 (2007):4117-4123.
Lund, L. G., et al. "514. Phosphonitrilic derivatives. Part I. The preparation of cyclic and linear phosphonitrilic chlorides." Journal of the Chemical Society (Resumed) (1960): 2542-2547.
Lysien, M. et al. "55-1: Deposition of Conductive and Insulating Materials at Micrometer Scale for Display-Component Prototyping." SID Symposium Digest of Technical Papers 53.1 (2022).
Mabry, J.M. et al., "Fluorinated Polyhedral Oligomeric Silsesquioxanes (F-POSS)", Angew. Chem. Int. Ed., 47.22 (2008):4137-4140.
Mabry, Joseph M., et al. Ultrahydrophobic Fluorinated Polyhedral Oligomeric Silsesquioxanes (F-POSS)(Preprint). Air Force Research Lab Edwards AFB CA Propulsion Directorate, 2007.
Mackus, A.J.M. et al. "From the bottom-up: toward area-selective atomic layer deposition with high selectivity" Chemistry of Materials 31.1 (2018): 2-12.
Maderna, Andreas, et al. "The syntheses of amphiphilic camouflaged carboranes as modules for supramolecular construction." Journal of the American Chemical Society 123.42 (2001): 10423-10424.
Magda van Leeuwen, et al. "The photochemistry and photophysics of a series of alpha octa(alkyl-substituted) silicon, zinc and palladium phthalocyanines." Photochemical & Photobiological Sciences 13.1 (2014): 62-69.
Maher, Andrew E., and Harry R. Allcock. "Influence of the n-Hexoxy Group on the Properties of Fluoroalkoxyphosphazene Polymers." Macromolecules 38.2 (2005): 641-642.
Maissel, Leon I., and Maurice H. Francombe. An introduction to thin films. CRC Press, 1973. pp. 61-83, 198, 199.
Majhy, B. et al., "Facile Fabrication and Mechanistic Understanding of a Transparent Reversible Superhydrophobic—Superhydrophilic Surface", Scientific Reports, 8 (2018): 18018.
Malandrino, Graziella, et al. "New thermally stable and highly volatile Precursors for lanthanum MOCVD: Synthesis and characterization of lanthanum. Beta.- Diketonate Glyme Complexes." Inorganic Chemistry 34.25 (1995): 6233-6234.
Mao, Hui-Ting, et al. "Recent progress in phosphorescent Ir (III) complexes for nondoped organic light-emitting diodes." Coordination Chemistry Reviews 413 (2020): 213283.
Mao, Y. and Gleason, K. K., "Vapor-Deposited Fluorinated Glycidyl Copolymer Thin Films with Low Surface Energy and Improved Mechanical Properties", Macromolecules, 39.11 (2006):3895-3900.
Marchon, B., et al. "Fomblin Multidentate Lubricants for Ultra-Low Magnetic Spacing." IEEE Transactions on Magnetics 42.10 (2006): 2504-2506.
Marzari, N. et al. "Electronic-structure methods for materials design." Nature materials 20.6 (2021): 736-749.
McDowell, Matthew, Ashley E. Wright, and Nathan I. Hammer. "Semiconductor nanocrystals hybridized with functional ligands: New composite materials with tunable properties." Materials 3.1 (2010): 614-637.

(56) References Cited

OTHER PUBLICATIONS

McIntosh, Thomas J., et al. "Structure and Interactive Properties of Highly Fluorinated Phospholipid Bilayers." Biophysical Journal 71.4 (1996): 1853-1868.
Medenbach, O., et al. "Refractive index and optical dispersion of rare earth oxides using a small-prism technique." Journal of Optics A: Pure and Applied Optics 3.3 (2001): 174.
Meinders, Marcel BJ, William Kloek, and Ton van Vliet. "Effect of surface elasticity on Ostwald ripening in emulsions." Langmuir 17.13 (2001): 3923-3929.
Melville, Owen A., Trevor M. Grant, and Beno?t H. Lessard. "Silicon phthalocyanines as N-type semiconductors in organic thin film transistors." Journal of Materials Chemistry C 6.20 (2018): 5482-5488.
Michel, U., et al. "Copolymerization of tetrafluoroethylene and 2, 2-bis (trifluoromethyl)-4, 5-difluoro-1, 3-dioxole in supercritical carbon dioxide." Macromolecules 36.19 (2003): 7107-7113.
Michele Ricks. Advanced OLED Materials Enabling Large-Size OLED Displays by Ink Jet Printing. OLEDs World Summit, Sep. 2020.
Mikhaylov, D.Y. and Budnikova, Y.H., "Fluoroalkylation of Organic Compounds", Russian Chemical Reviews, 82.9 (2013):835-864.
Mishra, Shashank, and Stephane Daniele. "Metal-organic derivatives with fluorinated ligands as precursors for inorganic nanomaterials." Chemical Reviews 115.16 (2015): 8379-8448.
Mittal, Kashmiri Lal, ed. Metallized plastics 3: fundamental and applied aspects. Springer Science & Business Media, 2012.
Modzelewski, Tomasz, and Harry R. Allcock. "An unusual polymer architecture for the generation of elastomeric properties in fluorinated polyphosphazenes." Macromolecules 47.19 (2014): 6776-6782.
Morgenstern, Karina, Georg Rosenfeld, and George Comsa. "Decay of two-dimensional Ag islands on Ag (111)." Physical review letters 76.12 (1996): 2113.
Mucur, S.P., et al. "Conventional and inverted organic light emitting diodes based on bright green emmisive polyfluorene derivatives." Polymer 151.12 (2018): 101-107.
Mugisawa, M. et al., "Synthesis and Application of Novel Fluoroalkyl End-Capped Cooligomers Having Adamantane as a Pendant Group", Colloid Polym Sci, 285 (2007): 737-744.
Murano, Sven, et al. "30.3: Invited Paper: AMOLED Manufacturing—Challenges and Solutions from a Material Makers Perspective." SID Symposium Digest of Technical Papers. vol. 45. No. 1. 2014.
Muray, M. et al., "NMR Studies of Hydrolysis and Rearrangement Reactions of Cyclophosphazenes", Phosphorus, Sulfur, and Silicon and the Related Elements, 65.1-4 (1992): 83-86.
Murotani, Eisuke, et al. "Synthesis and polymerization of a novel perfluorinated monomer." Journal of Fluorine Chemistry 128.10 (2007): 1131-1136.
Nabatova-Gabain, Nataliya, Yoko Wasai, and Taiju Tsuboi. "Spectroscopic ellipsometry study of Ir (ppy) 3 organic light emitting diode." Current Applied Physics 6.5 (2006): 833-838.
Nakamura, Daiki, et al. "68-4: Top-emission OLED Kawara-type Multidisplay with Auxiliary Electrode." SID Symposium Digest of Technical Papers. vol. 49. No. 1. 2018.
Nason, T.C. et al., "Deposition of Amorphous Fluoropolymer Thin Films by Thermolysis of Teflon Amorphous Fluoropolymer", Appl. Phys. Lett. 60 (1992): 1866-1868.
Nasrallah, H. and Hierso, J., "Porous Materials Based on 3-Dimensional Td-Directing Functionalized Adamantane Scaffolds and Applied as Recyclable Catalysts", Chem. Mater., 31.3 (2019):619-642.
Navarrini, Walter, et al. "Low surface energy coatings covalently bonded on diamond-like carbon films." Diamond and related materials 19.4 (2010): 336-341.
Nicolas, G. and Spiegelmann, F., "Theoretical Study of Ethylene-Noble Metal Complexes", J. Am. Chem. Soc., 112 (1990):5410-5419.
Nishino, T. et al., "The Lowest Surface Free Energy Based on –CF3 Alignment", Langmuir, 15 (1999): 4321-4323.
Nittler, Laurent, et al. "Morphology study of small amounts of evaporated gold on polymers." Surface and interface analysis 44.8 (2012): 1072-1075.
Niu, J. et al., "High Order Diffraction Suppression by Quasi-Periodic Two-Dimensional Gratings", Optical Materials Express, 7.2 (2017):366-375.
Nyk?nen, Virginia P. Silva, et al. "An efficient and stable star-shaped plasticizer for starch: cyclic phosphazene with hydrogen bonding aminoethoxy ethanol side chains." Green Chemistry 16.9 (2014): 4339-4350.
Oh, Il-Kwon, et al. "Hydrophobicity of rare earth oxides grown by atomic layer deposition." Chemistry of Materials 27.1 (2015): 148-156.
Ohnishi Y. et al., "Optical Characteristics of Poly(tetrafluoroethylene) Thin Film Prepared by a Vacuum Evaporation", Jpn. J. Appl. Phys., 55:2S (2016):02BB04.
Ohring, Milton. Materials science of thin films. Elsevier, 2001.
Oka, M. and Satoshi, H. "Synthesis of photoresponsive cyclic poly (dimethyl siloxane) s from monodisperse linear precursors" Reactive and functional polymers 158 (2021): 104800.
Okamoto, Yoshiyuki, et al. "New amorphous perfluoro polymers: perfluorodioxolane polymers for use as plastic optical fibers and gas separation membranes." Polymers for Advanced Technologies 27.1 (2016): 33-41.
Okui, N., H. M. Li, and J. H. Magill. "Thermal properties of poly (tetramethyl-p-silphenylene siloxane) and (tetramethyl-p-silphenylene siloxane-dimethyl siloxane) copolymers." Polymer 19.4 (1978): 411-415.
Okuyama, Kentaro, et al. "79-4L: Late-News Paper: Highly Transparent LCD using New Scattering-type Liquid Crystal with Field Sequential Color Edge Light." SID Symposium Digest of Technical Papers, 48, 2017.
Olejnik, A. et al., "Silsesquioxanes in the Cosmetics Industry—Applications and Perspectives", Materials, 15.3 (2022):1126-1143.
Olshavsky, Michael, and Harry R. Allcock. "Polyphosphazenes with high refractive indices: optical dispersion and molar refractivity." Macromolecules 30.14 (1997): 4179-4183.
Ottmann, Gerhard, Henry Lederle, and Ehrenfried Kober. "Arylamino Polyfluoroalkoxy Phosphonitriles. New Class of Potential Fire-Resistant Hydraulic Fluids and Lubricants." Industrial & Engineering Chemistry Product Research and Development 5.2 (1966): 202-204.
Owen, M. J. "A review of significant directions in fluorosiloxane coatings" Surface Coatings International Part B: Coatings Transactions 87:B2 (2004).
Pandharkar, Riddhish, et al. "A Computational Study of AIF3 and ACF Surfaces." Inorganics 6.4 (2018): 124.
Park, Chan II, et al. "54-1: Distinguished Paper: World 1st Large Size 77-inch Transparent Flexible OLED Display."?SID Symposium Digest of Technical Papers. vol. 49. No. 1. 2018.
Park, Eun Ji, et al. "Fabrication of conductive, transparent and superhydrophobic thin films consisting of multi-walled carbon nanotubes." RSC Advances 4.57 (2014): 30368-30374.
Park, Jongwoong, et al. "8-1: The Method to Compensate IR-Drop of AMOLED Display." SID Symposium Digest of Technical Papers. vol. 50. No. 1. 2019.
Park, Woo-Young, et al. "P-175L: Late-News Poster: High Efficiency Light Extraction from Top-Emitting Organic Light-Emitting Diodes Employing Mask-Free Plasma Etched Stochastic Polymer Surface." SID Symposium Digest of Technical Papers. vol. 46. No. 1. 2015.
Paulson, A.E. et al., "Three-Dimensional Profiling of OLED by Laser Desorption Ionization-Mass Spectrometry Imaging", Journal of the American Society for Mass Spectrometry, 31.12 (2020), 2443-2451.
Pearson, Andrew J., et al. "Silicon phthalocyanines as dopant red emitters for efficient solution processed OLEDs." Journal of Materials Chemistry C 5.48 (2017): 12688-12698.
Peters, Richard D., et al. "Using Self-Assembled Monolayers Exposed to X-rays To Control the Wetting Behavior of Thin Films of Diblock Copolymers." Langmuir 16.10 (2000): 4625-4631.

(56) References Cited

OTHER PUBLICATIONS

Pham, J.Q. and Green, P.F., "The Glass Transition of Thin Film Polymer/Polymer Blends: Interfacial Interactions and Confinement", J. Chem. Phys., 116.13 (2002):5801-5806.
Piorecka, Kinga, et al. "Hydrophilic Polyhedral Oligomeric Silsesquioxane, POSS (OH) 32, as a Complexing Nanocarrier for Doxorubicin and Daunorubicin." Materials 13.23 (2020): 5512.
Pittman, Allen G., Dennis L. Sharp, and Barbara A. Ludwig. "Polymers derived from fluoroketones. II. Wetting properties of fluoroalkyl acrylates and methacrylates." Journal of Polymer Science Part A-1: Polymer Chemistry 6.6 (1968): 1729-1740.
Plajer, Alex J., et al. "A modular approach to inorganic phosphazane macrocycles." Angewandte Chemie International Edition 56.31 (2017): 9087-9090.
Plajer, Alex J., et al. "Conformational Control in Main Group Phosphazane Anion Receptors and Transporters." Journal of the American Chemical Society 142.2 (2019): 1029-1037.
Plajer, Alex J., et al. "Tailoring the Binding Properties of Phosphazane Anion Receptors and Transporters." Journal of the American Chemical Society 141.22 (2019): 8807-8815.
Plint, Trevor, Beno?t H. Lessard, and Timothy P. Bender. "Assessing the potential of group 13 and 14 metal/metalloid phthalocyanines as hole transport layers in organic light emitting diodes." Journal of Applied Physics 119.14 (2016): 145502.
Pu, T. et al., "Effects of Structure Parameters on High-Order Diffraction Suppression of Quasi-Periodic Gratings", Journal of the Optical Society of America B, 35.4 (2018): 711-717.
Quan, Wei, et al. "69-2: Transparent Conductive Hybrid Cathode Structure for Top-Emitting Organic Light-Emitting Devices."?SID Symposium Digest of Technical Papers. vol. 51. No. 1. 2020.
Quast, Matthew J., et al. "Synthesis and Physical Properties of Highly Branched Perfluorinated Polymers from AB and AB2 Monomers." Journal of Polymer Science Part A: Polymer Chemistry 53.16 (2015): 1880-1894.
Ramirez, S.M. et al., "Incompletely Condensed Fluoroalkyl Silsesquioxanes and Derivatives: Precursors for Low Surface Energy Materials", J. Am. Chem. Soc. 133.50 (2011): 20084-20087.
Ratz, Rudi, et al. "A New Class of Stable Phosphonitrilic Acid Esters. Polyfluoroalkyl Phosphonitrilates." Journal of the American Chemical Society 84.4 (1962): 551-555.
Reichert, V.R. and Mathias, L.J., "Expanded Tetrahedral Molecules from 1,3,5,7-Tetraphenyladarnantane", Macromolecules, 27.24 (1994):7015-7023.
Ren, Zhongjie, and Yan, Shouke. "Polysiloxanes for optoelectronic applications." Progress in Materials Science 83 (2016): 383-416.
Rey, Nadège, et al. "Dumbbell-Shaped T8-POSS with Functional Organic Linkers." European Journal of Inorganic Chemistry 2019. 27 (2019): 3148-3156.
Riberiro, P. et al., "Optics, Photonics and Laser Technology 2017", Chapters 2 and 3, Springer (2019).
Riess, Jean G. "Understanding the fundamentals of perfluorocarbons and perfluorocarbon emulsions relevant to in vivo oxygen delivery." Artificial cells, blood substitutes, and biotechnology 33.1 (2005): 47-63.
Ringe, E., "Shapes, Plasmonic Properties, and Reactivity of Magnesium Nanoparticles", J. Phys, Chem. C, 124 (2020): 15665.
Roesky, H. W., and E. Niecke. "Darstellung von P3N3F5NH2 und P3N3F5NPCI3." Inorganic and Nuclear Chemistry Letters 4.8 (1968): 463-465.
Roesky, Herbert W. "Lineare und cyclische Chlorphosphazene." Chemische Berichte 105.4 (1972): 1439-1445.
Roesky, Herbert W., Walter Grosse B?wing, and Edgar Niecke. "?ber die Darstellung von Fluorcyclotriphosphazenen mit Phosphazenseitenketten." Chemische Berichte 104.2 (1971): 653-660.
Roitman, James N., and Allen G. Pittman. "Wetting properties of acrylic polymers containing perfluoro-t-butyl side chains." Journal of Polymer Science Part B: Polymer Letters 10.7 (1972): 499-503.
Roitman, James N., and Allen G. Pittman. "Wetting properties of bis (trifluoromethyl) carbinyl acrylate polymers." Journal of Polymer Science: Polymer Chemistry Edition 12.7 (1974): 1421-1436.
Rokni-Fard, Mahroo, and Quanmin Guo. "Biased Ostwald ripening in site-selective growth of two-dimensional gold clusters." The Journal of Physical Chemistry C 122.14 (2018): 7801-7805.
Romack, T. J., J. M. DeSimone, and T. A. Treat. "Synthesis of tetrafluoroethylene-based, nonaqueous fluoropolymers in supercritical carbon dioxide." Macromolecules 28.24 (1995): 8429-8431.
Roy, M.R., "Surface Properties of Hard Fluorinated Amorphous Carbon Films Deposited by Pulsed-DC Discharges", Doctoral Thesis, Universitat de Barcelona (2012).
Rumyantcev, R. V., and G. K. Fukin. "Intramolecular C—F—Ln dative interactions in lanthanide complexes with fluorinated ligands." Russian Chemical Bulletin 66.9 (2017): 1557-1562.
S?zen, Yasemin, and Simge Metinoglu. "Novel cyclomatrix-type polyphosphazene microspheres crosslinked with octachlorocyclotetraphosphazene: preparation and characterization." Anadolu University Journal of Science and Technology A-Applied Sciences and Engineering 18.5 (2017): 973-987.
Safonov, Alexey I., et al. "Deposition of thin composite films consisting of fluoropolymer and silver nanoparticles having surface plasmon resonance." Thin Solid Films 603 (2016): 313-316.
Sajoto, Tissa, et al. "Temperature dependence of blue phosphorescent cyclometalated Ir (III) complexes." Journal of the American Chemical Society 131.28 (2009): 9813-9822.
Sakamoto, Keiichi, and Eiko Ohno-Okumura. "Syntheses and functional properties of phthalocyanines." Materials 2.3 (2009): 1127-1179.
Sakka, Tetsuo, and Yukio H. Ogata. "Surface tension of fluoroalkanes in a liquid phase." Journal of fluorine chemistry 126.3 (2005): 371-375.
Sanju, K. S. "Synthesis of Organic Systems and Study of their Light Emitting Properties in Solution and Polymer Matrix." Chapter 1. https://shodhganga.inflibnet.ac.in/bitstream/10603/106813/8/08_chapter%201.pdf.
Satulu, Veronica, et al. "Combining fluorinated polymers with Ag nanoparticles as a route to enhance optical properties of composite materials." Polymers 12.8 (2020): 1640.
Scharnberg, M., et al. "Radiotracer measurements as a sensitive tool for the detection of metal penetration in molecular-based organic electronics." Applied Physics Letters 86.2 (2005): 024104.
Schenck, Rudolf, and G. R?mer. "?ber die Phosphornitrilchloride und ihre Umsetzungen (I.)." Berichte der deutschen chemischen Gesellschaft (A and B Series) 57.8 (1924): 1343-1355.
Schilling, C.I. et al., "Fourfold Suzuki-Miyaura and Sonogashira Cross-Coupling Reactions on Tetrahedral Methane and Adamantane Derivatives", Eur. J. Org. Chem., 2011.9 (2011): 1743-1754.
Schissel, Paul, and Alvin Warren Czanderna. "Reactions at the silver/polymer interface: a review." Solar Energy Materials 3.1-2 (1980): 225-245.
Schneider, Andreas, Stefan Kairies, and Klaus Rose. "Synthesis of alkoxysilyl substituted cyclophosphazenes and their properties in the sol-gel process." Silicon Chemistry. Springer, Vienna, 1999. 89-98.
Schwab, Tobias. Top-Emitting OLEDs: Improvement of the Light Extraction Efficiency and Optimization of Microcavity Effects for White Emission. Diss. Saechsische Landesbibliothek-Staats-und Universitaetsbibliothek Dresden, 2014.
Seebauer, E.G. and Allen, C.E., "Estimating Surface Diffusion Coefficients", Progress in Surface Science, 49.3 (1995): 265-330.
Senaweera, Sameera M., and Jimmie D. Weaver. "Selective Perfluoro-and Polyfluoroarylation of Meldrum's Acid." The Journal of Organic Chemistry 79.21 (2014): 10466-10476.
Senchyk, A.G. et al., "1,2,4-Triazole Functionalized Adamantanes: a New Library of Polydentate Tectons for Designing Structures of Coordination Polymers", Dalton Trans., 41.28 (2012): 8675-8689.
Senchyk, G.A. et al., "Functionalized Adamantane Tectons Used in the Design of Mixed-Ligand Copper(II) 1,2,4-Triazolyl/Carboxylate Metal-Organic Frameworks", Inorganic Chemistry, 52.2 (2013):863-872.
Sessler, C.D. et al., "CF2H, a Hydrogen Bond Donor", J. Am. Chem. Soc., 139.27 (2017):9325-9332.

(56) References Cited

OTHER PUBLICATIONS

Shen, Mingmin, et al. "Destabilization of Ag nanoislands on Ag (100) by adsorbed sulfur." The Journal of chemical physics 135.15 (2011): 154701.
Shen, Wen-Jian, et al. "Spirobifluorene-linked bisanthracene: An efficient blue emitter with pronounced thermal stability." Chemistry of materials 16.5 (2004): 930-934.
Shen, Xiao-Min, et al. "Highly photostable silicon(IV) phthalocyanines containing adamantane moieties: synthesis, structure, and properties." Tetrahedron 66.46 (2010): 9041-9048.
Shen. Y, et al. "32.1: Research of Nanocomposite Materials with High Refractive Index for HLEMS Application" SID Symposium Digest of Technical Papers 54 (2023).
Shevlin, S. et al. "Computational materials design." Nature Materials 20.6 (2021): 727-727.
Shi, Shiming, et al. "56-1: Invited Paper: Research on Commercial Foldable AMOLED and Relevant Technologies."?SID Symposium Digest of Technical Papers. vol. 51. No. 1. 2020.
Shi, Yan X., et al. "Synthesis and hydrolytic studies on the air-stable [(4_13 CN—PhO)(E) P (μ-N t Bu)] 2 (E= O, S, and Se) cyclodiphosphazanes." Inorganic Chemistry 54.13 (2015): 6423-6432.
Shih, H. et al., "A Cross-Linkable Triphenylamine Derivative as a Hole Injection/Transporting Material in Organic Light-Emitting Diodes", Polym. Chem., 6 (2015):6227-6237.
Shin, D. and Grassia, P. "Preliminary study on the self-patterning and self-registration of metal electrodes by exploiting the chemical and optical traits of an organic silver compound in conjunction with polyaniline." Journal of Micromechanics and Microengineering 20.2 (2010): 025030.
Shin, Dong-Youn, and Inyoung Kim. "Self-patterning of fine metal electrodes by means of the formation of isolated silver nanoclusters embedded in polyaniline."?Nanotechnology?20.41 (2009): 415301.
Shirasaki, Yasuhiro. Efficiency loss mechanisms in colloidal quantum-dot light-emitting diodes. Diss. Massachusetts Institute of Technology, 2013.
Shizu, Katsuyuki, et al. "Highly efficient blue electroluminescence using delayed-fluorescence emitters with large overlap density between luminescent and ground states." The Journal of Physical Chemistry C 119.47 (2015): 26283-26289.
Silicone Fluids, p. 20, retrieved from <https://s3.amazonaws.com/gelest/product-brochures/Inert_Silicones.pdf> on Mar. 24, 2022.
Sim, Ying, et al. "Orthogonality in main group compounds: a direct one-step synthesis of air-and moisture-stable cyclophosphazanes by mechanochemistry." Chemical Communications 54.50 (2018): 6800-6803.
Singh, Anurima, Lee Steely, and Harry R. Allcock. "Poly [bis (2, 2, 2-trifluoroethoxy) phosphazene] superhydrophobic nanofibers." Langmuir 21.25 (2005): 11604-11607.
Singh, Rajendra Prasad, et al. "A Novel Synthesis of Hexakis (trifluoromethyl) cyclotriphosphazene. Single-Crystal X-ray Structures of N3P3 (CF3) 6 and N3P3F6." Inorganic Chemistry 39.2 (2000): 375-377.
Smith, Arthur RG, Paul L. Burn, and Ben J. Powell. "Spin-Orbit Coupling in Phosphorescent Iridium (III) Complexes." ChemPhysChem 12.13 (2011): 2429-2438.
Smith, Arthur RG, Paul L. Burn, and Benjamin J. Powell. "Exact exchange and the density functional theory of metal-to-ligand charge-transfer in fac-Ir (ppy) 3." Organic Electronics 33 (2016): 110-115.
Smithson, Robert LW, Donald J. McClure, and D. Fennell Evans. "Effects of polymer substrate surface energy on nucleation and growth of evaporated gold films." Thin Solid Films 307.1-2 (1997): 110-112.
Snyder Jr, Carl E. "Structural Modifications of Fluoro-alkyl S-Triazines and Their Lubricant Properties." ASLE Transactions 14.3 (1971): 237-242.
Sohn, I. et al. "Improved modeling of material deposition during OLED manufacturing using direct simulation monte carlo method on GPU Architecture." International Journal of Precision Engineering and Manufacturing-Green Technology 6 (2019): 861-873.
Sohn, I. et al. "Numerical Experiment Using Direct Simulation Monte Carlo for Improving Material Deposition Uniformity During OLED Manufacturing." International Journal of Precision Engineering and Manufacturing-Green Technology (2021): 1-14.
Song, Hongwei, Olusegun J. llegbusi, and L. I. Trakhtenberg. "Modeling vapor deposition of metal/semiconductor-polymer nanocomposite." Thin Solid Films 476.1 (2005): 190-195.
Song, Wenfeng, et al. "5-3: 3-Stacked Top-Emitting White OLEDs with Super-Wide Color Gamut and High Efficiency." SID Symposium Digest of Technical Papers. vol. 50. No. 1. 2019.
Song, Wook, and Jun Yeob Lee. "Degradation mechanism and lifetime improvement strategy for blue phosphorescent organic light-emitting diodes." Advanced Optical Materials 5.9 (2017): 1600901.
Sonoda, Tohru, et al. "84-1: Invited Paper: 30-inch 4K Rollable OLED Display." SID Symposium Digest of Technical Papers. vol. 51. No. 1. 2020.
Spelt, J. K., Absolom, D. R., Neumann, A. W. "Solid Surface Tension: The Interpretation of Contact Angles by the Equation of State Approach and the Theory of Surface Tension Components." Langmuir 2.5 (1986): 620-625.
Spelt, J. K., Neumann, A. W. "Solid Surface Tension: The Equation of State Approach and the Theory of Surface Tension Components. Theoretical and Conceptual Considerations." Langmuir 3 (1987): 588-591.
Spoljaric, S. et al., "Novel Elastomer-Dumbbell Functionalized POSS Composites: Thermomechanical and Morphological Properties", Journal of Applied Polymer Science, 123.1 (2012):585-600.
Starr, F.W. et al., "Bound Layers 'Cloak' Nanoparticles in Strongly Interacting Polymer Nanocomposites", ACS Nano, 10.12 (2016): 10960-10965.
Steely, Lee B., et al. "Foam formation from fluorinated polyphosphazenes by liquid CO2 processing." Polymer Engineering & Science 48.4 (2008): 683-686.
Stokes, H. N. "On trimetaphosphimic acid and its decomposition-products." Amer. chem. J. 18 (1986): 629-663.
Stokes, Ho No. "On the chloronitrides of phosphorus." Amer. Chem. 17 (1985): 275-291.
Sun, J. et al. "6-4: Late-News Paper: Realizing Deep Blue Emission in Blue Phosphorescent Organic Light-Emitting Diodes", SID Symposium Digest of Technical Papers, 51,2020: 65-66.
Sun, T. et al., "Reversible Switching between Superhydrophilicity and Superhydrophobicity", Angew. Chem. Int. Ed., 43.3 (2004):357-360.
Sundaram, P. M., et al. "The Reaction of N4P4CI8 with Dibenzylamine: Formation of an Unusual Bicyclic Phosphazene, N4P4 [N (CH2Ph) 2] 6 (NCH2Ph), by Dealkylation." Phosphorus and Sulfur and the Related Elements 8.3 (1980): 373-374.
Svorcik, V. et al., "Deposition of Polystyrene Films by Vacuum Evaporation", Journal of Materials Science Letters, 16 (1997): 1564-1566.
Syafiq, A., et al. "Superhydrophilic Smart Coating for Self-Cleaning Application on Glass Substrate." Journal of Nanomaterials 2018 (2018).
Szab?, D?nes, et al. "Synthesis of novel lipophilic and/or fluorophilic ethers of perfluoro-tert-butyl alcohol, perfluoropinacol and hexafluoroacetone hydrate via a Mitsunobu reaction: Typical cases of ideal product separation." Journal of Fluorine Chemistry 126.4 (2005): 639-650.
T?pper, Tino, et al. "Tailoring the mass distribution and functional group density of dimethylsiloxane-based films by thermal evaporation." APL Materials 4.5 (2016): 056101.
Takele, H. et al., "Plasmonic Properties of Ag Nanoclusters in Various Polymer Matrices", Nanotechnology, 17.14 (2006):3499-3505.
Tang, Meixian, et al. "Inhibition of bacterial adhesion and biofilm formation by a textured fluorinated alkoxyphosphazene surface." Bioactive Materials 6.2 (2021): 447-459.
Tang, Quan, et al. "28-2: Study of the Image Blur through Ffs LCD Panel Caused by Diffraction for Camera under Panel." SID Symposium Digest of Technical Papers. vol. 51. No. 1. 2020.

(56) References Cited

OTHER PUBLICATIONS

Tao, C. et al., "Highly Icephobic Properties on Slippery Surfaces Formed From Polysiloxane and Fluorinated POSS", Progress in Organic Coatings, 103 (2017):48-59.
Tarasevich, Y. I. "Surface energy of oxides and silicates." Theoretical and Experimental Chemistry 42 (2006): 145-161.
Thran, A., et al. "Condensation coefficients of Ag on polymers." Physical review letters 82.9 (1999): 1903-1906.
Thurston, John H., et al. "Toward a General Strategy for the Synthesis of Heterobimetallic Coordination Complexes for Use as Precursors to Metal Oxide Materials :? Synthesis, Characterization, and Thermal Decomposition of Bi2(Hsal)6?M(Acac)3 (M = Al, Co, V, Fe, Cr)." Inorganic chemistry 43.10 (2004): 3299-3305.
Tian, Zhicheng, Chen Chen, and Harry R. Allcock. "New Mixed-Substituent Fluorophosphazene High Polymers and Small Molecule Cyclophosphazene Models: Synthesis, Characterization, and Structure Property Correlations." Macromolecules 48.5 (2015): 1483-1492.
Tian, Zhicheng, et al. "Limits to expanding the PN-F series of polyphosphazene elastomers." Polymer Engineering & Science 54.8 (2014): 1827-1832.
Tian, Zhicheng, et al. "Phosphazene high polymers and models with cyclic aliphatic side groups: new structure-property relationships." Macromolecules 48.13 (2015): 4301-4311.
Tokuchi. S. et al. "8-4: Oxide Semiconductor In—Zn—O—X system with High Electron Mobility." SID Symposium Digest of Technical Papers 54.1 (2023).
Tong, T. et al., "Adhesion in Organic Electronics Structures", Journal of Applied Physics, 106.8 (2009): 083708.
Töpper, T. et al. "Siloxane-based thin films for biomimetic low-voltage dielectric actuators." Sensors and Actuators A: Physical 233 (2015): 32-41.
Trautner, Frank, et al. "Gas-Phase Structure of Hexakis (trifluoromethyl)-cyclotriphosphazene, [(CF3) 2PN] 3." Inorganic Chemistry 39.23 (2000): 5398-5399.
Tsai, Yu-Hsiang, et al. "p. 202: A Flexible Transparent OLED Display with FlexUPTM Technology." SID Symposium Digest of Technical Papers. vol. 48. No. 1. 2017.
Tsubuku, M. et al. "8-1: Invited Paper: High Mobility Poly-Crystalline Oxide TFT Achieving Mobility over 50 cm2/Vs and High Level of Uniformity on the Large Size Substrates." SID Symposium Digest of Technical Papers 54.1 (2023).
Tsujioka, Tsuyoshi, and Kosuke Tsuji. "Metal-vapor deposition modulation on soft polymer surfaces." Applied Physics Express 5.2 (2012): 021601.
Tsujioka, Tsuyoshi, et al. "Metal-vapor integration/transportation based on metal-atom desorption from polymer surfaces with a low glass-transition temperature." Journal of Vacuum Science & Technology A 35.2 (2017).
Tsujioka, Tsuyoshi, et al. "Selective metal deposition on photoswitchable molecular surfaces." Journal of the American Chemical Society 130.32 (2008): 10740-10747.
Tsujioka, Tsuyoshi, Rie Takagi, and Takahiro Shiozawa. "Light-controlled metal deposition on photochromic polymer films."? Journal of Materials Chemistry?20.43 (2010): 9623-9627.
Tu, Kuan-Heng, et al. "A cyano-rich small molecule dopant for organic thermoelectrics." Organic Electronics 87 (2020): 105978.
Tuteja, A. et al., "Designing Superoleophobic Surfaces", Science, 318.5856 (2007): 1618-1622.
Umemoto, Teruo, et al. "Discovery of practical production processes for arylsulfur pentafluorides and their higher homologues, bis- and tris(sulfur pentafluorides): Beginning of a new era of 'super-trifluoromethyl' arene chemistry and its industry." Beilstein Journal of Organic Chemistry 8 (2012): 461-471.
Uslu, A. and Yesilot, S., "Chiral Configurations in Cyclophosphazene Chemistry", Coordination Chemistry Reviews, 291 (2015):28-67.
Usui, H. et al., "Anthracene and Polyethylene Thin Film Depositions by lonized Cluster Beam", J. Vac. Sci. Technol., 4.1 (1986):52-60.
Usui, H. et al., "Effect of Substrate Temperature on the Deposition of Polytetrafluoroethylene by an Ionization-Assisted Evaporation Method", Journal of Vacuum Science & Technology A, 13.5 (1995):2318-2324.
Usui, H., "Deposition of Polymeric Thin Films by Ionization-Assisted Method", IEICE Trans. Electron., E83-C:7 (2000):1128-1133.
Vampola, K. J. et al. "12-1: Invited Paper: Through-OLED Display Ambient Color Sensing." SID Symposium Digest of Technical Papers. 53.1 (2022).
Van de Grampel, R.D., "Surfaces of Fluorinated Polymer Systems", Doctoral Thesis, Technische Universiteit Eindhoven (2002).
Varagnolo, Silvia, et al. "Embedded-grid silver transparent electrodes fabricated by selective metal condensation."? Journal of Materials Chemistry C?8.38 (2020): 13453-13457.
Varagnolo, Silvia, et al. "Selective deposition of silver and copper films by condensation coefficient modulation." Electronic Supplementary Material (ESI) for Materials Horizons. (2020).
Varagnolo, Silvia, et al. "Selective deposition of silver and copper films by condensation coefficient modulation." Materials Horizons 7.1 (2020): 143-148.
Vasilak, L. et al., "Statistical Paradigm for Organic Optoelectronic Devices: Normal Force Testing for Adhesion of Organic Photovoltaics and Organic Light-Emitting Diodes", ACS Appl. Mater. Interfaces, 9.15 (2017), 13347-13356.
Vassileva, P., et al. "XPS determination of the binding energies of phosphorus and nitrogen in phosphazenes." Journal of materials science 39.9 (2004): 3201-3202.
Vij, A. et al. "Self Assembly of Ultrahydrophobic 'Teflon-Mimicking' Fluorinated (Polyhedral Oligomeric Silsesquioxanes) POSS Nano Columns" 14th European Symposium on Fluorine Chemistry, Poland (2004).
Vitos, Levente, et al. "The surface energy of metals." Surface science 411.1-2 (1998): 186-202.
Vogelsang, D.F. et al., "Separation of Asymmetrically Capped Double-Decker Silsesquioxanes Mixtures", Polyhedron, 155 (2018): 189-193.
von R. Schleyer, P. and Nicholas, R. D., "The Reactivity of Bridgehead Compounds of Adamantane", J. Am. Chem. Soc., 83.12 (1961):2700-2707.
Vu, B.D. et al., "Simple Two-step Procedure for the Synthesis of Memantine Hydrochloride from 1,3- Dimethyl-adamantane", ACS Omega, 5.26 (2020): 16085-16088.
Wadley, Maurice L., et al. "Solvent Dependence of the Morphology of Spin-Coated Thin Films of Polydimethylsiloxane-Rich Polystyrene-block-Polydimethylsiloxane Copolymers." Macromolecules 45.13 (2012): 5538-5545.
Wahl, Helene, Delia A. Haynes, and Tanya le Roex. "A series of polymorphs of hexakis (4-fluorophenoxy) cyclotriphosphazene." Crystal growth & design 12.8 (2012): 4031-4038.
Walker, Amy V., et al. "Dynamics of interaction of magnesium atoms on methoxy-terminated self-assembled monolayers: an example of a reactive metal with a low sticking probability." The Journal of Physical Chemistry C 111.2 (2007): 765-772.
Walsh, Patrick N., Harold W. Goldstein, and David White. "Vaporization of Rare-Earth Oxides." Journal of the American Ceramic Society 43.5 (1960): 229-233.
Wang, B. et al., "Graded-Index Fluoropolymer Antireflection Coatings for Invisible Plastic Optics", Nano Lett. 19.2 (2019):787-792.
Wang, C. et al., "Stable Superhydrophobic Polybenzoxazine Surfaces over a Wide pH Range", Langmuir, 22.20 (2006):8289-8292.
Wang, Hailiang, et al. "P-132: An Under-Display Camera Optical Structure for Full-Screen LCD." SID Symposium Digest of Technical Papers. vol. 51. No. 1. 2020.
Wang, J. et al. "A new fluorinated polysiloxane with good optical properties and low dielectric constant at high frequency based on easily available tetraethoxysilane (TEOS)." Macromolecules 50.23 (2017): 9394-9402.
Wang, J. et al., "Fluorinated and Thermo-Cross-Linked Polyhedral Oligomeric Silsesquioxanes: New Organic-Inorganic Hybrid Materials for High Performance Dielectric Application", ACS Appl. Mater. Interfaces, 9.14 (2017):12782-12790.

(56) References Cited

OTHER PUBLICATIONS

Wang, Maw Ling, and Ho Sheng Wu. "Kinetic study of the substitution reaction of hexachlorocyclotriphosphazene with 2, 2, 2-trifluoroethanol by phase-transfer catalysis and separation of the products." Industrial & engineering chemistry research 29.10 (1990): 2137-2142.
Wang, Y. et al., "Substrate Effect on the Melting Temperature of Thin Polyethylene Films", Physical Review Letters, 96.2 (2006):028303.
Wang, Y., and Q. J. Wang. "Lubrication regimes." Encyclopedia of Tribology (2013): 2056.
Wang, Zhibin, et al. "55-1: Invited Paper: Self-Assembled Cathode Patterning in AMOLED for Under-Display Camera."?SID Symposium Digest of Technical Papers. vol. 51. No. 1. 2020.
Wang, Zhibin, et al. "60-5: Late-News Paper: 17-inch Transparent AMOLED Display With Self- Assembled Auxiliary Electrode." SID Symposium Digest of Technical Papers. vol. 50. No. 1. 2019.
Wei, H. and Eilers, H., "Electrical Conductivity of Thin-Film Composites Containing Silver Nanoparticles Embedded in a Dielectric Fluoropolymer Matrix", Thin Solid Films, 517.2 (2008):575-581.
Wei, Qiang, et al. "Small-Molecule Emitters with High Quantum Efficiency: Mechanisms, Structures, and Applications in OLED Devices." Advanced Optical Materials 6.20 (2018): 1800512.
Weigel, W.K. et al., "Direct Radical Functionalization Methods to Access Substituted Adamantanes and Diamondoids", Org. Biomol. Chem., 20 (2022): 10-36.
Weimer, P. K. "Physics of Thin Films, vol. 2.". Academic Press, (1964).
Weiss, F.M. et al., "Molecular Beam Deposition of High-Permittivity Polydimethylsiloxane for Nanometer-Thin Elastomer Films in Dielectric Actuators", Materials and Design, 105 (2016): 106-113.
Wheeler, Bob L., et al. "A silicon phthalocyanine and a silicon naphthalocyanine: synthesis, electrochemistry, and electrogenerated chemiluminescence." Journal of the American Chemical Society 106.24 (1984): 7404-7410.
Wilcock, Donald F. "Vapor pressure-viscosity relations in methylpolysiloxanes." Journal of the American Chemical Society 68.4 (1946): 691-696.
Winget, P. et al. "57-1: Accelerating Next-Generation Display Materials Development with a Smart Digital Chemistry Platform." SID Symposium Digest of Technical Papers 54.1 (2023).
Winter, R. W., et al. "The application of novel methodology for the synthesis of o-, m-, and p-(SF5-perfluoroethyl) benzene derivatives." Journal of fluorine chemistry 122.2 (2003): 251-253.
Wojtczak, L., "The Melting Point of Thin Films", Phys. Stat. Sol., 23.2 (1967):K163-K166.
Wolf, Florian F., Joerg-M. Neudoerfl, and Bernd Goldfuss. "Hydrogen-bonding cyclodiphosphazanes: superior effects of 3, 5-(CF 3) 2-substitution in anion-recognition and counter-ion catalysis." New Journal of Chemistry 42.7 (2018): 4854-4870.
Wolfgang Decker, Vast Films, Ltd. "Pattern Metallization: Selective Deposition of Metals on Polymer Films for Functional Applications" AIMCAL Fall Conference 2005.
Wu, Y. et al. "P-13.5: Investigation on Chromatic Dispersion of Reflection for CFOT Display" SID Symposium Digest of Technical Papers 54 (2023).
Wu, Yinghua, and Jean-Luc Br?das. "Simulations of the emission spectra of fac-tris (2-phenylpyridine) iridium and Duschinsky rotation effects using the Herman-Kluk semiclassical initial value representation method." The Journal of chemical physics 129.21 (2008): 214305.
Wu, Zhongyuan, et al. "34-2: Distinguished Paper: Development of 55inch 8K AMOLED TV by Inkjet Printing Process."?SID Symposium Digest of Technical Papers. vol. 51. No. 1. 2020.
Xia, Zhen-Yuan, et al. "High performance organic light-emitting diodes based on tetra (methoxy)-containing anthracene derivatives as a hole transport and electron-blocking layer." Journal of Materials Chemistry 20.38 (2010): 8382-8388.
Xie, J. et al., "Regioselective Synthesis of Methyl-Substituted Adamantanes for Promoting Oxidation Stability of High-Density Fuels", Energy Fuels, 34.4 (2020): 4516-4524.
Xu, Guang-Rui, Miao-Jun Xu, and Bin Li. "Synthesis and characterization of a novel epoxy resin based on cyclotriphosphazene and its thermal degradation and flammability performance." Polymer degradation and stability 109 (2014): 240-248.
Xu, Haoran, et al. "Fabrication of copper patterns on polydimethylsiloxane through laser-induced selective metallization." Industrial & Engineering Chemistry Research 60.24 (2021): 8821-8828.
Xu, Hua, et al. "Transparent AMOLED Display Derived by Metal Oxide Thin Film Transistor with Praseodymium Doping." Proceedings of the International Display Workshops vol. 26 (IDW '19). 2019.
Xu, J. et al., "Polyhedral Oligomeric Silsesquioxanes Tethered with Perfluoroalkylthioether Corner Groups: Facile Synthesis and Enhancement of Hydrophobicity of Their Polymer Blends", Journal of Materials Chemistry, 19.27 (2009):4740-4745.
Xu, Pengyun, et al. "Superhydrophobic ceramic coating: Fabrication by solution precursor plasma spray and investigation of wetting behavior." Journal of Colloid and Interface Science 523 (2018): 35-44.
Xu, X. et al. "A Unified Spatial-Angular Structured Light for Single-View Acquisition of Shape and Reflectance" Proceedings of the IEEE/CVF Conference on Computer Vision and Pattern Recognition (2023).
Xu, Y. et al. "Depth Estimation by Combining Binocular Stereo and Monocular Structured-Light" Proceedings of the IEEE/CVF Conference on Computer Vision and Pattern Recognition (2022).
Yamada, Toshikazu, et al. "Nanoparticle chemisorption printing technique for conductive silver patterning with submicron resolution." Nature communications 7.1 (2016): 1-9.
Yang, H. et al., "Catalyst-Controlled C-H Functionalization of Adamantanes Using Selective H-Atom Transfer", ACS Catal., 9.6 (2019):5708-5715.
Yang, J. et al. "25-4: Methodology and Correlation of Al-Based Design for OLED Materials." SID Symposium Digest of Technical Papers 52.1 (2021).
Yang, Jun-Yu, et al. "32-3: AMOLED IR Drop Compensation for Channel Length Modulation." SID Symposium Digest of Technical Papers. vol. 51. No. 1. 2020.
Yang, Min K., Roger H. French, and Edward W. Tokarsky. "Optical properties of Teflon® AF amorphous fluoropolymers." Journal of Micro/Nanolithography, MEMS, and MOEMS 7.3 (2008):033010.
Yanyan, Z. H. U., F. A. N. G. Zebo, and L. I. U. Yongsheng. "Structural and optical properties of Er203 films." Journal of Rare Earths 28.5 (2010): 752-755.
Yao, Pan, et al. "Highly soluble and thermally stable copolyimides modified with trifluoromethyl and siloxane." Journal of Applied Polymer Science 132.13 (2015).
Yao, Wenqiang, Yongjun Li, and Xiaoyu Huang. "Fluorinated poly (meth) acrylate: Synthesis and properties." Polymer 55.24 (2014): 6197-6211.
Yao, Y. et al. "P-7.12: Research on High Brightness Mode Uniformity Problem of Flexible AMOLED Mobile" SID Symposium Digest of Technical Papers 54 (2023).
Yao, Z. et al. "Inverse design of nanoporous crystalline reticular materials with deep generative models." Nature Machine Intelligence 3.1 (2021): 76-86.
Yersin, Hartmut, et al. "Design of a new mechanism beyond thermally activated delayed fluorescence toward fourth generation organic light emitting diodes." Chemistry of Materials 31.16 (2019): 6110-6116.
Yersin, Hartmut, et al. "The triplet state of organo-transition metal compounds. Triplet harvesting and singlet harvesting for efficient OLEDs." Coordination Chemistry Reviews 255.21-22 (2011): 2622-2652.
Yeung, Leo WY, Christopher Stadey, and Scott A. Mabury. "Simultaneous analysis of perfluoroalkyl and polyfluoroalkyl substances including ultrashort-chain C2 and C3 compounds in rain and river water samples by ultra performance convergence chromatography." Journal of Chromatography A 1522 (2017): 78-85.

(56) References Cited

OTHER PUBLICATIONS

Yi, N. et al., "Preparation of Microstructure-Controllable Superhydrophobic Polytetrafluoroethylene Porous Thin Film by Vacuum Thermal-Evaporation", Front. Mater. Sci. 10.3 (2016):320-327.
Yoo, D. et al. "Retrosynthesis Planning for Thermally Activated Delayed Fluorescence Molecules" The 21st International Meeting on Information Display, Seoul, Korea (2021).
Yook, Kyoung Soo, and Jun Yeob Lee. "Organic materials for deep blue phosphorescent organic light-emitting diodes." Advanced materials 24.24 (2012): 3169-3190.
Yoshinaga, Harunobu, et al. "Spin—orbit coupling analyses of phosphorescence: the effects of cyclometalated ligand replacement in fac-Ir (ppy) 3 with various bpy ligands on blue phosphorescence." RSC advances 6.69 (2016): 65020-65030.
Youn, S. et al. "73-4: Novel Materials and Structures for High Efficiency and Long Lifetime Green Phosphorescent OLEDs in Automotive Applications." SID Symposium Digest of Technical Papers. 53.1 (2022).
Yu, Jun Ho, et al. "64-2: Fabrication of Auxiliary Electrodes using Ag Inkjet Printing for OLED Lighting." SID Symposium Digest of Technical Papers. vol. 49. No. 1. 2018.
Yuan, Fulong, et al. "A modified method for preparation of a pure octachlorocyclotetraphosphazene." Phosphorus, Sulfur, and Silicon and the Related Elements 176.1 (2001): 77-81.
Yun, J. et al. "A Novel Electroplex Host with Dual Triplet Exciton Up-Converting Channels for Long Lifetime Blue Phosphorescent Organic Light-Emitting Diodes" The 21st International Meeting on Information Display, Seoul, Korea (2021).
Zalewski, K. et al., "A Review of Polysiloxanes in Terms of Their Application in Explosives", Polymers, 13.7 (2021):1080-1090.
Zaporojtchenko, V., et al. "Condensation coefficients of noble metals on polymers: a novel method of determination by x-ray photoelectron spectroscopy." Surface and Interface Analysis: An International Journal devoted to the development and application of techniques for the analysis of surfaces, interfaces and thin films 30.1 (2000): 439-443.
Zaporojtchenko, V., et al. "Controlled growth of nano-size metal clusters on polymers by using VPD method."?Surface science?532 (2003): 300-305.
Zaporojtchenko, V., et al. "Determination of condensation coefficients of metals on polymer surfaces."?Surface science?454 (2000): 412-416.
Zaporojtchenko, V., et al. "Formation of metal-polymer interfaces by metal evaporation: influence of deposition parameters and defects." Microelectronic engineering 50.1-4 (2000): 465-471.
Zaporojtchenko, V., et al. "Metal/polymer interfaces with designed morphologies." Journal of Adhesion Science and Technology 14.3 (2000): 467-490.
Zarian, J., P. C. Painter, and M. M. Coleman. "Vibrational Spectra and Normal Coordinate Calculations of Chlorophosphazene Compounds. II. Octachlorocyclotetraphosphazene." Applied Spectroscopy 36.3 (1982): 272-277.
Zeng, Yang, et al. "28-4: Investigation of Moir? Interference in Pinhole Matrix Fingerprint on Display Technology." SID Symposium Digest of Technical Papers. vol. 51. No. 1. 2020.
Zhang, Bing, et al. "P-124: A 17.3-inch WQHD Top-Emission Foldable AMOLED Display with Outstanding Optical Performance and Visual Effects."?SID Symposium Digest of Technical Papers. vol. 51. No. 1. 2020.
Zhang, Hao, et al. "P-131: A Design of Under-screen Face Recognition based on Screen Miniature Blind Apertures." SID Symposium Digest of Technical Papers. vol. 51. No. 1. 2020.
Zhang, Tianyu, et al. "Transparent white organic light-emitting devices with a LiF/Yb: Ag cathode." Optics letters 34.8 (2009): 1174-1176.
Zhang, Tianzhan, et al. "Bio-inspired superhydrophilic coatings with high anti-adhesion against mineral scales." NPG Asia Materials 10.3 (2018): e471-e471.
Zhang, W. et al., "Polymer/polyhedral Oligomeric Silsesquioxane (POSS) Nanocomposites: An Overview of Fire Retardance", Progress in Polymer Science, 67 (2017):77-125.
Zhang, W. et al., "Why We Need to Look Beyond the Glass Transition Temperature to Characterize the Dynamics of Thin Supported Polymer Films", PNAS Latest Articles, 115.22 (2018): 5641-5646.
Zhang, Xu, et al. "General approach to compute phosphorescent OLED efficiency." The Journal of Physical Chemistry C 122.11 (2018): 6340-6347.
Zhang, Xuan, et al. "Synthesis of extended polycyclic aromatic hydrocarbons by oxidative tandem spirocyclization and 1, 2-aryl migration." Nature communications 8.1 (2017): 1-8.
Zhang, Yongjie, Mingshuai Fan, and Xiaopei Li. "Reaction of "unreactive" silicone: synthesis of long-chain alkyl fluorosilicone via a simple siloxane equilibration process." Polymer Bulletin 77.6 (2020): 2855-2871.
Zhang, Zhenhua. "74-3: Image Deblurring of Camera Under Display by Deep Learning."?SID Symposium Digest of Technical Papers. vol. 51. No. 1. 2020.
Zhao, Lei, Daqun Chen, and Weihua Hu. "Patterning of metal films on arbitrary substrates by using polydopamine as a UV-sensitive catalytic layer for electroless deposition." Langmuir 32.21 (2016): 5285-5290.
Zhao, Xuan, et al. "P-233: Late-News-Poster: Color Shift Improvement of AMOLED Device with Color Filter." SID Symposium Digest of Technical Papers. vol. 51. No. 1. 2020.
Zharkova, N. M., M. A. Kleinovskaya, and Yu K. Molokanov. "Evaporation of oligoorganic siloxanes under hgh vacuum." Chemistry and Technology of Fuels and Oils 5.4 (1969): 257-261.
Zheng, Bi-Yuan, et al. "Synthesis and antifungal photodynamic activities of a series of novel zinc(II) phthalocyanines substituted with piperazinyl moieties." Dyes and Pigments 99.1 (2013): 185-191.
Zheng, Dongxiao, Pei Zhao, and Liangliang Zhu. "Non-conjugated and p-conjugated functional ligands on semiconductive quantum dots." Composites Communications 11 (2019): 21-26.
Zhu, C. et al. "A novel synthetic UV-curable fluorinated siloxane resin for low surface energy coating." Polymers 10.9 (2018): 979.
Zhu, X. L., et al. "29.3: Very Bright and Efficient Top-Emitting OLED with Ultra-Thin Yb as Effective Electron Injector." SID Symposium Digest of Technical Papers. vol. 37. No. 1. Oxford, UK: Blackwell Publishing Ltd, 2006.
Zibarov, A. et al., "AB5 Derivatives of Cyclotriphosphazene for the Synthesis of Dendrons and Their Applications", Molecules, 26.13 (2021): 4017-4040.

$1200_a$

PATTERNING A CONDUCTIVE DEPOSITED LAYER USING A NUCLEATION INHIBITING COATING AND AN UNDERLYING METALLIC COATING

RELATED APPLICATIONS

The present application is a National Stage Entry under 35 U.S.C. § 371 of International Application No. PCT/IB2021/061385, filed 7 Dec. 2021, which claims the benefit of priority to: US Provisional Patent Application Nos. U.S. 63/122,421 filed 7 Dec. 2020, U.S. 63/129,163 filed 22 Dec. 2020 and U.S. 63/141,857 filed 26 Jan. 2021, the contents of each of which are incorporated herein by reference in their entirety.

TECHNICAL FIELD

The present disclosure relates to layered semiconductor devices and in particular to a layered semiconductor device having a conductive deposited material controllably deposited on a lateral portion of an exposed layer surface thereof, patterned using a patterning coating, which may act as and/or be a nucleation-inhibiting coating (NIC) and/or such NIC, in a fabrication process.

BACKGROUND

In an opto-electronic device such as an organic light emitting diode (OLED), at least one semiconducting layer is disposed between a pair of electrodes, such as an anode and a cathode. The anode and cathode electrically coupled to a power source end respectively generate holes and electrons that migrate toward each other through the at least one semiconducting layer. When a pair of holes and electrons combine, a photon may be emitted.

OLED display panels may comprise a plurality of (sub-) pixels, each of which has an associated pair of electrodes. Various layers and coatings of such panels are typically formed by vacuum-based deposition techniques.

In some applications, there may be an aim to provide a conductive deposited layer in a pattern for each (sub-) pixel of the panel across either or both of a lateral and a longitudinal aspect thereof, by selective deposition of the conductive coating to form a device feature, such as, without limitation, an electrode and/or a conductive element electrically coupled thereto, during the OLED manufacturing process.

One method for doing so, in some non-limiting applications, involves the interposition of a fine metal mask (FMM) during deposition of an electrode material and/or a conductive element electrically coupled thereto. However, materials typically used as electrodes have relatively high evaporation temperatures, which impacts the ability to re-use the FMM and/or the accuracy of the pattern that may be achieved, with attendant increases in cost, effort and complexity.

One method for doing so, in some non-limiting examples, involves depositing the electrode material and thereafter removing, including by a laser drilling process, unwanted regions thereof to form the pattern. However, the removal process often involves the creation and/or presence of debris, which may affect the yield of the manufacturing process.

Further, such methods may not be suitable for use in some application and/or with some devices with certain topographical features.

In some non-limiting examples, there may be an aim to provide an improved mechanism for providing selective deposition of a deposited material.

BRIEF DESCRIPTION OF THE DRAWINGS

Examples of the present disclosure will now be described by reference to the following figures, in which identical reference numerals in different figures indicate identical and/or in some non-limiting examples, analogous and/or corresponding elements and in which.

Figure 1:
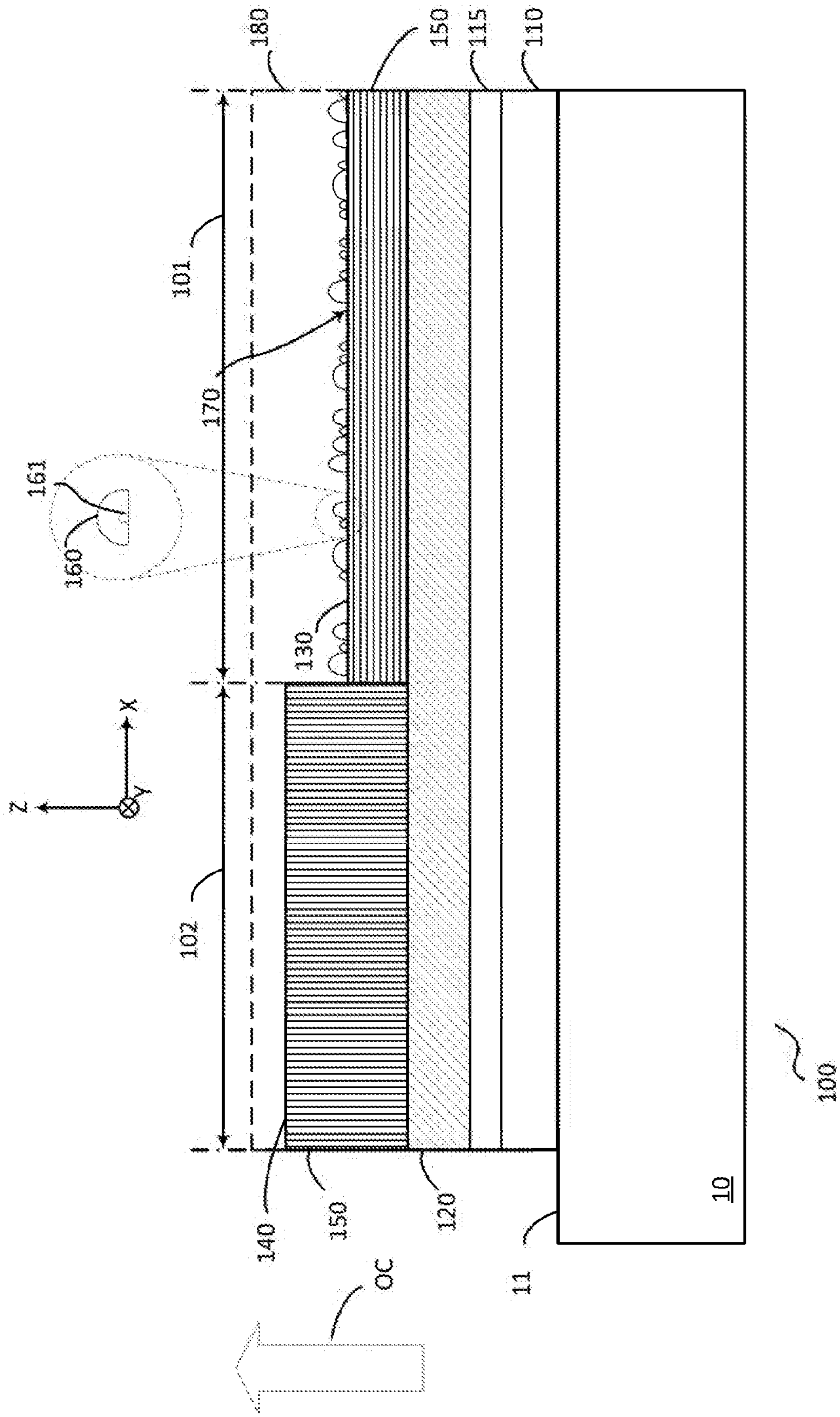
FIG. 1 is a simplified block diagram from a cross-sectional aspect, of an example device having a plurality of layers in a lateral aspect, formed by deposition of an orientation layer, selective deposition of a patterning coating thereon in a first portion of the lateral aspect, followed by deposition of a closed coating of deposited material in a second portion thereof, according to an example in the present disclosure.
Figure 2:
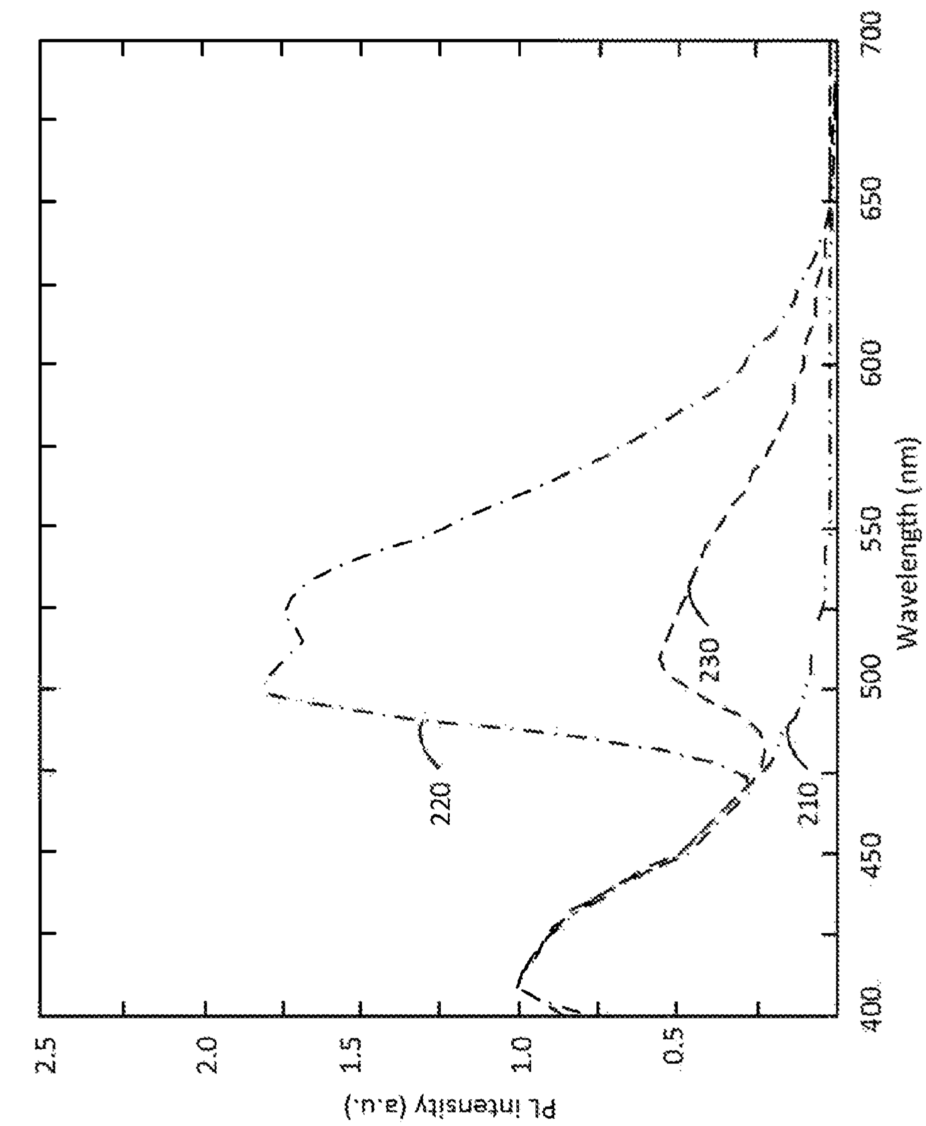
FIG. 2 is a plot of photoluminescence intensity as a function of wavelength for various experimental samples.
Figure 3:
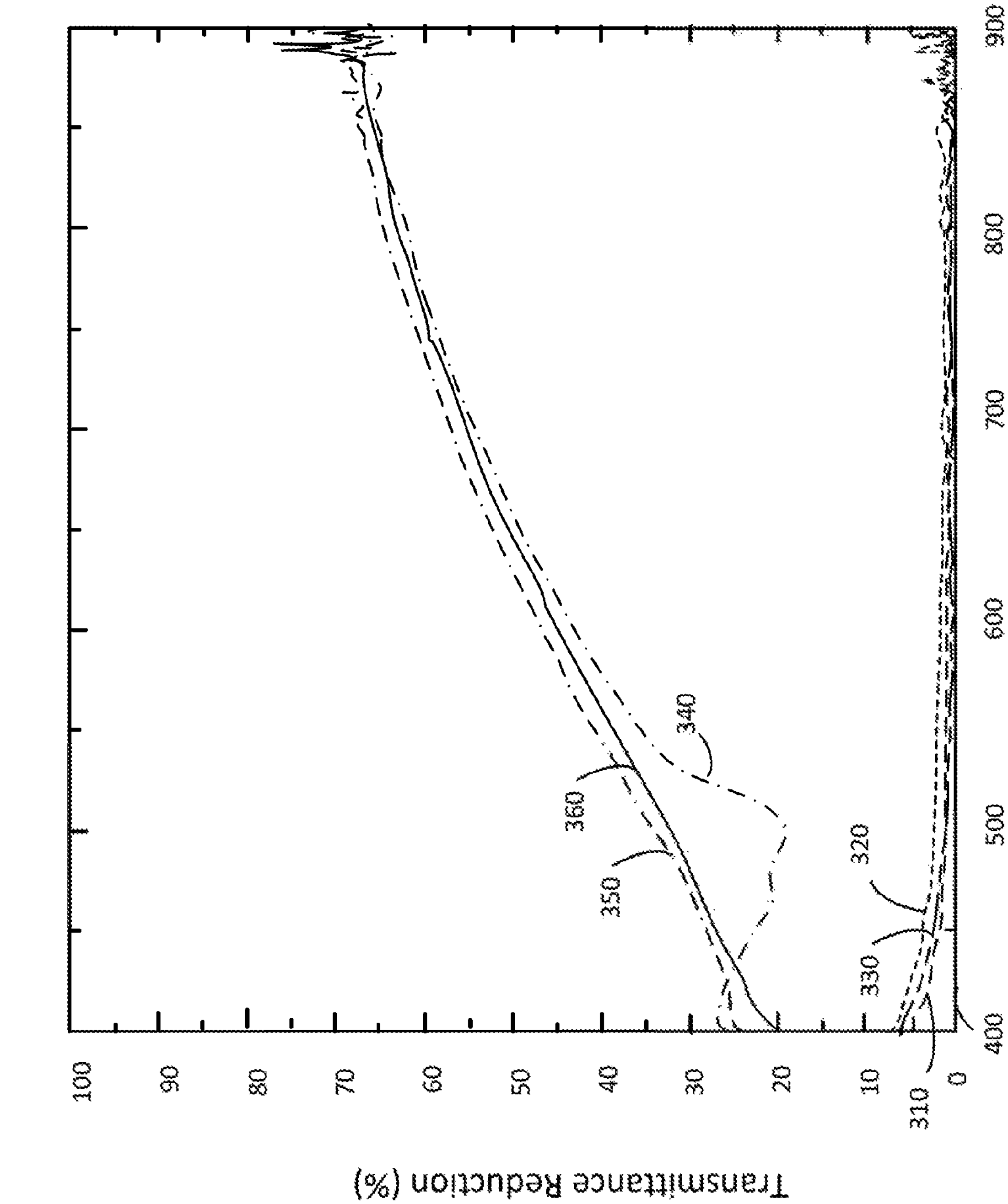
FIG. 3 is a plot of transmittance reduction as a function of wavelength for various experimental samples.

In the present disclosure, a reference numeral having at least one numeric value (including without limitation, in subscript) and/or lower-case alphabetic character(s) (including without limitation, in lower-case) appended thereto, may be considered to refer to a particular instance, and/or subset thereof, of the element or feature described by the reference numeral. Reference to the reference numeral without reference to the appended value(s) and/or character(s) may, as the context dictates, refer generally to the element(s) or feature(s) described by the reference numeral, and/or to the set of all instances described thereby. Similarly, a reference numeral may have the letter "x' in the place of a numeric digit. Reference to such reference numeral may, as the context dictates, refer generally to the element(s) or feature(s) described by the reference numeral, where the character "x" is replaced by a numeric digit, and/or to the set of all instances described thereby.

In the present disclosure, for purposes of explanation and not limitation, specific details are set forth to provide a thorough understanding of the present disclosure, including, without limitation, particular architectures, interfaces and/or techniques. In some instances, detailed descriptions of well-known systems, technologies, components, devices, circuits, methods, and applications are omitted to not obscure the description of the present disclosure with unnecessary detail.

Further, it will be appreciated that block diagrams reproduced herein can represent conceptual views of illustrative components embodying the principles of the technology.

Accordingly, the system and method components have been represented where appropriate by conventional symbols in the drawings, showing only those specific details that are pertinent to understanding the examples of the present disclosure, to not obscure the disclosure with details that will be readily apparent to those of ordinary skill in the art having the benefit of the description herein.

Any drawings provided herein may not be drawn to scale and may not be considered to limit the present disclosure in any way.

Any feature or action shown in dashed outline may in some examples be considered as optional.

SUMMARY

It is an object of the present disclosure to obviate or mitigate at least one disadvantage of the prior art.

The present disclosure discloses a semiconductor device having a plurality of layers deposited on a substrate and extending in a first portion and a second portion of at least one lateral aspect defined by a lateral axis thereof, comprises an orientation layer comprising an orientation material, disposed on a first exposed layer surface of the device in at least the first portion; at least one patterning layer comprising a patterning material, disposed on a first exposed layer surface of the orientation layer; and at least one deposited layer comprising a deposited material, disposed on a second exposed layer surface of the device in the second portion; wherein the first portion is substantially devoid of a closed coating of the deposited material.

According to a broad aspect, there is disclosed a semiconductor device having a plurality of layers deposited on a substrate and extending in a first portion and a second portion of at least one lateral aspect defined by a lateral axis thereof, comprising: an orientation layer comprising an orientation material, disposed on a first exposed layer surface of the device in at least the first portion; at least one patterning layer comprising a patterning material, disposed on a first exposed layer surface of the orientation layer; and at least one deposited layer comprising a deposited material, disposed on a second exposed layer surface of the device in the second portion; wherein the first portion is substantially devoid of a closed coating of the deposited material.

In some non-limiting examples, the device may further comprise a supporting layer disposed in at least the first portion, wherein an exposed layer surface thereof is the first exposed layer surface.

In some non-limiting examples, the supporting layer may be at least one semiconducting layer of an opto-electronic device. In some non-limiting examples, the supporting layer may comprise an organic material.

In some non-limiting examples, the orientation layer may extend beyond the first portion into at least a part of the second portion. In some non-limiting examples, the orientation layer may extend across the second portion.

In some non-limiting examples, the orientation layer may be at least one of a closed coating and a discontinuous layer. In some non-limiting examples, the orientation layer may be formed as a thin film. In some non-limiting examples, the orientation layer may be formed as a single monolithic coating.

In some non-limiting examples, the orientation layer may have an average film thickness that is at least one of at least about: 2 nm, 3 nm, 5 nm, and 10 nm. In some non-limiting examples, the orientation layer may have an average film thickness that is in a range of at least one of between about: 1-100 nm, 5-50 nm, 6-30 nm, 7-20 nm, 8-15 nm, 5-25 nm, 8-20 nm, and 8.5-10 nm. In some non-limiting examples, the orientation layer may have an average film thickness that is substantially constant across its lateral extent.

In some non-limiting examples, the orientation material may have a characteristic surface energy that is high relative to a characteristic surface energy of the patterning material. In some non-limiting examples, at least one of the orientation layer and the orientation material may have a surface energy of at least one of at least about: 30 dynes/cm, 35 dynes/cm, 50 dynes/cm, 60 dynes/cm, 70 dynes/cm, 80 dynes/cm, and 100 dynes/cm. In some non-limiting examples, at least one of the orientation layer and the orientation material may have a surface energy of at least one of at least about: 50 dynes/cm, 100 dynes/cm, 200 dynes/cm, and 500 dynes/cm.

In some non-limiting examples, the orientation material may comprise at least one of: a metal, a metallic material, a non-metallic material, a semiconducting material, an insulating material, an organic material, and an inorganic material.

In some non-limiting examples, the orientation layer may comprise at least one additional element. In some non-limiting examples, the additional element may be a non-metallic element. In some non-limiting examples, the non-metallic element may be at least one of: oxygen (O), sulfur (S), nitrogen (N), and carbon (C). In some non-limiting examples, a concentration of the non-metallic element may be at least one of no more than about: 1%, 0.1%, 0.01%, 0.001%, 0.0001%, 0.00001%, 0.000001%, and 0.0000001%.

In some non-limiting examples, the orientation layer may comprise a plurality of layers of the metallic material. In some non-limiting examples, the metallic material of at least one of the plurality of layers may comprise a metal having a work function that is no more than about: 4 eV. In some non-limiting examples, the metallic material of a first of the plurality of layers may comprise a metal and the metallic material of a second one of the plurality of layers comprises a metal oxide.

In some non-limiting examples, the metallic material may comprise an element selected from potassium (K), sodium (Na), lithium (Li), barium (Ba), cesium (Cs), ytterbium (Yb), silver (Ag), gold (Au), copper (Cu), aluminum (Al), magnesium (Mg), zinc (Zn), cadmium (Cd), tin (Sn), yttrium (Y), nickel (Ni), titanium (Ti), palladium (Pd), chromium (Cr), iron (Fe), cobalt (Co), zirconium (Zr), platinum (Pt), vanadium (V), niobium (Nb), iridium (Ir), osmium (Os), tantalum (Ta), molybdenum (Mo), and tungsten (W). In some non-limiting examples, the element may comprise at least one of: Mg, Ag, and Yb.

In some non-limiting examples, the metallic material may comprise an alloy. In some non-limiting examples, the alloy may be at least one of: an Ag-containing alloy, an AgMg-containing alloy, an alloy of Ag with Mg, an alloy of Ag with Yb, an alloy of Ag, Mg, and Yb, and an alloy of Ag with at least one other metal.

In some non-limiting examples, the metallic material may comprise oxygen (O). In some non-limiting examples, the metallic material may comprise a metal oxide. In some non-limiting examples, the metal oxide may comprise at least one of zinc (Zn), indium (In), tin (Sn), antimony (Sb), and gallium (Ga). In some non-limiting examples, the metal oxide may comprise a transparent conducting oxide (TCO). In some non-limiting examples, the TCO may comprise at least one of: indium titanium oxide (ITO), indium zinc oxide (IZO), fluorine tin oxide (FTO), and indium gallium zinc oxide (IGZO). In some non-limiting examples, the metallic material may comprise at least one metal oxide and at least one of: a metal and a metal alloy.

In some non-limiting examples, the orientation material may comprise at least one of: silver (Ag), ytterbium (Yb), a magnesium-Ag alloy (MgAg), copper (Cu), fullerene, aluminum fluoride ($AlF_3$), and molybdenum trioxide ($MoO_3$).

In some non-limiting examples, at least one of the orientation layer and the orientation material may be electrically conductive.

In some non-limiting examples, a sheet resistance of the orientation layer may be at least one of at least about: 5Ω/□, 8Ω/□, 10Ω/□, 12Ω/□, 15Ω/□, 20Ω/□, 30Ω/□, 50Ω/□, 80Ω/□, and 100Ω/□. In some non-limiting examples, a sheet resistance of the orientation layer may be at least one of between about: 0.1-1,000 Ω/□, 1-100Ω/□, 2-50Ω/□, 3-30Ω/□, 4-20Ω/□, 5-15Ω/□, and 10-12Ω/□.

In some non-limiting examples, the at least one patterning coating is a nucleation inhibiting coating.

In some non-limiting examples, the at least one patterning coating may be a closed coating.

In some non-limiting examples, the patterning material may be substantially devoid of any chemical bonds with the orientation material.

In some non-limiting examples, an interface between the at least one patterning coating and the orientation layer may be substantially devoid of chemisorption.

In some non-limiting examples, at least one of the at least one patterning coating and the patterning material may have a contact angle with respect to tetradecane of at least one of at least about: 40°, 45°, 50°, 55°, 60°, 65°, and 70°. In some non-limiting examples, at least one of the at least one patterning coating and the patterning material may have a contact angle with respect to water of at least one of no more than about: 15°, 10°, 8°, and 5°.

In some non-limiting examples, the at least one patterning coating may have a surface energy of at least one of no more than about: 25 dynes/cm, 21 dynes/cm, 20 dynes/cm, 19 dynes/cm, 18 dynes/cm, 17 dynes/cm, 16 dynes/cm, 15 dynes/cm, 14 dynes/cm, 13 dynes/cm, 12 dynes/cm, 11 dynes/cm, and 10 dynes/cm. In some non-limiting examples, the at least one patterning coating may have a surface energy of at least one of at least about: 6 dynes/cm, 7 dynes/cm, and 8 dynes/cm. In some non-limiting examples, the at least one patterning coating may have a surface energy of at least one of between about: 10-20 dynes/cm, 13-19 dynes/cm, 15-19 dynes/cm, and 17-20 dynes/cm.

In some non-limiting examples, a surface energy of the orientation layer may exceed a surface energy of the at least one patterning coating.

In some non-limiting examples, an average layer thickness of the patterning coating may be at least one of no more than about: 10 nm, 8 nm, 7 nm, 6 nm, and 5 nm. In some non-limiting examples, an average layer thickness of the patterning coating may be at least one of no less than about: 1 nm, 2 nm, 3 nm, 4 nm, and 5 nm.

In some non-limiting examples, a refractive index of the at least one patterning coating may be at least one of no more than about: 1.55, 1.5, 1.45, 1.43, 1.4, 1.39, 1.37, 1.35, 1.32, and 1.3. In some non-limiting examples, a refractive index of the at least one patterning coating may be at least one of at least about: 1.35, 1.32, 1.3, and 1.25.

In some non-limiting examples, the at least one patterning coating may have a molecular weight of at least one of at least about: 1,200 g/mol, 1,300 g/mol, 1,500 g/mol, 1,700 g/mol, 2,000 g/mol, 2,200 g/mol, and 2,500 g/mol. In some non-limiting examples, the patterning material may have a molecular weight of at least one of no more than about: 5,000 g/mol 0, 4,500 g/mol, 4,000 g/mol, 3,800 g/mol, and 3,500 g/mol.

In some non-limiting examples, the patterning material may have a glass transition temperature of at least one of no more than about: 20° C., 0° C., −20, −30° C., and −50° C. In some non-limiting examples, the patterning material may have a glass transition temperature of at least one of at least about: 100° C., 110° C., 120° C., 130° C., 150° C., 170° C., and 200° C.

In some non-limiting examples, the patterning material may have a melting point at atmospheric pressure of at least one of at least about: 100° C., 120° C., 140° C., 160° C., 180° C., and 200° C.

In some non-limiting examples, the patterning material may have a sublimation temperature in high vacuum of at least one of between about: 100-320° C., 120-300° C., 140-280° C., and 150-250° C.

In some non-limiting examples, a monomer of the patterning material may comprise a monomer backbone and at least one functional group. In some non-limiting examples, the at least one functional group may be bonded to the monomer backbone. In some non-limiting examples, the at least one functional group may be bonded directly to the monomer backbone. In some non-limiting examples, the monomer may comprise at least one linker group bonded to the monomer backbone and the at least one functional group.

In some non-limiting examples, the patterning material may comprise an organic-inorganic hybrid material.

In some non-limiting examples, the patterning material may comprise an oligomer, or a polymer.

In some non-limiting examples, the patterning material may comprise a compound having a molecular structure comprising a plurality of moieties. In some non-limiting examples, a first moiety of the molecular structure of the patterning material may be bonded to at least one second moiety thereof. In some non-limiting examples, the first moiety and the second moiety may be bonded directly. In some non-limiting examples, the first moiety may be bonded to the second moiety by a third moiety.

In some non-limiting examples, a majority of molecules of the patterning material in the at least one patterning coating may be oriented such that the first moiety thereof is proximate to an exposed layer surface of the orientation layer and at least one of the at least one second moiety thereof and a terminal group thereof is proximate to an exposed layer surface of the at least one patterning coating. In some non-limiting examples, a molecule of the patterning material in the at least one patterning coating may be oriented such that the first moiety thereof is proximate to an exposed layer surface of the orientation layer and at least one of the at least one second moiety and a terminal group thereof is proximate to an exposed layer surface of the at least one patterning coating, the first moiety has a substantially planar structure defining a plane. In some non-limiting examples, when so oriented, the plane of the structure may lie substantially parallel to an interface between the orientation layer and the at least one patterning coating. In some non-limiting examples, when so oriented, the second moiety may be configurable to lie out of plane with respect to the plane of the structure.

In some non-limiting examples, a critical surface tension of at least one of: the first moiety and the second moiety, may be determined according to the formula:

$$\gamma = \left(\frac{P}{V_m}\right)^4$$

where:

γ represents the critical surface tension of a moiety;

P represents the Parachor of the moiety; and $V_m$ represents the molar volume of the moiety.

In some non-limiting examples, the first moiety may have a critical surface tension that exceeds a critical surface tension of the at least one second moiety. In some non-limiting examples, a quotient of the critical surface tension of the first moiety divided by the critical surface tension of the second moiety may be at least one of at least about: 5, 7, 8, 9, 10, 12, 15, 18, 20, 30, 50, 60, 80, and 100. In some non-limiting examples, the critical surface tension of the first moiety may exceed the critical surface tension of the at least one second moiety by at least one of at least about: 50 dynes/cm, 70 dynes/cm, 80 dynes/cm, 100 dynes/cm, 150 dynes/cm, 200 dynes/cm, 250 dynes/cm, 300 dynes/cm, 350 dynes/cm, and 500 dynes/cm. In some non-limiting examples, the critical surface tension of the first moiety may be at least one of at least about: 50 dynes/cm, 70 dynes/cm, 80 dynes/cm, 100 dynes/cm, 150 dynes/cm, 180 dynes/cm, 200 dynes/cm, 250 dynes/cm, and 300 dynes/cm.

In some non-limiting examples, a molecular weight attributable to the first moiety may be at least one of at least about: 50 g/mol, 60 g/mol, 70 g/mol, 80 g/mol, 100 g/mol, 120 g/mol, 150 g/mol, and 200 g/mol. In some non-limiting examples, a molecular weight attributable to the first moiety may be at least one of no more than about: 500 g/mol, 400 g/mol, 350 g/mol, 300 g/mol, 250 g/mol, 200 g/mol, 180 g/mol, and 150 g/mol.

In some non-limiting examples, the first moiety may comprise at least one of: an aryl group, a heteroaryl group, a conjugated bond, and a phosphazene group. In some non-limiting examples, the first moiety may comprise at least one of: a cyclic structure, a cyclic aromatic structure, an aromatic structure, a caged structure, a polyhedral structure, and a cross-linked structure. In some non-limiting examples, the first moiety may comprise a rigid structure.

In some non-limiting examples, the first moiety may comprise at least one of: a benzene moiety, a naphthalene moiety, a pyrene moiety, and an anthracene moiety. In some non-limiting examples, the first moiety may comprise at least one of: a cyclotriphosphazene moiety and a cyclotetraphosphazene moiety.

In some non-limiting examples, the first moiety may be a hydrophilic moiety.

In some non-limiting examples, the critical surface tension of the at least one second moiety may be at least one of no more than about: 25 dynes/cm, 21 dynes/cm, 20 dynes/cm, 19 dynes/cm, 18 dynes/cm, 17 dynes/cm, 16 dynes/cm, 15 dynes/cm, 14 dynes/cm, 13 dynes/cm, 12 dynes/cm, 11 dynes/cm, and 10 dynes/cm.

In some non-limiting examples, the at least one second moiety may comprise at least one of F and Si.

In some non-limiting examples, the at least one second moiety may comprise at least one of a substituted and an unsubstituted fluoroalkyl group.

In some non-limiting examples, the at least one second moiety may comprise at least one of: $C_1$-$C_{12}$ linear fluorinated alkyl, $C_1$-$C_{12}$ linear fluorinated alkoxy, $C_3$-$C_{12}$ branched fluorinated cyclic alkyl, $C_3$-$C_{12}$ fluorinated cyclic alkyl, and $C_3$-$C_{12}$ fluorinated cyclic alkoxy.

In some non-limiting examples, the at least one second moiety may comprise a siloxane group.

In some non-limiting examples, each moiety of the at least one second moiety may comprise a proximal group, bonded to at least one of the first moiety and the third moiety, and a terminal group arranged distal to the proximal group. In some non-limiting examples, the terminal group may comprise at least one of: a $CF_2H$ group, a $CF_3$ group, and a $CH_2CF_3$ group. In some non-limiting examples, each of the at least one second moieties may comprise at least one of: a linear fluoroalkyl group, and a linear fluoroalkoxy group.

In some non-limiting examples, a sum of a molecular weight of each of the at least one second moieties in a compound structure may be at least one of at least about: 1,200 g/mol, 1,500 g/mol, 1,700 g/mol, 2,000 g/mol, 2,500 g/mol, and 3,000 g/mol.

In some non-limiting examples, the at least one second moiety may comprise a hydrophobic moiety.

In some non-limiting examples, the third moiety may be a linker group. In some non-limiting examples, the third moiety may be at least one of: a single bond, O, N, NH, C, CH, $CH_2$, and S.

In some non-limiting examples, the patterning material may comprise a cyclophosphazene derivative represented by at least one of Formula (C-2) and (C-3):

Formula (C-2)

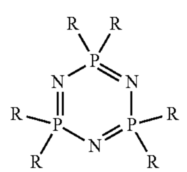

Formula (C-3)

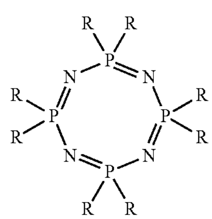

where:

R each independently represents and/or comprises, the second moiety.

In some non-limiting examples, R may comprise a fluoroalkyl group. In some non-limiting examples, the fluoroalkyl group may be a $C_1$-$C_{18}$ fluoroalkyl. In some non-limiting examples, the fluoroalkyl group may be represented by the formula:

$$*\text{—}(CH_2)_t(CF_2)_uZ$$

where:

t represents an integer between 1 and 3;

u represents an integer between 5 and 12; and

Z represents at least one of H, deutero (D), and F.

In some non-limiting examples, R may comprise the terminal group, the terminal group being arranged distal to the corresponding P atom to which R is bonded.

In some non-limiting examples, R may comprise the third moiety bonded to the second moiety.

In some non-limiting examples, the third moiety of each R may be bonded to the corresponding P atom in at least one of Formula (C-2) and (C-3).

In some non-limiting examples, the first moiety may be spaced apart from the second moiety.

In some non-limiting examples, a minimum value of a range of an average layer thickness of the at least one patterning coating may be at least one of at least about: 1 nm, 2 nm, 3 nm, 4 nm, and 5 nm. In some non-limiting examples, the a maximum value of a range of an average layer thickness of the at least one patterning coating may be at least one of no more than about: 5 nm, 6 nm, 7 nm, 8 nm, and 10 nm. In some non-limiting examples, a range of an average layer thickness of the at least one patterning coating may be at least one of between about: 2-6 nm, and 3-5 nm.

In some non-limiting examples, at least one of the at least one patterning coating and the patterning material may have an initial sticking probability against deposition of the deposited material, that is at least one of no more than about: 0.3, 0.2, 0.15, 0.1, 0.08, 0.05, 0.03, 0.02, 0.01, 0.008, 0.005, 0.003, 0.001, 0.0008, 0.0005, 0.0003, and 0.0001. In some non-limiting examples, at least one of the at least one patterning coating and the patterning material may have an initial sticking probability against deposition of at least one of silver and magnesium, that is at least one of no more than about: 0.3, 0.2, 0.15, 0.1, 0.08, 0.05, 0.03, 0.02, 0.01, 0.008, 0.005, 0.003, 0.001, 0.0008, 0.0005, 0.0003, and 0.0001. In some non-limiting examples, the at least one of the at least one patterning coating and the patterning material may have an initial sticking probability against deposition of the deposited material, that is at least one of between about: 0.15-0.0001, 0.1-0.0003, 0.08-0.0005, 0.08-0.0008, 0.05-0.001, 0.03-0.0001, 0.03-0.0003, 0.03-0.0005, 0.03-0.0008, 0.03-0.001, 0.03-0.005, 0.03-0.008, 0.03-0.01, 0.02-0.0001, 0.02-0.0003, 0.02-0.0005, 0.02-0.0008, 0.02-0.001, 0.02-0.005, 0.02-0.008, 0.02-0.01, 0.01-0.0001, 0.01-0.0003, 0.01-0.0005, 0.01-0.0008, 0.01-0.001, 0.01-0.005, 0.01-0.008, 0.008-0.0001, 0.008-0.0003, 0.008-0.0005, 0.008-0.0008, 0.008-0.001, 0.008-0.005, 0.005-0.0001, 0.005-0.0003, 0.005-0.0005, 0.005-0.0008, and 0.005-0.001.

In some non-limiting examples, an average layer thickness of the deposited layer may be at least one of at least about: 10 nm, 20 nm, 30 nm, 40 nm, 50 nm, 60 nm, 70 nm, 80 nm, 90 nm, and 100 nm.

In some non-limiting examples, the deposited material may comprise at least one common metal as a metallic material of which the orientation material is comprised.

In some non-limiting examples, the deposited material may comprise an element selected from at least one of potassium (K), sodium (Na), lithium (Li), barium (Ba), cesium (Cs), ytterbium (Yb), silver (Ag), gold (Au), copper (Cu), aluminum (Al), magnesium (Mg), zinc (Zn), cadmium (Cd), tin (Sn), and yttrium (Y). In some non-limiting examples, the element may comprise at least one of Mg, Ag, and Yb. In some non-limiting examples, the element may be Ag.

In some non-limiting examples, the deposited material may comprise an alloy. In some non-limiting examples, the alloy may be at least one of an Ag-containing alloy, an Mg-containing alloy, and an AgMg-containing alloy. In some non-limiting examples, the AgMg-containing alloy may have an alloy composition of between about: 1:10 (Ag:Mg)-10:1 by volume

DESCRIPTION

Layered Device

Figure 12A:
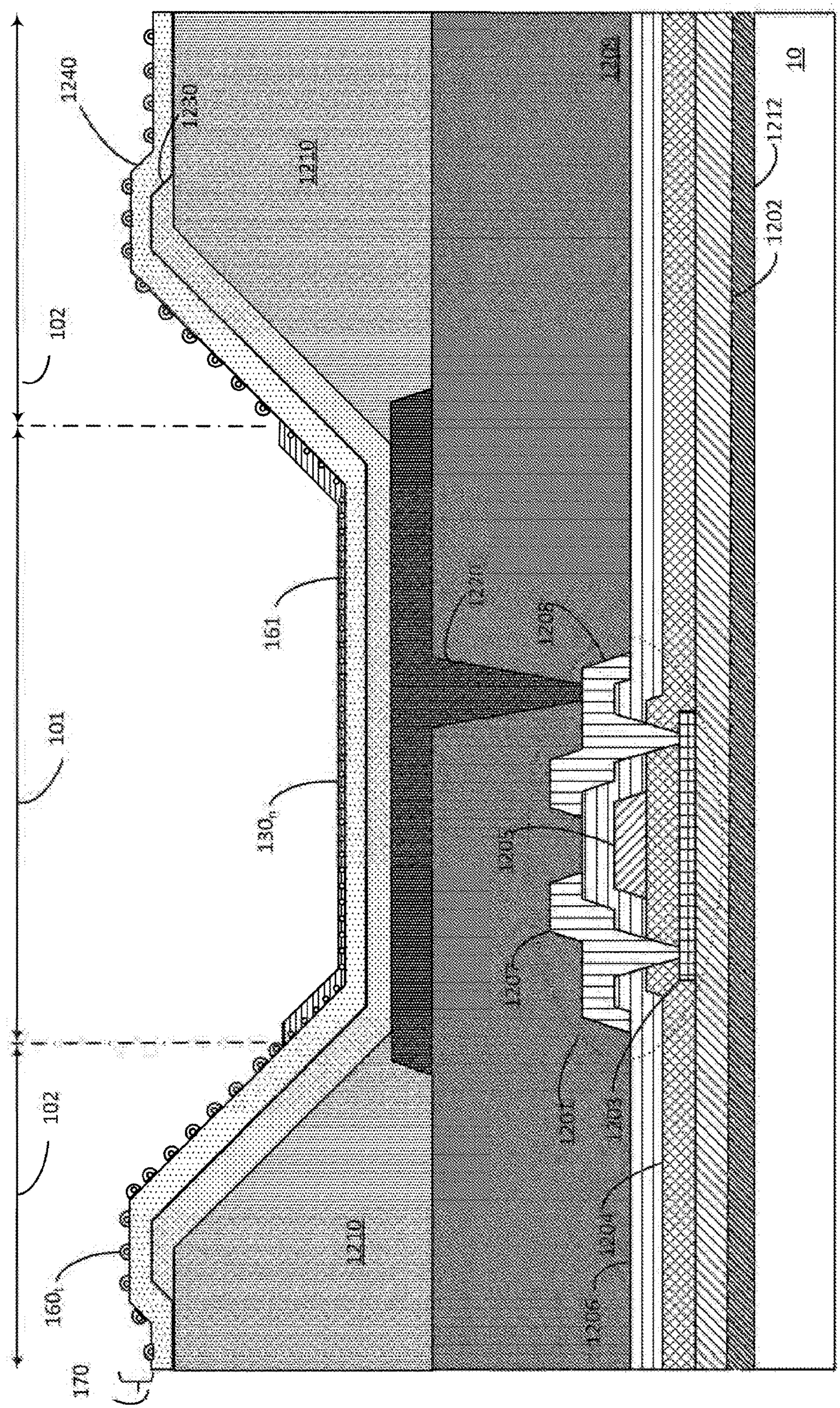
FIG. 12A is a schematic diagram showing the at least one particle structure of FIG. 1 proximate to an emissive region of the device of FIG. 1 formed by deposition of a patterning coating subsequent to deposition of a plurality of seeds for forming the structures according to an example in the present disclosure.
Figure 13A:
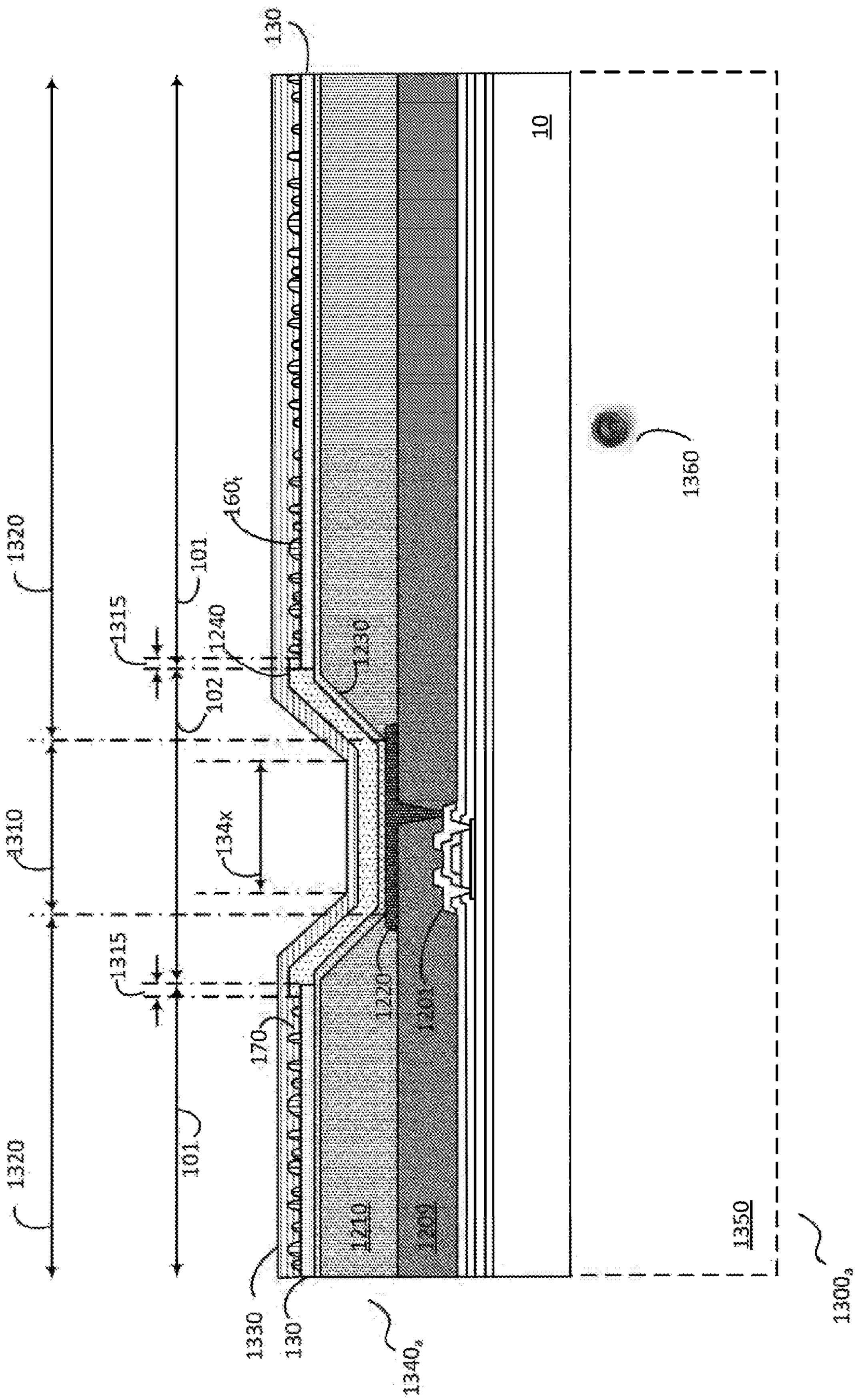
FIGS. 13A-13C are simplified block diagrams from a cross-sectional aspect, of various examples of an example user device having a display panel for covering a body, and at least one under-display component housed therewithin for exchanging EM signals at a non-zero angle to layers of the display panel therethrough, according to an example in the present disclosure.

The present disclosure relates generally to layered semiconductor devices 100, and more specifically, to opto-electronic devices 1200 (FIG. 12A). An opto-electronic device 1200 may generally encompass any device that converts electrical signals into photons and vice versa. In some non-limiting examples, the layered semiconductor device, including without limitation, the opto-electronic device 1200, may serve as a face 3401 (FIG. 34), including without limitation, a display panel 1340 (FIG. 13A), of a user device 1300 (FIG. 13A).

Those having ordinary skill in the relevant art will appreciate that, while the present disclosure is directed to opto-electronic devices 1200, the principles thereof may be applicable to any panel having a plurality of layers, including without limitation, at least one layer of conductive deposited material 531 (FIG. 5), including as a thin film, and in some non-limiting examples, through which electromagnetic (EM) signals may pass, entirely or partially, at a non-zero angle relative to a plane of at least one of the layers.

Turning now to FIG. 1, there may be shown a cross-sectional view of an example layered semiconductor device 100. In some non-limiting examples, as shown in greater detail in FIG. 16, the device 100 may comprise a plurality of layers deposited upon a substrate 10.

A lateral axis, identified as the X-axis, may be shown, together with a longitudinal axis, identified as the Z-axis. A second lateral axis, identified as the Y-axis, may be shown as being substantially transverse to both the X-axis and the Z-axis. At least one of the lateral axes may define a lateral aspect of the device 100. The longitudinal axis may define a transverse aspect of the device 100.

The layers of the device 100 may extend in the lateral aspect substantially parallel to a plane defined by the lateral axes. Those having ordinary skill in the relevant art will appreciate that the substantially planar representation shown in FIG. 1 may be, in some non-limiting examples, an abstraction for purposes of illustration. In some non-limiting examples, there may be, across a lateral extent of the device 100, localized substantially planar strata of different thicknesses and dimension, including, in some non-limiting examples, the substantially complete absence of a layer, and/or layer(s) separated by non-planar transition regions (including lateral gaps and even discontinuities).

Thus, while for illustrative purposes, the device 100 may be shown in its cross-sectional aspect as a substantially stratified structure of substantially parallel planar layers, such device may illustrate locally, a diverse topography to define features, each of which may substantially exhibit the stratified profile discussed in the cross-sectional aspect.

As shown in FIG. 1, the layers of the device 100 comprise a substrate 10, an orientation layer 120, and a patterning coating 130 disposed on an exposed layer surface 11 of at least a portion of the lateral aspect of the orientation layer 120. In some non-limiting examples, the patterning coating 130 may be limited in its lateral extent to a first portion 101 and a deposited layer 140 may be disposed as a closed coating 150 on an exposed layer surface 11 of the device 100 in a second portion 102 of its lateral aspect. In some non-limiting examples, the second portion 102 may comprise that part of the exposed layer surface 11 of the device that lies beyond the first portion 101.

In some non-limiting examples, at least one particle structure 160 may be disposed as a discontinuous layer 170 on the exposed layer surface 11 of the patterning coating 130. In some non-limiting examples, there may be at least one intervening layer 110 between the substrate 10 and the orientation layer 120. In some non-limiting examples, at least one of the intervening layers 110 may be an organic supporting layer 115.

In some non-limiting examples, the patterning coating 130, the deposited layer 140, and/or the at least one particle structure 160 may be covered by at least one overlying layer 180.

Supporting Layer

Figure 16:
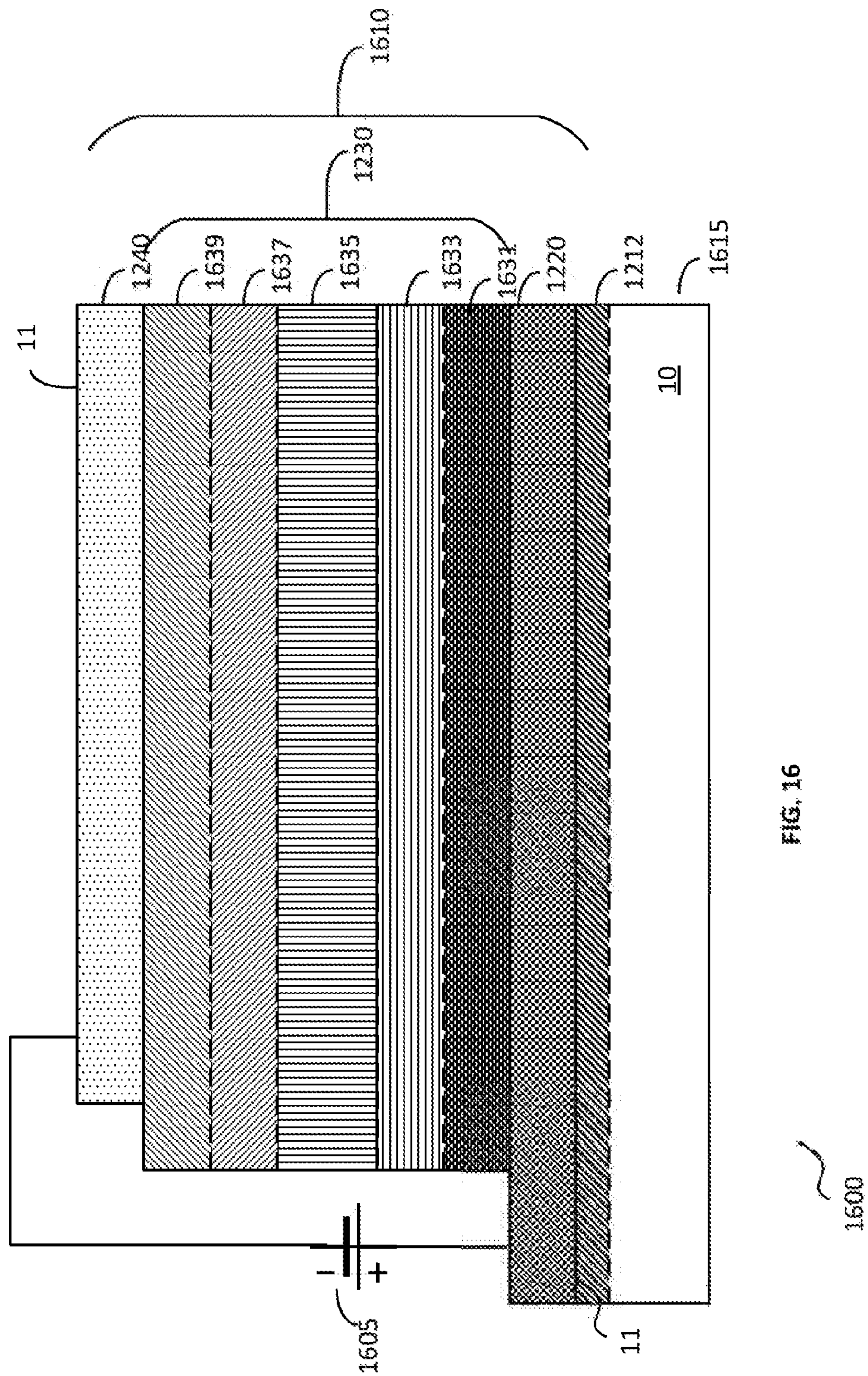
FIG. 16 is a block diagram from a cross-sectional aspect, of an example electro-luminescent device according to an example in the present disclosure.

In some non-limiting examples, the supporting layer 115 may be the at least one semiconducting layer 1230 (FIG. 12A) of an opto-electronic device 1200, including without limitation, an electron transport layer (ETL) 1639 (FIG. 16).

Without wishing to be bound by any particular theory, it has been found, somewhat surprisingly, that providing at least one semiconducting layer 1230 as the supporting layer 115, such that the orientation layer 120 is disposed on an exposed layer surface 11 thereof, may, at least in some non-limiting examples, provide certain advantages for achieving, by way of non-limiting example, improved patterning contrast against the deposition of the deposited material 531 on an exposed layer surface 11 of the device 100, relative to a scenario in which the orientation layer 120 is disposed on an exposed layer surface 11 of an intervening layer 110 other than the at least one semiconducting layer 1230, that is, in which the supporting layer 115 is absent. By way of non-limiting example, it has been found, somewhat surprisingly, that when the orientation layer 120 was disposed on an exposed layer surface 11 of an inorganic material, including without limitation, glass, the patterning contrast against the deposition of the deposited material 531 on an exposed layer surface 11 of the device 100, was substantially reduced relative to when the orientation layer 130 was disposed on an exposed layer surface 11 of a supporting layer 115 comprising at least one semiconducting layer 1230 interposed between the orientation layer 120 and the inorganic material.

Without wishing to be bound by any particular theory, it may be postulated that the interposition of the supporting layer 115 between an underlying layer and the orientation layer 120 may provide a morphology at the exposed layer surface 11 of the supporting layer 115 that may tend to allow the orientation material of the orientation layer 120 to present a high surface energy at the exposed layer surface 11 thereof.

Orientation Layer

The orientation layer 120 is disposed on an exposed layer surface 11 of an underlying layer, which may be, in some non-limiting examples, the substrate 10, one of the at least one intervening layer 110, including without limitation, the organic supporting layer 115.

In some non-limiting examples, the orientation layer 120 may extend laterally across at least the first portion 101 of the lateral aspect of the device. In some non-limiting examples, the orientation layer 120 may be restricted to the first portion 101. In some non-limiting examples, the orientation layer 120 may extend across the second portion 102 of the lateral aspect of the device 100.

In some non-limiting examples, the orientation layer 120 may form a closed coating 150.

In some non-limiting examples, the orientation layer 120 may form a discontinuous layer 170.

In some non-limiting examples, the orientation layer 120 may be formed as a thin film.

In some non-limiting examples, the orientation layer 120 may be formed as a single monolithic coating.

In some non-limiting examples, the orientation layer 120 may have an average film thickness $d_1$ (FIG. 6A) that may be at least one of at least about: 2 nm, 3 nm, 5 nm, and 10 nm. In some non-limiting examples, the orientation layer 120 may have an average film thickness $d_1$ that may be in a range of at least one of between about: 1-100 nm, 5-50 nm, 6-30 nm, 7-20 nm, 8-15 nm, 5-25 nm, 8-20 nm, and 8.5-10 nm. In some non-limiting examples, the average film thickness $d_1$ of the orientation layer 120 may be substantially the same or constant across its lateral extent.

In some non-limiting examples, the orientation layer 120 may be comprised of an orientation material.

In some non-limiting examples, the orientation material may have a high characteristic surface energy, in some non-limiting examples, relative to other materials, including without limitation, a patterning material 411.

In some non-limiting examples, the orientation layer 120, and/or the orientation material, in some non-limiting examples, when deposited as a film, and/or coating in a form, and under similar circumstances to the deposition of the orientation layer 120 within the device 100, may have a surface energy of at least one of at least about: 30 dynes/cm, 35 dynes/cm, 50 dynes/cm, 60 dynes/cm, 70 dynes/cm, 80 dynes/cm, and 100 dynes/cm.

In some non-limiting examples, the orientation layer 120, and/or the orientation material, in some non-limiting examples, when deposited as a film, and/or coating in a form, and under similar circumstances to the deposition of the orientation layer 120 within the device 100, may have a surface energy of at least one of at least about: 50 dynes/cm, 100 dynes/cm, 200 dynes/cm, and 500 dynes/cm.

In some non-limiting examples, the orientation material may be a metal and/or a metallic material. Those having ordinary skill in the relevant art will appreciate that metals have a very high characteristic surface energy.

In some non-limiting examples, the orientation layer 120 may form a cathode, or a part thereof, of an opto-electronic device 1200. In some non-limiting examples, the orientation layer 120 may be a common cathode of the opto-electronic device 1200.

In some non-limiting examples, the orientation material may be a non-metallic material. In some non-limiting examples, the orientation material may be a semiconducting material. In some non-limiting examples, the orientation material may be an insulating material. In some non-limiting examples, the orientation material may be an organic material. In some non-limiting examples, the orientation material may be a material having a high characteristic surface energy, in some non-limiting examples, relative to other materials, including without limitation, a patterning material 411.

In some non-limiting examples, the orientation material may be an inorganic material. In some non-limiting examples, the orientation material may be a non-metallic inorganic material having a high characteristic surface energy, in some non-limiting examples, relative to other materials, including without limitation, a patterning material 411.

Without wishing to be bound by any particular theory, it may be postulated that the orientation layer 120 may present a high surface energy at the exposed layer surface 11 thereof, and/or the orientation material may have a high characteristic surface energy, in some non-limiting examples, relative to other materials, including without limitation, a patterning material 411.

Without wishing to be bound by any particular theory, it may be postulated that, especially where, in some non-limiting examples, the patterning coating 130 comprises a patterning material 411 having a molecular structure having a first moiety that may comprise a high(er) surface energy component and a second moiety that may comprise a low(er) surface energy component coupled and/or bonded thereto, in some non-limiting examples, such that the first moiety is spaced-apart from the second moiety, when the orientation layer 120 is disposed between the patterning coating 130 and a layer underlying the orientation layer 120 ("underlying layer") of the device 100, which may be, in some non-limiting examples, the substrate 10 or an intervening layer 110, including without limitation, the organic supporting layer 115, the first moiety of the patterning coating 130 may tend to be oriented toward a surface having high surface energy, including without limitation, the exposed layer surface 11 of the orientation layer, because of various intermolecular interactions.

Thus, it may be postulated that the interposition of the orientation layer 120 between the patterning coating 130 and the underlying layer may present a high surface energy at the exposed layer surface 11 of the orientation layer 120 that may cause the first moiety of the patterning coating 130 to tend to be oriented toward the exposed layer surface 11 of the orientation layer 120, such that, in some non-limiting examples, the second moiety of the patterning coating 130 may tend to be oriented toward the exposed layer surface 11 of the patterning coating 130.

It may thus be further postulated that the orientation of the second moiety toward the exposed layer surface 11 of the patterning coating 130 may, in some non-limiting examples, provide improved patterning contrast against the deposition of the deposited material 531 on an exposed layer surface 11 of the device 100, so as to substantially preclude deposition of the deposited material 531 on the exposed layer surface 11 of the patterning coating 130, including without limitation, as a closed coating 150, and/or as at least one particle structure 160.

Non-limiting examples of the orientation material include silver (Ag), ytterbium (Yb), a magnesium-Ag alloy (MgAg), including without limitation, in a composition of about 1:9 by volume, copper (Cu), fullerene, including without limitation $C_{60}$, aluminum fluoride ($AlF_3$), and molybdenum trioxide ($MoO_3$).

In some non-limiting examples, the orientation layer 120, and/or the orientation material, in some non-limiting examples, when deposited as a film, and/or coating in a form, and under similar circumstances to the deposition of the orientation layer 120 within the device 100, may be electrically conductive.

In some non-limiting examples, a sheet resistance of the (metallic) orientation layer 120 may generally correspond to a characteristic sheet resistance of the orientation layer 120, measured or determined in isolation from other components, layers and/or parts of the device 100. In some non-limiting examples, the sheet resistance of the orientation layer 120 may be determined and/or calculated based on the composition, thickness, and morphology of the thin film of the orientation layer. In some non-limiting examples, the sheet resistance may be at least one of at least about: 5Ω/□, 8Ω/□, 10Ω/□, 12Ω/□, 15Ω/□, 20Ω/□, 30Ω/□, 50Ω/□, 80Ω/□, and 100Ω/□. In some non-limiting examples, the sheet resistance may be at least one of between about: 0.1-1,000Ω/□, 1-100Ω/□, 2-50Ω/□, 3-30 Ω/□, 4-20Ω/□, 5-15Ω/□, and 10-12Ω/□.

In some non-limiting examples, the metallic material may comprise a metal having a bond dissociation energy of at least one of at least: 10 kJ/mol, 50 kJ/mol, 100 kJ/mol, 150, 180 kJ/mol, and 200 kJ/mol.

In some non-limiting examples, the metallic material may comprise a metal having an electronegativity that is at least one of no more than about: 1.4, 1.3, and 1.2

In some non-limiting examples, the metallic material may comprise an element selected from potassium (K), sodium (Na), lithium (Li), barium (Ba), cesium (Cs), Yb, Ag, gold (Au), Cu, aluminum (Al), magnesium (Mg), zinc (Zn), cadmium (Cd), tin (Sn), yttrium (Y), nickel (Ni), titanium (Ti), palladium (Pd), chromium (Cr), iron (Fe), cobalt (Co), zirconium (Zr), platinum (Pt), vanadium (V), niobium (Nb), iridium (Ir), osmium (Os), tantalum (Ta), molybdenum (Mo), and tungsten (W). In some non-limiting examples, the element may comprise at least one of: Ag, Au, Cu, Al, and Mg. In some non-limiting examples, the element may comprise at least one of: Cu, Ag, and Au. In some non-limiting examples, the element may be Cu. In some non-limiting examples, the element may be Al. in some non-limiting examples, the element may comprise at least one of: Mg, Zn, Cd, and Yb. In some non-limiting examples, the element may comprise at least one of: Sn, Ni, Ti, Pd, Cr, Fe, and Co. In some non-limiting examples, the element may comprise at least one of: Zr, Pt, V, Nb, Ir, and Os. In some non-limiting examples, the element may comprise at least one of: Ta, Mo, and W. In some non-limiting examples, the element may comprise at least one of: Mg, Ag, and Yb. In some non-limiting examples, the element may comprise Mg, and/or Ag. In some non-limiting examples, the element may be Ag.

In some non-limiting examples, the metallic material may comprise a pure metal. In some non-limiting examples, the metallic material may be a pure metal. In some non-limiting examples, the metallic material may be pure Ag or substantially pure Ag. In some non-limiting examples, the metallic material may be pure Mg or substantially pure Mg. in some non-limiting examples, the metallic material may be pure Al or substantially pure Al.

In some non-limiting examples, the metallic material may comprise an alloy. In some non-limiting examples, the alloy may be an Ag-containing alloy, or an AgMg-containing alloy.

In some non-limiting examples, the metallic material may comprise other metals in place of, and/or in combination with, Ag. In some non-limiting examples, the metallic material may comprise an alloy of Ag with at least one other metal. In some non-limiting examples, the metallic material may comprise an alloy of Ag with Mg, and/or Yb. In some non-limiting examples, such alloy may be a binary alloy having a composition from about 5 vol. % Ag to about 95 vol. % Ag, with the remainder being the other metal. In some non-limiting examples, the metallic material may comprise Ag and Mg. In some non-limiting examples, the metallic material may comprise an Ag:Mg alloy having a composition from about 1:10 to about 10:1 by volume. In some non-limiting examples, the metallic material may comprise Ag and Yb. In some non-limiting examples, the metallic material may comprise a Yb:Ag alloy having a composition from about 1:20 to about 1-10:1 by volume. In some non-limiting examples, the metallic material may comprise Mg and Yb. In some non-limiting examples, the metallic material may comprise an Mg:Yb alloy. In some non-limiting examples, the metallic material may comprise Ag, Mg, and Yb. In some non-limiting examples, the metallic material may comprise an Ag:Mg:Yb alloy.

In some non-limiting examples, the metallic material may comprise oxygen (O). In some non-limiting examples, the metallic material may comprise at least one metal and O. In some non-limiting examples, the metallic material may comprise a metal oxide. In some non-limiting examples, the metal oxide may comprise at least one of: Zn, indium (In), Sn, antimony (Sb), and gallium (Ga). In some non-limiting examples, the metal oxide may be a transparent conducting oxide (TCO). In some non-limiting examples, the TCO may comprise at least one of: indium titanium oxide (ITO), ZnO, indium zinc oxide (IZO), fluorine tin oxide (FTO) and indium gallium zinc oxide (IGZO). In some non-limiting examples, the TCO may be electrically doped with other elements.

In some non-limiting examples, the orientation layer 120 may be formed by a metal and/or a metal alloy.

In some non-limiting examples, the metallic material may comprise at least one metal or metal alloy and at least one metal oxide.

In some non-limiting examples, the orientation layer 120 may comprise a plurality of layers of the metallic material. In some non-limiting examples, the metallic material of a first one of the plurality of layers may be different from the metallic material of a second one of the plurality of layers. In some non-limiting examples, the metallic material of the first one of the plurality of layers may comprise a metal and the metallic material of the second one of the plurality of layers may comprise a metal oxide.

In some non-limiting examples, the metallic material of at least one of the plurality of layers may comprise Yb. In some non-limiting examples, the metallic material of one of the plurality of layers may comprise an Ag-containing alloy and/or an AgMg-containing alloy, and/or pure Ag, substantially pure Ag, pure Mg, and/or substantially pure Mg. In some non-limiting examples, the orientation layer 120 may be a bilayer Yb/AgMg coating.

In some non-limiting examples, a first one of the plurality of layers that is proximate (top-most) to the patterning coating 130 may comprise an element selected from Ag, Au, Cu, Al, Sn, Ni, Ti, Pd, Cr, Fe, Co, Zr, Pt, V, Nb, Ir, Os, Ta, Mo, and/or W. In some non-limiting examples, the element may comprise Cu, Ag, and/or Au. In some non-limiting examples, the element may be Cu. In some non-limiting examples, the element may be Al. In some non-limiting examples, the element may comprise Sn, Ti, Pd, Cr, Fe, and/or Co. In some non-limiting examples, the element may comprise Ni, Zr, Pt, V, Nb, Ir, and/or Os. In some non-limiting examples, the element may comprise Ta, Mo, and/or W. In some non-limiting examples, the element may comprise Mg, Ag, and/or Al. In some non-limiting examples, the element may comprise Mg, and/or Ag. In some non-limiting examples, the element may be Ag.

In some non-limiting examples, the metallic material of at least one of the plurality of layers may comprise a metal having a work function that is no more than about: 4 eV.

In some non-limiting examples, the orientation layer 120 may comprise at least one additional element. In some non-limiting examples, such additional element may be a non-metallic element. In some non-limiting examples, the non-metallic element may be at least one of: O, sulfur (S), nitrogen (N), and carbon (C). It will appreciated by those having ordinary skill in the relevant art that, in some non-limiting examples, such additional element(s) may be incorporated into the orientation layer 120 as a contaminant, due to the presence of such additional element(s) in the source material, equipment used for deposition, and/or the vacuum chamber environment. In some non-limiting examples, the concentration of such additional element(s) may be limited to be below a threshold concentration. In some non-limiting examples, such additional element(s) may form a compound together with other element(s) of the orientation layer 120. In some non-limiting examples, a concentration of the non-metallic element in the metallic material may be at least one of no more than about: 1%, 0.1%, 0.01%, 0.001%, 0.0001%, 0.00001%, 0.000001%, and 0.0000001%. In some non-limiting examples, the orientation layer 120 may have a composition in which a combined amount of 0 and C therein is at least one of no more than about: 10%, 5%, 1%, 0.1%, 0.01%, 0.001%, 0.0001%, 0.00001%, 0.000001%, and 0.0000001%.

In some non-limiting examples, the orientation layer 120 may be disposed in a pattern that may be defined by at least one region therein that is substantially devoid of a closed coating 150 of the orientation layer 120. In some non-limiting examples, the at least one region may have disposed thereon, an orientation layer patterning coating (not shown) for precluding deposition of the metallic material in a closed coating 150 thereon. In some non-limiting examples, the orientation layer patterning coating may be formed as a single monolithic coating across the lateral aspect of the orientation layer 120.

In some non-limiting examples, the at least one region may separate the orientation layer 120 into a plurality of discrete fragments thereof. In some non-limiting examples, the plurality of discrete fragments of the orientation layer 120 may be physically spaced apart from one another in the lateral aspect thereof. In some non-limiting examples, at least two of such plurality of discrete fragments may be electrically coupled. In some non-limiting examples, at least two of such plurality of discrete fragments may be each electrically coupled to a common conductive layer or coating, including without limitation, the deposited layer 140, in the second portion 102, to allow the flow of electrical current between them. In some non-limiting examples, at least two of such plurality of discrete fragments of the orientation layer 120 may be electrically insulated from one another.

Patterning Coating

The patterning coating 130, which in some non-limiting examples, may be a nucleation inhibiting coating (NIC), is disposed, in some non-limiting examples, as a closed coating 150, on an exposed layer surface 11 of the orientation layer 120, in some non-limiting examples, restricted in lateral extent by selective deposition, including without limitation, using a shadow mask 415 (FIG. 4) such as, without limitation, a fine metal mask (FMM), including without limitation, to the first portion 101. Thus, in some non-limiting examples, in the second portion 102 of the device 100, the exposed layer surface 11 of the device 100, (whether of the orientation layer 120 or of the underlying layer), may be substantially devoid of a closed coating 150 of the patterning coating 130.

In some non-limiting examples, the patterning material 411 may be substantially devoid of any chemical bonds with the orientation material.

In some non-limiting examples, an interface between the patterning coating 130 and the orientation layer may be substantially devoid of chemisorption.

In some non-limiting examples, the patterning coating 130, and/or the patterning material 411, in some non-limiting examples, when deposited as a film, and/or coating in a form, and under similar circumstances to the deposition of the patterning coating 130 within the device 100, may have a contact angle with respect to tetradecane of at least one of at least about: 40°, 45°, 50°, 55°, 60°, 65°, and 70°.

In some non-limiting examples, the patterning coating 130, and/or the patterning material 411, in some non-limiting examples, when deposited as a film, and/or coating in a form, and under similar circumstances to the deposition of the patterning coating 130 within the device 100, may have a contact angle with respect to water of at least one of no more than about 15°, 10°, 8°, and 5°.

Without wishing to be bound by any particular theory, it may be postulated that materials that form a relatively steep contact angle of at least one of about: 40°, 45°, 50°, 55°, 60°, 65°, and 70° with respect to a non-polar solvent, such as by way of non-limiting example tetradecane, and a relatively low contact angle of at least one of no more than about 15°, 10°, 8°, and 5° with respect to a polar solvent, such as by way of non-limiting example water, may be suitable for forming a patterning coating 130 that exhibits an enhanced patterning contrast when deposited in conjunction with the orientation layer 120, at least in some non-limiting examples.

Without wishing to be bound by any particular theory, it may be postulated that materials that form a surface having a surface energy lower than, by way of non-limiting examples, at least one of about: 13 dynes/cm, 15 dynes/cm, and 17 dynes/cm, may have reduced suitability as a patterning material 411 in certain non-limiting examples, as such materials may: exhibit relatively poor adhesion to layer(s) surrounding such materials, exhibit a low melting point, and/or exhibit a low sublimation temperature.

In some non-limiting examples, the patterning coating 130 may have a surface energy of at least one of no more than about: 25 dynes/cm, 21 dynes/cm, 20 dynes/cm, 19 dynes/cm, 18 dynes/cm, 17 dynes/cm, 16 dynes/cm, 15 dynes/cm, 14 dynes/cm, 13 dynes/cm, 12 dynes/cm, 11 dynes/cm, and 10 dynes/cm.

In some non-limiting examples, the patterning coating 130 may have a surface energy of at least one of at least about: 6 dynes/cm, 7 dynes/cm, and 8 dynes/cm.

In some non-limiting examples, the patterning coating 130 may have a surface energy of at least one of between about: 10-20 dynes/cm, 13-19 dynes/cm, 15-19 dynes/cm, and 17-20 dynes/cm.

In some non-limiting examples, the surface energy of the orientation layer 120 may exceed the surface energy of the patterning coating 130.

In some non-limiting examples, an average layer thickness $d_2$ of the patterning coating 130 may be at least one of no more than about: 10 nm, 8 nm, 7 nm, 6 nm, and 5 nm.

In some non-limiting examples, a refractive index of the patterning coating 130 may be at least one of no more than about: 1.55, 1.5, 1.45, 1.43, 1.4, 1.39, 1.37, 1.35, 1.32, and 1.3.

In some non-limiting examples, a refractive index of the patterning coating 130 may be at least one of at least about: 1.35, 1.32, 1.3, and 1.25.

In some non-limiting examples, the patterning coating 130 may comprise a patterning material 411 (FIG. 4) which in some non-limiting examples, may be an NIC material.

In some non-limiting examples, the patterning material 411 may have a molecular weight of at least one of at least about: 1,200 g/mol, 1,300 g/mol, 1,500 g/mol, 1,700 g/mol, 2,000 g/mol, 2,200 g/mol, and 2,500 g/mol.

In some non-limiting examples, the patterning material 411 may have a molecular weight of at least one of no more than about: 5,000 g/mol, 4,500 g/mol, 4,000 g/mol, 3,800 g/mol, and 3,500 g/mol.

In some non-limiting examples, the patterning material 411 may have a glass transition temperature of at least one of no more than about: 20° C., 0° C., −20° C., −30° C., and −50° C.

In some non-limiting examples, the patterning material 411 may have a glass transition temperature of at least one of at least about: 100° C., 110° C., 120° C., 130° C., 150° C., 170° C., and 200° C.

In some non-limiting examples, the patterning material 411 may have a melting point at atmospheric pressure of at least one of at least about: 100° C., 120° C., 140° C., 160° C., 180° C., and 200° C.

In some non-limiting examples, the patterning material 411 may have a sublimation temperature in high vacuum of at least one of between about: 100-320° C., 120-300° C., 140-280° C., and 150-250° C.

In some non-limiting examples, the patterning material 411 may be, or comprise, a compound having a molecular structure containing a backbone and at least one functional group bonded to the backbone. In some non-limiting examples, the backbone may be an inorganic moiety, and the at least one functional group may be an organic moiety.

In some non-limiting examples, the compound may have a molecular structure comprising a substituted or unsubstituted aryl group, and/or a substituted or unsubstituted heteroaryl group. In some non-limiting examples, the aryl group may be phenyl, or naphthyl. In some non-limiting examples, at least one C atom of an aryl group may be substituted by a heteroatom, which by way of non-limiting example may be O, N, and/or S, to derive a heteroaryl group. In some non-limiting examples, the backbone may be, or comprise, a substituted or unsubstituted aryl group, and/or a substituted or unsubstituted heteroaryl group. In some non-limiting examples, the backbone may be, or comprise, a substituted or unsubstituted aryl group, and/or a substituted or unsubstituted heteroaryl group and at least one functional group comprising F. In some non-limiting examples, the at least one functional group comprising F may be a fluoroalkyl group.

In some non-limiting examples, the compound may have a molecular structure comprising a substituted or unsubstituted, linear, branched, or cyclic hydrocarbon group. In some non-limiting examples, one or more C atoms of the hydrocarbon group may be substituted by a heteroatom, which by way of non-limiting example may be O, N, and/or S.

In some non-limiting examples, the compound may have a molecular structure comprising a phosphazene group. In some non-limiting examples, the phosphazene group may be a linear, branched, or cyclic phosphazene group. In some non-limiting examples, the backbone may be, or comprise, a phosphazene group. In some non-limiting examples, the backbone may be, or comprise, a phosphazene group and at least one functional group comprising F. In some non-limiting examples, the at least one functional group comprising F may be a fluoroalkyl group. Non-limiting examples of such compound include fluoro-phosphazenes. Non-limiting examples of such compound include Example Materials 4, 10 and 11 (provided below).

In some non-limiting examples, the patterning material 411 comprises a compound having a molecular structure comprising a plurality of moieties. In some non-limiting examples, a first moiety of the molecular structure of the patterning material 411 may be bonded to at least one second moiety of the molecular structure of the patterning material 411. In some non-limiting examples, the first moiety of the molecule of the patterning material 411 may be bonded directly to the at least one second moiety of the molecule of the patterning material 411. In some non-limiting examples, the first moiety and the second moiety are coupled and/or bonded to one another by a third moiety.

In some non-limiting examples, the patterning material 411 may comprise an organic-inorganic hybrid material.

In some non-limiting examples, the patterning material 411 may comprise at least one of an oligomer and a polymer.

In some non-limiting examples, the patterning material 411 may be an oligomer or a polymer containing a plurality of monomers.

In some non-limiting examples, at least a fragment of the molecular structure of the patterning material 411 may be represented by the following formula:

$$(\mathrm{Mon})_n \tag{I}$$

where:

Mon represents a monomer, and n is an integer of at least 2.

In some non-limiting examples, n may be an integer of at least one of between about: 2-100, 2-50, 3-20, 3-15, 3-10, 3-7, or 3-4.

In some non-limiting examples, the molecular structure of the patterning material 411, may comprise a plurality of different monomers. In some non-limiting examples, such molecular structure may comprise monomer species that have different molecular composition and/or molecular structure. Non-limiting examples of such molecular structure include those represented by the following formulae:

$$(\mathrm{Mon}^A)_k(\mathrm{Mon}^B)_m \tag{I-1}$$

$$(\mathrm{Mon}^A)_k(\mathrm{Mon}^A)_m(\mathrm{Mon}^C)_o \tag{I-2}$$

where:

$\mathrm{Mon}^A$, $\mathrm{Mon}^B$, and $\mathrm{Mon}^C$ each represent a monomer specie, and k, m, and o each represent an integer of at least 2.

In some non-limiting examples, k, m, and o each represent an integer of at least one of between about: 2-100, 2-50, 3-20, 3-15, 3-10, or 3-7. Those having ordinary skill in the relevant art will appreciate that various non-limiting examples and descriptions regarding monomer, Mon, may be applicable with respect to each of $\mathrm{Mon}^A$, $\mathrm{Mon}^B$, and $\mathrm{Mon}^C$.

In some non-limiting examples, each monomer of the patterning material 411 may comprise a monomer backbone and at least one functional group. In some non-limiting examples, the first moiety may comprise the monomer backbone. In some non-limiting examples, the second moiety may comprise a functional group.

In some non-limiting examples, the monomer backbone may have a higher surface tension than at least one of the functional group(s) bonded thereto. In some non-limiting examples, the monomer backbone may have a higher surface tension than any functional group bonded thereto.

In some non-limiting examples, the functional group may be bonded, either directly or via a linker group, to the monomer backbone. In some non-limiting examples, the monomer may comprise the linker group, and the linker group may be bonded to the monomer backbone and to the functional group. In some non-limiting examples, the monomer may comprise a plurality of functional groups, which may be the same or different from one another. In such examples, each functional group may be bonded, either directly or via a linker group, to the monomer backbone. In some non-limiting examples, where a plurality of functional groups is present, a plurality of linker groups may also be present.

In some non-limiting examples, the monomer may be represented by the following formula:

$$M\text{-}(L\text{-}R_x)_y \tag{II}$$

where:

M represents the monomer backbone,

L represents the linker group,

R represents the functional group, x is an integer between 1 and 4, and y is an integer between 1 and 3.

In some non-limiting examples, the linker group may be represented by at least one of: a single bond, O, N, NH, C, CH, $CH_2$, and S. In some non-limiting examples, the linker group may be omitted such that the functional group is directly bonded to the monomer backbone.

Various non-limiting examples of the functional group that have been described herein may apply with respect to R of Formula (II). In some non-limiting examples, the functional group R may comprise a plurality of functional group monomer units. In some non-limiting examples, a functional group monomer unit may include at least one of: $CH_2$ and $CF_2$. In some non-limiting examples, a functional group may comprise a $CH_2CF_3$ moiety. For example, such functional group monomer units may be bonded together to form at least one of: an alkyl and an fluoroalkyl unit. In some non-limiting examples, the functional group may further comprise a functional group terminal unit. In some non-limiting examples, the functional group terminal unit may be arranged at a terminal end of the functional group and bonded to a functional group monomer unit. In some non-limiting examples, the terminal end at which the functional group terminal unit may be arranged may correspond to a fragment of the functional group that may be distal to the monomer backbone. In some non-limiting examples, the functional group terminal unit may comprise at least one of: $CF_2H$, $CF_3$, $CH_eCF_2H$, and $CH_2CF_3$.

In some non-limiting examples, the monomer backbone may be an inorganic moiety, and the at least one functional group may be an organic moiety.

In some non-limiting examples, the monomer backbone may comprise phosphorus (P) and N, including without limitation, a phosphazene, in which there is a double bond between P and N and may be represented as "NP" or as "N═P". In some non-limiting examples, the monomer backbone may comprise Si and O, including without limitation, silsesquioxane, which may be represented as $SiO_{3/2}$.

In some non-limiting examples, at least a part of the molecular structure of the at least one of the materials of the patterning coating 130, which may for example be the first material and/or the second material, is represented by the following formula:

$$(NP\text{-}(L\text{-}R_x)_y)_n \tag{III}$$

where:

NP represents the phosphazene monomer backbone,

L represents the linker group,

R represents the functional group, x is an integer between 1 and 4, y is an integer between 1 and 3, and n is an integer of at least 2.

In some non-limiting examples, the molecular structure of the patterning material 411 may be represented by Formula (III).

In some non-limiting examples, L may represent oxygen, x may be 1, and R may represent a fluoroalkyl group. In some non-limiting examples, the patterning material 411 or a fragment thereof, may be represented by the following formula:

$$(NP(OR_f)_2)_n \tag{IV}$$

where:

$R_f$ represents the fluoroalkyl group, and n is an integer between 3 and 7.

In some non-limiting examples, the fluoroalkyl group may comprise at least one of: a $CF_2$ group, a $CF_2H$ group, $CH_2CF_3$ group, and a $CF_3$ group. In some non-limiting examples, the fluoroalkyl group may be represented by the following formula:

$$\text{—}(CH_2)_p\text{—}(CF_2)_q\text{—}Z \tag{V}$$

where:

p is an integer of 1 to 5;

q is an integer of 6 to 20; and

Z represents H, D, or F.

In some non-limiting examples, p may be 1 and q may be an integer between 6 and 20.

In some non-limiting examples, the fluoroalkyl group $R_f$ in Formula (IV) may be represented by Formula (V).

In some non-limiting examples, the functional group R and/or the fluoroalkyl group $R_f$ may be selected independently upon each occurrence of such group in any of the foregoing formulae. It will also be appreciated that any of the foregoing formulae may represent a sub-structure of the compound, and additional groups or moieties may be present, which are not explicitly shown in the above formulae. It will also be appreciated that various formulae provided in the present application may represent linear, branched, cyclic, cyclo-linear, and/or cross-linked structures.

In some non-limiting examples, the molecular structure of the patterning material 411 may comprise a plurality of different monomers. In some non-limiting examples, such molecular structure may comprise monomer species that have different molecular composition and/or molecular structure.

In some non-limiting examples, a majority of the molecules of the patterning material 411 in the patterning coating 130 may be oriented such that the first moiety thereof may be proximate to the exposed layer surface 11 of the orientation layer 120 and the at least one second moiety thereof may be proximate to the exposed layer surface 11 of the patterning coating 130. In some non-limiting examples, a majority of the molecules of the patterning material 411 in the patterning coating 130 may be oriented such that a terminal group of the at least one second moiety thereof may be proximate to the exposed layer surface 11 of the patterning coating 130.

In some non-limiting examples, when so oriented, the first moiety may have a substantially planar structure defining a plane. When the molecules are oriented such that the terminal group of the at least one second moiety thereof is proximate to the exposed layer surface 11 of the patterning coating 130, the plane of the substantially planar structure may lie substantially parallel to an interface between the orientation layer 120 and the patterning coating 130.

In some non-limiting examples, when so oriented, the second moiety may be configurable to lie out of plane with respect to the plane of the substantially planar structure.

The surface tension attributable to a fragment of a molecular structure, including without limitation, a first moiety, a second moiety, a monomer, a monomer backbone, a linker group, and/or a functional group, may be determined using various known methods in the art. A non-limiting example of such method includes the use of a Parachor, such as may be further described, by way of non-limiting example, in "Conception and significance of the Parachor", *Nature* 196: 890-891. In some non-limiting examples, such method may include determining the critical surface tension of a moiety according to the formula (1):

$$\gamma = \left(\frac{P}{V_m}\right)^4 \tag{1}$$

where:

$\gamma$ represents the critical surface tension of a moiety;

P represents the Parachor of the moiety; and $V_m$ represents the molar volume of the moiety.

In some non-limiting examples, a first moiety of the molecule of the patterning material 411 may have a critical surface tension that exceeds a critical surface tension of a second moiety thereof and coupled thereto, such that the first moiety may comprise a high(er) critical surface tension component and the second moiety may comprise a low(er) critical surface tension component.

In some non-limiting examples, a quotient of the critical surface tension of the first moiety divided by the critical surface tension of the second moiety may be at least one of at least about: 5, 7, 8, 9, 10, 12, 15, 18, 20, 30, 50, 60, 80, and 100.

In some non-limiting examples, the critical surface tension of the first moiety may exceed the critical surface tension of the second moiety by at least one of at least about: 50 dynes/cm, 70 dynes/cm, 80 dynes/cm, 100 dynes/cm, 150 dynes/cm, 200 dynes/cm, 250 dynes/cm, 300 dynes/cm, 350 dynes/cm, and 500 dynes/cm.

In some non-limiting examples, the critical surface tension of the first moiety may be at least one of at least about: 50 dynes/cm, 70 dynes/cm, 80 dynes/cm, 100 dynes/cm, 150 dynes/cm, 180 dynes/cm, 200 dynes/cm, 250 dynes/cm, and 300 dynes/cm.

In some non-limiting examples, a molecular weight attributable to the first moiety may be at least one of at least about: 50 g/mol, 60 g/mol, 70 g/mol, 80 g/mol, 100 g/mol, 120 g/mol, 150 g/mol, and 200 g/mol.

In some non-limiting examples, the molecular weight attributable to the first moiety may be at least one of no more than about: 500 g/mol, 400 g/mol, 350 g/mol, 300 g/mol, 250 g/mol, 200 g/mol, 180 g/mol, and 150 g/mol.

Without wishing to be bound by any particular theory, it may be postulated that, in some non-limiting examples, a compound containing the first moiety having a relatively high critical surface tension of at least one of at least about: 50 dynes/cm, 70 dynes/cm, 80 dynes/cm, 100 dynes/cm, 150 dynes/cm, 180 dynes/cm, 200 dynes/cm, 250 dynes/cm, and 300 dynes/cm, and a molecular weight of the first moiety of at least one of between about: 50-500 g/mol, 60-400 g/mol, 70-300 g/mol, 80-250 g/mol, and 80-200 g/mol, may be useful in providing the patterning coating 130 that may exhibit an enhanced patterning contrast when deposited in conjunction with the orientation layer 120. It may be postulated that, for such moiety having a relatively high critical surface tension, a size of the moiety (reflected by the molecular weight attributable thereto) that may exceed these ranges may increase a likelihood of such moiety becoming exposed to, and/or interacting with, the vapor 532 of the deposited material 531, which may, in some non-limiting examples, reduce a resulting patterning contrast. It may be postulated that a size of the moiety within at least one of the above ranges may allow the first moiety to exhibit a degree of intermolecular interaction with the orientation material, possess a degree of rigidity, and/or accommodate bonding of a plurality of second moieties therewith, and therefore may be suitable as a patterning coating 140 in at least some applications.

In some non-limiting examples, the first moiety may comprise at least one of: an aryl group, a heteroaryl group, a conjugated bond, and a phosphazene group.

In some non-limiting examples, the first moiety may comprise at least one of: a cyclic structure, a cyclic aromatic structure, an aromatic structure, a caged structure, a polyhedral structure, and a cross-linked structure.

In some non-limiting examples, the first moiety may comprise a rigid structure.

In some non-limiting examples, the first moiety may comprise at least one of: a benzene moiety, a naphthalene moiety, a pyrene moiety, and an anthracene moiety.

In some non-limiting examples, the first moiety may comprise at least one of: a cyclotriphosphazene moiety and a cyclotetraphosphazene moiety.

In some non-limiting examples, the first moiety may be a hydrophilic moiety.

In some non-limiting examples, the critical surface tension of the second moiety may be at least one of no more than about: 25 dynes/cm, 21 dynes/cm, 20 dynes/cm, 19 dynes/cm, 18 dynes/cm, 17 dynes/cm, 16 dynes/cm, 15 dynes/cm, 14 dynes/cm, 13 dynes/cm, 12 dynes/cm, 11 dynes/cm, and 10 dynes/cm.

In some non-limiting examples, the second moiety may comprise at least one of F and Si. In some non-limiting examples, the second moiety may comprise at least one of a substituted and an unsubstituted fluoroalkyl group. In some non-limiting examples, the second moiety comprises at least one of: $C_1$-$C_{12}$ linear fluorinated alkyl, $C_1$-$C_{12}$ linear fluorinated alkoxy, $C_3$-$C_{12}$ branched fluorinated cyclic alkyl, $C_3$-$C_{12}$ fluorinated cyclic alkyl, and $C_3$-$C_{12}$ fluorinated cyclic alkoxy.

In some non-limiting examples, the second moiety may comprise saturated hydrocarbon group(s) and substantially omit the presence of any unsaturated hydrocarbon groups.

Without wishing to be bound by any particular theory, it may be postulated that the presence of at least one saturated hydrocarbon group in the second moiety may facilitate the second moiety to become oriented such that the terminal group of the at least one second moiety thereof is proximate to the exposed layer surface 11 of the patterning coating 130, due to the low degree of rigidity of saturated hydrocarbon group(s). In some non-limiting examples, it may be postulated that the presence of unsaturated hydrocarbon group(s) may inhibit the molecule from taking on such orientation.

A characteristic surface energy, as used herein particularly with respect to a material, may generally refer to a surface energy determined from such material. By way of non-limiting example, a characteristic surface energy may be measured from a surface formed by the material deposited and/or coated in a thin film form. Various methods and theories for determining the surface energy of a solid are known. By way of non-limiting example, a surface energy may be calculated or derived based on a series of contact angle measurements, in which various liquids may be brought into contact with a surface of a solid to measure the contact angle between the liquid-vapor interface and the surface. In some non-limiting examples, a surface energy of a solid surface may be equal to the surface tension of a liquid with the highest surface tension that completely wets the surface. By way of non-limiting example, a Zisman plot may be used to determine a highest surface tension value that would result in complete wetting (i.e. contact angle of 0°) of the surface.

In some non-limiting examples, the patterning material 411 may comprise a compound that comprises F and C in an atomic ratio corresponding to a quotient of F/C of at least one of at least about: 1, 1.3, 1.5, 1.7, or 2.

In some non-limiting examples, the patterning material 411 may comprise a compound in which all F atoms are bonded to $sp^3$ carbon atoms. In some non-limiting examples, an atomic ratio of F to C may be determined by counting all of the F atoms present in the compound structure, and for C atoms, counting solely the $sp^3$ hybridized C atoms present in the compound structure. In some non-limiting examples, the patterning material 411 may comprise a compound that comprises, as the second moiety or a part thereof, a moiety comprising F and C in an atomic ratio corresponding to a quotient of F/C of at least about: 1.5, 1.7, 2, 2.1, 2.3, or 2.5.

Those having ordinary skill in the relevant art will appreciate that the presence of materials in a coating which comprises at least one of: F, $sp^3$ carbon, and/or other functional groups or moieties may be detected using various methods known in the art, including by way of non-limiting example, an X-ray Photoelectron Spectroscopy (XPS).

In some non-limiting examples, the second moiety may comprise a siloxane group.

In some non-limiting examples, each moiety of the plurality of second moieties may comprise a proximal group, bonded to at least one of the first moiety and the third moiety, and a terminal group arranged distal to the proximal group.

In some non-limiting examples, the terminal group may comprise a $CF_2H$ group. In some non-limiting examples, the terminal group may comprise a $CF_3$ group. In some non-limiting examples, the terminal group may comprise a $CH_2CF_3$ group.

In some non-limiting examples, each of the plurality of second moieties may comprise at least one of a linear fluoroalkyl group and a linear fluoroalkoxy group.

In some non-limiting examples, a sum of a molecular weight of each of the at least one second moieties in a compound structure may be at least one of at least about: 1,200 g/mol, 1,500 g/mol, 1,700 g/mol, 2,000 g/mol, 2,500 g/mol, and 3,000 g/mol.

In some non-limiting examples, the at least one second moiety may comprise a hydrophobic moiety.

In some non-limiting examples, the third moiety may be a linker group. In some non-limiting examples, the third moiety may be at least one of: a single bond, O, N, NH, C, CH, $CH_2$, and S.

In some non-limiting examples, the patterning material 411 may comprise a cyclophosphazene derivative represented by at least one of Formula (C-2) and (C-3):

Formula (C-2)

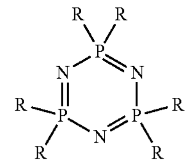

Formula (C-3)

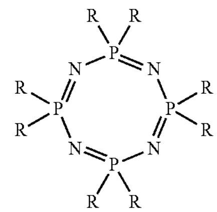

where:

R each independently represents and/or comprises, the second moiety.

In some non-limiting examples, R may comprise a fluoroalkyl group. In some non-limiting examples, the fluoroalkyl group may be a $C_1$-$C_{18}$ fluoroalkyl. In some non-limiting examples, the fluoroalkyl group may be represented by the formula:

$$*\text{—}(CH_2)_t(CF_2)_uZ$$

Where:

t represents an integer between 1 and 3;

u represents an integer between 5 and 12; and

Z represents at least one of H, deutero (D), and F.

In some non-limiting examples, R may comprise the terminal group, the terminal group being arranged distal to the corresponding P atom to which R is bonded.

In some non-limiting examples, R may comprise the third moiety bonded to the second moiety. In some non-limiting examples, the third moiety of each R may be bonded to the corresponding P atom in at least one of Formula (C-2) and (C-3).

In some non-limiting examples, the third moiety is an oxygen atom.

In some non-limiting examples, the first moiety may be spaced apart from the second moiety.

Without wishing to be bound by any particular theory, it may be postulated that the interposition of the orientation layer 120 between the patterning coating 130 and the underlying layer may, in some non-limiting examples, provide improved patterning contrast against the deposition of the deposited material 531 on an exposed layer surface 11 of the device 100, so as to substantially preclude deposition of the deposited material 531 on the exposed layer surface 11 of the patterning coating 130, including without limitation, as a closed coating 150, and/or as at least one particle structure 160, in some non-limiting examples, especially when the first moiety of the patterning material 411 exhibits a degree of intermolecular interaction with the orientation material upon being deposited on the orientation layer 120.

Without wishing to be bound by any particular theory, it may be postulated that in some non-limiting examples, a patterning coating 130 comprising a patterning material 411 that exhibits a degree of intermolecular interaction with the orientation material may tend to be oriented such that the second moiety of the patterning material 411 of which the patterning coating 130 may be comprised may tend to be oriented to be proximate to the exposed layer surface 11 of the patterning coating 130, thus presenting a low(er) surface energy surface to the deposited material 531.

In some non-limiting examples, the ability of the patterning coating to be so oriented may be dependent upon the average layer thickness of the patterning coating 130, and in some non-limiting examples, may be maximized and/or facilitated within a range thereof.

In some non-limiting examples, a range of the average layer thickness $d_2$ of the patterning coating 130 in which such enhanced patterning contrast may be observed may be correlated to a characteristic size of the molecular structure of the patterning material 411.

In some non-limiting examples, a minimum value of such range may be at least one of at least about: 1 nm, 2 nm, 3 nm, 4 nm, and 5 nm.

Without wishing to be bound by any particular theory, it may be postulated that if the patterning coating 130 has an average layer thickness $d_2$ that is less than such minimum value, the patterning material 411 may not provide a complete surface coverage over the desired part of the device, such that the patterning contrast may be compromised.

In some non-limiting examples, a maximum value of such range may be at least one of no more than about: 5 nm, 6 nm, 7 nm, 8 nm, and 10 nm.

Without wishing to be bound by any particular theory, it may be postulated that if the patterning coating 130 has an average layer thickness $d_2$ that is greater than such maximum value, the likelihood of the molecules of the patterning material 411 being oriented such that the second moiety thereof is oriented proximate to the exposed layer surface 11 of the patterning coating 130 so as to present a low surface energy therein may be substantially reduced. This may be caused, at least in part, due to the molecule orientation becoming increasingly more random as additional molecules are deposited to form the patterning coating 130, therefore decreasing the likelihood of the second moiety being proximate at or near the exposed layer surface 11.

Accordingly, without wishing to be bound by any particular theory, it may be postulated that such enhanced patterning contrast as a result of the interposition of the orientation layer 120 between the patterning coating 130 and the underlying layer may be substantially restricted to a range of an average layer thickness of the patterning coating 130. In some non-limiting examples, the range of the average layer thickness of the patterning coating 130 for enhanced patterning contrast is at least one of between about: 2-6 nm, and 3-5 nm.

For purposes of simplicity of discussion, to the extent that a patterning coating 130 is deposited to act as a base for the deposition of at least one particle structure 160 thereon, such patterning coating 130 may be designated as a particle structure patterning coating $\mathbf{130}_p$. By contrast, to the extent that a patterning coating 130 is deposited in a first portion 101 to substantially preclude formation in such first portion 101 of a closed coating 150 of the deposited layer 140, thus restricting the deposition of a closed coating 150 of the deposited layer 140 to a second portion 102, such patterning coating 130 may be designated as a non-particle structure patterning coating $\mathbf{130}_n$. Those having ordinary skill in the relevant art will appreciate that in some non-limiting examples, a patterning coating 130 may act as both a particle structure patterning coating $\mathbf{130}_p$ and a non-particle structure patterning coating $\mathbf{130}_n$.

The patterning coating 130 may provide an exposed layer surface 11 with a relatively low initial sticking probability (in some non-limiting examples, under the conditions identified in the dual QCM technique described by Walker et al.) against the deposition of deposited material 531, which, in some non-limiting examples, may be substantially less than the initial sticking probability against the deposition of the deposited material 531 of the exposed layer surface 11 of the underlying layer of the device 100, upon which the orientation layer 120 and the patterning coating 130 has been deposited.

In some non-limiting examples, the initial sticking probability of the patterning material 411 may be determined by depositing such material as a film, and/or coating in a form, and under similar circumstances to the deposition of the patterning coating 130 within the device 100, having sufficient thickness so as to mitigate or reduce any effects on the degree of intermolecular interaction with the orientation material of the patterning material 411 upon deposition on a surface. By way of non-limiting example, the initial sticking probability may be measured on a film or coating having thickness of at least one of at least about: 20 nm, 25 nm, 30 nm, 50 nm, 60 nm, and 100 nm.

Because of the low initial sticking probability of the patterning coating 130, and/or the patterning material 411, in some non-limiting examples, when deposited as a film, and/or coating in a form, and under similar circumstances to the deposition of the patterning coating 130 within the device 100, against the deposition of the deposited material 531, the exposed layer surface 11 the patterning coating 130, including without limitation, in the first portion 101, may be substantially devoid of a closed coating 150 of the deposited material 531.

In some non-limiting examples, the patterning coating 130, and/or the patterning material 411, in some non-limiting examples, when deposited as a film, and/or coating in a form, and under similar circumstances to the deposition of the patterning coating 130 within the device 100, may have an initial sticking probability against the deposition of the deposited material 531, that is at least one of no more than about: 0.3, 0.2, 0.15, 0.1, 0.08, 0.05, 0.03, 0.02, 0.01, 0.008, 0.005, 0.003, 0.001, 0.0008, 0.0005, 0.0003, and 0.0001.

In some non-limiting examples, the patterning coating 130, and/or the patterning material 411, in some non-limiting examples, when deposited as a film, and/or coating in a form, and under similar circumstances to the deposition of the patterning coating 130 within the device 100, may have an initial sticking probability against the deposition of Ag, and/or Mg that is at least one of no more than about: 0.3, 0.2, 0.15, 0.1, 0.08, 0.05, 0.03, 0.02, 0.01, 0.008, 0.005, 0.003, 0.001, 0.0008, 0.0005, 0.0003, and 0.0001.

In some non-limiting examples, the patterning coating 130, and/or the patterning material 411, in some non-limiting examples, when deposited as a film, and/or coating in a form, and under similar circumstances to the deposition of the patterning coating 130 within the device 100, may have an initial sticking probability against the deposition of a deposited material 531 of at least one of between about: 0.15-0.0001, 0.1-0.0003, 0.08-0.0005, 0.08-0.0008, 0.05-0.001, 0.03-0.0001, 0.03-0.0003, 0.03-0.0005, 0.03-0.0008, 0.03-0.001, 0.03-0.005, 0.03-0.008, 0.03-0.01, 0.02-0.0001, 0.02-0.0003, 0.02-0.0005, 0.02-0.0008, 0.02-0.001, 0.02-0.005, 0.02-0.008, 0.02-0.01, 0.01-0.0001, 0.01-0.0003, 0.01-0.0005, 0.01-0.0008, 0.01-0.001, 0.01-0.005, 0.01-0.008, 0.008-0.0001, 0.008-0.0003, 0.008-0.0005, 0.008-0.0008, 0.008-0.001, 0.008-0.005, 0.005-0.0001, 0.005-0.0003, 0.005-0.0005, 0.005-0.0008, and 0.005-0.001.

In some non-limiting examples, the patterning coating 130, and/or the patterning material 411, in some non-limiting examples, when deposited as a film, and/or coating in a form, and under similar circumstances to the deposition of the patterning coating 130 within the device 100, may have an initial sticking probability against the deposition of a plurality of deposited materials 531 that is no more than a threshold value. In some non-limiting examples, such threshold value may be at least one of about: 0.3, 0.2, 0.18, 0.15, 0.13, 0.1, 0.08, 0.05, 0.03, 0.02, 0.01, 0.008, 0.005, 0.003, or 0.001.

In some non-limiting examples, the patterning coating 130, and/or the patterning material 411, in some non-limiting examples, when deposited as a film, and/or coating in a form, and under similar circumstances to the deposition of the patterning coating 130 within the device 100, may have an initial sticking probability that is less than such threshold value against the deposition of a plurality of deposited materials 531 selected from at least one of: Ag, Mg, Yb, Cd, and Zn. In some further non-limiting examples, the patterning coating 130 may exhibit an initial sticking probability of or below such threshold value against the deposition of a plurality of deposited materials 531 selected from at least one of: Ag, Mg, and Yb.

In some non-limiting examples, the patterning coating 130, and/or the patterning material 411, in some non-limiting examples, when deposited as a film, and/or coating in a form, and under similar circumstances to the deposition of the patterning coating 130 within the device 100, may exhibit an initial sticking probability against the deposition of a first deposited material 531 of, or below, a first threshold value, and an initial sticking probability against the deposition of a second deposited material 531 of, or below, a second threshold value. In some non-limiting examples, the first deposited material 531 may be Ag, and the second deposited material 531 may be Mg. In some other non-limiting examples, the first deposited material 531 may be Ag, and the second deposited material 531 may be Yb. In some other non-limiting examples, the first deposited material 531 may be Yb, and the second deposited material 531 may be Mg. In some non-limiting examples, the first threshold value may exceed the second threshold value.

In some non-limiting examples, the patterning coating 130, and/or the patterning material 411, in some non-limiting examples, when deposited as a film, and/or coating in a form, and under circumstances similar to the deposition of the patterning coating 130 within the device 100 may have a transmittance for EM radiation of at least a threshold transmittance value, after being subjected to a vapor flux 532 (FIG. 5) of the deposited material 531, including without limitation, Ag.

In some non-limiting examples, such transmittance may be measured after exposing the exposed layer surface 11 of the patterning coating 130 and/or the patterning material 411, formed as a thin film, to a vapor flux 532 of the deposited material 531, including without limitation, Ag, under typical conditions that may be used for depositing an electrode of an opto-electronic device 1200, which by way of non-limiting example, may be a cathode of an organic light-emitting diode (OLED) device.

In some non-limiting examples, the conditions for subjecting the exposed layer surface 11 to the vapor flux 532 of the deposited material 531, including without limitation, Ag, may be as follows: (i) vacuum pressure of about $10^{-4}$ Torr or $10^{-5}$ Torr; (ii) the vapor flux 532 of the deposited material 531, including without limitation, Ag being substantially consistent with a reference deposition rate of about 1 angstrom (A)/sec, which by way of non-limiting example, may be monitored and/or measured using a QCM; and (iii) the exposed layer surface 11 being subjected to the vapor flux 532 of the deposited material 531, including without limitation, Ag until a reference average layer thickness of about 15 nm is reached, and upon such reference average layer thickness being attained, the exposed layer surface 11 not being further subjected to the vapor flux 532 of the deposited material 531, including without limitation, Ag.

In some non-limiting examples, the exposed layer surface 11 being subjected to the vapor flux 532 of the deposited material 531, including without limitation, Ag may be substantially at room temperature (e.g. about 25° C.). In some non-limiting examples, the exposed layer surface 11 being subjected to the vapor flux 532 of the deposited material 531, including without limitation, Ag may be positioned about 65 cm away from an evaporation source by which the deposited material 531, including without limitation, Ag, is evaporated.

In some non-limiting examples, the threshold transmittance value may be measured at a wavelength in the visible spectrum. By way of non-limiting example, the threshold transmittance value may be measured at a wavelength of about 460 nm. In some non-limiting examples, the threshold transmittance value may be measured at a wavelength in the IR and/or NIR spectrum. By way of non-limiting example, the threshold transmittance value may be measured at a wavelength of about 700 nm, 900 nm, or about 1000 nm. In some non-limiting examples, the threshold transmittance value may be expressed as a percentage of incident EM power that may be transmitted through a sample. In some non-limiting examples, the threshold transmittance value may be at least one of at least about: 60%, 65%, 70%, 75%, 80%, 85%, or 90%.

In some non-limiting examples, there may be a positive correlation between the initial sticking probability of the patterning coating 130, and/or the patterning material 411, in some non-limiting examples, when deposited as a film, and/or coating in a form, and under circumstances similar to the deposition of the patterning coating 130 within the device 100, against the deposition of the deposited material 531 and an average layer thickness of the deposited material 531 thereon.

It would be appreciated by a person having ordinary skill in the relevant art that high transmittance may generally indicate an absence of a closed coating 150 of the deposited material 531, which by way of non-limiting example, may be Ag. On the other hand, low transmittance may generally indicate presence of a closed coating 150 of the deposited material 531, including without limitation, Ag, Mg, and/or Yb, since metallic thin films, particularly when formed as a closed coating 150, may exhibit a high degree of absorption of EM radiation.

It may be further postulated that exposed layer surfaces 11 exhibiting low initial sticking probability with respect to the deposited material 531, including without limitation, Ag, Mg, and/or Yb, may exhibit high transmittance. On the other hand, exposed layer surfaces 11 exhibiting high sticking probability with respect to the deposited material 531, including without limitation, Ag, Mg, and/or Yb, may exhibit low transmittance.

A series of samples was fabricated to measure the transmittance of an example material, as well as to visually observe whether or not a closed coating 150 of Ag was formed on the exposed layer surface 11 of such example material. Each sample was prepared by depositing, on a glass substrate 10, an approximately 50 nm thick coating of an example material, then subjecting the exposed layer surface 11 of the coating to a vapor flux 532 of Ag at a rate of about 1 Å/sec until a reference layer thickness of about 15 nm was reached. Each sample was then visually analyzed and the transmittance through each sample was measured.
The molecular structures of the example materials used in the samples herein are set out in Table 1 below:
TABLE 1
| Material | Molecular Structure/Name |
|---|---|
| HT211 | 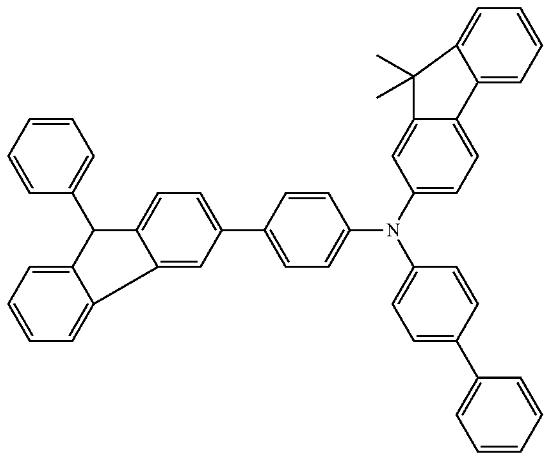 [SMILES: CC1(C)c2ccccc2-c2ccc(N(c3ccc(-c4ccccc4)cc3)c3ccc(-c4ccc5c(c4)-c4ccccc4C5c4ccccc4)cc3)cc21] |
| HT01 | 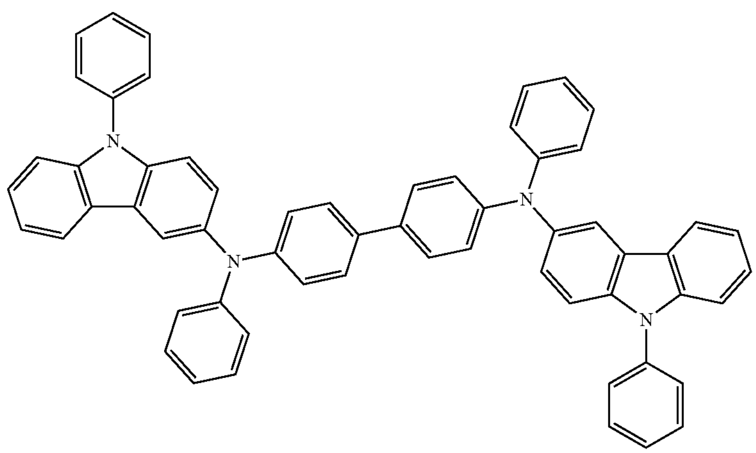 [SMILES: c1ccc(N(c2ccc(-c3ccc(N(c4ccccc4)c4ccc5c(c4)c4ccccc4n5-c4ccccc4)cc3)cc2)c2ccc3c(c2)c2ccccc2n3-c2ccccc2)cc1] |
| TAZ | 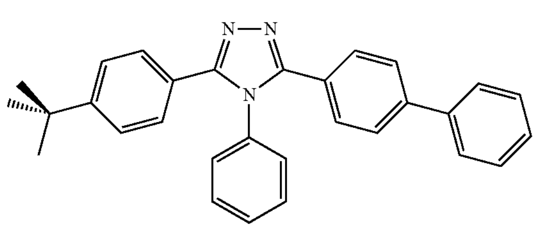 |

TABLE 1-continued
| Material | Molecular Structure/Name |
|---|---|
| Balq | 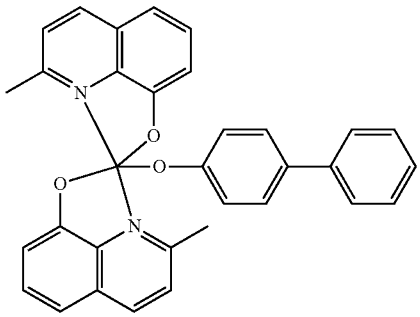 |
| Liq | 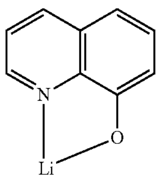 |
| Example Material 1 | 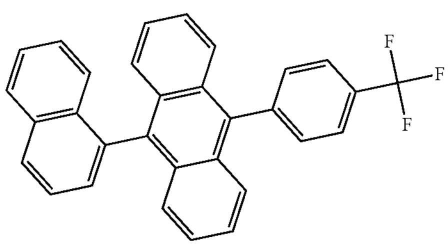 [SMILES: FC(F)(F)c1ccc(-c2c3ccccc3c(-c3cccc4ccccc34)c3ccccc23)cc1] |
| Example Material 2 | 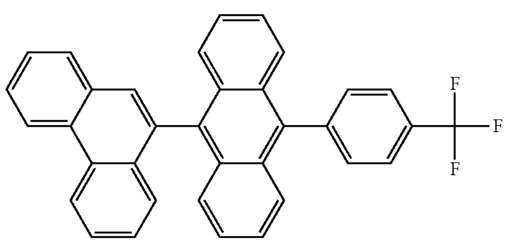 [SMILES: FC(F)(F)c1ccc(-c2c3ccccc3c(-c3cc4ccccc4c4ccccc34)c3ccccc23)cc1] |
| Example Material 3 | 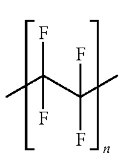 |

TABLE 1-continued
| Material | Molecular Structure/Name |
|---|---|
| Example Material 4 | 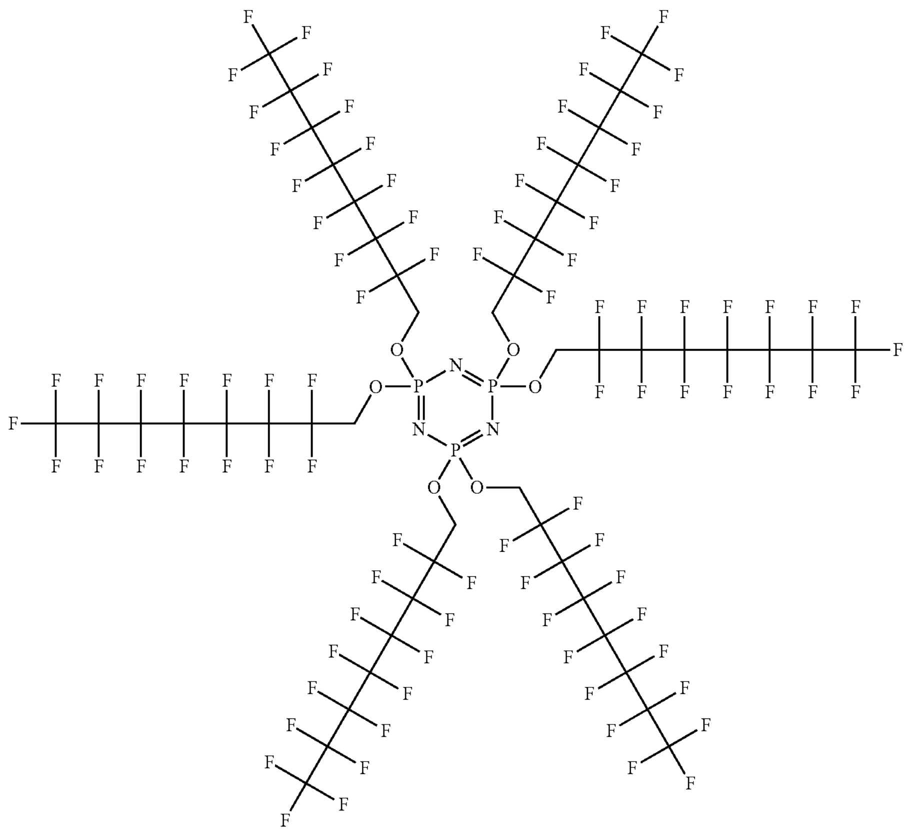 [SMILES: FC(F)(F)C(F)(F)C(F)(F)C(F)(F)C(F)(F)C(F)(F)C(F)(F)COP1(OCC(F)(F)C(F)(F)C(F)(F)C(F)(F)C(F)(F)C(F)(F)C(F)(F)F)=NP(OCC(F)(F)C(F)(F)C(F)(F)C(F)(F)C(F)(F)C(F)(F)C(F)(F)F)(OCC(F)(F)C(F)(F)C(F)(F)C(F)(F)C(F)(F)C(F)(F)C(F)(F)F)=NP(OCC(F)(F)C(F)(F)C(F)(F)C(F)(F)C(F)(F)C(F)(F)C(F)(F)F)(OCC(F)(F)C(F)(F)C(F)(F)C(F)(F)C(F)(F)C(F)(F)C(F)(F)F)=N1] |
| Example Material 5 | 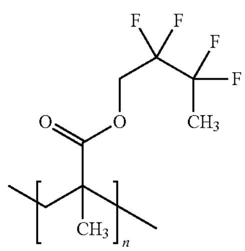 |
| Example Material 6 | 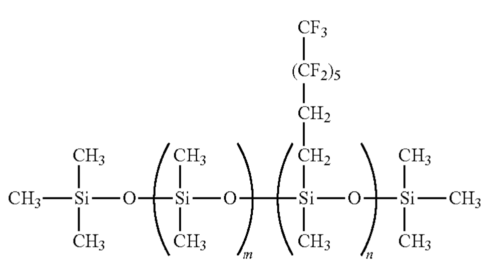 |

TABLE 1-continued
| Material | Molecular Structure/Name |
|---|---|
| Example Material 7 | 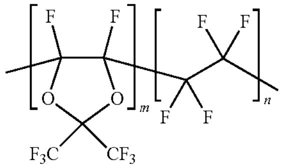 |
| Example Material 8 | 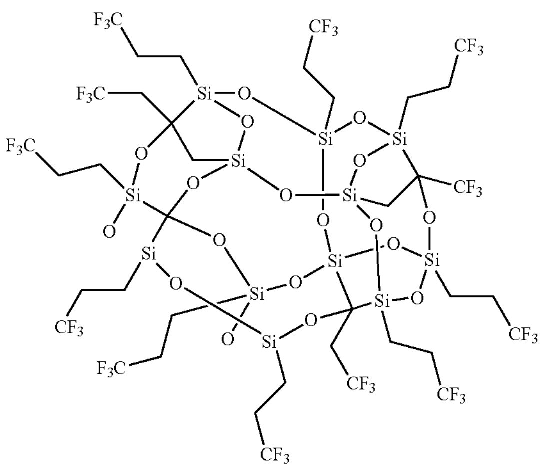 |
| Example Material 9 | 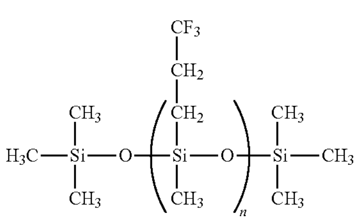 |

TABLE 1-continued

| Material | Molecular Structure/Name |
|---|---|
| Example Material 10 | |
| Example Material 11 | 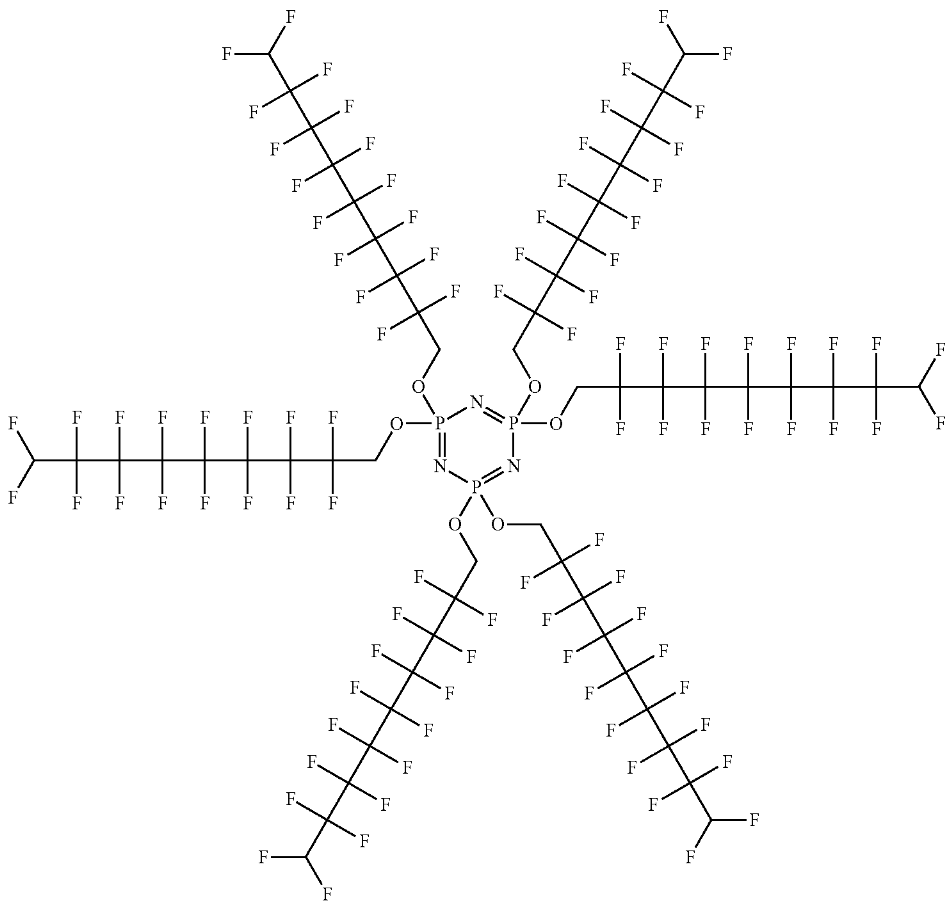 [SMILES: FC(F)C(F)(F)C(F)(F)C(F)(F)C(F)(F)C(F)(F)C(F)(F)C(F)(F)COP1(OCC(F)(F)C(F)(F)C(F)(F)C(F)(F)C(F)(F)C(F)(F)C(F)(F)C(F)F)=NP(OCC(F)(F)C(F)(F)C(F)(F)C(F)(F)C(F)(F)C(F)(F)C(F)(F)C(F)F)(OCC(F)(F)C(F)(F)C(F)(F)C(F)(F)C(F)(F)C(F)(F)C(F)(F)C(F)F)=NP(OCC(F)(F)C(F)(F)C(F)(F)C(F)(F)C(F)(F)C(F)(F)C(F)(F)C(F)F)(OCC(F)(F)C(F)(F)C(F)(F)C(F)(F)C(F)(F)C(F)(F)C(F)(F)C(F)F)=N1] |

The samples in which a substantially closed coating 150 of Ag had formed were visually identified, and the presence of such coating in these samples was further confirmed by measurement of transmittance therethrough, which showed transmittance of no more than about 50% at a wavelength of about 460 nm.

The samples in which no closed coating 150 of Ag had formed were also identified, and the absence of such coating in these samples was further confirmed by measurement of transmittance therethrough, which showed transmittance in excess of about 70% at a wavelength of about 460 nm.

The results are summarized in Table 2 below:

TABLE 2

| Material | Closed Coating of Ag? |
|---|---|
| HT211 | Present |
| HT01 | Present |
| TAZ | Present |
| Balq | Present |
| Liq | Present |
| Example Material 1 | Present |
| Example Material 2 | Present |

TABLE 2-continued

| Material | Closed Coating of Ag? |
|---|---|
| Example Material 3 | Not Present |
| Example Material 4 | Not Present |
| Example Material 5 | Not Present |
| Example Material 6 | Not Present |
| Example Material 7 | Not Present |
| Example Material 8 | Not Present |
| Example Material 9 | Not Present |
| Example Material 10 | Not Present |
| Example Material 11 | Not Present |

Based on the foregoing, it was found that the materials used in the first 7 samples in Tables 1 and 2 (HT211 to Example Material 2) may be less suitable for inhibiting the deposition of the deposited material 531 thereon, including without limitation, Ag, and/or Ag-containing materials.

On the other hand, it was found that Example Material 3 to Example Material 11 may be suitable, at least in some non-limiting applications, to act as a patterning coating 130 for inhibiting the deposition of the deposited material 531 thereon, including without limitation, Ag, and/or Ag-containing materials.

In some non-limiting examples, the patterning coating 130, and/or the patterning material 411, in some non-limiting examples, when deposited as a film, and/or coating in a form, and under circumstances similar to the deposition of the patterning coating 130 within the device 100, may have a surface energy of at least one of no more than about: 24 dynes/cm, 22 dynes/cm, 20 dynes/cm, 18 dynes/cm, 16 dynes/cm, 15 dynes/cm, 13 dynes/cm, 12 dynes/cm, or 11 dynes/cm.

In some non-limiting examples, the surface energy may be at least one of at least about: 6 dynes/cm, 7 dynes/cm, or 8 dynes/cm.

In some non-limiting examples, the surface energy may be at least one of between about: 10-20 dynes/cm, or 13-19 dynes/cm.

In some non-limiting examples, the critical surface tension of a surface may be determined according to the Zisman method, as further detailed in W. A. Zisman, *Advances in Chemistry* 43 (1964), pp. 1-51.

By way of non-limiting example, a series of samples was fabricated to measure the critical surface tension of the surfaces formed by the various materials. The results of the measurement are summarized in Table 3 below:

TABLE 3

| Material | Critical Surface Tension (dynes/cm) |
|---|---|
| HT211 | 25.6 |
| HT01 | >24 |
| TAZ | 22.4 |
| Balq | 25.9 |
| Liq | 24 |
| Example Material 1 | 26.3 |
| Example Material 2 | 24.8 |
| Example Material 3 | 19 |
| Example Material 4 | 7.6 |
| Example Material 5 | 15.9 |
| Example Material 6 | <20 |
| Example Material 7 | 13.1 |
| Example Material 8 | 20 |
| Example Material 9 | 18.9 |
| Example Material 10 | 15.4 |
| Example Material 11 | 13.4 |

Based on the foregoing measurement of the critical surface tension in Table 3 and the previous observation regarding the presence or absence of a substantially closed coating 150 of Ag, it was found that materials that form low surface energy surfaces when deposited as a coating, which by way of non-limiting example, may be those having a critical surface tension of at least one of between about: 13-20 dynes/cm, or 13-19 dynes/cm, may be suitable for forming the patterning coating 130 to inhibit deposition of a deposited material 531 thereon, including without limitation, Ag, and/or Ag-containing materials.

A series of samples was fabricated to measure the reduction in transmittance of an example patterning material 411, as an indication of the enhanced patterning contrast that may be attributable to the interposition of an orientation layer 120 between the patterning coating 130 and the underlying layers.

Each sample was prepared by depositing, on a glass substrate 10, an approximately 20 nm thick supporting layer 115, comprising a mixture of an ETL 1639 material and Liq in a composition of approximately 1:1 by volume. In a first set of samples, an orientation layer 120 comprising a first layer of approximately 2 nm of Yb and a second layer of approximately 10 nm of MgAg in a composition of approximately 1:9 by volume was deposited on the supporting layer 115. In a second set of samples, no orientation layer 120 was deposited. Thereafter, each sample had deposited, on an exposed layer surface 11 thereof, a patterning coating 130 having an average layer thickness that varied in a range of between about: 5-11 nm. Example Material 10 was used to form the patterning coating 130. The transmittance of EM radiation through each sample was measured at this stage, following which each sample was subjected to a vapor flux 532 of a deposited material 531 comprising Ag having a reference layer thickness of approximately 30 nm and a further measurement of the transmittance of EM radiation through each sample was measured.

For each sample, a transmittance reduction, corresponding to a difference between the transmittance measurement from the sample and the transmittance measurement from a comparison sample in which the sample structure is identical but without being exposed to vapor flux 532 of Ag was recorded for various wavelengths of EM radiation. Those having ordinary skill in the relevant art will appreciate that a low transmittance reduction indicates that the vapor deposition stage between the first and the second measurement did not result in significant deposition of the deposited material 531, which may be indicative, in some non-limiting examples, of good patterning contrast by the patterning coating 130 against deposition of the deposited material 531.

The transmittance reduction measurements for the first set of samples are set out in Table 4 below:

TABLE 4

| Thickness of | Transmittance Reduction | | |
|---|---|---|---|
| Patterning Coating | 450 nm | 600 nm | 900 nm |
| 5 nm | 2.7% | 4.0% | 5.3% |
| 7 nm | 1.2% | <1.0% | 1.1% |
| 9 nm | 1.7% | <1.0% | <1.0% |
| 11 nm | 1.7% | <1.0% | <1.0% |

The transmittance reduction measurements for the second set of samples are set out in Table 5 below:

TABLE 5

| Thickness of | Transmittance Reduction | | |
|---|---|---|---|
| Patterning Coating | 450 nm | 600 nm | 900 nm |
| 5 nm | 22.2% | 28.3% | 32.6% |
| 7 nm | 9.8% | 7.6% | 9.4% |
| 9 nm | 6.7% | 3.0% | 3.3% |
| 11 nm | 5.2% | 1.3% | <1.0% |

As may be seen, the transmittance reduction values in Table 4 are markedly and consistently lower than the corresponding values in Table 5, suggesting that the interposition of the orientation layer 120 between the supporting layer 115 and the patterning coating 130 resulted in improved patterning contrast.

Furthermore, it may be observed that for the first set of samples, as the thickness of the patterning coating 130 increases, the transmittance reduction is decreased, across all wavelengths. By contrast, as may be best seen with the 450 nm wavelength, for the second set of samples, the transmittance reduction reaches a local minimum at an intermediate value of the thickness (7 nm), suggesting that there exists a range between a minimum and a maximum value during which the patterning contrast is enhanced, which in some non-limiting examples may correspond to a thickness range for the patterning coating 130 during which the tendency to orient the high surface energy component of the molecules of the patterning material 411 toward the exposed layer surface 11 of the orientation layer 120 having a high surface energy may provide a tendency to present the low surface energy component of such molecules toward the exposed layer surface of the patterning coating 130, as discussed herein.

A series of samples was fabricated to explore this tendency with orientation layers 120 comprised of various different orientation materials.

Each sample was prepared by depositing, on a glass substrate 10, an approximately 20 nm thick supporting layer 115, comprising at least one semiconducting layer 1230 (namely a mixture of an ETL 1639 material and Liq in a composition of approximately 1:1 by volume). Thereafter, an orientation layer of approximately 10 nm of an orientation material was deposited on the supporting layer, followed by a patterning coating 130 having an average layer thickness that varied in a range of between about between about 2-10 nm. Example Material 11 was used to form the patterning coating 130. The transmittance of EM radiation through each sample was measured at this stage, following which each sample was subjected to a vapor flux 532 of a deposited material 531 comprising Ag having a reference layer thickness of approximately 120 nm and a further measurement of the transmittance of EM radiation through each sample was measured.

In a third set of samples, an orientation material comprising MgAg in a composition of approximately 1:9 by volume was used. The transmittance reduction measurements for this third set of samples are set out in Table 6 below:

TABLE 6

| Thickness of | Transmittance Reduction | | |
|---|---|---|---|
| Patterning Coating | 450 nm | 600 nm | 900 nm |
| 4 nm | 34.0% | 24.3% | 14.8% |
| 6 nm | <1.0% | <1.0% | <1.0% |
| 8 nm | 4.1% | 1.9% | 1.5% |
| 10 nm | 12.8% | 1.1% | <1.0% |

As may be seen, the change in transmittance reduction is more accentuated, having regard to the larger reference layer thickness of the vapor flux 532 of the deposited material 531 (120 nm) relative to that used in the first two sets of samples (30 nm).

Additionally, there is observed a substantial drop in transmittance reduction for thicknesses of the patterning coating 130 beyond 4 nm, with a gradual increase in transmittance reduction at least at the 450 nm wavelength as the thickness increases beyond 6 nm. This suggests that for this set of samples, an average layer thickness of the patterning coating 130 that is less than about 4 nm may not be large enough to ensure the formation of a closed coating 150 thereof, or to otherwise provide complete coverage.

In a fourth set of samples, an orientation material comprising Cu was used. The transmittance reduction measurements for this fourth set of samples are set out in Table 7 below:

TABLE 7

| Thickness of | Transmittance Reduction | | |
|---|---|---|---|
| Patterning Coating | 450 nm | 600 nm | 900 nm |
| 2 nm | 29.9% | 48.0% | 32.0% |
| 4 nm | <1.0% | <1.0% | <1.0% |
| 6 nm | 2.2% | <1.0% | 1.8% |
| 8 nm | 7.9% | 2.7% | 1.8% |

Similar results may be seen, with the minimum (or optimal) value of the effective range of the thickness of the patterning coating 130 being somewhere around 4 nm.

In a fifth set of samples, an orientation material comprising Ag was used. The transmittance reduction measurements for this fifth set of samples are set out in Table 8 below:

TABLE 8

| Thickness of | Transmittance Reduction | | |
|---|---|---|---|
| Patterning Coating | 450 nm | 600 nm | 900 nm |
| 4 nm | 25.3% | 16.0% | 11.1% |
| 6 nm | 1.9% | <1.0% | 1.4% |
| 8 nm | 6.0% | 2.0% | 1.4% |
| 10 nm | 11.5% | 1.0% | <1.0% |

Again, similar results may be seen, with the minimum (or optimal) value of the effective range of the thickness of the patterning coating 130 being somewhere around 6 nm, at least for the 450 nm wavelength.

In a sixth set of samples, each sample was prepared by depositing, on a glass substrate 10, an orientation layer of approximately 10 nm of an orientation material was deposited on the supporting layer, followed by a patterning coating 130 having an average layer thickness that varied in a range of between about 2-10 nm. The transmittance of EM radiation through each sample was measured at this stage, following which each sample was subjected to a vapor flux 532 of a deposited material 531 comprising Ag having a reference layer thickness of approximately 120 nm and a further measurement of the transmittance of EM radiation through each sample was measured. Thus, the sixth set of samples was identical to the fifth set of samples, with the exception that the supporting layer 115 comprising at least one semiconducting layer 1230 was omitted. The transmittance reduction measurements for this sixth set of samples are set out in Table 9 below:

TABLE 9

| Thickness of | Transmittance Reduction | | |
|---|---|---|---|
| Patterning Coating | 450 nm | 600 nm | 900 nm |
| 2 nm | 25.2% | 37.1% | 69% |
| 4 nm | <1.0% | 11.9% | 47.8% |
| 6 nm | 9.5% | 18.9% | 42.0% |
| 8 nm | 10.7% | 12.4% | 47.0% |

As may be seen, the transmittance is markedly reduced for the samples in the sixth set, relative to corresponding measurements in the fifth set, especially for the 600 nm and 900 nm wavelengths. This suggests that the interposition of a supporting layer 115 between the orientation layer 120 and the underlying layers may provide enhanced patterning contrast.

In some non-limiting examples, the patterning coating 130, and/or the patterning material 411, in some nonlimiting examples, when deposited as a film, and/or coating in a form, and under circumstances similar to the deposition of the patterning coating 130 within the device 100, may have a low refractive index.

In some non-limiting examples, the patterning coating 130, and/or the patterning material 411, in some non-limiting examples, when deposited as a film, and/or coating in a form, and under circumstances similar to the deposition of the patterning coating 130 within the device 100, may have a refractive index for EM radiation at a wavelength of 550 nm that may be at least one of no more than about: 1.55, 1.5, 1.45, 1.43, 1.4, 1.39, 1.37, 1.35, 1.32, or 1.3.

Without wishing to be bound by any particular theory, it has been observed that providing the patterning coating 130 having a low refractive index may, at least in some devices 100, enhance transmission of external EM radiation through the second portion 102 thereof. By way of non-limiting example, devices 100 including an air gap therein, which may be arranged near or adjacent to the patterning coating 130, may exhibit a higher transmittance when the patterning coating 130 has a low refractive index relative to a similarly configured device in which such low-index patterning coating 130 was not provided.

By way of non-limiting example, a series of samples was fabricated to measure the refractive index at a wavelength of 550 nm for the coatings formed by some of the various example materials. The results of the measurement are summarized in Table 10 below:

TABLE 10

| Material | Refractive Index |
|---|---|
| HT211 | 1.76 |
| HT01 | 1.80 |
| TAZ | 1.69 |
| Balq | 1.69 |
| Liq | 1.64 |
| Example Material 2 | 1.72 |
| Example Material 3 | 1.37 |
| Example Material 5 | 1.38 |
| Example Material 7 | 1.3 |
| Example Material 10 | 1.36 |
| Example Material 11 | 1.34 |

Based on the foregoing measurement of refractive index in Table 10, and the previous observation regarding the presence or absence of a substantially closed coating 150 of Ag in Table 2, it was found that materials that form a low refractive index coating, which by way of non-limiting example, may be those having a refractive index of at least one of no more than about: 1.4 or 1.38, may be suitable for forming the patterning coating 130 to inhibit deposition of a deposited material 531 thereon, including without limitation, Ag, and/or an Ag-containing materials.

In some non-limiting examples, the patterning coating 130, and/or the patterning material 411, in some non-limiting examples, when deposited as a film, and/or coating in a form, and under similar circumstances to the deposition of the patterning coating 130 within the device 100, may have an extinction coefficient that may be no more than about 0.01 for photons at a wavelength that is at least one of at least about: 600 nm, 500 nm, 460 nm, 420 nm, or 410 nm.

In some non-limiting examples, the patterning coating 130, and/or the patterning material 411, in some non-limiting examples, when deposited as a film, and/or coating in a form, and under circumstances similar to the deposition of the patterning coating 130 within the device 100, may not substantially attenuate EM radiation passing therethrough, in at least the visible spectrum.

In some non-limiting examples, the patterning coating 130, and/or the patterning material 411, when deposited as a film, and/or coating in a form, and under circumstances similar to the deposition of the patterning coating 130 within the device 100, may not substantially attenuate EM radiation passing therethrough, in at least the IR spectrum and/or the NIR spectrum.

In some non-limiting examples, the patterning coating 130, and/or the patterning material 411, in some non-limiting examples, when deposited as a film, and/or coating in a form, and under circumstances similar to the deposition of the patterning coating 130 within the device 100, may have an extinction coefficient that may be at least one of at least about: 0.05, 0.1, 0.2, or 0.5 for EM radiation at a wavelength shorter than at least one of at least about: 400 nm, 390 nm, 380 nm, or 370 nm.

In this way, the patterning coating 130, and/or the patterning material 411, when deposited as a film, and/or coating in a form, and under circumstances similar to the deposition of the patterning coating 130 within the device 100, may absorb EM radiation in the UVA spectrum incident upon the device 100, thereby reducing a likelihood that EM radiation in the UVA spectrum may impart undesirable effects in terms of device performance, device stability, device reliability, and/or device lifetime.

In some non-limiting examples, the patterning coating 130, and/or the patterning material 411, in some non-limiting examples, when deposited as a film, and/or coating in a form, and under circumstances similar to the deposition of the patterning coating 130 within the device 100, may have a glass transition temperature that is at least one of: (i) at least one of at least about: 300° C., 150° C., 130° C., 120° C., and 100° C., and (ii) at least one of no more than about: 30° C., 0° C., −30° C., and −50° C.

In some non-limiting examples, the patterning material 411 may have a sublimation temperature of at least one of between about: 100-320° C., 120-300° C., 140-280° C., or 150-250° C. In some non-limiting examples, such sublimation temperature may allow the patterning material 411 to be readily deposited as a coating using PVD.

The sublimation temperature of a material may be determined using various methods apparent to those having ordinary skill in the relevant art, including without limitation, by heating the material under high vacuum in a crucible and by determining a temperature that may be attained to:

- observe commencement of the deposition of the material onto a surface on a QCM mounted a fixed distance from the crucible;
- observe a specific deposition rate, by way of non-limiting example, 0.1 Å/sec, onto a surface on a QCM mounted a fixed distance from the crucible; and/or
- reach a threshold vapor pressure of the material, by way of non-limiting example, about $10^{-4}$ or $10^{-5}$ Torr.

In some non-limiting examples, the sublimation temperature of a material may be determined by heating the material in an evaporation source under a high vacuum environment, by way of non-limiting example, about $10^{-4}$ Torr, and by determining a temperature that may be attained to cause the material to evaporate, thus generating a vapor flux sufficient to cause deposition of the material, by way of non-limiting example, at a deposition rate of about 0.1 Å/sec onto a surface on a QCM mounted a fixed distance from the source.

In some non-limiting examples, the QCM may be mounted about 65 cm away from the crucible for the purpose of determining the sublimation temperature.

In some non-limiting examples, the patterning material 411 may comprise a plurality of different materials.

In some non-limiting examples, a molecular weight of the compound of the patterning material 411 may be at least one of no more than about: 5,000 g/mol, 4,500 g/mol, 4,000 g/mol, 3,800 g/mol, or 3,500 g/mol.

In some non-limiting examples, the molecular weight of the compound of the patterning material 411 may be at least one of at least about: 1,500 g/mol, 1,700 g/mol, 2,000 g/mol, 2,200 g/mol, or 2,500 g/mol.

Without wishing to be bound by any particular theory, it may be postulated that, for compounds that are adapted to form surfaces with relatively low surface energy, there may be an aim, in at least some applications, for the molecular weight of such compounds to be at least one of between about: 1,500-5,000 g/mol, 1,500-4,500 g/mol, 1,700-4,500 g/mol, 2,000-4,000 g/mol, 2,200-4,000 g/mol, or 2,500-3,800 g/mol.

Without wishing to be bound by any particular theory, it may be postulated that such compounds may exhibit at least one property that maybe suitable for forming a coating, and/or layer having: (i) a relatively high melting point, by way of non-limiting example, of at least 100° C., (ii) a relatively low surface energy, and/or (iii) a substantially amorphous structure, when deposited, by way of non-limiting example, using vacuum-based thermal evaporation processes.

In some non-limiting examples, a percentage of the molar weight of such compound that may be attributable to the presence of F atoms, may be at least one of between about: 40-90%, 45-85%, 50-80%, 55-75%, or 60-75%. In some non-limiting examples, F atoms may constitute a majority of the molar weight of such compound.

In some non-limiting examples, the patterning coating 130 may be disposed in a pattern that may be defined by at least one region therein that may be substantially devoid of a closed coating 150 of the patterning coating 130. In some non-limiting examples, the at least one region may separate the patterning coating 130 into a plurality of discrete fragments thereof. In some non-limiting examples, the plurality of discrete fragments of the patterning coating 130 may be physically spaced apart from one another in the lateral aspect thereof. In some non-limiting examples, the plurality of the discrete fragments of the patterning coating 130 may be arranged in a regular structure, including without limitation, an array or matrix, such that in some non-limiting examples, the discrete fragments of the patterning coating 130 may be configured in a repeating pattern.

In some non-limiting examples, at least one of the plurality of the discrete fragments of the patterning coating 130 may each correspond to an emissive region 1310. In some non-limiting examples, an aperture ratio of the emissive regions 1310 may be at least one of no more than about: 50%, 40%, 30%, or 20%.

In some non-limiting examples, the patterning coating 130 may be formed as a single monolithic coating.

In some non-limiting examples, the patterning coating 130 may have and/or provide, including without limitation, because of the patterning material 411 used and/or the deposition environment, at least one nucleation site for the deposited material 531.

In some non-limiting examples, the patterning coating 130 may be doped, covered, and/or supplemented with another material that may act as a seed or heterogeneity, to act as such a nucleation site for the deposited material 531. In some non-limiting examples, such other material may comprise an NPC 720 material. In some non-limiting examples, such other material may comprise an organic material, such as by way of non-limiting example, a polycyclic aromatic compound, and/or a material comprising a non-metallic element such as, without limitation, at least one of: O, S, N, or C, whose presence might otherwise be a contaminant in the source material, equipment used for deposition, and/or the vacuum chamber environment. In some non-limiting examples, such other material may be deposited in a layer thickness that is a fraction of a monolayer, to avoid forming a closed coating 150 thereof. Rather, the deposited material of such other material may tend to be spaced apart in the lateral aspect so as form discrete nucleation sites for the deposited material.

In some non-limiting examples, the patterning coating 130 may act as an optical coating. In some non-limiting examples, the patterning coating 130 may modify at least one property, and/or characteristic of EM radiation (including without limitation, in the form of photons) emitted by the device 100. In some non-limiting examples, the patterning coating 130 may exhibit a degree of haze, causing emitted EM radiation to be scattered. In some non-limiting examples, the patterning coating 130 may comprise a crystalline material for causing EM radiation transmitted therethrough to be scattered. Such scattering of EM radiation may facilitate enhancement of the outcoupling of EM radiation from the device 100 in some non-limiting examples. In some non-limiting examples, the patterning coating 130 may initially be deposited as a substantially non-crystalline, including without limitation, substantially amorphous, coating, whereupon, after deposition thereof, the patterning coating 130 may become crystallized and thereafter serve as an optical coupling.

A material which is suitable for use in providing the patterning coating 130 may generally have a low surface energy when deposited as a thin film or coating on a surface. In some non-limiting examples, a material with a low surface energy may exhibit low intermolecular forces. In some non-limiting examples, a material with low intermolecular forces may exhibit a low melting point. In some non-limiting examples, a material with low melting point may not be suitable for use in some applications that call for high temperature reliability, by way of non-limiting example, of up to at least one of about: 60° C., 85° C., or 100° C., due to changes in physical properties of the coating or material at operating temperatures approaching the melting point of the material. By way of non-limiting example, a material with a melting point of 120° C. may not be suitable for an application which counts on high temperature reliability up to 100° C. Accordingly, a material with a higher melting point may be suitable at least in some applications that call for high temperature reliability. Without wishing to be bound by any particular theory, it is now postulated that a material with a relatively high surface energy may be suitable at least in some applications that call for a high temperature reliability.

In some non-limiting examples, a material with low intermolecular forces may exhibit a low sublimation temperature. In some non-limiting examples, a material having a low sublimation temperature, may not be suitable for manufacturing processes that call for a high degree of control over a layer thickness of a deposited film of the material. By way of non-limiting example, for materials with sublimation temperature less than about: 140° C., 120° C., 110° C., 100° C., or 90° C., it may be difficult to control the deposition rate and layer thickness of a film deposited using vacuum thermal evaporation or other methods in the art. In some non-limiting examples, a material with a higher sublimation temperature may be suitable in at least some applications that call for a high degree of control over the film thickness. Without wishing to be bound by any particular theory, it may now be postulated that a material with a relatively high surface energy may be suitable at least in some applications that call for a high degree of control over the film thickness.

In general, a material with a low surface energy may exhibit a large or wide optical gap which, by way of non-limiting example, may correspond to the HOMO-LUMO gap of the material.

In some non-limiting examples, the first optical gap may be at least one of no more than about: 4.1 eV, 3.5 eV, or 3.4 eV. In some non-limiting examples, the second optical gap may exceed at least one of about: 3.4 eV, 3.5 eV, 4.1 eV, 5 eV, or 6.2 eV.

In some non-limiting examples, the patterning material 411 may not substantially exhibit photoluminescence at any wavelength corresponding to the visible spectrum. In some non-limiting examples, the patterning material 411 may not exhibit photoluminescence upon being subjected to EM radiation having a wavelength of at least one of at least about: 300 nm, 320 nm, 350 nm, or 365 nm. In some non-limiting examples, the patterning material 411 may exhibit insignificant and/or no detectable absorption when subjected to such EM radiation. In some non-limiting examples, the optical gap of the patterning material 411 may be wider than the photon energy of the EM radiation emitted by the source, such that the patterning material 411 does not undergo photoexcitation when subjected to such EM radiation. However, in some non-limiting examples, the patterning coating 130 containing such patterning material 411 may nevertheless exhibit photoluminescence upon being subjected to EM radiation due to the patterning coating 130 containing another material exhibiting photoluminescence. In some non-limiting examples, the presence of the patterning coating 130 may be detected and/or observed using routine characterization techniques such as fluorescence microscopy upon deposition of the patterning coating 130.

In some non-limiting examples, there may be an aim to provide a patterning coating 130 for causing formation of a discontinuous layer 170 of at least one particle structure 160, upon the patterning coating 130 being subjected to a vapor flux 532 of a deposited material 531. In at least some applications, the patterning coating 130 may exhibit a sufficiently low initial sticking probability such that a closed coating 150 of the deposited material 531 may be formed in the second portion 102, which may be substantially devoid of the patterning coating 130, while the discontinuous layer 170 of at least one particle structure 160 having at least one characteristic may be formed in the first portion 101 on the patterning coating 130. In some non-limiting examples, there may be an aim to form a discontinuous layer 170 of at least one particle structure 160 of a deposited material 531, which may be, by way of non-limiting example, of a metal or metal alloy, in the second portion 102, while depositing a closed coating 150 of the deposited material 531 having a thickness of, for example, at least one of no more than about: 100 nm, 50 nm, 25 nm, or 15 nm. In some non-limiting examples, a relative amount of the deposited material 531 deposited as a discontinuous layer 170 of at least one particle structure 160 in the first portion 101 may correspond to at least one of between about: 1-50%, 2-25%, 5-20%, or 7-10% of the amount of the deposited material 531 deposited as a closed coating 150 in the second portion 102, which by way of non-limiting example may correspond to a thickness of at least one of no more than about: 100 nm, 75 nm, 50 nm, 25 nm, or 15 nm.

Without wishing to be bound by any particular theory, it has now been found that a patterning coating 130 containing a material which, when deposited as a thin film, exhibits a relatively high surface energy, may, in some non-limiting examples, form a discontinuous layer 170 of at least one particle structure 160 of a deposited material 531 in the first portion 101, and a closed coating 150 of the deposited material 531 in the second portion 102, including without limitation, in cases where the thickness of the closed coating 150 is, by way of non-limiting example, at least one of no more than about: 100 nm, 75 nm, 50 nm, 25 nm, or 15 nm.

In some non-limiting examples, the patterning coating 130 may comprise a plurality of materials. In some non-limiting examples, the patterning coating 130 may comprise a first material and a second material.

In some non-limiting examples, at least one of the plurality of materials of the patterning coating 130 may serve as an NIC when deposited as a thin film.

In some non-limiting examples, at least one of the first material and the second material of the patterning coating 130 may be an oligomer.

In some non-limiting examples, at least one of the plurality of materials of the patterning coating 130 may serve as an NIC when deposited as a thin film, and another material thereof may form an NPC 720 when deposited as a thin film. In some non-limiting examples, the first material may form an NPC 720 when deposited as a thin film, and the second material may form an NIC when deposited as a thin film. In some non-limiting examples, the presence of the first material in the patterning coating 130 may result in an increased initial sticking probability thereof compared to cases in which the patterning coating 130 is formed of the second material and is substantially devoid of the first material.

In some non-limiting examples, at least one of the materials of the patterning coating 130 may be adapted to form a surface having a low surface energy when deposited as a thin film. In some non-limiting examples, the first material, when deposited as a thin film, may be adapted to form a surface having a lower surface energy than a surface provided by a thin film comprising the second material.

In some non-limiting examples, the patterning coating 130 may exhibit photoluminescence, including without limitation, by comprising a material which exhibits photoluminescence.

Deposited Layer

In some non-limiting examples, where the patterning coating 130 is restricted in its lateral extent to the first portion 102, in the second portion 102 of the lateral aspect of the device 100, a deposited layer 140 comprising a deposited material 531 may be disposed as a closed coating 150 on an exposed layer surface 11 of the underlying layer.

In some non-limiting examples, the deposited layer 140 may be deposited on the orientation layer 120, and/or the underlying layer.

In some non-limiting examples, an average layer thickness $d_3$ of the deposited layer 140 may be at least one of at least about: 2 nm, 5 nm, 8 nm, 10 nm, 15 nm, 20 nm, 30 nm, 40 nm, 50 nm, 60 nm, 70 nm, 80 nm, 90 nm, and 100 nm.

In some non-limiting examples, the deposited layer 140 may comprise a deposited material 531.

In some non-limiting examples, the deposited material 531 may be the same and/or comprise at least one common metal as the metallic material of the orientation layer 120. In some non-limiting examples, the deposited material 531 may be the same and/or comprise at least one common metal as the underlying layer.

In some non-limiting examples, the deposited material 531 may comprise an element selected from at least one of: K, Na, Li, Ba, Cs, Yb, Ag, Au, Cu, Al, Mg, Zn, Cd, Sn, and Y. In some non-limiting examples, the element may comprise at least one of: K, Na, Li, Ba, Cs, Yb, Ag, Au, Cu, Al, and Mg. In some non-limiting examples, the element may comprise at least one of: Cu, Ag, and Au. In some non-limiting examples, the element may be Cu. In some non-limiting examples, the element may be Al. In some non-limiting examples, the element may comprise at least one of: Mg, Zn, Cd, and Yb. In some non-limiting examples, the element may comprise at least one of: Mg, Ag, Al, Yb, and Li. In some non-limiting examples, the element may comprise at least one of: Mg, Ag, and Yb. In some non-limiting examples, the element may comprise at least one of: Mg, and Ag. In some non-limiting examples, the element may be Ag.

In some non-limiting examples, the deposited material 531 may be and/or comprise a pure metal. In some non-limiting examples, the deposited material 531 may be at least one of: pure Ag and substantially pure Ag. In some non-limiting examples, the substantially pure Ag may have a purity of at least one of at least about: 95%, 99%, 99.9%, 99.99%, 99.999%, and 99.9995%. In some non-limiting examples, the deposited material 531 may be at least one of: pure Mg and substantially pure Mg. In some non-limiting examples, the substantially pure Mg may have a purity of at least one of at least about: 95%, 99%, 99.9%, 99.99%, 99.999%, and 99.9995%.

In some non-limiting examples, the deposited material 531 may comprise an alloy. In some non-limiting examples, the alloy may be at least one of: an Ag-containing alloy, an Mg-containing alloy, and an AgMg-containing alloy. In some non-limiting examples, the AgMg-containing alloy may have an alloy composition that may range from about 1:10 (Ag:Mg) to about 10:1 by volume.

In some non-limiting examples, the deposited material 531 may comprise other metals in place of, and/or in combination with, Ag. In some non-limiting examples, the deposited material 531 may comprise an alloy of Ag with at least one other metal. In some non-limiting examples, the deposited material 531 may comprise an alloy of Ag with at least one of: Mg, and Yb. In some non-limiting examples, such alloy may be a binary alloy having a composition between about 5-95 vol. % Ag, with the remainder being the other metal. In some non-limiting examples, the deposited material 531 may comprise Ag and Mg. In some non-limiting examples, the deposited material 531 may comprise an Ag:Mg alloy having a composition between about 1:10-10:1 by volume. In some non-limiting examples, the deposited material 531 may comprise Ag and Yb. In some non-limiting examples, the deposited material 531 may comprise a Yb:Ag alloy having a composition between about 1:20-10:1 by volume. In some non-limiting examples, the deposited material 531 may comprise Mg and Yb. In some non-limiting examples, the deposited material 531 may comprise an Mg:Yb alloy. In some non-limiting examples, the deposited material 531 may comprise Ag, Mg, and Yb. In some non-limiting examples, the deposited layer 140 may comprise an Ag:Mg:Yb alloy.

In some non-limiting examples, the deposited layer 140 may comprise at least one additional element. In some non-limiting examples, such additional element may be a non-metallic element. In some non-limiting examples, the non-metallic element may be at least one of: O, S, N, and C. It will be appreciated by those having ordinary skill in the relevant art that, in some non-limiting examples, such additional element(s) may be incorporated into the deposited layer 140 as a contaminant, due to the presence of such additional element(s) in the source material, equipment used for deposition, and/or the vacuum chamber environment. In some non-limiting examples, the concentration of such additional element(s) may be limited to be below a threshold concentration. In some non-limiting examples, such additional element(s) may form a compound together with other element(s) of the deposited layer 140. In some non-limiting examples, a concentration of the non-metallic element in the deposited material 531 may be at least one of no more than about: 1%, 0.1%, 0.01%, 0.001%, 0.0001%, 0.00001%, 0.000001%, and 0.0000001%. In some non-limiting examples, the deposited layer 140 may have a composition in which a combined amount of 0 and C therein may be at least one of no more than about: 10%, 5%, 1%, 0.1%, 0.01%, 0.001%, 0.0001%, 0.00001%, 0.000001%, and 0.0000001%.

It has now been found, somewhat surprisingly, that reducing a concentration of certain non-metallic elements in the deposited layer 140, particularly in cases wherein the deposited layer 140 may be substantially comprised of metal(s), and/or metal alloy(s), may facilitate selective deposition of the deposited layer 140. Without wishing to be bound by any particular theory, it may be postulated that certain non-metallic elements, such as, by way of non-limiting example, at least one of O, and C, when present in the vapor flux 532 of the deposited layer 140, and/or in the deposition chamber, and/or environment, may be deposited onto the surface of the patterning coating 130 to act as nucleation sites for the metallic element(s) of the deposited layer 140. It may be postulated that reducing a concentration of such non-metallic elements that could act as nucleation sites may facilitate reducing an amount of deposited material 531 deposited on the exposed layer surface 11 of the patterning coating 130.

In some non-limiting examples, the deposited material 531 to be deposited over the exposed layer surface 11 of the device 100 may have a dielectric constant property that may, in some non-limiting examples, have been chosen to facilitate and/or increase the absorption, by the at least one particle structure 160, of EM radiation generally, or in some time-limiting examples, in a wavelength (sub-) range of the EM spectrum, including without limitation, the visible spectrum, and/or a sub-range and/or wavelength thereof, including without limitation, corresponding to a specific colour.

In some non-limiting examples, the deposited layer 140 may comprise a plurality of layers of the deposited material 531. In some non-limiting examples, the deposited material 531 of a first one of the plurality of layers may be different from the deposited material 531 of a second one of the plurality of layers. In some non-limiting examples, the deposited layer 140 may comprise a multilayer coating. In some non-limiting examples, such multilayer coating may be at least one of: Yb/Ag, Yb/Mg, Yb/Mg:Ag, Yb/Yb:Ag, Yb/Ag/Mg, and Yb/Mg/Ag.

In some non-limiting examples, the deposited material 531 may comprise a metal having a bond dissociation energy, of at least one of no more than about: 300 kJ/mol, 200 kJ/mol, 165 kJ/mol, 150 kJ/mol, 100 kJ/mol, 50 kJ/mol, and 20 kJ/mol.

In some non-limiting examples, the deposited material 531 may comprise a metal having an electronegativity that is at least one of no more than about: 1.4, 1.3, and 1.2.

In some non-limiting examples, a sheet resistance of the deposited layer 140 may generally correspond to a sheet resistance of the deposited layer 140, measured or determined in isolation from other components, layers, and/or parts of the device 100. In some non-limiting examples, the deposited layer 140 may be formed as a thin film. Accordingly, in some non-limiting examples, the characteristic sheet resistance for the deposited layer 140 may be determined, and/or calculated based on the composition, thickness, and/or morphology of such thin film. In some non-limiting examples, the sheet resistance may be at least one of no more than about: 10Ω/□, 5Ω/□, 1Ω/□, 0.5Ω/□, 0.2Ω/□, and 0.1Ω/□.

In some non-limiting examples, the deposited layer 140 may be disposed in a pattern that may be defined by at least one region therein that is substantially devoid of a closed coating 150 of the deposited layer 140. In some non-limiting examples, the at least one region may separate the deposited layer 140 into a plurality of discrete fragments thereof. In some non-limiting examples, each discrete fragment of the deposited layer 140 may be a distinct second portion 102. In some non-limiting examples, the plurality of discrete fragments of the deposited layer 140 may be physically spaced apart from one another in the lateral aspect thereof. In some non-limiting examples, at least two of such plurality of discrete fragments of the deposited layer 140 may be electrically coupled. In some non-limiting examples, at least two of such plurality of discrete fragments of the deposited layer 140 may be each electrically coupled with a common conductive layer or coating, including without limitation, the underlying surface, to allow the flow of electrical current between them. In some non-limiting examples, at least two of such plurality of discrete fragments of the deposited layer 140 may be electrically insulated from one another.

Selective Deposition Using Patterning Coatings

Figure 4:
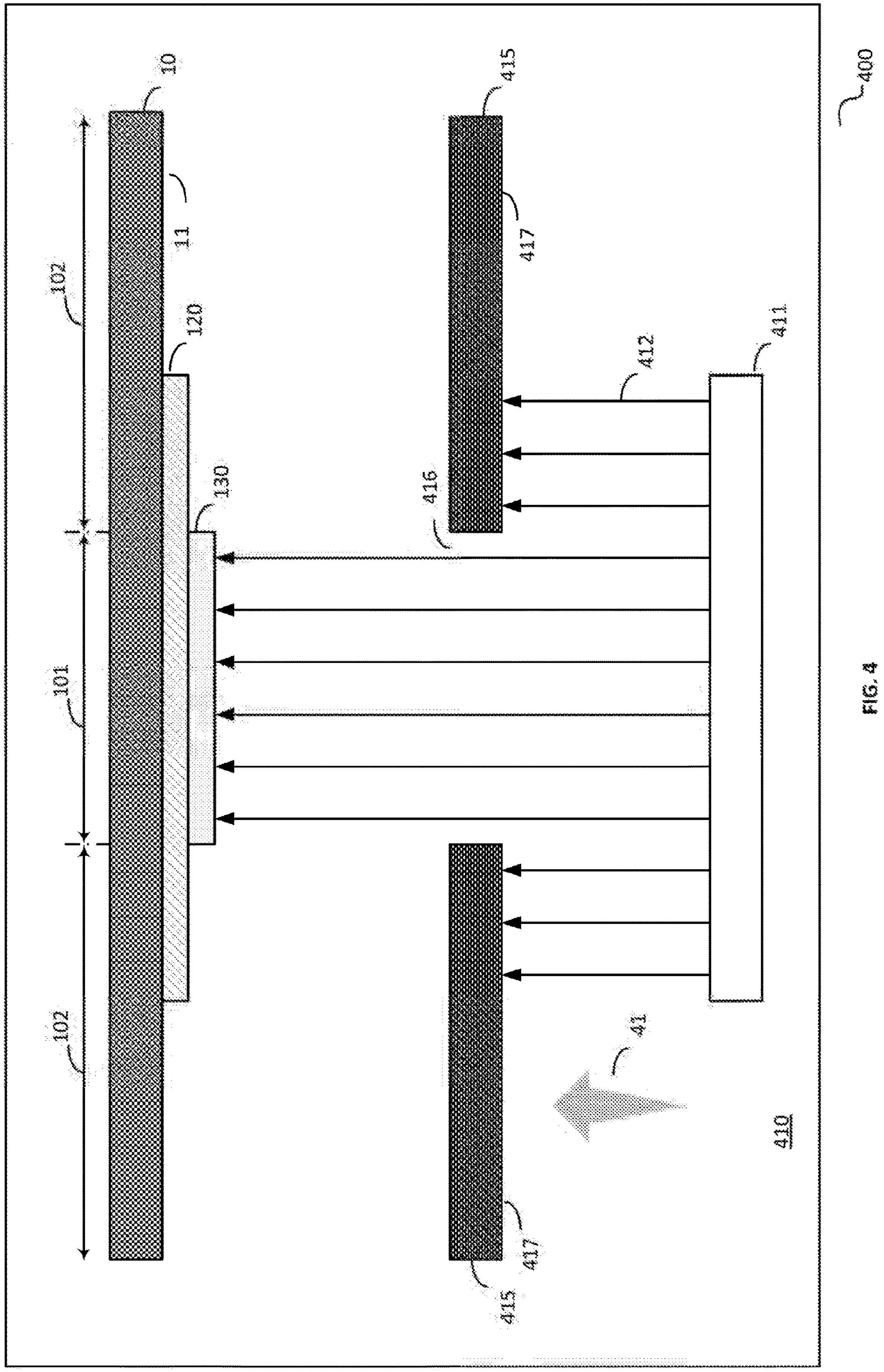
FIG. 4 is a schematic diagram showing an example process for depositing a patterning coating in a pattern on an exposed layer surface of an underlying layer in an example version of the device of FIG. 1, according to an example in the present disclosure.

FIG. 4 is an example schematic diagram illustrating a non-limiting example of an evaporative deposition process, shown generally at 400, in a chamber 410, for selectively depositing a patterning coating 130 onto a first portion 101 of an exposed layer surface 11 of the orientation layer 120.

In the process 400, a quantity of a patterning material 411 is heated under vacuum, to evaporate, and/or sublime the patterning material 411. In some non-limiting examples, the patterning material 411 may comprise entirely, and/or substantially, a material used to form the patterning coating 130. In some non-limiting examples, such material may comprise an organic material.

An vapor flux 412 of the patterning material 411 may flow through the chamber 410, including in a direction indicated by arrow 41, toward the exposed layer surface 11. When the vapor flux 412 is incident on the exposed layer surface 11 of the orientation layer 120, the patterning coating 130 may be formed thereon.

In some non-limiting examples, as shown in the figure for the process 400, the patterning coating 130 may be selectively deposited only onto a portion, in the example illustrated, the first portion 101, of the exposed layer surface 11 of the orientation layer 120, by the interposition, between the vapor flux 412 and the exposed layer surface 11 of the orientation layer, of a shadow mask 415, which in some non-limiting examples, may be an FMM. In some non-limiting examples, such a shadow mask 415 may, in some non-limiting examples, be used to form relatively small features, with a feature size on the order of tens of microns or smaller.

The shadow mask 415 may have at least one aperture 416 extending therethrough such that a part of the vapor flux 412 passes through the aperture 416 and may be incident on the exposed layer surface 11 to form the patterning coating 130.

Where the vapor flux 412 does not pass through the aperture 416 but is incident on the surface 417 of the shadow mask 415, it is precluded from being disposed on the exposed layer surface 11 to form the patterning coating 130. In some non-limiting examples, the shadow mask 415 may be configured such that the vapor flux 412 that passes through the aperture 416 may be incident on the first portion 101 but not the second portion 102. The second portion 102 of the exposed layer surface 11 (of the orientation layer 120 and/or of the underlying layer thereunder) may thus be substantially devoid of the patterning coating 130. In some non-limiting examples (not shown), the patterning material 411 that is incident on the shadow mask 415 may be deposited on the surface 417 thereof.

Accordingly, a patterned surface may be produced upon completion of the deposition of the patterning coating 130.

Figure 5:
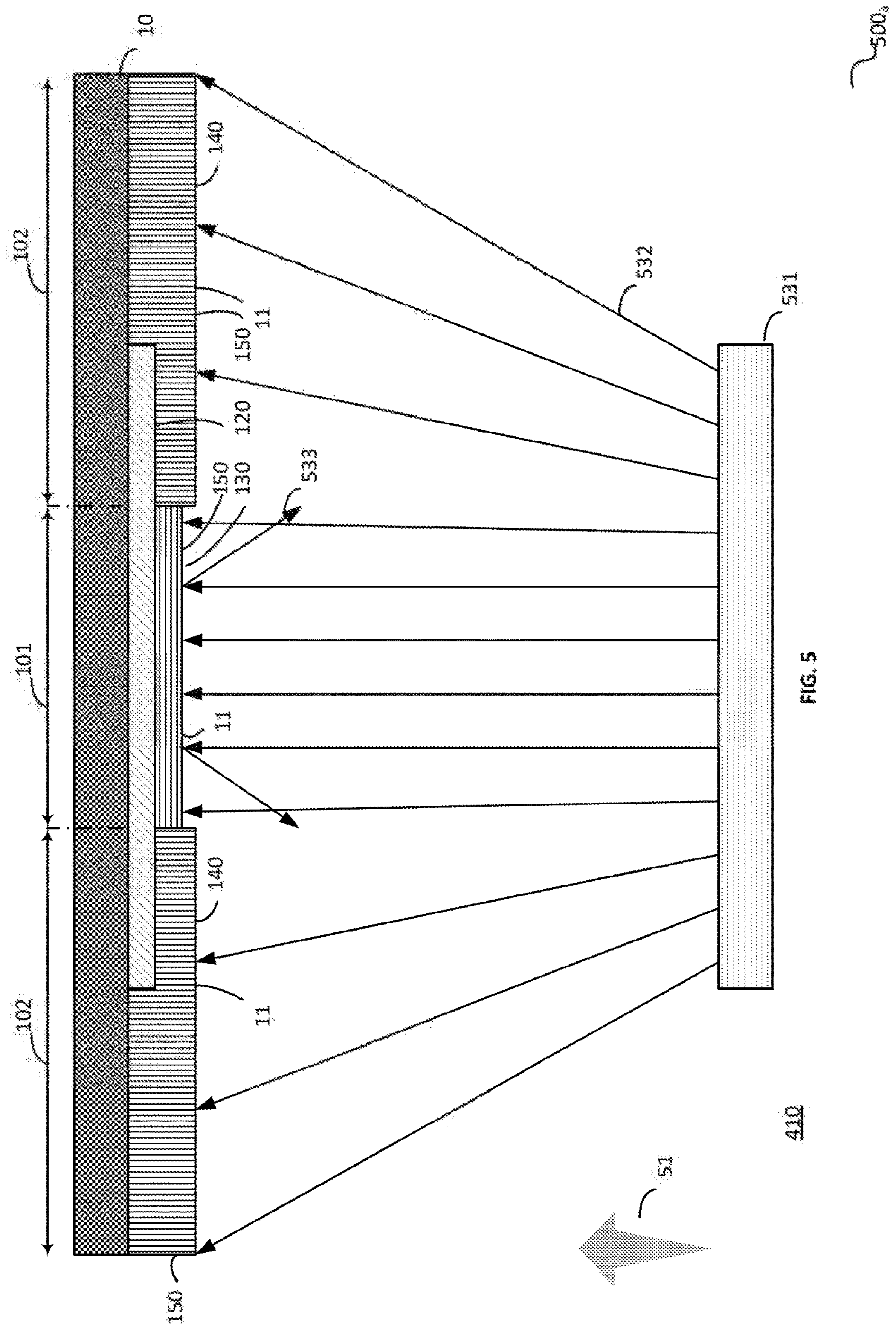
FIG. 5 is a schematic diagram showing an example process for depositing a deposited material in the second portion on an exposed layer surface that comprises the deposited pattern of the patterning coating of FIG. 1 where the patterning coating is a nucleation-inhibiting coating (NIC)

FIG. 5 is an example schematic diagram illustrating a non-limiting example of a result of an evaporative process, shown generally at 500*a*, in a chamber 410, for selectively depositing a closed coating 150 of a deposited layer 140 onto the second portion 102 of an exposed layer surface 11 of the underlying layer that is substantially devoid of the patterning coating 130 that was selectively deposited onto the first portion 101, including without limitation, by the evaporative process 400 of FIG. 4.

In some non-limiting examples, the deposited layer 140 may be comprised of a deposited material 531, in some non-limiting examples, comprising at least one metal. It will be appreciated by those having ordinary skill in the relevant art that typically, a vaporization temperature of an organic material is low relative to the vaporization temperature of metals, such as may be employed as a deposited material 531.

Thus, in some non-limiting examples, there may be fewer constraints in employing a shadow mask 415 to selectively deposit a patterning coating 130 in a pattern, relative to directly patterning the deposited layer 140 using such shadow mask 415.

Once the patterning coating 130 has been deposited on the first portion 101 of the exposed layer surface 11 of the orientation layer 120, a closed coating 150 of the deposited material 531 may be deposited, on the second portion 102 of the exposed layer surface 11 (whether of the orientation layer 120 or the underlying layer) that is substantially devoid of the patterning coating 130, as the deposited layer 140.

In the process 500*a*, a quantity of the deposited material 531 may be heated under vacuum, to evaporate, and/or sublime the deposited material 531. In some non-limiting examples, the deposited material 531 may comprise entirely, and/or substantially, a material used to form the deposited layer 140.

An vapor flux 532 of the deposited material 531 may be directed inside the chamber 410, including in a direction indicated by arrow 51, toward the exposed layer surface 11 of the first portion 101 and of the second portion 102. When the vapor flux 532 is incident on the second portion 102 of the exposed layer surface 11, a closed coating 150 of the deposited material 531 may be formed thereon as the deposited layer 140.

In some non-limiting examples, deposition of the deposited material 531 may be performed using an open mask and/or mask-free deposition process.

It will be appreciated by those having ordinary skill in the relevant art that, contrary to that of a shadow mask 415, the feature size of an open mask may be generally comparable to the size of a device 100 being manufactured.

It will be appreciated by those having ordinary skill in the relevant art that, in some non-limiting examples, the use of an open mask may be omitted. In some non-limiting examples, an open mask deposition process described herein may alternatively be conducted without the use of an open mask, such that an entire target exposed layer surface 11 may be exposed.

Indeed, as shown in FIG. 5, the vapor flux 532 may be incident both on an exposed layer surface 11 of the patterning coating 130 across the first portion 101 as well as the exposed layer surface 11 (whether of the orientation layer 120 or of the underlying layer) across the second portion 102 that is substantially devoid of the patterning coating 130.

Since the exposed layer surface 11 of the patterning coating 130 in the first portion 101 may exhibit a relatively low initial sticking probability against the deposition of the deposited material 531 relative to the exposed layer surface 11 (whether of the orientation layer 120 or of the underlying layer) in the second portion 102, the deposited layer 140 may be selectively deposited substantially only on the exposed layer surface 11, (whether of the orientation layer 120 or of the underlying layer) in the second portion 102, that is substantially devoid of the patterning coating 130. By contrast, the vapor flux 532 incident on the exposed layer surface 11 of the patterning coating 130 across the first portion 101 may tend to not be deposited (as shown 533), and the exposed layer surface 11 of the patterning coating 130 across the first portion 101 may be substantially devoid of a closed coating 150 of the deposited layer 140.

In some non-limiting examples, an initial deposition rate, of the vapor flux 532 on the exposed layer surface 11 of the underlying layer in the second portion 102, may exceed at least one of about: 200 times, 550 times, 900 times, 1,000 times, 1,500 times, 1,900 times, or 2,000 times an initial deposition rate of the vapor flux 532 on the exposed layer surface 11 of the patterning coating 130 in the first portion 101.

Thus, the combination of the selective deposition of a patterning coating 130 in FIG. 4 using a shadow mask 415 and the open mask and/or mask-free deposition of the deposited material 531 may result in a version $\mathbf{500}_a$ of the device 100 shown in FIG. 5.

After selective deposition of the patterning coating 130 across the first portion 101, a closed coating 150 of the deposited material 531 may be deposited over the device 100 as the deposited layer 140, in some non-limiting examples, using an open mask and/or a mask-free deposition process, but may remain substantially only within the second portion 102, which is substantially devoid of the patterning coating 130.

The patterning coating 130 may provide, within the first portion 101, an exposed layer surface 11 with a relatively low initial sticking probability, against the deposition of the deposited material 531, and that is substantially less than the initial sticking probability, against the deposition of the deposited material 531, of the exposed layer surface 11 (whether of the orientation layer 120 or of the underlying layer) of the device 100 within the second portion 102.

Thus, the first portion 101 may be substantially devoid of a closed coating 150 of the deposited material 531.

While the present disclosure contemplates the patterned deposition of the patterning coating 130 by an evaporative deposition process, involving a shadow mask 415, those having ordinary skill in the relevant art will appreciate that, in some non-limiting examples, this may be achieved by any suitable deposition process, including without limitation, a micro-contact printing process.

While the present disclosure contemplates the patterning coating 130 being an NIC, those having ordinary skill in the relevant art will appreciate that, in some non-limiting examples, the patterning coating 130 may be an NPC 720. In such examples, the portion (such as, without limitation, the first portion 101) in which the NPC 720 has been deposited may, in some non-limiting examples, have a closed coating 150 of the deposited material 531, while the other portion (such as, without limitation, the second portion 102) may be substantially devoid of a closed coating 150 of the deposited material 531.

In some non-limiting examples, an average layer thickness of the patterning coating 130 and of the deposited layer 140 deposited thereafter may be varied according to a variety of parameters, including without limitation, a given application and given performance characteristics. In some non-limiting examples, the average layer thickness of the patterning coating 130 may be comparable to, and/or substantially no more than an average layer thickness of the deposited layer 140 deposited thereafter. Use of a relatively thin patterning coating 130 to achieve selective patterning of a deposited layer 140 may be suitable to provide flexible devices 100. In some non-limiting examples, a relatively thin patterning coating 130 may provide a relatively planar surface on which a barrier coating or other thin film encapsulation (TFE) layer 2050, may be deposited. In some non-limiting examples, providing such a relatively planar surface for application of such barrier coating 2050 may increase adhesion thereof to such surface.

Edge Effects

Patterning Coating Transition Region

Figure 6A:
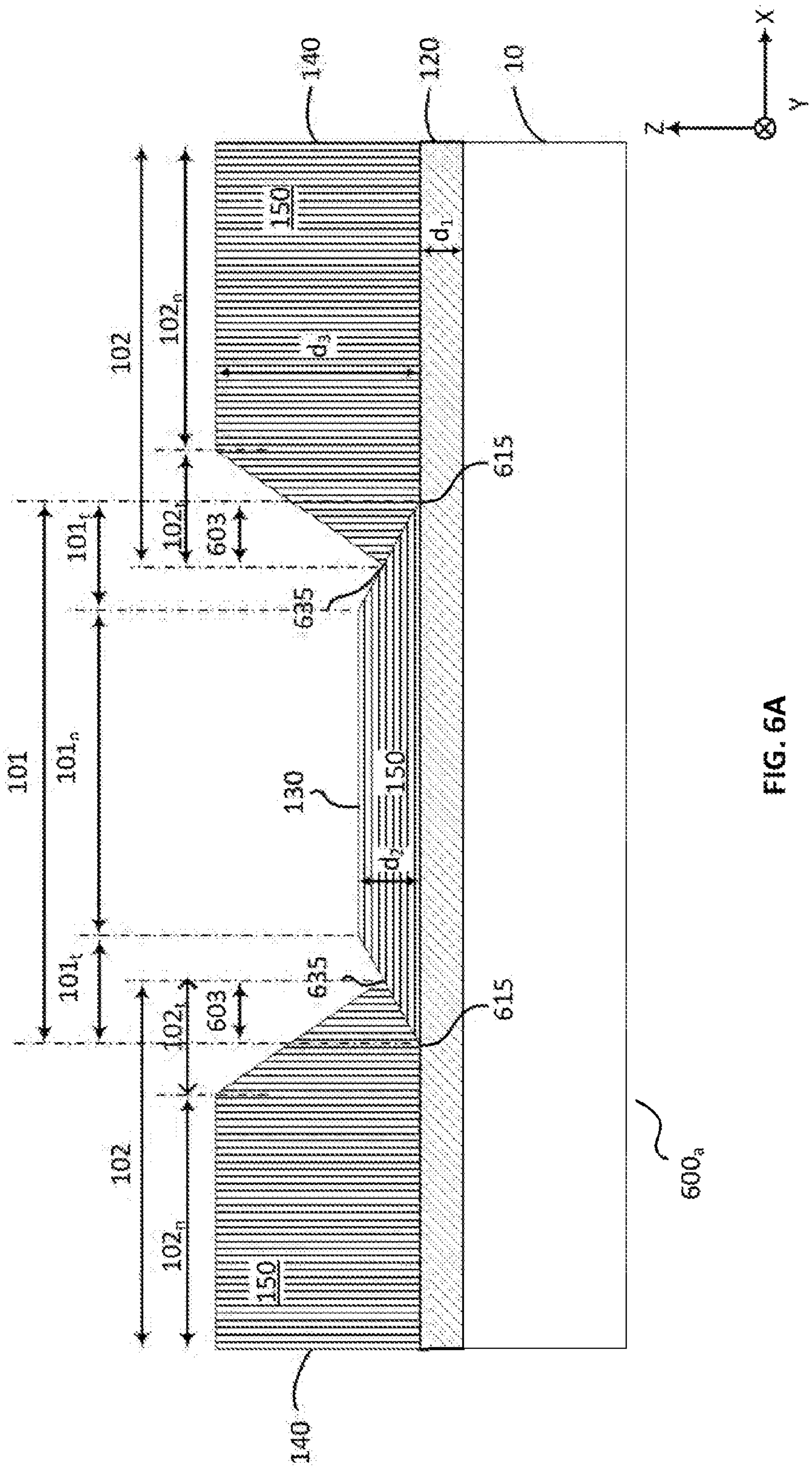
FIG. 6A is a schematic diagram illustrating an example version of the device of FIG. 1 in a cross-sectional view.
Figure 6B:
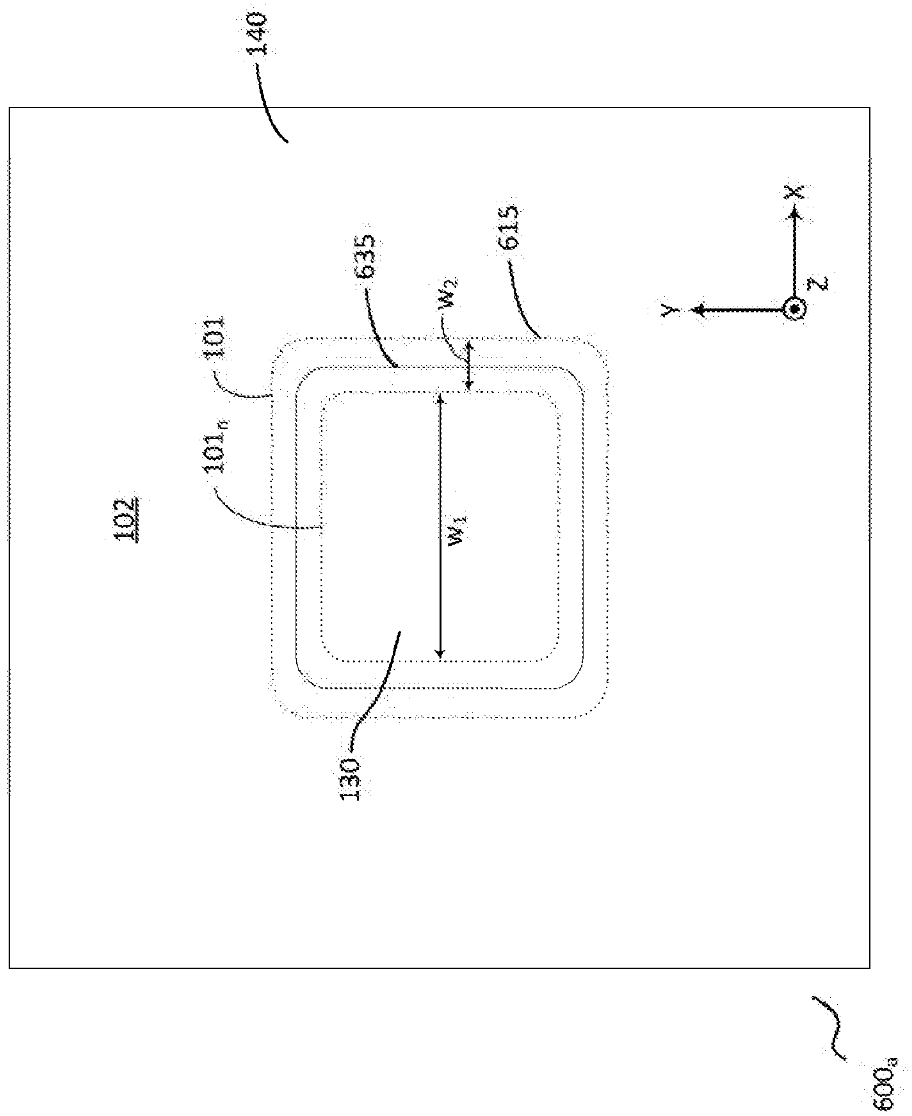
FIG. 6B is a schematic diagram illustrating the device of FIG. 6A in a complementary plan view.
Figure 6C:
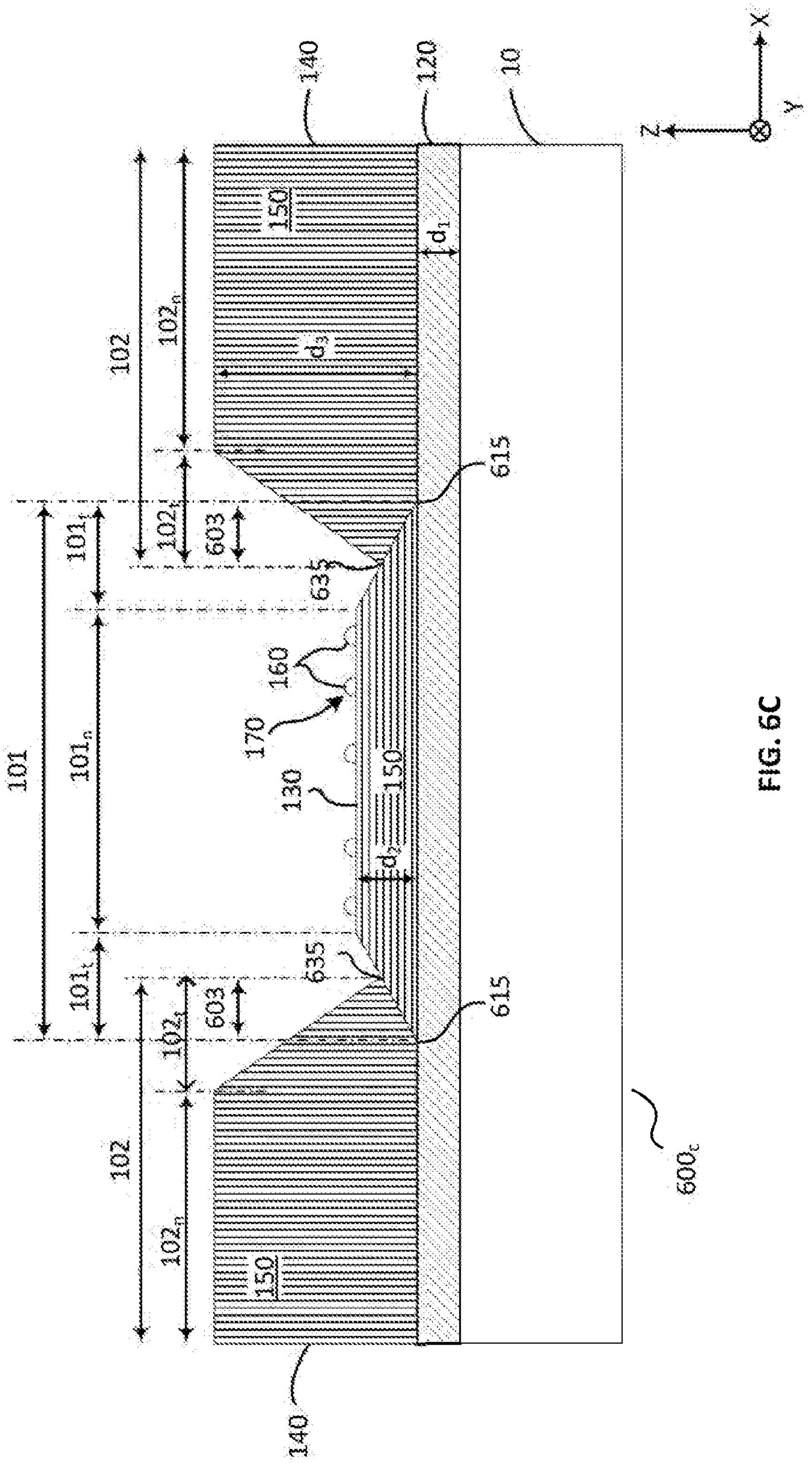
FIG. 6C is a schematic diagram illustrating an example version of the device of FIG. 1 in a cross-sectional view.
Figure 6D:
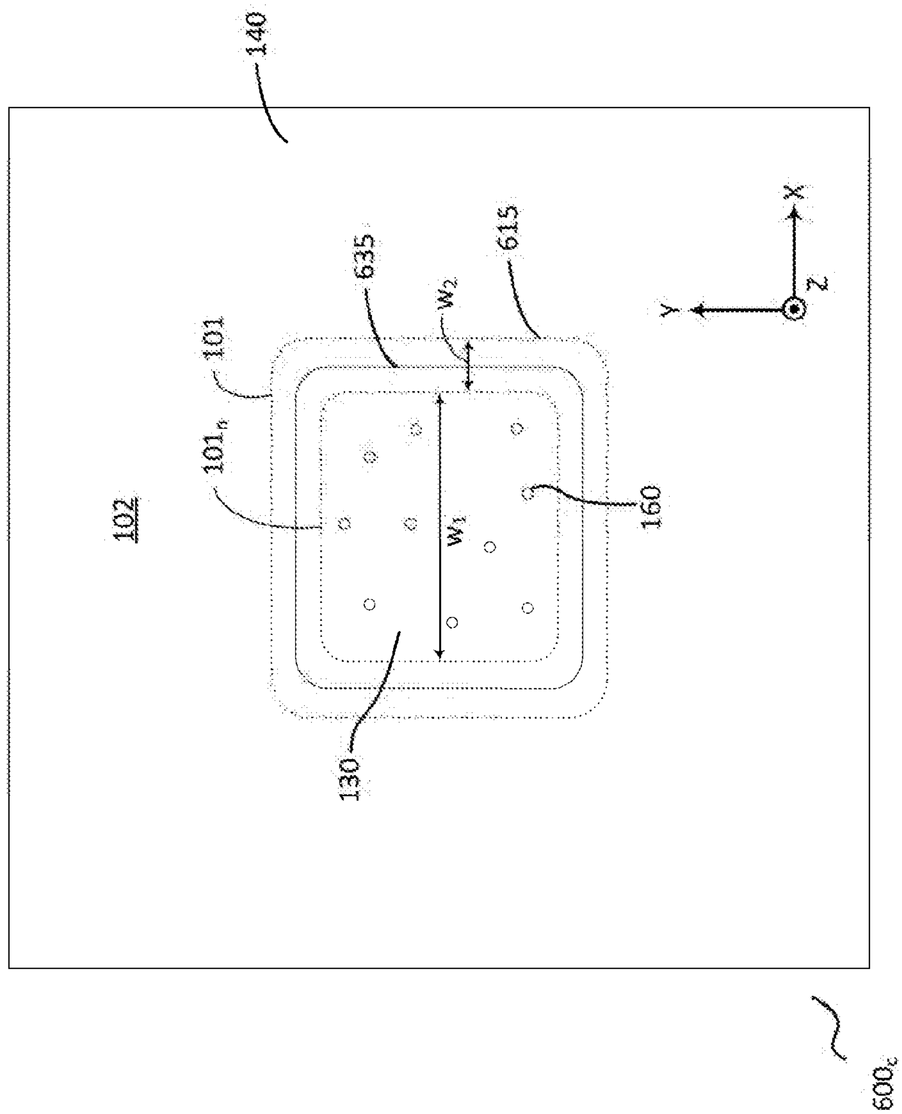
FIG. 6D is a schematic diagram illustrating the device of FIG. 6C in a complementary plan view.

Turning to FIG. 6A, there may be shown a version $\mathbf{600}_a$ of the device 100 of FIG. 1 that may show in exaggerated form, an interface between the patterning coating 130 in the first portion 101 and the deposited layer 140 in the second portion 102. FIG. 6B may show the device $\mathbf{600}_a$ in plan.

As may be better seen in FIG. 6B, in some non-limiting examples, the patterning coating 130 in the first portion 101 may be surrounded on all sides by the deposited layer 140 in the second portion 102, such that the first portion 101 may have a boundary that is defined by the further extent or edge 615 of the patterning coating 130 in the lateral aspect along each lateral axis. In some non-limiting examples, the patterning coating edge 615 in the lateral aspect may be defined by a perimeter of the first portion 101 in such aspect.

In some non-limiting examples, the first portion 101 may comprise at least one patterning coating transition region $\mathbf{101}_t$, in the lateral aspect, in which a thickness of the patterning coating 130 may transition from a maximum thickness to a reduced thickness. The extent of the first portion 101 that does not exhibit such a transition may be identified as a patterning coating non-transition part $\mathbf{101}_n$ of the first portion 101. In some non-limiting examples, the patterning coating 130 may form a substantially closed coating 150 in the patterning coating non-transition part $\mathbf{101}_n$ of the first portion 101.

In some non-limiting examples, the patterning coating transition region $\mathbf{101}_t$ may extend, in the lateral aspect, between the patterning coating non-transition part $\mathbf{101}_n$ of the first portion 101 and the patterning coating edge 615.

In some non-limiting examples, in plan, the patterning coating transition region $\mathbf{101}_t$ may surround, and/or extend along a perimeter of, the patterning coating non-transition part $\mathbf{101}_n$ of the first portion 101.

In some non-limiting examples, along at least one lateral axis, the patterning coating non-transition part $\mathbf{101}_n$ may occupy the entirety of the first portion 101, such that there is no patterning coating transition region $101_t$ between it and the second portion 102.

As illustrated in FIG. 6A, in some non-limiting examples, the patterning coating 130 may have an average film thickness $d_2$ in the patterning coating non-transition part $101_n$ of the first portion 101 that may be in a range of at least one of between about: 1-100 nm, 2-50 nm, 3-30 nm, 4-20 nm, 5-15 nm, 5-10 nm, or 1-10 nm. In some non-limiting examples, the average film thickness $d_2$ of the patterning coating 130 in the patterning coating non-transition part $101_n$ of the first portion 101 may be substantially the same, or constant, thereacross. In some non-limiting examples, an average layer thickness $d_2$ of the patterning coating 130 may remain, within the patterning coating non-transition part $101_n$, within at least one of about: 95%, or 90% of the average film thickness $d_2$ of the patterning coating 130.

In some non-limiting examples, the average film thickness $d_2$ may be between about 1-100 nm. In some non-limiting examples, the average film thickness $d_2$ may be at least one of no more than about: 80 nm, 60 nm, 50 nm, 40 nm, 30 nm, 20 nm, 15 nm, or 10 nm. In some non-limiting examples, the average film thickness $d_2$ of the patterning coating 130 may exceed at least one of about: 3 nm, 5 nm, or 8 nm.

In some non-limiting examples, the average film thickness $d_2$ of the patterning coating 130 in the patterning coating non-transition part $101_n$ of the first portion 101 may be no more than about 10 nm. Without wishing to be bound by any particular theory, it has been found, somewhat surprisingly, that a non-zero average film thickness $d_2$ of the patterning coating 130 that is no more than about 10 nm may, at least in some non-limiting examples, provide certain advantages for achieving, by way of non-limiting example, enhanced patterning contrast of the deposited layer 140, relative to a patterning coating 130 having an average film thickness $d_2$ in the patterning coating non-transition part $101_n$ of the first portion 101 in excess of 10 nm.

In some non-limiting examples, the patterning coating 130 may have a patterning coating thickness that decreases from a maximum to a minimum within the patterning coating transition region $101_t$. In some non-limiting examples, the maximum may be at, and/or proximate to, a boundary between the patterning coating transition region $101_t$ and the patterning coating non-transition part $101_n$ of the first portion 101. In some non-limiting examples, the minimum may be at, and/or proximate to, the patterning coating edge 615. In some non-limiting examples, the maximum may be the average film thickness $d_2$ in the patterning coating non-transition part $101_n$ of the first portion 101. In some non-limiting examples, the maximum may be at least one of no more than about: 95% or 90% of the average film thickness $d_2$ in the patterning coating non-transition part $101_n$ of the first portion 101. In some non-limiting examples, the minimum may be in a range of between about 0-0.1 nm.

In some non-limiting examples, a profile of the patterning coating thickness in the patterning coating transition region $101_t$ may be sloped, and/or follow a gradient. In some non-limiting examples, such profile may be tapered. In some non-limiting examples, the taper may follow a linear, non-linear, parabolic, and/or exponential decaying profile.

In some non-limiting examples, the patterning coating 130 may completely cover the underlying surface in the patterning coating transition region $101_t$. In some non-limiting examples, at least a part of the underlying layer may be left uncovered by the patterning coating 130 in the patterning coating transition region $101_t$. In some non-limiting examples, the patterning coating 130 may comprise a substantially closed coating 150 in at least a part of the patterning coating transition region $101_t$ and/or at least a part of the patterning coating non-transition part $101_n$.

In some non-limiting examples, the patterning coating 130 may comprise a discontinuous layer 170 in at least a part of the patterning coating transition region $101_t$ and/or at least a part of the patterning coating non-transition part $101_n$.

In some non-limiting examples, at least a part of the patterning coating 130 in the first portion 101 may be substantially devoid of a closed coating 150 of the deposited layer 140. In some non-limiting examples, at least a part of the exposed layer surface 11 of the first portion 101 may be substantially devoid of a closed coating 150 of the deposited layer 140 or of the deposited material 531.

In some non-limiting examples, along at least one lateral axis, including without limitation, the X-axis, the patterning coating non-transition part $101_n$ may have a width of $w_1$, and the patterning coating transition region $101_t$ may have a width of $w_2$. In some non-limiting examples, the patterning coating non-transition part $101_n$ may have a cross-sectional area that, in some non-limiting examples, may be approximated by multiplying the average film thickness $d_2$ by the width $w_1$. In some non-limiting examples, the patterning coating transition region $101_t$ may have a cross-sectional area that, in some non-limiting examples, may be approximated by multiplying an average film thickness across the patterning coating transition region $101_t$ by the width $w_1$.

In some non-limiting examples, $w_1$ may exceed $w_2$. In some non-limiting examples, a quotient of $w_1/w_2$ may be at least one of at least about: 5, 10, 20, 50, 100, 500, 1,000, 1,500, 5,000, 10,000, 50,000, or 100,000.

In some non-limiting examples, at least one of $w_1$ and $w_2$ may exceed the average film thickness $d_1$ of the orientation layer 120.

In some non-limiting examples, at least one of $w_1$ and $w_2$ may exceed $d_2$. In some non-limiting examples, both $w_1$ and $w_2$ may exceed $d_2$. In some non-limiting examples, $w_1$ and $w_2$ both may exceed $d_1$, and $d_1$ may exceed $d_2$.

Deposited Layer Transition Region

As may be better seen in FIG. 6B, in some non-limiting examples, the patterning coating 130 in the first portion 101 may be surrounded by the deposited layer 140 in the second portion 102 such that the second portion 102 has a boundary that is defined by the further extent or edge 635 of the deposited layer 140 in the lateral aspect along each lateral axis. In some non-limiting examples, the deposited layer edge 635 in the lateral aspect may be defined by a perimeter of the second portion 102 in such aspect.

In some non-limiting examples, the second portion 102 may comprise at least one deposited layer transition region $102_t$, in the lateral aspect, in which a thickness of the deposited layer 140 may transition from a maximum thickness to a reduced thickness. The extent of the second portion 102 that does not exhibit such a transition may be identified as a deposited layer non-transition part $102_n$ of the second portion 102. In some non-limiting examples, the deposited layer 140 may form a substantially closed coating 150 in the deposited layer non-transition part $102_n$ of the second portion 102.

In some non-limiting examples, in plan, the deposited layer transition region $102_t$ may extend, in the lateral aspect, between the deposited layer non-transition part $102_n$ of the second portion 102 and the deposited layer edge 635.

In some non-limiting examples, in plan, the deposited layer transition region $102_t$ may surround, and/or extend along a perimeter of, the deposited layer non-transition part $102_n$ of the second portion 102.

In some non-limiting examples, along at least one lateral axis, the deposited layer non-transition part $102_n$ of the second portion 102 may occupy the entirety of the second portion 102, such that there is no deposited layer transition region $102_t$ between it and the first portion 101.

As illustrated in FIG. 6A, in some non-limiting examples, the deposited layer 140 may have an average film thickness $d_3$ in the deposited layer non-transition part $102_n$ of the second portion 102 that may be in a range of at least one of between about: 1-500 nm, 5-200 nm, 5-40 nm, 10-30 nm, or 10-100 nm. In some non-limiting examples, $d_3$ may exceed at least one of about: 10 nm, 50 nm, or 100 nm. In some non-limiting examples, the average film thickness $d_3$ of the deposited layer 140 in the deposited layer non-transition part $102_t$ of the second portion 102 may be substantially the same, or constant, thereacross.

In some non-limiting examples, $d_3$ may exceed the average film thickness $d_1$ of the orientation layer 120.

In some non-limiting examples, a quotient $d_3/d_1$ may be at least one of at least about: 1.5, 2, 5, 10, 20, 50, or 100. In some non-limiting examples, the quotient $d_3/d_1$ may be in a range of at least one of between about: 0.1-10, or 0.2-40.

In some non-limiting examples, $d_3$ may exceed an average film thickness $d_2$ of the patterning coating 130.

In some non-limiting examples, a quotient $d_3/d_2$ may be at least one of at least about: 1.5, 2, 5, 10, 20, 50, or 100. In some non-limiting examples, the quotient $d_3/d_2$ may be in a range of at least one of between about: 0.2-10, or 0.5-40.

In some non-limiting examples, $d_3$ may exceed $d_2$ and $d_2$ may exceed $d_1$. In some other non-limiting examples, $d_3$ may exceed $d_1$ and $d_1$ may exceed $d_2$.

In some non-limiting examples, a quotient $d_2/d_1$ may be between at least one of about: 0.2-3, or 0.1-5.

In some non-limiting examples, along at least one lateral axis, including without limitation, the X-axis, the deposited layer non-transition part $102_n$ of the second portion 102 may have a width of $w_3$. In some non-limiting examples, the deposited layer non-transition part $102_n$ of the second portion 102 may have a cross-sectional area that, in some non-limiting examples, may be approximated by multiplying the average film thickness $d_3$ by the width $w_3$.

In some non-limiting examples, $w_3$ may exceed the width $w_1$ of the patterning coating non-transition part $101_n$. In some non-limiting examples, $w_1$ may exceed $w_3$.

In some non-limiting examples, a quotient $w_1/w_3$ may be in a range of at least one of between about: 0.1-10, 0.2-5, 0.3-3, or 0.4-2. In some non-limiting examples, a quotient $w_3/w_1$ may be at least one of at least about: 1, 2, 3, or 4.

In some non-limiting examples, $w_3$ may exceed the average film thickness $d_3$ of the deposited layer 140.

In some non-limiting examples, a quotient $w_3/d_3$ may be at least one of at least about: 10, 50, 100, or 500. In some non-limiting examples, the quotient $w_3/d_3$ may be no more than about 100,000.

In some non-limiting examples, the deposited layer 140 may have a thickness that decreases from a maximum to a minimum within the deposited layer transition region $102_t$. In some non-limiting examples, the maximum may be at, and/or proximate to, the boundary between the deposited layer transition region $102_t$ and the deposited layer non-transition part $102_n$ of the second portion 102. In some non-limiting examples, the minimum may be at, and/or proximate to, the deposited layer edge 635. In some non-limiting examples, the maximum may be the average film thickness $d_3$ in the deposited layer non-transition part $102_n$ of the second portion 102. In some non-limiting examples, the minimum may be in a range of between about 0-0.1 nm. In some non-limiting examples, the minimum may be the average film thickness $d_3$ in the deposited layer non-transition part $102_n$ of the second portion 102.

In some non-limiting examples, a profile of the thickness in the deposited layer transition region $102_t$ may be sloped, and/or follow a gradient. In some non-limiting examples, such profile may be tapered. In some non-limiting examples, the taper may follow a linear, non-linear, parabolic, and/or exponential decaying profile.

Figure 6E:
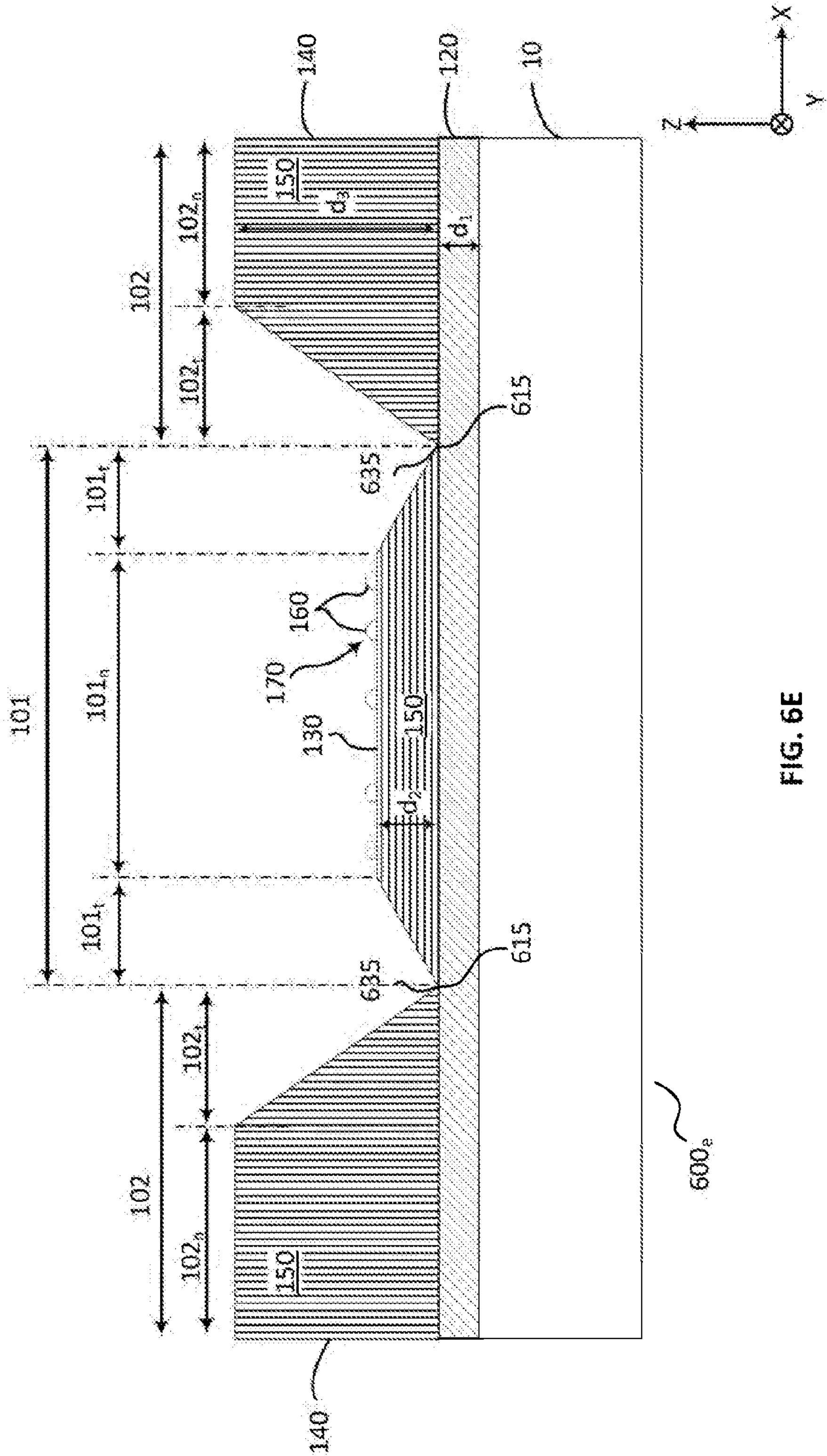
FIG. 6E is a schematic diagram illustrating an example of the device of FIG. 1 in a cross-sectional view.

In some non-limiting examples, as shown by way of non-limiting example in the example version $600_e$ in FIG. 6E of the device 100, the deposited layer 140 may completely cover the underlying surface in the deposited layer transition region $102_t$. In some non-limiting examples, the deposited layer 140 may comprise a substantially closed coating 150 in at least a part of the deposited layer transition region $102_t$. In some non-limiting examples, at least a part of the underlying surface may be uncovered by the deposited layer 140 in the deposited layer transition region $102_t$.

In some non-limiting examples, the deposited layer 140 may comprise a discontinuous layer 170 in at least a part of the deposited layer transition region $102_t$.

Those having ordinary skill in the relevant art will appreciate that, while not explicitly illustrated, the patterning material 411 may also be present to some extent at an interface between the deposited layer 140 and an underlying layer. Such material may be deposited as a result of a shadowing effect, in which a deposited pattern is not identical to a pattern of a mask and may, in some non-limiting examples, result in some evaporated patterning material 411 being deposited on a masked part of a target exposed layer surface 11. By way of non-limiting example, such material may form as particle structures 160 and/or as a thin film having a thickness that may be substantially no more than an average thickness of the patterning coating 130.

Overlap

In some non-limiting examples, the deposited layer edge 635 may be spaced apart, in the lateral aspect from the patterning coating transition region $101_t$ of the first portion 101, such that there is no overlap between the first portion 101 and the second portion 102 in the lateral aspect.

In some non-limiting examples, at least a part of the first portion 101 and at least a part of the second portion 102 may overlap in the lateral aspect. Such overlap may be identified by an overlap portion 603, such as may be shown by way of non-limiting example in FIG. 6A, in which at least a part of the second portion 102 overlaps at least a part of the first portion 101.

Figure 6F:
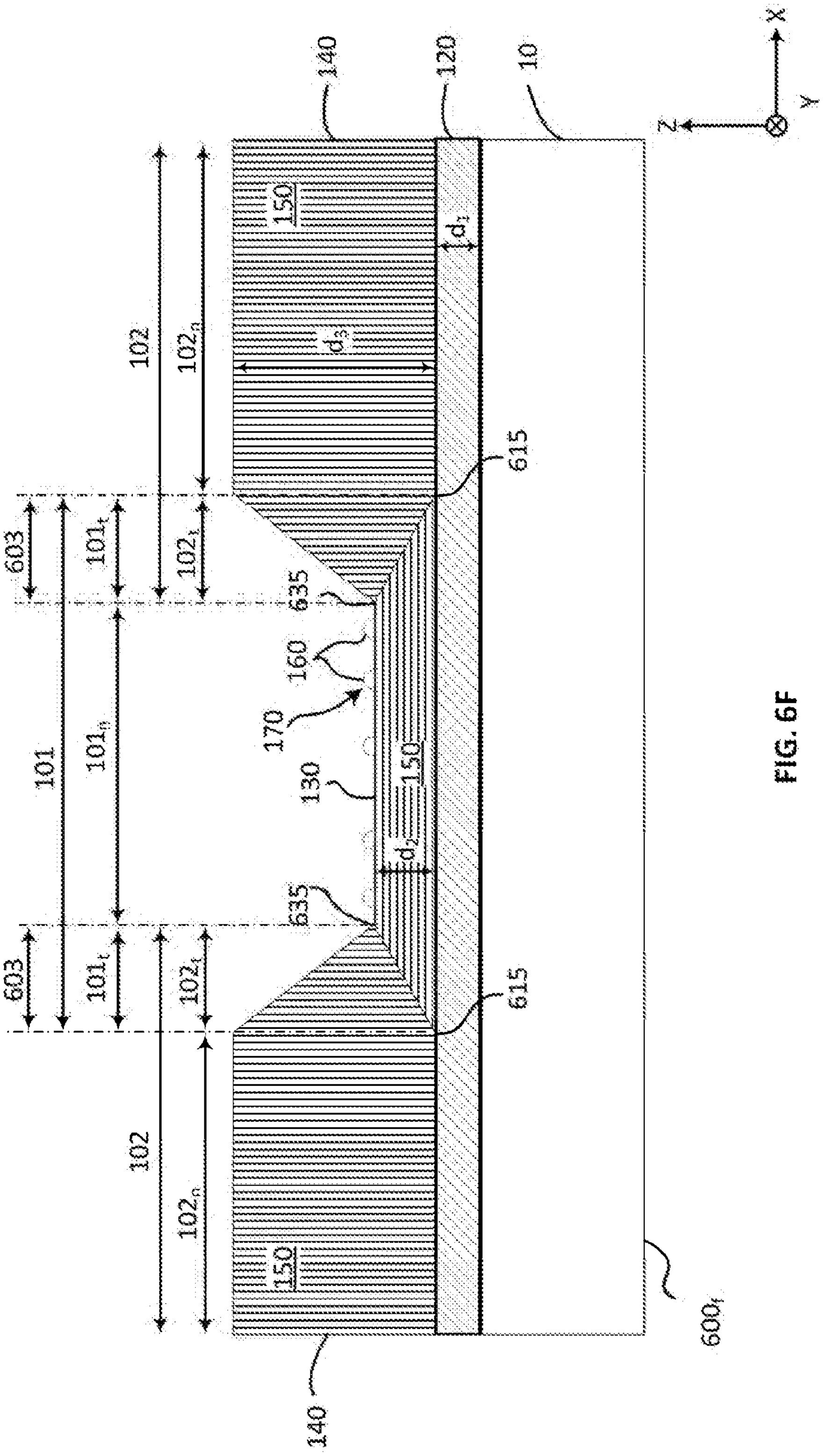
FIG. 6F is a schematic diagram illustrating an example of the device of FIG. 1 in a cross-sectional view.

In some non-limiting examples, as shown by way of non-limiting example in FIG. 6F, at least a part of the deposited layer transition region $102_t$ may be disposed over at least a part of the patterning coating transition region $101_t$. In some non-limiting examples, at least a part of the patterning coating transition region $101_t$ may be substantially devoid of the deposited layer 140, and/or the deposited material 531. In some non-limiting examples, the deposited material 531 may form a discontinuous layer 170 on an exposed layer surface 11 of at least a part of the patterning coating transition region $101_t$.

Figure 6G:
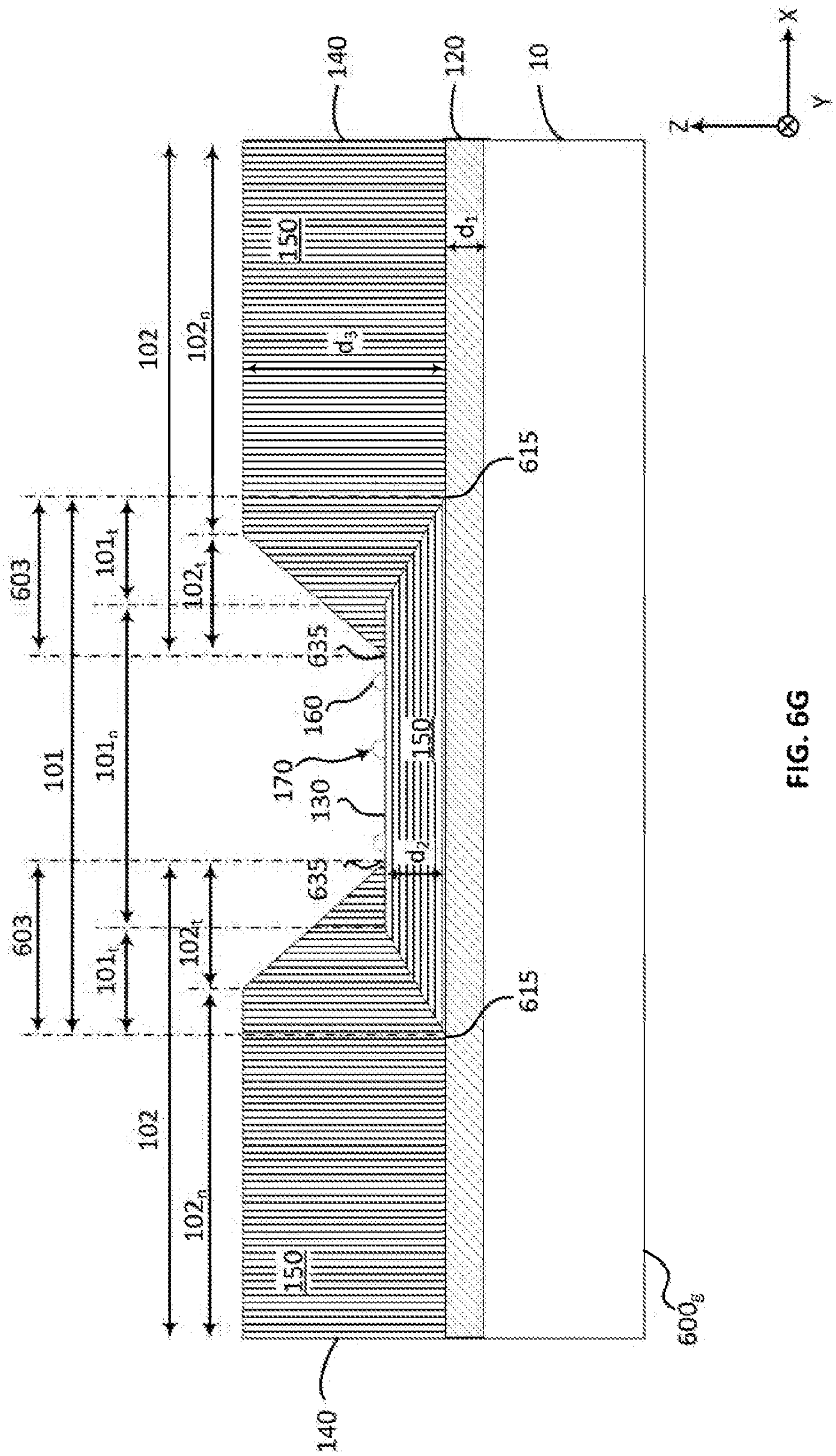
FIG. 6G is a schematic diagram illustrating an example of the device of FIG. 1 in a cross-sectional view.

In some non-limiting examples, as shown by way of non-limiting example in FIG. 6G, at least a part of the deposited layer transition region $102_t$ may be disposed over at least a part of the patterning coating non-transition part $101_n$ of the first portion 101.

Although not shown, those having ordinary skill in the relevant art will appreciate that, in some non-limiting examples, the overlap portion 603 may reflect a scenario in which at least a part of the first portion 101 overlaps at least a part of the second portion 102.

Thus, in some non-limiting examples, at least a part of the patterning coating transition region $\mathbf{101}_t$ may be disposed over at least a part of the deposited layer transition region $\mathbf{102}_t$. In some non-limiting examples, at least a part of the deposited layer transition region $\mathbf{102}_t$ may be substantially devoid of the patterning coating 130, and/or the patterning material 411. In some non-limiting examples, the patterning material 411 may form a discontinuous layer 170 on an exposed layer surface of at least a part of the deposited layer transition region $\mathbf{102}_t$.

In some non-limiting examples, at least a part of the patterning coating transition region $\mathbf{101}_t$ may be disposed over at least a part of the deposited layer non-transition part $\mathbf{102}_n$ of the second portion 102.

In some non-limiting examples, the patterning coating edge 615 may be spaced apart, in the lateral aspect, from the deposited layer non-transition part $\mathbf{102}_n$ of the second portion 102.

In some non-limiting examples, the deposited layer 140 may be formed as a single monolithic coating across both the deposited layer non-transition part $\mathbf{102}_n$ and the deposited layer transition region $\mathbf{102}_t$ of the second portion 102.

Edge Effects of Patterning Coatings and Deposited Layers

FIGS. 7A-7I describe various potential behaviours of patterning coatings 130 at a deposition interface with deposited layers 140.

Figure 7A:
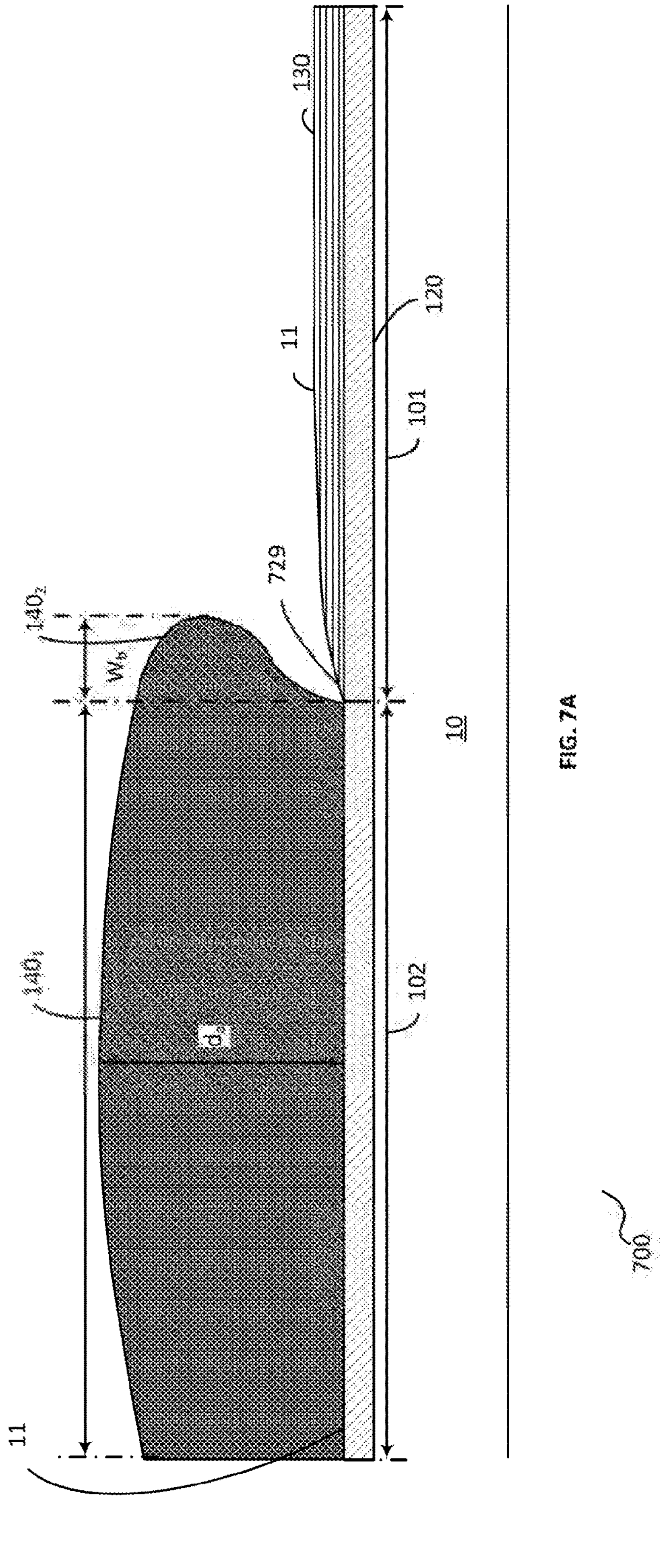
FIGS. 7A-7I are schematic diagrams that show various potential behaviours of a patterning coating at a deposition interface with a deposited layer in an example version of the device of FIG. 1 according to various examples in the present disclosure.

Turning to FIG. 7A, there may be shown a first example of a part of an example version 700 of the device 100 at a patterning coating deposition boundary. The device 700 may comprise a substrate 10 having an exposed layer surface 11. A patterning coating 130 may be deposited over a first portion 101 of the exposed layer surface 11 of the orientation layer 120. A deposited layer 140 may be deposited over a second portion 102 of the exposed layer surface 11 (whether of the orientation layer 120 or of the underlying layer). As shown, by way of non-limiting example, the first portion 101 and the second portion 102 may be distinct and non-overlapping parts of the exposed layer surface 11.

The deposited layer 140 may comprise a first part $\mathbf{140}_1$ and a second part $\mathbf{140}_2$. As shown, by way of non-limiting example, the first part $\mathbf{140}_1$ of the deposited layer 140 may substantially cover the second portion 102 and the second part $\mathbf{140}_2$ of the deposited layer 140 may partially project over, and/or overlap a first part of the patterning coating 130.

In some non-limiting examples, since the patterning coating 130 may be formed such that its exposed layer surface 11 exhibits a relatively low initial sticking probability against deposition of the deposited material 531, there may be a gap 729 formed between the projecting, and/or overlapping second part $\mathbf{140}_2$ of the deposited layer 140 and the exposed layer surface 11 of the patterning coating 130. As a result, the second part $\mathbf{140}_2$ may not be in physical contact with the patterning coating 130 but may be spaced-apart therefrom by the gap 729 in a cross-sectional aspect. In some non-limiting examples, the first part $\mathbf{140}_1$ of the deposited layer 140 may be in physical contact with the patterning coating 130 at an interface, and/or boundary between the first portion 101 and the second portion 102.

In some non-limiting examples, the projecting, and/or overlapping second part $\mathbf{140}_2$ of the deposited layer 140 may extend laterally over the patterning coating 130 by a comparable extent as an average layer thickness $d_a$ of the first part $\mathbf{140}_1$ of the deposited layer 140. By way of non-limiting example, as shown, a width $w_b$ of the second part $\mathbf{140}_2$ may be comparable to the average layer thickness $d_a$ of the first part $\mathbf{140}_1$. In some non-limiting examples, a ratio of a width $w_b$ of the second part $\mathbf{140}_2$ by an average layer thickness $d_a$ of the first part $\mathbf{140}_1$ may be in a range of at least one of between about: 1:1-1:3, 1:1-1:1.5, or 1:1-1:2. While the average layer thickness $d_a$ may in some non-limiting examples be relatively uniform across the first part $\mathbf{140}_1$, in some non-limiting examples, the extent to which the second part $\mathbf{140}_2$ may project, and/or overlap with the patterning coating 130 (namely $w_b$) may vary to some extent across different parts of the exposed layer surface 11.

Figure 7B:
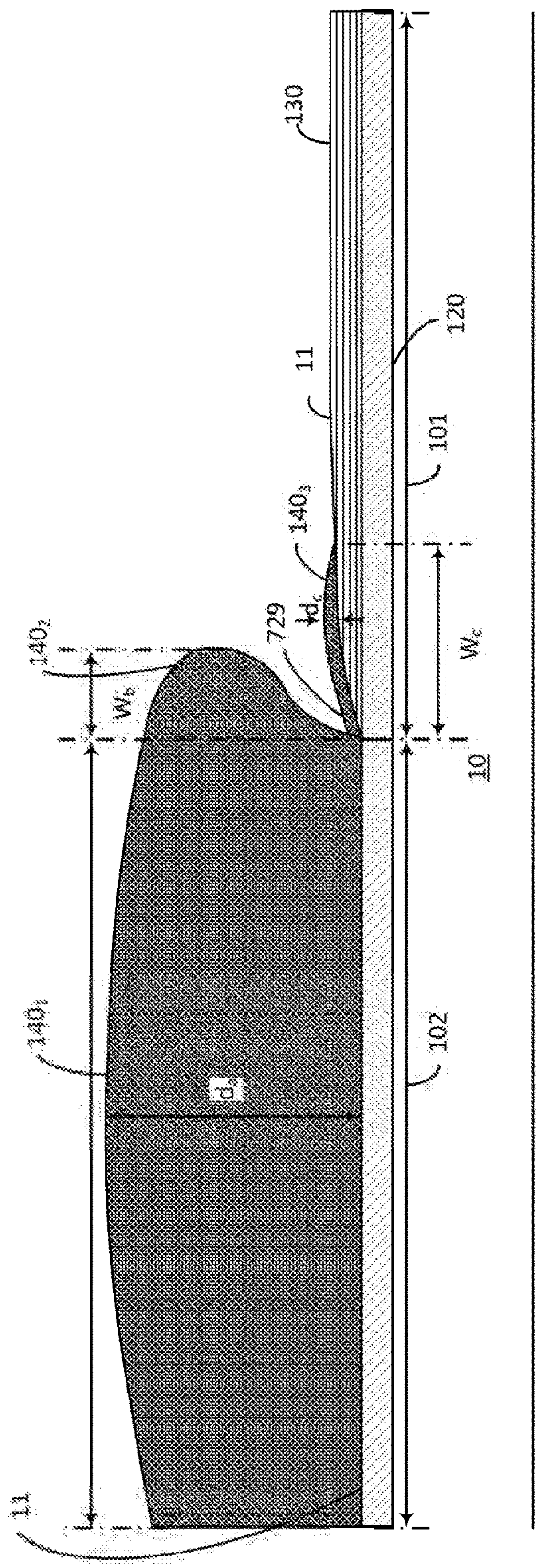

Turning now to FIG. 7B, the deposited layer 140 may be shown to include a third part 1403 disposed between the second part $\mathbf{140}_2$ and the patterning coating 130. As shown, the second part $\mathbf{140}_2$ of the deposited layer 140 may extend laterally over and is longitudinally spaced apart from the third part 1403 of the deposited layer 140 and the third part 1403 may be in physical contact with the exposed layer surface 11 of the patterning coating 130. An average layer thickness of the third part 1403 of the deposited layer 140 may be no more than, and in some non-limiting examples, substantially less than, the average layer thickness $d_a$ of the first part $\mathbf{140}_1$ thereof. In some non-limiting examples, a width $w_c$ of the third part 1403 may exceed the width $w_b$ of the second part $\mathbf{140}_2$. In some non-limiting examples, the third part 1403 may extend laterally to overlap the patterning coating 130 to a greater extent than the second part $\mathbf{140}_2$. In some non-limiting examples, a ratio of a width $w_c$ of the third part 1403 by an average layer thickness $d_a$ of the first part $\mathbf{140}_1$ may be in a range of at least one of between about: 1:2-3:1, or 1:1.2-2.5:1. While the average layer thickness $d_a$ may in some non-limiting examples be relatively uniform across the first part $\mathbf{140}_1$, in some non-limiting examples, the extent to which the third part 1403 may project, and/or overlap with the patterning coating 130 (namely $w_c$) may vary to some extent across different parts of the exposed layer surface 11.

In some non-limiting examples, the average layer thickness of the third part 1403 may not exceed about 5% of the average layer thickness $d_a$ of the first part $\mathbf{140}_1$. By way of non-limiting example, $d_c$ may be at least one of no more than about: 4%, 3%, 2%, 1%, or 0.5% of $d_a$. Instead of, and/or in addition to, the third part 1403 being formed as a thin film, as shown, the deposited material 531 of the deposited layer 140 may form as particle structures 160 (not shown) on a part of the patterning coating 130. By way of non-limiting example, such particle structures 160 may comprise features that are physically separated from one another, such that they do not form a continuous layer.

Figure 7C:
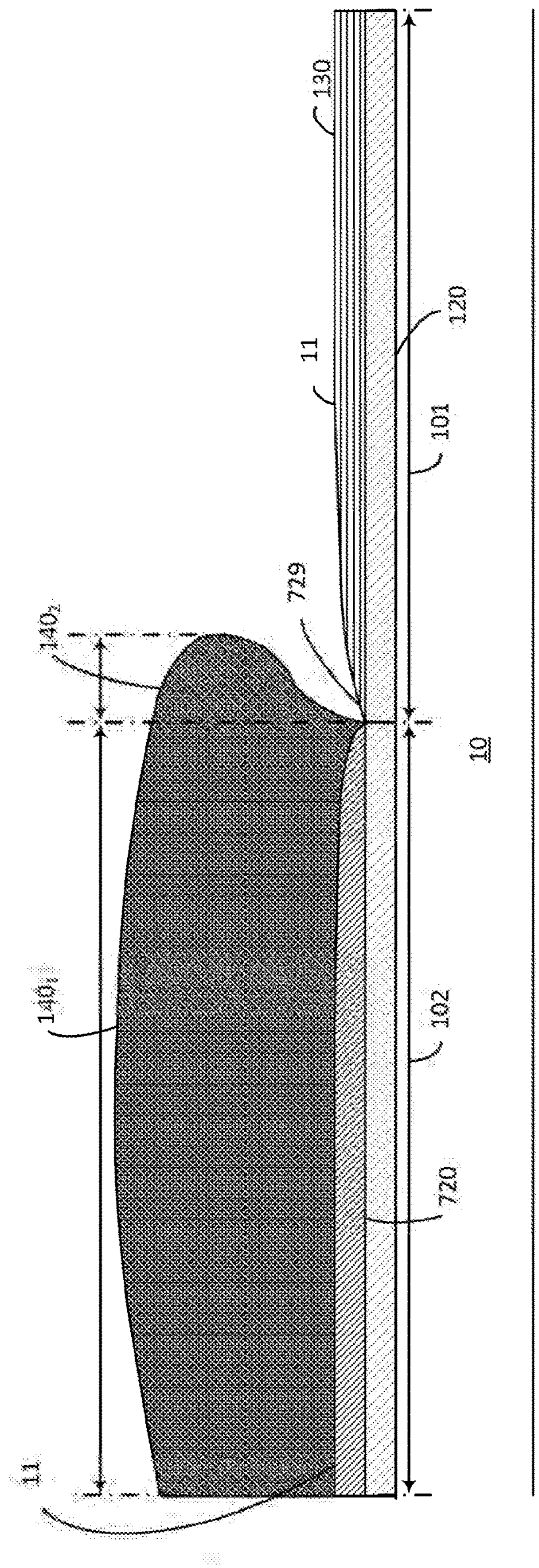

Turning now to FIG. 7C, an NPC 720 may be disposed between the substrate 10 and the deposited layer 140. The NPC 720 may be disposed between the first part $\mathbf{140}_1$ of the deposited layer 140 and the second portion 102 of the exposed layer surface 11 (whether of the orientation layer 120 or of the underlying layer). The NPC 720 is illustrated as being disposed on the second portion 102 and not on the first portion 101, where the patterning coating 130 has been deposited. The NPC 720 may be formed such that, at an interface, and/or boundary between the NPC 720 and the deposited layer 140, a surface of the NPC 720 may exhibit a relatively high initial sticking probability against deposition of the deposited material 531. As such, the presence of the NPC 720 may promote the formation, and/or growth of the deposited layer 140 during deposition.

Figure 7D:
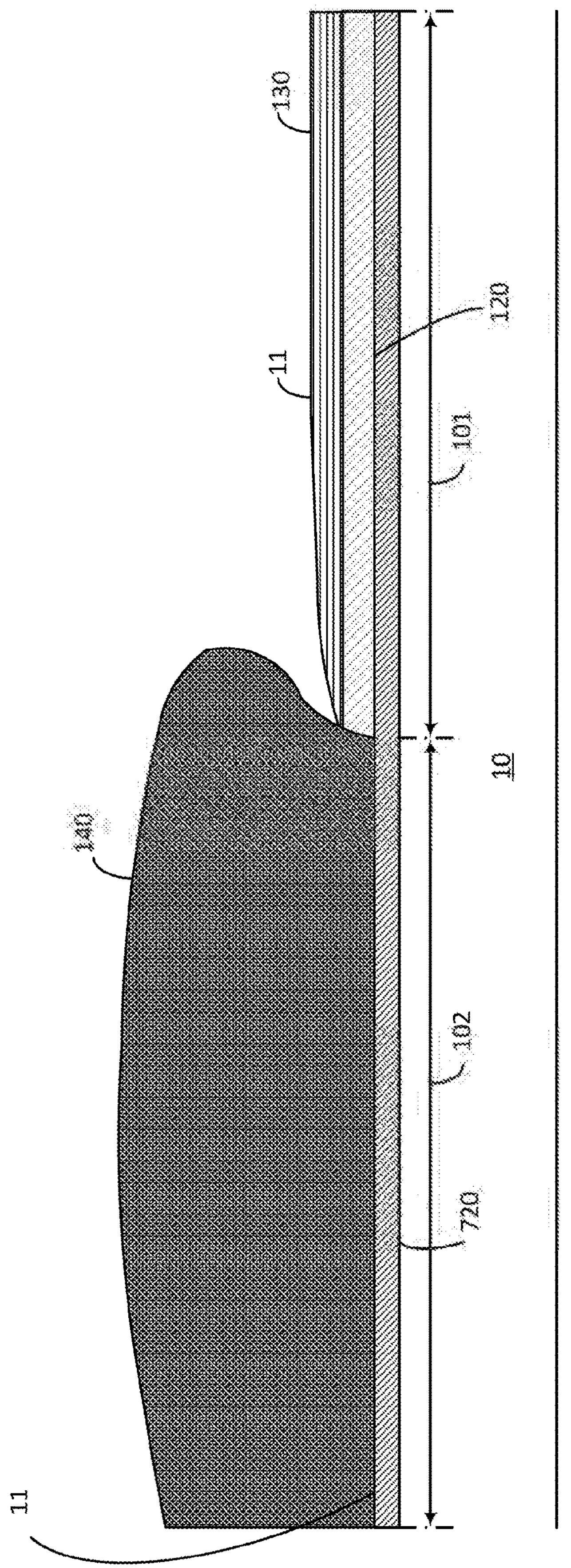

Turning now to FIG. 7D, the NPC 720 may be disposed on both the first portion 101 and the second portion 102 of the substrate 10 and the orientation layer 120 may cover a part of the NPC 720 disposed on the first portion 101. Another part of the NPC 720 may be substantially devoid of the orientation layer 120 and of the patterning coating 130 and the deposited layer 140 may cover such part of the NPC 720.

Figure 7E:
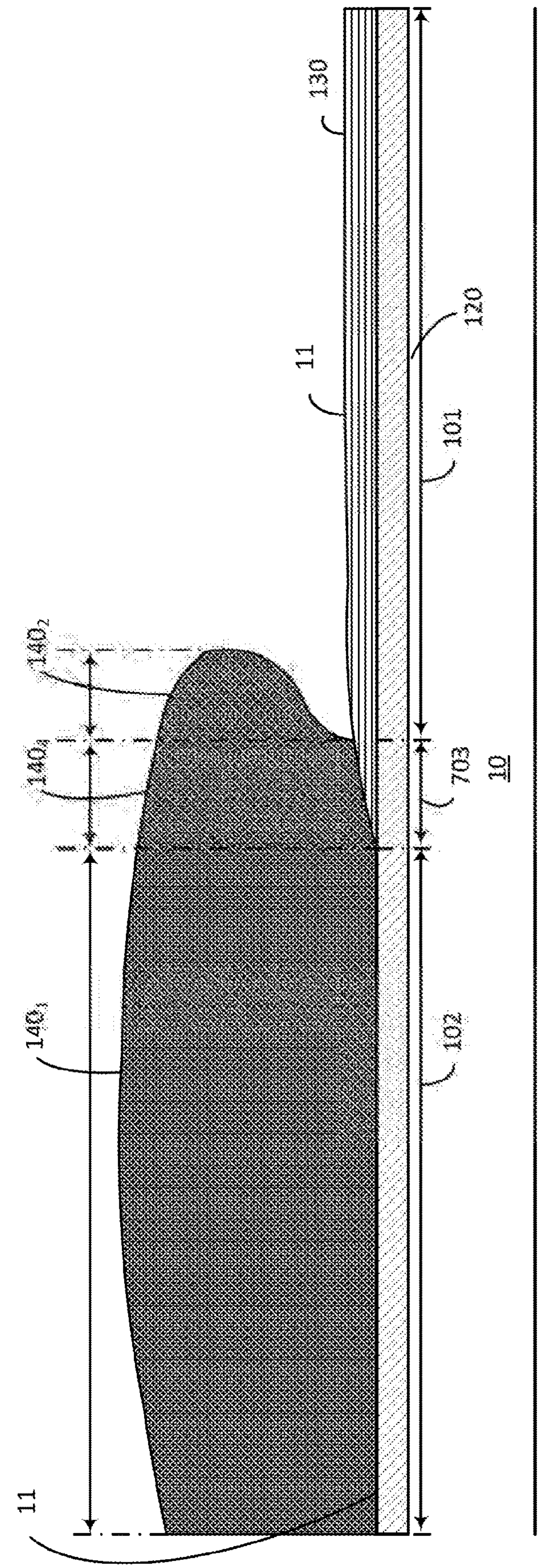

Turning now to FIG. 7E, the deposited layer 140 may be shown to partially overlap a part of the patterning coating 130 in a third portion 703 of the substrate 10. In some non-limiting examples, in addition to the first part $\mathbf{140}_1$ and the second part $\mathbf{140}_2$, the deposited layer 140 may further include a fourth part $\mathbf{140}_4$. As shown, the fourth part $\mathbf{140}_4$ of the deposited layer 140 may be disposed between the first part $\mathbf{140}_1$ and the second part $\mathbf{140}_2$ of the deposited layer 140 and the fourth part $\mathbf{140}_4$ may be in physical contact with the exposed layer surface 11 of the patterning coating 130. In some non-limiting examples, the overlap in the third portion 703 may be formed as a result of lateral growth of the deposited layer 140 during an open mask and/or mask-free deposition process. In some non-limiting examples, while the exposed layer surface 11 of the patterning coating 130 may exhibit a relatively low initial sticking probability against deposition of the deposited material 531, and thus a probability of the material nucleating on the exposed layer surface 11 may be low, as the deposited layer 140 grows in thickness, the deposited layer 140 may also grow laterally and may cover a subset of the patterning coating 130 as shown.

Figure 7F:
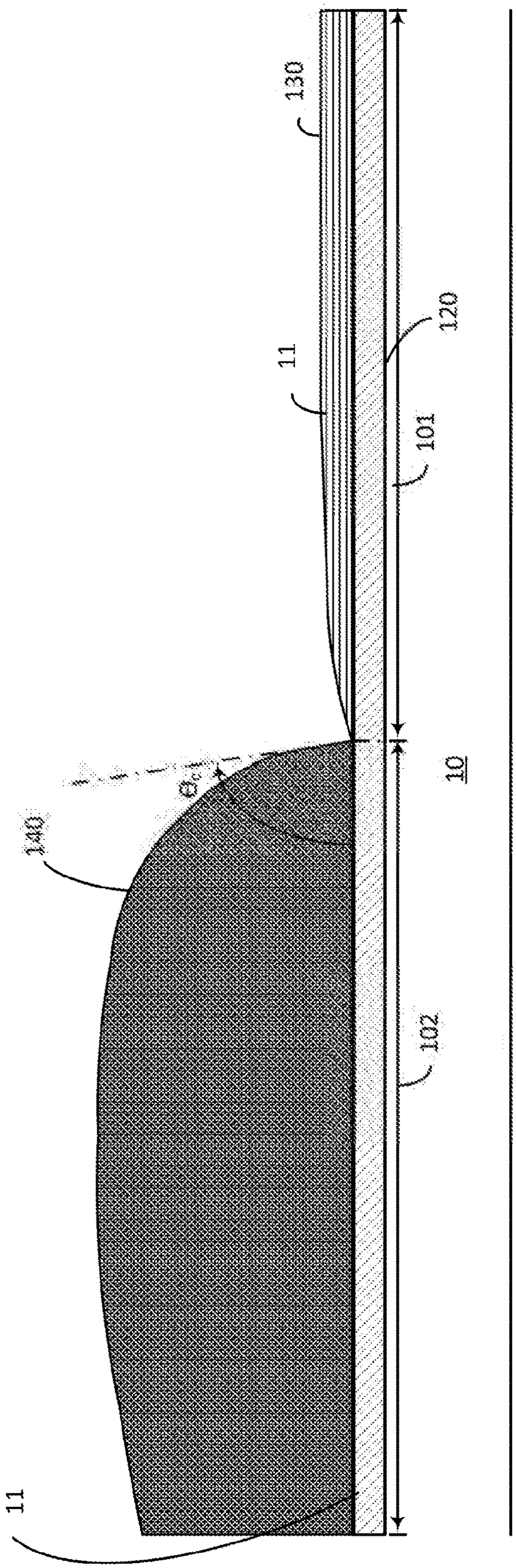

Turning now to FIG. 7F the first portion 101 of the substrate 10 may be coated with the patterning coating 130 and the second portion 102 adjacent thereto may be coated with the deposited layer 140. In some non-limiting examples, it has been observed that conducting an open mask and/or mask-free deposition of the deposited layer 140 may result in the deposited layer 140 exhibiting a tapered cross-sectional profile at, and/or near an interface between the deposited layer 140 and the patterning coating 130.

In some non-limiting examples, an average layer thickness of the deposited layer 140 at, and/or near the interface may be less than an average layer thickness $d_3$ of the deposited layer 140. While such tapered profile may be shown as being curved, and/or arched, in some non-limiting examples, the profile may, in some non-limiting examples be substantially linear, and/or non-linear. By way of non-limiting example, an average layer thickness $d_3$ of the deposited layer 140 may decrease, without limitation, in a substantially linear, exponential, and/or quadratic fashion in a region proximal to the interface.

It has been observed that a contact angle $\theta_c$ of the deposited layer 140 at, and/or near the interface between the deposited layer 140 and the patterning coating 130 may vary, depending on properties of the patterning coating 130, such as a relative initial sticking probability. It may be further postulated that the contact angle $\theta_c$ of the nuclei may, in some non-limiting examples, dictate the thin film contact angle of the deposited layer 140 formed by deposition. Referring to FIG. 7F by way of non-limiting example, the contact angle $\theta_c$ may be determined by measuring a slope of a tangent of the deposited layer 140 at and/or near the interface between the deposited layer 140 and the patterning coating 130. In some non-limiting examples, where the cross-sectional taper profile of the deposited layer 140 may be substantially linear, the contact angle $\theta_c$ may be determined by measuring the slope of the deposited layer 140 at, and/or near the interface. As will be appreciated by those having ordinary skill in the relevant art, the contact angle $\theta_c$ may be generally measured relative to a non-zero angle of the underlying layer. In the present disclosure, for purposes of simplicity of illustration, the patterning coating 130 and the deposited layer 140 may be shown deposited on a planar surface. However, those having ordinary skill in the relevant art will appreciate that the patterning coating 130 and the deposited layer 140 may be deposited on non-planar surfaces.

Figure 7G:
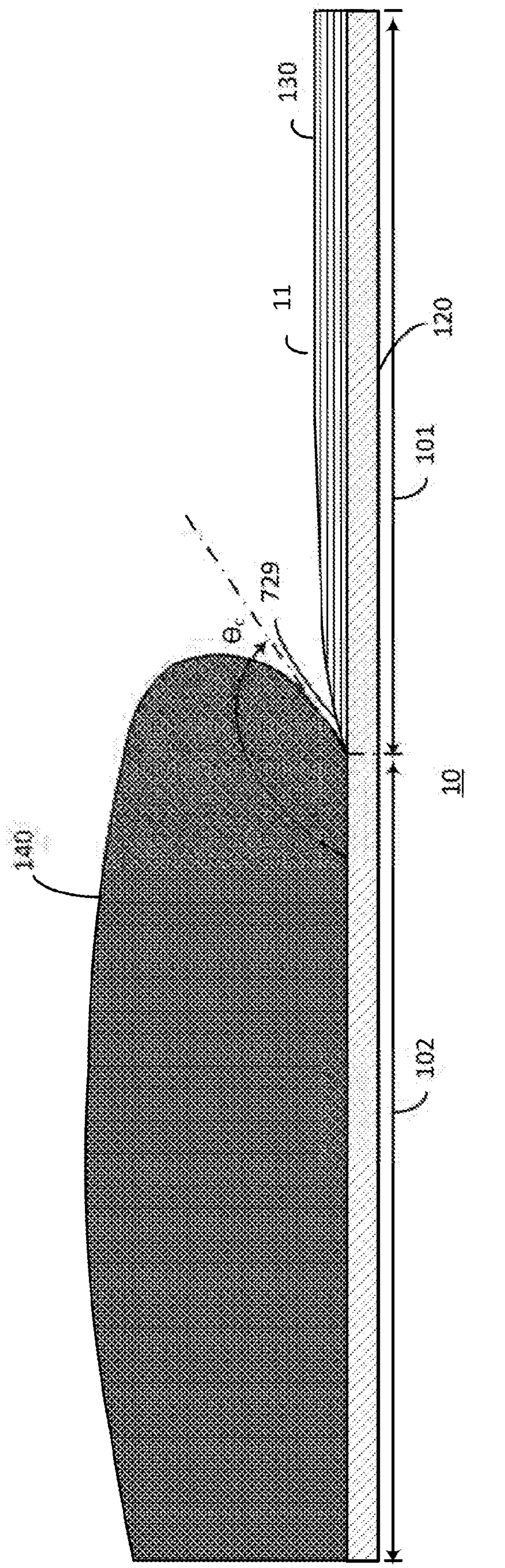

In some non-limiting examples, the contact angle $\theta_c$ of the deposited layer 140 may exceed about 90°. Referring now to FIG. 7G, by way of non-limiting example, the deposited layer 140 may be shown as including a part extending past the interface between the patterning coating 130 and the deposited layer 140 and may be spaced apart from the patterning coating 130 by a gap 729. In such non-limiting scenario, the contact angle $\theta_c$ may, in some non-limiting examples, exceed 90°.

In some non-limiting examples, it may be advantageous to form a deposited layer 140 exhibiting a relatively high contact angle $\theta_c$. By way of non-limiting example, the contact angle $\theta_c$ may exceed at least one of about: 10°, 15°, 20°, 25°, 30°, 35°, 40°, 50°, 70°, 75°, or 80°. By way of non-limiting example, a deposited layer 140 having a relatively high contact angle θ, may allow for creation of finely patterned features while maintaining a relatively high aspect ratio. By way of non-limiting example, there may be an aim to form a deposited layer 140 exhibiting a contact angle θ, greater than about 90°. By way of non-limiting example, the contact angle $\theta_c$ may exceed at least one of about: 90°, 95°, 100°, 105°, 110° 120°, 130°, 135°, 140°, 145°, 150°, or 170°.

Figure 7H:
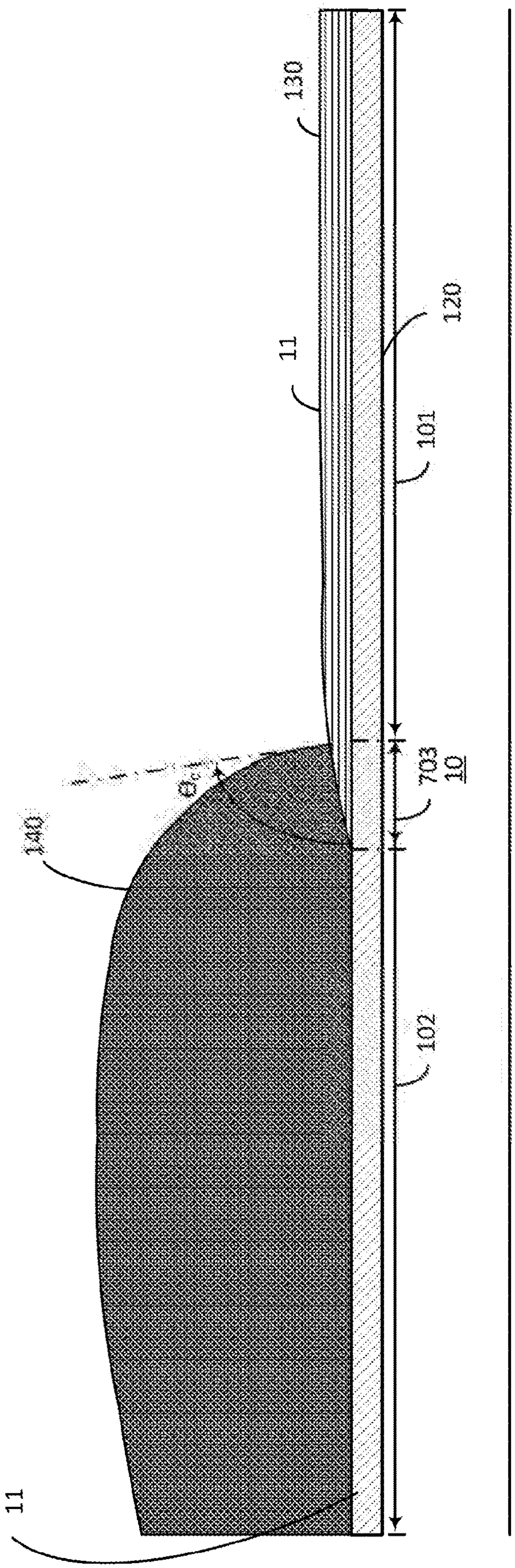
Figure 7I:
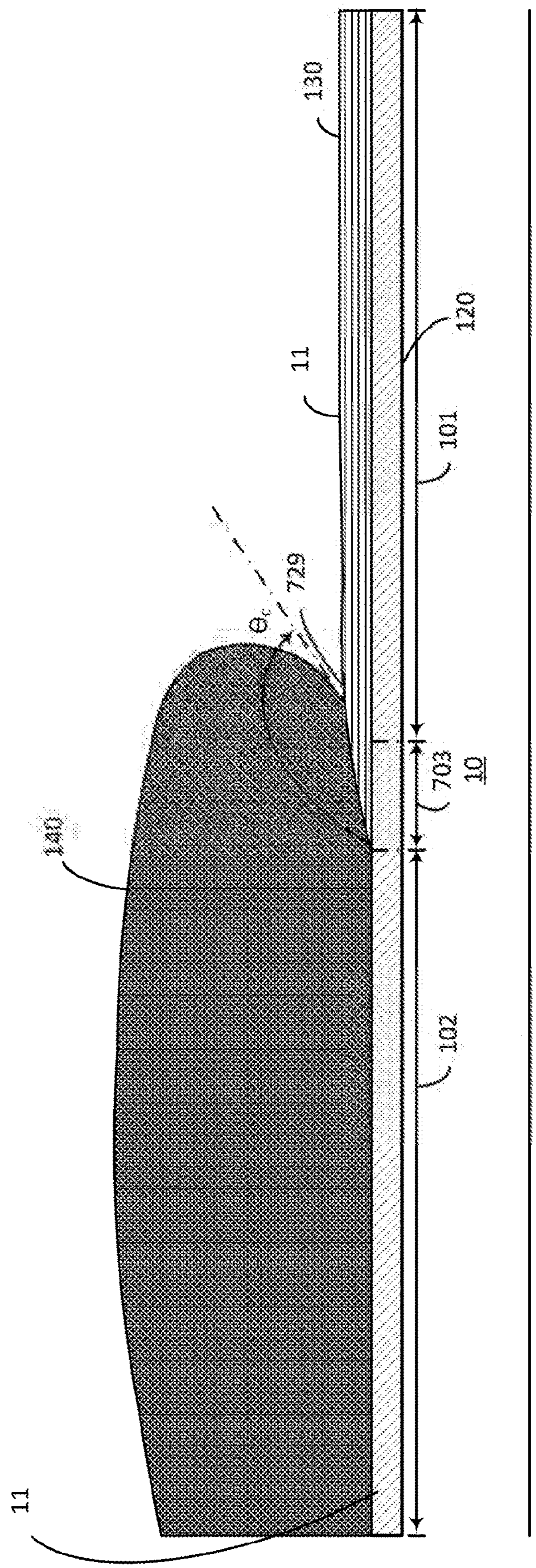

Turning now to FIGS. 7H-7I, the deposited layer 140 may partially overlap a part of the patterning coating 130 in the third portion 703 of the substrate 10, which may be disposed between the first portion 101 and the second portion 102 thereof. As shown, the subset of the deposited layer 140 partially overlapping a subset of the patterning coating 130 may be in physical contact with the exposed layer surface 11 thereof. In some non-limiting examples, the overlap in the third portion 703 may be formed because of lateral growth of the deposited layer 140 during an open mask and/or mask-free deposition process. In some non-limiting examples, while the exposed layer surface 11 of the patterning coating 130 may exhibit a relatively low initial sticking probability against deposition of the deposited material 531 and thus the probability of the material nucleating on the exposed layer surface 11 is low, as the deposited layer 140 grows in thickness, the deposited layer 140 may also grow laterally and may cover a subset of the patterning coating 130.

In the case of FIGS. 7H-7I, the contact angle $\theta_c$ of the deposited layer 140 may be measured at an edge thereof near the interface between it and the patterning coating 130, as shown. In FIG. 71, the contact angle $\theta_c$ may exceed about 90°, which may in some non-limiting examples result in a subset of the deposited layer 140 being spaced apart from the patterning coating 130 by the gap 729.

Particle Structure

A nanoparticle (NP) is a particle of matter whose predominant characteristic size is of nanometer (nm) scale, generally understood to be between about: 1-300 nm. At nm scale, NPs of a given material may possess unique properties (including without limitation, optical, chemical, physical, and/or electrical) relative to the same material in bulk form, including without limitation, an amount of absorption of EM radiation exhibited by such NPs at different wavelengths (ranges).

These properties may be exploited when a plurality of NPs is formed into a layer of a layered semiconductor device 100 to improve its performance.

However, current mechanisms for introducing such a layer of NPs into such a device have some drawbacks.

First, typically, such NPs are formed into a close-packed layer, and/or dispersed into a matrix material, of such device. Consequently, the thickness of such an NP layer is typically much thicker than the characteristic size of the NPs themselves. The thickness of such NP layer may impart undesirable characteristics in terms of device performance, device stability, device reliability, and/or device lifetime that may reduce or even obviate any perceived advantages provided by the unique properties of NPs.

Second, techniques to synthesize NPs, in and for use in such devices may introduce large amounts of carbon (C), oxygen (O), and/or S through various mechanisms.

By way of non-limiting example, wet chemical methods are typically used to introduce NPs that have a precisely controlled characteristic size, length, width, diameter, height, size distribution, shape, surface coverage, configuration, deposited density, dispersity, and/or composition into an opto-electronic device 1200. However, such methods typically employ an organic capping group (such as the synthesis of citrate-capped Ag NPs) to stabilize the NPs, but such organic capping groups introduce C, O, and/or S into the synthesized NPs.

Still further, NP layers deposited from solution typically comprise C, O, and/or S because of the solvents used during deposition.

Additionally, these elements may be introduced as contaminants during the wet chemical process and/or the deposition of the NP layers.

However, introduced, the presence of a high amount of C, O, and/or S in the NP layer of such a device may erode the performance, stability, reliability, and/or lifetime of such device.

Third, when depositing an NP layer from solution, as the employed solvents dry, the NP layer(s) may tend to have non-uniform properties across the NP layer, and/or between different patterned regions of such layer. In some non-limiting examples, an edge of a given layer may be considerably thicker or thinner than an internal region of such layer, which disparities may adversely impact the device performance, stability, reliability, and/or lifetime.

Fourth, while there are other methods and/or processes, beyond wet chemical synthesis and solution deposition processes, of synthesizing and/or depositing NPs, including without limitation, a vacuum-based process such as, without limitation, PVD, such methods tend to provide poor control of the characteristic size, length, width, diameter, height, size distribution, shape, surface coverage, configuration, deposited density, dispersity, and/or composition of the NPs deposited thereby. By way of non-limiting example, in a PVD process, the NPs tend to form a close-packed film as their size increases. As a result, methods such as PVD are generally not well-suited to form a layer of large disperse NPs with low surface coverage. Rather, the poor control of characteristic size, length, width, diameter, height, size distribution, shape, surface coverage, configuration, deposited density, dispersity, and/or composition imparted by such methods may result in poor device performance, stability, reliability, and/or lifetime.

In some non-limiting examples, an OLED display panel 1340 may comprise a plurality of laterally distributed (sub-) pixels 134*x* (FIG. 23A), each of which has an associated pair of electrodes 1220, 1240 (FIG. 12A) acting as an anode and a cathode, and at least one semiconducting layer 1230 (FIG. 12A) between them. The anode and cathode are electrically coupled with a power source 1605 (FIG. 16) and respectively generate holes and electrons that migrate toward each other through the at least one semiconducting layer 1230. When a pair of holes and electrons combine, a photon may be emitted. In some non-limiting examples, the (sub-) pixels 134*x* may be selectively driven by a driving circuit comprising a plurality of thin-film transistor (TFT) structures 1201 (FIG. 12A) electrically coupled by conductive metal lines, in some non-limiting examples, within a substrate upon which the electrodes 1220, 1240 and the at least one semiconducting layer 1230 are deposited. Various layers and coatings of such panels 1340 are typically formed by vacuum-based deposition processes.

Figure 28A:
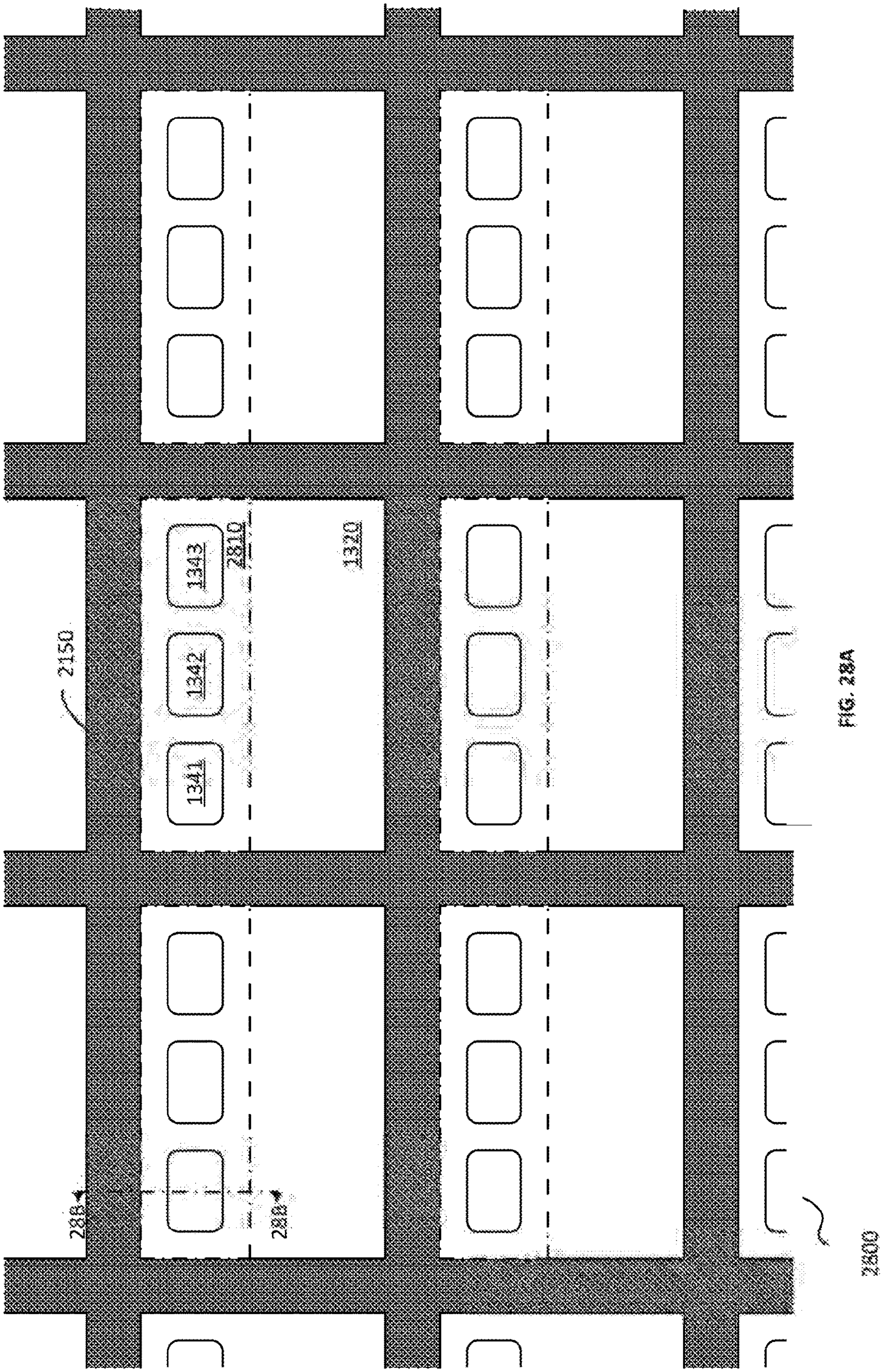
FIG. 28A is a schematic diagram illustrating, in plan view, an example of a transparent version of the device of FIG. 16 comprising at least one example pixel region and at least one example light-transmissive region, with at least one auxiliary electrode according to an example in the present disclosure.

In some non-limiting examples, a plurality of sub-pixels 134*x*, each corresponding to and emitting EM radiation of a different wavelength (range) may collectively form a pixel 2810 (FIG. 28A). The EM radiation at a first wavelength (range) emitted by a first sub-pixel 134*x* of a pixel 2810 may perform differently than the EM radiation at a second wavelength (range) emitted by a second sub-pixel 134*x* thereof because of the different wavelength (range) involved.

In some non-limiting examples, an absorption spectrum exhibited by a layer of metal NPs of a first given characteristic size, length, width, diameter, height, size distribution, shape, surface coverage, configuration, deposited density, dispersity, and/or composition across a first wavelength range may be different than an absorption spectrum exhibited by a layer of metal NPs of a second given characteristic size, length, width, diameter, height, size distribution, shape, surface coverage, configuration, deposited density, dispersity, and/or composition across the first wavelength range and/or than an absorption spectrum exhibited by a layer of metal NPs of the first given characteristic size, length, width, diameter, height, size distribution, shape, surface coverage, configuration, deposited density, dispersity, and/or composition across a second wavelength range.

Particle structures 160, including without limitation, as a discontinuous layer 170, take advantage of plasmonics, a branch of nanophotonics, which studies the resonant interaction of EM radiation with metals.

Those having ordinary skill in the relevant art will appreciate that certain metal NPs may exhibit surface plasmon (SP) excitations, and/or coherent oscillations of free electrons, with the result that such NPs may absorb, and/or scatter light in a wavelength (sub-) range of the EM spectrum, including without limitation, the visible spectrum, and/or a sub-range thereof. The optical response, including without limitation, the (sub-) range of the EM spectrum over which absorption may be concentrated (absorption spectrum), refractive index, and/or extinction coefficient, of such localized SP (LSP) excitations, and/or coherent oscillations, may be tailored by varying properties of such NPs, including without limitation, at least one of: a characteristic size, length, width, diameter, height, size distribution, shape, surface coverage, configuration, deposition density, dispersity, and/or property, including without limitation, material, and/or degree of aggregation, of the nanostructures, and/or a medium proximate thereto.

Such optical response, in respect of particle structures 160, may include absorption of EM radiation incident thereon, thereby reducing reflection thereof and/or shifting to a lower or higher wavelength ((sub-) range) of the EM spectrum, including without limitation, the visible spectrum, and/or a sub-range thereof.

Thus, as shown in FIG. 1, in some non-limiting examples, the layered semiconductor device 100 may have as a layer thereof, which may, in some non-limiting examples, be a discontinuous layer 170, at least one particle, including without limitation, a nanoparticle (NP), an island, a plate, a disconnected cluster, and/or a network (collectively particle structure 160), controllably disposed on and/or over the exposed layer surface 11 of an underlying layer of the device 100.

Those having ordinary skill in the art will appreciate that there may be at least one particle structure 160 in a layer, without necessarily forming a discontinuous layer 170. However, given that the formation of at least one particle structure 160 in a layer may typically lead to the formation of a discontinuous layer 170, for purposes of simplicity of description only, reference to the formation of at least one particle structure 160 herein will carry with it the implication, even if not stated, that in some non-limiting examples, such particle structures 160 may comprise a discontinuous layer 170 thereof.

In some non-limiting examples, at least some of the particle structures 160 may be disconnected from one another. In other words, in some non-limiting examples, the discontinuous layer 170 may comprise features, including particle structures 160, that may be physically separated from one another, such that the at least one particle structure 160 does not form a closed coating 150.

In some non-limiting examples, at least one overlying layer 180 of the plurality of layers of the device 100 may be deposited on the exposed layer surface 11 of the particle structures 160 and on the exposed layer surface 11 of the underlying layer therebetween. In some non-limiting examples, the at least one overlying layer 180 may be a CPL 1215.

In some non-limiting examples, the device 100 may be configured to substantially permit EM radiation to engage an exposed layer surface 11 of the device 100 along an optical path substantially parallel to the axis of a first direction indicated by the arrow OC at a non-zero angle to a plane of the underlying layer defined by a plurality of the lateral axes.

In the present disclosure, the propagation of EM radiation temporally in a given direction, including without limitation, as indicated by the arrow OC, may give rise to a directional convention, in which a first layer may be said to be "anterior" to, "ahead of", and/or "before" a second layer in the (direction of propagation of the EM radiation in the) optical path.

The optical path may correspond to a direction that may be at least one of: a direction from which EM radiation, emitted by the device 100, may be extracted therefrom (such as is shown by the orientation of the arrow OC in the figure), and a direction at which EM radiation may be incident on an exposed layer surface 11 of the device 100, and propagated at least partially therethrough, including without limitation, where the EM radiation may be incident on an exposed layer surface 11 of the substrate 10, opposite to that on which the various layers and/or coatings have been deposited, and transmitted at least partially through the substrate 10 and the various layers and/or coatings (not shown).

Those having ordinary skill in the relevant art will appreciate that there may be a scenario where EM radiation is both emitted by the device 100 and concomitantly, EM radiation is incident on an exposed layer surface 11 of the device 100 and transmitted at least partially therethrough. In such scenario, the direction of the optical path will, unless the context indicates to the contrary, be determined by the direction from which the EM radiation emitted by the device 100 may be extracted. In some non-limiting examples, the EM radiation transmitted entirely through the device 100 may be propagated in the same or a similar direction. Nevertheless, nothing in the present disclosure should be interpreted as limiting the propagation of EM radiation entirely through the device 100 to a direction that is the same or similar to the direction of propagation of EM radiation emitted by the device 100.

In some non-limiting examples, the device 100 may be a top-emission opto-electronic device 2100 in which EM radiation (including without limitation, in the form of light and/or photons) may be emitted by the device 100 in at least the first direction.

Although not shown, in some non-limiting examples, the device 100 may comprise at least one signal-transmissive region 1320 (FIG. 28A) in which EM radiation incident on an exposed layer surface 11 of the substrate 10, on which the various layers and/or coatings have been deposited, may be transmitted through the substrate 10 and the various layers and/or coatings in at least the first direction, which would be, in such scenario, opposite to the direction shown by the arrow OC in the figure.

In some non-limiting examples, the location of the at least one particle structure 160 within the various layers of the device 100 (that is, the selective identification of which of the various layers of the device 100 will serve as the underlying layer on which the particle structures 160 may be deposited), may be controllably selected to achieve an effect related to an optical response exhibited by the particle structures 160 when positioned at such location.

In some non-limiting examples, the particle structures 160 may be controllably selected so as to be limited to a portion 101, 102 of the lateral aspect of the device 100 (including without limitation, corresponding to an emissive region 1310 (FIG. 22) of the device 100), to selectively restrict achieving of an effect related to an optical response exhibited by the particle structures 160 to such portion 101, 102 of the lateral aspect of the device 100.

In some non-limiting examples, the particle structures 160 may be controllably selected so as to have a characteristic size, length, width, diameter, height, size distribution, shape, surface coverage, configuration, deposited density, dispersity, and/or composition to achieve an effect related to an optical response exhibited by the particle structures 160.

Those having ordinary skill in the relevant art will appreciate that, having regard to the mechanism by which materials are deposited, due to possible stacking and/or clustering of monomers and/or atoms, an actual size, height, weight, thickness, shape, profile, and/or spacing thereof, the at least one particle structure 160 may be, in some non-limiting examples, substantially non-uniform. Additionally, although the at least one particle structure 160 are illustrated as having a given profile, this is intended to be illustrative only, and not determinative of any size, height, weight, thickness, shape, profile, and/or spacing thereof.

In some non-limiting examples, the at least one particle structure 160 may have a characteristic dimension of no more than about 200 nm. In some non-limiting examples, the at least one particle structure 160 may have a characteristic diameter that may be at least one of between about: 1-200 nm, 1-160 nm, 1-100 nm, 1-50 nm, or 1-30 nm.

In some non-limiting examples, the at least one particle structure 160 may be, and/or comprise discrete metal plasmonic islands or clusters.

In some non-limiting examples, the at least one particle structure 160 may comprise a particle material.

In some non-limiting examples, the particle material may be the same and/or comprise at least one common metal as the deposited material 531. In some non-limiting examples, the particle material may be the same and/or comprise at least one common metal as the metallic material of the orientation layer 120. In some non-limiting examples, the particle material may be the same and/or comprise at least one common metal as the underlying layer.

In some non-limiting examples, such particle structures 160 may be formed by depositing a scant amount, in some non-limiting examples, having an average layer thickness that may be on the order of a few, or a fraction of an angstrom, of a particle material on an exposed layer surface 11 of the underlying layer. In some non-limiting examples, the exposed layer surface 11 may be of an NPC 720.

In some non-limiting examples, the particle material may comprise at least one of Ag, Yb, and/or Mg.

In some non-limiting examples, the particle material may comprise an element selected from at least one of: K, Na, Li, Ba, Cs, Yb, Ag, Au, Cu, Al, Mg, Zn, Cd, Sn, or Y. In some non-limiting examples, the element may comprise at least one of: K, Na, Li, Ba, Cs, Yb, Ag, Au, Cu, Al, or Mg. In some non-limiting examples, the element may comprise at least one of: Cu, Ag, or Au. In some non-limiting examples, the element may be Cu. In some non-limiting examples, the element may be Al. In some non-limiting examples, the element may comprise at least one of: Mg, Zn, Cd, or Yb. In some non-limiting examples, the element may comprise at least one of: Mg, Ag, Al, Yb, or Li. In some non-limiting examples, the element may comprise at least one of: Mg, Ag, or Yb. In some non-limiting examples, the element may comprise at least one of: Mg, or Ag. In some non-limiting examples, the element may be Ag.

In some non-limiting examples, the particle material may comprise a pure metal. In some non-limiting examples, the at least one particle structure 160 may be a pure metal. In some non-limiting examples, the at least one particle structure 160 may be at least one of: pure Ag or substantially pure Ag. In some non-limiting examples, the substantially pure Ag may have a purity of at least one of at least about: 95%, 99%, 99.9%, 99.99%, 99.999%, or 99.9995%. In some non-limiting examples, the at least one particle structure 160 may be at least one of: pure Mg or substantially pure Mg. In some non-limiting examples, the substantially pure Mg may have a purity of at least one of at least about: 95%, 99%, 99.9%, 99.99%, 99.999%, or 99.9995%.

In some non-limiting examples, the at least one particle structure 160 may comprise an alloy. In some non-limiting examples, the alloy may be at least one of: an Ag-containing alloy, an Mg-containing alloy, or an AgMg-containing alloy. In some non-limiting examples, the AgMg-containing alloy may have an alloy composition that may range from about 1:10 (Ag:Mg) to about 10:1 by volume.

In some non-limiting examples, the particle material may comprise other metals in place of, or in combination with Ag. In some non-limiting examples, the particle material may comprise an alloy of Ag with at least one other metal. In some non-limiting examples, the particle material may comprise an alloy of Ag with at least one of: Mg, or Yb. In some non-limiting examples, such alloy may be a binary alloy having a composition of between about: 5-95 vol. % Ag, with the remainder being the other metal. In some non-limiting examples, the particle material may comprise Ag and Mg. In some non-limiting examples, the particle material may comprise an Ag:Mg alloy having a composition of between about 1:10-10:1 by volume. In some non-limiting examples, the particle material may comprise Ag and Yb. In some non-limiting examples, the particle material may comprise a Yb:Ag alloy having a composition of between about 1:20-10:1 by volume. In some non-limiting examples, the particle material may comprise Mg and Yb. In some non-limiting examples, the particle material may comprise an Mg:Yb alloy. In some non-limiting examples, the particle material may comprise an Ag:Mg:Yb alloy.

In some non-limiting examples, the at least one particle structure 160 may comprise at least one additional element. In some non-limiting examples, such additional element may be a non-metallic element. In some non-limiting examples, the non-metallic material may be at least one of: O, S, N, or C. It will be appreciated by those having ordinary skill in the relevant art that, in some non-limiting examples, such additional element(s) may be incorporated into the at least one particle structure 160 as a contaminant, due to the presence of such additional element(s) in the source material, equipment used for deposition, and/or the vacuum chamber environment. In some non-limiting examples, such additional element(s) may form a compound together with other element(s) of the at least one particle structure 160. In some non-limiting examples, a concentration of the non-metallic element in the particle material may be at least one of no more than about: 1%, 0.1%, 0.01%, 0.001%, 0.0001%, 0.00001%, 0.000001%, or 0.0000001%. In some non-limiting examples, the at least one particle structure 160 may have a composition in which a combined amount of 0 and C therein is at least one of no more than about: 10%, 5%, 1%, 0.1%, 0.01%, 0.001%, 0.0001%, 0.00001%, 0.000001%, or 0.0000001%.

In some non-limiting examples, the characteristics of the at least one particle structure 160 may be assessed, in some non-limiting examples, according to at least one of several criteria, including without limitation, a characteristic size, length, width, diameter, height, size distribution, shape, configuration, surface coverage, deposited distribution, dispersity, and/or a presence, and/or extent of aggregation instances of the particle material, formed on a part of the exposed layer surface 11 of the underlying layer.

In some non-limiting examples, an assessment of the at least one particle structure 160 according to such at least one criterion, may be performed on, including without limitation, by measuring, and/or calculating, at least one attribute of the at least one particle structure 160, using a variety of imaging techniques, including without limitation, at least one of: transmission electron microscopy (TEM), atomic force microscopy (AFM), and/or scanning electron microscopy (SEM).

Those having ordinary skill in the relevant art will appreciate that such an assessment of the at least one particle structure 160 may depend, to a greater, and/or lesser extent, by the extent, of the exposed layer surface 11 under consideration, which in some non-limiting examples may comprise an area, and/or region thereof. In some non-limiting examples, the at least one particle structure 160 may be assessed across the entire extent, in a first lateral aspect, and/or a second lateral aspect that is substantially transverse thereto, of the exposed layer surface 11 of the underlying layer. In some non-limiting examples, the at least one particle structure 160 may be assessed across an extent that comprises at least one observation window applied against (a part of) the at least one particle structure 160.

In some non-limiting examples, the at least one observation window may be located at at least one of: a perimeter, interior location, and/or grid coordinate of the lateral aspect of the exposed layer surface 11. In some non-limiting examples, a plurality of the at least one observation windows may be used in assessing the at least one particle structure 160.

In some non-limiting examples, the observation window may correspond to a field of view of an imaging technique applied to assess the at least one particle structure 160, including without limitation, at least one of: TEM, AFM, and/or SEM. In some non-limiting examples, the observation window may correspond to a given level of magnification, including without limitation, at least one of: 2.00 μm, 1.00 μm, 500 nm, or 200 nm.

In some non-limiting examples, the assessment of the at least one particle structure 160, including without limitation, at least one observation window used, of the exposed layer surface 11 thereof, may involve calculating, and/or measuring, by any number of mechanisms, including without limitation, manual counting, and/or known estimation techniques, which may, in some non-limiting examples, may comprise curve, polygon, and/or shape fitting techniques.

In some non-limiting examples, the assessment of the at least one particle structure 160, including without limitation, at least one observation window used, of the exposed layer surface 11 thereof, may involve calculating, and/or measuring an average, median, mode, maximum, minimum, and/or other probabilistic, statistical, and/or data manipulation of a value of the calculation, and/or measurement.

In some non-limiting examples, one of the at least one criterion by which such at least one particle structure 160 may be assessed, may be a surface coverage of the particle material of such (part of the) at least one particle structure 160. In some non-limiting examples, the surface coverage may be represented by a (non-zero) percentage coverage by such particle material of such (part of) the at least one particle structure 160. In some non-limiting examples, the percentage coverage may be compared to a maximum threshold percentage coverage.

Those having ordinary skill in the relevant art will appreciate that in some non-limiting examples, surface coverage may be understood to encompass one or both of particle size, and deposited density. Thus, in some non-limiting examples, a plurality of these three criteria may be positively correlated. Indeed, in some non-limiting examples, a criterion of low surface coverage may comprise some combination of a criterion of low deposited density with a criterion of low particle size.

In some non-limiting examples, one of the at least one criterion by which such at least one particle structure 160 may be assessed, may be a characteristic size thereof.

In some non-limiting examples, the at least one particle structure 160 may have a characteristic size that is no more than a maximum threshold size. Non-limiting examples of the characteristic size may include at least one of: height, width, length, and/or diameter.

In some non-limiting examples, substantially all of the particle structures 160 may have a characteristic size that lies within a specified range.

In some non-limiting examples, such characteristic size may be characterized by a characteristic length, which in some non-limiting examples, may be considered a maximum value of the characteristic size. In some non-limiting examples, such maximum value may extend along a major axis of the particle structure 160. In some non-limiting examples, the major axis may be understood to be a first dimension extending in a plane defined by the plurality of lateral axes. In some non-limiting examples, a characteristic width may be identified as a value of the characteristic size of the particle structure 160 that may extend along a minor axis of the particle structure 160. In some non-limiting examples, the minor axis may be understood to be a second dimension extending in the same plane but substantially transverse to the major axis.

In some non-limiting examples, the characteristic length of the at least one particle structure 160, along the first dimension, may be no more than the maximum threshold size.

In some non-limiting examples, the characteristic width of the at least one particle structure 160, along the second dimension, may be no more than the maximum threshold size.

In some non-limiting examples, a size of the at least one particle structure 160 may be assessed by calculating, and/or measuring a characteristic size thereof, including without limitation, a mass, volume, length of a diameter, perimeter, major, and/or minor axis thereof.

In some non-limiting examples, one of the at least one criterion by which such at least one particle structure 160 may be assessed, may be a deposited density thereof.

In some non-limiting examples, the characteristic size of the at least one particle structure 160 may be compared to a maximum threshold size.

In some non-limiting examples, the deposited density of the at least one particle structure 160 may be compared to a maximum threshold deposited density.

In some non-limiting examples, at least one of such criteria may be quantified by a numerical metric. In some non-limiting examples, such a metric may be a calculation of a dispersity D that describes the distribution of particle (area) sizes of particle structures 160, in which:

$$D = \frac{\overline{S_s}}{\overline{S_n}} \tag{1}$$

where:

$$\overline{S_s} = \frac{\sum_{i=1}^{n} S_i^2}{\sum_{i=1}^{n} S_i}, \overline{S_n} = \frac{\sum_{i=1}^{n} S_i}{n}, \tag{2}$$

n is the number of particle structures 160 in a sample area, $S_i$ is the (area) size of the $i^{th}$ particle structure 160, $\overline{S}_n$ is the number average of the particle (area) sizes, and $\overline{S}_s$ is the (area) size average of the particle (area) sizes.

Those having ordinary skill in the relevant art will appreciate that the dispersity is roughly analogous to a polydispersity index (PDI) and that these averages are roughly analogous to the concepts of number average molecular weight and weight average molecular weight familiar in organic chemistry, but applied to an (area) size, as opposed to a molecular weight of a sample particle structure 160.

Those having ordinary skill in the relevant art will also appreciate that while the concept of dispersity may, in some non-limiting examples, be considered a three-dimensional volumetric concept, in some non-limiting examples, the dispersity may be considered to be a two-dimensional concept. As such, the concept of dispersity may be used in connection with viewing and analyzing two-dimensional images of the at least one particle structure 160, such as may be obtained by using a variety of imaging techniques, including without limitation, at least one of: TEM, AFM and/or SEM. It is in such a two-dimensional context, that the equations set out above are defined.

In some non-limiting examples, the dispersity and/or the number average of the particle (area) size and the (area) size average of the particle (area) size may involve a calculation of at least one of: the number average of the particle diameters and the (area) size average of the particle diameters:

$$\overline{d_n} = 2\sqrt{\frac{\overline{S_n}}{\pi}},\ \overline{d_s} = 2\sqrt{\frac{\overline{S_s}}{\pi}} \tag{3}$$

In some non-limiting examples, the particle material of the at least one particle structure 160 may be deposited by a mask-free and/or open mask deposition process.

In some non-limiting examples, the at least one particle structure 160 may have a substantially round shape. In some non-limiting examples, the at least one particle structure 160 may have a substantially spherical shape.

For purposes of simplification, in some non-limiting examples, it may be assumed that a longitudinal extent of each particle structure 160 may be substantially the same (and, in any event, may not be directly measured from a SEM image in plan) so that the (area) size of such particle structure 160 may be represented as a two-dimensional area coverage along the pair of lateral axes. In the present disclosure, a reference to an (area) size may be understood to refer to such two-dimensional concept, and to be differentiated from a size (without the prefix "area") that may be understood to refer to a one-dimensional concept, such as a linear dimension.

Indeed, in some early investigations, it appears that, in some non-limiting examples, the longitudinal extent, along the longitudinal axis, of such particle structures 160, may tend to be small relative to the lateral extent (along at least one of the lateral axes), such that the volumetric contribution of the longitudinal extent thereof may be much less than that of such lateral extent. In some non-limiting examples, this may be expressed by an aspect ratio (a ratio of a longitudinal extent to a lateral extent) that may be no more than 1. In some non-limiting examples, such aspect ratio may be at least one of no more than about: 0.1:10, 1:20, 1:50, 1:75, or 1:300.

In this regard, the assumption set out above (that the longitudinal extent is substantially the same and can be ignored) to represent the at least one particle structure 160 as a two-dimensional area coverage may be appropriate.

Those having ordinary skill in the relevant art will appreciate, having regard to the non-determinative nature of the deposition process, especially in the presence of defects, and/or anomalies on the exposed layer surface 11 of the underlying layer, including without limitation, heterogeneities, including without limitation, at least one of: a step edge, a chemical impurity, a bonding site, a kink, and/or a contaminant thereon, and consequently the formation of particle structures 160 thereon, the non-uniform nature of coalescence thereof as the deposition process continues, and in view of the uncertainty in the size, and/or position of observation windows, as well as the intricacies and variability inherent in the calculation, and/or measurement of their characteristic size, length, width, diameter, height, size distribution, shape, surface coverage, configuration, deposited density, dispersity, composition, degree of aggregation, and the like, there may be considerable variability in terms of the features, and/or topology within observation windows.

In the present disclosure, for purposes of simplicity of illustration, certain details of particle materials, including without limitation, thickness profiles, and/or edge profiles of layer(s) have been omitted.

In some non-limiting examples, the characteristic size of the particle structures 160 in (an observation window used) may reflect a statistical distribution.

In some non-limiting examples, an absorption spectrum intensity may tend to be proportional to a deposited density of the at least one particle structure 160, for a particular distribution of the characteristic size of thereof.

In some non-limiting examples, the characteristic size of the particle structures 160$_r$ in (an observation window used), may be concentrated about a single value, and/or in a relatively narrow range.

In some non-limiting examples, the characteristic size of the particle structures 160$_r$ in (an observation window used), may be concentrated about a plurality of values, and/or in a plurality of relatively narrow ranges. By way of non-limiting example, the at least one particle structure 160, may exhibit such multi-modal behavior in which there are a plurality of different values and/or ranges about which the characteristic size of the particle structures 160 in (an observation window used), may be concentrated.

In some non-limiting examples, the at least one particle structure 160 may comprise a first at least one particle structure 160$_1$, having a first range of characteristic sizes, and a second at least one particle structure 160$_2$, having a second range of characteristic sizes. In some non-limiting examples, the first range of characteristic sizes may correspond to sizes of no more than about 50 nm, and the second range of characteristic sizes may correspond to sizes of at least 50 nm. By way of non-limiting example, the first range of characteristic sizes may correspond to sizes of between about 1-49 nm and the second range of characteristic sizes may correspond to sizes of between about 50-300 nm. In some non-limiting examples, a majority of the first particle structures 160$_1$ may have a characteristic size in a range of at least one of between about: 10-40 nm, 5-30 nm, 10-30 nm, 15-35 nm, 20-35 nm, or 25-35 nm. In some non-limiting examples, a majority of the second particle structures 160$_2$ may have a characteristic size in a range of at least one of between about: 50-250 nm, 50-200 nm, 60-150 nm, 60-100 nm, or 60-90 nm. In some non-limiting examples, the first particle structures 160$_1$ and the second particle structures 160$_2$ may be interspersed with one another.

A series of five samples was fabricated to study the formation of such multi-modal particle structures 160. Each sample was prepared by depositing, on a glass substrate, an approximately 20 nm thick organic semiconducting layer 1230, followed by an approximately 34 nm thick Ag layer, followed by an approximately 30 nm thick patterning coating 130, then subjecting the surface of the patterning coating 130 to a vapor flux 532 of Ag. SEM images of each sample were taken at various magnifications.

Figure 8A:
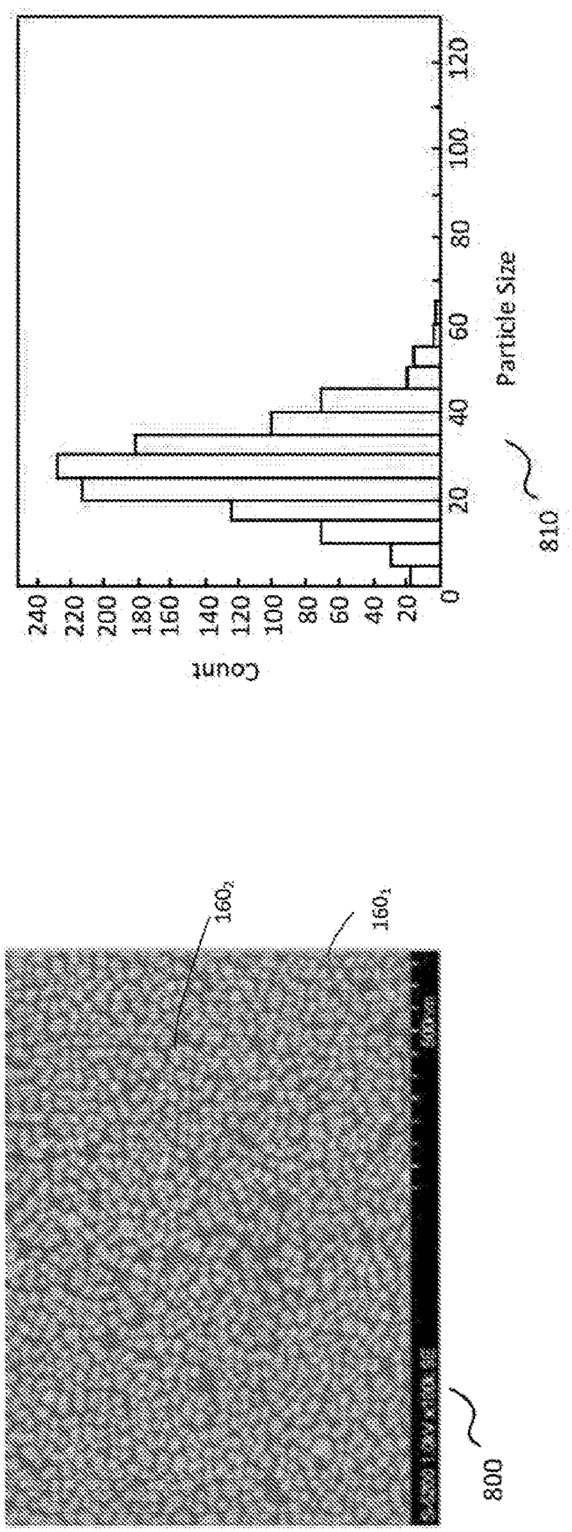
FIGS. 8A-8E each show multiple SEM images of example samples according to an example in the present disclosure, together with a plot of a distribution of a number of particles of various characteristic sizes therein.

FIG. 8A shows a SEM image 800 of a first sample and a further SEM image 805 at increased magnification. As may be seen from the image 800, there are a number of first particle structures 160$_1$ that may tend to be concentrated about a first, small, characteristic size, and a smaller number of second particle structures 160$_2$ that may tend to be concentrated about a second, larger, characteristic size. A plot 810, of a count of particle structures 160$_r$ as a function of characteristic particle size, may show that a majority of the first particle structures $160_1$ may be concentrated around about 30 nm. Analysis shows that a surface coverage of the observation window of the image 800, of the first particle structures $160_1$ having a characteristic size that is no more than about 50 nm was about 38%, whereas a surface coverage of the observation window of the image 800, of the second particle structures $160_2$, having a characteristic size that is at least about 50 nm was about 1%.

Figure 8B:
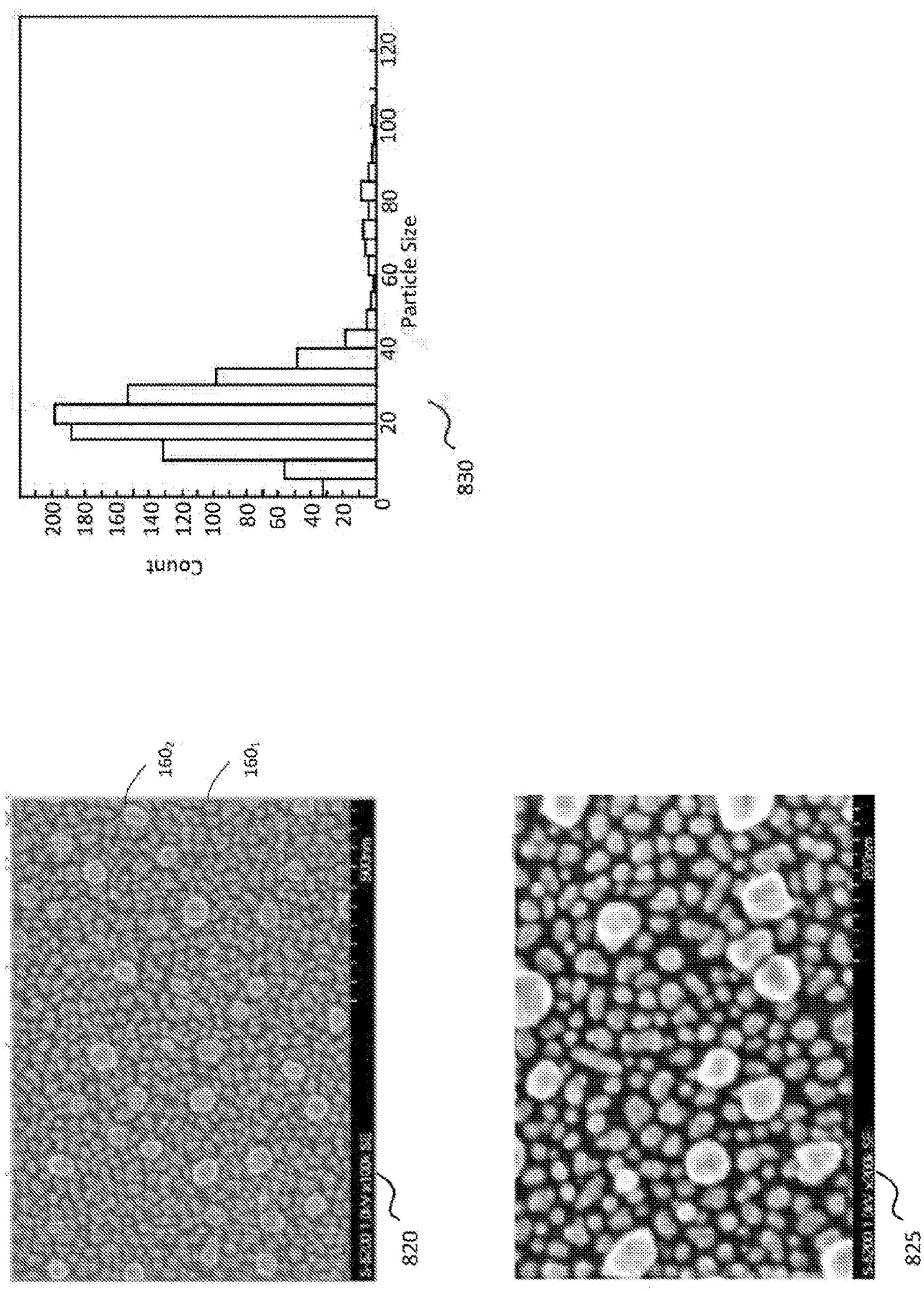

FIG. 8B shows a SEM image 820 of a second sample and a further SEM image 825 at increased magnification. As may be seen from the image 820, while there continue to be a number of first particle structures $160_1$ that may tend to be concentrated about the first characteristic size, a number of second particle structures $160_2$ that may tend to be concentrated about the second characteristic size may be greater. Further, such second particle structures $160_2$ may tend to be more noticeable. A plot 830, of a count of particle structures $160_t$ as a function of characteristic particle size, may show two discernible peaks, a large peak of first particle structures $160_1$ concentrated around about 30 nm and a smaller peak of second particle structures $160_2$ concentrated around about 75 nm. Analysis shows that a surface coverage of the observation window of the image 820, of the first particle structures $160_1$ having a characteristic size that is no more than about 50 nm was about 23%, whereas a surface coverage of the observation window of the image 820, of the second particle structures $160_2$ having a characteristic size that is at least about 50 nm was about 10%.

Figure 8C:
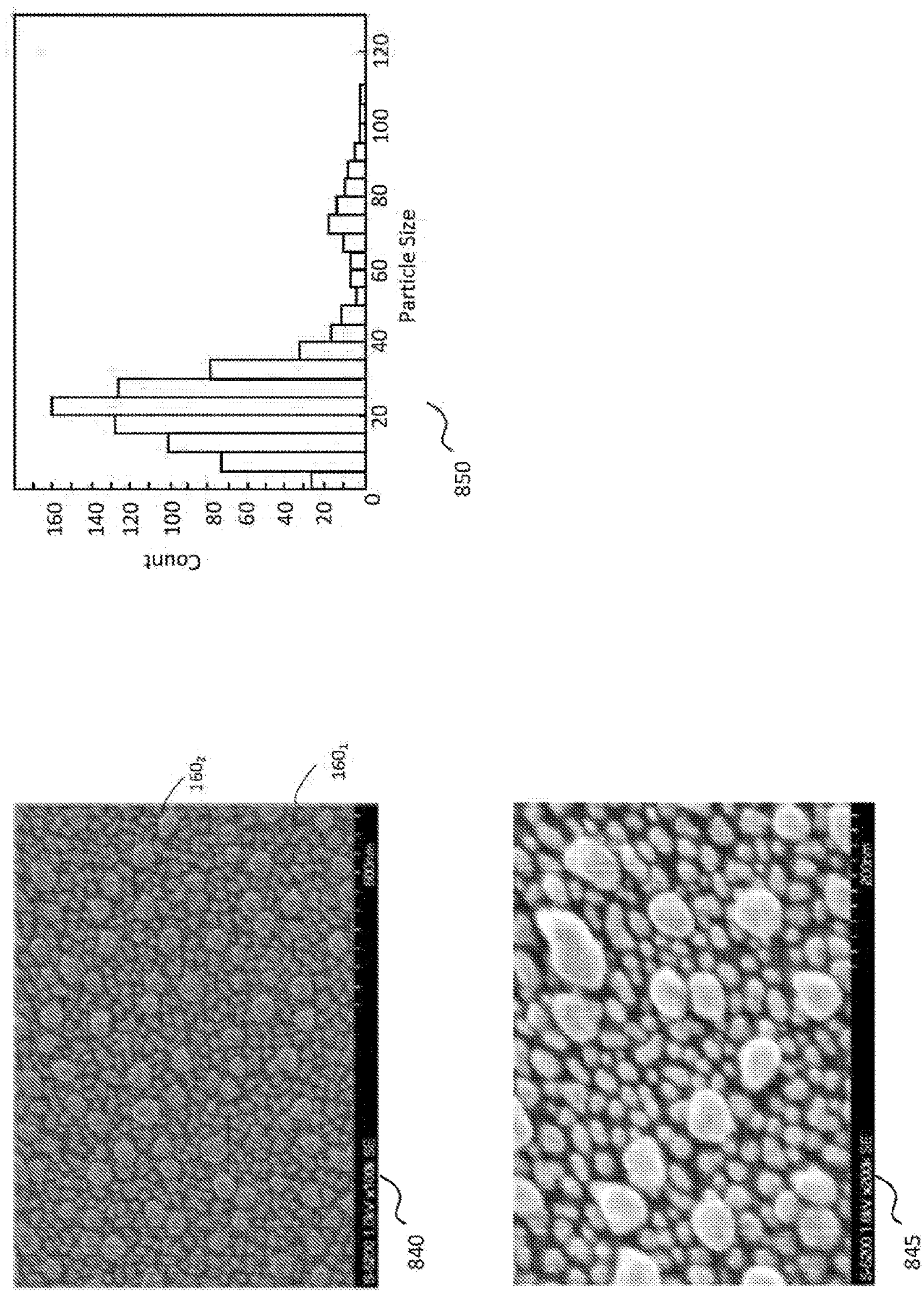

FIG. 8C shows a SEM image 840 of a third sample and a further SEM image 845 at increased magnification. As may be seen from the image 840, while there continue to be a number of first particle structures $160_1$ that may tend to be concentrated about the first characteristic size, a number of second particle structures $160_2$ that may tend to be concentrated about the second characteristic size may be even greater than in the second sample A plot 850, of a count of particle structures $160_t$ as a function of characteristic particle size, may show two discernible peaks, a large peak of first particle structures $160_1$ concentrated around about 30 nm, and a smaller (but larger than shown in the plot 830) peak of second particle structures $160_2$ concentrated around about 75 nm. Analysis shows that a surface coverage of the observation window of the image 840, of the first particle structures $160_1$ having a characteristic size that is no more than about 50 nm was about 19%, whereas a surface coverage of the observation window of the image 840, of the second particle structures $160_2$ having a characteristic size that is at least about 50 nm was about 21%.

Figure 8D:
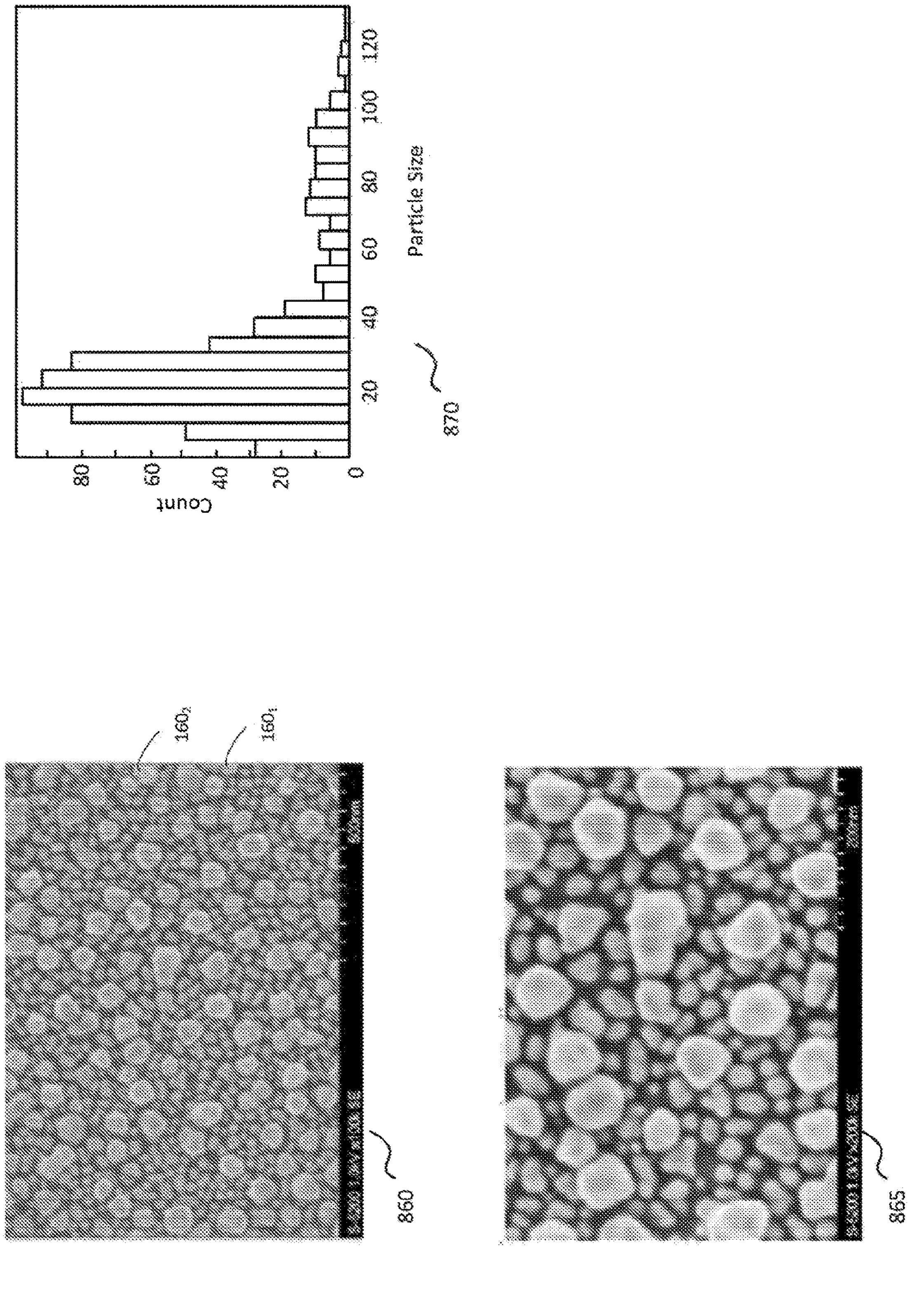

FIG. 8D shows a SEM image 860 of a fourth sample and a further SEM image 865 at increased magnification. As may be seen from the image 860, while there continue to be a number of first particle structures $160_1$ that may tend to be concentrated about the first characteristic size, a number of second particle structures $160_2$ that may tend to be concentrated about the second characteristic size may be greater. A plot 870, of a count of particle structures $160_t$ as a function of characteristic particle size, may show two discernible peaks, a large peak of first particle structures $160_1$ concentrated around about 20 nm and a smaller peak of second particle structures $160_2$ concentrated around about 85 nm. Analysis shows that a surface coverage of the observation window of the image 860, of the first particle structures $160_1$ having a characteristic size that is no more than about 50 nm was about 14%, whereas a surface coverage of the observation window of the image 860, of the second particle structures $160_2$ having a characteristic size that is at least about 50 nm was about 34%.

Figure 8E:
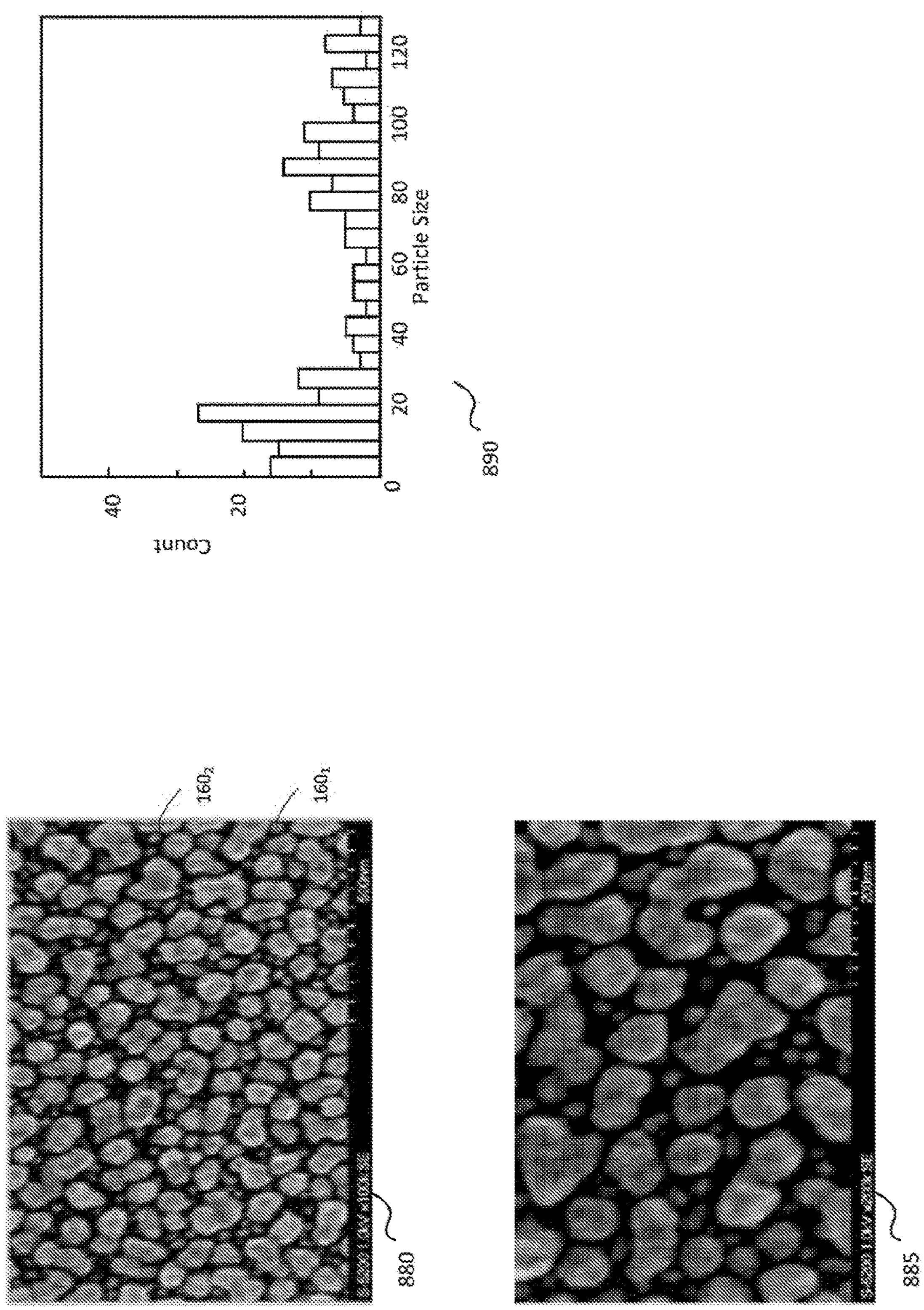

FIG. 8E shows a SEM image 880 of a fifth sample and a further SEM image 885 at increased magnification. As may be seen from the image 880, while there continue to be a number of first particle structures $160_1$ that may tend to be concentrated about the first characteristic size, a number of second particle structures $160_2$ that may tend to be concentrated about the second characteristic size may be greater. Indeed, the second particle structures $160_2$ may tend to predominate. A plot 890 of a count of particle structures $160_t$ as a function of characteristic particle size, shows two discernible peaks, a large peak of first particle structures $160_1$ concentrated around about 15 nm and a smaller peak of second particle structures $160_2$ concentrated about around 85 nm. Analysis shows that a surface coverage of the observation window of the image 880, of the first particle structures $160_1$ having a characteristic size that is no more than about 50 nm was about 3%, whereas a surface coverage of the observation window of the image 880, of the second particle structure $160_2$ having a characteristic size that is at least about 50 nm was about 55%.

Without wishing to be limited to any particular theory, it may be postulated that, in some non-limiting examples, such multi-modal behaviour of the at least one particle structure 160 may be produced by introducing a plurality of nucleation sites for the particle material, including without limitation, by doping, covering, and/or supplementing a patterning material 411 with another material that may act as a seed or heterogeneity that may act as such a nucleation site. In some non-limiting examples, it may be postulated that first particle structures $160_1$ of the first characteristic size may tend to form on a particle structure patterning coating $130_p$ where there may be substantially no such nucleation sites, and that second particle structures $160_2$ of the second characteristic size may tend to form at the locations of such nucleation sites.

Those having ordinary skill in the relevant art will appreciate that there may be other mechanisms by which such multi-modal behaviours may be produced.

Those having ordinary skill in the relevant art will appreciate, having regard to the non-determinative nature of the deposition process, especially in the presence of defects, and/or anomalies on the exposed layer surface 11 of the underlying layer, including without limitation, heterogeneities, including without limitation, at least one of: a step edge, a chemical impurity, a bonding site, a kink, and/or a contaminant thereon, and consequently the formation of particle structures 160 thereon, the non-uniform nature of coalescence thereof as the deposition process continues, and in view of the uncertainty in the size, and/or position of observation windows, as well as the intricacies and variability inherent in the calculation, and/or measurement of their characteristic size, length, width, diameter, height, size distribution, shape, surface coverage, configuration, deposited density, dispersity, composition, degree of aggregation, and the like, there may be considerable variability in terms of the features, and/or topology within observation windows.

In some non-limiting examples, the layer (or level) within the layers of the device 100, a portion 101, 102 of the lateral aspect of the device 100, and/or the characteristic size, length, width, diameter, height, size distribution, shape, surface coverage, configuration, deposited density, dispersity, and/or composition of the particle structures 160 deposited therein or thereon, may be controllably selected, at least in part, by causing the particle material to come into contact with a contact material, whose properties may impact the formation of particle structures 160. Such contact materials include without limitation, seed material, patterning material 411 and co-deposited dielectric material.

In some non-limiting examples, the contact material used may determine how the particle material may come into contact therewith, and the impact imparted thereby on the formation of the particle structures 160. In some non-limiting examples, a plurality of different contact materials and a concomitant variety of mechanisms may be employed.

In some non-limiting examples, the at least one particle structure 160 may be disposed in a pattern that may be defined by at least one region therein that is substantially devoid of the at least one particle structure 160.

In the present disclosure, for purposes of simplicity of illustration, certain details of particle materials, including without limitation, thickness profiles, and/or edge profiles of layer(s) have been omitted.

Seeds

In some non-limiting examples, the location, size, height, weight, thickness, shape, profile, and/or spacing of the particle structures 160 may be, to a greater or lesser extent, specified by depositing seed material, in a templating layer at appropriate locations and/or at an appropriate density and/or stage of deposition. In some non-limiting examples, such seed material may act as a seed 161 or heterogeneity, to act as a nucleation site such that particle material may tend to coalesce around each seed 161 to form the particle structures 160.

Thus, as shown in the inset region shown in dashed outline in FIG. 1, the particle material may be in physical contact with the seed material, and indeed, may fully surround and/or encapsulate it.

In some non-limiting examples, the seed material may comprise a metal, including without limitation, Yb or Ag. In some non-limiting examples, the seed material may have a high wetting property with respect to the particle material deposited thereon and coalescing thereto.

In some non-limiting examples, the seeds 161 may be deposited in the templating layer, across the exposed layer surface 11 of the underlying layer of the device 100, in some non-limiting examples, using an open mask and/or a mask-free deposition process, of the seed material.

Co-Deposition with Dielectric Material

Although not shown, in some non-limiting examples, the at least one particle structure 160 may be formed without the use of seeds 161, including without limitation, by co-depositing the particle material with a co-deposited dielectric material.

Thus, the particle material may be in physical contact with the co-deposited dielectric material, and indeed, may be intermingled with it.

In some non-limiting examples, a ratio of the particle material to the co-deposited dielectric material may be in a range of at least one of between about: 50:1-5:1, 30:1-5:1, or 20:1-10:1. In some non-limiting examples, the ratio may be at least one of about: 50:1, 45:1, 40:1, 35:1, 30:1, 25:1, 20:1, 19:1, 15:1, 12.5:1, 10:1, 7.5:1, or 5:1.

In some non-limiting examples, the co-deposited dielectric material may have an initial sticking probability, against the deposition of the particle material with which it may be co-deposited, that may be less than 1.

In some non-limiting examples, a ratio of the particle material to the co-deposited dielectric material may vary depending upon the initial sticking probability of the co-deposited dielectric material against the deposition of the particle material.

In some non-limiting examples, the co-deposited dielectric material may be an organic material. In some non-limiting examples, the co-deposited dielectric material may be a semiconductor. In some non-limiting examples, the co-deposited dielectric material may be an organic semiconductor.

In some non-limiting examples, co-depositing the particle material with the co-deposited dielectric material may facilitate formation of at least one particle structure 160 in the absence of a templating layer comprising the seeds 161.

In some non-limiting examples, co-depositing the particle material with the co-deposited dielectric material may facilitate and/or increase absorption, by the at least one particle structure 160, of EM radiation generally, or in some non-limiting examples, in a wavelength (sub-) range of the EM spectrum, including without limitation, the visible spectrum, and/or a sub-range and/or wavelength thereof, including without limitation, corresponding to a specific colour.

Particle Structure Patterning Coating

In some non-limiting examples, the at least one particle structure 160 may comprise at least one particle structure $160_t$ deposited on the exposed layer surface 11 of a particle structure patterning coating $130_p$, for purposes of depositing the at least one particle structure $160_t$, including without limitation, using a mask-free and/or open mask deposition process.

In some non-limiting examples, at least one of the particle structures $160_t$ may be in physical contact with an exposed layer surface 11 of the particle structure patterning coating $130_p$. In some non-limiting examples, substantially all of the particle structures $160_t$ may be in physical contact with the exposed layer surface 11 of the particle structure patterning coating $130_p$.

In some non-limiting examples, the at least one particle structure $160_t$ may be deposited in a pattern across the lateral extent of the particle structure patterning coating $130_p$.

In some non-limiting examples, the at least one particle structure $160_t$ may be deposited in a discontinuous layer 170 on an exposed layer surface 11 of the particle structure patterning coating $130_p$. In some non-limiting examples, the discontinuous layer 170 extends across substantially the entire lateral extent of the particle structure patterning coating $130_p$.

In some non-limiting examples, the particle structures $160_t$ in at least a central part of the discontinuous layer 170 may have at least one common characteristic selected from at least one of: a size, length, width, diameter, height, size distribution, shape, surface coverage, configuration, deposition density, dispersity, material, degree of aggregation, or other property, thereof.

In some non-limiting examples, the particle structures $160_t$ beyond such central part of the discontinuous layer 170 may exhibit characteristics that may be different from the at least one common characteristic having regard to edge effects, including without limitation, the proximity of a deposited layer 140, an increased presence of small apertures, including without limitation, pin-holes, tears, and/or cracks beyond such central part, or a reduced thickness of the particle structure patterning coating $130_p$ beyond such central part.

In some non-limiting examples, the deposition of the particle structure patterning coating $130_p$ may be limited to a first portion 101 of the lateral aspect of the device 100, by the interposition of a shadow mask 415, between the exposed layer surface 11 of an underlying layer and a patterning material 411 of which the particle structure patterning coating $130_p$ may be comprised.

After selective deposition of the particle structure patterning coating $130_p$ in the first portion 101, particle material may be deposited over the device 100, in some non-limiting examples, across both the first portion 101, and a second portion 102 which is substantially devoid of the particle structure patterning coating $130_p$, in some non-limiting examples, using an open mask and/or a mask-free deposition process, as, and/or to form, particle structures $160_t$ in the first portion 101, including without limitation, by coalescing around respective seeds 161, if any, that are not covered by the particle structure patterning coating $130_p$. In some non-limiting examples, the second portion 102 may be substantially devoid of any particle structures $160_t$.

Those having ordinary skill in the relevant art will appreciate that since the at least one particle structure $160_t$ is deposited on the exposed layer surface 11 of the particle structure patterning coating $130_p$, it may be considered that the particle structure patterning coating $130_p$ itself is the underlying layer. However, for purposes of simplicity of description, and given that the prior deposition of the particle structure patterning coating $130_p$ on the underlying layer may facilitate the controllable deposition of the at least one particle structure $160_t$ thereon as described herein, in the present disclosure, such particle structure patterning coating $130_p$ is not considered to be the underlying layer, but rather an adjunct to formation of the at least one particle structure $160_t$. Similarly, in the present disclosure, the orientation layer 120 is not considered to be the underlying layer, but rather an adjunct to formation of the at least one particle structure $160_t$.

The particle structure patterning coating $130_p$ may provide a surface with a relatively low initial sticking probability against the deposition of the particle material, that may be substantially less than an initial sticking probability against the deposition of the particle material, of the exposed layer surface 11 of the underlying layer of the device 100.

Thus, the exposed layer surface 11 of the underlying layer may be substantially devoid of a closed coating 150 of the particle material, in either the first portion 101 or the second portion 102, while forming at least one particle structure $160_t$ on the exposed layer surface 11 of the underlying layer in the first portion 101 including without limitation, by coalescing around the seeds 161 not covered by the particle structure patterning coating $130_p$.

In this fashion, the particle structure patterning coating $130_p$ may be selectively deposited, including without limitation, using a shadow mask 415, to allow the particle material to be deposited, including without limitation, using an open mask and/or a mask-free deposition process, so as to form particle structures $160_t$, including without limitation, by coalescing around respective seeds 161.

In some non-limiting examples, the particle structure patterning coating $130_p$ may comprise a patterning material that exhibits a relatively low initial sticking probability with respect to the seed material and/or the particle material such that the surface of such particle structure patterning coating $130_p$ may exhibit an increased propensity to cause the particle material (and/or the seed material) to be deposited as particle structures $160_t$, in some examples, relative to a non-particle structure patterning coating $130_n$ and/or patterning materials 411 of which they may be comprised, used for purposes of inhibiting deposition of a closed coating 150 of the particle material, including the applications discussed herein, other than the formation of the at least one particle structure $160_t$.

Without wishing to be limited to any particular theory, it may be postulated that, while the formation of a closed coating 150 of the particle material thereon may be substantially inhibited on the particle structure patterning coating $130_p$, in some non-limiting examples, when the particle structure patterning coating $130_p$ is exposed to deposition of the particle material, some vapor monomers of the particle material may ultimately form at least one particle structure $160_t$ of the particle material thereon.

Such at least one particle structure $160_t$ may, in some non-limiting examples, thus comprise a thin disperse layer of particle material, inserted at, and substantially across the lateral extent of, an interface between the particle structure patterning coating $130_p$ and the overlying layer 180.

In some non-limiting examples, the particle structure patterning coating $130_p$, and/or the patterning material 411, in some non-limiting examples, when deposited as a film, and/or coating in a form, and under similar circumstances to the deposition of the particle structure patterning coating $130_p$ within the device 100, may have a first surface energy that may be no more than a second surface energy of the particle material in some non-limiting examples, when deposited as a film, and/or coating in a form, and under similar circumstances to the deposition of the at least one particle structure $160_t$, within the device 100.

In some non-limiting examples, a quotient of the second surface energy/the first surface energy may be at least one of at least about: 1, 5, 10, or 20.

In some non-limiting examples, a surface coverage of an area of the particle structure patterning coating $130_p$ by the at least one particle structures $160_t$ deposited thereon, may be no more than a maximum threshold percentage coverage.

FIGS. 9A-9H illustrate non-limiting examples of possible interactions between the particle structure patterning coating $130_p$ and the at least one particle structure $160_t$ in contact therewith.

Thus, as shown in FIGS. 9A-9H, the particle material may be in physical contact with the patterning material 411, including without limitation, as shown in the various figures, being deposited thereon and/or being substantially surrounded thereby.

Figure 9B:
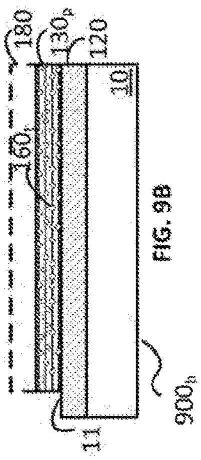
FIGS. 9A-9H are simplified block diagrams from a cross-sectional aspect, of example versions of the device of FIG. 1, showing various examples of possible interactions between the particle structure patterning coating and the particle structures according to examples in the present disclosure.
Figure 9D:
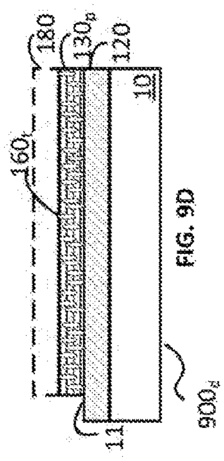
Figure 9F:
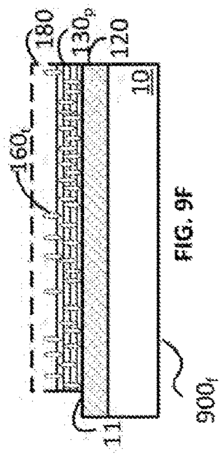
Figure 9H:
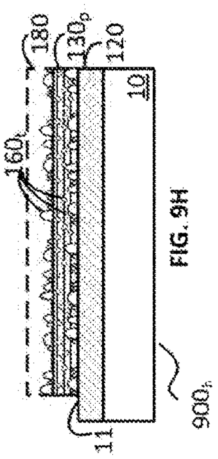
Figure 9A:
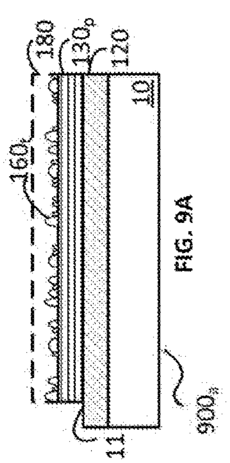

In FIG. 9A, the particle material may be in physical contact with the particle structure patterning coating $130_p$ in that it is deposited thereon.

In FIG. 9B, the particle material may be substantially surrounded by the particle structure patterning coating $130_p$. In some non-limiting examples, the at least one particle structure 160 may be distributed throughout at least one of the lateral and longitudinal extent of the particle structure patterning coating $130_p$.

In some non-limiting examples, the distribution of the at least one particle structure $160_t$ throughout the particle structure patterning coating $130_p$ may be achieved by causing the particle structure patterning coating $130_p$ to be deposited and/or to remain in a relatively viscous state at the time of deposition of the particle material thereon, such that the at least one particle structure $160_t$ may tend to penetrate and/or settle within the particle structure patterning coating $130_p$.

In some non-limiting examples, the viscous state of the particle structure patterning coating $130_p$ may be achieved in a number of manners, including without limitation, conditions during deposition of the patterning material 411, including without limitation, a time, temperature, and/or pressure of the deposition environment thereof, a composition of the patterning material 411, a characteristic of the patterning material 411, including without limitation, a melting point, a freezing temperature, a sublimation temperature, a viscosity, or a surface energy thereof, conditions during deposition of the particle material, including without limitation, a time, temperature, and/or pressure of the deposition environment thereof, a composition of the particle material, or a characteristic of the particle material, including without limitation, a melting point, a freezing temperature, a sublimation temperature, a viscosity, or a surface energy thereof.

In some non-limiting examples, the distribution of the at least one particle structure 160$_t$ throughout the particle structure patterning coating 130$_p$ may be achieved through the presence of small apertures, including without limitation, pin-holes, tears, and/or cracks, therein. Those having ordinary skill in the relevant art will appreciate that such apertures may be formed during the deposition of a thin film of the patterning structure patterning coating 130$_p$, using various techniques and processes, including without limitation, those described herein, due to inherent variability in the deposition process, and in some non-limiting examples, to the existence of impurities in at least one of the particle material and the exposed layer surface 11 of the patterning material 411.

Figure 9C:
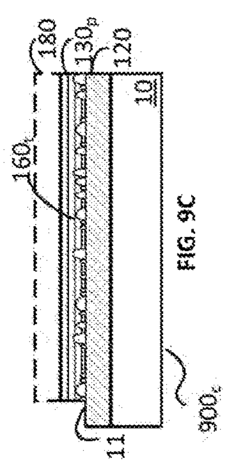

In FIG. 9C, the particle material of which the at least one particle structure 160$_t$ may be comprised may settle at a bottom of the particle structure patterning coating 130$_p$ such that it is effectively disposed on the exposed layer surface 11 of the underlying layer 11.

In some non-limiting examples, the distribution of the at least one particle structure 160$_t$ at a bottom of the particle structure patterning coating 130$_p$ may be achieved by causing the particle structure patterning coating 130$_p$ to be deposited and/or to remain in a relatively viscous state at the time of deposition of the particle material thereon, such that the at least one particle structure 160$_t$ may tend to settle to the bottom of the particle structure patterning coating 130$_p$. In some non-limiting examples, the viscosity of the patterning material 411 used in FIG. 9C may be less than the viscosity of the patterning material 411 used in FIG. 9B, allowing the at least one particle structure 160$_t$ to settle further within the particle structure patterning coating 130$_p$, eventually descending to the bottom thereof.

Figure 9E:
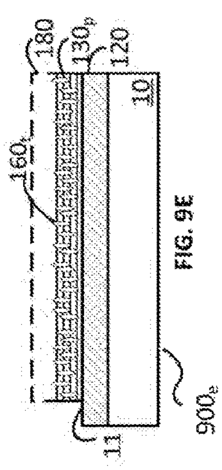

In FIGS. 9D-9F, a shape of the at least one particle structure 160$_t$ is shown as being longitudinally elongated relative to a shape of the at least one particle structure 160$_t$ of FIG. 9B.

In some non-limiting examples, the longitudinally elongated shape of the at least one particle structure 160$_t$ may be achieved in a number of manners, including without limitation, conditions during deposition of the patterning material 411, including without limitation, a time, temperature, and/or pressure of the deposition environment thereof, a composition of the patterning material 411, a characteristic of the patterning material 411, including without limitation, a melting point, a freezing temperature, a sublimation temperature, a viscosity, or a surface energy thereof, conditions during deposition of the particle material, including without limitation, a time, temperature, and/or pressure of the deposition environment thereof, a composition of the particle material, or a characteristic of the particle material, including without limitation, a melting point, a freezing temperature, a sublimation temperature, a viscosity, or a surface energy thereof, that may tend to facilitate the deposition of such longitudinally elongated particle structures 160$_t$.

In FIG. 9D, the longitudinally elongated particle structures 160$_t$ are shown to remain substantially entirely within the particle structure patterning coating 130$_p$. By contrast, in FIG. 9E, at least one of the longitudinally elongated particle structures 160$_t$ may be shown to protrude at least partially beyond the exposed layer surface 11 of the particle structure patterning coating 130$_p$. Further, in FIG. 9F, at least one of the longitudinally elongated particle structures 160$_t$ may be shown to protrude substantially beyond the exposed layer surface 11 of the particle structure patterning coating 130$_p$, to the extent that such protruding particle structures 160$_t$ may begin to be considered to be substantially deposited on the exposed layer surface 11 of the particle structure patterning coating 130$_p$.

Figure 9G:
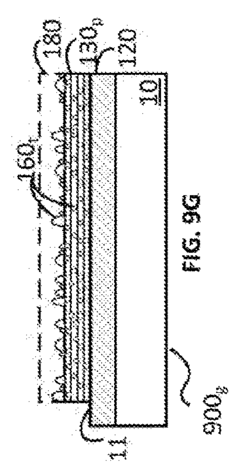

Thus, as shown in FIG. 9G, there may be a scenario in which at least one particle structure 160$_t$ may be deposited on the exposed layer surface 11 of the particle structure patterning coating 130$_p$ and at least one particle structure 160$_t$ may penetrate and/or settle within the particle structure patterning coating 130$_p$. Although the at least one particle structure 160$_t$ shown within the particle structure patterning coating 130$_p$ is shown as having a shape such as is shown in FIG. 9B, those having ordinary skill in the relevant art will appreciate that, although not shown, such particle structures 160$_t$ may have a longitudinally elongated shape such as is shown in FIGS. 9D-9F.

Further, FIG. 9H shows a scenario in which at least one particle structure 160$_t$ may be deposited on the exposed layer surface 11 of the particle structure patterning coating 130$_p$, at least one particle structure 160$_t$ may penetrate and/or settle within the particle structure patterning coating 130$_p$, and at least one particle structure 160$_t$ may settle to the bottom of the particle structure patterning coating 130$_p$.

Figure 10:
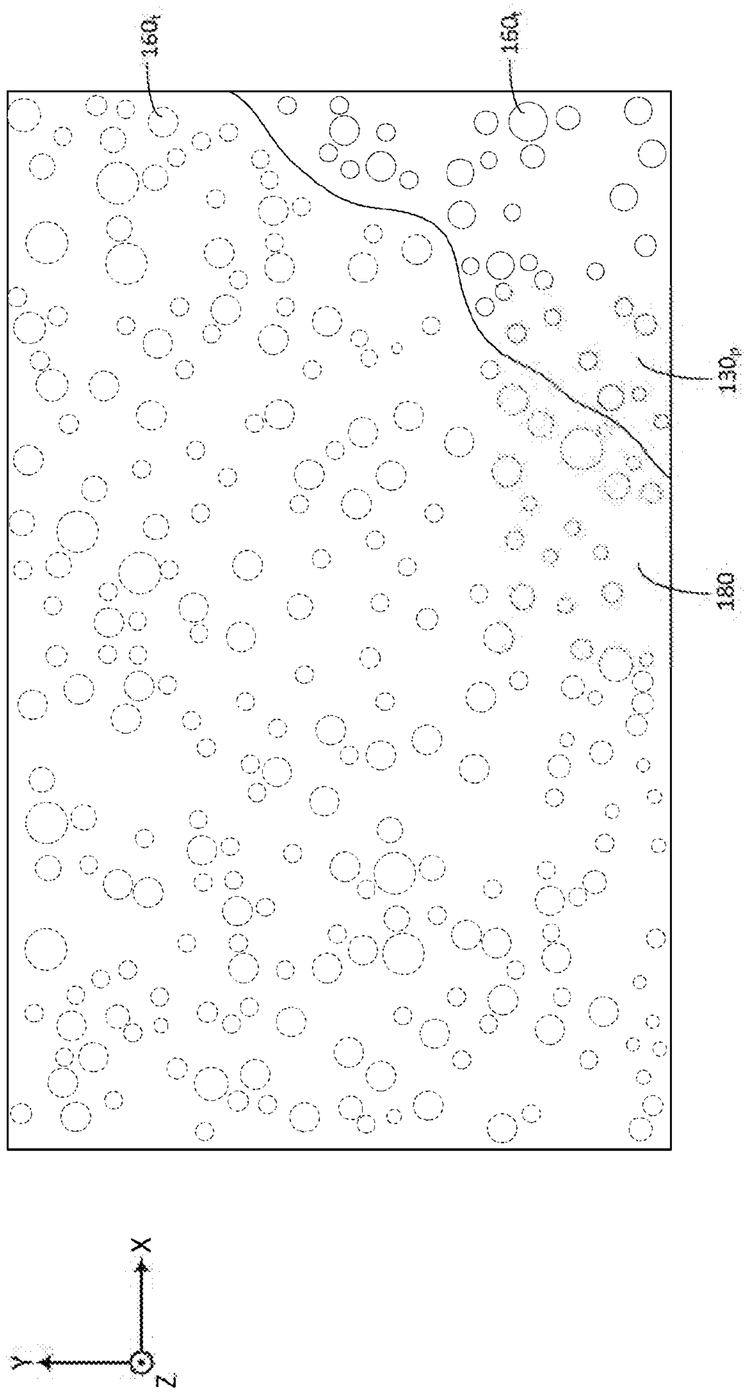
FIG. 10 is an example schematic diagram illustrating, in plan, partially cut-away, the device of FIG. 1, including the particle structure patterning coating underlying at least one particle structure; and a overlying layer deposited thereover according to an example in the present disclosure.

FIG. 10 is a simplified partially cut-away diagram in plan of the first portion 101 of the device 100. While some parts of the device 100 have been omitted from FIG. 10 for purposes of simplicity of illustration, it will be appreciated that various features described with respect thereto may be combined with those of no-limiting examples, provided therein.

In the figure, a pair of lateral axes, identified as the X-axis and Y-axis respectively, which in some non-limiting examples may be substantially transverse to one another, may be shown. At least one of these lateral axes may define a lateral aspect of the device 100.

In FIG. 10, the overlying layer 180 may, in some non-limiting examples, substantially extend across the at least one particle structure 160$_t$. To the extent that any part of the exposed layer surface 11 of the particle structure patterning coating 130$_p$, on which the at least one particle structure 160$_t$ is disposed, is substantially devoid of particle material, including by way of non-limiting example, in gaps between the at least one particle structure(s) 160$_t$, the overlying layer 180 may extend substantially across and be disposed on the exposed layer surface 11 of such particle structure patterning coating 130$_p$.

In some non-limiting examples, the particle structure patterning coating 130$_p$ may comprise a plurality of materials, wherein at least one material thereof is a patterning material 411, including without limitation, a patterning material 411 that exhibits such a relatively low initial sticking probability with respect to the particle material and/or the seed material as discussed above.

In some non-limiting examples, a first one of the plurality of materials may be a patterning material 411 that has a first initial sticking probability against deposition of the particle material and/or the seed material and a second one of the plurality of materials may be a patterning material 411 that has a second initial sticking probability against deposition of the particle material and/or the seed material, wherein the second initial sticking probability exceeds the first initial sticking probability.

In some non-limiting examples, the first initial sticking probability and the second initial sticking probability may be measured using substantially identical conditions and parameters.

In some non-limiting examples, the first one of the plurality of materials may be doped, covered, and/or supplemented with the second one of the plurality of materials, such that the second material may act as a seed or heterogeneity, to act as a nucleation site for the particle material and/or the seed material.

In some non-limiting examples, the second one of the plurality of materials may comprise an NPC 720. In some non-limiting examples, the second one of the plurality of materials may comprise an organic material, including without limitation, a polycyclic aromatic compound, and/or a material comprising a non-metallic element including without limitation, O, S, N, or C, whose presence might otherwise be considered to be a contaminant in the source material, equipment used for deposition, and/or the vacuum chamber environment. In some non-limiting examples, the second one of the plurality of materials may be deposited in a layer thickness that is a fraction of a monolayer, to avoid forming a closed coating 150 thereof. Rather, the monomers of such material may tend to be spaced apart in the lateral aspect so as to form discrete nucleation sites for the particle material and/or seed material.

A series of samples was fabricated to evaluate the suitability of at least one particle structure 160 formed by a particle structure patterning coating $\mathbf{130}_p$ comprising a mixture of a first patterning material $\mathbf{411}_1$ and a second patterning material $\mathbf{411}_2$. In all the samples, the first patterning material $\mathbf{411}_1$ was an NIC having a substantially low initial sticking probability against the deposition of Ag as a particle material. Three example materials were evaluated as the second patterning material $\mathbf{411}_2$, namely an ETL 1637 material, Liq, which tends to have a relatively high initial sticking probability against the deposition of Ag as a material and may be suitable, in some non-limiting examples, as an NPC 720, and LiF.

For the ETL 1637 material, a number of samples were prepared by co-depositing the first patterning material $\mathbf{411}_1$ and the ETL 1637 material in varying ratios, to an average layer thickness of 20 nm on an ITO substrate 10 and thereafter exposing the exposed layer surface 11 thereof to a vapor flux 532 of Ag to a reference layer thickness of 15 nm.

Six samples were prepared, where the ratios of the ETL 1637 material to the first patterning material $\mathbf{411}_1$ by % volume were respectively 1:99 (ETL Sample A), 2:98 (ETL Sample B), 5:95 (ETL Sample C), 10:90 (ETL Sample D), 20:80 (ETL Sample E), and 40:60 (ETL Sample F). Additionally, two comparative samples were prepared, where the ratios of the ETL 1637 material to the first patterning material $\mathbf{411}_1$ by % volume were respectively 0:100 (Comparative Sample 1) and 100:0 (Comparative Sample 2).

ETL Sample B exhibited a total surface coverage of 15.156%, a mean characteristic size of 13.6292 nm, a dispersity of 2.0462, a number average of the particle diameters of 14.5399 nm, and a size average of the particle diameters of 20.7989 nm.

ETL Sample C exhibited a total surface coverage of 22.083%, a mean characteristic size of 16.6985 nm, a dispersity of 1.6813, a number average of the particle diameters of 17.8372 nm, and a size average of the particle diameters of 23.1283 nm.

ETL Sample D exhibited a total surface coverage of 27.0626%, a mean characteristic size of 19.4518 nm, a dispersity of 1.5521, a number average of the particle diameters of 20.7487 nm, and a size average of the particle diameters of 25.8493 nm.

ETL Sample E exhibited a total surface coverage of 35.5376%, a mean characteristic size of 24.2092 nm, a dispersity of 1.6311, a number average of the particle diameters of 25.858 nm, and a size average of the particle diameters of 32.9858 nm.

FIGS. 11A-11E are respectively SEM micrographs of Comparative Sample 1, ETL Sample B, ETL Sample C, ETL Sample D, and ETL Sample E.

Figure 11A:
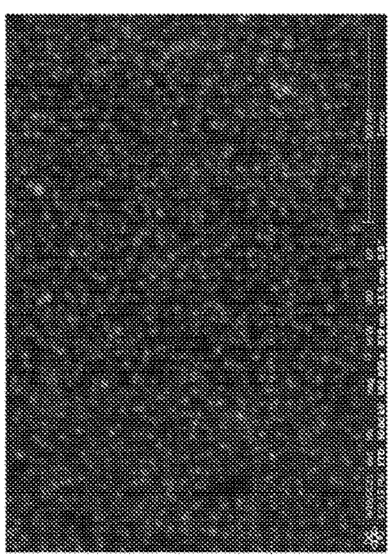
FIGS. 11A-11E are SEM micrographs of samples fabricated in examples of the present disclosure.
Figure 11B:
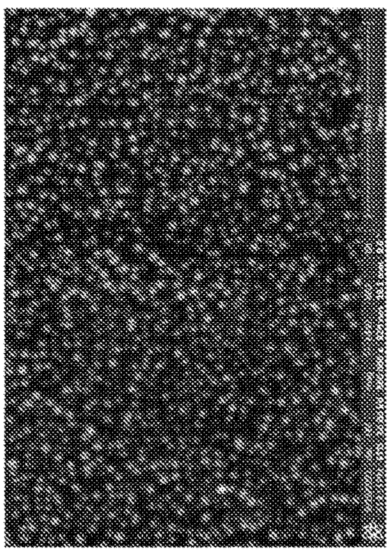
Figure 11C:
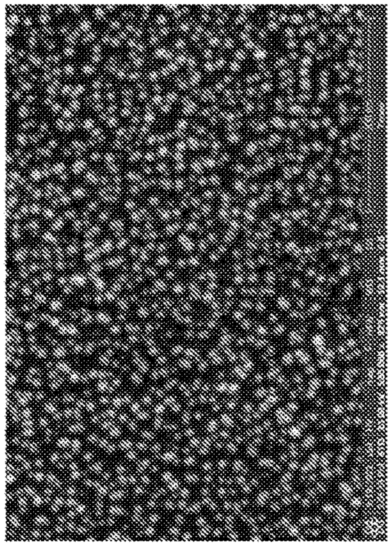
Figure 11D:
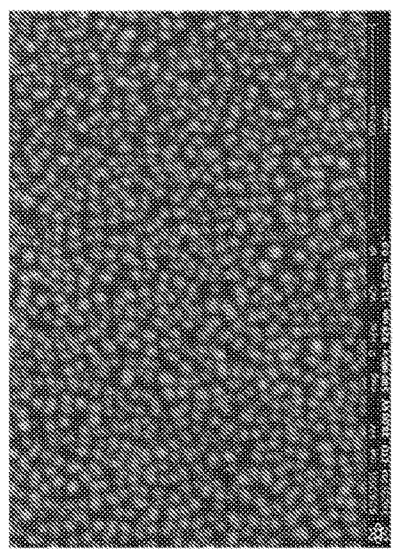
Figure 11E:
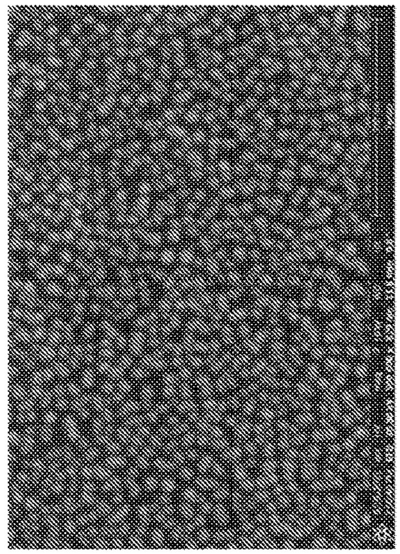
Figure 11F:
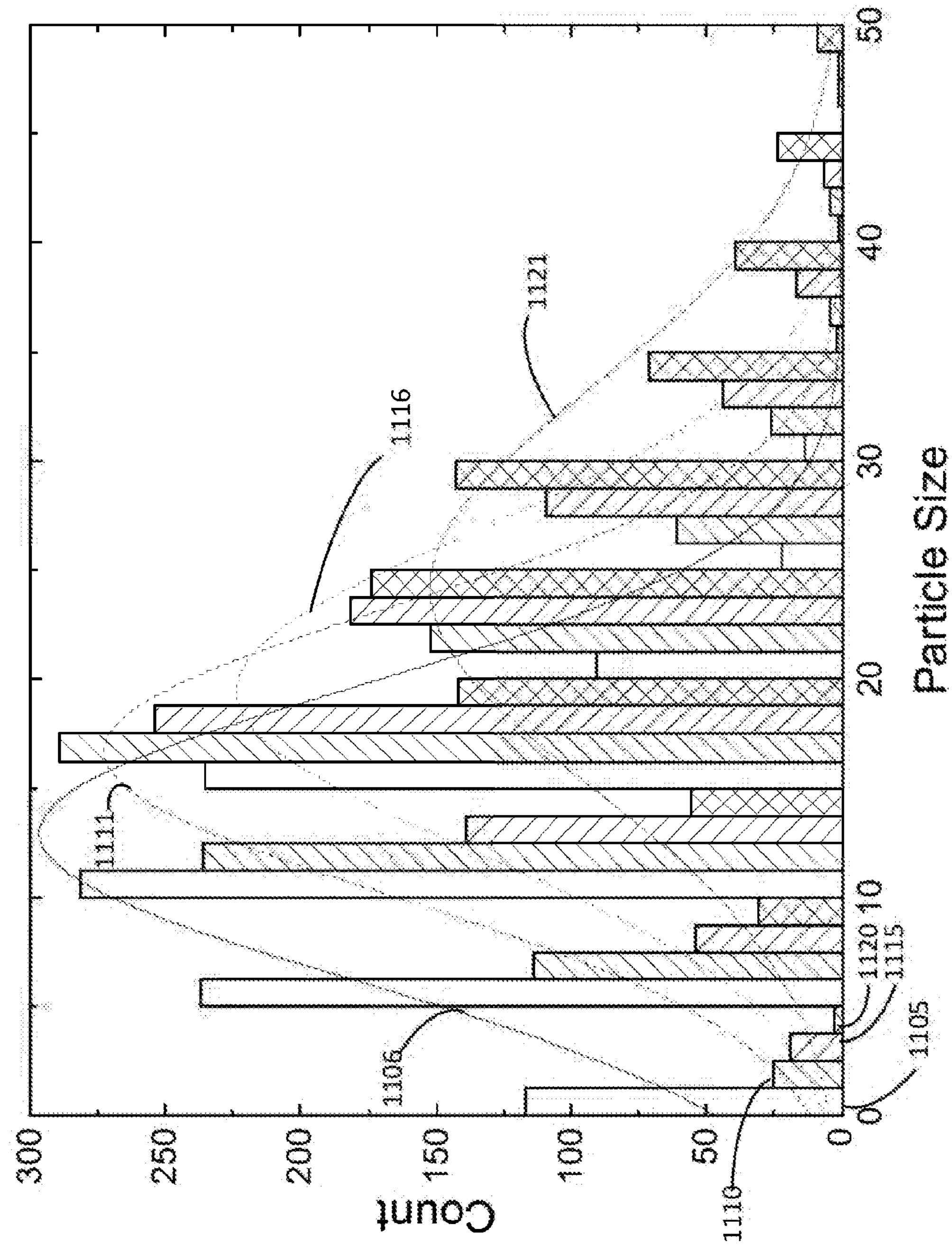
FIG. 11F is a chart of transmittance at various wavelengths based on analysis of the micrographs of FIGS. 11A-11E.
Figure 11G:
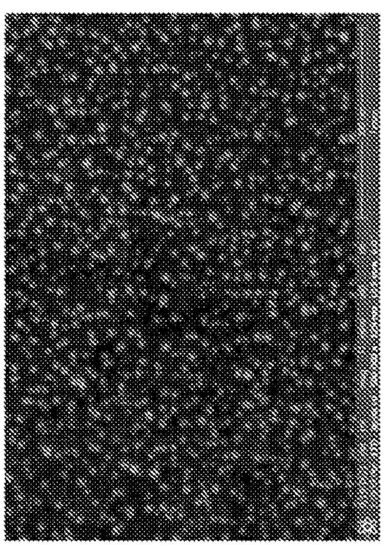
FIGS. 11G-11J are SEM micrographs of samples fabricated in examples of the present disclosure.
Figure 11H:
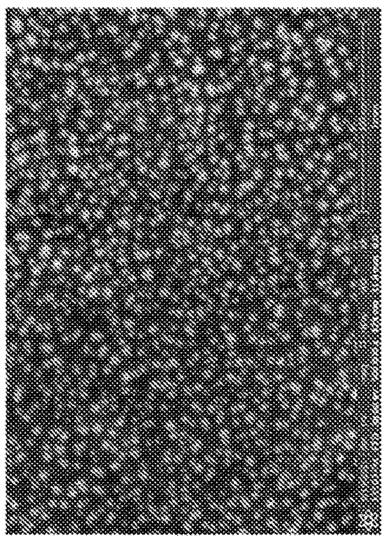
Figure 11I:
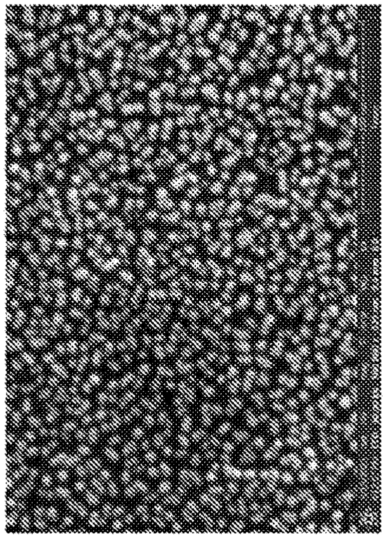
Figure 11J:
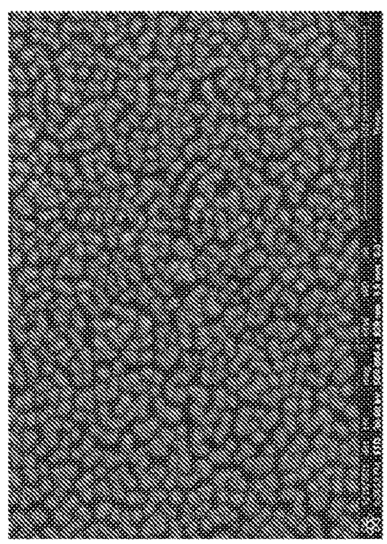

FIG. 11F is a histogram plotting a histogram distribution of particle structures 160 as a function of characteristic particle size, for ETL Sample B 1105, ETL Sample C 1110, ETL Sample D 1115, and ETL Sample E 1120, and respective curves fitting the histogram 1106, 1111, 1116, 1121.

Table 13 below shows measured transmittance percent reduction values for various samples at various wavelengths.

In the present disclosure, reference to transmittance percent reduction of a layered sample refers to values obtained when the transmittance of layers prior to the deposition thereon of metal (including without limitation Ag) in the sample, including any substrate 10, has been subtracted out. Those having ordinary skill in the relevant art will appreciate that, in some non-limiting examples, simplifying assumptions may be made for convenience, at the cost of some computational rigor. By way of non-limiting example, one simplifying assumption may be that the transmittance of glass across a wide range of wavelengths is substantially 0.92. By way of non-limiting example, one simplifying assumption may be that the transmittance of layers between the substrate 10 and the metal is negligible. By way of non-limiting examples, one simplifying assumption may be that the substrate 10 is glass. In some non-limiting examples, therefore, the subtraction of the transmittance of layers prior to the deposition thereon of metal (including without limitation Ag) in the sample, including any substrate 10, may be calculated by dividing a measured transmittance value by 0.92.

TABLE 13

| | Wavelength | | | |
|---|---|---|---|---|
| Sample | 450 nm | 550 nm | 700 nm | 850 nm |
| Comparative Sample 1 | 1.5% | <1% | <1% | <1% |
| ETL Sample B (2:98) | 9% | 5% | <1% | <1% |
| ETL Sample C (5:95) | 17% | 11% | 2.4% | 1% |
| ETL Sample D (10:90) | 29% | 24% | 11% | 5% |
| ETL Sample D (20:80) | 33% | 32% | 21% | 13% |

As may be seen, with relatively low concentrations of the ETL as the second patterning material $\mathbf{411}_2$, there was minimal reduction in transmittance across most wavelengths. However, as the ETL concentration exceeded about 5% vol, a substantial reduction (>10%) was observed at wavelengths of 450 nm and 550 nm in the visible spectrum, without significant reduction in transmittance at wavelengths of 700 nm in the IR spectrum and 850 nm in the NIR spectrum.

For Liq, a number of samples were prepared by co-depositing the first patterning material $\mathbf{411}_1$ and the Liq in varying ratios, to an average layer thickness of 20 nm on an ITO substrate 10 and thereafter exposing the exposed layer surface 11 thereof to a vapor flux 532 of Ag to a reference layer thickness of 15 nm.

Four samples were prepared, where the ratios of Liq to the first patterning material $411_1$ by % volume were respectively 2:98 (Liq Sample A), 5:95 (Liq Sample B), 10:90 (Liq Sample C), and 20:80 (Liq Sample D).

Liq Sample A exhibited a total surface coverage of 11.1117%, a mean characteristic size of 13.2735 nm, a dispersity of 1.651, a number average of the particle sizes of 13.9619 nm, and a size average of the particle sizes of 17.9398 nm.

Liq Sample B exhibited a total surface coverage of 17.2616%, a mean characteristic size of 15.2667 nm, a dispersity of 1.7914, a number average of the particle sizes of 16.3933 nm, and a size average of the particle sizes of 21.941 nm.

Liq Sample C exhibited a total surface coverage of 32.2093%, a mean characteristic size of 23.6209 nm, a dispersity of 1.6428, a number average of the particle sizes of 25.3038 nm, and a size average of the particle sizes of 32.4322 nm.

FIGS. 11G-11J are respectively SEM micrographs of Liq Sample A, Liq Sample B, Liq Sample C, and Liq Sample D.

Figure 11K:
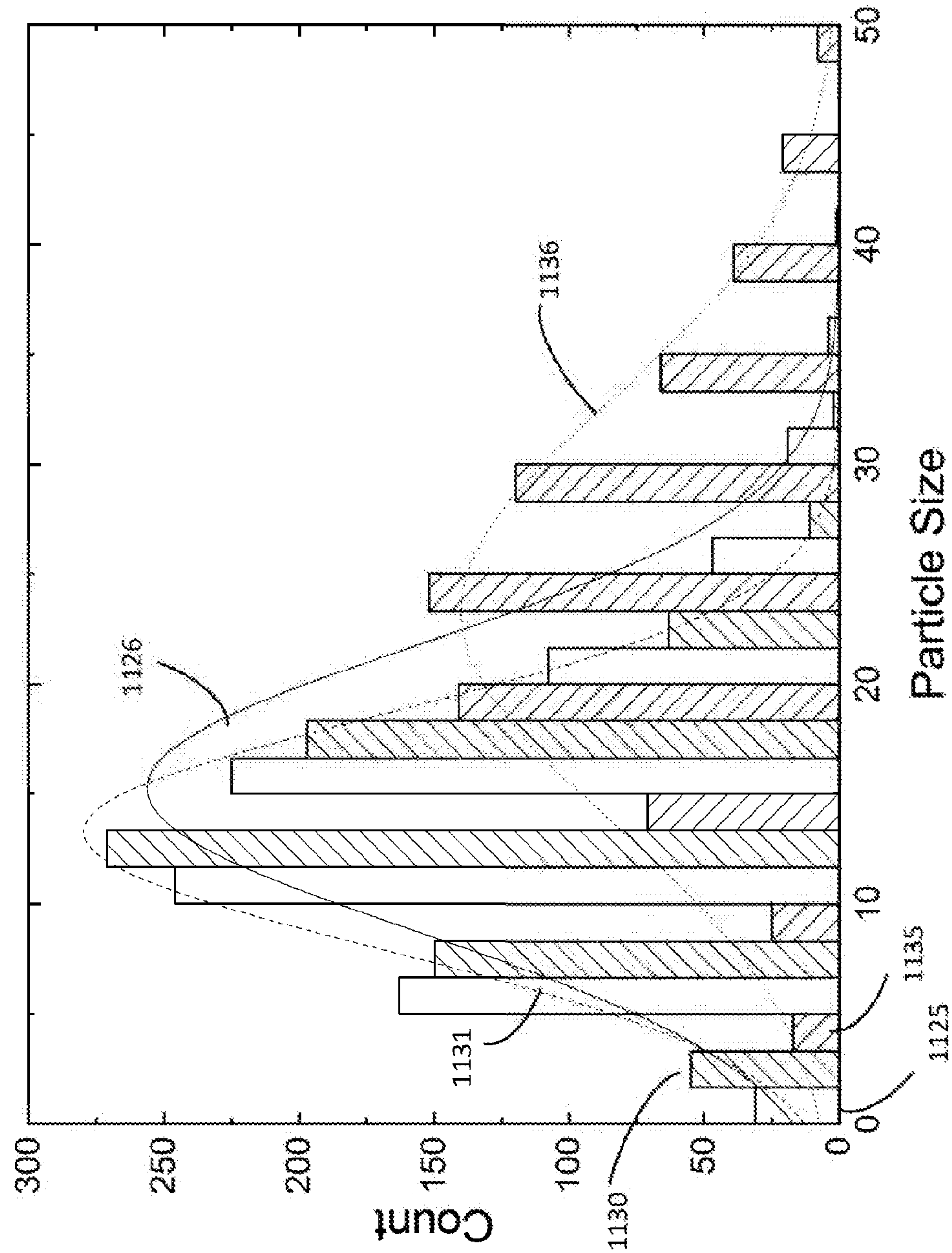
FIG. 11K is a chart of transmittance at various wavelengths based on analysis of the micrographs of FIGS. 11G-11J.
Figure 11N:
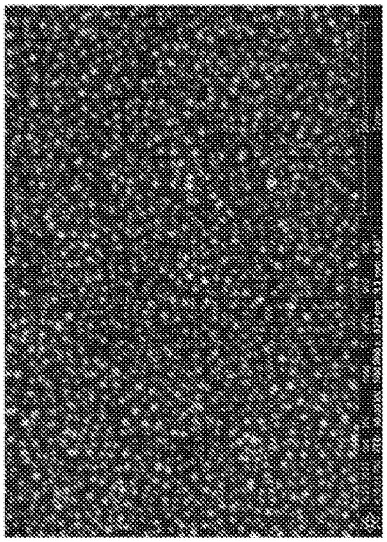
FIGS. 11L-11O are SEM micrographs of samples fabricated in examples of the present disclosure.
Figure 11M:
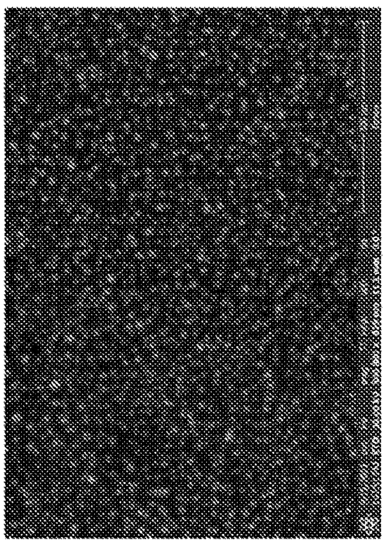
Figure 11L:
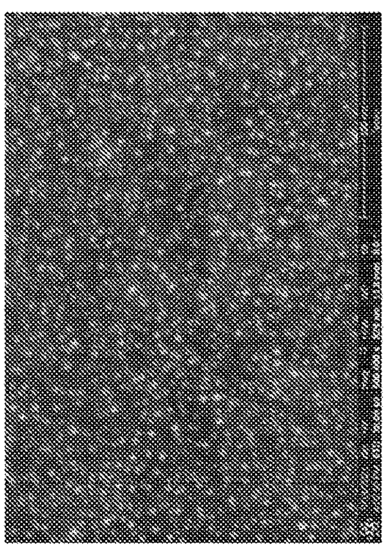
Figure 11O:
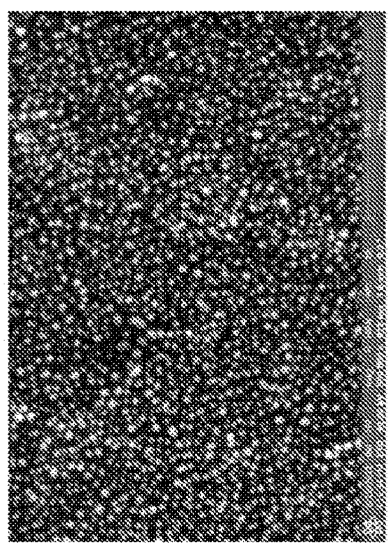

FIG. 11K is a histogram plotting a histogram distribution of particle structures 160 as a function of characteristic particle size, for Liq Sample B 1125, Liq Sample A 1130, and Liq Sample C 1135, and respective curves fitting the histogram 1126, 1131, 1136.

Table 14 below shows measured transmittance reduction percent reduction values for various samples at various wavelengths.

TABLE 14

| | Wavelength | | | | 1,000 |
|---|---|---|---|---|---|
| Sample | 450 nm | 550 nm | 700 nm | 850 nm | nm |
| Comparative Sample 1 | 1.5% | <1% | <1% | <1% | <1% |
| Liq Sample A (2:98) | 7% | 4% | <1% | <1% | <1% |
| Liq Sample B (5:95) | 15% | 10% | 1.5% | <1% | <1% |
| Liq Sample C (10:90) | 34% | 40% | 27.5% | 18% | 11% |

As may be seen, with relatively low concentrations of the Liq as the second patterning material $411_2$, there was minimal reduction in transmittance across most wavelengths. However, as Liq concentration exceeded about 5% vol, a substantial reduction (>10%) was observed at wavelengths of 450 nm and 550 nm in the visible spectrum, without significant reduction in transmittance at wavelengths of 700 nm in the IR spectrum and 850 nm and 1,000 nm in the NIR spectrum.

For LiF, a number of samples were prepared by first depositing the ETL material to an average layer thickness of 20 nm on an ITO substrate 10, then co-depositing the first patterning material $411_1$ and LiF in varying ratios, to an average layer thickness of 20 nm on the exposed layer surface 11 of the ETL material and thereafter exposing the exposed layer surface 11 thereof to a vapor flux 532 of Ag to a reference layer thickness of 15 nm.

Four samples were prepared, where the ratios of LiF to the first patterning material $411_1$ by % volume were respectively 2:98 (LiF Sample A), 5:95 (LiF Sample B), 10:90 (LiF Sample C), and 20:80 (LiF Sample D).

FIGS. 11L-11O are respectively SEM micrographs of LiF Sample A, LiF Sample B, LiF Sample C, and LiF Sample D.

Figure 11P:
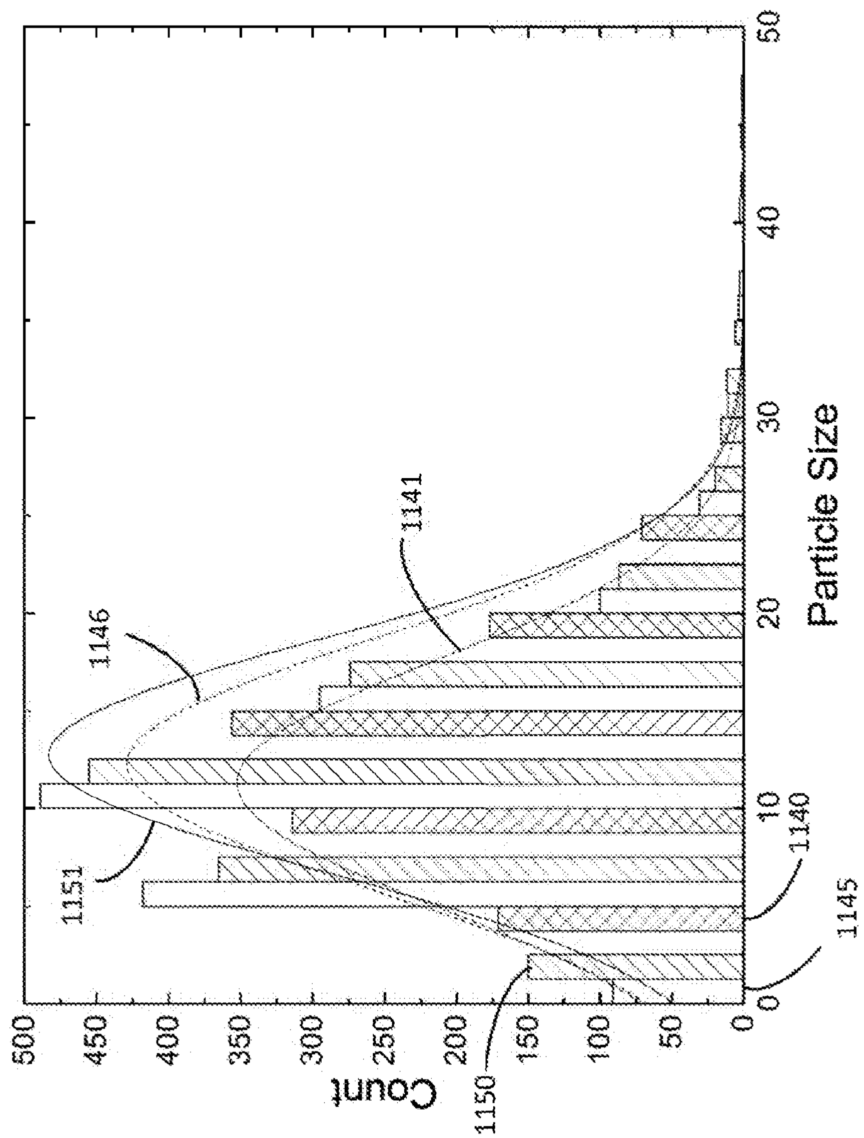
FIG. 11P is a chart of transmittance at various wavelengths based on analysis of the micrographs of FIGS. 11L-11O.

FIG. 11P is a histogram plotting a histogram distribution of particle structures 160 as a function of characteristic particle size, for LiF Sample A 1140, LiF Sample B 1145, and LiF Sample D 1150, and respective curves fitting the histogram 1141, 1146, 1151.

Table 15 below shows measured transmittance reduction percent reduction values for various samples at various wavelengths.

TABLE 15

| | Wavelength | | | | 1,000 |
|---|---|---|---|---|---|
| Sample | 450 nm | 550 nm | 700 nm | 850 nm | nm |
| Comparative Sample 1 | 1.5% | <1% | <1% | <1% | <1% |
| LiF Sample A (2:98) | 2.5% | 1.4% | <1% | <1% | <1% |
| LiF Sample B (5:95) | 6% | 3.4% | <1% | <1% | <1% |
| LiF Sample C (10:90) | 8% | 5% | <1% | <1% | <1% |
| LiF Sample D (20:80) | 11% | 6% | <1% | <1% | <1% |

As may be seen, with relatively low concentrations of LiF as the second patterning material $411_2$, there was minimal reduction in transmittance across most wavelengths. However, as the LiF concentration exceeded about 10% vol, a noticeable reduction (8%) was observed at wavelength of 450 nm in the visible spectrum, without significant reduction in transmittance at wavelengths of 700 nm in the IR spectrum and 850 nm and 1,000 nm in the NIR spectrum Additionally, it was observed that there was substantially no reduction in transmittance at wavelengths of 700 nm or greater, for a concentration of LiF of up to 20% vol.

Table 16 below shows measured refractive index of the materials used in the above samples at various wavelengths.

TABLE 16

| | Wavelength | | |
|---|---|---|---|
| Material | 460 nm | 500 nm | 550 nm |
| First patterning material | 1.36 | 1.36 | 1.36 |
| ETL Material | 1.89 | 1.86 | 1.83 |
| Liq | 1.68 | 1.66 | 1.64 |
| LiF | 1.40 | 1.40 | 1.40 |

It will be appreciated that, for layers or coatings formed by co-depositing two or more materials, the refractive index of such layers or coatings may be estimated using, by way of non-limiting example, the lever rule, in which, for each material constituting such layer or coating, the product of a concentration of the material multiplied by the refractive index of the material is calculated, and a sum is calculated of all of the products calculated for the materials constituting such layer or coating.

Optical Effects of a Layer of Particle Structures

Without wishing to be bound by any particular theory, it has been found, somewhat surprisingly, that the presence of a thin, disperse layer of at least one particle structure 160, including without limitation, at least one metal particle structure 160, including without limitation, on an exposed layer surface 11 of the particle structure patterning coating $130_p$, may exhibit one or more varied characteristics and concomitantly, varied behaviors, including without limitation, optical effects and properties of the device 100, as discussed herein.

In some non-limiting examples, the presence of such a discontinuous layer 170 of particle material, including without limitation, at least one particle structure 160, may contribute to enhanced extraction of EM radiation, performance, stability, reliability, and/or lifetime of the device.

In some non-limiting examples, such effects and properties may be controlled to some extent by judicious selection of at least one of: the characteristic size, length, width, diameter, height, size distribution, shape, surface coverage, configuration, deposited density, dispersity, and/or composition of the particle structures 160.

In some non-limiting examples, the formation of at least one of: the characteristic size, length, width, diameter, height, size distribution, shape, surface coverage, configuration, deposited density, dispersity, and/or composition of such at least one particle structure $\mathbf{160}_t$ may be controlled, in some non-limiting examples, by judicious selection of at least one of: at least one characteristic of the patterning material 411, an average film thickness of the particle structure patterning coating $\mathbf{130}_p$, the introduction of heterogeneities in the particle structure patterning coating $\mathbf{130}_p$, and/or a deposition environment, including without limitation, a temperature, pressure, duration, deposition rate, and/or deposition process for the patterning material 411 of the particle structure patterning coating $\mathbf{130}_p$.

In some non-limiting examples, the formation of at least one of the characteristic size, length, width, diameter, height, size distribution, shape, surface coverage, configuration, deposited density, dispersity, and/or composition of such at least one particle structure $\mathbf{160}_t$ may be controlled, in some non-limiting examples, by judicious selection of at least one of: at least one characteristic of the particle material, an extent to which the particle structure patterning coating $\mathbf{130}_p$ may be exposed to deposition of the particle material (which, in some non-limiting examples may be specified in terms of a thickness of the corresponding discontinuous layer 170), and/or a deposition environment, including without limitation, a temperature, pressure, duration, deposition rate, and/or method of deposition for the particle material.

In some non-limiting examples, a (part of) at least one particle structure 160 having a surface coverage that may be substantially no more than the maximum threshold percentage coverage, may result in a manifestation of different optical characteristics that may be imparted by such part of the at least one particle structure 160, to EM radiation passing therethrough, whether transmitted entirely through the device 100, and/or emitted thereby, relative to EM radiation passing through a part of the at least one particle structure 160 having a surface coverage that substantially exceeds the maximum threshold percentage coverage.

In some non-limiting examples, at least one dimension, including without limitation, a characteristic dimension, of the at least one particle structure 160, may correspond to a wavelength range in which an absorption spectrum of the at least one particle structure 160 does not substantially overlap with a wavelength range of the EM spectrum of EM radiation being emitted by and/or transmitted at least partially through the device 100.

While the at least one particle structure 160 may absorb EM radiation incident thereon from beyond the layered semiconductor device 100, thus reducing reflection, those having ordinary skill in the relevant art will appreciate that, in some non-limiting examples, the at least one particle structure 160 may absorb EM radiation incident thereon that is emitted by the device 100.

In some non-limiting examples, the existence, in a layered device 100, of at least one particle structure 160, on, and/or proximate to the exposed layer surface 11 of a patterning coating 130, and/or, in some non-limiting examples, and/or proximate to the interface of such patterning coating 130 with an overlying layer 180, may impart optical effects to EM radiation, including without limitation, photons, emitted by the device, and/or transmitted therethrough.

In some non-limiting examples, the optical effects may be described in terms of its impact on the transmission, and/or absorption wavelength spectrum, including a wavelength range, and/or peak intensity thereof.

Additionally, while the model presented may suggest certain effects imparted on the transmission, and/or absorption of EM radiation passing through such at least one particle structure 160, in some non-limiting examples, such effects may reflect local effects that may not be reflected on a broad, observable basis.

The foregoing also assumes, as a simplifying assumption, that the NPs modelling each particle structure 160 may have a perfectly spherical shape. Typically, the shape of particle structures $\mathbf{160}_t$ in (an observation window used, of) the at least one particle structure 160 may be highly dependent upon the deposition process. In some non-limiting examples, a shape of the particle structures $\mathbf{160}_t$ may have a significant impact on the SP excitation exhibited thereby, including without limitation, on a width, wavelength range, and/or intensity of a resonance band, and concomitantly, an absorption band thereof.

In some non-limiting examples, material surrounding the at least one particle structure 160, whether underlying it (such that the particle structures $\mathbf{160}_t$ may be deposited onto the exposed layer surface 11 thereof) or subsequently disposed on an exposed layer surface 11 of the at least one particle structure 160, may impact the optical effects generated by the emission and/or transmission of EM radiation and/or EM signals 3461 through the at least one particle structure 160.

It may be postulated that disposing the at least one particle structure 160 containing the particle structures $\mathbf{160}_t$ on, and/or in physical contact with, and/or proximate to, an exposed layer surface 11 of a particle structure patterning coating $\mathbf{130}_p$ that may be comprised of a material having a low refractive index may, in some non-limiting examples, shift an absorption spectrum of the at least one particle structure 160.

In some non-limiting examples, the change and/or shift in absorption may be concentrated in an absorption spectrum that is a (sub-) range of the EM spectrum, including without limitation, the visible spectrum, and/or a sub-range thereof.

Since the at least one particle structure 160 may be arranged to be on, and/or in physical contact with, and/or proximate to, the particle structure patterning coating $\mathbf{130}_p$, the device 100 may be configured such that an absorption spectrum of the at least one particle structure 160 may be tuned and/or modified, due to the presence of the particle structure patterning coating $\mathbf{130}_p$, including without limitation such that such absorption spectrum may substantially overlap and/or may not overlap with at least a wavelength (sub-) range of the EM spectrum, including without limitation, the visible spectrum, the UV spectrum, and/or the IR spectrum.

In some non-limiting examples, one measure of a surface coverage of an amount of an electrically conductive material on a surface may be a (EM radiation) transmittance, since in some non-limiting examples, electrically conductive materials, including without limitation, metals, including without limitation: Ag, Mg, or Yb, attenuate, and/or absorb EM radiation.

In some non-limiting examples, the resonance imparted by the at least one particle structure $160_t$ for enhancing the transmission of EM signals 3461 passing at a non-zero angle relative to the layers of the device 100, may be tuned by judicious selection of at least one of a characteristic size, size distribution, shape, surface coverage, configuration, dispersity, and/or material of the particle structures $160_t$.

In some non-limiting examples, the resonance may be tuned by varying the deposited thickness of the particle material.

In some non-limiting examples, the resonance may be tuned by varying the average film thickness of the particle structure patterning coating $130_p$.

In some non-limiting examples, the resonance may be tuned by varying the thickness of the overlying layer 180. In some non-limiting examples, the thickness of the overlying layer 180 may be in the range of 0 nm (corresponding to the absence of the overlying layer 180) to a value that exceeds a characteristic size of the deposited particle structures $160_t$.

In some non-limiting examples, the resonance may be tuned by selecting and/or modifying the material deposited as the overlying layer 180 to have a specific refractive index and/or a specific extinction coefficient. By way of non-limiting example, typical organic CPL 1215 materials may have a refractive index in the range of between about: 1.7-2.0, whereas $SiON_x$, a material typically used as a TFE material, may have a refractive index that may exceed about 2.4. Concomitantly, $SiON_x$ may have a high extinction coefficient that may impact the desired resonance characteristics.

In some non-limiting examples, the resonance may be tuned by altering the composition of metal in the particle material to alter the dielectric constant of the deposited particle structures $160_t$.

In some non-limiting examples, the resonance may be tuned by doping the patterning material 411 with an organic material having a different composition.

In some non-limiting examples, the resonance may be tuned by selecting and/or modifying a patterning material 411 to have a specific refractive index and/or a specific extraction coefficient.

Those having ordinary skill in the relevant art will appreciate that additional parameters and/or values and/or ranges thereof may become apparent as being suitable to tune the resonance imparted by the at least one particle structure 160 for allowing transmission of EM signals 3461 passing at a non-zero angle relative to the layers of the device 100, and/or enhancing absorption of EM radiation, which by way of non-limiting example may be visible light, incident upon the device 100.

Those having ordinary skill in the relevant art will appreciate that while certain values and/or ranges of these parameters may be suitable to tune the resonance imparted by the at least one particle structure 160 for enhancing the transmission of EM signals 3461 passing at a non-zero angle relative to the layers of the device 100, other values and/or ranges of such parameters may be appropriate for other purposes, beyond the enhancement of the transmission of EM signals 3461, including increasing the performance, stability, reliability, and/or lifetime of the device 100, and in some non-limiting examples, to ensure deposition of a suitable second electrode 1240 (FIG. 12A) in the second portion 102, in the emissive region(s) 1310 of an opto-electronic version of the device 100, to facilitate emission of EM radiation thereby.

Additionally, those having ordinary skill in the relevant art will appreciate that there may be additional parameters and/or values and/or ranges that may be suitable for such other purposes.

In some non-limiting examples, employing at least one particle structure 160 as part of a layered semiconductor device 100 may reduce reliance on a polarizer therein.

Those having ordinary skill in the relevant art will appreciate that, while a simplified model of the optical effects is presented herein, other models, and/or explanations may be applicable.

In some non-limiting examples, the presence of at least one particle structure 160, may reduce, and/or mitigate crystallization of thin film layers, and/or coatings disposed adjacent in the longitudinal aspect, including without limitation, the patterning coating 130, and/or the overlying layer 180, thereby stabilizing the property of the thin film(s) disposed adjacent thereto, and, in some non-limiting examples, reducing scattering. In some non-limiting examples, such thin film may be, and/or comprise at least one layer of an outcoupling, and/or encapsulating coating 2050 (FIG. 23C) of the device 100, including without limitation, a capping layer (CPL 1215).

In some non-limiting examples, the presence of such at least one particle structure 160, may provide an enhanced absorption in at least a part of the UV spectrum. In some non-limiting examples, controlling the characteristics of such particle structures 160, including without limitation, at least one of: characteristic size, length, width, diameter, height, size distribution, shape, surface coverage, configuration, deposited density, dispersity, composition, particle material, and/or refractive index, of the particle structures 160, may facilitate controlling the degree of absorption, wavelength range and peak wavelength of the absorption spectrum, including in the UV spectrum. Enhanced absorption of EM radiation in at least a part of the UV spectrum may be advantageous, for example, for improving device performance, stability, reliability, and/or lifetime.

In some non-limiting examples, the optical effects may be described in terms of their impact on the transmission, and/or absorption wavelength spectrum, including a wavelength range, and/or peak intensity thereof.

Additionally, while the model presented may suggest certain effects imparted on the transmission, and/or absorption of EM radiation passing through such at least one particle structure 160, in some non-limiting examples, such effects may reflect local effects that may not be reflected on a broad, observable basis.

It has also been reported that arranging certain metal NPs near a medium having relatively low refractive index, may shift the absorption spectrum of such NPs to a lower wavelength (sub-) range (blue-shifted).

Accordingly, it may be further postulated that disposing particle material, in some non-limiting examples, as a discontinuous layer 170 of at least one particle structure 160 on an exposed layer surface 11 of an underlying layer, such that the at least one particle structure 160 is in physical contact with the underlying layer, may, in some non-limiting examples, favorably shift the absorption spectrum of the particle material, including without limitation, blue-shift, such that it does not substantially overlap with a wavelength range of the EM spectrum of EM radiation being emitted by and/or transmitted at least partially through the device 100.

In some non-limiting examples, a peak absorption wavelength of the at least one particle structure 160 may be less than a peak wavelength of the EM radiation being emitted by and/or transmitted at least partially through the device 100. By way of non-limiting example, the particle material may exhibit a peak absorption at a wavelength (range) that is at least one of no more than about: 470 nm, 460 nm, 455 nm, 450 nm, 445 nm, 440 nm, 430 nm, 420 nm, or 400 nm.

It has now been found, somewhat surprisingly, that providing particle material, including without limitation, in the form of at least one particle structure 160, including without limitation, those comprised of a metal, may further impact the absorption and/or transmittance of EM radiation passing through the device 100, including without limitation, in the first direction, in at least a wavelength (sub-) range of the EM spectrum, including without limitation, the visible spectrum, and/or a sub-range thereof, passing in the first direction from and/or through the at least one particle structure(s) 160.

In some non-limiting examples, absorption may be reduced, and/or transmittance may be facilitated, in at least a wavelength (sub-) range of the EM spectrum, including without limitation, the visible spectrum, and/or a sub-range thereof.

In some non-limiting examples, the absorption may be concentrated in an absorption spectrum that is a wavelength (sub-) range of the EM spectrum, including without limitation, the visible spectrum, and/or a sub-range thereof.

In some non-limiting examples, the absorption spectrum may be blue-shifted and/or shifted to a higher wavelength (sub-) range (red-shifted), including without limitation, to a wavelength (sub-) range of the EM spectrum, including without limitation, the visible spectrum, and/or a sub-range thereof, and/or to a wavelength (sub-) range of the EM spectrum that lies, at least in part, beyond the visible spectrum.

Those having ordinary skill in the relevant art will appreciate that in some non-limiting examples, a plurality of layers of particle structures 160 may be disposed on one another, whether or not separated by additional layers of the device 100, including without limitation, with varying lateral aspects and having different characteristics, providing different optical responses. In this fashion, the optical response of certain layers and/or portions 101, 102 of the device 100 may be tuned according to one or more criteria.

Absorption Around Emissive Regions

In some non-limiting examples, the layered semiconductor device 100 may be an opto-electronic device 1200$_a$ (FIG. 12A), such as an OLED, comprising at least one emissive region 1310 (FIG. 13A). In some non-limiting examples, the emissive region 1310 may correspond to at least one semiconducting layer 1230 (FIG. 12A) disposed between a first electrode 1220 (FIG. 12A), which in some non-limiting examples, may be an anode, and a second electrode 1240, which in some non-limiting examples, may be a cathode. The anode and cathode may be electrically coupled with a power source 1605 (FIG. 16) and respectively generate holes and electrons that migrate toward each other through the at least one semiconducting layer 1230. When a pair of holes and electrons combine, EM radiation in the form of a photon may be emitted.

In some non-limiting examples, in at least a part of the emissive region 1310, the at least one semiconducting layer 1230 may be deposited over the exposed layer surface 11 of the device 1200, which in some non-limiting examples, comprise the first electrode 1220.

In some non-limiting examples, the exposed layer surface 11 of the device 100, which may, in some non-limiting examples, comprise the at least one semiconducting layer 1230, may be exposed to an vapor flux 412 of the patterning material 411, including without limitation, using a shadow mask 415, to form a patterning coating 130 in the first portion 101. Whether or not a shadow mask 415 is employed, the patterning coating 130 may be restricted, in its lateral aspect, substantially to the signal transmissive region(s) 1320.

In some non-limiting examples, the exposed layer surface 11 of the device 1200 may be exposed to a vapor flux 532 of a deposited material 531, which in some non-limiting examples, may be, and/or comprise similar materials as the particle material, including without limitation, in an open mask and/or mask-free deposition process.

In some non-limiting examples, the exposed layer surface 11 of the face 3401 within the lateral aspect 1720 of the at least one signal transmissive region 1320, may comprise the patterning coating 130. Accordingly, within the lateral aspect 1720 of the at least one signal transmissive region(s) 1320, the vapor flux 532 of the deposited material 531, which in some non-limiting examples, may be, and/or comprise similar materials as the particle material, incident on the exposed layer surface 11, may form at least one particle structure 160$_p$, on the exposed layer surface 11 of the patterning coating 130. In some non-limiting examples, a surface coverage of the at least one particle structure 160 may be at least one of no more than about: 70%, 60%, 50%, 40%, 30%, 25%, 20%, 15%, or 10%.

At the same time, because the patterning coating 130 has been restricted, in its lateral aspect, substantially to the non-emissive regions 1520, in some non-limiting examples, the exposed layer surface 11 of the face 3401 within the lateral aspect 1710 of the emissive region(s) 1310 may comprise the at least one semiconducting layer 1230. Accordingly, within the second portion 102 of the lateral aspect 1710 of the at least one emissive region 1310, the vapor flux 532 of the deposited material 531 incident on the exposed layer surface 11, may form a closed coating 150 of the deposited material 531 as the second electrode 1240.

Thus, in some non-limiting examples, the patterning coating 130 may serve dual purposes, namely as a particle structure patterning coating 130$_p$ to provide a base for the deposition of the at least one particle structure 160 in the first portion 101, and as a non-particle structure patterning coating 130$_g$ to restrict the lateral extent of the deposition of the deposited material 531 as the second electrode 1240 to the second portion 102, without employing a shadow mask 415 during the deposition of the deposited material 531.

In some non-limiting examples, an average film thickness of the closed coating 150 of the deposited material 531 may be at least one of at least about: 5 nm, 6 nm, or 8 nm. In some non-limiting examples, the deposited material 531 may comprise MgAg.

In some non-limiting examples, the at least one particle structure 160 may be deposited on and/or over the exposed layer surface 11 of the second electrode 1240.

In some non-limiting examples, a lateral aspect of an exposed layer surface 11 of the device 1200 may comprise a first portion 101 and a second portion 102.

In some non-limiting examples, the at least one particle structure 160 may be omitted, or may not extend, over the first portion 101, but rather may only extend over the second portion 102. In some non-limiting examples, as shown by way of non-limiting example in FIG. 12A, the first portion 101 may correspond, to a greater or lesser extent, to a lateral aspect 1720 (FIG. 22) of at least one non-emissive region 1520 (FIG. 23A) of a version $\mathbf{1200}_a$ of the device 100, in which the seeds 161 may be deposited before deposition of a non-particle structure patterning coating $\mathbf{130}_g$.

Such a non-limiting configuration may be appropriate to enable and/or to maximize transmittance of EM radiation emitted from the at least one emissive region 1310, while reducing reflection of external EM radiation incident on an exposed layer surface 11 of the device 100.

Thus, as shown in FIG. 12A, in such a scenario, where the non-particle structure patterning coating $\mathbf{130}_g$ may be deposited, not for purposes of depositing the at least one particle structure 160, but for limiting the lateral extent thereof, the patterning material 411 of which such non-particle structure patterning coating $\mathbf{130}_n$ may be comprised may not exhibit a relatively low initial sticking probability with respect to the particle material and/or the seed material, such as discussed above.

Those having ordinary skill in the relevant art will appreciate that in some non-limiting examples, the at least one particle structure 160 may be omitted from region(s) of the device 1200 other than, and/or in addition to, the emissive region(s) 1310 of the device 1200, and the second portion 102 may, in some examples, correspond to, and/or comprise such other region(s).

In some non-limiting examples, such as shown in FIG. 12A, the non-particle structure patterning coating $\mathbf{130}_n$ may be deposited on the exposed layer surface 11, after deposition of the seeds 161 in the templating layer, if any, such that the seeds 161 may be deposited across both the first portion 101 and the second portion 102, and the non-particle structure patterning coating $\mathbf{130}_n$ may cover the seeds 161 deposited across the first portion 101.

Figure 12B:
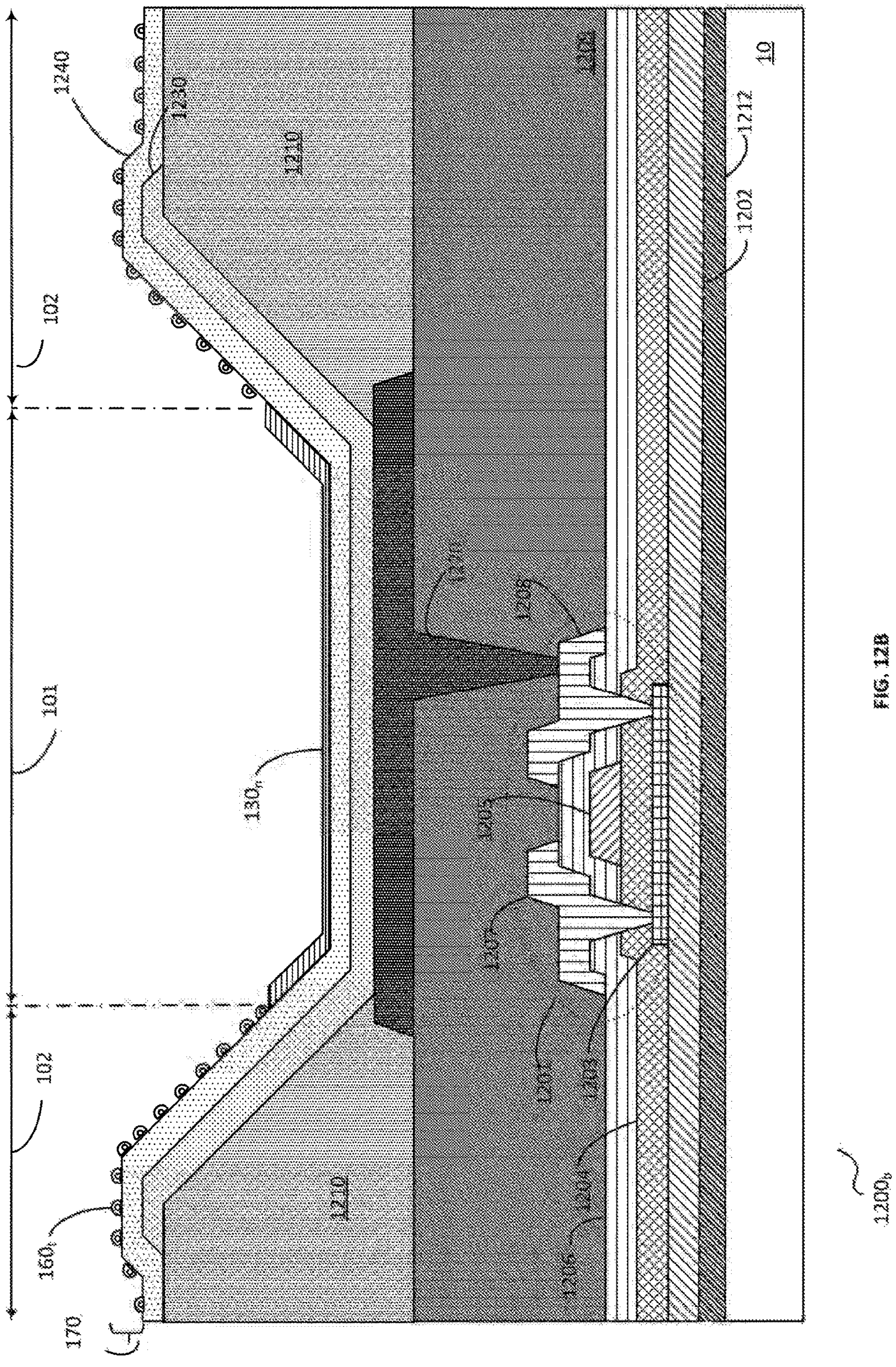
FIG. 12B is a schematic diagram showing a version of the at least one particle structure of FIG. 12A, formed by deposition of the patterning coating prior to deposition of the plurality of seeds, according to an example in the present disclosure.

In some non-limiting examples, the non-particle structure patterning coating $\mathbf{130}_n$ may provide a surface with a relatively low initial sticking probability against the deposition, not only of the particle material, but also of the seed material. In such examples, such as is shown in the example version $\mathbf{1200}_b$ of the device 100 in FIG. 12B, the non-particle structure patterning coating $\mathbf{130}_n$ may be deposited before, not after, any deposition of the seed material.

After selective deposition of the non-particle structure patterning coating $\mathbf{130}_n$ across the first portion 101, a conductive particle material may be deposited over the device $\mathbf{1200}_b$, in some non-limiting examples, using an open mask and/or a mask-free deposition process, but may remain substantially only within the second portion 102, which may be substantially devoid of the patterning coating 130, as, and/or to form, particle structures $\mathbf{160}_t$ therein, including without limitation, by coalescing around respective seeds 161, if any, that are not covered by the non-particle structure patterning coating $\mathbf{130}_n$.

After selective deposition of the non-particle structure patterning coating $\mathbf{130}_n$ across the first portion 101, the seed material, if deposited, may be deposited in the templating layer, across the exposed layer surface 11 of the device $\mathbf{1200}_b$, in some non-limiting examples, using an open mask and/or a mask-free deposition process, but the seeds 161 may remain substantially only within the second portion 102, which may be substantially devoid of the non-particle structure patterning coating $\mathbf{130}_g$.

Further, the particle material may be deposited across the exposed layer surface 11 of the device 1200, in some non-limiting examples, using an open mask and/or a mask-free deposition process, but the particle material may remain substantially only within the second portion 102, which may be substantially devoid of the non-particle structure patterning coating $\mathbf{130}_g$, as and/or to form particle structures $\mathbf{160}_t$ therein, including without limitation, by coalescing around respective seeds 161.

The non-particle structure patterning coating $\mathbf{130}_g$ may provide, within the first portion 101, a surface with a relatively low initial sticking probability against the deposition of the particle material and/or the seed material, if any, that may be substantially less than an initial sticking probability against the deposition of the particle material, and/or the seed material, if any, of the exposed layer surface 11 of the underlying layer of device $\mathbf{1200}_b$ within the second portion 102.

Thus, the first portion 101 may be substantially devoid of a closed coating 150 of any seeds 161 and/or of the particle material that may be deposited within the second portion 102 to form the particle structures $\mathbf{160}_t$, including without limitation, by coalescing around the seeds 161.

Those having ordinary skill in the relevant art will appreciate that, even if some of the particle material, and/or some of the seed material, remains within the first portion 101, the amount of any such particle material, and/or seeds 161 formed of the seed material, in the first portion 101, may be substantially less than in the second portion 102, and that any such particle material in the first portion 101 may tend to form a discontinuous layer 170 that may be substantially devoid of particle structures 160. Even if some of such particle material in the first portion 101 were to form a particle structure $\mathbf{160}_d$, including without limitation, about a seed 161 formed of the seed material, the size, height, weight, thickness, shape, profile, and/or spacing of any such particle structures $\mathbf{160}_d$ may nevertheless be sufficiently different from that of the particle structures $\mathbf{160}_t$ of the second portion 102, that absorption of EM radiation in the first portion 101 may be substantially less than in the second portion 102, including without limitation, in a wavelength (sub-) range of the EM spectrum, including without limitation, the visible spectrum, and/or a sub-range and/or wavelength thereof, including without limitation, corresponding to a specific colour.

In this fashion, the non-particle structure patterning coating $\mathbf{130}_n$ may be selectively deposited, including without limitation, using a shadow mask 415, to allow the particle material to be deposited, including without limitation, using an open mask and/or a mask-free deposition process, so as to form particle structures $\mathbf{160}_t$, including without limitation, by coalescing around respective seeds 161.

Those having ordinary skill in the relevant art will appreciate that structures exhibiting relatively low reflectance may, in some non-limiting examples, be suitable for providing at least one particle structure 160.

In some non-limiting examples, the presence of the at least one particle structure 160, including without limitation, NPs, including without limitation, in a discontinuous layer 170, on an exposed layer surface 11 of the patterning coating 130 may affect some optical properties of the device 1200.

Without wishing to be limited to any particular theory, it may be postulated that, while the formation of a closed coating 150 of the particle material may be substantially inhibited by and/or on the patterning coating 130, in some non-limiting examples, when the patterning coating 130 is exposed to deposition of the particle material thereon, some vapor monomers of the particle material may ultimately form at least one particle structure 160 thereon.

In some non-limiting examples, at least some of the particle structures 160 may be disconnected from one another. In other words, in some non-limiting examples, the discontinuous layer 170 may comprise features, including particle structures 160, that may be physically separated from one another, such that the particle structures 160 do not form a closed coating 150. Accordingly, such discontinuous layer 170 may, in some non-limiting examples, thus comprise a thin disperse layer of particle material formed as particle structures 160, inserted at, and/or substantially across the lateral extent of, an interface between the patterning coating 130 and the overlying layer 180 in the device 1200.

In some non-limiting examples, at least one of the particle structures 160 may be in physical contact with an exposed layer surface 11 of the patterning coating 130. In some non-limiting examples, substantially all of the particle structures 160 of may be in physical contact with the exposed layer surface 11 of the patterning coating 130.

Turning now to FIG. 13A, which is a simplified block diagram of an example version $\mathbf{1300}_a$ of a user device 1300, although not shown, in some non-limiting examples, a thickness of pixel definition layers (PDLs) 1210 in at least one signal transmissive region 1320, in some non-limiting examples, at least in a region laterally spaced apart from neighbouring emissive regions 1310, and in some non-limiting examples, of the TFT insulating layer 1209, may be reduced in order to enhance a transmittivity and/or a transmittivity angle relative to and through the layers of a display panel $\mathbf{1340}_a$ of the user device 1300, which in some non-limiting examples, may be a layered semiconductor device 100.

In some non-limiting examples, a lateral aspect 1710 (FIG. 17) of at least one emissive region 1310 may extend across and include at least one TFT structure 1201 associated therewith for driving the emissive region 1310 along data and/or scan lines (not shown), which, in some non-limiting examples, may be formed of Cu and/or a TCO.

In some non-limiting examples, at least one covering layer 1330 may be deposited at least partially across the lateral extent of the device 1310, in some non-limiting examples, covering the second electrode 1240 in the first portion 101, and, in some non-limiting examples, at least partially covering the at least one particle structure 160 and forming an interface with the patterning coating 130 at the exposed layer surface 11 thereof in the second portion 102.

In some non-limiting examples, the vapor flux 532 of the particle material incident on the exposed layer surface 11 of the face 3401 within the second portion 102 (that is, beyond the lateral aspect of the first portion 101, in which the exposed layer surface 11 of the face 3401 is of the particle structure patterning coating $\mathbf{130}_p$), may be at a rate and/or for a duration that it may not form a closed coating 150 of the particle material thereon, even in the absence of the particle structure patterning coating $\mathbf{130}_p$. In such scenario, the vapor flux 532 of the particle material on the exposed layer surface 11, within the lateral aspect of the second portion 102, may also form at least one particle structure $\mathbf{160}_d$ thereon, including without limitation, as a discontinuous layer 170, as shown in FIG. 13B.

Figure 13B:
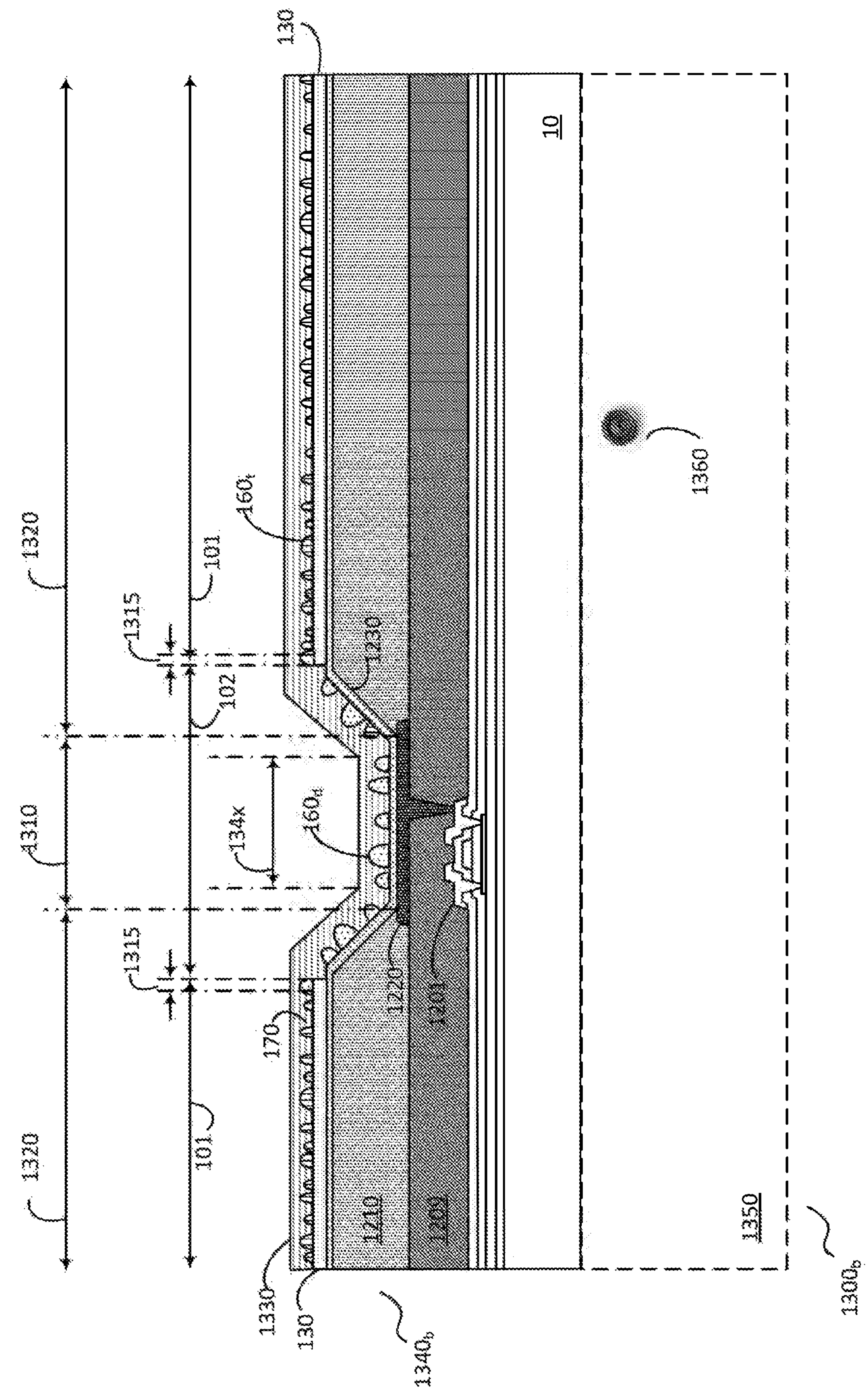

FIG. 13B is a simplified block diagram of an example version $\mathbf{1300}_b$ of the user device 1300. In the display panel $\mathbf{1340}_b$ thereof, when the vapor flux 532 of the particle material is incident on the exposed layer surface 11 thereof, rather than forming a closed coating 150 as the second electrode 1240 in the second portion 102, as in the face 3401, a discontinuous layer 170 may be formed in the second portion 102, comprising at least one particle structure $\mathbf{160}_d$. Where the at least one particle structures $\mathbf{160}_d$ are electrically coupled, the discontinuous layer 170 may serve as a second electrode 1240.

In some non-limiting examples, a characteristic size, length, width, diameter, height, size distribution, shape, surface coverage, configuration, deposited density, dispersity, and/or composition of the at least one particle structure $\mathbf{160}_t$ of the at least one particle structure 160 in the first portion 101 may be different from that of the at least one particle structure $\mathbf{160}_d$ of the discontinuous layer 170 forming the second electrode 1240 in the second portion 102.

In some non-limiting examples, a characteristic size of the at least one particle structure $\mathbf{160}_t$ of the at least one particle structure 160 in the first portion 101 may exceed a characteristic size of the at least one particle structure $\mathbf{160}_d$ of the discontinuous layer 170 forming the second electrode 1240 in the second portion 102.

In some non-limiting examples, a surface coverage of the at least one particle structure $\mathbf{160}_t$ of the at least one particle structure 160 in the first portion 101 may exceed a surface coverage of the at least one particle structure $\mathbf{160}_d$ of the discontinuous layer 170 forming the second electrode 1240 in the second portion 102.

In some non-limiting examples, a deposited density of the at least one particle structure $\mathbf{160}_t$ of the at least one particle structure 160 in the first portion 101 may exceed a deposited density of the at least one particle structure $\mathbf{160}_d$ of the discontinuous layer 170 forming the second electrode 1240 in the second portion 102.

In some non-limiting examples, a characteristic size, length, width, diameter, height, size distribution, shape, surface coverage, configuration, deposited density, dispersity, and/or composition of the at least one particle structure $\mathbf{160}_d$ of the discontinuous layer 170 forming the second electrode 1240 in the second portion 102 may be such to allow them to be electrically coupled.

In some non-limiting examples, the characteristic size of the at least one particle structure $\mathbf{160}_d$ of the discontinuous layer 170 forming the second electrode 1240 in the second portion 102 may exceed a characteristic size of the at least one particle structure $\mathbf{160}_t$ of the at least one particle structure 160 in the first portion 101.

In some non-limiting examples, a surface coverage of the at least one particle structure $\mathbf{160}_d$ of the discontinuous layer 170 forming the second electrode 1240 in the second portion 102 may exceed a surface coverage of the at least one particle structure $\mathbf{160}_t$ of the at least one particle structure 160 in the first portion 101.

In some non-limiting examples, a deposited density of the at least one particle structure $\mathbf{160}_d$ of the discontinuous layer 170 forming the second electrode 1240 in the second portion 102 may exceed a deposited density of the at least one particle structure $\mathbf{160}_t$ of the at least one particle structure 160 in the first portion 101.

In some non-limiting examples, the second electrode 1240 may extend partially over the patterning coating 130 in a transition region 1315.

In some non-limiting examples, the at least one particle structure $\mathbf{160}_d$ of the discontinuous layer 170 forming the second electrode 1240 may extend partially over the particle structure patterning coating $\mathbf{130}_p$ in the transition region 1315.

Figure 13C:
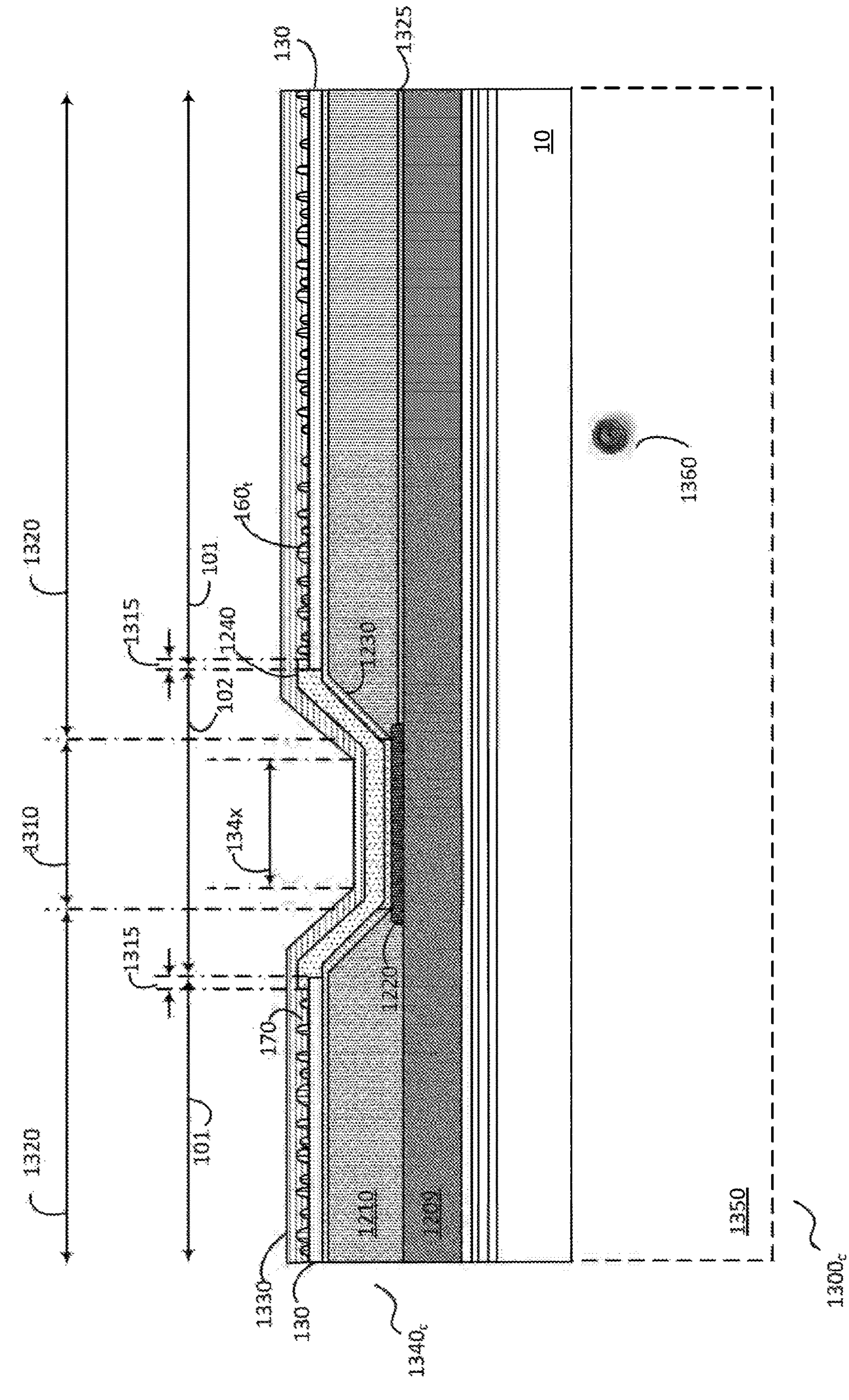

FIG. 13C is a simplified block diagram of an example version $\mathbf{1300}_c$ of the user device 1300. In the display panel $\mathbf{1340}_b$ of FIG. 13B, the at least one TFT structure 1201 for driving the emissive region 1310 in the second portion 102 of the lateral aspect of the display panel $\mathbf{1340}_b$ may be co-located with the emissive region 1310 within the second portion 102 of the lateral aspect of the display panel $\mathbf{1340}_b$ and the first electrode 1220 may extend through the TFT insulating layer 1209 to be electrically coupled through the at least one driving circuit incorporating such at least one TFT structure 1201 to a terminal of the power source 1605 and/or to ground.

By contrast, in the display panel 1340$_c$ of FIG. 13C, there is no TFT structure 1201 co-located with the emissive region 1310 that it drives, within the second portion 102 of the lateral aspect of the face 3401. Accordingly, the first electrode 1220 of the display panel 1340$_c$ does not extend through the TFT insulating layer 1209.

Rather, the at least one TFT structure 1201 for driving the emissive region 1310 in the second portion 102 of the lateral aspect of the display panel 1340$_c$ may be located elsewhere within the lateral aspect thereof (not shown), and a conductive channel 1325 may extend within the lateral aspect of the display panel 1340$_c$ beyond the second portion 102 thereof on an exposed layer surface 11 of the display panel 1340$_c$, which in some non-limiting examples, may be the TFT insulating layer 1209. In some non-limiting examples, the conductive channel 1325 may extend across at least part of the first portion 101 of the lateral aspect of the display panel 1340$_c$. In some non-limiting examples, the conductive channel 1325 may have an average film thickness so as to maximize the transmissivity of EM signals 3461 passing at a non-zero angle to the layers of the face 3401 therethrough. In some non-limiting examples, the conductive channel 1325 may be formed of Cu and/or a TCO.

A series of samples were fabricated to analyze the features of the at least one particle structure 160 formed on the exposed layer surface 11 of the particle structure patterning coating 130$_p$, following exposure of such exposed layer surface 11 to a vapor flux 532 of Ag.

A sample was fabricated by depositing an organic material to provide the particle structure patterning coating 130$_p$ on a silicon (Si) substrate 10. The exposed layer surface 11 of the particle structure patterning coating 130$_p$ was then subjected to a vapor flux 532 of Ag until a reference thickness of 8 nm was reached. Following the exposure of the exposed layer surface 11 of the particle structure patterning coating 130$_p$ to the vapor flux 532, the formation of a discontinuous layer 170 in the form of discrete particle structures 160$_t$ of Ag on the exposed layer surface 11 of the particle structure patterning coating 130$_p$ was observed.

Figure 14B:
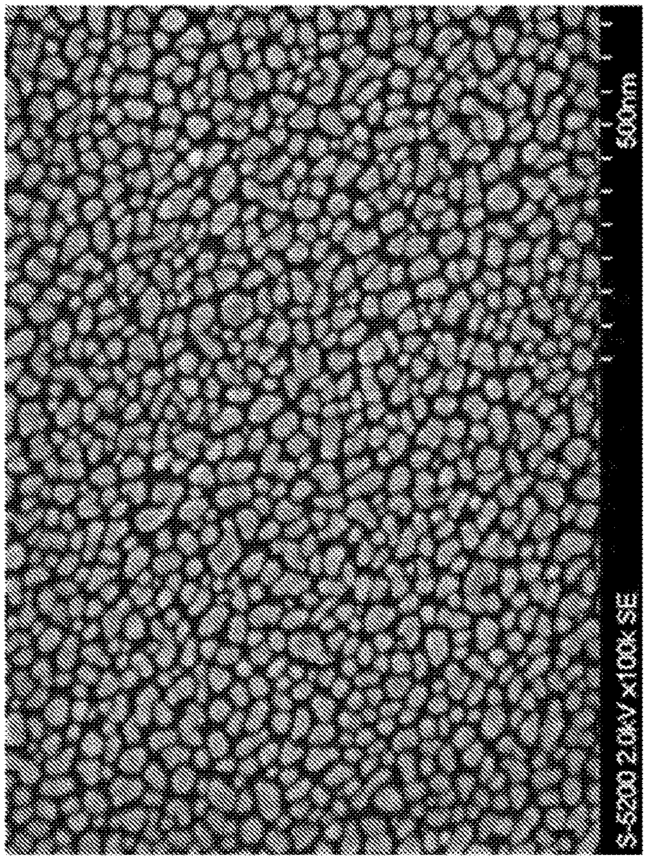
FIGS. 14A-14B are SEM micrographs of samples fabricated in examples of the present disclosure.
Figure 14A:
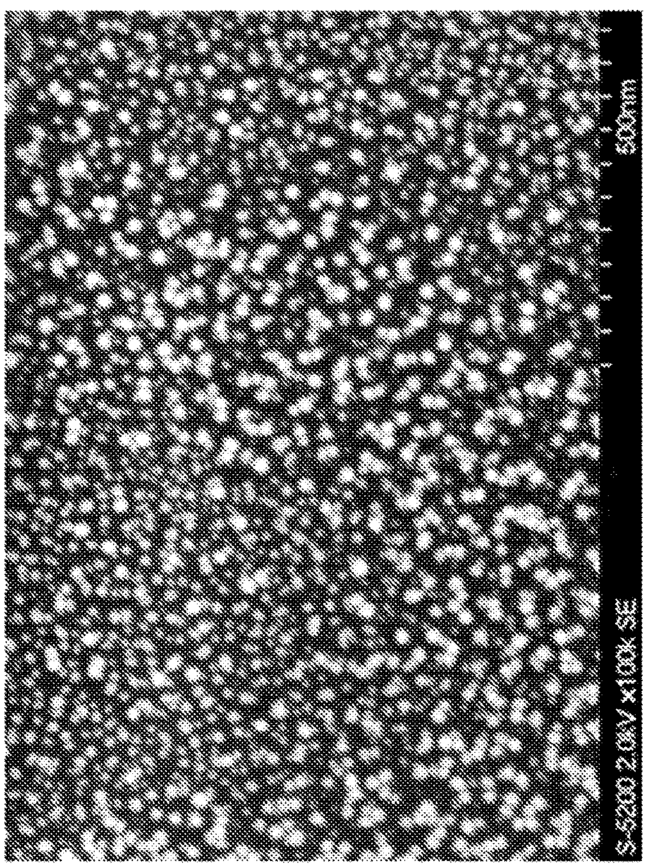
Figure 14C:
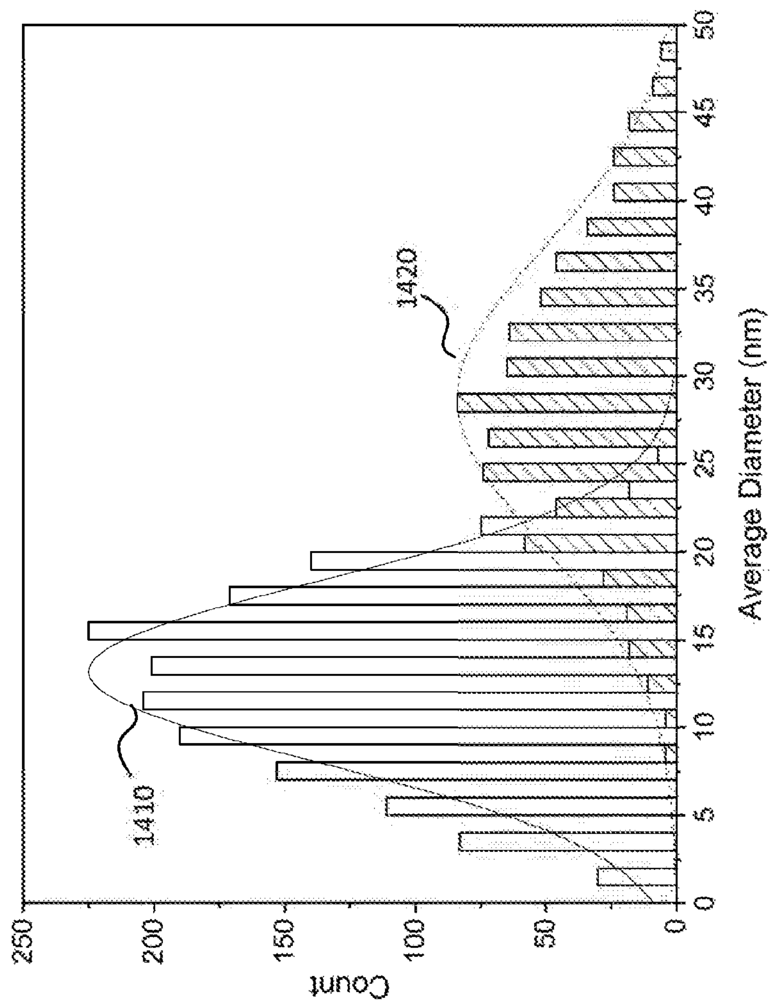
FIG. 14C is a chart of average diameter based on analysis of the micrographs of FIGS. 14A-14B.

The features of such discontinuous layer 170 was characterized by SEM to measure the size of the discrete particle structures 160$_t$ of Ag deposited on the exposed layer surface 11 of the particle structure patterning coating 130$_p$. Specifically, an average diameter of each discrete particle structure 160$_t$ was calculated by measuring the surface area occupied thereby when the exposed layer surface 11 of the particle structure patterning coating 130$_p$ was viewed in plan, and calculating an average diameter upon fitting the area occupied by each particle structures 160$_t$ with a circle having an equivalent area. The SEM micrograph of the sample is shown in FIG. 14A, and FIG. 14C shows a distribution of average diameters 1410 obtained by this analysis. For comparison, a reference sample was prepared in which 8 nm of Ag was deposited directly on an Si substrate 10. The SEM micrograph of such reference sample is shown in FIG. 14B, and analysis 1420 of this micrograph is also reflected in FIG. 14C.

As may be seen, a median size of the discrete Ag particle structures 160$_t$ on the exposed layer surface 11 of the particle structure patterning coating 130$_p$ was found to be approximately 13 nm, while a median grain size of the Ag film deposited on the Si substrate 10 in the reference sample was found to be approximately 28 nm. An area percentage of the exposed layer surface 11 of the particle structure patterning coating 130$_p$ covered by the discrete Ag particle structures 160$_t$ of the discontinuous layer 170 in the analyzed part of the sample was found to be approximately 22.5%, while the percentage of the exposed layer surface 11 of the Si substrate 10 covered by the Ag grains in the reference sample was found to be approximately 48.5%.

Additionally, a glass sample was prepared using substantially identical processes, by depositing a particle structure patterning coating 130$_p$ and a discontinuous layer 170 of Ag particle structures 160$_t$ on a glass substrate 10, and this sample (Sample B) was analyzed in order to determine the effects of the discontinuous layer 170 on transmittance through the sample. Comparative glass samples were fabricated by depositing a particle structure patterning coating 130$_p$ on a glass substrate 10 (Comparative Sample A), and by depositing an 8 nm thick Ag coating directly on a glass substrate 10 (Comparative Sample C). The transmittance of EM radiation, expressed as a percentage of intensity of EM radiation detected upon the EM radiation passing through each sample, was measured at various wavelengths for each sample and summarized in Table 17 below:

TABLE 17

| | Wavelength | | | |
|---|---|---|---|---|
| | 450 nm | 550 nm | 700 nm | 850 nm |
| Comparative Sample A | 90% | 90% | 90% | 90% |
| Sample B | 54% | 80% | 85% | 88% |
| Comparative Sample C | 37% | 30% | 46% | 60% |

As may be seen, Sample B exhibited relatively low EM radiation transmittance of about 54% at a wavelength of 450 nm in the visible spectrum, due to EM radiation absorption caused by the presence of the at least one particle structure 160, while exhibiting a relatively high EM radiation transmittance of about 88% at a wavelength of 850 nm in the NIR spectrum. Since Comparative Sample A exhibited transmittance of about 90% at a wavelength of 850 nm, it will be appreciated that the presence of the at least one particle structure 160 did not substantially attenuate the transmission of EM radiation, including without limitation, EM signals 3461, at such wavelength. Comparative Sample C exhibited a relatively low transmittance of 30-40% in the visible spectrum and a lower transmittance at a wavelength of 850 nm in the NIR spectrum relative to Sample B.

For the purposes of the foregoing analysis, small particle structures 160$_t$ below a threshold area of no more than about: 10 $nm^2$ at a 500 nm scale and of no more than about: 2.5 $nm^2$ at a 200 nm scale were disregarded as these approached the resolution of the images.

Particles in Emissive Region

In some non-limiting examples, a pixel 2810 may comprise a plurality of adjacent sub-pixels 134$x$, where each sub-pixel 134$x$ emits EM radiation having an emission spectrum corresponding to a different wavelength range. Because of the difference in wavelength spectra between adjacent sub-pixels 134$x$, if the physical structures of the emissive regions 1310 corresponding thereto are identical, the optical performance thereof may be different. In some non-limiting examples, the physical structures of the sub-pixels 134$x_i$ of one wavelength range may be varied from the physical structures of the sub-pixels 134$x_j$ of another wavelength range so as to tune the optical performance of the sub-pixels $134x_1$, $134x_j$ to their associated wavelength range. In some non-limiting examples, such tuning may be to provide a relatively consistent optical performance between the sub-pixels 134x of different wavelength ranges. In some non-limiting examples, such tuning may be to accentuate the optical performance of the sub-pixels of a given wavelength range.

One mechanism to tune the optical performance of the sub-pixels 134x of a given wavelength range may take advantage of the ability to control the formation and/or attributes, of a thin disperse layer of particle material, including without limitation, particle structures 160, including without limitation, to enhance emission and/or outcoupling of EM radiation, in some non-limiting examples, in the wavelength range of the EM spectrum associated with such sub-pixels 134x.

Figure 15:
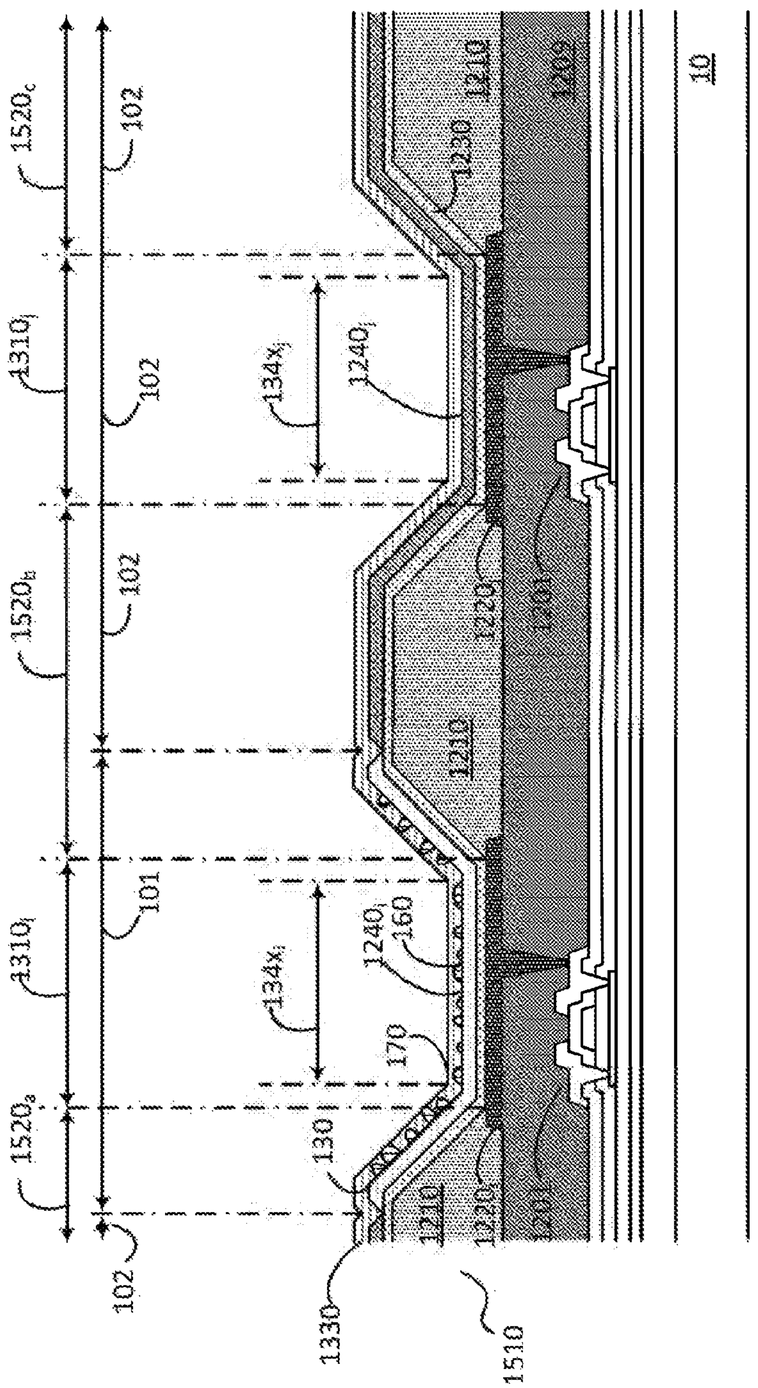
FIG. 15 is a simplified block diagram from a cross-sectional aspect, of an example of an opto-electronic device according to an example in the present disclosure.

Turning now to FIG. 15, there is shown an example version 1510 of the opto-electronic device 1200. In the device 1510, there are shown a plurality of sub-pixels $134x_1$, $134x_j$ corresponding to a common pixel 2810. Those having ordinary skill in the art will appreciate that, although two sub-pixels $134x_1$, $134x_j$ are shown, in some non-limiting examples, the pixel 2810 may have more than two sub-pixels 134x associated therewith. In some non-limiting examples, either of the sub-pixels $134x_1$, $134x_j$ correspond to a R(ed), G(reen), B(lue) or W(hite) wavelength range and the other of the sub-pixels $134x_1$, $134x_j$ may correspond to a different wavelength range.

In some non-limiting examples, the sub-pixels $134x_i$ and $134x_j$ have corresponding emissive regions $1310_i$, $1310_j$. In some non-limiting examples, the emissive region $1310_i$ may be surrounded by at least one non-emissive region $1520_a$, $1520_b$ and the emissive region $1310_j$ may be surrounded by at least one non-emissive region $1520_b$, $1520_c$.

In some non-limiting examples, the first electrode $1220_i$ corresponding to the sub-pixel $134x_i$ and the first electrode $1220_j$ corresponding to the sub-pixel $134x_j$ may be disposed over an exposed layer surface 11 of the device 1510, in some non-limiting examples, within at least a part of the lateral aspect of the corresponding emissive regions $1310_i$, $1310_j$. In some non-limiting examples, at least within the lateral aspect of the emissive regions $1310_i$, $1310_j$, the exposed layer surface 11 may comprise the TFT insulating layer 1209 of the various TFT structures $1201_i$, $1201_j$ that make up the driving circuit for the corresponding emissive regions $1310_i$, $1310_j$. In some non-limiting examples, the first electrode $1220_i$, $1220_j$ may extend through the TFT insulating layer 1209 to be electrically coupled through the respective at least one driving circuit incorporating the corresponding the at least one TFT structure $1201_i$, $1201_j$ to a terminal of the power source 1605 and/or to ground.

In some non-limiting examples, in at least a part of the lateral aspect of such emissive regions $1310_i$, $1310_j$, the at least one semiconducting layer 1230 may be deposited over the exposed layer surface of the device 1510, which may, in some non-limiting examples, comprise the respective first electrodes $1220_i$, $1220_j$.

In some non-limiting examples, the at least one semiconducting layer 1230 may also extend beyond the lateral aspects of the emissive regions $1310_i$, $1310_j$, and at least partially within the lateral aspect of at least one of the surrounding non-emissive regions $1520_a$, $1520_b$, $1520_c$. In some non-limiting examples, the exposed layer surface 11 of the device 1510 in the lateral aspect of the non-emissive regions 1520 may comprise the PDL(s) 1210 corresponding thereto.

In some non-limiting examples, the lateral aspect of the exposed layer surface 11 of the device 1510 may comprise a first portion 101 and a second portion 102, where the first portion 101 extends substantially across the lateral aspect of the emissive region $1310_i$, and the second portion 102 extends substantially across the lateral aspect of at least the emissive region $1310_j$ and of the non-emissive regions 1520.

In some non-limiting examples, the exposed layer surface 11 of the at least one semiconducting layer 1230 may be exposed to a vapor flux 412 of the patterning material 411, including without limitation, using a shadow mask 415, to form a patterning coating 130 as the patterning coating 130, substantially only across the lateral aspect of the emissive region $1310_i$, that is the first portion 101. However, in the second portion 102, the exposed layer surface 11 of the device 1510 may be substantially devoid of the patterning coating 130.

After selective deposition of the patterning coating 130 across the first portion 101, the exposed layer surface 11 of the device 1510 may be exposed to a vapor flux 532 of a deposited material 531, which in some non-limiting examples, may be, and/or comprise similar materials as the particle material, including without limitation, in an open mask and/or mask-free deposition process.

Thus, in some non-limiting examples, a discontinuous layer 170, comprising at least one particle structure 160 may be formed on, and restricted to the exposed layer surface 11 of the patterning coating 130 in the first portion 101, substantially only across the lateral aspect of the emissive region $1310_i$.

In some non-limiting examples, the discontinuous layer 170 may serve as a second electrode $1240_i$.

Where the exposed layer surface 11 of the device 1510 may be substantially devoid of the patterning coating 130, the deposited material 531 may be deposited in the second portion 102, as a deposited layer 140 that is a closed coating 150, which may serve, by way of non-limiting example, as the second electrode $1240_j$ of the corresponding sub-pixel $134x_j$ in the emissive region $1310_j$.

In some non-limiting examples, an average film thickness of the second electrode $1240_j$ in the second portion 102 may be greater than a characteristic size of the particle structures 160 in the first portion 101.

In some non-limiting examples, the deposited material 531 for forming the particle structures 160, in the context of enhancing the emission and/or outcoupling of EM radiation passing at a non-zero angle relative to the layers of the device 1510 through the non-emissive region(s) 1520 thereof, may comprise at least one of: Ag, Au, Cu, or Al.

In some non-limiting examples, the particle structures 160, in the context of enhancing the emission and/or outcoupling of EM radiation passing at a non-zero angle relative to the layers of the device 1510 through the non-emissive region(s) 1520 thereof, may have a characteristic size that lies in a range of at least one between about: 1-500 nm, 10-500 nm, 50-300 nm, 50-500 nm, 100-300 nm, about 1-250 nm, 1-200 nm, 1-180 nm, 1-150 nm, 1-100 nm, 5-150 nm, 5-130 nm, 5-100 nm, or 5-80 nm.

In some non-limiting examples, the particle structures 160, in the context of enhancing the emission and/or outcoupling of EM radiation passing at a non-zero angle relative to the layers of the device 1510 through the non-emissive region(s) 1520 thereof, may have a mean and/or median feature size of at least one of between about: 10-500 nm, 50-300 nm, 50-500 nm, 100-300 nm, 5-130 nm, 10-100 nm, 10-90 nm, 15-90 nm, 20-80 nm, 20-70 nm, or 20-60 nm. By way of non-limiting example, such mean and/or median dimension may correspond to the mean diameter and/or the median diameter of the particle structures 160.

In some non-limiting examples, a majority of the particle structures 160, in the context of enhancing the emission and/or outcoupling of EM radiation passing at a non-zero angle relative to the layers of the device 1510 through the non-emissive region(s) 1520 thereof, may have a maximum feature size of at least one of about: 500 nm, 300 nm, 200 nm, 130 nm, 100 nm, 90 nm, 80 nm, 60 nm, or 50 nm.

In some non-limiting examples, a percentage of the particle structures 160, in the context of enhancing the emission and/or outcoupling of EM radiation passing at a non-zero angle relative to the layers of the device 1510 through the non-emissive region(s) 1520 thereof, that have such a maximum feature size may exceed at least one of about: 50%, 60%, 75%, 80%, 90%, or 95%.

In some non-limiting examples, a maximum threshold percentage coverage, in the context of enhancing the emission and/or outcoupling of EM radiation passing at a non-zero angle relative to the layers of the device 1510 through the non-emissive region(s) 1520 thereof, may be at least one of about: 75%, 60%, 50%, 35%, 30%, 25%, 20%, 15%, or about 10% of the area of the discontinuous layer 170.

In some non-limiting examples, the at least one covering layer 1330 may be deposited at least partially across the lateral extent of the device 1310, in some non-limiting examples, at least partially covering the at least one particle structure 160 and forming an interface with the patterning coating 130 at the exposed layer surface 11 thereof in the emissive region $\mathbf{1310}_i$, and, in some non-limiting examples, covering the second electrode 1240 in the emissive region $\mathbf{1310}_j$, and the non-emissive regions 1520.

Further, the at least one particle structure 160, at an interface between the patterning coating 130, comprising a low refractive index patterning material, and the at least one covering layer 1330, comprising a high refractive index material, may enhance the out-coupling of EM radiation emitted by the emissive region $\mathbf{1310}_i$ through the at least one covering layer 1330.

Opto-Electronic Device

FIG. 16 is a simplified block diagram from a cross-sectional aspect, of an example electro-luminescent device 1600 according to the present disclosure. In some non-limiting examples, the device 1600 is an OLED.

The device 1600 may comprise a substrate 10, upon which a frontplane 1610, comprising a plurality of layers, respectively, a first electrode 1220, at least one semiconducting layer 1230, and a second electrode 1240, are disposed. In some non-limiting examples, the frontplane 1610 may provide mechanisms for photon emission, and/or manipulation of emitted photons.

In some non-limiting examples, the deposited layer 140 and the underlying layer may together form at least a part of at least one of the first electrode 1220 and the second electrode 1240 of the device 1600. In some non-limiting examples, the deposited layer 140 and the underlying layer thereunder may together form at least a part of a cathode of the device 1600.

In some non-limiting examples, the device 1600 may be electrically coupled with a power source 1605. When so coupled, the device 1600 may emit photons as described herein.

Substrate

In some examples, the substrate 10 may comprise a base substrate 1212. In some examples, the base substrate 1212 may be formed of material suitable for use thereof, including without limitation, an inorganic material, including without limitation, Si, glass, metal (including without limitation, a metal foil), sapphire, and/or other inorganic material, and/or an organic material, including without limitation, a polymer, including without limitation, a polyimide, and/or an Si-based polymer. In some examples, the base substrate 1212 may be rigid or flexible. In some examples, the substrate 10 may be defined by at least one planar surface. In some non-limiting examples, the substrate 10 may have at least one surface that supports the remaining frontplane 1610 components of the device 1600, including without limitation, the first electrode 1220, the at least one semiconducting layer 1230, and/or the second electrode 1240.

In some non-limiting examples, such surface may be an organic surface, and/or an inorganic surface.

In some examples, the substrate 10 may comprise, in addition to the base substrate 1212, at least one additional organic, and/or inorganic layer (not shown nor specifically described herein) supported on an exposed layer surface 11 of the base substrate 1212.

In some non-limiting examples, such additional layers may comprise, and/or form at least one organic layer, which may comprise, replace, and/or supplement at least one of the at least one semiconducting layers 1230.

In some non-limiting examples, such additional layers may comprise at least one inorganic layer, which may comprise, and/or form at least one electrode, which in some non-limiting examples, may comprise, replace, and/or supplement the first electrode 1220, and/or the second electrode 1240.

In some non-limiting examples, such additional layers may comprise, and/or be formed of, and/or as a backplane 1615. In some non-limiting examples, the backplane 1615 may contain power circuitry, and/or switching elements for driving the device 1600, including without limitation, electronic TFT structure(s) 1201, and/or component(s) thereof, that may be formed by a photolithography process, which may not be provided under, and/or may precede the introduction of a low pressure (including without limitation, a vacuum) environment.

Backplane and TFT structure(s) embodied therein

In some non-limiting examples, the backplane 1615 of the substrate 10 may comprise at least one electronic, and/or opto-electronic component, including without limitation, transistors, resistors, and/or capacitors, such as which may support the device 1600 acting as an active-matrix, and/or a passive matrix device. In some non-limiting examples, such structures may be a thin-film transistor (TFT) structure 1201.

Non-limiting examples of TFT structures 1201 include top-gate, bottom-gate, n-type and/or p-type TFT structures 1201. In some non-limiting examples, the TFT structure 1201 may incorporate any at least one of amorphous Si (a-Si), indium gallium zinc oxide (IGZO), and/or low-temperature polycrystalline Si (LTPS).

First Electrode

The first electrode 1220 may be deposited over the substrate 10. In some non-limiting examples, the first electrode 1220 may be electrically coupled with a terminal of the power source 1605, and/or to ground. In some non-limiting examples, the first electrode 1220 may be so coupled through at least one driving circuit which in some non-limiting examples, may incorporate at least one TFT structure 1201 in the backplane 1615 of the substrate 10.

In some non-limiting examples, the first electrode 1220 may comprise an anode, and/or a cathode. In some non-limiting examples, the first electrode 1220 may be an anode.

In some non-limiting examples, the first electrode 1220 may be formed by depositing at least one thin conductive film, over (a part of) the substrate 10. In some non-limiting examples, there may be a plurality of first electrodes 1220, disposed in a spatial arrangement over a lateral aspect of the substrate 10. In some non-limiting examples, at least one of such at least one first electrodes 1220 may be deposited over (a part of) a TFT insulating layer 1209 disposed in a lateral aspect in a spatial arrangement. If so, in some non-limiting examples, at least one of such at least one first electrodes 1220 may extend through an opening of the corresponding TFT insulating layer 1209 to be electrically coupled with an electrode of the TFT structures 1201 in the backplane 1615.

In some non-limiting examples, the at least one first electrode 1220, and/or at least one thin film thereof, may comprise various materials, including without limitation, at least one metallic material, including without limitation, Mg, Al, calcium (Ca), Zn, Ag, Cd, Ba, or Yb, or combinations of any plurality thereof, including without limitation, alloys containing any of such materials, at least one metal oxide, including without limitation, a TCO, including without limitation, ternary compositions such as, without limitation, FTO, IZO, or ITO, or combinations of any plurality thereof, or in varying proportions, or combinations of any plurality thereof in at least one layer, any at least one of which may be, without limitation, a thin film.

Second Electrode

The second electrode 1240 may be deposited over the at least one semiconducting layer 1230. In some non-limiting examples, the second electrode 1240 may be electrically coupled with a terminal of the power source 1605, and/or with ground. In some non-limiting examples, the second electrode 1240 may be so coupled through at least one driving circuit, which in some non-limiting examples, may incorporate at least one TFT structure 1201 in the backplane 1615 of the substrate 10.

In some non-limiting examples, the second electrode 1240 may comprise an anode, and/or a cathode. In some non-limiting examples, the second electrode 1240 may be a cathode.

In some non-limiting examples, the second electrode 1240 may be formed by depositing a deposited layer 140, in some non-limiting examples, as at least one thin film, over (a part of) the at least one semiconducting layer 1230. In some non-limiting examples, there may be a plurality of second electrodes 1240, disposed in a spatial arrangement over a lateral aspect of the at least one semiconducting layer 1230.

In some non-limiting examples, the at least one second electrode 1240 may comprise various materials, including without limitation, at least one metallic materials, including without limitation, Mg, Al, Ca, Zn, Ag, Cd, Ba, or Yb, or combinations of any plurality thereof, including without limitation, alloys containing any of such materials, at least one metal oxides, including without limitation, a TCO, including without limitation, ternary compositions such as, without limitation, FTO, IZO, or ITO, or combinations of any plurality thereof, or in varying proportions, or zinc oxide ZnO, or other oxides containing In, or Zn, or combinations of any plurality thereof in at least one layer, and/or at least one non-metallic materials, any at least one of which may be, without limitation, a thin conductive film. In some non-limiting examples, for a Mg:Ag alloy, such alloy composition may range between about 1:9-9:1 by volume.

In some non-limiting examples, the deposition of the second electrode 1240 may be performed using an open mask and/or a mask-free deposition process.

In some non-limiting examples, the second electrode 1240 may comprise a plurality of such layers, and/or coatings. In some non-limiting examples, such layers, and/or coatings may be distinct layers, and/or coatings disposed on top of one another.

In some non-limiting examples, the second electrode 1240 may comprise a Yb/Ag bi-layer coating. By way of non-limiting example, such bi-layer coating may be formed by depositing a Yb coating, followed by an Ag coating. In some non-limiting examples, a thickness of such Ag coating may exceed a thickness of the Yb coating.

In some non-limiting examples, the second electrode 1240 may be a multi-layer electrode 1240 comprising at least one metallic layer, and/or at least one oxide layer.

In some non-limiting examples, the second electrode 1240 may comprise a fullerene and Mg.

By way of non-limiting example, such coating may be formed by depositing a fullerene coating followed by an Mg coating. In some non-limiting examples, a fullerene may be dispersed within the Mg coating to form a fullerene-containing Mg alloy coating. Non-limiting examples of such coatings are described in United States Patent Application Publication No. 2015/0287846 published 8 Oct. 2015, and/or in PCT International Application No. PCT/162017/054970 filed 15 Aug. 2017 and published as WO2018/033860 on 22 Feb. 2018.

Semiconducting Layer

In some non-limiting examples, the at least one semiconducting layer 1230 may comprise a plurality of layers 1631, 1633, 1635, 1637, 1639, any of which may be disposed, in some non-limiting examples, in a thin film, in a stacked configuration, which may include, without limitation, at least one of a hole injection layer (HIL) 1631, a hole transport layer (HTL) 1633, an emissive layer (EML) 1635, an ETL 1637, and/or an electron injection layer (EIL) 1639.

In some non-limiting examples, the at least one semiconducting layer 1230 may form a "tandem" structure comprising a plurality of EMLs 1635. In some non-limiting examples, such tandem structure may also comprise at least one charge generation layer (CGL).

Those having ordinary skill in the relevant art will readily appreciate that the structure of the device 1600 may be varied by omitting, and/or combining at least one of the semiconductor layers 1631, 1633, 1635, 1637, 1639.

Further, any of the layers 1631, 1633, 1635, 1637, 1639 of the at least one semiconducting layer 1230 may comprise any number of sub-layers. Still further, any of such layers 1631, 1633, 1635, 1637, 1639, and/or sub-layer(s) thereof may comprise various mixture(s), and/or composition gradient(s). In addition, those having ordinary skill in the relevant art will appreciate that the device 1600 may comprise at least one layer comprising inorganic, and/or organometallic materials and may not be necessarily limited to devices comprised solely of organic materials. By way of non-limiting example, the device 1600 may comprise at least one QD.

In some non-limiting examples, the HIL 1631 may be formed using a hole injection material, which may facilitate injection of holes by the anode.

In some non-limiting examples, the HTL 1633 may be formed using a hole transport material, which may, in some non-limiting examples, exhibit high hole mobility.

In some non-limiting examples, the ETL 1637 may be formed using an electron transport material, which may, in some non-limiting examples, exhibit high electron mobility.

In some non-limiting examples, the EIL 1639 may be formed using an electron injection material, which may facilitate injection of electrons by the cathode.

In some non-limiting examples, the EML 1635 may be formed, by way of non-limiting example, by doping a host material with at least one emitter material. In some non-limiting examples, the emitter material may be a fluorescent emitter, a phosphorescent emitter, a thermally activated delayed fluorescence (TADF) emitter, and/or a plurality of any combination of these.

In some non-limiting examples, the device 1600 may be an OLED in which the at least one semiconducting layer 1230 comprises at least an EML 1635 interposed between conductive thin film electrodes 1220, 1240, whereby, when a potential difference is applied across them, holes may be injected into the at least one semiconducting layer 1230 through the anode and electrons may be injected into the at least one semiconducting layer 1230 through the cathode, migrate toward the EML 1635 and combine to emit EM radiation in the form of photons.

In some non-limiting examples, the device 1600 may be an electro-luminescent QD device in which the at least one semiconducting layer 1230 may comprise an active layer comprising at least one QD. When current may be provided by the power source 1605 to the first electrode 1220 and second electrode 1240, EM radiation, including without limitation, in the form of photons, may be emitted from the active layer comprising the at least one semiconducting layer 1230 between them.

Those having ordinary skill in the relevant art will readily appreciate that the structure of the device 1600 may be varied by the introduction of at least one additional layer (not shown) at appropriate position(s) within the at least one semiconducting layer 1230 stack, including without limitation, a hole blocking layer (HBL) (not shown), an electron blocking layer (EBL) (not shown), an additional charge transport layer (CTL) (not shown), and/or an additional charge injection layer (CIL) (not shown).

In some non-limiting examples, including where the OLED device 1600 comprises a lighting panel, an entire lateral aspect of the device 1600 may correspond to a single emissive element. As such, the substantially planar cross-sectional profile shown in FIG. 16 may extend substantially along the entire lateral aspect of the device 1600, such that EM radiation is emitted from the device 1600 substantially along the entirety of the lateral extent thereof. In some non-limiting examples, such single emissive element may be driven by a single driving circuit of the device 1600.

In some non-limiting examples, including where the OLED device 1600 comprises a display module, the lateral aspect of the device 1600 may be sub-divided into a plurality of emissive regions 1310 of the device 1600, in which the cross-sectional aspect of the device structure 1600, within each of the emissive region(s) 1310, may cause EM radiation to be emitted therefrom when energized.

Emissive Regions

Figure 17:
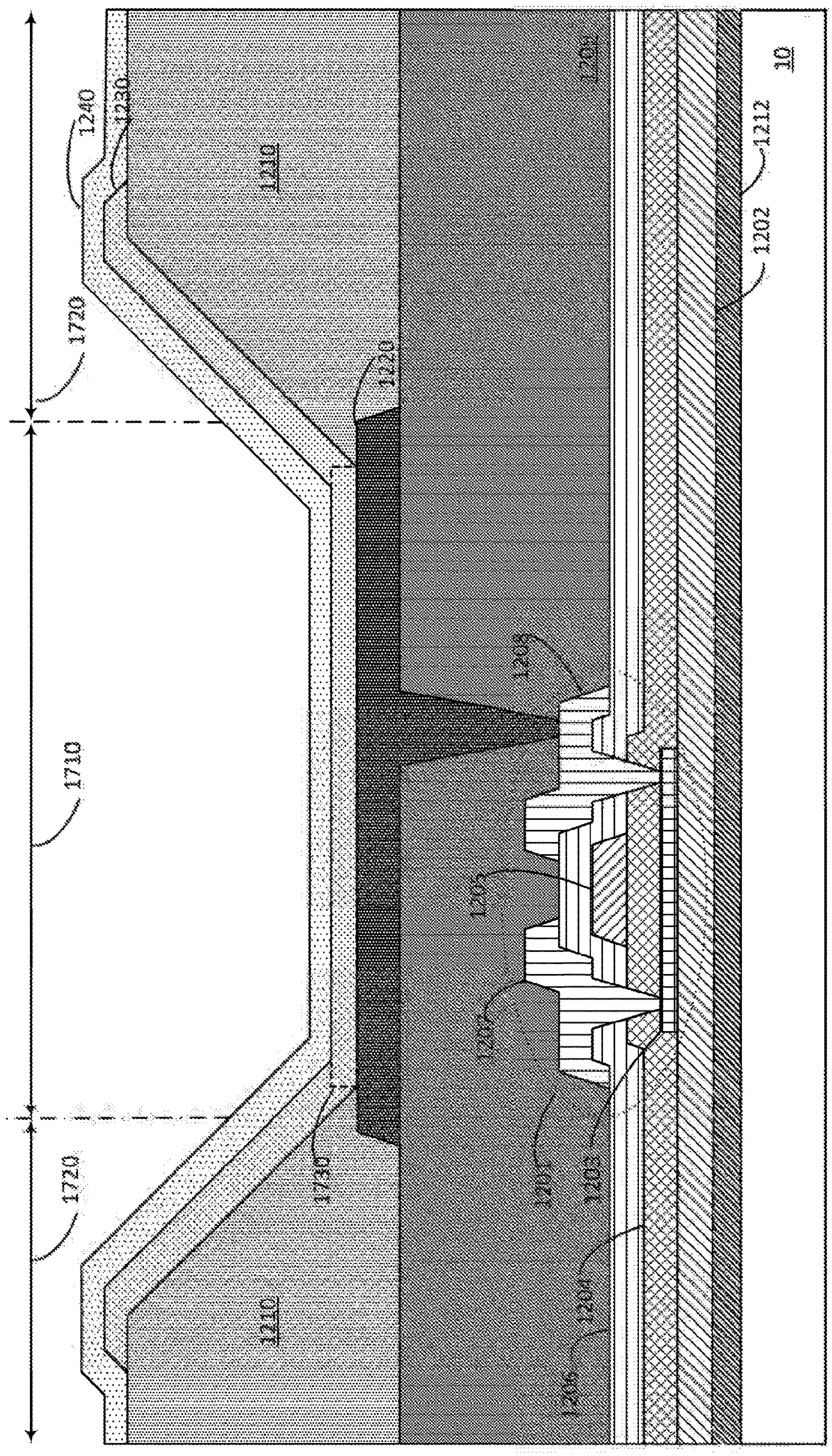
FIG. 17 is a cross-sectional view of the device of FIG. 16.

In some non-limiting examples, such as may be shown by way of non-limiting example in FIG. 17, an active region 1730 of an emissive region 1310 may be defined to be bounded, in the transverse aspect, by the first electrode 1220 and the second electrode 1240, and to be confined, in the lateral aspect, to an emissive region 1310 defined by the first electrode 1220 and the second electrode 1240. Those having ordinary skill in the relevant art will appreciate that the lateral aspect 1710 of the emissive region 1310, and thus the lateral boundaries of the active region 1730, may not correspond to the entire lateral aspect of either, or both, of the first electrode 1220 and the second electrode 1240. Rather, the lateral aspect 1710 of the emissive region 1310 may be substantially no more than the lateral extent of either of the first electrode 1220 and the second electrode 1240. By way of non-limiting example, parts of the first electrode 1220 may be covered by the PDL(s) 1210 and/or parts of the second electrode 1240 may not be disposed on the at least one semiconducting layer 1230, with the result, in either, or both, scenarios, that the emissive region 1310 may be laterally constrained.

In some non-limiting examples, individual emissive regions 1310 of the device 1600 may be laid out in a lateral pattern. In some non-limiting examples, the pattern may extend along a first lateral direction. In some non-limiting examples, the pattern may also extend along a second lateral direction, which in some non-limiting examples, may be substantially normal to the first lateral direction. In some non-limiting examples, the pattern may have a number of elements in such pattern, each element being characterized by at least one feature thereof, including without limitation, a wavelength of EM radiation emitted by the emissive region 1310 thereof, a shape of such emissive region 1310, a dimension (along either, or both of, the first, and/or second lateral direction(s)), an orientation (relative to either, and/or both of the first, and/or second lateral direction(s)), and/or a spacing (relative to either, or both of, the first, and/or second lateral direction(s)) from a previous element in the pattern. In some non-limiting examples, the pattern may repeat in either, or both of, the first and/or second lateral direction(s).

In some non-limiting examples, each individual emissive region 1310 of the device 1600 may be associated with, and driven by, a corresponding driving circuit within the backplane 1615 of the device 1600, for driving an OLED structure for the associated emissive region 1310. In some non-limiting examples, including without limitation, where the emissive regions 1310 may be laid out in a regular pattern extending in both the first (row) lateral direction and the second (column) lateral direction, there may be a signal line in the backplane 1615, corresponding to each row of emissive regions 1310 extending in the first lateral direction and a signal line, corresponding to each column of emissive regions 1310 extending in the second lateral direction. In such a non-limiting configuration, a signal on a row selection line may energize the respective gates of the switching TFT structure(s) 1201 electrically coupled therewith and a signal on a data line may energize the respective sources of the switching TFT structure(s) 1201 electrically coupled therewith, such that a signal on a row selection line/data line pair may electrically couple and energise, by the positive terminal of the power source 1605, the anode of the OLED structure of the emissive region 1310 associated with such pair, causing the emission of a photon therefrom, the cathode thereof being electrically coupled with the negative terminal of the power source 1605.

In some non-limiting examples, each emissive region 1310 of the device 1600 may correspond to a single display pixel 2810. In some non-limiting examples, each pixel 2810 may emit light at a given wavelength spectrum. In some non-limiting examples, the wavelength spectrum may correspond to a colour in, without limitation, the visible spectrum.

In some non-limiting examples, each emissive region 1310 of the device 1600 may correspond to a sub-pixel **134*x* of a display pixel 2810. In some non-limiting examples, a plurality of sub-pixels 134*x* may combine to form, or to represent, a single display pixel 2810**.

In some non-limiting examples, a single display pixel 2810 may be represented by three sub-pixels 134*x*. In some non-limiting examples, the three sub-pixels 134*x* may be denoted as, respectively, R(ed) sub-pixels 1341, G(reen) sub-pixels 1342, and/or B(lue) sub-pixels 1343. In some non-limiting examples, a single display pixel 2810 may be represented by four sub-pixels 134*x*, in which three of such sub-pixels 134*x* may be denoted as R(ed), G(reen) and B(lue) sub-pixels 134*x* and the fourth sub-pixel 134*x* may be denoted as a W(hite) sub-pixel 134*x*. In some non-limiting examples, the emission spectrum of the EM radiation emitted by a given sub-pixel 134*x* may correspond to the colour by which the sub-pixel 134*x* is denoted. In some non-limiting examples, the wavelength of the EM radiation may not correspond to such colour, but further processing may be performed, in a manner apparent to those having ordinary skill in the relevant art, to transform the wavelength to one that does so correspond.

Since the wavelength of sub-pixels 134*x* of different colours may be different, the optical characteristics of such sub-pixels 134*x* may differ, especially if a common electrode 1220, 1240 having a substantially uniform thickness profile may be employed for sub-pixels 134*x* of different colours.

When a common electrode 1220, 1240 having a substantially uniform thickness may be provided as the second electrode 1240 in a device 1600, the optical performance of the device 1600 may not be readily be fine-tuned according to an emission spectrum associated with each (sub-) pixel 2810/134*x*. The second electrode 1240 used in such OLED devices 1600 may in some non-limiting examples, be a common electrode 1220, 1240 coating a plurality of (sub-) pixels 2810/134*x*. By way of non-limiting example, such common electrode 1220, 1240 may be a relatively thin conductive film having a substantially uniform thickness across the device 1600. While efforts have been made in some non-limiting examples, to tune the optical microcavity effects associated with each (sub-) pixel 2810/134*x* color by varying a thickness of organic layers disposed within different (sub-) pixel(s) 2810/134*x*, such approach may, in some non-limiting examples, provide a significant degree of tuning of the optical microcavity effects in at least some cases. In addition, in some non-limiting examples, such approach may be difficult to implement in an OLED display production environment.

As a result, the presence of optical interfaces created by numerous thin-film layers and coatings with different refractive indices, such as may in some non-limiting examples be used to construct opto-electronic devices 1200 including without limitation OLED devices 1600, may create different optical microcavity effects for sub-pixels 134*x* of different colours.

Some factors that may impact an observed microcavity effect in a device 1600 include, without limitation, a total path length (which in some non-limiting examples may correspond to a total thickness (in the longitudinal aspect) of the device 1600 through which EM radiation emitted therefrom will travel before being outcoupled) and the refractive indices of various layers and coatings.

In some non-limiting examples, modulating a thickness of an electrode 1220, 1240 in and across a lateral aspect 1710 of emissive region(s) 1310 of a (sub-) pixel 2810/134*x* may impact the microcavity effect observable. In some non-limiting examples, such impact may be attributable to a change in the total optical path length.

In some non-limiting examples, a change in a thickness of the electrode 1220, 1240 may also change the refractive index of EM radiation passing therethrough, in some non-limiting examples, in addition to a change in the total optical path length. In some non-limiting examples, this may be particularly the case where the electrode 1220, 1240 may be formed of at least one deposited layer 140.

In some non-limiting examples, the optical properties of the device 1600, and/or in some non-limiting examples, across the lateral aspect 1710 of emissive region(s) 1310 of a (sub-) pixel 2810/134*x* that may be varied by modulating at least one optical microcavity effect, may include, without limitation, the emission spectrum, the intensity (including without limitation, luminous intensity), and/or angular distribution of emitted EM radiation, including without limitation, an angular dependence of a brightness, and/or color shift of the emitted EM radiation.

In some non-limiting examples, a sub-pixel 134*x* may be associated with a first set of other sub-pixels 134*x* to represent a first display pixel 2810 and also with a second set of other sub-pixels 134*x* to represent a second display pixel 2810, so that the first and second display pixels 2810 may have associated therewith, the same sub-pixel(s) 134*x*.

The pattern, and/or organization of sub-pixels 134*x* into display pixels 2810 continues to develop. All present and future patterns, and/or organizations are considered to fall within the scope of the present disclosure.

Non-Emissive Regions

In some non-limiting examples, the various emissive regions 1310 of the device 1600 may be substantially surrounded and separated by, in at least one lateral direction, at least one non-emissive region 1520, in which the structure, and/or configuration along the cross-sectional aspect, of the device structure 1600 shown, without limitation, in FIG. 16, may be varied, to substantially inhibit EM radiation to be emitted therefrom. In some non-limiting examples, the non-emissive regions 1520 may comprise those regions in the lateral aspect, that are substantially devoid of an emissive region 1310.

Thus, as shown in the cross-sectional view of FIG. 17, the lateral topology of the various layers of the at least one semiconducting layer 1230 may be varied to define at least one emissive region 1310, surrounded (at least in one lateral direction) by at least one non-emissive region 1520.

In some non-limiting examples, the emissive region 1310 corresponding to a single display (sub-) pixel 2810/134*x* may be understood to have a lateral aspect 1710, surrounded in at least one lateral direction by at least one non-emissive region 1520 having a lateral aspect 1720.

A non-limiting example of an implementation of the cross-sectional aspect of the device 1600 as applied to an emissive region 1310 corresponding to a single display (sub-) pixel 2810/134*x* of an OLED display 1600 will now be described. While features of such implementation are shown to be specific to the emissive region 1310, those having ordinary skill in the relevant art will appreciate that in some non-limiting examples, more than one emissive region 1310 may encompass common features.

In some non-limiting examples, the first electrode 1220 may be disposed over an exposed layer surface 11 of the device 1600, in some non-limiting examples, within at least a part of the lateral aspect 1710 of the emissive region 1310. In some non-limiting examples, at least within the lateral aspect 1710 of the emissive region 1310 of the (sub-) pixel(s) 2810/134*x*, the exposed layer surface 11, may, at the time of deposition of the first electrode 1220, comprise the TFT insulating layer 1209 of the various TFT structures 1201 that make up the driving circuit for the emissive region 1310 corresponding to a single display (sub-) pixel 2810/134*x*.

In some non-limiting examples, the TFT insulating layer 1209 may be formed with an opening extending therethrough to permit the first electrode 1220 to be electrically coupled with one of the TFT electrodes 1205, 1207, 1208, including, without limitation, as shown in FIG. 17, the TFT drain electrode 1208.

Those having ordinary skill in the relevant art will appreciate that the driving circuit comprises a plurality of TFT structures 1201. In FIG. 17, for purposes of simplicity of illustration, only one TFT structure 1201 may be shown, but it will be appreciated by those having ordinary skill in the relevant art, that such TFT structure 1201 may be representative of such plurality thereof and/or at least one component thereof, that comprise the driving circuit.

In a cross-sectional aspect, the configuration of each emissive region 1310 may, in some non-limiting examples, be defined by the introduction of at least one PDL 1210 substantially throughout the lateral aspects 1720 of the surrounding non-emissive region(s) 1520. In some non-limiting examples, the PDLs 1210 may comprise an insulating organic, and/or inorganic material.

In some non-limiting examples, the PDLs 1210 may be deposited substantially over the TFT insulating layer 1209, although, as shown, in some non-limiting examples, the PDLs 1210 may also extend over at least a part of the deposited first electrode 1220, and/or its outer edges.

In some non-limiting examples, as shown in FIG. 17, the cross-sectional thickness, and/or profile of the PDLs 1210 may impart a substantially valley-shaped configuration to the emissive region 1310 of each (sub-) pixel 2810/134*x* by a region of increased thickness along a boundary of the lateral aspect 1720 of the surrounding non-emissive region 1520 with the lateral aspect of the surrounded emissive region 1310, corresponding to a (sub-) pixel 2810/134*x*.

In some non-limiting examples, the profile of the PDLs 1210 may have a reduced thickness beyond such valley-shaped configuration, including without limitation, away from the boundary between the lateral aspect 1720 of the surrounding non-emissive region 1520 and the lateral aspect 1710 of the surrounded emissive region 1310, in some non-limiting examples, substantially well within the lateral aspect 1720 of such non-emissive region 1520.

While the PDL(s) 1210 have been generally illustrated as having a linearly sloped surface to form a valley-shaped configuration that define the emissive region(s) 1310 surrounded thereby, those having ordinary skill in the relevant art will appreciate that in some non-limiting examples, at least one of the shape, aspect ratio, thickness, width, and/or configuration of such PDL(s) 1210 may be varied. By way of non-limiting example, a PDL 1210 may be formed with a more steep or more gradually sloped part. In some non-limiting examples, such PDL(s) 1210 may be configured to extend substantially normally away from a surface on which it is deposited, that may cover at least one edges of the first electrode 1220. In some non-limiting examples, such PDL(s) 1210 may be configured to have deposited thereon at least one semiconducting layer 1230 by a solution-processing technology, including without limitation, by printing, including without limitation, ink-jet printing.

In some non-limiting examples, the at least one semiconducting layer 1230 may be deposited over the exposed layer surface 11 of the device 1600, including at least a part of the lateral aspect 1710 of such emissive region 1310 of the (sub-) pixel(s) 2810/134*x*. In some non-limiting examples, at least within the lateral aspect 1710 of the emissive region 1310 of the (sub-) pixel(s) 2810/134*x*, such exposed layer surface 11, may, at the time of deposition of the at least one semiconducting layer 1230 (and/or layers 1631, 1633, 1635, 1637, 1639 thereof), comprise the first electrode 1220.

In some non-limiting examples, the at least one semiconducting layer 1230 may also extend beyond the lateral aspect 1710 of the emissive region 1310 of the (sub-) pixel(s) 2810/134*x* and at least partially within the lateral aspects 1720 of the surrounding non-emissive region(s) 1520. In some non-limiting examples, such exposed layer surface 11 of such surrounding non-emissive region(s) 1520 may, at the time of deposition of the at least one semiconducting layer 1230, comprise the PDL(s) 1210.

In some non-limiting examples, the second electrode 1240 may be disposed over an exposed layer surface 11 of the device 1600, including at least a part of the lateral aspect 1710 of the emissive region 1310 of the (sub-) pixel(s) 2810/134*x*. In some non-limiting examples, at least within the lateral aspect of the emissive region 1310 of the (sub-) pixel(s) 2810/134*x*, such exposed layer surface 11, may, at the time of deposition of the second electrode 1220, comprise the at least one semiconducting layer 1230.

In some non-limiting examples, the second electrode 1240 may also extend beyond the lateral aspect 1710 of the emissive region 1310 of the (sub-) pixel(s) 2810/134*x* and at least partially within the lateral aspects 1720 of the surrounding non-emissive region(s) 1520. In some non-limiting examples, such exposed layer surface 11 of such surrounding non-emissive region(s) 1520 may, at the time of deposition of the second electrode 1240, comprise the PDL(s) 1210.

In some non-limiting examples, the second electrode 1240 may extend throughout substantially all or a substantial part of the lateral aspects 1720 of the surrounding non-emissive region(s) 1520.

Selective Deposition of Patterned Electrode

In some non-limiting examples, the ability to achieve selective deposition of the deposited material 531 in an open mask and/or mask-free deposition process by the prior selective deposition of a patterning coating 130, may be employed to achieve the selective deposition of a patterned electrode 1220, 1240, 2150, and/or at least one layer thereof, of an opto-electronic device, including without limitation, an OLED device 1600, and/or a conductive element electrically coupled therewith.

In this fashion, the selective deposition of a patterning coating 130 in FIG. 17 using a shadow mask 415, and the open mask and/or mask-free deposition of the deposited material 531, may be combined to effect the selective deposition of at least one deposited layer 140 to form a device feature, including without limitation, a patterned electrode 1220, 1240, 2150, and/or at least one layer thereof, and/or a conductive element electrically coupled therewith, in the device 1600 shown in FIG. 16, without employing a shadow mask 415 within the deposition process for forming the deposited layer 140. In some non-limiting examples, such patterning may permit, and/or enhance the transmissivity of the device 1600.

A number of non-limiting examples of such patterned electrode 1220, 1240, 2150, and/or at least one layer thereof, and/or a conductive element electrically coupled therewith, to impart various structural and/or performance capabilities to such devices 1600 will now be described.

As a result of the foregoing, there may be an aim to selectively deposit, across the lateral aspect 1710 of the emissive region 1310 of a (sub-) pixel 2810/134*x*, and/or the lateral aspect 1720 of the non-emissive region(s) 1520 surrounding the emissive region 1310, a device feature, including without limitation, at least one of the first electrode 1220, the second electrode 1240, the auxiliary electrode 2150, and/or a conductive element electrically coupled therewith, in a pattern, on an exposed layer surface 11 of a frontplane 1610 of the device 1600. In some non-limiting examples, the first electrode 1220, the second electrode 1240, and/or the auxiliary electrode 2150, may be deposited in at least one of a plurality of deposited layers 140.

Figure 18:
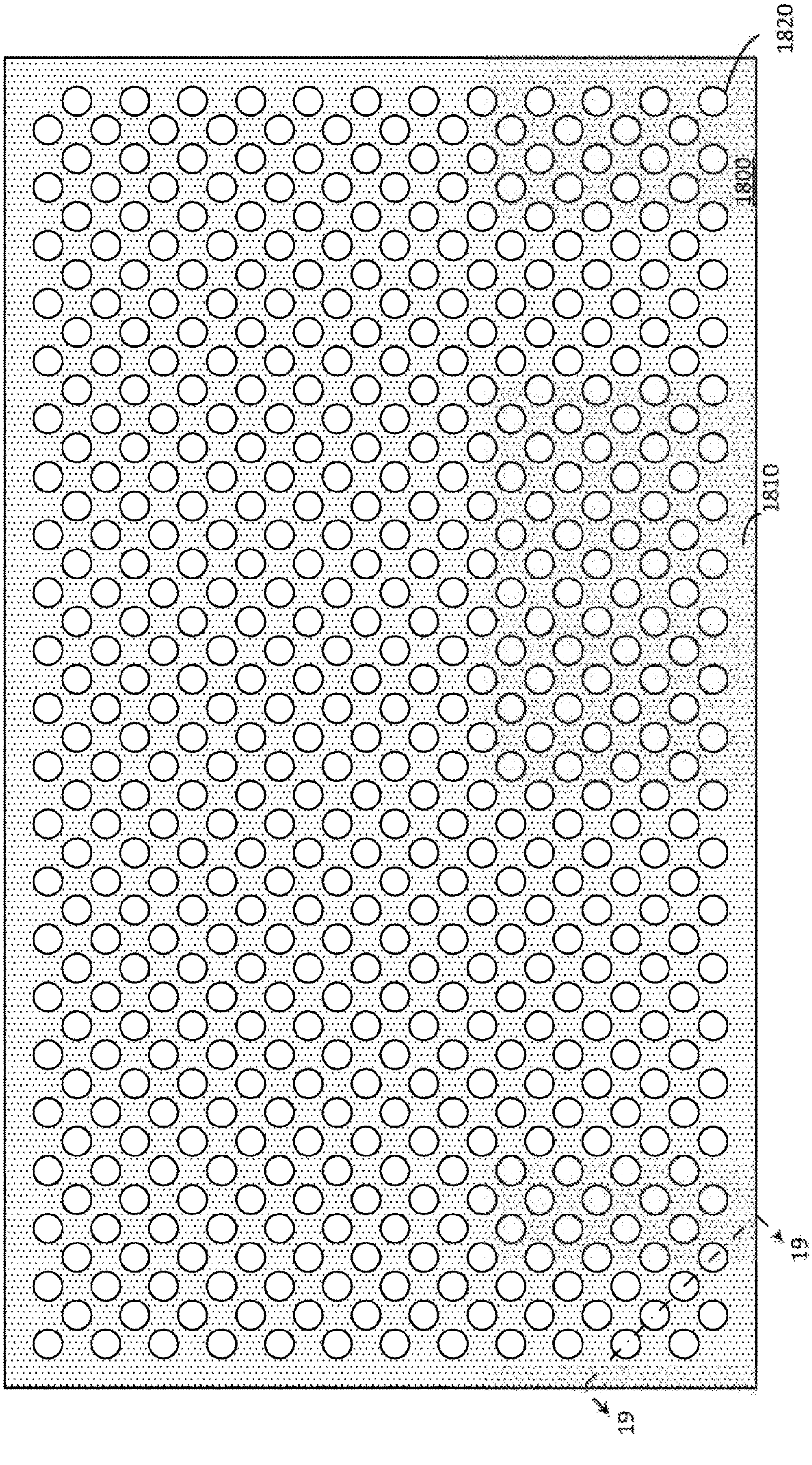
FIG. 18 is a schematic diagram illustrating, in plan, an example patterned electrode suitable for use in a version of the device of FIG. 16, according to an example in the present disclosure.

FIG. 18 may show an example patterned electrode 1800 in plan, in the figure, the second electrode 1240 suitable for use in an example version 1900 (FIG. 19) of the device 1600. The electrode 1800 may be formed in a pattern 1810 that comprises a single continuous structure, having or defining a patterned plurality of apertures 1820 therewithin, in which the apertures 1820 may correspond to regions of the device 1900 where there is no cathode.

In the figure, by way of non-limiting example, the pattern 1810 may be disposed across the entire lateral extent of the device 1900, without differentiation between the lateral aspect(s) 1710 of emissive region(s) 1310 corresponding to (sub-) pixel(s) 2810/134*x* and the lateral aspect(s) 1720 of non-emissive region(s) 1520 surrounding such emissive region(s) 1310. Thus, the example illustrated may correspond to a device 1900 that may be substantially transmissive relative to EM radiation incident on an external surface thereof, such that a substantial part of such externally-incident EM radiation may be transmitted through the device 1900, in addition to the emission (in a top-emission, bottom-emission, and/or double-sided emission) of EM radiation generated internally within the device 1900 as disclosed herein.

The transmittivity of the device 1900 may be adjusted, and/or modified by altering the pattern 1810 employed, including without limitation, an average size of the apertures 1820, and/or a spacing, and/or density of the apertures 1820.

Figure 19:
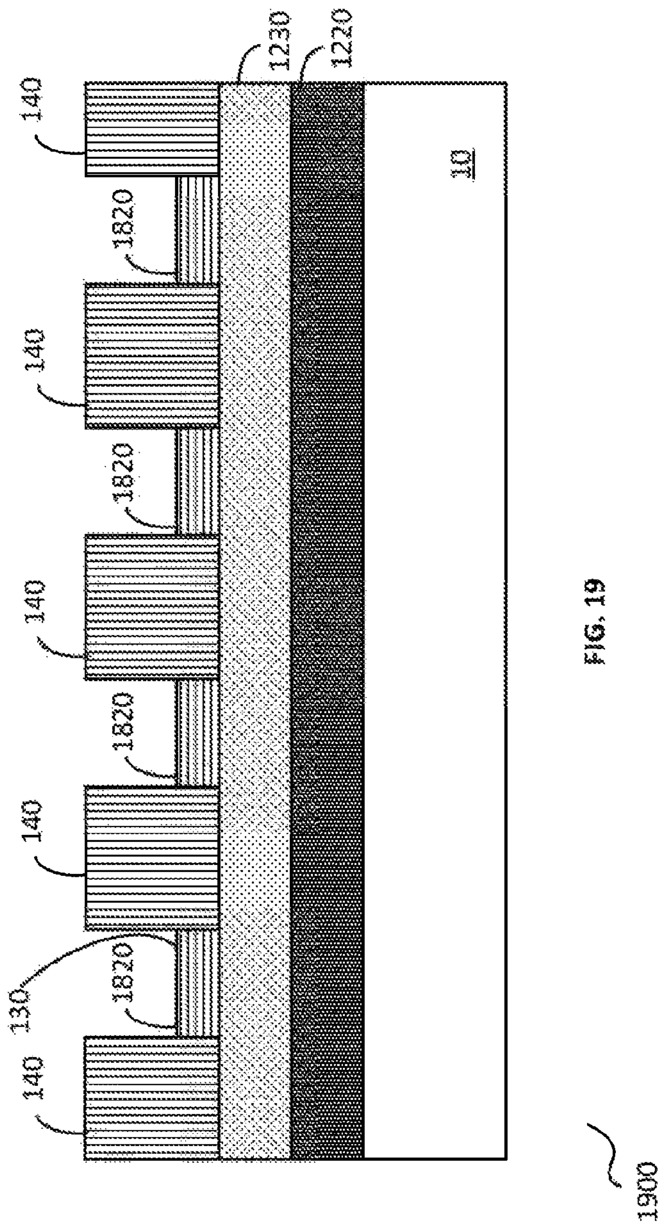
FIG. 19 is a schematic diagram illustrating an example cross-sectional view of the device of FIG. 28 taken along line 18-18.

Turning now to FIG. 19, there may be shown a cross-sectional view of the device 1900, taken along line 19-19 in FIG. 18. In the figure, the device 1900 may be shown as comprising the substrate 10, the first electrode 1220 and the at least one semiconducting layer 1230.

A patterning coating 130 may be selectively disposed in a pattern substantially corresponding to the pattern 1810 on the exposed layer surface 11 of the underlying layer.

A deposited layer 140 suitable for forming the patterned electrode 1800, which in the figure is the second electrode 1240, may be disposed on substantially all of the exposed layer surface 11 of the underlying layer, using an open mask and/or a mask-free deposition process. The underlying layer may comprise both regions of the patterning coating 130, disposed in the pattern 1810, and regions of the at least one semiconducting layer 1230, in the pattern 1810 where the patterning coating 130 has not been deposited. In some non-limiting examples, the regions of the patterning coating 130 may correspond substantially to a first portion 101 comprising the apertures 1820 shown in the pattern 1810.

Because of the nucleation-inhibiting properties of those regions of the pattern 1810 where the patterning coating 130 was disposed (corresponding to the apertures 1820), the deposited material 531 disposed on such regions may tend to not remain, resulting in a pattern of selective deposition of the deposited layer 140, that may correspond substantially to the remainder of the pattern 1810, leaving those regions of the first portion 101 of the pattern 1810 corresponding to the apertures 1820 substantially devoid of a closed coating 150 of the deposited layer 140.

In other words, the deposited layer 140 that will form the cathode may be selectively deposited substantially only on a second portion 102 comprising those regions of the at least one semiconducting layer 1230 that surround but do not occupy the apertures 1820 in the pattern 1810.

Figure 20A:
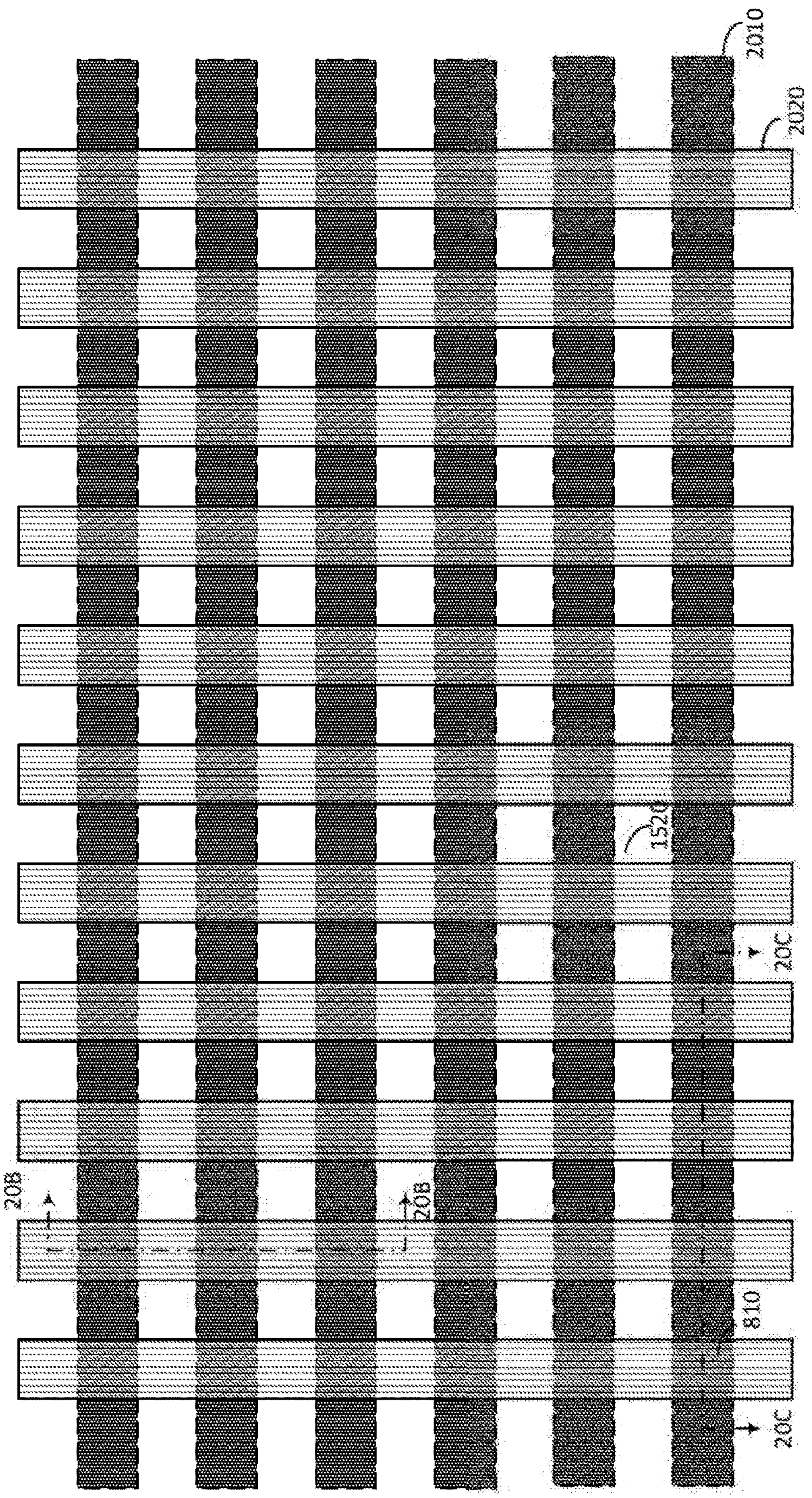
FIG. 20A is a schematic diagram illustrating, in plan view, a plurality of example patterns of electrodes suitable for use in an example version of the device of FIG. 16 according to an example in the present disclosure.

FIG. 20A may show, in plan view, a schematic diagram showing a plurality of patterns 2010, 2020 of electrodes 1220, 1240, 2150.

In some non-limiting examples, the first pattern 2010 may comprise a plurality of elongated, spaced-apart regions that extend in a first lateral direction. In some non-limiting examples, the first pattern 2010 may comprise a plurality of first electrodes 1220. In some non-limiting examples, a plurality of the regions that comprise the first pattern 2010 may be electrically coupled.

In some non-limiting examples, the second pattern 2020 may comprise a plurality of elongated, spaced-apart regions that extend in a second lateral direction. In some non-limiting examples, the second lateral direction may be substantially normal to the first lateral direction. In some non-limiting examples, the second pattern 2020 may comprise a plurality of second electrodes 1240. In some non-limiting examples, a plurality of the regions that comprise the second pattern 2020 may be electrically coupled.

In some non-limiting examples, the first pattern 2010 and the second pattern 2020 may form part of an example version, shown generally at 2000, of the device 1600.

In some non-limiting examples, the lateral aspect(s) 1710 of emissive region(s) 1310 corresponding to (sub-) pixel(s) 2810/134*x* may be formed where the first pattern 2010 overlaps the second pattern 2020. In some non-limiting examples, the lateral aspect(s) 1720 of non-emissive region(s) 1520 may correspond to any lateral aspect other than the lateral aspect(s) 1710.

In some non-limiting examples, a first terminal, which, in some non-limiting examples, may be a positive terminal, of the power source 1605, may be electrically coupled with at least one electrode 1220, 1240, 2150 of the first pattern 2010. In some non-limiting examples, the first terminal may be coupled with the at least one electrode 1220, 1240, 2150 of the first pattern 2010 through at least one driving circuit. In some non-limiting examples, a second terminal, which, in some non-limiting examples, may be a negative terminal, of the power source 1605, may be electrically coupled with at least one electrode 1220, 1240, 2150 of the second pattern 2020. In some non-limiting examples, the second terminal may be coupled with the at least one electrode 1220, 1240, 2150 of the second pattern 2020 through the at least one driving circuit.

Figure 20B:
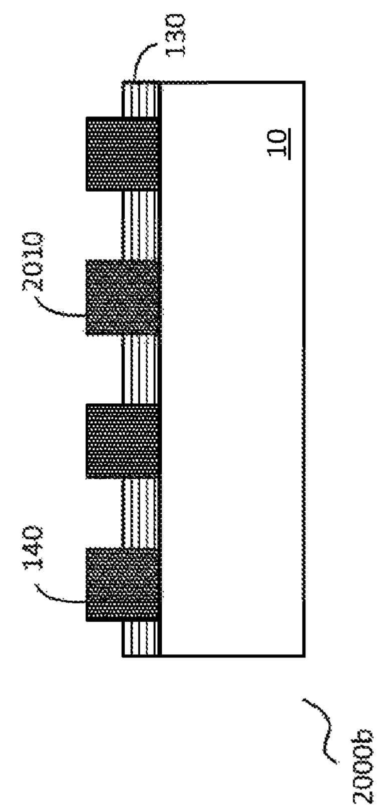
FIG. 20B is a schematic diagram illustrating an example cross-sectional view, at an intermediate stage, of the device of FIG. 20A taken along line 20B-20B.

Turning now to FIG. 20B, there may be shown a cross-sectional view of the device 2000, at a deposition stage 2000*b*, taken along line 20B-20B in FIG. 20A. In the figure, the device 2000 at the stage 2000*b* may be shown as comprising the substrate 10.

A patterning coating 130 may be selectively disposed in a pattern substantially corresponding to the inverse of the first pattern 2010 on the exposed layer surface 11 of the underlying layer, which, as shown in the figure, may be the substrate 10.

A deposited layer 140 suitable for forming the first pattern 2010 of electrode 1220, 1240, 2150, which in the figure is the first electrode 1220, may be disposed on substantially all of the exposed layer surface 11 of the underlying layer, using an open mask and/or a mask-free deposition process. The underlying layer may comprise both regions of the patterning coating 130, disposed in the inverse of the first pattern 2010, and regions of the substrate 10, disposed in the first pattern 2010 where the patterning coating 130 has not been deposited. In some non-limiting examples, the regions of the substrate 10 may correspond substantially to the elongated spaced-apart regions of the first pattern 2010, while the regions of the patterning coating 130 may correspond substantially to a first portion 101 comprising the gaps therebetween.

Because of the nucleation-inhibiting properties of those regions of the first pattern 2010 where the patterning coating 130 was disposed (corresponding to the gaps therebetween), the deposited material 531 disposed on such regions may tend to not remain, resulting in a pattern of selective deposition of the deposited layer 140, that may correspond substantially to elongated spaced-apart regions of the first pattern 2010, leaving a first portion 101 comprising the gaps therebetween substantially devoid of a closed coating 150 of the deposited layer 140.

In other words, the deposited layer 140 that may form the first pattern 2010 of electrode 1220, 1240, 2150 may be selectively deposited substantially only on a second portion 102 comprising those regions of the substrate 10 that define the elongated spaced-apart regions of the first pattern 2010.

Figure 20C:
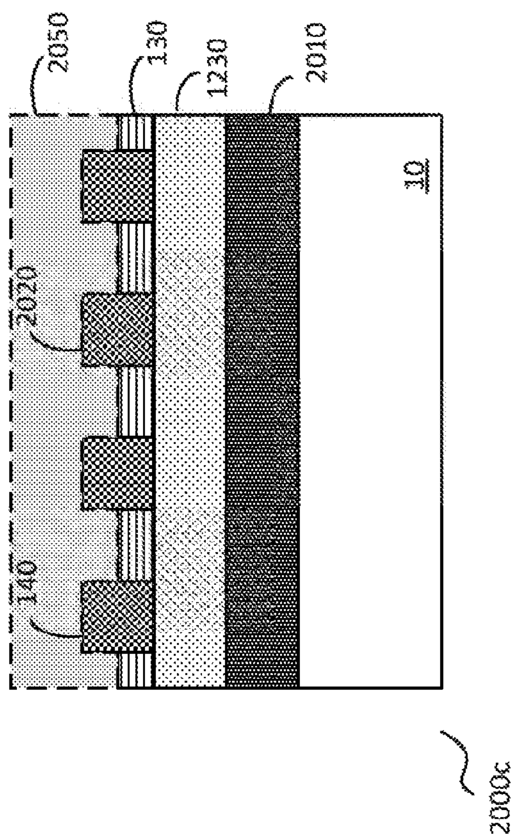
FIG. 20C is a schematic diagram illustrating an example cross-sectional view of the device of FIG. 20A taken along line 20C-20C.

Turning now to FIG. 20C, there may be shown a cross-sectional view 2000*c* of the device 2000, taken along line 20C-20C in FIG. 20A. In the figure, the device 2000 may be shown as comprising the substrate 10, the first pattern 2010 of electrode 1220 deposited as shown in FIG. 20B, and the at least one semiconducting layer(s) 1230.

In some non-limiting examples, the at least one semiconducting layer(s) 1230 may be provided as a common layer across substantially all of the lateral aspect(s) of the device 2000.

A patterning coating 130 may be selectively disposed in a pattern substantially corresponding to the second pattern 2020 on the exposed layer surface 11 of the underlying layer, which, as shown in the figure, is the at least one semiconducting layer 1230.

A deposited layer 140 suitable for forming the second pattern 2020 of electrode 1220, 1240, 2150, which in the figure is the second electrode 1240, may be disposed on substantially all of the exposed layer surface 11 of the underlying layer, using an open mask and/or a mask-free deposition process. The underlying layer may comprise both regions of the patterning coating 130, disposed in the inverse of the second pattern 2020, and regions of the at least one semiconducting layer(s) 1230, in the second pattern 2020 where the patterning coating 130 has not been deposited. In some non-limiting examples, the regions of the at least one semiconducting layer(s) 1230 may correspond substantially to a first portion 101 comprising the elongated spaced-apart regions of the second pattern 2020, while the regions of the patterning coating 130 may correspond substantially to the gaps therebetween.

Because of the nucleation-inhibiting properties of those regions of the second pattern 2020 where the patterning coating 130 was disposed (corresponding to the gaps therebetween), the deposited layer 140 disposed on such regions may tend not to remain, resulting in a pattern of selective deposition of the deposited layer 140, that may correspond substantially to elongated spaced-apart regions of the second pattern 2020, leaving the first portion 101 comprising the gaps therebetween substantially devoid of a closed coating 150 of the deposited layer 140.

In other words, the deposited layer 140 that may form the second pattern 2020 of electrode 1220, 1240, 2150 may be selectively deposited substantially only on a second portion 102 comprising those regions of the at least one semiconducting layer 1230 that define the elongated spaced-apart regions of the second pattern 2020.

In some non-limiting examples, an average layer thickness of the patterning coating 130 and of the deposited layer 140 deposited thereafter for forming either, or both, of the first pattern 2010, and/or the second pattern 2020 of electrode 1220, 1240 may be varied according to a variety of parameters, including without limitation, a given application and given performance characteristics. In some non-limiting examples, the average layer thickness of the patterning coating 130 may be comparable to, and/or substantially less than an average layer thickness of the deposited layer 140 deposited thereafter. Use of a relatively thin patterning coating 130 to achieve selective patterning of a deposited layer 140 deposited thereafter may be suitable to provide flexible devices 1600. In some non-limiting examples, a relatively thin patterning coating 130 may provide a relatively planar surface on which a barrier coating 2050 may be deposited. In some non-limiting examples, providing such a relatively planar surface for application of the barrier coating 2050 may increase adhesion of the barrier coating 2050 to such surface.

At least one of the first pattern 2010 of electrode 1220, 1240, 2150 and at least one of the second pattern 2020 of electrode 1220, 1240, 2150 may be electrically coupled with the power source 1605, whether directly, and/or, in some non-limiting examples, through their respective driving circuit(s) to control EM radiation emission from the lateral aspect(s) 1710 of the emissive region(s) 1310 corresponding to (sub-) pixel(s) 2810/134*x*.

Auxiliary Electrode

Those having ordinary skill in the relevant art will appreciate that the process of forming the second electrode 1240 in the second pattern 2020 shown in FIGS. 20A-20C may, in some non-limiting examples, be used in similar fashion to form an auxiliary electrode 2150 for the device 1600. In some non-limiting examples, the second electrode 1240 thereof may comprise a common electrode, and the auxiliary electrode 2150 may be deposited in the second pattern 2020, in some non-limiting examples, above or in some non-limiting examples below, the second electrode 1240 and electrically coupled therewith. In some non-limiting examples, the second pattern 2020 for such auxiliary electrode 2150 may be such that the elongated spaced-apart regions of the second pattern 2020 lie substantially within the lateral aspect(s) 1720 of non-emissive region(s) 1520 surrounding the lateral aspect(s) 1710 of emissive region(s) 1310 corresponding to (sub-) pixel(s) 2810/134*x*. In some non-limiting examples, the second pattern 2020 for such auxiliary electrodes 2150 may be such that the elongated spaced-apart regions of the second pattern 2020 lie substantially within the lateral aspect(s) 1710 of emissive region(s) 1310 corresponding to (sub-) pixel(s) 2810/134*x*, and/or the lateral aspect(s) 1720 of non-emissive region(s) 1520 surrounding them.

Figure 21:
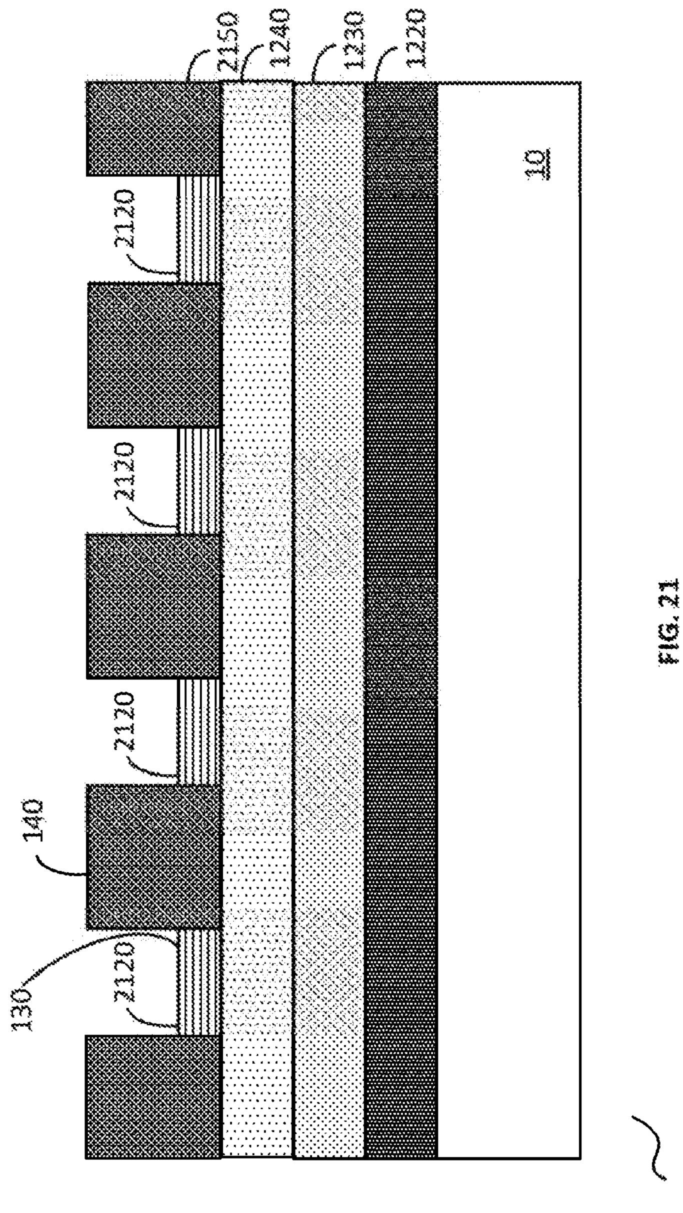
FIG. 21 is a schematic diagram illustrating a cross-sectional view of an example version of the device of FIG. 16, having an example patterned auxiliary electrode according to an example in the present disclosure.

FIG. 21 may show an example cross-sectional view of an example version 2100 of the device 1600 that is substantially similar thereto, but further may comprise at least one auxiliary electrode 2150 disposed in a pattern above and electrically coupled (not shown) with the second electrode 1240.

The auxiliary electrode 2150 may be electrically conductive. In some non-limiting examples, the auxiliary electrode 2150 may be formed by at least one metal, and/or metal oxide. Non-limiting examples of such metals include Cu, Al, Mo, or Ag. By way of non-limiting example, the auxiliary electrode 2150 may comprise a multi-layer metallic structure, including without limitation, one formed by Mo/Al/Mo. Non-limiting examples of such metal oxides include ITO, ZnO, IZO, or other oxides containing In, or Zn. In some non-limiting examples, the auxiliary electrode 2150 may comprise a multi-layer structure formed by a combination of at least one metal and at least one metal oxide, including without limitation, Ag/ITO, Mo/ITO, ITO/Ag/ITO, or ITO/Mo/ITO. In some non-limiting examples, the auxiliary electrode 2150 comprises a plurality of such electrically conductive materials.

The device 2100 may be shown as comprising the substrate 10, the first electrode 1220 and the at least one semiconducting layer 1230.

The second electrode 1240 may be disposed on substantially all of the exposed layer surface 11 of the at least one semiconducting layer 1230.

In some non-limiting examples, particularly in a top-emission device 2100, the second electrode 1240 may be formed by depositing a relatively thin conductive film layer (not shown) in order, by way of non-limiting example, to reduce optical interference (including, without limitation, attenuation, reflections, and/or diffusion) related to the presence of the second electrode 1240. In some non-limiting examples, as discussed elsewhere, a reduced thickness of the second electrode 1240, may generally increase a sheet resistance of the second electrode 1240, which may, in some non-limiting examples, reduce the performance, and/or efficiency of the device 2100. By providing the auxiliary electrode 2150 that may be electrically coupled with the second electrode 1240, the sheet resistance and thus, the IR drop associated with the second electrode 1240, may, in some non-limiting examples, be decreased.

In some non-limiting examples, the device 2100 may be a bottom-emission, and/or double-sided emission device 2100. In such examples, the second electrode 1240 may be formed as a relatively thick conductive layer without substantially affecting optical characteristics of such a device 2100. Nevertheless, even in such scenarios, the second electrode 1240 may nevertheless be formed as a relatively thin conductive film layer (not shown), by way of non-limiting example, so that the device 2100 may be substantially transmissive relative to EM radiation incident on an external surface thereof, such that a substantial part of such externally-incident EM radiation may be transmitted through the device 2100, in addition to the emission of EM radiation generated internally within the device 2100 as disclosed herein.

A patterning coating 130 may be selectively disposed in a pattern on the exposed layer surface 11 of the underlying layer, which, as shown in the figure, may be the second electrode 1240. In some non-limiting examples, as shown in the figure, the patterning coating 130 may be disposed, in a first portion 101 of the pattern, as a series of parallel rows 2120 that may correspond to the lateral aspects 1720 of the non-emissive regions 1520.

A deposited layer 140, suitable for forming the patterned auxiliary electrode 2150, may be disposed on substantially all of the exposed layer surface 11 of the underlying layer, using an open mask and/or a mask-free deposition process. The underlying layer may comprise both regions of the patterning coating 130, disposed in the pattern of rows 2120, and regions of the second electrode 1240 where the patterning coating 130 has not been deposited.

Because of the nucleation-inhibiting properties of those rows 2120 where the patterning coating 130 was disposed, the deposited material 531 disposed on such rows 2120 may tend to not remain, resulting in a pattern of selective deposition of the deposited layer 140, that may correspond substantially to at least one second portion 102 of the pattern, leaving the first portion 101 comprising the rows 2120 substantially devoid of a closed coating 150 of the deposited layer 140.

In other words, the deposited layer 140 that may form the auxiliary electrode 2150 may be selectively deposited substantially only on a second portion 102 comprising those regions of the at least one semiconducting layer 1230, that surround but do not occupy the rows 2120.

In some non-limiting examples, selectively depositing the auxiliary electrode 2150 to cover only certain rows 2120 of the lateral aspect of the device 2100, while other regions thereof remain uncovered, may control, and/or reduce optical interference related to the presence of the auxiliary electrode 2150.

In some non-limiting examples, the auxiliary electrode 2150 may be selectively deposited in a pattern that may not be readily detected by the naked eye from a typical viewing distance.

In some non-limiting examples, the auxiliary electrode 2150 may be formed in devices other than OLED devices, including for decreasing an effective resistance of the electrodes of such devices.

The ability to pattern electrodes 1220, 1240, 2150, including without limitation, the second electrode 1240, and/or the auxiliary electrode 2150 without employing a shadow mask 415 during the high-temperature deposited layer 140 deposition process by employing a patterning coating 130, including without limitation, the process depicted in FIG. 5, may allow numerous configurations of auxiliary electrodes 2150 to be deployed.

In some non-limiting examples, the auxiliary electrode 2150 may be disposed between neighbouring emissive regions 1310 and electrically coupled with the second electrode 1240. In non-limiting examples, a width of the auxiliary electrode 2150 may be less than a separation distance between the neighbouring emissive regions 1310. As a result, there may exist a gap within the at least one non-emissive region 1520 on each side of the auxiliary electrode 2150. In some non-limiting examples, such an arrangement may reduce a likelihood that the auxiliary electrode 2150 would interfere with an optical output of the device 2100, in some non-limiting examples, from at least one of the emissive regions 1310. In some non-limiting examples, such an arrangement may be appropriate where the auxiliary electrode 2150 is relatively thick (in some non-limiting examples, greater than several hundred nm, and/or on the order of a few microns in thickness). In some non-limiting examples, an aspect ratio of the auxiliary electrode 2150 may exceed about 0.05, such as at least one of at least about: 0.1, 0.2, 0.5, 0.8, 1, or 2. By way of non-limiting example, a height (thickness) of the auxiliary electrode 2150 may exceed about 50 nm, such as at least one of at least about: 80 nm, 100 nm, 200 nm, 500 nm, 700 nm, 1,000 nm, 1,500 nm, 1,700 nm, or 2,000 nm.

Figure 22:
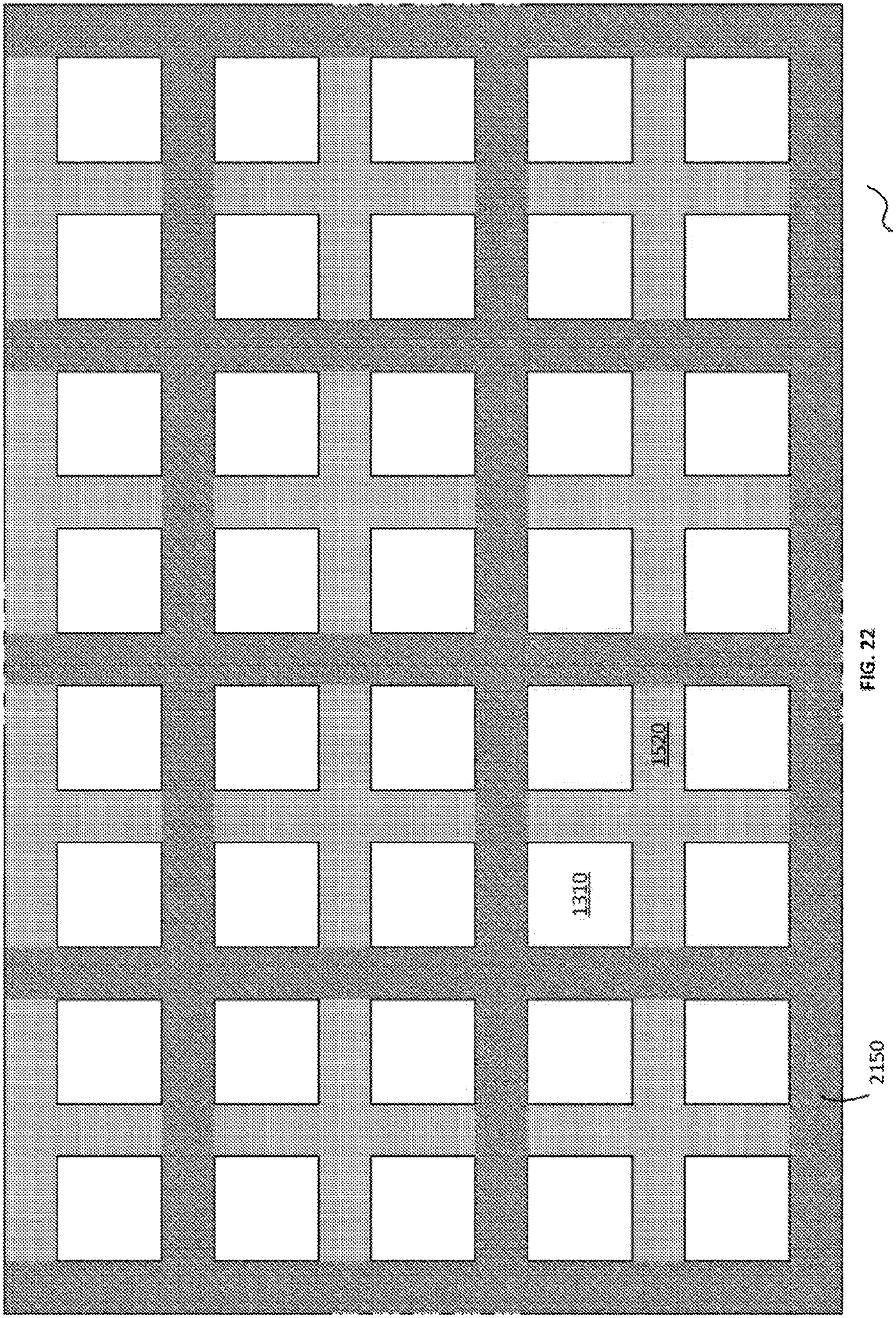
FIG. 22 is a schematic diagram illustrating, in plan view an example pattern of an auxiliary electrode overlaying at least one emissive region and at least one non-emissive region according to an example in the present disclosure.

FIG. 22 may show, in plan view, a schematic diagram showing an example of a pattern 2150 of the auxiliary electrode 2150 formed as a grid that may be overlaid over both the lateral aspects 1710 of emissive regions 1310, which may correspond to (sub-) pixel(s) 2810/134*x* of an example version 2200 of the device 1600, and the lateral aspects 1720 of non-emissive regions 1520 surrounding the emissive regions 1310.

In some non-limiting examples, the auxiliary electrode pattern 2150 may extend substantially only over some but not all of the lateral aspects 1720 of non-emissive regions 1520, to not substantially cover any of the lateral aspects 1710 of the emissive regions 1310.

Those having ordinary skill in the relevant art will appreciate that while, in the figure, the pattern 2150 of the auxiliary electrode 2150 may be shown as being formed as a continuous structure such that all elements thereof are both physically connected to and electrically coupled with one another and electrically coupled with at least one electrode 1220, 1240, 2150, which in some non-limiting examples may be the first electrode 1220, and/or the second electrode 1240, in some non-limiting examples, the pattern 2150 of the auxiliary electrode 2150 may be provided as a plurality of discrete elements of the pattern 2150 of the auxiliary electrode 2150 that, while remaining electrically coupled with one another, may not be physically connected to one another. Even so, such discrete elements of the pattern 2150 of the auxiliary electrode 2150 may still substantially lower a sheet resistance of the at least one electrode 1220, 1240, 2150 with which they are electrically coupled, and consequently of the device 2200, to increase an efficiency of the device 2200 without substantially interfering with its optical characteristics.

In some non-limiting examples, auxiliary electrodes 2150 may be employed in devices 2200 with a variety of arrangements of (sub-) pixel(s) 2810/134*x*. In some non-limiting examples, the (sub-) pixel 2810/134*x* arrangement may be substantially diamond-shaped.

Figure 23A:
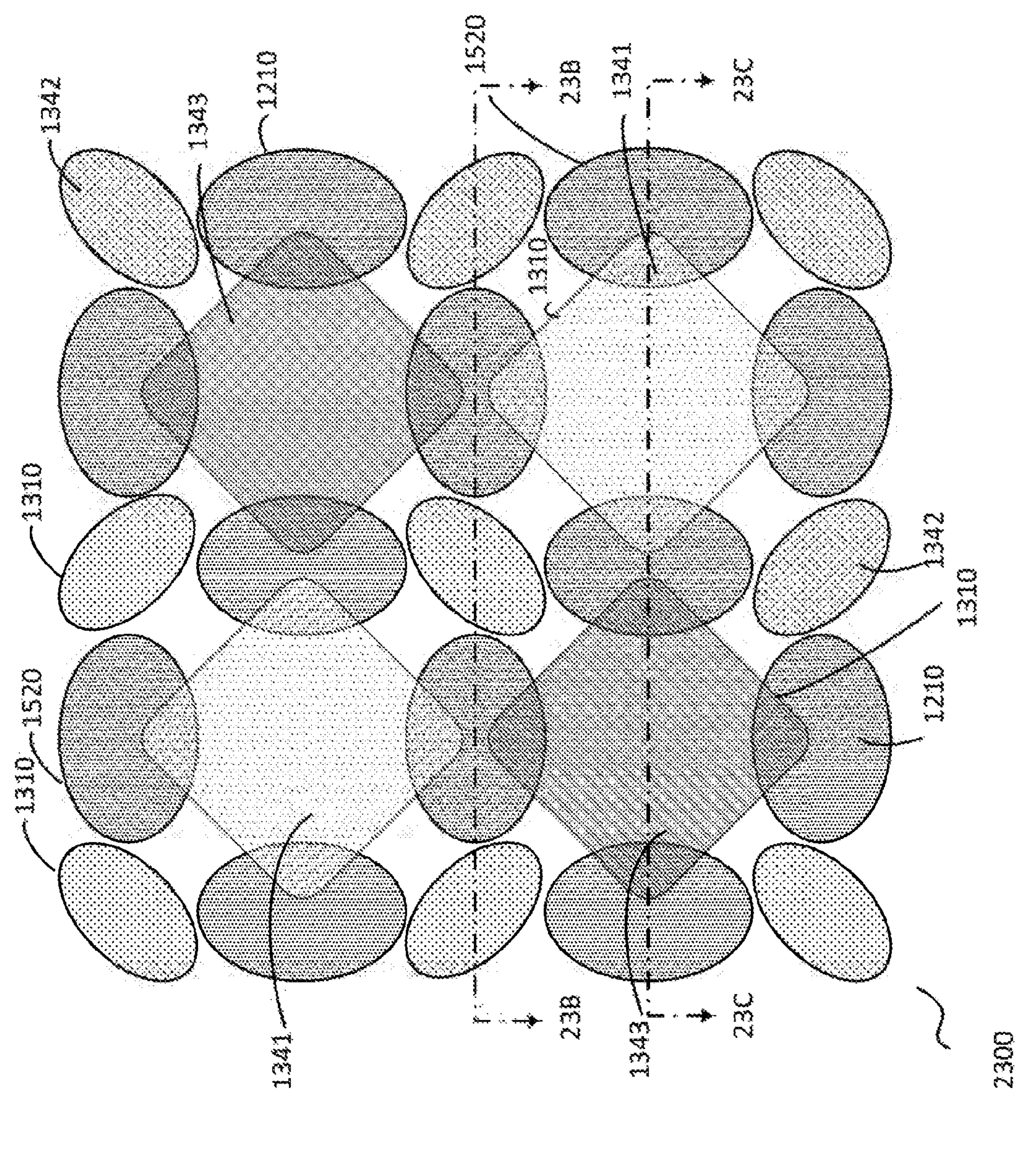
FIG. 23A is a schematic diagram illustrating, in plan view, an example pattern of an example version of the device of FIG. 16 having a plurality of groups of emissive regions in a diamond configuration according to an example in the present disclosure.

By way of non-limiting example, FIG. 23A may show, in plan, in an example version 2300 of device 1600, a plurality of groups 1341-1343 of emissive regions 1310 each corresponding to a sub-pixel 134*x*, surrounded by the lateral aspects of a plurality of non-emissive regions 1520 comprising PDLs 1210 in a diamond configuration. In some non-limiting examples, the configuration may be defined by patterns 1141-1143 of emissive regions 1310 and PDLs 1210 in an alternating pattern of first and second rows.

In some non-limiting examples, the lateral aspects 1720 of the non-emissive regions 1520 comprising PDLs 1210 may be substantially elliptically shaped. In some non-limiting examples, the major axes of the lateral aspects 1720 of the non-emissive regions 1520 in the first row may be aligned and substantially normal to the major axes of the lateral aspects 1720 of the non-emissive regions 1520 in the second row. In some non-limiting examples, the major axes of the lateral aspects 1720 of the non-emissive regions 1520 in the first row may be substantially parallel to an axis of the first row.

In some non-limiting examples, a first group 1341 of emissive regions 1310 may correspond to sub-pixels 134*x* that emit EM radiation at a first wavelength, in some non-limiting examples the sub-pixels 134*x* of the first group 1341 may correspond to R(ed) sub-pixels 1341. In some non-limiting examples, the lateral aspects 1710 of the emissive regions 1310 of the first group 1341 may have a substantially diamond-shaped configuration. In some non-limiting examples, the emissive regions 1310 of the first group 1341 may lie in the pattern of the first row, preceded and followed by PDLs 1210. In some non-limiting examples, the lateral aspects 1710 of the emissive regions 1310 of the first group 1341 may slightly overlap the lateral aspects 1720 of the preceding and following non-emissive regions 1520 comprising PDLs 1210 in the same row, as well as of the lateral aspects 1720 of adjacent non-emissive regions 1520 comprising PDLs 1210 in a preceding and following pattern of the second row.

In some non-limiting examples, a second group 1342 of emissive regions 1310 may correspond to sub-pixels 134*x* that emit EM radiation at a second wavelength, in some non-limiting examples the sub-pixels 134*x* of the second group 1342 may correspond to G(reen) sub-pixels 1342. In some non-limiting examples, the lateral aspects 1710 of the emissive regions 1310 of the second group 1342 may have a substantially elliptical configuration. In some non-limiting examples, the emissive regions 1310 of the second group 1341 may lie in the pattern of the second row, preceded and followed by PDLs 1210. In some non-limiting examples, a major axis of some of the lateral aspects 1710 of the emissive regions 1310 of the second group 1342 may be at a first angle, which in some non-limiting examples, may be 45° relative to an axis of the second row. In some non-limiting examples, a major axis of others of the lateral aspects 1710 of the emissive regions 1310 of the second group 1342 may be at a second angle, which in some non-limiting examples may be substantially normal to the first angle. In some non-limiting examples, the emissive regions 1310 of the second group 1342, whose lateral aspects 1710 may have a major axis at the first angle, may alternate with the emissive regions 1310 of the second group 1342, whose lateral aspects 1710 may have a major axis at the second angle.

In some non-limiting examples, a third group 1343 of emissive regions 1310 may correspond to sub-pixels 134*x* that emit EM radiation at a third wavelength, in some non-limiting examples the sub-pixels 134*x* of the third group 1343 may correspond to B(lue) sub-pixels 1343. In some non-limiting examples, the lateral aspects 1710 of the emissive regions 1310 of the third group 1343 may have a substantially diamond-shaped configuration. In some non-limiting examples, the emissive regions 1310 of the third group 1343 may lie in the pattern of the first row, preceded and followed by PDLs 1210. In some non-limiting examples, the lateral aspects 1710 of the emissive regions 1310 of the third group 1343 may slightly overlap the lateral aspects 1720 of the preceding and following non-emissive regions 1520 comprising PDLs 1210 in the same row, as well as of the lateral aspects 1720 of adjacent non-emissive regions 1520 comprising PDLs 1210 in a preceding and following pattern of the second row. In some non-limiting examples, the pattern of the second row may comprise emissive regions 1310 of the first group 1341 alternating emissive regions 1310 of the third group 1343, each preceded and followed by PDLs 1210.

Figure 23B:
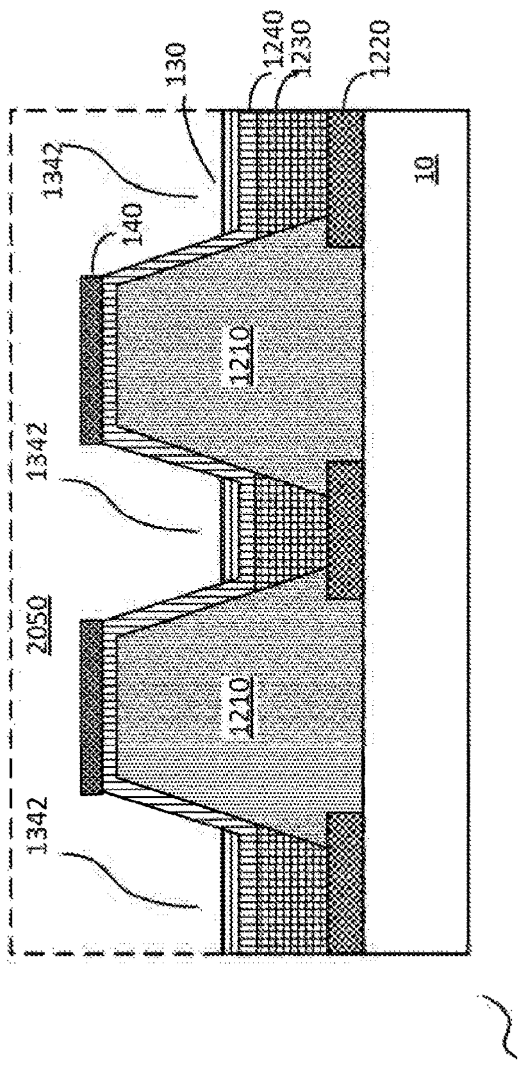
FIG. 23B is a schematic diagram illustrating an example cross-sectional view of the device of FIG. 23A taken along line 23B-23B.

Turning now to FIG. 23B, there may be shown an example cross-sectional view of the device 2300, taken along line 23B-23B in FIG. 23A. In the figure, the device 2300 may be shown as comprising a substrate 10 and a plurality of elements of a first electrode 1220, formed on an exposed layer surface 11 thereof. The substrate 10 may comprise the base substrate 1212 (not shown for purposes of simplicity of illustration), and/or at least one TFT structure 1201 (not shown for purposes of simplicity of illustration), corresponding to and for driving each sub-pixel 134*x*. PDLs 1210 may be formed over the substrate 10 between elements of the first electrode 1220, to define emissive region(s) 1310 over each element of the first electrode 1220, separated by non-emissive region(s) 1520 comprising the PDL(s) 1210. In the figure, the emissive region(s) 1310 may all correspond to the second group 1342.

In some non-limiting examples, at least one semiconducting layer 1230 may be deposited on each element of the first electrode 1220, between the surrounding PDLs 1210.

In some non-limiting examples, a second electrode 1240, which in some non-limiting examples, may be a common cathode, may be deposited over the emissive region(s) 1310 of the second group 1342 to form the G(reen) sub-pixel(s) 1342 thereof and over the surrounding PDLs 1210.

In some non-limiting examples, a patterning coating 130 may be selectively deposited over the second electrode 1240 across the lateral aspects 1710 of the emissive region(s) 1310 of the second group 1342 of G(reen) sub-pixels 1342 to allow selective deposition of a deposited layer 140 over parts of the second electrode 1240 that may be substantially devoid of the patterning coating 130, namely across the lateral aspects 1720 of the non-emissive region(s) 1520 comprising the PDLs 1210. In some non-limiting examples, the deposited layer 140 may tend to accumulate along the substantially planar parts of the PDLs 1210, as the deposited layer 140 may tend to not remain on the inclined parts of the PDLs 1210 but may tend to descend to a base of such inclined parts, which may be coated with the patterning coating 130. In some non-limiting examples, the deposited layer 140 on the substantially planar parts of the PDLs 1210 may form at least one auxiliary electrode 2150 that may be electrically coupled with the second electrode 1240.

In some non-limiting examples, the device 2300 may comprise a CPL 1215, and/or an outcoupling layer. By way of non-limiting example, such CPL 1215, and/or outcoupling layer may be provided directly on a surface of the second electrode 1240, and/or a surface of the patterning coating 130. In some non-limiting examples, such CPL 1215, and/or outcoupling layer may be provided across the lateral aspect of at least one emissive region 1310 corresponding to a (sub-) 2810/134*x*.

In some non-limiting examples, the patterning coating 130 may also act as an index-matching coating. In some non-limiting examples, the patterning coating 130 may also act as an outcoupling layer.

In some non-limiting examples, the device 2300 may comprise an encapsulation layer 2050. Non-limiting examples of such encapsulation layer 2050 include a glass cap, a barrier film, a barrier adhesive, a barrier coating 2050, and/or a TFE layer such as shown in dashed outline in the figure, provided to encapsulate the device 2300. In some non-limiting examples, the TFE layer 2050 may be considered a type of barrier coating 2050.

In some non-limiting examples, the encapsulation layer 2050 may be arranged above at least one of the second electrode 1240, and/or the patterning coating 130. In some non-limiting examples, the device 2300 may comprise additional optical, and/or structural layers, coatings, and components, including without limitation, a polarizer, a color filter, an anti-reflection coating, an anti-glare coating, cover glass, and/or an optically clear adhesive (OCA).

Figure 23C:
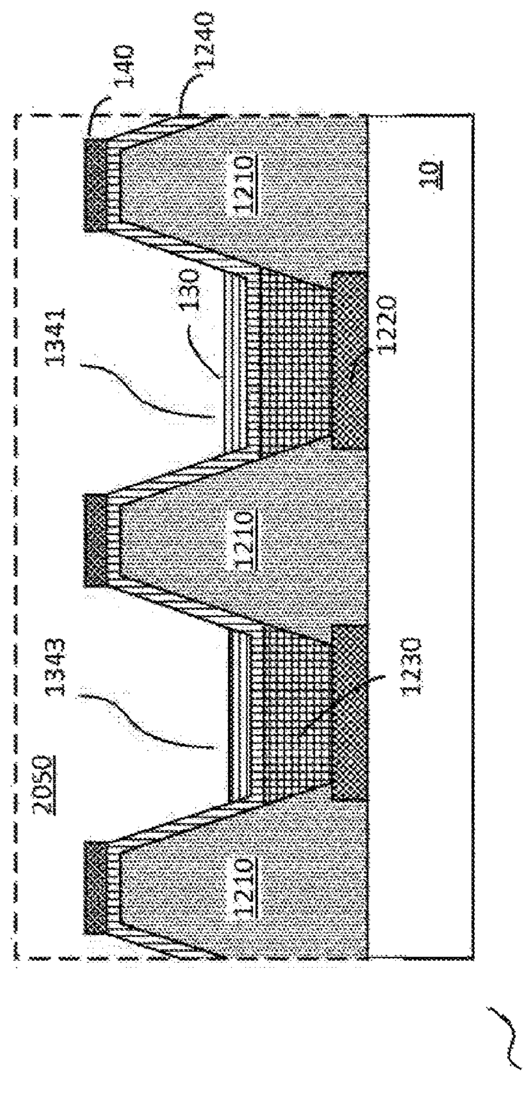
FIG. 23C is a schematic diagram illustrating an example cross-sectional view of the device of FIG. 23A taken along line 23C-23C.

Turning now to FIG. 23C, there may be shown an example cross-sectional view of the device 2300, taken along line 23C-23C in FIG. 23A. In the figure, the device 2300 may be shown as comprising a substrate 10 and a plurality of elements of a first electrode 1220, formed on an exposed layer surface 11 thereof. PDLs 1210 may be formed over the substrate 10 between elements of the first electrode 1220, to define emissive region(s) 1310 over each element of the first electrode 1220, separated by non-emissive region(s) 1520 comprising the PDL(s) 1210. In the figure, the emissive region(s) 1310 may correspond to the first group 1341 and to the third group 1343 in alternating fashion.

In some non-limiting examples, at least one semiconducting layer 1230 may be deposited on each element of the first electrode 1220, between the surrounding PDLs 1210.

In some non-limiting examples, a second electrode 1240, which in some non-limiting examples, may be a common cathode, may be deposited over the emissive region(s) 1310 of the first group 1341 to form the R(ed) sub-pixel(s) 1341 thereof, over the emissive region(s) 1310 of the third group 1343 to form the B(lue) sub-pixel(s) 1343 thereof, and over the surrounding PDLs 1210.

In some non-limiting examples, a patterning coating 130 may be selectively deposited over the second electrode 1240 across the lateral aspects 1710 of the emissive region(s) 1310 of the first group 1341 of R(ed) sub-pixels 1341 and of the third group 1343 of B(lue) sub-pixels 1343 to allow selective deposition of a deposited layer 140 over parts of the second electrode 1240 that may be substantially devoid of the patterning coating 130, namely across the lateral aspects 1720 of the non-emissive region(s) 1520 comprising the PDLs 1210. In some non-limiting examples, the deposited layer 140 may tend to accumulate along the substantially planar parts of the PDLs 1210, as the deposited layer 140 may tend to not remain on the inclined parts of the PDLs 1210 but may tend to descend to a base of such inclined parts, which are coated with the patterning coating 130. In some non-limiting examples, the deposited layer 140 on the substantially planar parts of the PDLs 1210 may form at least one auxiliary electrode 2150 that may be electrically coupled with the second electrode 1240.

Figure 24:
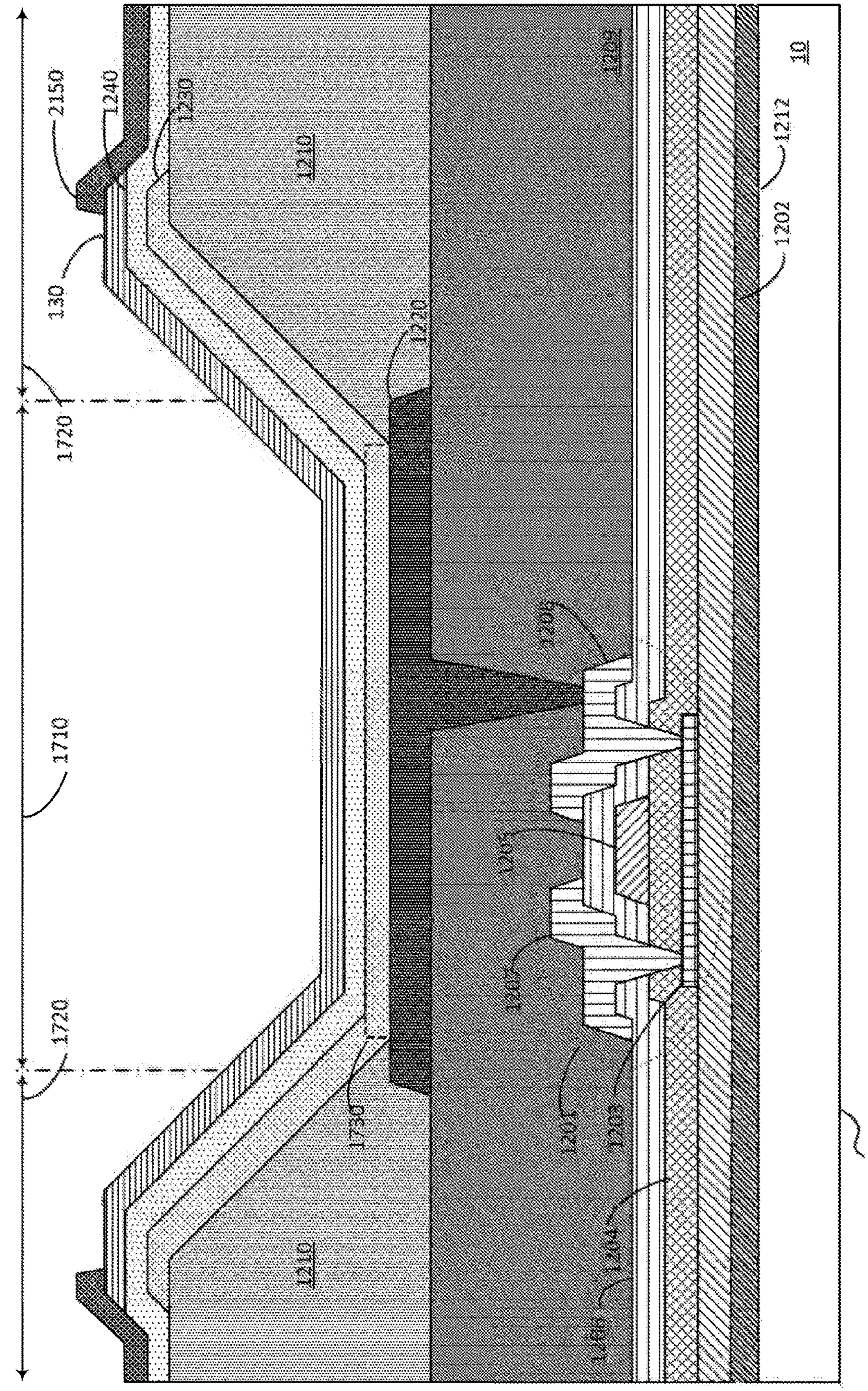
FIG. 24 is a schematic diagram illustrating an example cross-sectional view of an example version of the device of FIG. 17 with additional example deposition steps according to an example in the present disclosure.

Turning now to FIG. 24, there may be shown an example version 2400 of the device 1600, which may encompass the device shown in cross-sectional view in FIG. 17, but with additional deposition steps that are described herein.

The device 2400 may show a patterning coating 130 selectively deposited over the exposed layer surface 11 of the underlying layer, in the figure, the second electrode 1240, within a first portion 101 of the device 2400, corresponding substantially to the lateral aspect 1710 of emissive region(s) 1310 corresponding to (sub-) pixel(s) 2810/134*x* and not within a second portion 102 of the device 2400, corresponding substantially to the lateral aspect(s) 1720 of non-emissive region(s) 1520 surrounding the first portion 101.

In some non-limiting examples, the patterning coating 130 may be selectively deposited using a shadow mask 415.

The patterning coating 130 may provide, within the first portion 101, an exposed layer surface 11 with a relatively low initial sticking probability against deposition of a deposited material 531 to be thereafter deposited as a deposited layer 140 to form an auxiliary electrode 2150.

After selective deposition of the patterning coating 130, the deposited material 531 may be deposited over the device 2400 but may remain substantially only within the second portion 102, which may be substantially devoid of any patterning coating 130, to form the auxiliary electrode 2150.

In some non-limiting examples, the deposited material 531 may be deposited using an open mask and/or a mask-free deposition process.

The auxiliary electrode 2150 may be electrically coupled with the second electrode 1240 to reduce a sheet resistance of the second electrode 1240, including, as shown, by lying above and in physical contact with the second electrode 1240 across the second portion that may be substantially devoid of any patterning coating 130.

In some non-limiting examples, the deposited layer 140 may comprise substantially the same material as the second electrode 1240, to ensure a high initial sticking probability against deposition of the deposited material 531 in the second portion 102.

In some non-limiting examples, the second electrode 1240 may comprise substantially pure Mg, and/or an alloy of Mg and another metal, including without limitation, Ag. In some non-limiting examples, an Mg:Ag alloy composition may range from about 1:9-9:1 by volume. In some non-limiting examples, the second electrode 1240 may comprise metal oxides, including without limitation, ternary metal oxides, such as, without limitation, ITO, and/or IZO, and/or a combination of metals, and/or metal oxides.

In some non-limiting examples, the deposited layer 140 used to form the auxiliary electrode 2150 may comprise substantially pure Mg.

Figure 25:
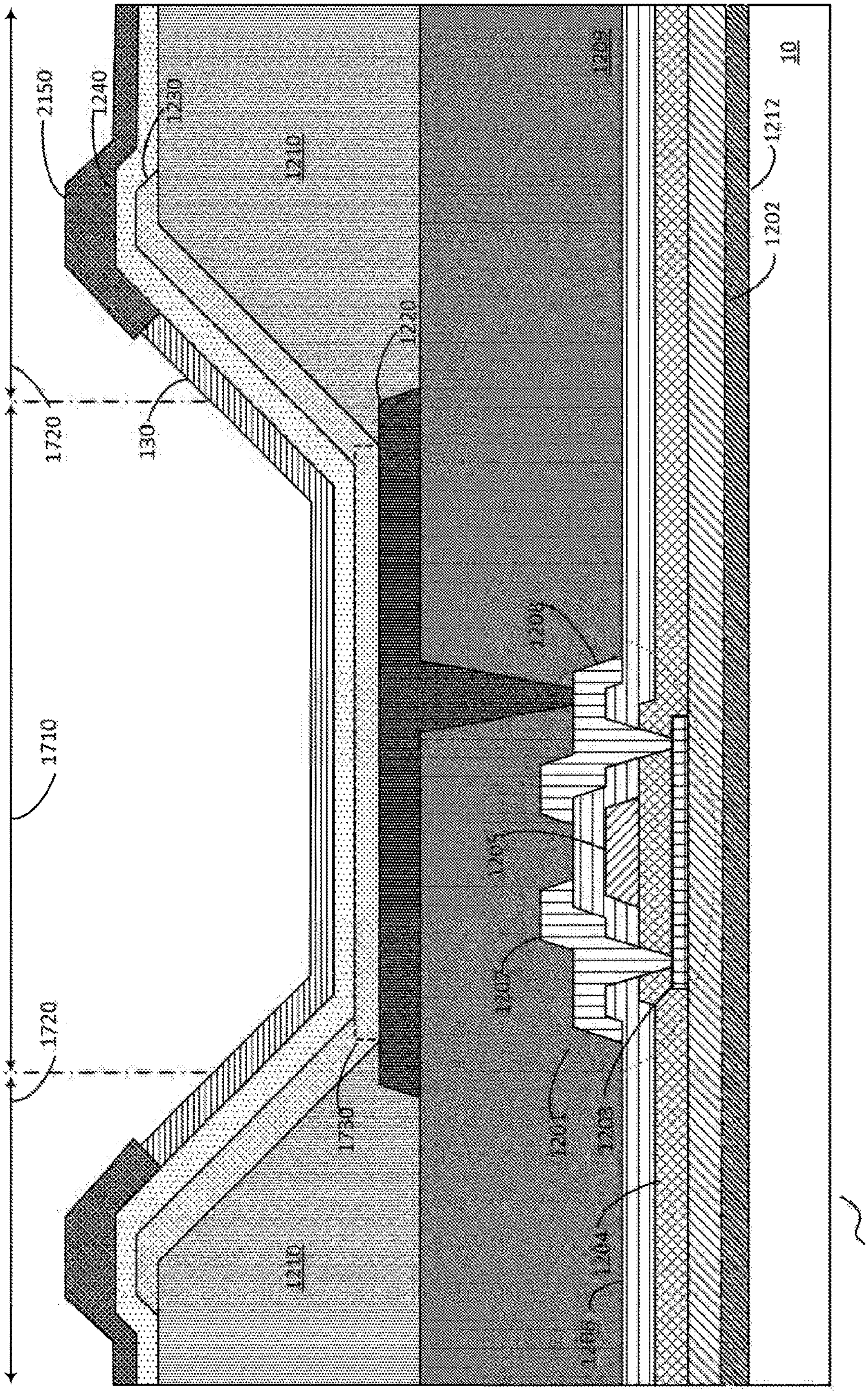
FIG. 25 is a schematic diagram illustrating an example cross-sectional view of an example version of the device of FIG. 17 with additional example deposition steps according to an example in the present disclosure.

Turning now to FIG. 25, there may be shown an example version 2500 of the device 1600, which may encompass the device shown in cross-sectional view in FIG. 17, but with additional deposition steps that are described herein.

The device 2500 may show a patterning coating 130 selectively deposited over the exposed layer surface 11 of the underlying layer, in the figure, the second electrode 1240, within a first portion 101 of the device 2500, corresponding substantially to a part of the lateral aspect 1710 of emissive region(s) 1310 corresponding to (sub-) pixel(s) 2810/134*x*, and not within a second portion 102. In the figure, the first portion 101 may extend partially along the extent of an inclined part of the PDLs 1210 defining the emissive region(s) 1310.

In some non-limiting examples, the patterning coating 130 may be selectively deposited using a shadow mask 415.

The patterning coating 130 may provide, within the first portion 101, an exposed layer surface 11 with a relatively low initial sticking probability against deposition of a deposited material 531 to be thereafter deposited as a deposited layer 140 to form an auxiliary electrode 2150.

After selective deposition of the patterning coating 130, the deposited material 531 may be deposited over the device 2500 but may remain substantially only within the second portion 102, which may be substantially devoid of patterning coating 130, to form the auxiliary electrode 2150. As such, in the device 2500, the auxiliary electrode 2150 may extend partly across the inclined part of the PDLs 1210 defining the emissive region(s) 1310.

In some non-limiting examples, the deposited layer 140 may be deposited using an open mask and/or a mask-free deposition process.

The auxiliary electrode 2150 may be electrically coupled with the second electrode 1240 to reduce a sheet resistance of the second electrode 1240, including, as shown, by lying above and in physical contact with the second electrode 1240 across the second portion 102 that may be substantially devoid of patterning coating 130.

In some non-limiting examples, the material of which the second electrode 1240 may be comprised, may not have a high initial sticking probability against deposition of the deposited material 531.

Figure 26:
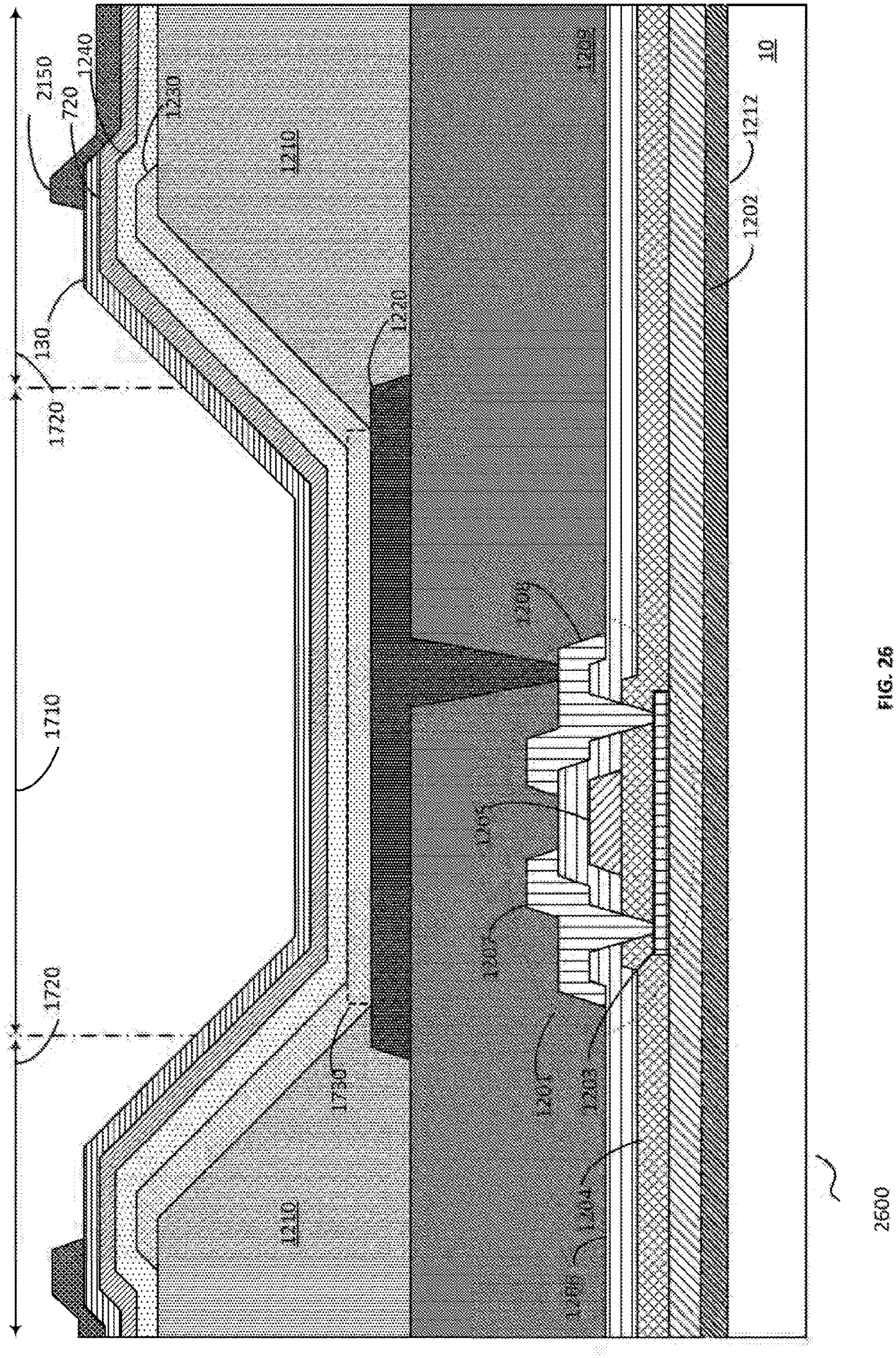
FIG. 26 is a schematic diagram illustrating an example cross-sectional view of an example version of the device of FIG. 17 with additional example deposition steps according to an example in the present disclosure.

FIG. 26 may illustrate such a scenario, in which there may be shown an example version 2600 of the device 1600, which may encompass the device shown in cross-sectional view in FIG. 17, but with additional deposition steps that are described herein.

The device 2600 may show an NPC 720 deposited over the exposed layer surface 11 of the underlying layer, in the figure, the second electrode 1240.

In some non-limiting examples, the NPC 720 may be deposited using an open mask and/or a mask-free deposition process.

Thereafter, a patterning coating 130 may be deposited selectively deposited over the exposed layer surface 11 of the underlying layer, in the figure, the NPC 720, within a first portion 101 of the device 2600, corresponding substantially to a part of the lateral aspect 1710 of emissive region(s) 1310 corresponding to (sub-) pixel(s) 2810/134*x*, and not within a second portion 102 of the device 2600, corresponding substantially to the lateral aspect(s) 1720 of non-emissive region(s) 1520 surrounding the first portion 101.

In some non-limiting examples, the patterning coating 130 may be selectively deposited using a shadow mask 415.

The patterning coating 130 may provide, within the first portion 101, an exposed layer surface 11 with a relatively low initial sticking probability against deposition of a deposited material 531 to be thereafter deposited as a deposited layer 140 to form an auxiliary electrode 2150.

After selective deposition of the patterning coating 130, the deposited material 531 may be deposited over the device 2600 but may remain substantially only within the second portion 102, which may be substantially devoid of patterning coating 130, to form the auxiliary electrode 2150.

In some non-limiting examples, the deposited layer 140 may be deposited using an open mask and/or a mask-free deposition process.

The auxiliary electrode 2150 may be electrically coupled with the second electrode 1240 to reduce a sheet resistance thereof. While, as shown, the auxiliary electrode 2150 may not be lying above and in physical contact with the second electrode 1240, those having ordinary skill in the relevant art will nevertheless appreciate that the auxiliary electrode 2150 may be electrically coupled with the second electrode 1240 by several well-understood mechanisms. By way of non-limiting example, the presence of a relatively thin film (in some non-limiting examples, of up to about 50 nm) of a patterning coating 130 may still allow a current to pass therethrough, thus allowing a sheet resistance of the second electrode 1240 to be reduced.

Figure 27:
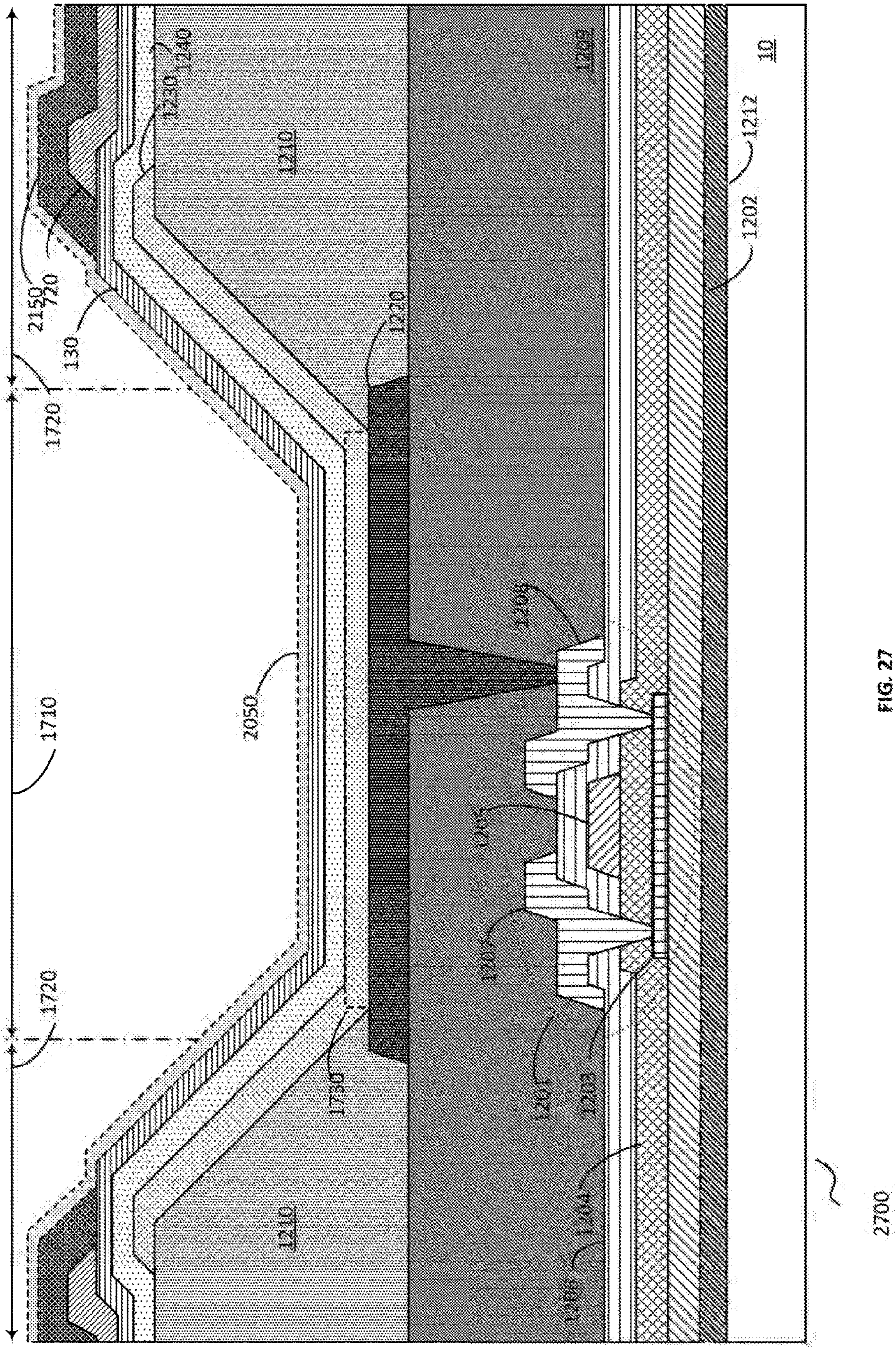
FIG. 27 is a schematic diagram illustrating an example cross-sectional view of an example version of the device of FIG. 17 with additional example deposition steps according to an example in the present disclosure.

Turning now to FIG. 27, there may be shown an example version 2700 of the device 1600, which may encompass the device shown in cross-sectional view in FIG. 17, but with additional deposition steps that are described herein.

The device 2700 may show a patterning coating 130 deposited over the exposed layer surface 11 of the underlying layer, in the figure, the second electrode 1240.

In some non-limiting examples, the patterning coating 130 may be deposited using an open mask and/or a mask-free deposition process.

The patterning coating 130 may provide an exposed layer surface 11 with a relatively low initial sticking probability against deposition of a deposited material 531 to be thereafter deposited as a deposited layer 140 to form an auxiliary electrode 2150.

After deposition of the patterning coating 130, an NPC 720 may be selectively deposited over the exposed layer surface 11 of the underlying layer, in the figure, the patterning coating 130, corresponding substantially to a part of the lateral aspect 1720 of non-emissive region(s) 1520, and surrounding a second portion 102 of the device 2700, corresponding substantially to the lateral aspect(s) 1710 of emissive region(s) 1310 corresponding to (sub-) pixel(s) 2810/134*x*.

In some non-limiting examples, the NPC 720 may be selectively deposited using a shadow mask 415.

The NPC 720 may provide, within the first portion 101, an exposed layer surface 11 with a relatively high initial sticking probability against deposition of a deposited material 531 to be thereafter deposited as a deposited layer 140 to form an auxiliary electrode 2150.

After selective deposition of the NPC 720, the deposited material 531 may be deposited over the device 2700 but may remain substantially where the patterning coating 130 has been overlaid with the NPC 720, to form the auxiliary electrode 2150.

In some non-limiting examples, the deposited layer 140 may be deposited using an open mask and/or a mask-free deposition process.

The auxiliary electrode 2150 may be electrically coupled with the second electrode 1240 to reduce a sheet resistance of the second electrode 1240

Transparent OLED

Because the OLED device 1600 may emit EM radiation through either, or both, of the first electrode 1220 (in the case of a bottom-emission, and/or a double-sided emission device), as well as the substrate 10, and/or the second electrode 1240 (in the case of a top-emission, and/or double-sided emission device), there may be an aim to make either, or both of, the first electrode 1220, and/or the second electrode 1240 substantially EM radiation- (or light)-transmissive ("transmissive"), in some non-limiting examples, at least across a substantial part of the lateral aspect of the emissive region(s) 1310 of the device 1600. In the present disclosure, such a transmissive element, including without limitation, an electrode 1220, 1240, a material from which such element may be formed, and/or property thereof, may comprise an element, material, and/or property thereof that is substantially transmissive ("transparent"), and/or, in some non-limiting examples, partially transmissive ("semi-transparent"), in some non-limiting examples, in at least one wavelength range.

A variety of mechanisms may be adopted to impart transmissive properties to the device 1600, at least across a substantial part of the lateral aspect of the emissive region(s) 1310 thereof.

In some non-limiting examples, including without limitation, where the device 1600 is a bottom-emission device, and/or a double-sided emission device, the TFT structure(s) 1201 of the driving circuit associated with an emissive region 1310 of a (sub-) pixel 2810/134*x*, which may at least partially reduce the transmissivity of the surrounding substrate 10, may be located within the lateral aspect 1720 of the surrounding non-emissive region(s) 1520 to avoid impacting the transmissive properties of the substrate 10 within the lateral aspect 1710 of the emissive region 1310.

In some non-limiting examples, where the device 1600 is a double-sided emission device, in respect of the lateral aspect 1710 of an emissive region 1310 of a (sub-) pixel 2810/134*x*, a first one of the electrodes 1220, 1240 may be made substantially transmissive, including without limitation, by at least one of the mechanisms disclosed herein, in respect of the lateral aspect 1710 of neighbouring, and/or adjacent (sub-) pixel(s) 2810/134*x*, a second one of the electrodes 1220, 1240 may be made substantially transmissive, including without limitation, by at least one of the mechanisms disclosed herein. Thus, the lateral aspect 1710 of a first emissive region 1310 of a (sub-) pixel 2810/134*x* may be made substantially top-emitting while the lateral aspect 1710 of a second emissive region 1310 of a neighbouring (sub-) pixel 2810/134*x* may be made substantially bottom-emitting, such that a subset of the (sub-) pixel(s) 2810/134*x* may be substantially top-emitting and a subset of the (sub-) pixel(s) 2810/134*x* may be substantially bottom-emitting, in an alternating (sub-) pixel 2810/134*x* sequence, while only a single electrode 1220, 1240 of each (sub-) pixel 2810/134*x* may be made substantially transmissive.

In some non-limiting examples, a mechanism to make an electrode 1220, 1240, in the case of a bottom-emission device, and/or a double-sided emission device, the first electrode 1220, and/or in the case of a top-emission device, and/or a double-sided emission device, the second electrode 1240, transmissive, may be to form such electrode 1220, 1240 of a transmissive thin film.

In some non-limiting examples, an electrically conductive deposited layer 140, in a thin film, including without limitation, those formed by a depositing a thin conductive film layer of a metal, including without limitation, Ag, Al, and/or by depositing a thin layer of a metallic alloy, including without limitation, an Mg:Ag alloy, and/or a Yb:Ag alloy, may exhibit transmissive characteristics. In some non-limiting examples, the alloy may comprise a composition ranging from between about 1:9-9:1 by volume. In some non-limiting examples, the electrode 1220, 1240 may be formed of a plurality of thin conductive film layers of any combination of deposited layers 140, any at least one of which may be comprised of TCOs, thin metal films, thin metallic alloy films, and/or any combination of any of these.

In some non-limiting examples, especially in the case of such thin conductive films, a relatively thin layer thickness may be up to substantially a few tens of nm to contribute to enhanced transmissive qualities but also favorable optical properties (including without limitation, reduced microcavity effects) for use in an OLED device 1600.

In some non-limiting examples, a reduction in the thickness of an electrode 1220, 1240 to promote transmissive qualities may be accompanied by an increase in the sheet resistance of the electrode 1220, 1240.

In some non-limiting examples, a device 1600 having at least one electrode 1220, 1240 with a high sheet resistance may create a large current resistance (IR) drop when coupled with the power source 1605, in operation. In some non-limiting examples, such an IR drop may be compensated for, to some extent, by increasing a level of the power source 1605. However, in some non-limiting examples, increasing the level of the power source 1605 to compensate for the IR drop due to high sheet resistance, for at least one (sub-) pixel 2810/134*x* may call for increasing the level of a voltage to be supplied to other components to maintain effective operation of the device 1600.

In some non-limiting examples, to reduce power supply demands for a device 1600 without significantly impacting an ability to make an electrode 1220, 1240 substantially transmissive (by employing at least one thin film layer of any combination of TCOs, thin metal films, and/or thin metallic alloy films), an auxiliary electrode 2150 may be formed on the device 1600 to allow current to be carried more effectively to various emissive region(s) 1310 of the device 1600, while at the same time, reducing the sheet resistance and its associated IR drop of the transmissive electrode 1220, 1240.

In some non-limiting examples, a sheet resistance specification, for a common electrode 1220, 1240 of a display device 1600, may vary according to several parameters, including without limitation, a (panel) size of the device 1600, and/or a tolerance for voltage variation across the device 1600. In some non-limiting examples, the sheet resistance specification may increase (that is, a lower sheet resistance is specified) as the panel size increases. In some non-limiting examples, the sheet resistance specification may increase as the tolerance for voltage variation decreases.

In some non-limiting examples, a sheet resistance specification may be used to derive an example thickness of an auxiliary electrode 2150 to comply with such specification for various panel sizes.

By way of non-limiting example, for a top-emission device, the second electrode 1240 may be made transmissive. On the other hand, in some non-limiting examples, such auxiliary electrode 2150 may not be substantially transmissive but may be electrically coupled with the second electrode 1240, including without limitation, by deposition of a conductive deposited layer 140 therebetween, to reduce an effective sheet resistance of the second electrode 1240.

In some non-limiting examples, such auxiliary electrode 2150 may be positioned, and/or shaped in either, or both of, a lateral aspect, and/or cross-sectional aspect to not interfere with the emission of photons from the lateral aspect of the emissive region 1310 of a (sub-) pixel 2810/134*x*.

In some non-limiting examples, a mechanism to make the first electrode 1220, and/or the second electrode 1240, may be to form such electrode 1220, 1240 in a pattern across at least a part of the lateral aspect of the emissive region(s) 1310 thereof, and/or in some non-limiting examples, across at least a part of the lateral aspect 1720 of the non-emissive region(s) 1520 surrounding them. In some non-limiting examples, such mechanism may be employed to form the auxiliary electrode 2150 in a position, and/or shape in either, or both of, a lateral aspect, and/or cross-sectional aspect to not interfere with the emission of EM radiation from the lateral aspect 1710 of the emissive region 1310 of a (sub-) pixel 2810/134*x*, as discussed above.

In some non-limiting examples, the device 1600 may be configured such that it may be substantially devoid of a conductive oxide material in an optical path of EM radiation emitted by the device 1600. By way of non-limiting example, in the lateral aspect 1710 of at least one emissive region 1310 corresponding to a (sub-) pixel 2810/134*x*, at least one of the layers, and/or coatings deposited after the at least one semiconducting layer 1230, including without limitation, the second electrode 1240, the patterning coating 130, and/or any other layers, and/or coatings deposited thereon, may be substantially devoid of any conductive oxide material. In some non-limiting examples, being substantially devoid of any conductive oxide material may reduce absorption, and/or reflection of EM radiation emitted by the device 1600. By way of non-limiting example, conductive oxide materials, including without limitation, ITO, and/or IZO, may absorb EM radiation in at least the B(lue) region of the visible spectrum, which may, in generally, reduce efficiency, and/or performance of the device 1600.

In some non-limiting examples, a combination of these, and/or other mechanisms may be employed.

Additionally, in some non-limiting examples, in addition to rendering at least one of the first electrode 1220, the second electrode 1240, and/or the auxiliary electrode 2150, substantially transmissive across at least across a substantial part of the lateral aspect 1710 of the emissive region 1310 corresponding to the (sub-) pixel(s) 2810/134*x* of the device 1600, to allow EM radiation to be emitted substantially across the lateral aspect 1710 thereof, there may be an aim to make at least one of the lateral aspect(s) 1720 of the surrounding non-emissive region(s) 1520 of the device 1600 substantially transmissive in both the bottom and top directions, to render the device 1600 substantially transmissive relative to EM radiation incident on an external surface thereof, such that a substantial part of such externally-incident EM radiation may be transmitted through the device 1600, in addition to the emission (in a top-emission, bottom-emission, and/or double-sided emission) of EM radiation generated internally within the device 1600 as disclosed herein.

Turning now to FIG. 28A, there may be shown an example view in plan of a transmissive (transparent) version, shown generally at 2800, of the device 1600. In some non-limiting examples, the device 2800 may be an active matrix OLED (AMOLED) device having a plurality of pixels or pixel regions 2810 and a plurality of transmissive regions 1320. In some non-limiting examples, at least one auxiliary electrode 2150 may be deposited on an exposed layer surface 11 of an underlying layer between the pixel region(s) 2810, and/or the transmissive region(s) 1320.

In some non-limiting examples, each pixel region 2810 may comprise a plurality of emissive regions 1310 each corresponding to a sub-pixel 134*x*. In some non-limiting examples, the sub-pixels 134*x* may correspond to, respectively, R(ed) sub-pixels 1341, G(reen) sub-pixels 1342, and/or B(lue) sub-pixels 1343.

In some non-limiting examples, each transmissive region 1320 may be substantially transparent and allows EM radiation to pass through the entirety of a cross-sectional aspect thereof.

Figure 28B:
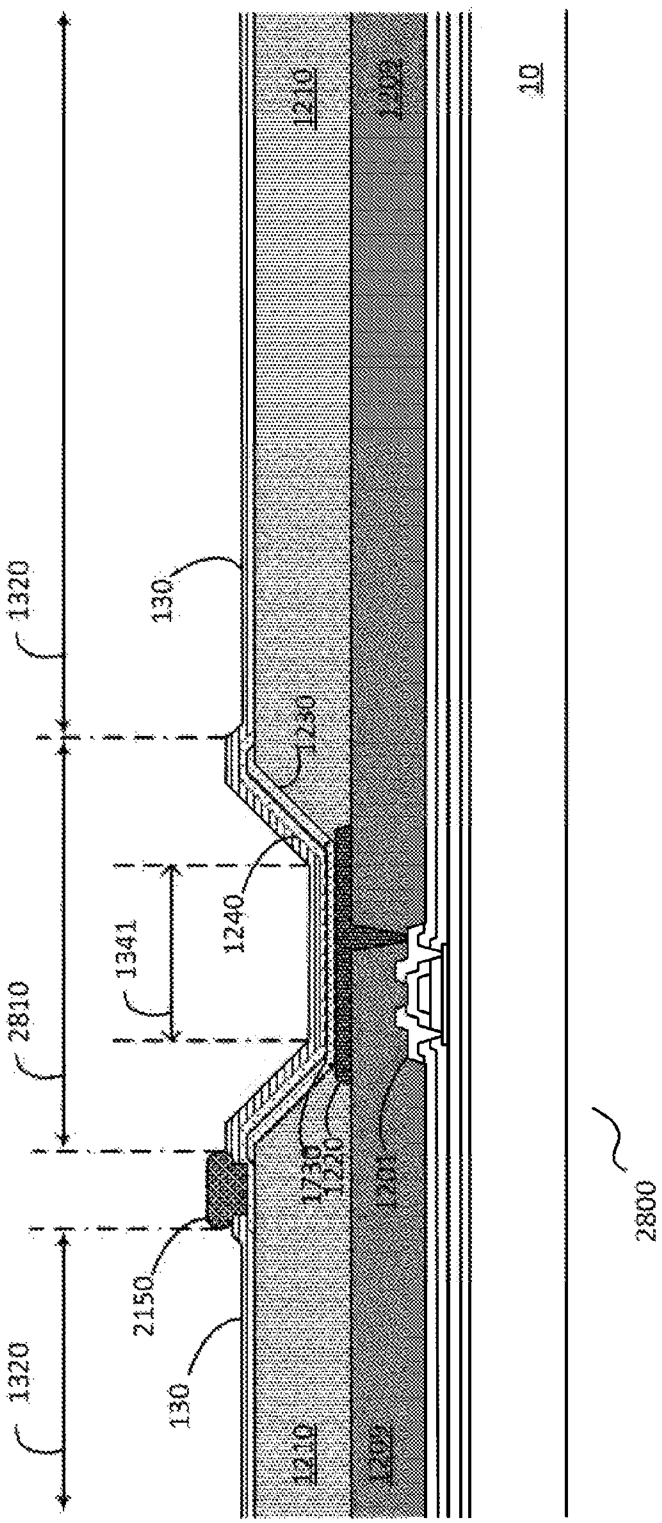
FIG. 28B is a schematic diagram illustrating an example cross-sectional view of the device of FIG. 28A taken along line 28B-28B.

Turning now to FIG. 28B, there may be shown an example cross-sectional view of a version 2800 of the device 1600, taken along line 28B-28B in FIG. 28A. In the figure, the device 2800 may be shown as comprising a substrate 10, a TFT insulating layer 1209 and a first electrode 1220 formed on an exposed layer surface 11 of the TFT insulating layer 1209. In some non-limiting examples, the substrate 10 may comprise the base substrate 1212 (not shown for purposes of simplicity of illustration), and/or at least one TFT structure 1201, corresponding to, and for driving, each sub-pixel 134*x* positioned substantially thereunder and electrically coupled with the first electrode 1220 thereof. In some non-limiting examples, PDL(s) 1210 may be formed in non-emissive regions 1520 over the substrate 10, to define emissive region(s) 1310 also corresponding to each sub-pixel 134*x*, over the first electrode 1220 corresponding thereto. In some non-limiting examples, the PDL(s) 1210 may cover edges of the first electrode 1220.

In some non-limiting examples, at least one semiconducting layer 1230 may be deposited over exposed region(s) of the first electrode 1220 and, in some non-limiting examples, at least parts of the surrounding PDLs 1210.

In some non-limiting examples, a second electrode 1240 may be deposited over the at least one semiconducting layer(s) 1230, including over the pixel region 2810 to form the sub-pixel(s) 134*x* thereof and, in some non-limiting examples, at least partially over the surrounding PDLs 1210 in the transmissive region 1320.

In some non-limiting examples, a patterning coating 130 may be selectively deposited over first portion(s) 101 of the device 2800, comprising both the pixel region 2810 and the transmissive region 1320 but not the region of the second electrode 1240 corresponding to the auxiliary electrode 2150 comprising second portion(s) 102 thereof.

In some non-limiting examples, the entire exposed layer surface 11 of the device 2800 may then be exposed to a vapor flux 532 of the deposited material 531, which in some non-limiting examples may be Mg. The deposited layer 140 may be selectively deposited over second portion(s) 102 of the second electrode 1240 that may be substantially devoid of the patterning coating 130 to form an auxiliary electrode 2150 that may be electrically coupled with and in some non-limiting examples, in physical contact with uncoated parts of the second electrode 1240.

At the same time, the transmissive region 1320 of the device 2800 may remain substantially devoid of any materials that may substantially affect the transmission of EM radiation therethrough. In particular, as shown in the figure, the TFT structure 1201 and the first electrode 1220 may be positioned, in a cross-sectional aspect, below the sub-pixel

134*x* corresponding thereto, and together with the auxiliary electrode 2150, may lie beyond the transmissive region 1320. As a result, these components may not attenuate or impede EM radiation from being transmitted through the transmissive region 1320. In some non-limiting examples, such arrangement may allow a viewer viewing the device 2800 from a typical viewing distance to see through the device 2800, in some non-limiting examples, when all the (sub-) pixel(s) 2810/134*x* may not be emitting, thus creating a transparent device 2800.

While not shown in the figure, in some non-limiting examples, the device 2800 may further comprise an NPC 720 disposed between the auxiliary electrode 2150 and the second electrode 1240. In some non-limiting examples, the NPC 720 may also be disposed between the patterning coating 130 and the second electrode 1240.

In some non-limiting examples, the patterning coating 130 may be formed concurrently with the at least one semiconducting layer(s) 1230. By way of non-limiting example, at least one material used to form the patterning coating 130 may also be used to form the at least one semiconducting layer(s) 1230. In such non-limiting example, several stages for fabricating the device 2800 may be reduced.

Those having ordinary skill in the relevant art will appreciate that in some non-limiting examples, various other layers, and/or coatings, including without limitation those forming the at least one semiconducting layer(s) 1230, and/or the second electrode 1240, may cover a part of the transmissive region 1320, especially if such layers, and/or coatings are substantially transparent. In some non-limiting examples, the PDL(s) 1210 may have a reduced thickness, including without limitation, by forming a well therein, which in some non-limiting examples may be similar to the well defined for emissive region(s) 1310, to further facilitate transmission of EM radiation through the transmissive region 1320.

Those having ordinary skill in the relevant art will appreciate that (sub-) pixel(s) 2810/134*x* arrangements other than the arrangement shown in FIGS. 28A and 28B may, in some non-limiting examples, be employed.

Those having ordinary skill in the relevant art will appreciate that arrangements of the auxiliary electrode(s) 2150 other than the arrangement shown in FIGS. 28A and 28B may, in some non-limiting examples, be employed. By way of non-limiting example, the auxiliary electrode(s) 2150 may be disposed between the pixel region 2810 and the transmissive region 1320. By way of non-limiting example, the auxiliary electrode(s) 2150 may be disposed between sub-pixel(s) 134*x* within a pixel region 2810.

Figure 29A:
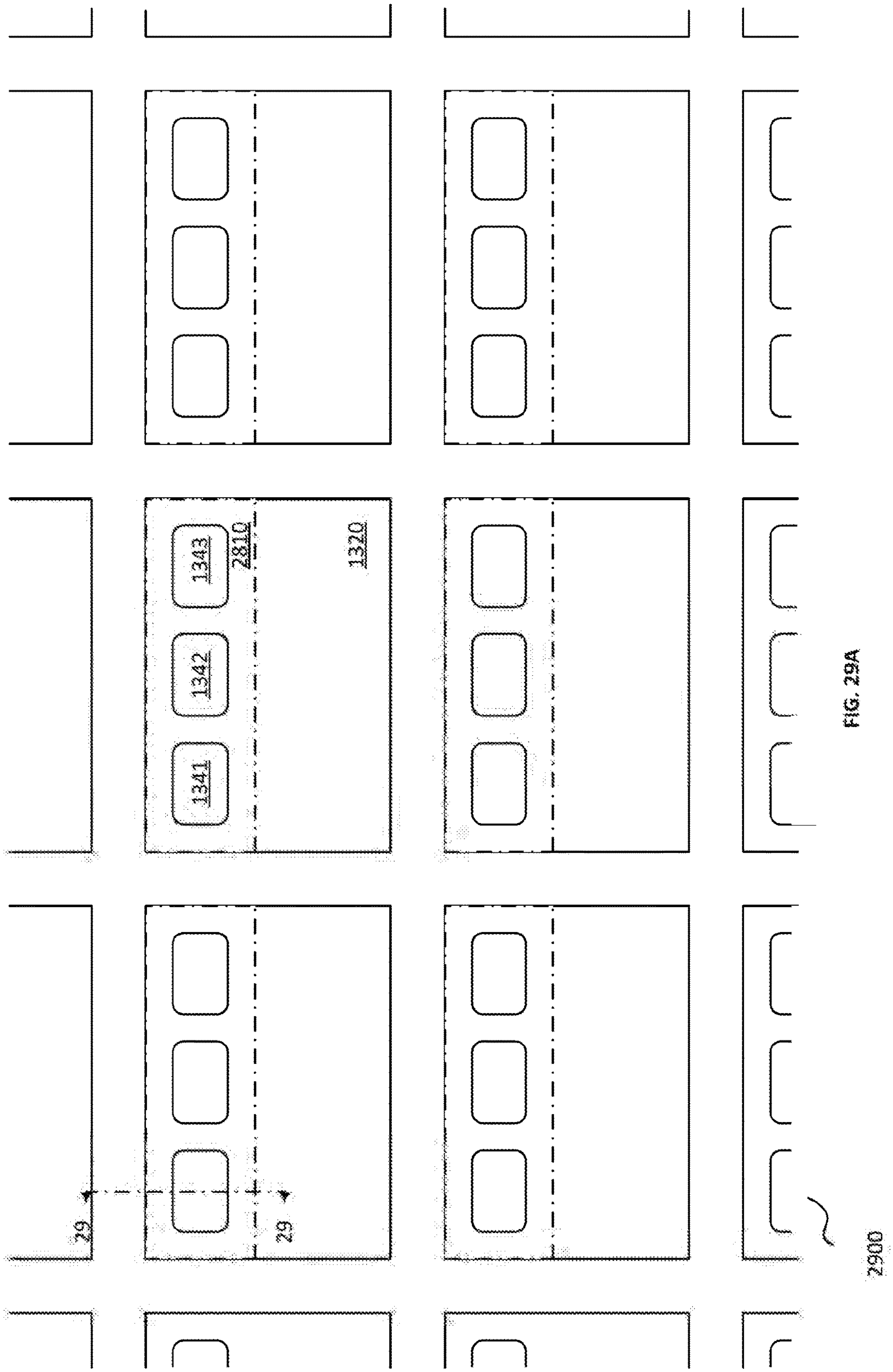
FIG. 29A is a schematic diagram illustrating, in plan view, an example of a transparent version of the device of FIG. 16 comprising at least one example pixel region and at least one example light-transmissive region according to an example in the present disclosure.

Turning now to FIG. 29A, there may be shown an example plan view of a transparent version, shown generally at 2900, of the device 1600. In some non-limiting examples, the device 2900 may be an AMOLED device having a plurality of pixel regions 2810 and a plurality of transmissive regions 1320. The device 2900 may differ from device 2800 in that no auxiliary electrode(s) 2150 lie between the pixel region(s) 2810, and/or the transmissive region(s) 1320.

In some non-limiting examples, each pixel region 2810 may comprise a plurality of emissive regions 1310, each corresponding to a sub-pixel 134*x*. In some non-limiting examples, the sub-pixels 134*x* may correspond to, respectively, R(ed) sub-pixels 1341, G(reen) sub-pixels 1342, and/or B(lue) sub-pixels 1343.

In some non-limiting examples, each transmissive region 1320 may be substantially transparent and may allow light to pass through the entirety of a cross-sectional aspect thereof.

Figure 29B:
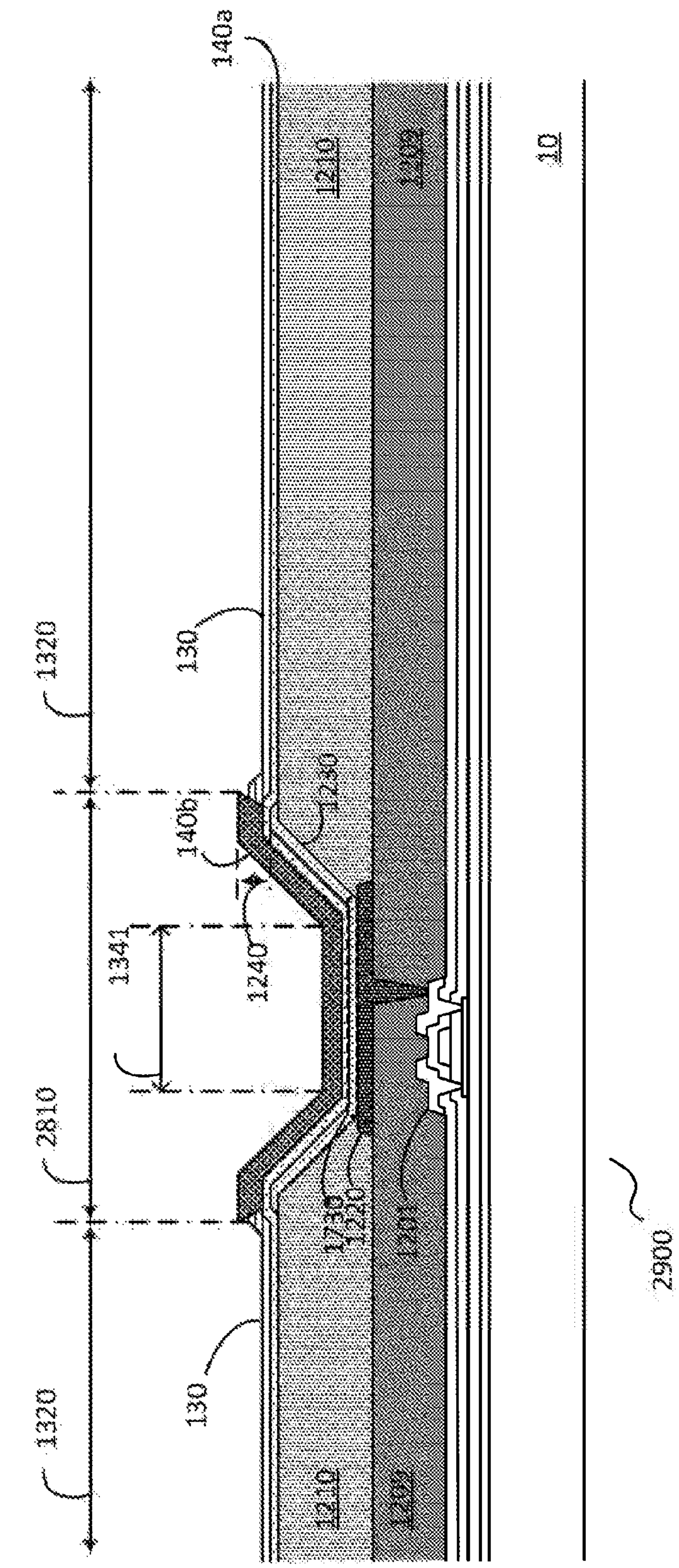
FIG. 29B is a schematic diagram illustrating an example cross-sectional view of the device of FIG. 29A taken along line 29-29.

Turning now to FIG. 29B, there may be shown an example cross-sectional view of the device 2900, taken along line 29-29 in FIG. 29A. In the figure, the device 2900 may be shown as comprising a substrate 10, a TFT insulating layer 1209 and a first electrode 1220 formed on a surface of the TFT insulating layer 1209. The substrate 10 may comprise the base substrate 1212 (not shown for purposes of simplicity of illustration), and/or at least one TFT structure 1201 corresponding to, and for driving, each sub-pixel 134*x* positioned substantially thereunder and electrically coupled with the first electrode 1220 thereof. PDL(s) 1210 may be formed in non-emissive regions 1520 over the substrate 10, to define emissive region(s) 1310 also corresponding to each sub-pixel 134*x*, over the first electrode 1220 corresponding thereto. The PDL(s) 1210 cover edges of the first electrode 1220.

In some non-limiting examples, at least one semiconducting layer 1230 may be deposited over exposed region(s) of the first electrode 1220 and, in some non-limiting examples, at least parts of the surrounding PDLs 1210.

In some non-limiting examples, a first deposited layer 140*a* may be deposited over the at least one semiconducting layer(s) 1230, including over the pixel region 2810 to form the sub-pixel(s) 134*x* thereof and over the surrounding PDLs 1210 in the transmissive region 1320. In some non-limiting examples, the average layer thickness of the first deposited layer 140*a* may be relatively thin such that the presence of the first deposited layer 140*a* across the transmissive region 1320 does not substantially attenuate transmission of EM radiation therethrough. In some non-limiting examples, the first deposited layer 140*a* may be deposited using an open mask and/or mask-free deposition process.

In some non-limiting examples, a patterning coating 130 may be selectively deposited over first portions 101 of the device 2900, comprising the transmissive region 1320.

In some non-limiting examples, the entire exposed layer surface 11 of the device 2900 may then be exposed to a vapor flux 532 of the deposited material 531, which in some non-limiting examples may be Mg, to selectively deposit a second deposited layer 140*b*, over second portion(s) 102 of the first deposited layer 140*a* that may be substantially devoid of the patterning coating 130, in some examples, the pixel region 2810, such that the second deposited layer 140*b* may be electrically coupled with and in some non-limiting examples, in physical contact with uncoated parts of the first deposited layer 140*a*, to form the second electrode 1240.

In some non-limiting examples, an average layer thickness of the first deposited layer 140*a* may be no more than an average layer thickness of the second deposited layer 140*b*. In this way, relatively high transmittance may be maintained in the transmissive region 1320, over which only the first deposited layer 140*a* may extend. In some non-limiting examples, an average layer thickness of the first deposited layer 140*a* may be at least one of no more than about: 30 nm, 25 nm, 20 nm, 15 nm, 10 nm, 8 nm, or 5 nm. In some non-limiting examples, an average layer thickness of the second deposited layer 140*b* may be at least one of no more than about: 30 nm, 25 nm, 20 nm, 15 nm, 10 nm, or 8 nm.

Thus, in some non-limiting examples, an average layer thickness of the second electrode 1240 may be no more than about 40 nm, and/or in some non-limiting examples, at least one of between about: 5-30 nm, 10-25 nm, or 15-25 nm.

In some non-limiting examples, an average layer thickness of the first deposited layer 140a may exceed an average layer thickness of the second deposited layer 140b. In some non-limiting examples, the average layer thickness of the first deposited layer 140a and the average layer thickness of the second deposited layer 140b may be substantially the same.

In some non-limiting examples, at least one deposited material 531 used to form the first deposited layer 140a may be substantially the same as at least one deposited material 531 used to form the second deposited layer 140b. In some non-limiting examples, such at least one deposited material 531 may be substantially as described herein in respect of the first electrode 1220, the second electrode 1240, the auxiliary electrode 2150, and/or a deposited layer 140 thereof.

In some non-limiting examples, the first deposited layer $\mathbf{140}_a$ may provide, at least in part, the functionality of an EIL 1639, in the pixel region 2810. Non-limiting examples, of the deposited material 531 for forming the first deposited layer $\mathbf{140}_a$ include Yb, which for example, may be about 1-3 nm in thickness.

In some non-limiting examples, the transmissive region 1320 of the device 2900 may remain substantially devoid of any materials that may substantially inhibit the transmission of EM radiation, including without limitation, EM signals, including without limitation, in the IR spectrum and/or NIR spectrum, therethrough. In particular, as shown in the figure, the TFT structure 1209, and/or the first electrode 1220 may be positioned, in a cross-sectional aspect below the sub-pixel 134x corresponding thereto and beyond the transmissive region 1320. As a result, these components may not attenuate or impede EM radiation from being transmitted through the transmissive region 1320. In some non-limiting examples, such arrangement may allow a viewer viewing the device 2900 from a typical viewing distance to see through the device 2900, in some non-limiting examples, when the (sub-) pixel(s) 2810/134x are not emitting, thus creating a transparent AMOLED device 2900.

In some non-limiting examples, such arrangement may also allow an IR emitter $\mathbf{1360}_t$ and/or an IR detector $\mathbf{1360}_r$ to be arranged behind the AMOLED device 2900 such that EM signals, including without limitation, in the IR and/or NIR spectrum, to be exchanged through the AMOLED device 2900 by such under-display components 1360.

While not shown in the figure, in some non-limiting examples, the device 2900 may further comprise an NPC 720 disposed between the second deposited layer 140b and the first deposited layer 140a. In some non-limiting examples, the NPC 720 may also be disposed between the patterning coating 130 and the first deposited layer 140a.

In some non-limiting examples, the patterning coating 130 may be formed concurrently with the at least one semiconducting layer(s) 1230. By way of non-limiting example, at least one material used to form the patterning coating 130 may also be used to form the at least one semiconducting layer(s) 1230. In such non-limiting example, several stages for fabricating the device 2900 may be reduced.

Those having ordinary skill in the relevant art will appreciate that in some non-limiting examples, various other layers, and/or coatings, including without limitation those forming the at least one semiconducting layer(s) 1230, and/or the first deposited layer 140a, may cover a part of the transmissive region 1320, especially if such layers, and/or coatings are substantially transparent. In some non-limiting examples, the PDL(s) 1210 may have a reduced thickness, including without limitation, by forming a well therein, which in some non-limiting examples may be similar to the well defined for emissive region(s) 1310, to further facilitate transmission of EM radiation through the transmissive region 1320.

Those having ordinary skill in the relevant art will appreciate that (sub-) pixel(s) 2810/134x arrangements other than the arrangement shown in FIGS. 29A and 29B may, in some non-limiting examples, be employed.

Figure 29C:
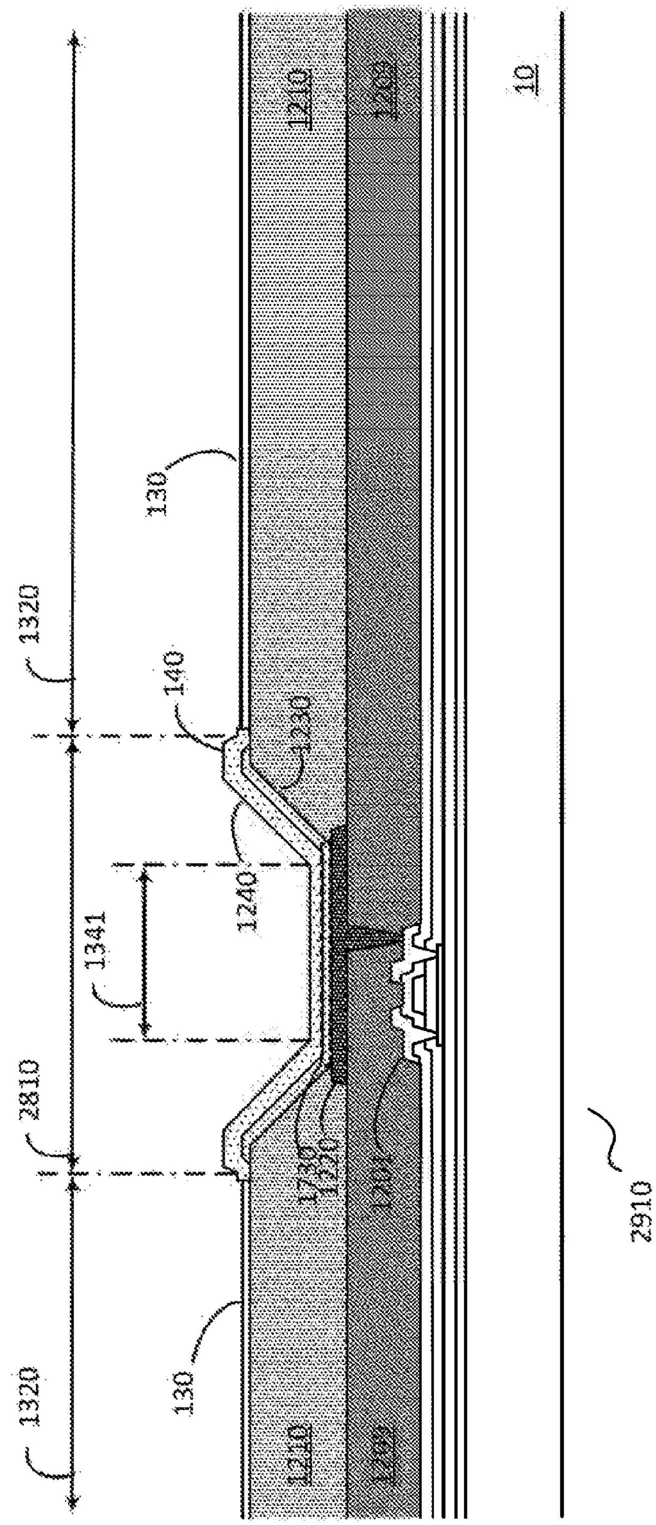
FIG. 29C is a schematic diagram illustrating an example cross-sectional view of the device of FIG. 29A taken along line 29-29.

Turning now to FIG. 29C, there may be shown an example cross-sectional view of a different version 2910 of the device 1600, taken along the line 29-29 in FIG. 29A. In the figure, the device 2910 may be shown as comprising a substrate 10, a TFT insulating layer 1209 and a first electrode 1220 formed on a surface of the TFT insulating layer 1209. The substrate 10 may comprise the base substrate 1212 (not shown for purposes of simplicity of illustration), and/or at least one TFT structure 1201 corresponding to and for driving each sub-pixel 134x positioned substantially thereunder and electrically coupled with the first electrode 1220 thereof. PDL(s) 1210 may be formed in non-emissive regions 1520 over the substrate 10, to define emissive region(s) 1310 also corresponding to each sub-pixel 134x, over the first electrode 1220 corresponding thereto. The PDL(s) 1210 may cover edges of the first electrode 1220.

In some non-limiting examples, at least one semiconducting layer 1230 may be deposited over exposed region(s) of the first electrode 1220 and, in some non-limiting examples, at least parts of the surrounding PDLs 1210.

In some non-limiting examples, a patterning coating 130 may be selectively deposited over first portions 101 of the device 2910, comprising the transmissive region 1320.

In some non-limiting examples, a deposited layer 140 may be deposited over the at least one semiconducting layer(s) 1230, including over the pixel region 2810 to form the sub-pixel(s) 134x thereof but not over the surrounding PDLs 1210 in the transmissive region 1320. In some non-limiting examples, the first deposited layer 140a may be deposited using an open mask and/or mask-free deposition process. In some non-limiting examples, such deposition may be effected by exposing the entire exposed layer surface 11 of the device 2910 to a vapor flux 532 of the deposited material 531, which in some non-limiting examples may be Mg, to selectively deposit the deposited layer 140 over second portions 102 of the at least one semiconducting layer(s) 1230 that are substantially devoid of the patterning coating 130, in some non-limiting examples, the pixel region 2810, such that the deposited layer 140 may be deposited on the at least one semiconducting layer(s) 1230 to form the second electrode 1240.

In some non-limiting examples, the transmissive region 1320 of the device 2910 may remain substantially devoid of any materials that may substantially affect the transmission of EM radiation therethrough, including without limitation, EM signals, including without limitation, in the IR and/or NIR spectrum. In particular, as shown in the figure, the TFT structure 1201, and/or the first electrode 1220 may be positioned, in a cross-sectional aspect below the sub-pixel 134x corresponding thereto and beyond the transmissive region 1320. As a result, these components may not attenuate or impede EM radiation from being transmitted through the transmissive region 1320. In some non-limiting examples, such arrangement may allow a viewer viewing the device 2910 from a typical viewing distance to see through the device 2910, in some non-limiting examples, when the (sub-) pixel(s) 2810/134x are not emitting, thus creating a transparent AMOLED device 2910.

By providing a transmissive region 1320 that may be free, and/or substantially devoid of any deposited layer 140, the transmittance in such region 1320 may, in some non-limiting examples, be favorably enhanced, by way of non-limiting example, by comparison to the device 2900 of FIG. 29B.

While not shown in the figure, in some non-limiting examples, the device 2910 may further comprise an NPC 720 disposed between the deposited layer 140 and the at least one semiconducting layer(s) 1230. In some non-limiting examples, the NPC 720 may also be disposed between the patterning coating 130 and the PDL(s) 1210.

While not shown in FIGS. 29B and 29C for sake of simplicity, those having ordinary skill in the relevant art will appreciate that in some non-limiting examples, at least one particle structure 160 may be disposed thereon, to facilitate absorption of EM radiation in the transmissive region 1320 in at least a part of the visible spectrum, while allowing EM signals 3461 having a wavelength in at least a part of the IR and/or NIR spectrum to be exchanged through the device in the transmissive region 1320.

In some non-limiting examples, the patterning coating 130 may be formed concurrently with the at least one semiconducting layer(s) 1230. By way of non-limiting example, at least one material used to form the patterning coating 130 may also be used to form the at least one semiconducting layer(s) 1230. In such non-limiting example, several stages for fabricating the device 2910 may be reduced.

In some non-limiting examples, at least one layer of the at least one semiconducting layer 1230 may be deposited in the transmissive region 1320 to provide the patterning coating 130. By way of non-limiting example, the ETL 1637 of the at least one semiconducting layer 1230 may be a patterning coating 130 that may be deposited in both the emissive region 1310 and the transmissive region 1320 during the deposition of the at least one semiconducting layer 1230. The EIL 1639 may then be selectively deposited in the emissive region 1310 over the ETL 1637, such that the exposed layer surface 11 of the ETL 1637 in the transmissive region 1320 may be substantially devoid of the EIL 1639. The exposed layer surface 11 of the EIL 1639 in the emissive region 1310 and the exposed layer surface of the ETL 1637, which acts as the patterning coating 130, may then be exposed to a vapor flux 532 of the deposited material 531 to form a closed coating 150 of the deposited layer 140 on the EIL 1639 in the emissive region 1310, and a discontinuous layer 170 of the deposited material 531 on the EIL 1639 in the transmissive region 1320.

Those having ordinary skill in the relevant art will appreciate that in some non-limiting examples, various other layers, and/or coatings, including without limitation those forming the at least one semiconducting layer(s) 1230, and/or the deposited layer 140, may cover a part of the transmissive region 1320, especially if such layers, and/or coatings are substantially transparent. In some non-limiting examples, the PDL(s) 1210 may have a reduced thickness, including without limitation, by forming a well therein, which in some non-limiting examples may be similar to the well defined for emissive region(s) 1310, to further facilitate transmission of EM radiation through the transmissive region 1320.

Those having ordinary skill in the relevant art will appreciate that (sub-) pixel(s) 2810/134*x* arrangements other than the arrangement shown in FIGS. 29A and 29C may, in some non-limiting examples, be employed Selective Deposition to Modulate Electrode Thickness over Emissive Region(s)

As discussed above, modulating the thickness of an electrode 1220, 1240, 2150 in and across a lateral aspect 1710 of emissive region(s) 1310 of a (sub-) pixel 2810/134*x* may impact the microcavity effect observable. In some non-limiting examples, selective deposition of at least one deposited layer 140 through deposition of at least one patterning coating 130, including without limitation, an NIC and/or an NPC 720, in the lateral aspects 1710 of emissive region(s) 1310 corresponding to different sub-pixel(s) 134*x* in a pixel region 2810 may allow the optical microcavity effect in each emissive region 1310 to be controlled, and/or modulated to optimize desirable optical microcavity effects on a sub-pixel 134*x* basis, including without limitation, an emission spectrum, a luminous intensity, and/or an angular dependence of a brightness, and/or a color shift of emitted light.

Such effects may be controlled by independently modulating an average layer thickness and/or a number of the deposited layer(s) 140, disposed in each emissive region 1310 of the sub-pixel(s) 134*x*. By way of non-limiting example, the average layer thickness of a second electrode 1240 disposed over a B(lue) sub-pixel 1343 may be less than the average layer thickness of a second electrode 1240 disposed over a G(reen) sub-pixel 1342, and the average layer thickness of a second electrode 1240 disposed over a G(reen) sub-pixel 1342 may be less than the average layer thickness of a second electrode 1240 disposed over a R(ed) sub-pixel 1341.

In some non-limiting examples, such effects may be controlled to an even greater extent by independently modulating the average layer thickness and/or a number of the deposited layers 140, but also of the patterning coating 130 and/or an NPC 720, deposited in part(s) of each emissive region 1310 of the sub-pixel(s) 134*x*.

Figure 30:
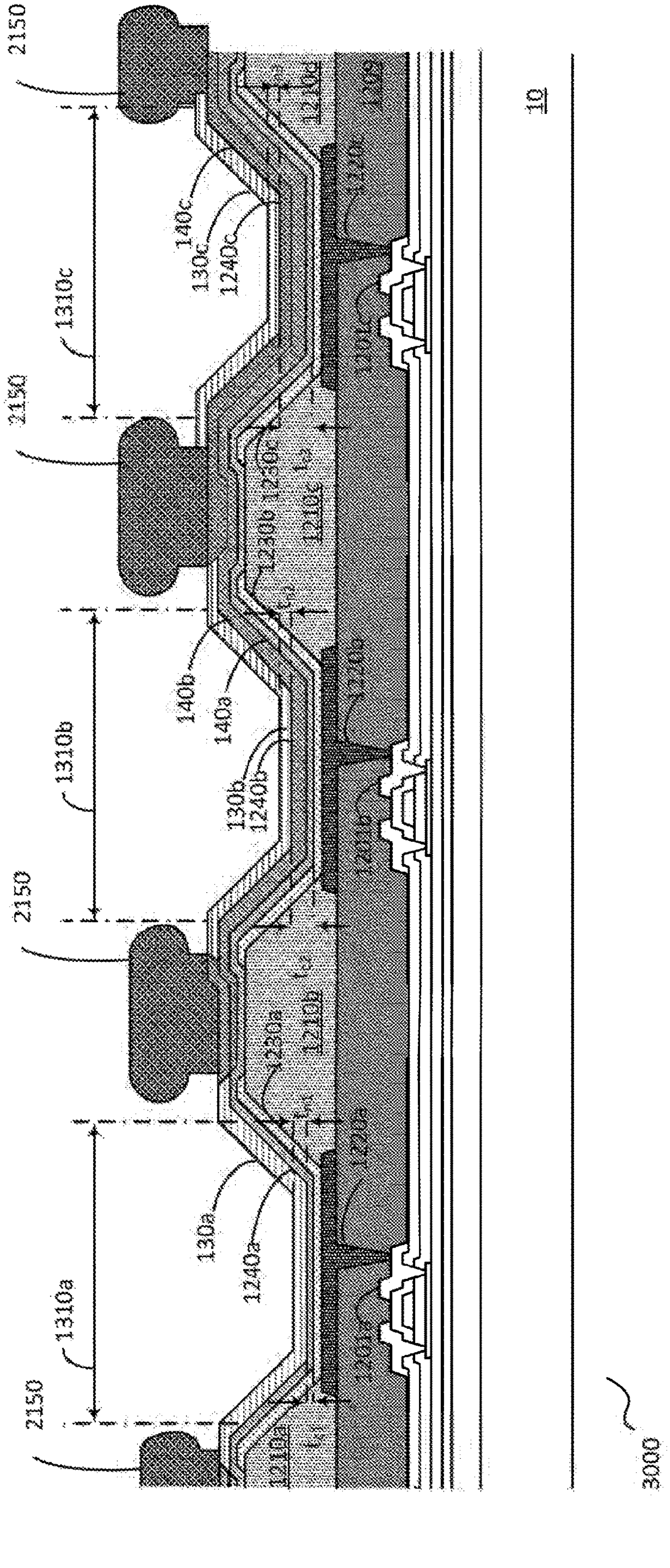
FIG. 30 is a schematic diagram that may show example stages of an example process for manufacturing an example version of the device of FIG. 17 having sub-pixel regions having a second electrode of different thickness according to an example in the present disclosure.

As shown by way of non-limiting example in FIG. 30, there may be deposited layer(s) 140 of varying average layer thickness selectively deposited for emissive region(s) 1310 corresponding to sub-pixel(s) 134*x*, in some non-limiting examples, in a version 3000 of an OLED display device 1600, having different emission spectra. In some non-limiting examples, a first emissive region 1310*a* may correspond to a sub-pixel 134*x* configured to emit EM radiation of a first wavelength, and/or emission spectrum, and/or in some non-limiting examples, a second emissive region 1310*b* may correspond to a sub-pixel 134*x* configured to emit EM radiation of a second wavelength, and/or emission spectrum. In some non-limiting examples, a device 3000 may comprise a third emissive region 1310*c* that may correspond to a sub-pixel 134*x* configured to emit EM radiation of a third wavelength, and/or emission spectrum.

In some non-limiting examples, the first wavelength may be less than, greater than, and/or equal to at least one of the second wavelength, and/or the third wavelength. In some non-limiting examples, the second wavelength may be less than, greater than, and/or equal to at least one of the first wavelength, and/or the third wavelength. In some non-limiting examples, the third wavelength may be less than, greater than, and/or equal to at least one of the first wavelength, and/or the second wavelength.

In some non-limiting examples, the device 3000 may also comprise at least one additional emissive region 1310 (not shown) that may in some non-limiting examples be configured to emit EM radiation having a wavelength, and/or emission spectrum that is substantially identical to at least one of the first emissive region 1310*a*, the second emissive region 1310*b*, and/or the third emissive region 1310*c*.

In some non-limiting examples, the patterning coating 130 may be selectively deposited using a shadow mask 415 that may also have been used to deposit the at least one semiconducting layer 1230 of the first emissive region 1310*a*. In some non-limiting examples, such shared use of a shadow mask 415 may allow the optical microcavity effect(s) to be tuned for each sub-pixel 134*x* in a cost-effective manner.

The device 3000 may be shown as comprising a substrate 10, a TFT insulating layer 1209 and a plurality of first electrodes 1220, formed on an exposed layer surface 11 of the TFT insulating layer 1209.

In some non-limiting examples, the substrate 10 may comprise the base substrate 1212 (not shown for purposes of simplicity of illustration), and/or at least one TFT structure 1201 corresponding to, and for driving, a corresponding emissive region 1310, each having a corresponding sub-pixel 134*x*, positioned substantially thereunder and electrically coupled with its associated first electrode 1220. PDL(s) 1210 may be formed over the substrate 10, to define emissive region(s) 1310. In some non-limiting examples, the PDL(s) 1210 may cover edges of their respective first electrode 1220.

In some non-limiting examples, at least one semiconducting layer 1230 may be deposited over exposed region(s) of their respective first electrode 1220 and, in some non-limiting examples, at least parts of the surrounding PDLs 1210.

In some non-limiting examples, a first deposited layer 140*a* may be deposited over the at least one semiconducting layer(s) 1230. In some non-limiting examples, the first deposited layer 140*a* may be deposited using an open mask and/or mask-free deposition process. In some non-limiting examples, such deposition may be effected by exposing the entire exposed layer surface 11 of the device 3000 to a vapor flux 532 of deposited material 531, which in some non-limiting examples may be Mg, to deposit the first deposited layer 140*a* over the at least one semiconducting layer(s) 1230 to form a first layer of the second electrode 1240*a* (not shown), which in some non-limiting examples may be a common electrode, at least for the first emissive region 1310*a*. Such common electrode may have a first thickness $t_{c1}$ in the first emissive region 1310*a*. In some non-limiting examples, the first thickness $t_{c1}$ may correspond to a thickness of the first deposited layer 140*a*.

In some non-limiting examples, a first patterning coating 130*a* may be selectively deposited over first portions 101 of the device 3000, comprising the first emissive region 1310*a*.

In some non-limiting examples, a second deposited layer 140*b* may be deposited over the device 3000. In some non-limiting examples, the second deposited layer 140*b* may be deposited using an open mask and/or mask-free deposition process. In some non-limiting examples, such deposition may be effected by exposing the entire exposed layer surface 11 of the device 3000 to a vapor flux 532 of deposited material 531, which in some non-limiting examples may be Mg, to deposit the second deposited layer 140*b* over the first deposited layer 140*a* that may be substantially devoid of the first patterning coating 130*a*, in some examples, the second and third emissive regions 1310*b*, 1310*c*, and/or at least part(s) of the non-emissive region(s) 1520 in which the PDLs 1210 lie, such that the second deposited layer 140*b* may be deposited on the second portion(s) 102 of the first deposited layer 140*a* that are substantially devoid of the first patterning coating 130*a* to form a second layer of the second electrode 1240*b* (not shown), which in some non-limiting examples, may be a common electrode, at least for the second emissive region 1310*b*. In some non-limiting examples, such common electrode may have a second thickness $t_{c2}$ in the second emissive region 1310$_b$. In some non-limiting examples, the second thickness $t_{c2}$ may correspond to a combined average layer thickness of the first deposited layer 140$_a$ and of the second deposited layer 140$_b$ and may in some non-limiting examples exceed the first thickness $t_{c1}$.

In some non-limiting examples, a second patterning coating 130*b* may be selectively deposited over further first portions 101 of the device 3000, comprising the second emissive region 1310*b*.

In some non-limiting examples, a third deposited layer 140*c* may be deposited over the device 3000. In some non-limiting examples, the third deposited layer 140*c* may be deposited using an open mask and/or mask-free deposition process. In some non-limiting examples, such deposition may be effected by exposing the entire exposed layer surface 11 of the device 3000 to a vapor flux 532 of deposited material 531, which in some non-limiting examples may be Mg, to deposit the third deposited layer 140*c* over the second deposited layer 140*b* that may be substantially devoid of either the first patterning coating 130*a* or the second patterning coating 130*b*, in some examples, the third emissive region 1310*c*, and/or at least part(s) of the non-emissive region 1520 in which the PDLs 1210 lie, such that the third deposited layer 140*c* may be deposited on the further second portion(s) 102 of the second deposited layer 140*b* that are substantially devoid of the second patterning coating 130*b* to form a third layer of the second electrode 1240*c* (not shown), which in some non-limiting examples, may be a common electrode, at least for the third emissive region 1310*c*. In some non-limiting examples, such common electrode may have a third thickness $t_{c3}$ in the third emissive region 1310*c*. In some non-limiting examples, the third thickness $t_{c3}$ may correspond to a combined thickness of the first deposited layer 140*a*, the second deposited layer 140*b* and the third deposited layer 140*c* and may in some non-limiting examples exceed either, or both of, the first thickness $t_{c1}$ and the second thickness $t_{c2}$.

In some non-limiting examples, a third patterning coating 130*c* may be selectively deposited over additional first portions 101 of the device 3000, comprising the third emissive region 1310*c*.

In some non-limiting examples, at least one auxiliary electrode 2150 may be disposed in the non-emissive region(s) 1520 of the device 3000 between neighbouring emissive regions 1310 thereof and in some non-limiting examples, over the PDLs 1210. In some non-limiting examples, the deposited layer 140 used to deposit the at least one auxiliary electrode 2150 may be deposited using an open mask and/or mask-free deposition process. In some non-limiting examples, such deposition may be effected by exposing the entire exposed layer surface 11 of the device 3000 to a vapor flux 532 of deposited material 531, which in some non-limiting examples may be Mg, to deposit the deposited layer 140 over the exposed parts of the first deposited layer 140*a*, the second deposited layer 140*b* and the third deposited layer 140*c* that may be substantially devoid of any of the first patterning coating 130*a* the second patterning coating 130*b*, and/or the third patterning coating 130*c*, such that the deposited layer 140 may be deposited on an additional second portion 102 comprising the exposed part(s) of the first deposited layer 140*a*, the second deposited layer 140*b*, and/or the third deposited layer 140*c* that may be substantially devoid of any of the first patterning coating 130*a*, the second patterning coating 130*b*, and/or the third patterning coating 130$c$ to form the at least one auxiliary electrode 2150. In some non-limiting examples, each of the at least one auxiliary electrodes 2150 may be electrically coupled with a respective one of the second electrodes 1240. In some non-limiting examples, each of the at least one auxiliary electrode 2150 may be in physical contact with such second electrode 1240.

In some non-limiting examples, the first emissive region 1310$a$, the second emissive region 1310$b$ and the third emissive region 1310$c$ may be substantially devoid of a closed coating 150 of the deposited material 531 used to form the at least one auxiliary electrode 2150.

In some non-limiting examples, at least one of the first deposited layer 140$a$, the second deposited layer 140$b$, and/or the third deposited layer 140$c$ may be transmissive, and/or substantially transparent in at least a part of the visible spectrum. Thus, in some non-limiting examples, the second deposited layer 140$b$, and/or the third deposited layer 140$c$ (and/or any additional deposited layer(s) 140) may be disposed on top of the first deposited layer 140$a$ to form a multi-coating electrode 1220, 1240, 2150 that may also be transmissive, and/or substantially transparent in at least a part of the visible spectrum. In some non-limiting examples, the transmittance of any of the at least one of the first deposited layer 140$a$, the second deposited layer 140$b$, the third deposited layer 140$c$, any additional deposited layer(s) 140, and/or the multi-coating electrode 1220, 1240, 2150 may exceed at least one of about: 30%, 40% 45%, 50%, 60%, 70%, 75%, or 80% in at least a part of the visible spectrum.

In some non-limiting examples, an average layer thickness of the first deposited layer 140$a$, the second deposited layer 140$b$, and/or the third deposited layer 140$c$ may be made relatively thin to maintain a relatively high transmittance. In some non-limiting examples, an average layer thickness of the first deposited layer 140$a$ may be at least one of between about: 5-30 nm, 8-25 nm, or 10-20 nm. In some non-limiting examples, an average layer thickness of the second deposited layer 140$b$ may be at least one of between about: 1-25 nm, 1-20 nm, 1-15 nm, 1-10 nm, or 3-6 nm. In some non-limiting examples, an average layer thickness of the third deposited layer 140$c$ may be at least one of between about: 1-25 nm, 1-20 nm, 1-15 nm, 1-10 nm, or 3-6 nm. In some non-limiting examples, a thickness of a multi-coating electrode formed by a combination of the first deposited layer 140$a$, the second deposited layer 140$b$, the third deposited layer 140$c$, and/or any additional deposited layer(s) 140 may be at least one of between about: 6-35 nm, 10-30 nm, 10-25 nm, or 12-18 nm.

In some non-limiting examples, a thickness of the at least one auxiliary electrode 2150 may exceed an average layer thickness of the first deposited layer 140$a$, the second deposited layer 140$b$, the third deposited layer 140$c$, and/or a common electrode. In some non-limiting examples, the thickness of the at least one auxiliary electrode 2150 may exceed at least one of about: 50 nm, 80 nm, 100 nm, 150 nm, 200 nm, 300 nm, 400 nm, 500 nm, 700 nm, 800 nm, 1 μm, 1.2 μm, 1.5 μm, 2 μm, 2.5 μm, or 3 μm.

In some non-limiting examples, the at least one auxiliary electrode 2150 may be substantially non-transparent, and/or opaque. However, since the at least one auxiliary electrode 2150 may be, in some non-limiting examples, provided in a non-emissive region 1520 of the device 3000, the at least one auxiliary electrode 2150 may not cause or contribute to significant optical interference. In some non-limiting examples, the transmittance of the at least one auxiliary electrode 2150 may be at least one of no more than about: 50%, 70%, 80%, 85%, 90%, or 95% in at least a part of the visible spectrum.

In some non-limiting examples, the at least one auxiliary electrode 2150 may absorb EM radiation in at least a part of the visible spectrum.

In some non-limiting examples, an average layer thickness of the first patterning coating $\mathbf{130}_a$, the second patterning coating $\mathbf{130}_b$, and/or the third patterning coating $\mathbf{130}_c$ disposed in the first emissive region 1310$a$, the second emissive region 1310$b$, and/or the third emissive region 1310$c$ respectively, may be varied according to a colour, and/or emission spectrum of EM radiation emitted by each emissive region 1310. In some non-limiting examples, the first patterning coating 130$a$ may have a first patterning coating thickness $t_{n1}$, the second patterning coating 130$b$ may have a second patterning coating thickness $t_{n2}$, and/or the third patterning coating 130$c$ may have a third patterning coating thickness $t_{n3}$. In some non-limiting examples, the first patterning coating thickness $t_{n1}$, the second patterning coating thickness $t_{n2}$, and/or the third patterning coating thickness $t_{n3}$, may be substantially the same. In some non-limiting examples, the first patterning coating thickness $t_{n1}$, the second patterning coating thickness $t_{n2}$, and/or the third patterning coating thickness $t_{n3}$, may be different from one another.

In some non-limiting examples, the device 3000 may also comprise any number of emissive regions 1310$a$-1310$c$, and/or (sub-) pixel(s) 2810/134$x$ thereof. In some non-limiting examples, a device may comprise a plurality of pixels 2810, wherein each pixel 2810 comprises two, three or more sub-pixel(s) 134$x$.

Those having ordinary skill in the relevant art will appreciate that the specific arrangement of (sub-) pixel(s) 2810/134$x$ may be varied depending on the device design. In some non-limiting examples, the sub-pixel(s) 134$x$ may be arranged according to known arrangement schemes, including without limitation, RGB side-by-side, diamond, and/or PenTile®.

Figure 31:
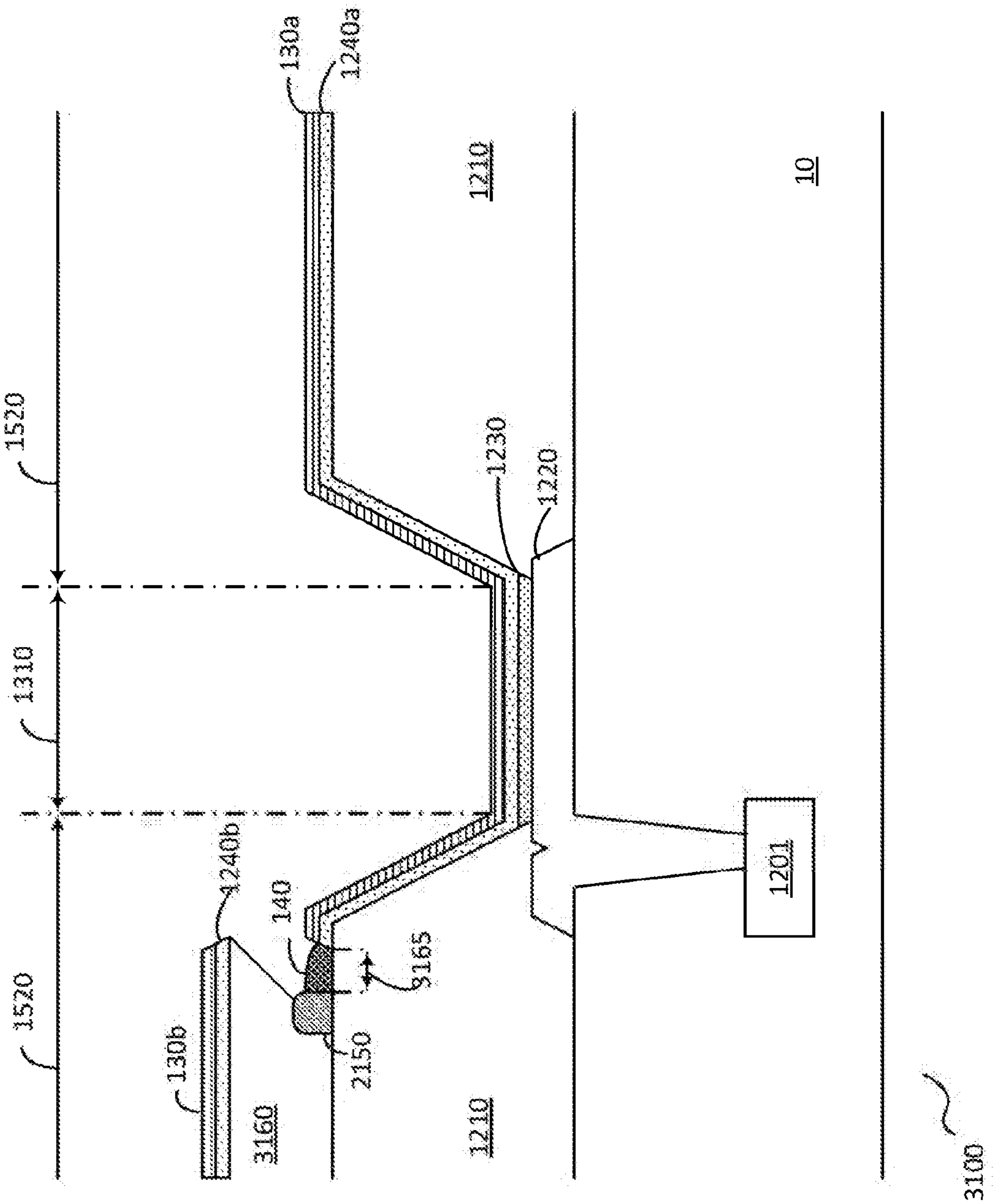
FIG. 31 is a schematic diagram illustrating an example cross-sectional view of an example version of the device of FIG. 16 in which a second electrode is coupled with an auxiliary electrode according to an example in the present disclosure.

Conductive Coating for Electrically Coupling an Electrode to an Auxiliary Electrode Turning to FIG. 31, there may be shown a cross-sectional view of an example version 3100 of the device 1600. The device 3100 may comprise in a lateral aspect, an emissive region 1310 and an adjacent non-emissive region 1520.

In some non-limiting examples, the emissive region 1310 may correspond to a sub-pixel 134$x$ of the device 3100. The emissive region 1310 may have a substrate 10, a first electrode 1220, a second electrode 1240 and at least one semiconducting layer 1230 arranged therebetween.

The first electrode 1220 may be disposed on an exposed layer surface 11 of the substrate 10. The substrate 10 may comprise a TFT structure 1201, that may be electrically coupled with the first electrode 1220. The edges, and/or perimeter of the first electrode 1220 may generally be covered by at least one PDL 1210.

The non-emissive region 1520 may have an auxiliary electrode 2150 and a first part of the non-emissive region 1520 may have a projecting structure 3160 arranged to project over and overlap a lateral aspect of the auxiliary electrode 2150. The projecting structure 3160 may extend laterally to provide a sheltered region 3165. By way of non-limiting example, the projecting structure 3160 may be recessed at, and/or near the auxiliary electrode 2150 on at least one side to provide the sheltered region 3165. As shown, the sheltered region 3165 may in some non-limiting examples, correspond to a region on a surface of the PDL 1210 that may overlap with a lateral projection of the projecting structure 3160. The non-emissive region 1520 may further comprise a deposited layer 140 disposed in the sheltered region 3165. The deposited layer 140 may electrically couple the auxiliary electrode 2150 with the second electrode 1240.

A patterning coating 130*a* may be disposed in the emissive region 1310 over the exposed layer surface 11 of the second electrode 1240. In some non-limiting examples, an exposed layer surface 11 of the projecting structure 3160 may be coated with a residual thin conductive film from deposition of a thin conductive film to form a second electrode 1240. In some non-limiting examples, an exposed layer surface 11 of the residual thin conductive film may be coated with a residual patterning coating 130*b* from deposition of the patterning coating 130.

However, because of the lateral projection of the projecting structure 3160 over the sheltered region 3165, the sheltered region 3165 may be substantially devoid of patterning coating 130. Thus, when a deposited layer 140 may be deposited on the device 3100 after deposition of the patterning coating 130, the deposited layer 140 may be deposited on, and/or migrate to the sheltered region 3165 to couple the auxiliary electrode 2150 to the second electrode 1240.

Those having ordinary skill in the relevant art will appreciate that a non-limiting example has been shown in FIG. 31 and that various modifications may be apparent. By way of non-limiting example, the projecting structure 3160 may provide a sheltered region 3165 along at least two of its sides. In some non-limiting examples, the projecting structure 3160 may be omitted and the auxiliary electrode 2150 may comprise a recessed part that may define the sheltered region 3165. In some non-limiting examples, the auxiliary electrode 2150 and the deposited layer 140 may be disposed directly on a surface of the substrate 10, instead of the PDL 1210.

Selective Deposition of Optical Coating

In some non-limiting examples, a device (not shown), which in some non-limiting examples may be an opto-electronic device 1200, may comprise a substrate 10, a patterning coating 130 and an optical coating. The patterning coating 130 may cover, in a lateral aspect, a first lateral portion 101 of the substrate 10. The optical coating may cover, in a lateral aspect, a second lateral portion 102 of the substrate 10. At least a part of the patterning coating 130 may be substantially devoid of a closed coating 150 of the optical coating.

In some non-limiting examples, the optical coating may be used to modulate optical properties of EM radiation being transmitted, emitted, and/or absorbed by the device, including without limitation, plasmon modes. By way of non-limiting example, the optical coating may be used as an optical filter, index-matching coating, optical outcoupling coating, scattering layer, diffraction grating, and/or parts thereof.

In some non-limiting examples, the optical coating may be used to modulate at least one optical microcavity effect in the device 1200 by, without limitation, tuning the total optical path length, and/or the refractive index thereof. At least one optical property of the device 1200 may be affected by modulating at least one optical microcavity effect including without limitation, the output EM radiation, including without limitation, an angular dependence of an intensity thereof, and/or a wavelength shift thereof. In some non-limiting examples, the optical coating may be a non-electrical component, that is, the optical coating may not be configured to conduct, and/or transmit electrical current during normal device operations.

In some non-limiting examples, the optical coating may be formed of any deposited material 531, and/or may employ any mechanism of depositing a deposited layer 140 as described herein.

Partition and Recess

Figure 32:
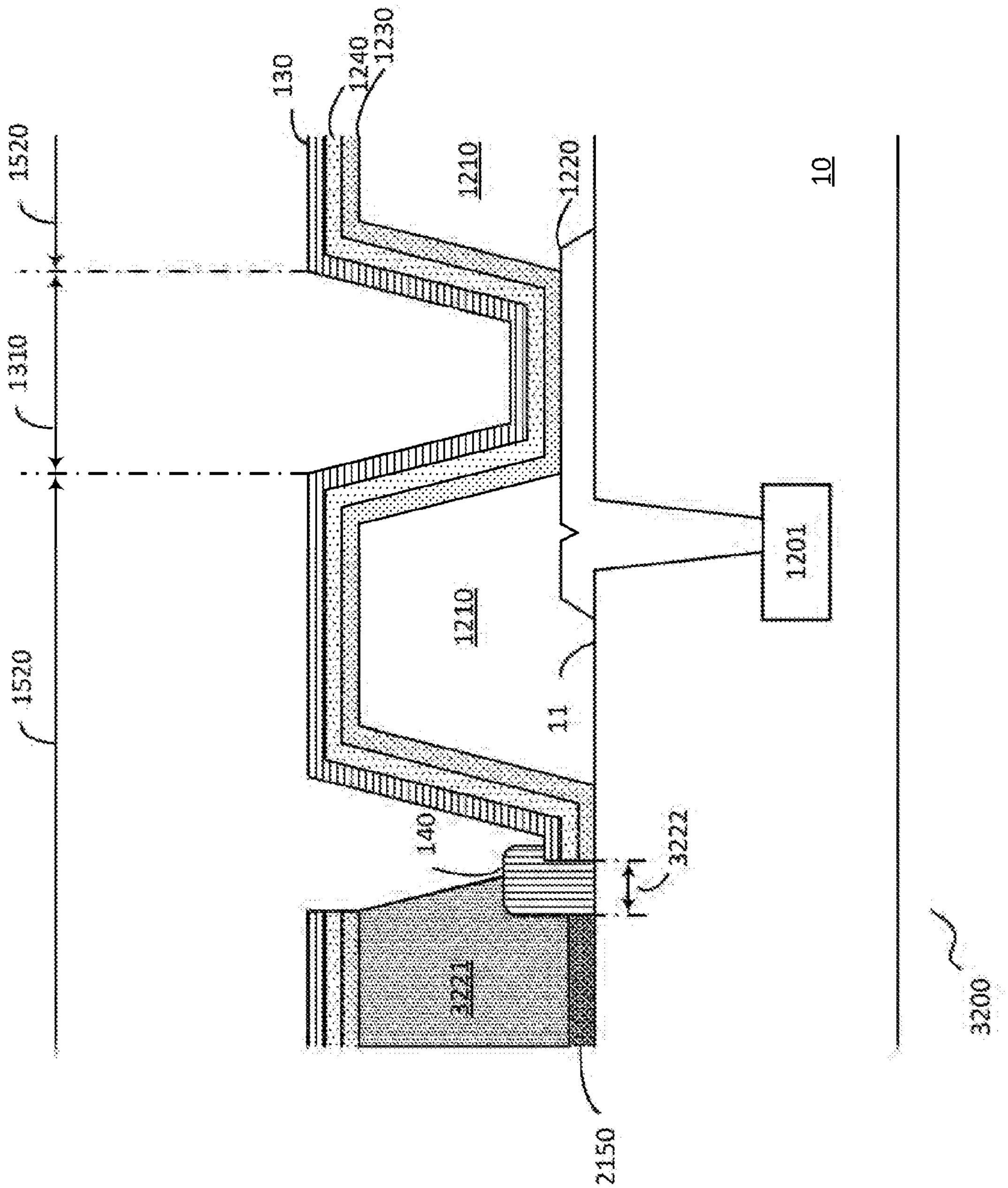
FIG. 32 is a schematic diagram illustrating an example cross-sectional view of an example version of the device of FIG. 16 having a partition and a sheltered region, such as a recess, in a non-emissive region thereof according to an example in the present disclosure.

Turning to FIG. 32, there may be shown a cross-sectional view of an example version 3200 of the device 1600. The device 3200 may comprise a substrate 10 having an exposed layer surface 11. The substrate 10 may comprise at least one TFT structure 1201. By way of non-limiting example, the at least one TFT structure 1201 may be formed by depositing and patterning a series of thin films when fabricating the substrate 10, in some non-limiting examples, as described herein.

The device 3200 may comprise, in a lateral aspect, an emissive region 1310 having an associated lateral aspect 1710 and at least one adjacent non-emissive region 1520, each having an associated lateral aspect 1720. The exposed layer surface 11 of the substrate 10 in the emissive region 1310 may be provided with a first electrode 1220, that may be electrically coupled with the at least one TFT structure 1201. A PDL 1210 may be provided on the exposed layer surface 11, such that the PDL 1210 covers the exposed layer surface 11 as well as at least one edge, and/or perimeter of the first electrode 1220. The PDL 1210 may, in some non-limiting examples, be provided in the lateral aspect 1720 of the non-emissive region 1520. The PDL 1210 may define a valley-shaped configuration that may provide an opening that generally may correspond to the lateral aspect 1710 of the emissive region 1310 through which a layer surface of the first electrode 1220 may be exposed. In some non-limiting examples, the device 3200 may comprise a plurality of such openings defined by the PDLs 1210, each of which may correspond to a (sub-) pixel 2810/134*x* region of the device 3200.

As shown, in some non-limiting examples, a partition 3221 may be provided on the exposed layer surface 11 in the lateral aspect 1720 of a non-emissive region 1520 and, as described herein, may define a sheltered region 3165, such as a recess 3222. In some non-limiting examples, the recess 3222 may be formed by an edge of a lower section of the partition 3221 being recessed, staggered, and/or offset with respect to an edge of an upper section of the partition 3221 that may overlap, and/or project beyond the recess 3222.

In some non-limiting examples, the lateral aspect 1710 of the emissive region 1310 may comprise at least one semiconducting layer 1230 disposed over the first electrode 1220, a second electrode 1240, disposed over the at least one semiconducting layer 1230, and a patterning coating 130 disposed over the second electrode 1240. In some non-limiting examples, the at least one semiconducting layer 1230, the second electrode 1240 and the patterning coating 130 may extend laterally to cover at least the lateral aspect 1720 of a part of at least one adjacent non-emissive region 1520. In some non-limiting examples, as shown, the at least one semiconducting layer 1230, the second electrode 1240 and the patterning coating 130 may be disposed on at least a part of at least one PDL 1210 and at least a part of the partition 3221. Thus, as shown, the lateral aspect 1710 of the emissive region 1310, the lateral aspect 1720 of a part of at least one adjacent non-emissive region 1520, a part of at least one PDL 1210, and at least a part of the partition 3221, together may make up a first portion 101, in which the second electrode 1240 may lie between the patterning coating 130 and the at least one semiconducting layer 1230.

An auxiliary electrode 2150 may be disposed proximate to, and/or within the recess 3222 and a deposited layer 140 may be arranged to electrically couple the auxiliary electrode 2150 with the second electrode 1240. Thus, as shown, in some non-limiting examples, the recess 3222 may comprise a second portion 102, in which the deposited layer 140 is disposed on the exposed layer surface 11.

In some non-limiting examples, in depositing the deposited layer 140, at least a part of the vapor flux 532 of the deposited material 531 may be directed at a non-normal angle relative to a lateral plane of the exposed layer surface 11. By way of non-limiting example, at least a part of the vapor flux 532 may be incident on the device 3200 at a non-zero angle of incidence that is, relative to such lateral plane of the exposed layer surface 11, at least one of no more than about: 90°, 85°, 80°, 75°, 70°, 60°, or 50°. By directing an vapor flux 532 of a deposited material 531, including at least a part thereof incident at a non-normal angle, at least one exposed layer surface 11 of, and/or in the recess 3222 may be exposed to such vapor flux 532.

In some non-limiting examples, a likelihood of such vapor flux 532 being precluded from being incident onto at least one exposed layer surface 11 of, and/or in the recess 3222 due to the presence of the partition 3221, may be reduced since at least a part of such vapor flux 532 may be flowed at a non-normal angle of incidence.

In some non-limiting examples, at least a part of such vapor flux 532 may be non-collimated. In some non-limiting examples, at least a part of such vapor flux 532 may be generated by an evaporation source that is a point source, a linear source, and/or a surface source.

In some non-limiting examples, the device 3200 may be displaced during deposition of the deposited layer 140. By way of non-limiting example, the device 3200, and/or the substrate 10 thereof, and/or any layer(s) deposited thereon, may be subjected to a displacement that is angular, in a lateral aspect, and/or in an aspect substantially parallel to the cross-sectional aspect.

In some non-limiting examples, the device 3200 may be rotated about an axis that substantially normal to the lateral plane of the exposed layer surface 11 while being subjected to the vapor flux 532.

In some non-limiting examples, at least a part of such vapor flux 532 may be directed toward the exposed layer surface 11 of the device 3200 in a direction that is substantially normal to the lateral plane of the exposed layer surface 11.

Without wishing to be bound by a particular theory, it may be postulated that the deposited material 531 may nevertheless be deposited within the recess 3222 due to lateral migration, and/or desorption of adatoms adsorbed onto the exposed layer surface 11 of the patterning coating 130. In some non-limiting examples, it may be postulated that any adatoms adsorbed onto the exposed layer surface 11 of the patterning coating 130 may tend to migrate, and/or desorb from such exposed layer surface 11 due to unfavorable thermodynamic properties of the exposed layer surface 11 for forming a stable nucleus. In some non-limiting examples, it may be postulated that at least some of the adatoms migrating, and/or desorbing off such exposed layer surface 11 may be re-deposited onto the surfaces in the recess 3222 to form the deposited layer 140.

In some non-limiting examples, the deposited layer 140 may be formed such that the deposited layer 140 may be electrically coupled with both the auxiliary electrode 2150 and the second electrode 1240. In some non-limiting examples, the deposited layer 140 may be in physical contact with at least one of the auxiliary electrodes 2150, and/or the second electrode 1240. In some non-limiting examples, an intermediate layer may be present between the deposited layer 140 and at least one of the auxiliary electrodes 2150, and/or the second electrode 1240. However, in such example, such intermediate layer may not substantially preclude the deposited layer 140 from being electrically coupled with the at least one of the auxiliary electrodes 2150, and/or the second electrode 1240. In some non-limiting examples, such intermediate layer may be relatively thin and be such as to permit electrical coupling therethrough. In some non-limiting examples, a sheet resistance of the deposited layer 140 may be no more than a sheet resistance of the second electrode 1240.

As shown in FIG. 32, the recess 3222 may be substantially devoid of the second electrode 1240. In some non-limiting examples, during the deposition of the second electrode 1240, the recess 3222 may be masked, by the partition 3221, such that the vapor flux 532 of the deposited material 531 for forming the second electrode 1240 may be substantially precluded from being incident on at least one exposed layer surface 11 of, and/or in, the recess 3222. In some non-limiting examples, at least a part of the vapor flux 532 of the deposited material 531 for forming the second electrode 1240 may be incident on at least one exposed layer surface 11 of, and/or in, the recess 3222, such that the second electrode 1240 may extend to cover at least a part of the recess 3222.

In some non-limiting examples, the auxiliary electrode 2150, the deposited layer 140, and/or the partition 3221 may be selectively provided in certain region(s) of a display panel 1340. In some non-limiting examples, any of these features may be provided at, and/or proximate to, at least one edge of such display panel 1340 for electrically coupling at least one element of the frontplane 1610, including without limitation, the second electrode 1240, to at least one element of the backplane 1615. In some non-limiting examples, providing such features at, and/or proximate to, such edges may facilitate supplying and distributing electrical current to the second electrode 1240 from an auxiliary electrode 2150 located at, and/or proximate to, such edges. In some non-limiting examples, such configuration may facilitate reducing a bezel size of the display panel 1340.

In some non-limiting examples, the auxiliary electrode 2150, the deposited layer 140, and/or the partition 3221 may be omitted from certain regions(s) of such display panel 1340. In some non-limiting examples, such features may be omitted from parts of the display panel 1340, including without limitation, where a relatively high pixel density may be provided, other than at, and/or proximate to, at least one edge thereof.

Aperture in Non-Emissive Region

Figure 33A:
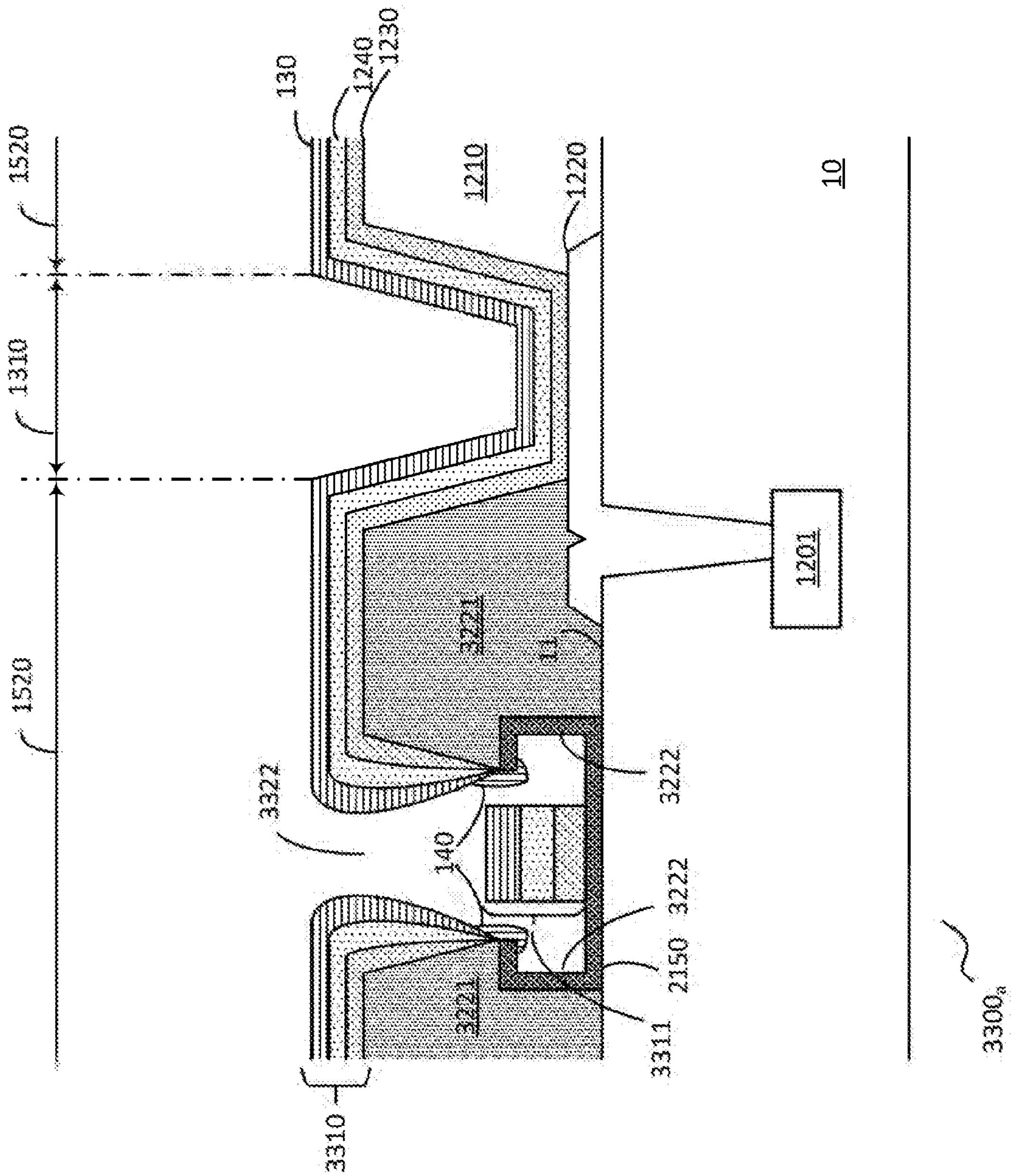
FIGS. 33A-33B are schematic diagrams that show example cross-sectional views of an example version of the device of FIG. 16 having a partition and a sheltered region, such as an aperture, in a non-emissive region, according to various examples in the present disclosure.

Turning now to FIG. 33A, there may be shown a cross-sectional view of an example version 3300$_a$ of the device 1600. The device 3300$_a$ may differ from the device 3200 in that a pair of partitions 3221 in the non-emissive region 1520 may be disposed in a facing arrangement to define a sheltered region 3165, such as an aperture 3322, therebetween. As shown, in some non-limiting examples, at least one of the partitions 3221 may function as a PDL 1210 that covers at least an edge of the first electrode 1220 and that defines at least one emissive region 1310. In some non-limiting examples, at least one of the partitions 3221 may be provided separately from a PDL 1210.

A sheltered region 3165, such as the recess 3222, may be defined by at least one of the partitions 3221. In some non-limiting examples, the recess 3222 may be provided in a part of the aperture 3322 proximal to the substrate 10. In some non-limiting examples, the aperture 3322 may be substantially elliptical when viewed in plan. In some non-limiting examples, the recess 3222 may be substantially annular when viewed in plan and surround the aperture 3322.

In some non-limiting examples, the recess 3222 may be substantially devoid of materials for forming each of the layers of a device stack 3310, and/or of a residual device stack 3311.

In these figures, a device stack 3310 may be shown comprising the at least one semiconducting layer 1230, the second electrode 1240 and the patterning coating 130 deposited on an upper section of the partition 3221.

In these figures, a residual device stack 3311 may be shown comprising the at least one semiconducting layer 1230, the second electrode 1240 and the patterning coating 130 deposited on the substrate 10 beyond the partition 3221 and recess 3222. From comparison with FIG. 32, it may be seen that the residual device stack 3311 may, in some non-limiting examples, correspond to the semiconductor layer 1230, second electrode 1240 and the patterning coating 130 as it approaches the recess 3222 at, and/or proximate to, a lip of the partition 3221. In some non-limiting examples, the residual device stack 3311 may be formed when an open mask and/or mask-free deposition process is used to deposit various materials of the device stack 3310.

In some non-limiting examples, the residual device stack 3311 may be disposed within the aperture 3322. In some non-limiting examples, evaporated materials for forming each of the layers of the device stack 3310 may be deposited within the aperture 3322 to form the residual device stack 3311 therein.

In some non-limiting examples, the auxiliary electrode 2150 may be arranged such that at least a part thereof is disposed within the recess 3222. As shown, in some non-limiting examples, the auxiliary electrode 2150 may be arranged within the aperture 3322, such that the residual device stack 3311 is deposited onto a surface of the auxiliary electrode 2150.

A deposited layer 140 may be disposed within the aperture 3322 for electrically coupling the second electrode 1240 with the auxiliary electrode 2150. By way of non-limiting example, at least a part of the deposited layer 140 may be disposed within the recess 3222.

Figure 33B:
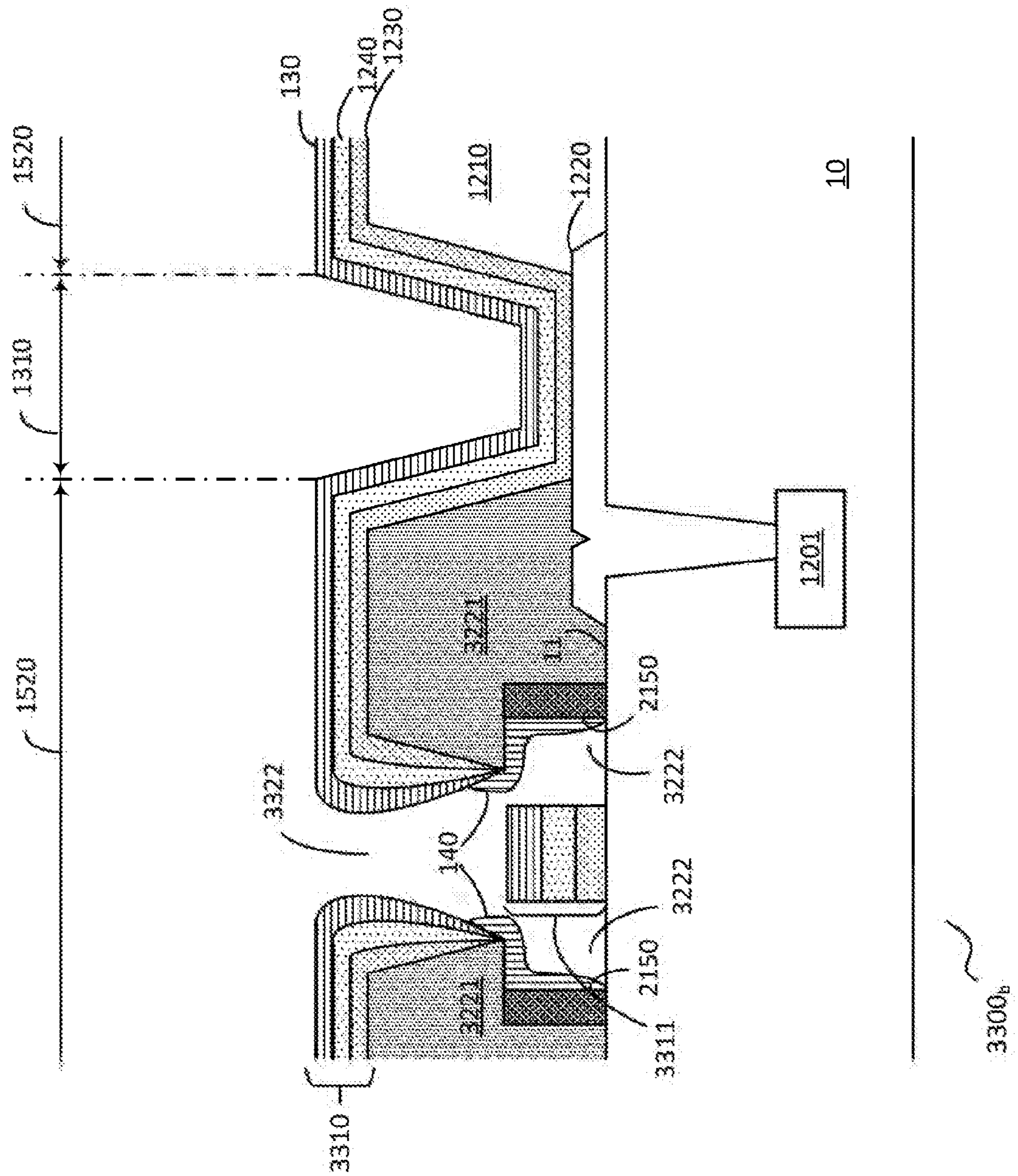

Turning now to FIG. 33B, there may be shown a cross-sectional view of a further example of the device $\mathbf{3300}_b$. As shown, the auxiliary electrode 2150 may be arranged to form at least a part of a side of the partition 3221. As such, the auxiliary electrode 2150 may be substantially annular, when viewed in plan view, and may surround the aperture 3322. As shown, in some non-limiting examples, the residual device stack 3311 may be deposited onto an exposed layer surface 11 of the substrate 10.

In some non-limiting examples, the partition 3221 may comprise, and/or be formed by, an NPC 720. By way of non-limiting example, the auxiliary electrode 2150 may act as an NPC 720.

In some non-limiting examples, the NPC 720 may be provided by the second electrode 1240, and/or a part, layer, and/or material thereof. In some non-limiting examples, the second electrode 1240 may extend laterally to cover the exposed layer surface 11 arranged in the sheltered region 3165. In some non-limiting examples, the second electrode 1240 may comprise a lower layer thereof and a second layer thereof, wherein the second layer thereof may be deposited on the lower layer thereof. In some non-limiting examples, the lower layer of the second electrode 1240 may comprise an oxide such as, without limitation, ITO, IZO, or ZnO. In some non-limiting examples, the upper layer of the second electrode 1240 may comprise a metal such as, without limitation, at least one of Ag, Mg, Mg:Ag, Yb/Ag, other alkali metals, and/or other alkali earth metals.

In some non-limiting examples, the lower layer of the second electrode 1240 may extend laterally to cover a surface of the sheltered region 3165, such that it forms the NPC 720. In some non-limiting examples, at least one surface defining the sheltered region 3165 may be treated to form the NPC 720. In some non-limiting examples, such NPC 720 may be formed by chemical, and/or physical treatment, including without limitation, subjecting the surface(s) of the sheltered region 3165 to a plasma, UV, and/or UV-ozone treatment.

Without wishing to be bound to any particular theory, it may be postulated that such treatment may chemically, and/or physically alter such surface(s) to modify at least one property thereof. By way of non-limiting example, such treatment of the surface(s) may increase a concentration of C—O, and/or C—OH bonds on such surface(s), may increase a roughness of such surface(s), and/or may increase a concentration of certain species, and/or functional groups, including without limitation, halogens, N-containing functional groups, and/or oxygen-containing functional groups to thereafter act as an NPC 720.

Display Panel

Figure 34:
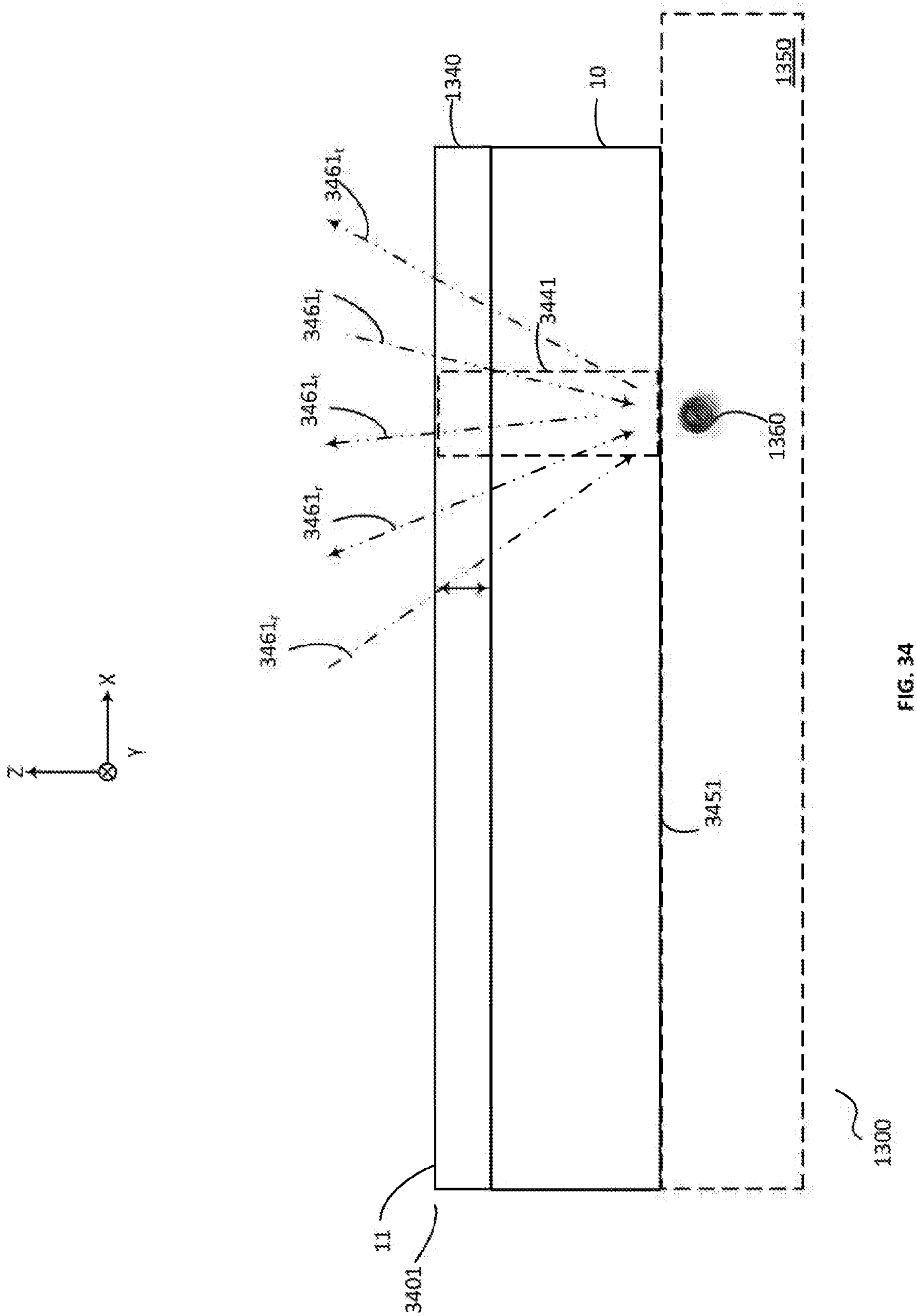
FIG. 34 is a schematic diagram illustrating an example cross-sectional view of an example user device having a display panel having a plurality of layers, comprising at least one aperture therewithin, according to an example in the present disclosure.

Turning now to FIG. 34, there is shown a cross-sectional view of a display panel 1340. In some non-limiting examples, the display panel 1340 may be a version of the layered semiconductor device 100, including without limitation, an opto-electronic device 1200, culminating with an outermost layer that forms a face 3401 thereof.

The face 3401 of the display panel 1340 may extend across a lateral aspect thereof, substantially along a plane defined by the lateral axes.

User Device

In some non-limiting examples, the face 3401, and indeed, the entire display panel 1340, may act as a face of a user device 1300 through which at least one EM signal 3461 may be exchanged therethrough at a non-zero angle relative to the plane of the face 3401. In some non-limiting examples, the user device 1300 may be a computing device, such as, without limitation, a smartphone, a tablet, a laptop, and/or an e-reader, and/or some other electronic device, such as a monitor, a television set, and/or a smart device, including without limitation, an automotive display and/or windshield, a household appliance, and/or a medical, commercial, and/or industrial device.

In some non-limiting examples, the face 3401 may correspond to and/or mate with a body 1350, and/or an opening 3451 therewithin, within which at least one under-display component 1360 may be housed.

In some non-limiting examples, the at least one under-display component 1360 may be formed integrally, or as an assembled module, with the display panel 1340 on a surface thereof opposite to the face 3401. In some non-limiting examples, the at least one under-display component 1360 may be formed on an exposed layer surface 11 of the substrate 10 of the display panel 1340 opposite to the face 3401.

In some non-limiting examples, at least one aperture 3441 may be formed in the display panel 1340 to allow for the exchange of at least one EM signal 3461 through the face 3401 of the display panel 1340, at a non-zero angle to the plane defined by the lateral axes, or concomitantly, the layers of the display panel 1340, including without limitation, the face 3401 of the display panel 1340.

In some non-limiting examples, the at least one aperture 3441 may be understood to comprise the absence and/or reduction in thickness and/or opacity of a substantially opaque coating otherwise disposed across the display panel 1340. In some non-limiting examples, the at least one aperture 3441 may be embodied as a signal transmissive region 1320 as described herein.

However, the at least one aperture 3441 is embodied, the at least one EM signal 3461 may pass therethrough such that it passes through the face 3401. As a result, the at least one EM signal 3461 may be considered to exclude any EM radiation that may extend along the plane defined by the lateral axes, including without limitation, any electric current that may be conducted across at least one particle structure 160 laterally across the display panel 1340.

Further, those having ordinary skill in the relevant art will appreciate that the at least one EM signal 3461 may be differentiated from EM radiation per se, including without limitation, electric current, and/or an electric field generated thereby, in that the at least one EM signal 3461 may convey, either alone, or in conjunction with other EM signals 3461, some information content, including without limitation, an identifier by which the at least one EM signal 3461 may be distinguished from other EM signals 3461. In some non-limiting examples, the information content may be conveyed by specifying, altering, and/or modulating at least one of the wavelength, frequency, phase, timing, bandwidth, resistance, capacitance, impedance, conductance, and/or other characteristic of the at least one EM signal 3461.

In some non-limiting examples, the at least one EM signal 3461 passing through the at least one aperture 3441 of the display panel 1340 may comprise at least one photon and, in some non-limiting examples, may have a wavelength spectrum that lies, without limitation, within at least one of the visible spectrum, the IR spectrum, and/or the NIR spectrum. In some non-limiting examples, the at least one EM signal 3461 passing through the at least one aperture 3441 of the display panel 1340 may have a wavelength that lies, without limitation, within the IR and/or NR spectrum.

In some non-limiting examples, the at least one EM signal 3461 passing through the at least one aperture 3441 of the display panel 1340 may comprise ambient light incident thereon.

In some non-limiting examples, the at least one EM signal 3461 exchanged through the at least one aperture 3441 of the display panel 1340 may be transmitted and/or received by the at least one under-display component 1360.

In some non-limiting examples, the at least one under-display component 1360 may have a size that is greater than a single signal transmissive region 1320, but may underlie not only a plurality thereof but also at least one emissive region 1310 extending therebetween. Similarly, in some non-limiting examples, the at least one under-display component 1360 may have a size that is greater than a single one of the at least one aperture 3441.

In some non-limiting examples, the at least one under-display component 1360 may comprise a receiver 1360$_r$ adapted to receive and process at least one received EM signal 3461$_r$ passing through the at least one aperture 3441 from beyond the user device 1300. Non-limiting examples of such receiver 1360$_r$ include an under-display camera (UDC), and/or a sensor, including without limitation, an IR sensor or detector, an NIR sensor or detector, a LIDAR sensing module, a fingerprint sensing module, an optical sensing module, an IR (proximity) sensing module, an iris recognition sensing module, and/or a facial recognition sensing module, and/or a part thereof.

In some non-limiting examples, the at least one under-display component 1360 may comprise a transmitter 1360$_t$ adapted to emit at least one transmitted EM signal 3461$_t$ passing through the at least one aperture 3441 beyond the user device 1300. Non-limiting examples of such transmitter 1360$_t$ include a source of EM radiation, including without limitation, a built-in flash, a flashlight, an IR emitter, and/or an NIR emitter, and/or a LIDAR sensing module, a fingerprint sensing module, an optical sensing module, an IR (proximity) sensing module, an iris recognition sensing module, and/or a facial recognition sensing module, and/or a part thereof.

In some non-limiting examples, the at least one received EM signal 3461$_r$ includes at least a fragment of the at least one transmitted EM signal 3461$_t$, which is reflected off, or otherwise returned by, an external surface to the user device 1300.

In some non-limiting examples, the at least one EM signal 3461 passing through the at least one aperture 3441 of the display panel 1340 beyond the user device 1300, including without limitation, those transmitted EM signals 3461$_t$ emitted by the at least one under-display component 1360 that comprises a transmitter 1360$_t$, may emanate from the display panel 1340, and pass back as emitted EM signals 3461$_r$ through the at least one aperture 3441 of the display panel 1340 to at least one under-display component 1360 that comprises a receiver 1360$_r$.

In some non-limiting examples, the under-display component 1360 may comprise an IR emitter and an IR sensor. By way of non-limiting example, such under-display component 1360 may comprise, as a part, component or module thereof: a dot matrix projector, a time-of-flight (ToF) sensor module, which may operate as a direct ToF and/or indirect ToF sensor, a vertical cavity surface-emitting laser (VCSEL), flood illuminator, NIR imager, folded optics, or a diffractive grating.

In some non-limiting examples, there may be a plurality of under-display components 1360 within the user device 1300, a first one of which comprises a transmitter 1360$_t$ for emitting at least one transmitted EM signal 3461$_t$ to pass through the at least one aperture 3441, beyond the user device 1300, and a second one of which comprises a receiver 1360$_r$, for receiving at least one received EM signal 3461$_r$. In some non-limiting examples, such transmitter 1360$_t$ and receiver 1360$_r$ may be embodied in a single, common under-display component 1360.

Figure 35A:
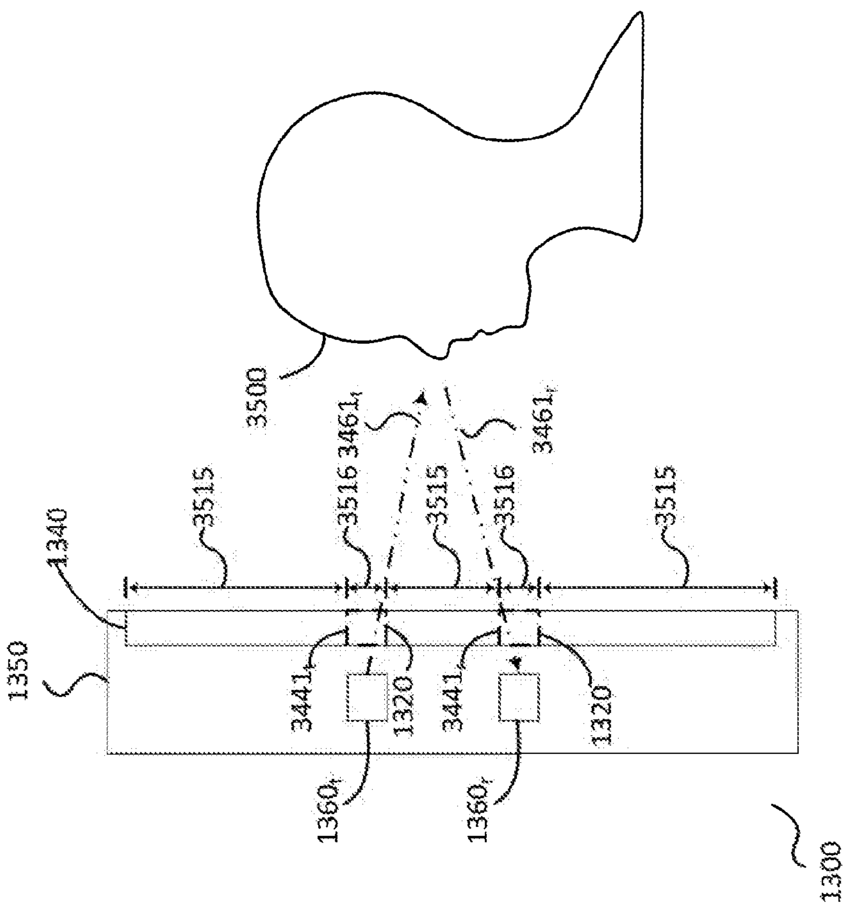
FIG. 35A is a schematic diagram illustrating use of the user device of FIG. 34, where the at least one aperture is embodied by at least one signal transmissive region, to exchange EM radiation in the IR and/or NIR spectrum for purposes of biometric authentication of a user, according to an example in the present disclosure.

This may be seen by way of non-limiting example in FIG. 35A, in which a version of the user device 1300 is shown as having a display panel 1340 that comprises, in a lateral aspect thereof (shown vertically in the figure), at least one display part 3515 adjacent and in some non-limiting examples, separated by at least one signal-exchanging display part 3516. The user device 1300 houses at least one transmitter 1360$_t$ for transmitting at least one transmitted EM signal 3461$_t$ through at least one first signal transmissive region 1320 in, and in some non-limiting examples, substantially corresponding to, the first signal-exchanging display part 3516 beyond the face 3401, as well as a receiver 1360$_r$ for receiving at least one received EM signal 3461$_r$, through at least one second signal transmissive region 1320 in, and in some non-limiting examples, substantially corresponding to, the second signal-exchanging display part 3516. In some non-limiting examples, the at least one first and second signal-exchanging display part 3516 may be the same. In some non-limiting examples, the at least one received EM signal 3461$_r$ may be the at least one transmitted EM signal 3461$_t$ reflected of an external surface, including without limitation, a user 1100, including without limitation, for biometric authentication thereof.

Figure 35C:
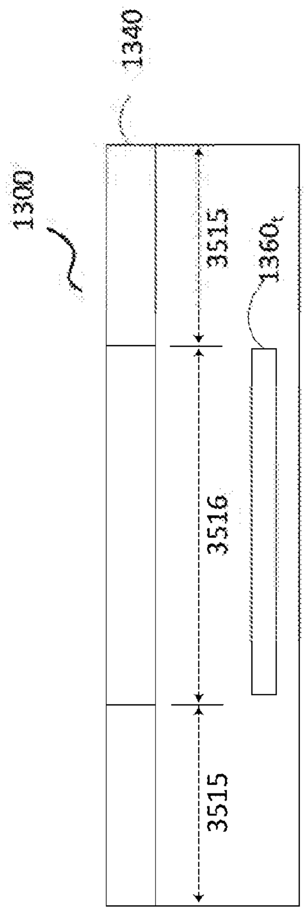
FIG. 35C shows the cross-sectional view taken along the line 35C-35C of the device shown in FIG. 35B.
Figure 35B:
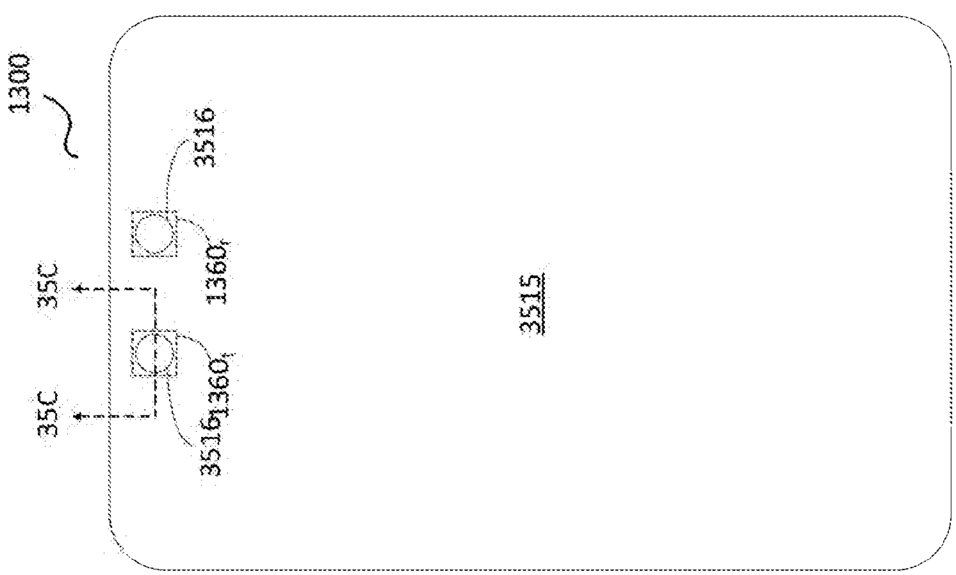
FIG. 35B is a plan view of the user device of FIG. 34 which includes a display panel, according to an example in the present disclosure.

FIG. 35B, shows a version of the user device 1300 in plan according to a non-limiting example, which includes a display panel 1340 defining a face of the user device 1300. The user device 1300 houses the least one transmitter 1360$_t$ and the at least one receiver 1360$_r$ arranged beyond the face 3401. FIG. 35C shows the cross-sectional view taken along the line 35C-35C of the user device 1300.

The display panel 1340 includes a display part 3515 and a signal-exchanging display part 3516. The display part 3515 includes a plurality of emissive regions 1310 (not shown). The signal-exchanging display part 3516 includes a plurality of emissive regions 1310 (not shown) and a plurality of signal transmissive regions 1320. The plurality of emissive regions 1310 in the display part 3515 and the signal-exchanging display part 3516 may correspond to sub-pixels 134*x* of the display panel 1340. The plurality of signal transmissive regions 1320 in the signal-exchanging display part 3516 may be configured to allow EM signals having a wavelength (range) corresponding to the IR spectrum to pass through the entirety of a cross-sectional aspect thereof. The at least one transmitter 1360$_t$ and the at least one receiver 1360$_r$ may be arranged behind the corresponding signal-exchanging display part 3516, such that IR signals may be emitted and received, respectively, by passing through the signal-exchanging display part 3516 of the panel 1340. In the illustrated non-limiting example, each of the at least one transmitter 1360$_t$ and the at least one receiver 1360$_r$ is shown as having a corresponding signal-exchanging display part 3516 disposed in the path of the signal transmission.

Figure 35E:
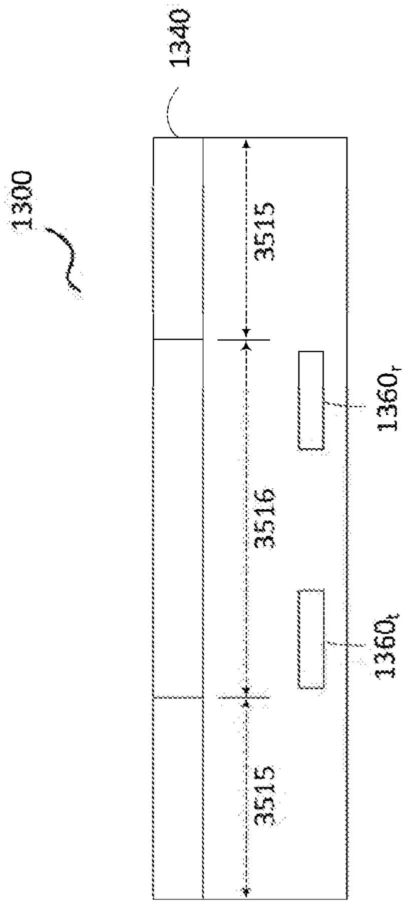
FIG. 35E shows the cross-sectional view taken along the line 35E-35E of the device shown in FIG. 35D.
Figure 35D:
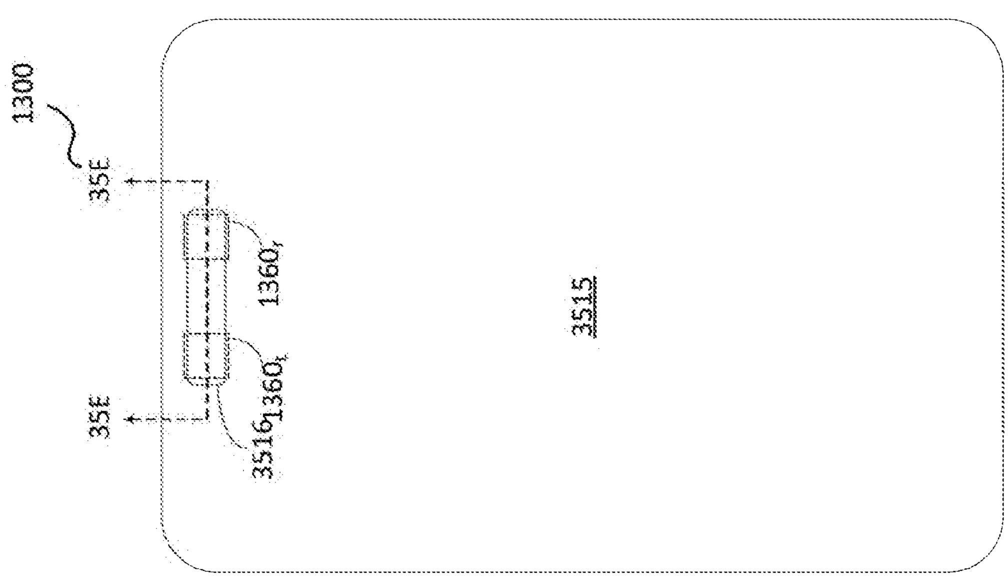
FIG. 35D is a plan view of the user device of FIG. 34 which includes a display panel, according to an example in the present disclosure.
Figure 35G:
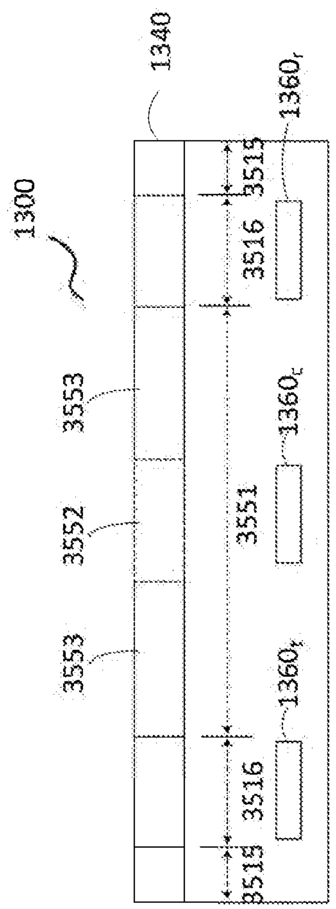
FIG. 35G shows the cross-sectional view taken along the line 35G-35G of the device shown in FIG. 35F.

FIG. 35D shows a version of the user device 1300 in plan according to a non-limiting example, wherein at least one transmitter 1360$_t$ and the at least one receiver 1360$_r$ are both arranged behind a common signal-exchanging display part 3516. By way of non-limiting example, the signal-exchanging display part 3516 may be elongated along at least one configuration axis in the plan view, such that it extends over both the transmitter 1360$_t$ and the receiver 1360$_r$. FIG. 35E shows a cross-sectional view taken along the line 35E-35E in FIG. 35D.

Figure 35F:
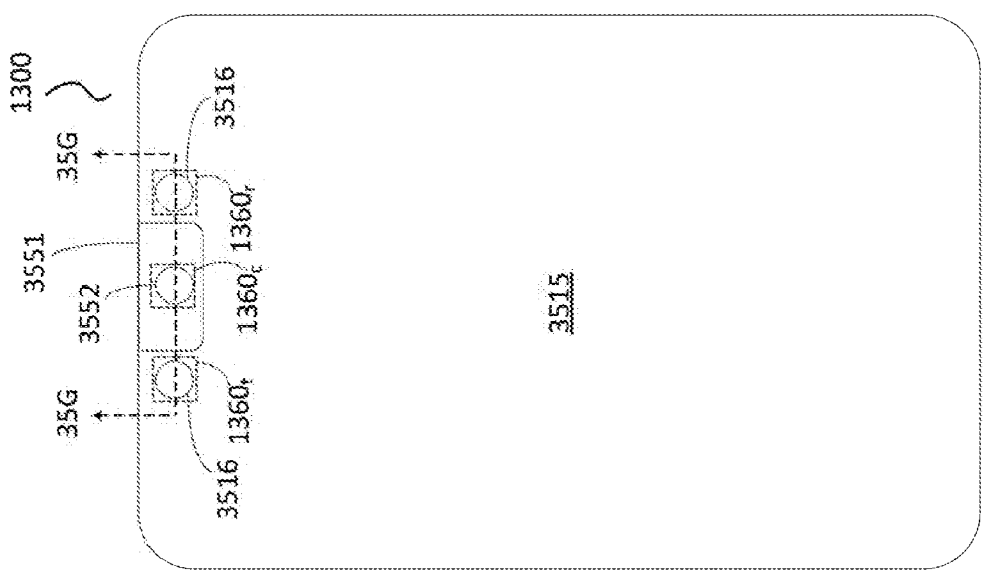
FIG. 35F is a plan view of the user device of FIG. 34 which includes a display panel, according to an example in the present disclosure.

FIG. 35F shows a version of the user device 1300 in plan according to a non-limiting example, wherein the display panel 1340 further includes a non-display part 3551. In some non-limiting examples, the display panel 1340 may include the at least one transmitter 1360$_t$ and the at least one receiver 1360$_r$, each of which may be arranged behind the corresponding signal-exchanging display part 3516. The non-display part 3551 may be arranged, in plan, adjacent to, and between, the two signal-exchanging display parts 3516. The non-display part 3551 may be substantially devoid of any emissive regions 1310. In some non-limiting examples, the user device 1300 may house a camera 1360$_c$ arranged in the non-display part 3551. In some non-limiting examples, the non-display part 3551 may include a through-hole part 3552 which may be arranged to overlap with the camera 1360$_c$. In some non-limiting examples, the panel 1340 in the through-hole part 3552 may be substantially devoid of any layers, coatings, and/or components which may be present in the display part 3515 and/or the signal-exchanging display part 3516. By way of non-limiting example, the panel 1340 in the through-hole part 3552 may be substantially devoid of any backplane and/or frontplane components, the presence of which may otherwise interfere with an image captured by the camera 1360$_c$. In some non-limiting examples, a cover glass of the panel 1340 may extend substantially across the display part 3515, the signal-exchanging display part 3516, and the through-hole part 3552 such that it may be present in all of the foregoing parts of the panel 1340. In some non-limiting examples, the panel 1340 may further include a polarizer (not shown), which may extend substantially across the display part 3515, the signal-exchanging display part 3516, and the through-hole part 3552 such that it may be present in all of the foregoing parts of the panel 1340. In some non-limiting examples, the through-hole part 3552 may be substantially devoid of a polarizer in order to enhance the transmission of EM radiation through such part of the panel 1340.

In some non-limiting examples, the non-display part 3551 of the panel 1340 may further include a non-through-hole part 3553. By way of non-limiting example, the non-through-hole part 3553 may be arranged between the through-hole part 3552 and the signal-exchanging display part 3516 in a lateral aspect. In some non-limiting examples, the non-through-hole part 3553 may surround at least a part, or the entirety, of a perimeter of the through-hole part 3552. While not specifically shown, the user device 1300 may comprise additional modules, components, and/or sensors in the part of the user device 1300 corresponding to the non-through-hole part 3553 of the display panel 1340.

In some non-limiting examples, the signal-exchanging display part 3516 may have a reduced number of, or be substantially devoid of, backplane components that would otherwise hinder or reduce transmission of EM radiation through the signal-exchanging display part 3516. By way of non-limiting example, the signal-exchanging display part 3516 may be substantially devoid of TFT structures 1201, including but not limited to: metal trace lines, capacitors, and/or other opaque or light-absorbing elements. In some non-limiting examples, the emissive regions 1310 in the signal-exchanging display part 3516 may be electrically coupled with one or more TFT structures 1201 located in the non-through-hole part 3553 of the non-display part 3551. Specifically, the TFT structures 1201 for actuating the sub-pixels 134*x* in the signal-exchanging display part 3516 may be relocated outside of the signal-exchanging display part 3516 and within the non-through-hole part 3553 of the panel 1340, such that a relatively high transmission of EM radiation, at least in the IR spectrum and/or NIR spectrum, through the non-emissive regions 1520 (not shown) within the signal-exchanging display part 3516 may be attained. By way of non-limiting example, the TFT structures 1201 in the non-through-hole part 3553 may be electrically coupled with sub-pixels 134*x* in the signal-exchanging display part 3516 via conductive trace(s). In some non-limiting examples, the transmitter 1360$_t$ and the receiver 1360$_r$ may be arranged adjacent, and/or proximate, to the non-through-hole part 3553 in the lateral aspect, such that a distance over which current travels between the TFT structures 1201 and the sub-pixels 134*x* may be reduced.

In some non-limiting examples, the emissive regions 1310 may be configured such that at least one of an aperture ratio and a pixel density thereof may be the same within both the display part 3515 and the signal-exchanging display part 3516. In some non-limiting examples, the pixel density may be at least one of at least about: 300 ppi, 350 ppi, 400 ppi, 450 ppi, 500 ppi, 550 ppi, or 600 ppi. In some non-limiting examples, the aperture ratio may be at least one of at least about: 25%, 27%, 30%, 33%, 35%, or 40%. In some non-limiting examples, the emissive regions 1310 or pixels 134*x* of the panel 1340 may be substantially identically shaped and arranged between the display part 3515 and the signal-exchanging display part 3516 to reduce the likelihood of a user 1100 detecting visual differences between the display part 3515 and the signal-exchanging display part 3516 of the panel 1340.

Figure 35H:
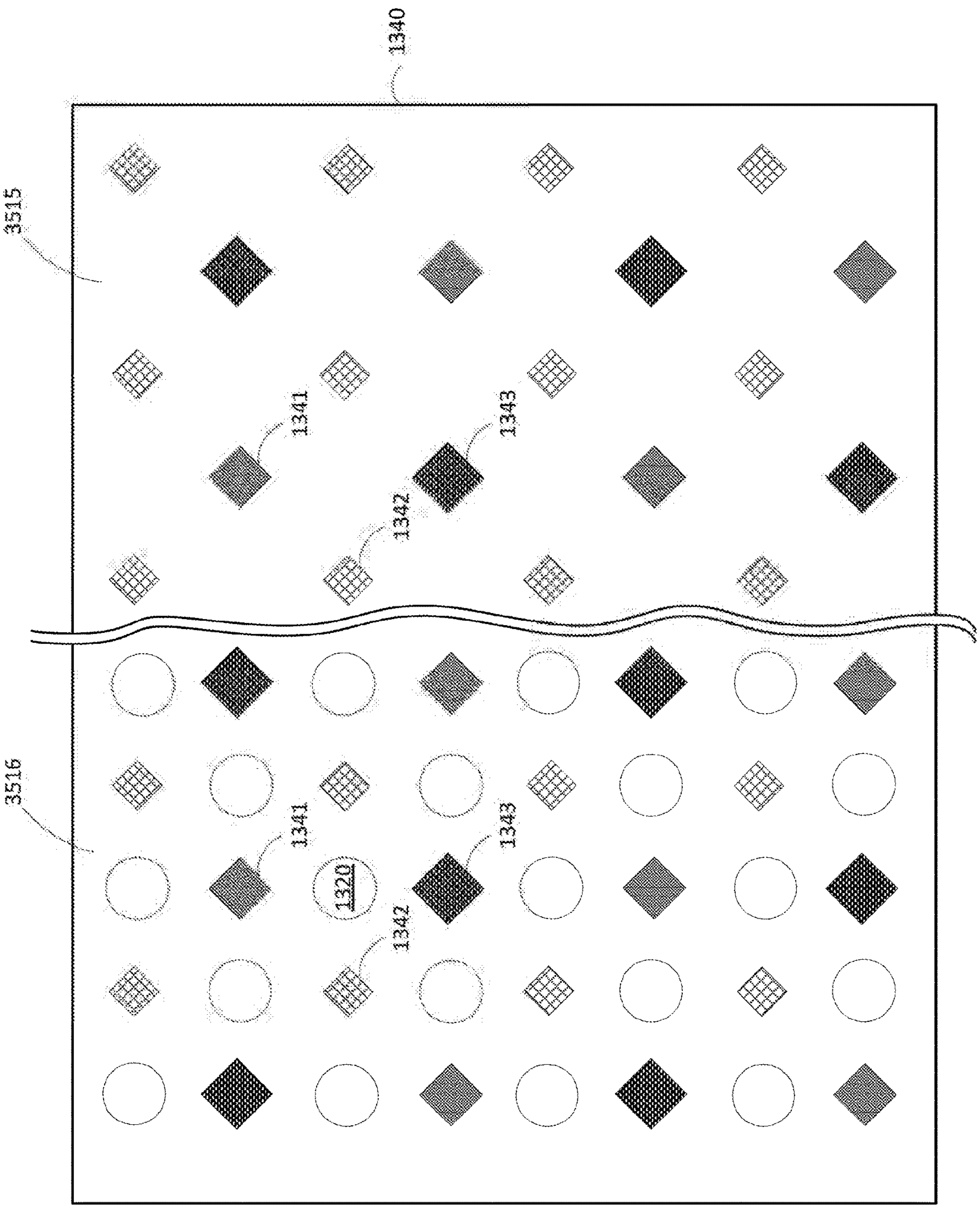
FIG. 35H shows a magnified plan view of parts of the panel according to an example in the present disclosure.

FIG. 35H shows a magnified view, partially cut-away, of parts of the panel 1340 in plan, according to a non-limiting example. Specifically, the configuration and layout of emissive regions 1310, represented as sub-pixels 134*x*, in the display part 3515 and the signal-exchanging display part 3516 is shown. In each part, a plurality of emissive regions 1310 may be provided, each corresponding to a sub-pixel 134*x*. In some non-limiting examples, the sub-pixels 134*x* may correspond to, respectively, R(ed) sub-pixels 1341, G(reen) sub-pixels 1342 and/or B(lue) sub-pixels 1343. In the signal-exchanging display part 3516, a plurality of signal transmissive regions 1320 may be provided between adjacent sub-pixels 134*x*.

In some non-limiting examples, the display panel 1340 may further include a transition region (not shown) between the display part 3515 and the signal-exchanging display part 3516 wherein the configuration of the emissive regions 1310 and/or signal transmissive regions 1320 may differ from those of the adjacent display part 3515 and/or the signal-exchanging display part 3516. In some non-limiting examples, the presence of such transition region may be omitted such that the emissive regions 1310 are provided in a substantially continuous repeating pattern across the display part 3515 and the signal-exchanging display part 3516.

Covering Layer

In some non-limiting examples, at least one covering layer 1330 may be provided in the form of at least one layer of an outcoupling and/or encapsulation coating of the display panel 1340, including without limitation, an outcoupling layer, a CPL 1215, a layer of a TFE, a polarizing layer, or other physical layer and/or coating that may be deposited upon the display panel 1340 as part of the manufacturing process. In some non-limiting examples, the at least one covering layer 1330 may comprise LiF. In some non-limiting examples, the at least one covering layer 1330 may serve as the overlying layer 180.

In some non-limiting examples, a CPL 1215 may be deposited over the entire exposed layer surface 11 of the device 100. The function of the CPL 1215 in general may be to promote outcoupling of light emitted by the device 100, thus enhancing the external quantum efficiency (EQE).

In some non-limiting examples, the at least one covering layer 1330 may be deposited at least partially across the lateral extent of the face 3401, in some non-limiting examples, at least partially covering the at least one particle structure 160$_t$ of the at least one particle structure 160 in the first portion 101, and forming an interface with the particle structure patterning coating 130*p* at the exposed layer surface 11 thereof. In some non-limiting examples, the at least one covering layer 1330 may also at least partially cover the second electrode 1240 in the second portion 102.

In some non-limiting examples, the at least one covering layer 1330 may have a high refractive index. In some non-limiting examples, the at least one covering layer 1330 may have a refractive index that exceeds a refractive index of the particle structure patterning coating 130*p*.

In some non-limiting examples, the display panel 1340 may be provided, at the interface with the exposed layer surface 11 of the particle structure patterning coating 130*p*, with an air gap and/or air interface, whether during, or subsequent to, manufacture, and/or in operation. Thus, in some non-limiting examples, such air gap and/or air interface may be considered as the at least one covering layer 1330. In some non-limiting examples, the display panel 1340 may be provided with both a CPL 1215 and an air gap, wherein the at least one particle structure 160 may be covered by the CPL 1215 and the air gap may be disposed on or over the CPL 1215.

In some non-limiting examples, at least one of the particle structures 160$_t$ may be in physical contact with the at least one covering layer 1330. In some non-limiting examples, substantially all of the particle structures 160$_t$ may be in physical contact with the at least one covering layer 1330.

Those having ordinary skill in the relevant art will appreciate that there may be additional layers introduced at various stage of manufacture that are not shown.

In some non-limiting examples, the at least one particle structure 160$_t$ in the first portion 101, at an interface between the particle structure patterning layer 323$_p$, comprising a patterning material 411 having a low refractive index, and the at least one covering layer 1330, including without limitation, a CPL 1215, comprising a material that may have a high refractive index, may enhance outcoupling of at least one EM signal 3461 passing through the signal transmissive region(s) 1320 of device 1300 at a non-zero angle relative to the layers thereof.

Diffraction Reduction

It has been discovered that, in some non-limiting examples, the at least one EM signal 3461 passing through the at least one signal transmissive region 1320 may be impacted by a diffraction characteristic of a diffraction pattern imposed by a shape of the at least one signal transmissive region 1320.

At least in some non-limiting examples, a display panel 1340 that causes at least one EM signal 3461 to pass through the at least one signal transmissive region 1320 that is shaped to exhibit a distinctive and non-uniform diffraction pattern, may interfere with the capture of an image and/or EM radiation pattern represented thereby.

By way of non-limiting example, such diffraction pattern may interfere with an ability to facilitate mitigating interference by such diffraction pattern, that is, to permit an under-display component 1360 to be able to accurately receive and process such image or pattern, even with the application of optical post-processing techniques, or to allow a viewer of such image and/or pattern through such display panel 1340 to discern information contained therein.

In some non-limiting examples, a distinctive and/or non-uniform diffraction pattern may result from a shape of the at least one signal transmissive region 1320 that may cause distinct and/or angularly separated diffraction spikes in the diffraction pattern.

In some non-limiting examples, a first diffraction spike may be distinguished from a second proximate diffraction spike by simple observation, such that a total number of diffraction spikes along a full angular revolution may be counted. However, in some non-limiting examples, especially where the number of diffraction spikes is large, it may be more difficult to identify individual diffraction spikes. In such circumstances, the distortion effect of the resulting diffraction pattern may in fact facilitate mitigation of the interference caused thereby, since the distortion effect tends to be blurred and/or distributed more evenly. Such blurring and/or more even distribution of the distortion effect may, in some non-limiting examples, be more amenable to mitigation, including without limitation, by optical post-processing techniques, in order to recover the original image and/or information contained therein.

In some non-limiting examples, an ability to facilitate mitigation of the interference caused by the diffraction pattern may increase as the number of diffraction spikes increases.

In some non-limiting examples, a distinctive and non-uniform diffraction pattern may result from a shape of the at least one signal transmissive region 1320 that increase a length of a pattern boundary within the diffraction pattern between region(s) of high intensity of EM radiation and region(s) of low intensity of EM radiation as a function of a pattern circumference of the diffraction pattern and/or that reduces a ratio of the pattern circumference relative to the length of the pattern boundary thereof.

Without wishing to be bound by any specific theory, it may be postulated that display panels 1340 having closed boundaries of signal transmissive regions 1320 that are polygonal may exhibit a distinctive and non-uniform diffraction pattern that may adversely impact an ability to facilitate mitigation of interference caused by the diffraction pattern, relative to a display panel 1340 having closed boundaries of light transmissive regions 1320 defined by a corresponding signal transmissive region 1320 that is non-polygonal.

In the present disclosure, the term "polygonal" may refer generally to shapes, figures, closed boundaries, and/or perimeters formed by a finite number of linear and/or straight segments and the term "non-polygonal" may refer generally to shapes, figures, closed boundaries, and/or perimeters that are not polygonal. By way of non-limiting example, a closed boundary formed by a finite number of linear segments and at least one non-linear or curved segment may be considered non-polygonal.

Without wishing to be bound by a particular theory, it may be postulated that when a closed boundary of a signal transmissive region 1320 comprises at least one non-linear and/or curved segment, EM signals incident thereon and transmitted therethrough may exhibit a less distinctive and/or more uniform diffraction pattern that facilitates mitigation of interference caused by the diffraction pattern.

In some non-limiting examples, a display panel 1340 having a closed boundary of the signal transmissive regions 1320 that is substantially elliptical and/or circular may further facilitate mitigation of interference caused by the diffraction pattern.

In some non-limiting examples, a signal transmissive region 1320 may be defined by a finite plurality of convex rounded segments. In some non-limiting examples, at least some of these segments coincide at a concave notch or peak.

Removal of Selective Coating

In some non-limiting examples, the patterning coating 130 may be removed after deposition of the deposited layer 140, such that at least a part of a previously exposed layer surface 11 of an underlying layer covered by the patterning coating 130 may become exposed once again. In some non-limiting examples, the patterning coating 130 may be selectively removed by etching, and/or dissolving the patterning coating 130, and/or by employing plasma, and/or solvent processing techniques that do not substantially affect or erode the deposited layer 140.

Figures 36A, 36B, 36C:
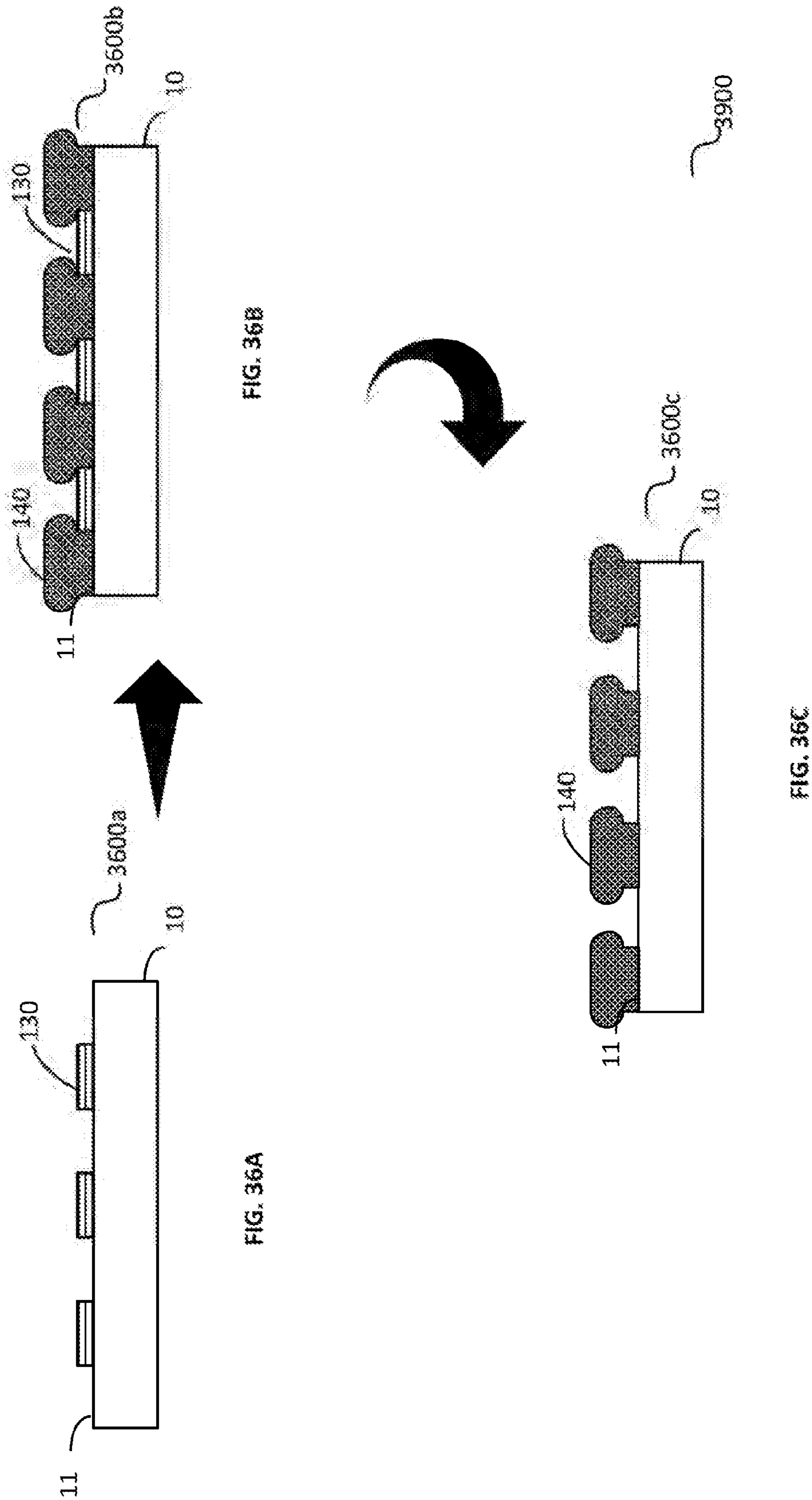
FIGS. 36A-36C are schematic diagrams that show example stages of an example process for depositing a deposited layer in a pattern on an exposed layer surface of an example version of the device of FIG. 16 by selective deposition and subsequent removal process, according to an example in the present disclosure.

Turning now to FIG. 36A, there may be shown an example cross-sectional view of an example version 3600 of the device 1600, at a deposition stage 3600*a*, in which a patterning coating 130 may have been selectively deposited on a first portion 101 of an exposed layer surface 11 of an underlying layer. In the figure, the underlying layer may be the substrate 10.

In FIG. 36B, the device 3600 may be shown at a deposition stage 3600*b*, in which a deposited layer 140 may be deposited on the exposed layer surface 11 of the underlying layer, that is, on both the exposed layer surface 11 of patterning coating 130 where the patterning coating 130 may have been deposited during the stage 3600*a*, as well as the exposed layer surface 11 of the substrate 10 where that patterning coating 130 may not have been deposited during the stage 3600*a*. Because of the nucleation-inhibiting properties of the first portion 101 where the patterning coating 130 may have been disposed, the deposited layer 140 disposed thereon may tend to not remain, resulting in a pattern of selective deposition of the deposited layer 140, that may correspond to a second portion 102, leaving the first portion 101 substantially devoid of the deposited layer 140.

In FIG. 36C, the device 3600 may be shown at a deposition stage 3600*c*, in which the patterning coating 130 may have been removed from the first portion 101 of the exposed layer surface 11 of the substrate 10, such that the deposited layer 140 deposited during the stage 3600*b* may remain on the substrate 10 and regions of the substrate 10 on which the patterning coating 130 may have been deposited during the stage 3600*a* may now be exposed or uncovered.

In some non-limiting examples, the removal of the patterning coating 130 in the stage 3600*c* may be effected by exposing the device 3600 to a solvent, and/or a plasma that reacts with, and/or etches away the patterning coating 130 without substantially impacting the deposited layer 140.

Thin Film Formation

The formation of thin films during vapor deposition on an exposed layer surface 11 of an underlying layer may involve processes of nucleation and growth.

During initial stages of film formation, a sufficient number of vapor monomers which in some non-limiting examples may be molecules, and/or atoms of a deposited material 531 in vapor form 532) may typically condense from a vapor phase to form initial nuclei on the exposed layer surface 11 presented of an underlying layer. As vapor monomers may impinge on such surface, a characteristic size, length, width, diameter, height, size distribution, shape, surface coverage, configuration, deposited density, dispersity of these initial nuclei may increase to form small particle structures 160. Non-limiting examples of a dimension to which such characteristic size refers may include a height, width, length, and/or diameter of such particle structure 160.

After reaching a saturation island density, adjacent particle structures 160 may typically start to coalesce, increasing an average characteristic size of such particle structures 160, while decreasing a deposited density thereof.

With continued vapor deposition of monomers, coalescence of adjacent particle structures 160 may continue until a substantially closed coating 150 may eventually be deposited on an exposed layer surface 11 of an underlying layer. The behaviour, including optical effects caused thereby, of such closed coatings 150 may be generally relatively uniform, consistent, and unsurprising.

There may be at least three basic growth modes for the formation of thin films, in some non-limiting examples, culminating in a closed coating 150: 1) island (Volmer-Weber), 2) layer-by-layer (Frank-van der Merwe), and 3) Stranski-Krastanov.

Island growth may typically occur when stale clusters of monomers nucleate on an exposed layer surface 11 and grow to form discrete islands. This growth mode may occur when the interaction between the monomers is stronger than that between the monomers and the surface.

The nucleation rate may describe how many nuclei of a given size (where the free energy does not push a cluster of such nuclei to either grow or shrink) ("critical nuclei") may be formed on a surface per unit time. During initial stages of film formation, it may be unlikely that nuclei will grow from direct impingement of monomers on the surface, since the deposited density of nuclei is low, and thus the nuclei may cover a relatively small fraction of the surface (e.g., there are large gaps/spaces between neighboring nuclei). Therefore, the rate at which critical nuclei may grow may typically depend on the rate at which adatoms (e.g., adsorbed monomers) on the surface migrate and attach to nearby nuclei.

Figure 37:
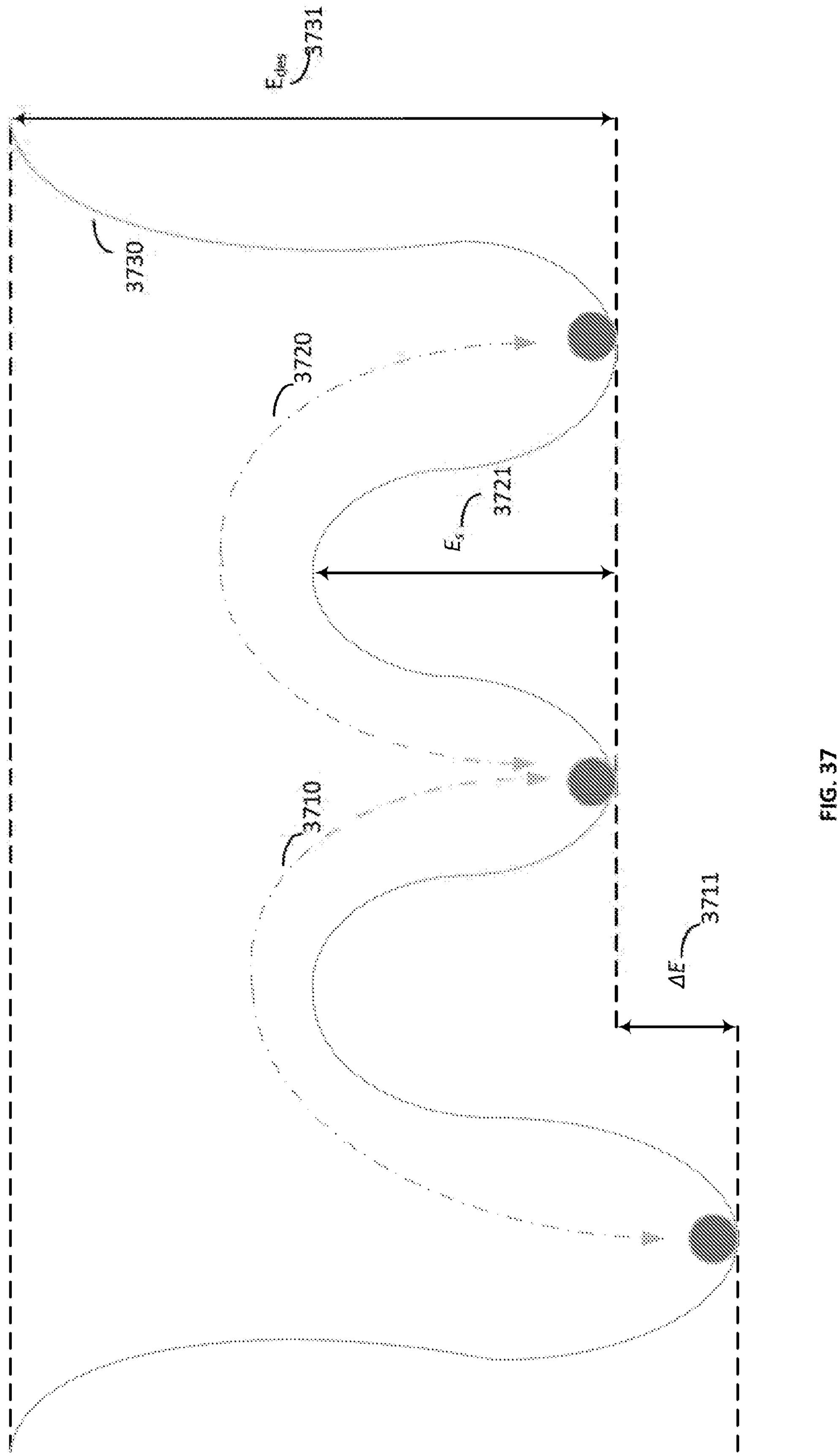
FIG. 37 is an example energy profile illustrating relative energy states of an adatom absorbed onto a surface according to an example in the present disclosure.

An example of an energy profile of an adatom adsorbed onto an exposed layer surface 11 of an underlying layer is illustrated in FIG. 37. Specifically, FIG. 37 may illustrate example qualitative energy profiles corresponding to: an adatom escaping from a local low energy site (3710); diffusion of the adatom on the exposed layer surface 11 (3720); and desorption of the adatom (3730).

In 3710, the local low energy site may be any site on the exposed layer surface 11 of an underlying layer, onto which an adatom will be at a lower energy. Typically, the nucleation site may comprise a defect, and/or an anomaly on the exposed layer surface 11, including without limitation, a ledge, a step edge, a chemical impurity, a bonding site, and/or a kink ("heterogeneity").

Sites of substrate heterogeneity may increase an energy involved to desorb the adatom from the surface $E_{des}$ 3731, leading to a higher deposited density of nuclei observed at such sites. Also, impurities or contamination on a surface may also increase $E_{des}$ 3731, leading to a higher deposited density of nuclei. For vapor deposition processes, conducted under high vacuum conditions, the type and deposited density of contaminants on a surface may be affected by a vacuum pressure and a composition of residual gases that make up that pressure.

Once the adatom is trapped at the local low energy site, there may typically, in some non-limiting examples, be an energy barrier before surface diffusion takes place. Such energy barrier may be represented as $\Delta E$3711 in FIG. 37. In some non-limiting examples, if the energy barrier $\Delta E$3711 to escape the local low energy site is sufficiently large, the site may act as a nucleation site.

In 3720, the adatom may diffuse on the exposed layer surface 11. By way of non-limiting example, in the case of localized absorbates, adatoms may tend to oscillate near a minimum of the surface potential and migrate to various neighboring sites until the adatom is either desorbed, and/or is incorporated into growing islands 160 formed by a cluster of adatoms, and/or a growing film. In FIG. 37, the activation energy associated with surface diffusion of adatoms may be represented as $E_s$ 3711.

In 3730, the activation energy associated with desorption of the adatom from the surface may be represented as $E_{des}$ 3731. Those having ordinary skill in the relevant art will appreciate that any adatoms that are not desorbed may remain on the exposed layer surface 11. By way of non-limiting example, such adatoms may diffuse on the exposed layer surface 11, become part of a cluster of adatoms that form islands 160 on the exposed layer surface 11, and/or be incorporated as part of a growing film, and/or coating.

After adsorption of an adatom on a surface, the adatom may either desorb from the surface, or may migrate some distance on the surface before either desorbing, interacting with other adatoms to form a small cluster, or attaching to a growing nucleus. An average amount of time that an adatom may remain on the surface after initial adsorption may be given by:

$$\tau_s = \frac{1}{\nu}\exp\left(\frac{E_{des}}{kT}\right) \tag{TF1}$$

In the above equation:

$\nu$ is a vibrational frequency of the adatom on the surface, k is the Botzmann constant, and T is temperature.

From Equation TF1 it may be noted that the lower the value of $E_{des}$ 3831, the easier it may be for the adatom to desorb from the surface, and hence the shorter the time the adatom may remain on the surface. A mean distance an adatom can diffuse may be given by, $$X = a_0\exp\left(\frac{E_{des} - E_s}{2kT}\right) \tag{TF2}$$

where:

$\alpha_0$ is a lattice constant.

For low values of $E_{des}$ 3731, and/or high values of $E_s$ 3721, the adatom may diffuse a shorter distance before desorbing, and hence may be less likely to attach to growing nuclei or interact with another adatom or cluster of adatoms.

During initial stages of formation of a deposited layer of particle structures 160, adsorbed adatoms may interact to form particle structures 160, with a critical concentration of particle structures 160 per unit area being given by, $$\frac{N_i}{n_0} = \left|\frac{N_1}{n_0}\right|^i \exp\left(\frac{E_i}{kT}\right) \tag{TF3}$$

where:

$E_i$ is an energy involved to dissociate a critical cluster containing i adatoms into separate adatoms, $n_0$ is a total deposited density of adsorption sites, and $N_1$ is a monomer deposited density given by:

$$N_1 = \dot{R}\tau_s \tag{TF4}$$

where:

$\dot{R}$ is a vapor impingement rate.

Typically, i may depend on a crystal structure of a material being deposited and may determine a critical size of particle structures 160 to form a stable nucleus.

A critical monomer supply rate for growing particle structures 160 may be given by the rate of vapor impingement and an average area over which an adatom can diffuse before desorbing:

$$\dot{R}X^2 = \alpha_0^2\exp\left(\frac{E_{des} - E_s}{kT}\right) \tag{TF5}$$

The critical nucleation rate may thus be given by the combination of the above equations:

$$\dot{N}_i = \dot{R}\alpha_0^2 n_0\left(\frac{\dot{R}}{\nu n_0}\right)^i \exp\left(\frac{(i+1)E_{des} - E_s + E_i}{kT}\right) \tag{TF6}$$

From the above equation, it may be noted that the critical nucleation rate may be suppressed for surfaces that have a low desorption energy for adsorbed adatoms, a high activation energy for diffusion of an adatom, are at high temperatures, and/or are subjected to vapor impingement rates.

Under high vacuum conditions, a vapor flux 532 of molecules that may impinge on a surface (per $cm^2$-sec) may be given by:

$$\phi = 3.513 \times 10^{22} \frac{P}{MT} \quad \text{(TF7)}$$

where:

P is pressure, and

M is molecular weight.

Therefore, a higher partial pressure of a reactive gas, such as $H_2O$, may lead to a higher deposited density of contamination on a surface during vapor deposition, leading to an increase in $E_{des}$ 3731 and hence a higher deposited density of nuclei.

In the present disclosure, "nucleation-inhibiting" may refer to a coating, material, and/or a layer thereof, that may have a surface that exhibits an initial sticking probability against deposition of a deposited material 531 thereon, that may be close to 0, including without limitation, less than about 0.3, such that the deposition of the deposited material 531 on such surface may be inhibited.

In the present disclosure, "nucleation-promoting" may refer to a coating, material, and/or a layer thereof, that has a surface that exhibits an initial sticking probability against deposition of a deposited material 531 thereon, that may be close to 1, including without limitation, at least about 0.7, such that the deposition of the deposited material 531 on such surface may be facilitated.

Without wishing to be bound by a particular theory, it may be postulated that the shapes and sizes of such nuclei and the subsequent growth of such nuclei into islands 160 and thereafter into a thin film may depend upon various factors, including without limitation, interfacial tensions between the vapor, the surface, and/or the condensed film nuclei.

One measure of a nucleation-inhibiting, and/or nucleation-promoting property of a surface may be the initial sticking probability of the surface against the deposition of a given deposited material 531.

In some non-limiting examples, the sticking probability S may be given by:

$$S = \frac{N_{ads}}{N_{total}} \quad \text{(TF8)}$$

where:

$N_{ads}$ is a number of adatoms that remain on an exposed layer surface 11 (that is, are incorporated into a film), and $N_{total}$ is a total number of impinging monomers on the surface.

A sticking probability S equal to 1 may indicate that all monomers that impinge on the surface are adsorbed and subsequently incorporated into a growing film. A sticking probability S equal to 0 may indicate that all monomers that impinge on the surface are desorbed and subsequently no film may be formed on the surface.

A sticking probability S of a deposited material 531 on various surfaces may be evaluated using various techniques of measuring the sticking probability S, including without limitation, a dual quartz crystal microbalance (QCM) technique as described by Walker et al., J. Phys. Chem. C 2007, 111, 765 (2006).

As the deposited density of a deposited material 531 may increase (e.g., increasing average film thickness), a sticking probability S may change.

An initial sticking probability $S_0$ may therefore be specified as a sticking probability S of a surface prior to the formation of any significant number of critical nuclei. One measure of an initial sticking probability $S_0$ may involve a sticking probability S of a surface against the deposition of a deposited material 531 during an initial stage of deposition thereof, where an average film thickness of the deposited material 531 across the surface is at or below a threshold value. In the description of some non-limiting examples a threshold value for an initial sticking probability may be specified as, by way of non-limiting example, 1 nm. An average sticking probability $\overline{S}$ may then be given by:

$$\overline{S} = S_0(1 - A_{nuc}) + S_{nuc}(A_{nuc}) \quad \text{(TF9)}$$

where:

$S_{nuc}$ is a sticking probability S of an area covered by particle structures 160, and $A_{nuc}$ is a percentage of an area of a substrate surface covered by particle structures 160.

By way of non-limiting example, a low initial sticking probability may increase with increasing average film thickness. This may be understood based on a difference in sticking probability between an area of an exposed layer surface 11 with no particle structures 160, by way of non-limiting example, a bare substrate 10, and an area with a high deposited density. By way of non-limiting example, a monomer that may impinge on a surface of a particle structure 160 may have a sticking probability that may approach 1.

Based on the energy profiles 3710, 3720, 3730 shown in FIG. 37, it may be postulated that materials that exhibit relatively low activation energy for desorption ($E_{des}$ 3731), and/or relatively high activation energy for surface diffusion ($E_s$ 3721), may be deposited as a patterning coating 130, and may be suitable for use in various applications.

Without wishing to be bound by a particular theory, it may be postulated that, in some non-limiting examples, the relationship between various interfacial tensions present during nucleation and growth may be dictated according to Young's equation in capillary theory:

$$\gamma_{sv} = \gamma_{fs} + \gamma_{vf} \cos \theta \quad \text{(TF10)}$$

where:

$\gamma_{sv}$ (FIG. 38) corresponds to the interfacial tension between the substrate 10 and vapor 532, $\gamma_{fs}$ (FIG. 38) corresponds to the interfacial tension between the deposited material 531 and the substrate 10, $\gamma_{vf}$ (FIG. 38) corresponds to the interfacial tension between the vapor 532 and the film, and θ is the film nucleus contact angle.

Figure 38:
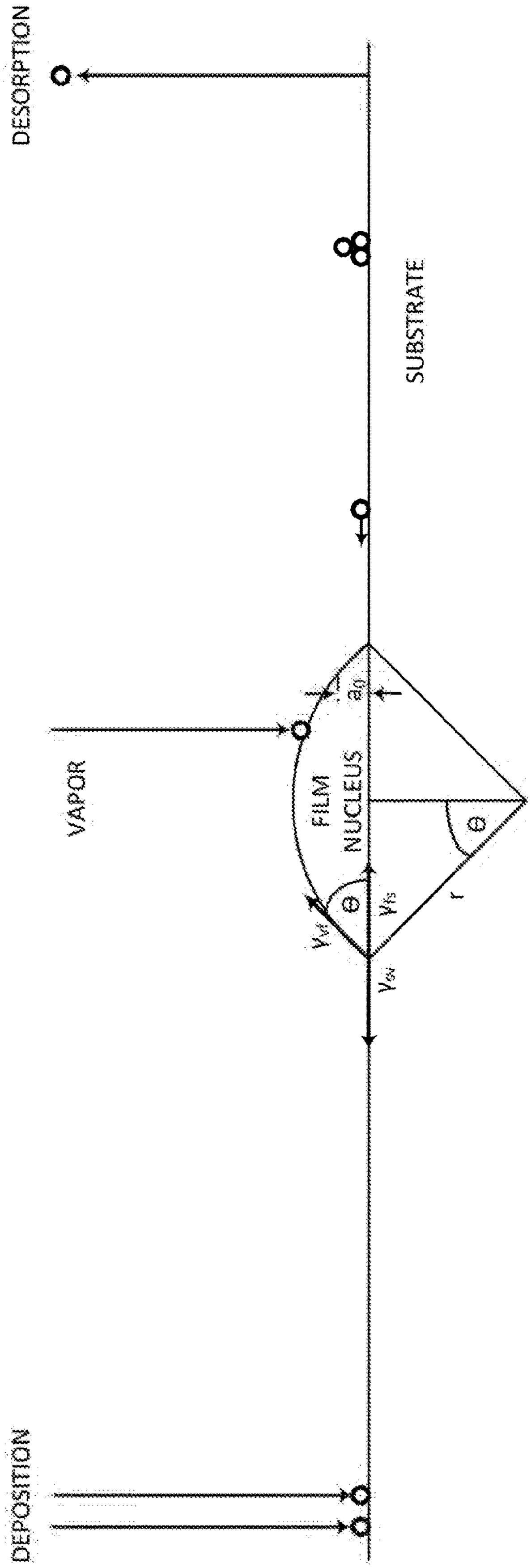
FIG. 38 is a schematic diagram illustrating the formation of a film nucleus according to an example in the present disclosure.

FIG. 38 may illustrate the relationship between the various parameters represented in this equation.

On the basis of Young's equation (Equation (TF10)), it may be derived that, for island growth, the film nucleus contact angle may exceed 0 and therefore: $\gamma_{sv} < \gamma_{fs} + \gamma_{vf}$.

For layer growth, where the deposited material 531 may "wet" the substrate 10, the nucleus contact angle θ may be equal to 0, and therefore: $\gamma_{sv} = \gamma_{fs} + \gamma_{vf}$.

For Stranski-Krastanov growth, where the strain energy per unit area of the film overgrowth may be large with respect to the interfacial tension between the vapor 532 and the deposited material 531: $\gamma_{sv}>\gamma_{fs}+\gamma_{vf}$.

Without wishing to be bound by any particular theory, it may be postulated that the nucleation and growth mode of a deposited material 531 at an interface between the patterning coating 130 and the exposed layer surface 11 of the substrate 10, may follow the island growth model, where $\theta>0$.

Particularly in cases where the patterning coating 130 may exhibit a relatively low initial sticking probability (in some non-limiting examples, under the conditions identified in the dual QCM technique described by Walker et. al) against deposition of the deposited material 531, there may be a relatively high thin film contact angle of the deposited material 531.

On the contrary, when a deposited material 531 may be selectively deposited on an exposed layer surface 11 without the use of a patterning coating 130, by way of non-limiting example, by employing a shadow mask 415, the nucleation and growth mode of such deposited material 531 may differ. In particular, it has been observed that a coating formed using a shadow mask 415 patterning process may, at least in some non-limiting examples, exhibit relatively low thin film contact angle of less than about 10°.

It has now been found, somewhat surprisingly, that in some non-limiting examples, a patterning coating 130 (and/or the patterning material 411 of which it is comprised) may exhibit a relatively low critical surface tension.

Those having ordinary skill in the relevant art will appreciate that a "surface energy" of a coating, layer, and/or a material constituting such coating, and/or layer, may generally correspond to a critical surface tension of the coating, layer, and/or material. According to some models of surface energy, the critical surface tension of a surface may correspond substantially to the surface energy of such surface.

Generally, a material with a low surface energy may exhibit low intermolecular forces. Generally, a material with low intermolecular forces may readily crystallize or undergo other phase transformation at a lower temperature in comparison to another material with high intermolecular forces. In at least some applications, a material that may readily crystallize or undergo other phase transformations at relatively low temperatures may be detrimental to the long-term performance, stability, reliability, and/or lifetime of the device.

Without wishing to be bound by a particular theory, it may be postulated that certain low energy surfaces may exhibit relatively low initial sticking probabilities and may thus be suitable for forming the patterning coating 130.

Without wishing to be bound by any particular theory, it may be postulated that, especially for low surface energy surfaces, the critical surface tension may be positively correlated with the surface energy. By way of non-limiting example, a surface exhibiting a relatively low critical surface tension may also exhibit a relatively low surface energy, and a surface exhibiting a relatively high critical surface tension may also exhibit a relatively high surface energy.

In reference to Young's equation (Equation (TF10)), a lower surface energy may result in a greater contact angle, while also lowering the $\gamma_{sv}$, thus enhancing the likelihood of such surface having low wettability and low initial sticking probability with respect to the deposited material 531.

The critical surface tension values, in various non-limiting examples, herein may correspond to such values measured at around normal temperature and pressure (NTP), which in some non-limiting examples, may correspond to a temperature of 20° C., and an absolute pressure of 1 atm. In some non-limiting examples, the critical surface tension of a surface may be determined according to the Zisman method, as further detailed in Zisman, W. A., "*Advances in Chemistry*" 43 (1964), p. 1-51.

In some non-limiting examples, the exposed layer surface 11 of the patterning coating 130 may exhibit a critical surface tension of at least one of no more than about: 20 dynes/cm, 19 dynes/cm, 18 dynes/cm, 17 dynes/cm, 16 dynes/cm, 15 dynes/cm, 13 dynes/cm, 12 dynes/cm, or 11 dynes/cm.

In some non-limiting examples, the exposed layer surface 11 of the patterning coating 130 may exhibit a critical surface tension of at least one of at least about: 6 dynes/cm, 7 dynes/cm, 8 dynes/cm, 9 dynes/cm, and 10 dynes/cm.

Those having ordinary skill in the relevant art will appreciate that various methods and theories for determining the surface energy of a solid may be known. By way of non-limiting example, the surface energy may be calculated, and/or derived based on a series of measurements of contact angle, in which various liquids are brought into contact with a surface of a solid to measure the contact angle between the liquid-vapor interface and the surface. In some non-limiting examples, the surface energy of a solid surface may be equal to the surface tension of a liquid with the highest surface tension that completely wets the surface. By way of non-limiting example, a Zisman plot may be used to determine the highest surface tension value that would result in a contact angle of 0° with the surface. According to some theories of surface energy, various types of interactions between solid surfaces and liquids may be considered in determining the surface energy of the solid. By way of non-limiting example, according to some theories, including without limitation, the Owens/Wendt theory, and/or Fowkes' theory, the surface energy may comprise a dispersive component and a non-dispersive or "polar" component.

Without wishing to be bound by a particular theory, it may be postulated that, in some non-limiting examples, the contact angle of a coating of deposited material 531 may be determined, based at least partially on the properties (including, without limitation, initial sticking probability) of the patterning coating 130 onto which the deposited material 531 is deposited. Accordingly, patterning materials 411 that allow selective deposition of deposited materials 1631 exhibiting relatively high contact angles may provide some benefit.

Those having ordinary skill in the relevant art will appreciate that various methods may be used to measure a contact angle $\theta$, including without limitation, the static, and/or dynamic sessile drop method and the pendant drop method.

In some non-limiting examples, the activation energy for desorption ($E_{des}$ 3831) (in some non-limiting examples, at a temperature T of about 300K) may be at least one of no more than about: 2 times, 1.5 times, 1.3 times, 1.2 times, 1.0 times, 0.8 times, or 0.5 times, the thermal energy. In some non-limiting examples, the activation energy for surface diffusion ($E_s$ 3821) (in some non-limiting examples, at a temperature of about 300K) may exceed at least one of about: 1.0 times, 1.5 times, 1.8 times, 2 times, 3 times, 5 times, 7 times, or 10 times the thermal energy.

Without wishing to be bound by a particular theory, it may be postulated that, during thin film nucleation and growth of a deposited material 531 at, and/or near an interface between the exposed layer surface 11 of the underlying layer and the patterning coating 130, a relatively high contact angle between the edge of the deposited material 531 and the underlying layer may be observed due to the inhibition of nucleation of the solid surface of the deposited material 531 by the patterning coating 130. Such nucleation inhibiting property may be driven by minimization of surface energy between the underlying layer, thin film vapor and the patterning coating 130.

One measure of a nucleation-inhibiting, and/or nucleation-promoting property of a surface may be an initial deposition rate of a given (electrically conductive) deposited material 531, on the surface, relative to an initial deposition rate of the same deposited material 531 on a reference surface, where both surfaces are subjected to, and/or exposed to an evaporation flux of the deposited material 531.

Definitions

In some non-limiting examples, the opto-electronic device may be an electro-luminescent device. In some non-limiting examples, the electro-luminescent device may be an organic light-emitting diode (OLED) device. In some non-limiting examples, the electro-luminescent device may be part of an electronic device. By way of non-limiting example, the electro-luminescent device may be an OLED lighting panel or module, and/or an OLED display or module of a computing device, such as a smartphone, a tablet, a laptop, an e-reader, and/or of some other electronic device such as a monitor, and/or a television set.

In some non-limiting examples, the opto-electronic device may be an organic photo-voltaic (OPV) device that converts photons into electricity. In some non-limiting examples, the opto-electronic 1200 device may be an electro-luminescent quantum dot (QD) device.

In the present disclosure, unless specifically indicated to the contrary, reference will be made to OLED devices, with the understanding that such disclosure could, in some examples, equally be made applicable to other opto-electronic devices 1200, including without limitation, an OPV, and/or QD device, in a manner apparent to those having ordinary skill in the relevant art.

The structure of such devices may be described from each of two aspects, namely from a cross-sectional aspect, and/or from a lateral (plan view) aspect.

In the present disclosure, a directional convention may be followed, extending substantially normally to the lateral aspect described above, in which the substrate may be the "bottom" of the device, and the layers may be disposed on "top" of the substrate. Following such convention, the second electrode may be at the top of the device shown, even if (as may be the case in some examples, including without limitation, during a manufacturing process, in which at least one layers may be introduced by means of a vapor deposition process), the substrate may be physically inverted, such that the top surface, in which one of the layers, such as, without limitation, the first electrode, may be disposed, may be physically below the substrate, to allow the deposition material (not shown) to move upward and be deposited upon the top surface thereof as a thin film.

In the context of introducing the cross-sectional aspect herein, the components of such devices may be shown in substantially planar lateral strata. Those having ordinary skill in the relevant art will appreciate that such substantially planar representation may be for purposes of illustration only, and that across a lateral extent of such a device, there may be localized substantially planar strata of different thicknesses and dimension, including, in some non-limiting examples, the substantially complete absence of a layer, and/or layer(s) separated by non-planar transition regions (including lateral gaps and even discontinuities). Thus, while for illustrative purposes, the device may be shown below in its cross-sectional aspect as a substantially stratified structure, in the plan view aspect discussed below, such device may illustrate a diverse topography to define features, each of which may substantially exhibit the stratified profile discussed in the cross-sectional aspect.

In the present disclosure, the terms "layer" and "strata" may be used interchangeably to refer to similar concepts.

The thickness of each layer shown in the figures may be illustrative only and not necessarily representative of a thickness relative to another layer.

For purposes of simplicity of description, in the present disclosure, a combination of a plurality of elements in a single layer may be denoted by a colon while a plurality of (combination(s) of) elements comprising a plurality of layers in a multi-layer coating may be denoted by separating two such layers by a slash "/". In some non-limiting examples, the layer after the slash may be deposited after, and/or on the layer preceding the slash.

For purposes of illustration, an exposed layer surface of an underlying layer, onto which a coating, layer, and/or material may be deposited, may be understood to be a surface of such underlying layer that may be presented for deposition of the coating, layer, and/or material thereon, at the time of deposition.

Those having ordinary skill in the relevant art will appreciate that when a component, a layer, a region, and/or a portion thereof, is referred to as being "formed", "disposed", and/or "deposited" on, and/or over another underlying layer, component, layer, region, and/or portion, such formation, disposition, and/or deposition may be directly, and/or indirectly on an exposed layer surface (at the time of such formation, disposition, and/or deposition) of such underlying layer, component, layer, region, and/or portion, with the potential of intervening material(s), component(s), layer(s), region(s), and/or portion(s) therebetween.

In the present disclosure, the terms "overlap", and/or "overlapping" may refer generally to a plurality of layers, and/or structures arranged to intersect a cross-sectional axis extending substantially normally away from a surface onto which such layers, and/or structures may be disposed.

While the present disclosure discusses thin film formation, in reference to at least one layer or coating, in terms of vapor deposition, those having ordinary skill in the relevant art will appreciate that, in some non-limiting examples, various components of the device may be selectively deposited using a wide variety of techniques, including without limitation, evaporation (including without limitation, thermal evaporation, and/or electron beam evaporation), photolithography, printing (including without limitation, ink jet, and/or vapor jet printing, reel-to-reel printing, and/or micro-contact transfer printing), PVD (including without limitation, sputtering), chemical vapor deposition (CVD) (including without limitation, plasma-enhanced CVD (PECVD), and/or organic vapor phase deposition (OVPD)), laser annealing, laser-induced thermal imaging (LITI) patterning, atomic-layer deposition (ALD), coating (including without limitation, spin-coating, di coating, line coating, and/or spray coating), and/or combinations thereof (collectively "deposition process").

Some processes may be used in combination with a shadow mask, which may, in some non-limiting examples, may be an open mask, and/or fine metal mask (FMM), during deposition of any of various layers, and/or coatings to achieve various patterns by masking, and/or precluding deposition of a deposited material on certain parts of a surface of an underlying layer exposed thereto.

In the present disclosure, the terms "evaporation", and/or "sublimation" may be used interchangeably to refer generally to deposition processes in which a source material is converted into a vapor, including without limitation, by heating, to be deposited onto a target surface in, without limitation, a solid state. As will be understood, an evaporation deposition process may be a type of PVD process where at least one source material is evaporated, and/or sublimed under a low pressure (including without limitation, a vacuum) environment to form vapor monomers, and deposited on a target surface through de-sublimation of the at least one evaporated source material. A variety of different evaporation sources may be used for heating a source material, and, as such, it will be appreciated by those having ordinary skill in the relevant art, that the source material may be heated in various ways. By way of non-limiting example, the source material may be heated by an electric filament, electron beam, inductive heating, and/or by resistive heating. In some non-limiting examples, the source material may be loaded into a heated crucible, a heated boat, a Knudsen cell (which may be an effusion evaporator source), and/or any other type of evaporation source.

In some non-limiting examples, a deposition source material may be a mixture. In some non-limiting examples, at least one component of a mixture of a deposition source material may not be deposited during the deposition process (or, in some non-limiting examples, be deposited in a relatively small amount compared to other components of such mixture).

In the present disclosure, a reference to a layer thickness, a film thickness, and/or an average layer, and/or film thickness, of a material, irrespective of the mechanism of deposition thereof, may refer to an amount of the material deposited on a target exposed layer surface, which corresponds to an amount of the material to cover the target surface with a uniformly thick layer of the material having the referenced layer thickness. By way of non-limiting example, depositing a layer thickness of 10 nm of material may indicate that an amount of the material deposited on the surface may correspond to an amount of the material to form a uniformly thick layer of the material that may be 10 nm thick. It will be appreciated that, having regard to the mechanism by which thin films are formed discussed above, by way of non-limiting example, due to possible stacking or clustering of monomers, an actual thickness of the deposited material may be non-uniform. By way of non-limiting example, depositing a layer thickness of 10 nm may yield some parts of the deposited material having an actual thickness greater than 10 nm, or other parts of the deposited material having an actual thickness of no more than 10 nm. A certain layer thickness of a material deposited on a surface may thus correspond, in some non-limiting examples, to an average thickness of the deposited material across the target surface.

In the present disclosure, a reference to a reference layer thickness may refer to a layer thickness of the deposited material (such as Mg), that may be deposited on a reference surface exhibiting a high initial sticking probability or initial sticking coefficient (that is, a surface having an initial sticking probability that is about, and/or close to 1.0). The reference layer thickness may not indicate an actual thickness of the deposited material deposited on a target surface (such as, without limitation, a surface of a patterning coating). Rather, the reference layer thickness may refer to a layer thickness of the deposited material that would be deposited on a reference surface, in some non-limiting examples, a surface of a quartz crystal, positioned inside a deposition chamber for monitoring a deposition rate and the reference layer thickness, upon subjecting the target surface and the reference surface to identical vapor flux of the deposited material for the same deposition period. Those having ordinary skill in the relevant art will appreciate that in the event that the target surface and the reference surface are not subjected to identical vapor flux simultaneously during deposition, an appropriate tooling factor may be used to determine, and/or to monitor the reference layer thickness.

In the present disclosure, a reference deposition rate may refer to a rate at which a layer of the deposited material would grow on the reference surface, if it were identically positioned and configured within a deposition chamber as the sample surface.

In the present disclosure, a reference to depositing a number X of monolayers of material may refer to depositing an amount of the material to cover a given area of an exposed layer surface with X single layer(s) of constituent monomers of the material, such as, without limitation, in a closed coating.

In the present disclosure, a reference to depositing a fraction of a monolayer of a material may refer to depositing an amount of the material to cover such fraction of a given area of an exposed layer surface with a single layer of constituent monomers of the material. Those having ordinary skill in the relevant art will appreciate that due to, by way of non-limiting example, possible stacking, and/or clustering of monomers, an actual local thickness of a deposited material across a given area of a surface may be non-uniform. By way of non-limiting example, depositing 1 monolayer of a material may result in some local regions of the given area of the surface being uncovered by the material, while other local regions of the given area of the surface may have multiple atomic, and/or molecular layers deposited thereon.

In the present disclosure a target surface (and/or target region(s) thereof) may be considered to be "substantially devoid of", "substantially free of", and/or "substantially uncovered by" a material if there may be a substantial absence of the material on the target surface as determined by any suitable determination mechanism.

In the present disclosure, the terms "sticking probability" and "sticking coefficient" may be used interchangeably.

In the present disclosure, the term "nucleation" may reference a nucleation stage of a thin film formation process, in which monomers in a vapor phase condense onto a surface to form nuclei.

In the present disclosure, in some non-limiting examples, as the context dictates, the terms "patterning coating" and "patterning material" may be used interchangeably to refer to similar concepts, and references to a patterning coating herein, in the context of being selectively deposited to pattern a deposited layer may, in some non-limiting examples, be applicable to a patterning material in the context of selective deposition thereof to pattern a deposited material, and/or an electrode coating material.

Similarly, in some non-limiting examples, as the context dictates, the term "patterning coating" and "patterning material" may be used interchangeably to refer to similar concepts, and reference to an NPC herein, in the context of being selectively deposited to pattern a deposited layer may, in some non-limiting examples, be applicable to an NPC in the context of selective deposition thereof to pattern a deposited material, and/or an electrode coating.

While a patterning material may be either nucleation-inhibiting or nucleation-promoting, in the present disclosure, unless the context dictates otherwise, a reference herein to a patterning material is intended to be a reference to an NIC.

In some non-limiting examples, reference to a patterning coating may signify a coating having a specific composition as described herein.

In the present disclosure, the terms "deposited layer", "conductive coating", and "electrode coating" may be used interchangeably to refer to similar concepts and references to a deposited layer herein, in the context of being patterned by selective deposition of a patterning coating, and/or an NPC may, in some non-limiting examples, be applicable to a deposited layer in the context of being patterned by selective deposition of a patterning material. In some non-limiting examples, reference to an electrode coating may signify a coating having a specific composition as described herein. Similarly, in the present disclosure, the terms "deposited layer material", "deposited material", "conductive coating material", and "electrode coating material" may be used interchangeably to refer to similar concepts and references to a deposited material herein.

In the present disclosure, it will be appreciated by those having ordinary skill in the relevant art that an organic material may comprise, without limitation, a wide variety of organic molecules, and/or organic polymers. Further, it will be appreciated by those having ordinary skill in the relevant art that organic materials that are doped with various inorganic substances, including without limitation, elements, and/or inorganic compounds, may still be considered organic materials. Still further, it will be appreciated by those having ordinary skill in the relevant art that various organic materials may be used, and that the processes described herein are generally applicable to an entire range of such organic materials. Still further, it will be appreciated by those having ordinary skill in the relevant art that organic materials that contain metals, and/or other organic elements, may still be considered as organic materials. Still further, it will be appreciated by those having ordinary skill in the relevant art that various organic materials may be molecules, oligomers, and/or polymers.

As used herein, an organic-inorganic hybrid material may generally refer to a material that comprises both an organic component and an inorganic component. In some non-limiting examples, such organic-inorganic hybrid material may comprise an organic-inorganic hybrid compound that comprises an organic moiety and an inorganic moiety. Non-limiting examples of such organic-inorganic hybrid compounds include those in which an inorganic scaffold is functionalized with at least one organic functional group. Non-limiting examples of such organic-inorganic hybrid materials include those comprising at least one of: a siloxane group, a silsesquioxane group, a polyhedral oligomeric silsesquioxane (POSS) group, a phosphazene group, and a metal complex.

In the present disclosure, a semiconductor material may be described as a material that generally exhibits a band gap. In some non-limiting examples, the band gap may be formed between a highest occupied molecular orbital (HOMO) and a lowest unoccupied molecular orbital (LUMO) of the semiconductor material. Semiconductor materials thus generally exhibit electrical conductivity that is no more than that of a conductive material (including without limitation, a metal), but that is greater than that of an insulating material (including without limitation, a glass). In some non-limiting examples, the semiconductor material may comprise an organic semiconductor material. In some non-limiting examples, the semiconductor material may comprise an inorganic semiconductor material.

As used herein, an oligomer may generally refer to a material which includes at least two monomer units or monomers. As would be appreciated by a person skilled in the art, an oligomer may differ from a polymer in at least one aspect, including but not limited to: (1) the number of monomer units contained therein; (2) the molecular weight; and (3) other material properties, and/or characteristics. By way of non-limiting example, further description of polymers and oligomers may be found in Naka K. (2014) *Monomers, Oligomers, Polymers, and Macromolecules* (*Overview*), and in Kobayashi S., Müllen K. (*eds.*) *Encyclopedia of Polymeric Nanomaterials*, Springer, Berlin, Heidelberg.

An oligomer or a polymer may generally include monomer units that may be chemically bonded together to form a molecule. Such monomer units may be substantially identical to one another such that the molecule is primarily formed by repeating monomer units, or the molecule may include plurality different monomer units. Additionally, the molecule may include at least one terminal unit, which may be different from the monomer units of the molecule. An oligomer or a polymer may be linear, branched, cyclic, cyclo-linear, and/or cross-linked. An oligomer or a polymer may include a plurality of different monomer units which are arranged in a repeating pattern, and/or in alternating blocks of different monomer units.

In the present disclosure, the term "semiconducting layer(s)" may be used interchangeably with "organic layer(s)" since the layers in an OLED device may in some non-limiting examples, may comprise organic semiconducting materials.

In the present disclosure, an inorganic substance may refer to a substance that primarily includes an inorganic material. In the present disclosure, an inorganic material may comprise any material that is not considered to be an organic material, including without limitation, metals, glasses, and/or minerals.

In the present disclosure, the terms "EM radiation", "photon", and "light" may be used interchangeably to refer to similar concepts. In the present disclosure, EM radiation may have a wavelength that lies in the visible spectrum, in the infrared (IR) region (IR spectrum), near IR region (NIR spectrum), ultraviolet (UV) region (UV spectrum), and/or UVA region (UVA spectrum) (which may correspond to a wavelength range between about 315-400 nm) thereof, and/or UVB region (UVB spectrum) (which may correspond to a wavelength between about 280-315 nm) thereof.

In the present disclosure, the term "visible spectrum" as used herein, generally refers to at least one wavelength in the visible part of the EM spectrum.

As would be appreciated by those having ordinary skill in the relevant art, such visible part may correspond to any wavelength between about 380-740 nm. In general, electro-luminescent devices may be configured to emit, and/or transmit EM radiation having wavelengths in a range of between about 425-725 nm, and more specifically, in some non-limiting examples, EM radiation having peak emission wavelengths of 456 nm, 528 nm, and 624 nm, corresponding to B(lue), G(reen), and R(ed) sub-pixels, respectively. Accordingly, in the context of such electro-luminescent devices, the visible part may refer to any wavelength between about 425-725 nm, or between about 456-624 nm. EM radiation having a wavelength in the visible spectrum may, in some non-limiting examples, also be referred to as "visible light" herein.

In the present disclosure, the term "emission spectrum" as used herein, generally refers to an electroluminescence spectrum of light emitted by an opto-electronic device 1200. By way of non-limiting example, an emission spectrum may be detected using an optical instrument, such as, by way of non-limiting example, a spectrophotometer, which may measure an intensity of EM radiation across a wavelength range. In the present disclosure, the term "onset wavelength", as used herein, may generally refer to a lowest wavelength at which an emission is detected within an emission spectrum.

In the present disclosure, the term "peak wavelength", as used herein, may generally refer to a wavelength at which a maximum luminous intensity is detected within an emission spectrum.

In some non-limiting examples, the onset wavelength may be less than the peak wavelength. In some non-limiting examples, the onset wavelength $\lambda_{onset}$ may correspond to a wavelength at which a luminous intensity is at least one of no more than about: 10%, 5%, 3%, 1%, 0.5%, 0.1%, or 0.01%, of the luminous intensity at the peak wavelength.

In some non-limiting examples, an emission spectrum that lies in the R(ed) part of the visible spectrum may be characterized by a peak wavelength that may lie in a wavelength range of about 600-640 nm and in some non-limiting examples, may be substantially about 620 nm.

In some non-limiting examples, an emission spectrum that lies in the G(reen) part of the visible spectrum may be characterized by a peak wavelength that may lie in a wavelength range of about 510-540 nm and in some non-limiting examples, may be substantially about 530 nm.

In some non-limiting examples, an emission spectrum that lies in the B(lue) part of the visible spectrum may be characterized by a peak wavelength $\lambda_{max}$ that may lie in a wavelength range of about 450-460 nm and in some non-limiting examples, may be substantially about 455 nm.

In the present disclosure, the term "IR signal" as used herein, may generally refer to EM radiation having a wavelength in an IR subset (IR spectrum) of the EM spectrum. An IR signal may, in some non-limiting examples, have a wavelength corresponding to a near-infrared (NIR) subset (NIR spectrum) thereof. By way of non-limiting example, an NIR signal may have a wavelength of at least one of between about: 750-1400 nm, 750-1300 nm, 800-1300 nm, 800-1200 nm, 850-1300 nm, or 900-1300 nm.

In the present disclosure, the term "absorption spectrum", as used herein, may generally refer to a wavelength (sub-) range of the EM spectrum over which absorption may be concentrated.

In the present disclosure, the terms "absorption edge", "absorption discontinuity", and/or "absorption limit" as used herein, may generally refer to a sharp discontinuity in the absorption spectrum of a substance. In some non-limiting examples, an absorption edge may tend to occur at wavelengths where the energy of absorbed EM radiation may correspond to an electronic transition, and/or ionization potential.

In the present disclosure, the term "extinction coefficient" as used herein, may generally refer to a degree to which an EM coefficient may be attenuated when propagating through a material. In some non-limiting examples, the extinction coefficient may be understood to correspond to the imaginary component k of a complex refractive index. In some non-limiting examples, the extinction coefficient of a material may be measured by a variety of methods, including without limitation, by ellipsometry.

In the present disclosure, the terms "refractive index", and/or "index", as used herein to describe a medium, may refer to a value calculated from a ratio of the speed of light in such medium relative to the speed of light in a vacuum. In the present disclosure, particularly when used to describe the properties of substantially transparent materials, including without limitation, thin film layers, and/or coatings, the terms may correspond to the real part, n, in the expression N=n+ik, in which N may represent the complex refractive index and k may represent the extinction coefficient.

As would be appreciated by those having ordinary skill in the relevant art, substantially transparent materials, including without limitation, thin film layers, and/or coatings, may generally exhibit a relatively low extinction coefficient value in the visible spectrum, and therefore the imaginary component of the expression may have a negligible contribution to the complex refractive index. On the other hand, light-transmissive electrodes formed, for example, by a metallic thin film, may exhibit a relatively low refractive index value and a relatively high extinction coefficient value in the visible spectrum. Accordingly, the complex refractive index, N, of such thin films may be dictated primarily by its imaginary component k.

In the present disclosure, unless the context dictates otherwise, reference without specificity to a refractive index may be intended to be a reference to the real part n of the complex refractive index N.

In some non-limiting examples, there may be a generally positive correlation between refractive index and transmittance, or in other words, a generally negative correlation between refractive index and absorption. In some non-limiting examples, the absorption edge of a substance may correspond to a wavelength at which the extinction coefficient approaches 0.

It will be appreciated that the refractive index, and/or extinction coefficient values described herein may correspond to such value(s) measured at a wavelength in the visible spectrum. In some non-limiting examples, the refractive index, and/or extinction coefficient value may correspond to the value measured at wavelength(s) of about 456 nm which may correspond to a peak emission wavelength of a B(lue) sub-pixel, about 528 nm which may correspond to a peak emission wavelength of a G(reen) sub-pixel, and/or about 624 nm which may correspond to a peak emission wavelength of a R(ed) sub-pixel. In some non-limiting examples, the refractive index, and/or extinction coefficient value described herein may correspond to a value measured at a wavelength of about 589 nm, which may approximately correspond to the Fraunhofer D-line.

In the present disclosure, the concept of a pixel may be discussed on conjunction with the concept of at least one sub-pixel thereof. For simplicity of description only, such composite concept may be referenced herein as a "(sub-) pixel" and such term may be understood to suggest either, or both of, a pixel, and/or at least one sub-pixel thereof, unless the context dictates otherwise.

In some nonlimiting examples, one measure of an amount of a material on a surface may be a percentage coverage of the surface by such material. In some non-limiting examples, surface coverage may be assessed using a variety of imaging techniques, including without limitation, TEM, AFM, and/or SEM.

In the present disclosure, the terms "particle", "island", and "cluster" may be used interchangeably to refer to similar concepts.

In the present disclosure, for purposes of simplicity of description, the terms "coating film", "closed coating", and/or "closed film", as used herein, may refer to a thin film structure, and/or coating of a deposited material used for a deposited layer, in which a relevant part of a surface may be substantially coated thereby, such that such surface may be not substantially exposed by or through the coating film deposited thereon.

In the present disclosure, unless the context dictates otherwise, reference without specificity to a thin film may be intended to be a reference to a substantially closed coating.

In some non-limiting examples, a closed coating, in some non-limiting examples, of a deposited layer, and/or a deposited material, may be disposed to cover a part of an underlying surface, such that, within such part, at least one of no more than about: 40%, 30%, 25%, 20%, 15%, 10%, 5%, 3%, or 1% of the underlying surface therewithin may be exposed by, or through, the closed coating.

Those having ordinary skill in the relevant art will appreciate that a closed coating may be patterned using various techniques and processes, including without limitation, those described herein, to deliberately leave a part of the exposed layer surface of the underlying surface to be exposed after deposition of the closed coating. In the present disclosure, such patterned films may nevertheless be considered to constitute a closed coating, if, by way of non-limiting example, the thin film, and/or coating that is deposited, within the context of such patterning, and between such deliberately exposed parts of the exposed layer surface of the underlying surface, itself substantially comprises a closed coating.

Those having ordinary skill in the relevant art will appreciate that, due to inherent variability in the deposition process, and in some non-limiting examples, to the existence of impurities in either, or both of, the deposited materials, in some non-limiting examples, the deposited material, and the exposed layer surface of the underlying layer, deposition of a thin film, using various techniques and processes, including without limitation, those described herein, may nevertheless result in the formation of small apertures, including without limitation, pin-holes, tears, and/or cracks, therein. In the present disclosure, such thin films may nevertheless be considered to constitute a closed coating, if, by way of non-limiting example, the thin film, and/or coating that is deposited substantially comprises a closed coating and meets any specified percentage coverage criterion set out, despite the presence of such apertures.

In the present disclosure, for purposes of simplicity of description, the term "discontinuous layer" as used herein, may refer to a thin film structure, and/or coating of a material used for a deposited layer, in which a relevant part of a surface coated thereby, may be neither substantially devoid of such material, nor forms a closed coating thereof. In some non-limiting examples, a discontinuous layer of a deposited material may manifest as a plurality of discrete islands disposed on such surface.

In the present disclosure, for purposes of simplicity of description, the result of deposition of vapor monomers onto an exposed layer surface of an underlying layer, that has not (yet) reached a stage where a closed coating has been formed, may be referred to as a "intermediate stage layer". In some non-limiting examples, such an intermediate stage layer may reflect that the deposition process has not been completed, in which such an intermediate stage layer may be considered as an interim stage of formation of a closed coating. In some non-limiting examples, an intermediate stage layer may be the result of a completed deposition process, and thus constitute a final stage of formation in and of itself.

In some non-limiting examples, an intermediate stage layer may more closely resemble a thin film than a discontinuous layer but may have apertures, and/or gaps in the surface coverage, including without limitation, at least one dendritic projection, and/or at least one dendritic recess. In some non-limiting examples, such an intermediate stage layer may comprise a fraction of a single monolayer of the deposited material such that it does not form a closed coating.

In the present disclosure, for purposes of simplicity of description, the term "dendritic", with respect to a coating, including without limitation, the deposited layer, may refer to feature(s) that resemble a branched structure when viewed in a lateral aspect. In some non-limiting examples, the deposited layer may comprise a dendritic projection, and/or a dendritic recess. In some non-limiting examples, a dendritic projection may correspond to a part of the deposited layer that exhibits a branched structure comprising a plurality of short projections that are physically connected and extend substantially outwardly. In some non-limiting examples, a dendritic recess may correspond to a branched structure of gaps, openings, and/or uncovered parts of the deposited layer that are physically connected and extend substantially outwardly. In some non-limiting examples, a dendritic recess may correspond to, including without limitation, a mirror image, and/or inverse pattern, to the pattern of a dendritic projection. In some non-limiting examples, a dendritic projection, and/or a dendritic recess may have a configuration that exhibits, and/or mimics a fractal pattern, a mesh, a web, and/or an interdigitated structure.

In some non-limiting examples, sheet resistance may be a property of a component, layer, and/or part that may alter a characteristic of an electric current passing through such component, layer, and/or part. In some non-limiting examples, a sheet resistance of a coating may generally correspond to a characteristic sheet resistance of the coating, measured, and/or determined in isolation from other components, layers, and/or parts of the device.

In the present disclosure, a deposited density may refer to a distribution, within a region, which in some non-limiting examples may comprise an area, and/or a volume, of a deposited material therein. Those having ordinary skill in the relevant art will appreciate that such deposited density may be unrelated to a density of mass or material within a particle structure itself that may comprise such deposited material. In the present disclosure, unless the context dictates otherwise, reference to a deposited density, and/or to a density, may be intended to be a reference to a distribution of such deposited material, including without limitation, as at least one particle, within an area.

In some non-limiting examples, a bond dissociation energy of a metal may correspond to a standard-state enthalpy change measured at 298 K from the breaking of a bond of a diatomic molecule formed by two identical atoms of the metal. Bond dissociation energies may, by way of non-limiting example, be determined based on known literature including without limitation, Luo, Yu-Ran, "*Bond Dissociation Energies*" (2010).

Without wishing to be bound by a particular theory, it is postulated that providing an NPC may facilitate deposition of the deposited layer onto certain surfaces.

Non-limiting examples of suitable materials for forming an NPC may comprise without limitation, at least one metal, including without limitation, alkali metals, alkaline earth metals, transition metals, and/or post-transition metals, metal fluorides, metal oxides, and/or fullerene.

Non-limiting examples of such materials may comprise Ca, Ag, Mg, Yb, ITO, IZO, ZnO, $YbF_3$, $MgF_2$, and/or CsF.

In the present disclosure, the term "fullerene" may refer generally to a material including carbon molecules. Non-limiting examples of fullerene molecules include carbon cage molecules, including without limitation, a three-dimensional skeleton that includes multiple carbon atoms that form a closed shell, and which may be, without limitation, spherical, and/or semi-spherical in shape. In some non-limiting examples, a fullerene molecule may be designated as $C_n$, where n may be an integer corresponding to several carbon atoms included in a carbon skeleton of the fullerene molecule. Non-limiting examples of fullerene molecules include $C_n$, where n may be in the range of 50 to 250, such as, without limitation, $C_{60}$, $C_{70}$, $C_{72}$, $C_{74}$, $C_{76}$, $C_{78}$, $C_{80}$, $C_{82}$, and $C_{84}$. Additional non-limiting examples of fullerene molecules include carbon molecules in a tube, and/or a cylindrical shape, including without limitation, single-walled carbon nanotubes, and/or multi-walled carbon nanotubes.

Based on findings and experimental observations, it may be postulated that nucleation promoting materials, including without limitation, fullerenes, metals, including without limitation, Ag, and/or Yb, and/or metal oxides, including without limitation, ITO, and/or IZO, as discussed further herein, may act as nucleation sites for the deposition of a deposited layer, including without limitation Mg.

In some non-limiting examples, suitable materials for use to form an NPC, may include those exhibiting or characterized as having an initial sticking probability for a material of a deposited layer of at least one of at least about: 0.4, 0.5, 0.6, 0.7, 0.75, 0.8, 0.9, 0.93, 0.95, 0.98, or 0.99.

By way of non-limiting example, in scenarios where Mg is deposited using without limitation, an evaporation process on a fullerene-treated surface, in some non-limiting examples, the fullerene molecules may act as nucleation sites that may promote formation of stable nuclei for Mg deposition.

In some non-limiting examples, no more than a monolayer of an NPC, including without limitation, fullerene, may be provided on the treated surface to act as nucleation sites for deposition of Mg.

In some non-limiting examples, treating a surface by depositing several monolayers of an NPC thereon may result in a higher number of nucleation sites and accordingly, a higher initial sticking probability.

Those having ordinary skill in the relevant art will appreciate than an amount of material, including without limitation, fullerene, deposited on a surface, may be more, or less than one monolayer. By way of non-limiting example, such surface may be treated by depositing at least one of about: 0.1, 1, 10, or more monolayers of a nucleation promoting material, and/or a nucleation inhibiting material.

In some non-limiting examples, an average layer thickness of the NPC deposited on an exposed layer surface of underlying layer(s) may be at least one of between about: 1-5 nm, or 1-3 nm.

Where features or aspects of the present disclosure may be described in terms of Markush groups, it will be appreciated by those having ordinary skill in the relevant art that the present disclosure may also be thereby described in terms of any individual member of sub-group of members of such Markush group

Terminology

References in the singular form may include the plural and vice versa, unless otherwise noted.

As used herein, relational terms, such as "first" and "second", and numbering devices such as "a", "b" and the like, may be used solely to distinguish one entity or element from another entity or element, without necessarily requiring or implying any physical or logical relationship or order between such entities or elements.

The terms "including" and "comprising" may be used expansively and in an open-ended fashion, and thus should be interpreted to mean "including, but not limited to". The terms "example" and "exemplary" may be used simply to identify instances for illustrative purposes and should not be interpreted as limiting the scope of the invention to the stated instances. In particular, the term "exemplary" should not be interpreted to denote or confer any laudatory, beneficial, or other quality to the expression with which it is used, whether in terms of design, performance or otherwise.

Further, the term "critical", especially when used in the expressions "critical nuclei", "critical nucleation rate", "critical concentration", "critical cluster", "critical monomer", "critical particle structure size", and/or "critical surface tension" may be a term familiar to those having ordinary skill in the relevant art, including as relating to or being in a state in which a measurement or point at which some quality, property or phenomenon undergoes a definite change. As such, the term "critical" should not be interpreted to denote or confer any significance or importance to the expression with which it is used, whether in terms of design, performance, or otherwise.

The terms "couple" and "communicate" in any form may be intended to mean either a direct connection or indirect connection through some interface, device, intermediate component, or connection, whether optically, electrically, mechanically, chemically, or otherwise.

The terms "on" or "over" when used in reference to a first component relative to another component, and/or "covering" or which "covers" another component, may encompass situations where the first component is directly on (including without limitation, in physical contact with) the other component, as well as cases where at least one intervening component is positioned between the first component and the other component.

Directional terms such as "upward", "downward", "left" and "right" may be used to refer to directions in the drawings to which reference is made unless otherwise stated. Similarly, words such as "inward" and "outward" may be used to refer to directions toward and away from, respectively, the geometric center of the device, area or volume or designated parts thereof. Moreover, all dimensions described herein may be intended solely to be by way of example of purposes of illustrating certain examples and may not be intended to limit the scope of the disclosure to any examples that may depart from such dimensions as may be specified.

As used herein, the terms "substantially", "substantial", "approximately", and/or "about" may be used to denote and account for small variations. When used in conjunction with an event or circumstance, such terms may refer to instances in which the event or circumstance occurs precisely, as well as instances in which the event or circumstance occurs to a close approximation. By way of non-limiting example, when used in conjunction with a numerical value, such terms may refer to a range of variation of no more than about ±10% of such numerical value, such as at least one of no more than about: ±5%, ±4%, ±3%, ±2%, ±1%, ±0.5%, ±0.1%, or ±0.05%.

As used herein, the phrase "consisting substantially of" may be understood to include those elements specifically recited and any additional elements that do not materially affect the basic and novel characteristics of the described technology, while the phrase "consisting of" without the use of any modifier, may exclude any element not specifically recited.

As will be understood by those having ordinary skill in the relevant art, for any and all purposes, particularly in terms of providing a written description, all ranges disclosed herein may also encompass any and all possible sub-ranges, and/or combinations of sub-ranges thereof. Any listed range may be easily recognized as sufficiently describing, and/or enabling the same range being broken down at least into equal fractions thereof, including without limitation, halves, thirds, quarters, fifths, tenths etc. As a non-limiting example, each range discussed herein may be readily be broken down into a lower third, middle third, and/or upper third, etc.

As will also be understood by those having ordinary skill in the relevant art, all language, and/or terminology such as "up to", "at least", "greater than", "less than", and the like, may include, and/or refer the recited range(s) and may also refer to ranges that may be subsequently broken down into sub-ranges as discussed herein.

As will be understood by those having ordinary skill in the relevant art, a range may include each individual member of the recited range General The purpose of the Abstract is to enable the relevant patent office or the public generally, and specifically, persons of ordinary skill in the art who are not familiar with patent or legal terms or phraseology, to quickly determine from a cursory inspection, the nature of the technical disclosure. The Abstract is neither intended to define the scope of this disclosure, nor is it intended to be limiting as to the scope of this disclosure in any way.

The structure, manufacture and use of the presently disclosed examples have been discussed above. The specific examples discussed are merely illustrative of specific ways to make and use the concepts disclosed herein, and do not limit the scope of the present disclosure. Rather, the general principles set forth herein are merely illustrative of the scope of the present disclosure.

It should be appreciated that the present disclosure, which is described by the claims and not by the implementation details provided, and which can be modified by varying, omitting, adding or replacing, and/or in the absence of any element(s), and/or limitation(s) with alternatives, and/or equivalent functional elements, whether or not specifically disclosed herein, will be apparent to those having ordinary skill in the relevant art, may be made to the examples disclosed herein, and may provide many applicable inventive concepts that may be embodied in a wide variety of specific contexts, without straying from the present disclosure.

In particular, features, techniques, systems, sub-systems and methods described and illustrated in at least one of the above-described examples, whether or not described and illustrated as discrete or separate, may be combined or integrated in another system without departing from the scope of the present disclosure, to create alternative examples comprised of a combination or sub-combination of features that may not be explicitly described above, or certain features may be omitted, or not implemented. Features suitable for such combinations and sub-combinations would be readily apparent to persons skilled in the art upon review of the present application as a whole. Other examples of changes, substitutions, and alterations are easily ascertainable and could be made without departing from the spirit and scope disclosed herein.

All statements herein reciting principles, aspects, and examples of the disclosure, as well as specific examples thereof, are intended to encompass both structural and functional equivalents thereof and to cover and embrace all suitable changes in technology. Additionally, it is intended that such equivalents include both currently known equivalents as well as equivalents developed in the future, i.e., any elements developed that perform the same function, regardless of structure

CLAUSES

The present disclosure includes, without limitation, the following clauses:

The device according to at least one clause herein wherein the patterning coating comprises a patterning material.

The device according to at least one clause herein, wherein an initial sticking probability against deposition of the deposited material of the patterning coating is no more than an initial sticking probability against deposition of the deposited material of the exposed layer surface.

The device according to at least one clause herein, wherein the patterning coating is substantially devoid of a closed coating of the deposited material.

The device according to at least one clause herein, wherein at least one of the patterning coating and the patterning material has an initial sticking probability against deposition of the deposited material that is at least one of no more than about: 0.9, 0.3, 0.2, 0.15, 0.1, 0.08, 0.05, 0.03, 0.02, 0.01, 0.008, 0.005, 0.003, 0.001, 0.0008, 0.0005, 0.0003, and 0.0001.

The device according to at least one clause herein, wherein at least one of the patterning coating and the patterning material has an initial sticking probability against deposition of at least one of silver (Ag) and magnesium (Mg) that is at least one of no more than about: 0.9, 0.3, 0.2, 0.15, 0.1, 0.08, 0.05, 0.03, 0.02, 0.01, 0.008, 0.005, 0.003, 0.001, 0.0008, 0.0005, 0.0003, and 0.0001.

The device according to at least one clause herein, wherein at least one of the patterning coating and the patterning material has an initial sticking probability against deposition of the deposited material of at least one of between about: 0.15-0.0001, 0.1-0.0003, 0.08-0.0005, 0.08-0.0008, 0.05-0.001, 0.03-0.0001, 0.03-0.0003, 0.03-0.0005, 0.03-0.0008, 0.03-0.001, 0.03-0.005, 0.03-0.008, 0.03-0.01, 0.02-0.0001, 0.02-0.0003, 0.02-0.0005, 0.02-0.0008, 0.02-0.001, 0.02-0.005, 0.02-0.008, 0.02-0.01, 0.01-0.0001, 0.01-0.0003, 0.01-0.0005, 0.01-0.0008, 0.01-0.001, 0.01-0.005, 0.01-0.008, 0.008-0.0001, 0.008-0.0003, 0.008-0.0005, 0.008-0.0008, 0.008-0.001, 0.008-0.005, 0.005-0.0001, 0.005-0.0003, 0.005-0.0005, 0.005-0.0008, and 0.005-0.001.

The device according to at least one clause herein, wherein at least one of the patterning coating and the patterning material has an initial sticking probability against deposition of the deposited material that is no more than a threshold value that is at least one of about: 0.3, 0.2, 0.18, 0.15, 0.13, 0.1, 0.08, 0.05, 0.03, 0.02, 0.01, 0.008, 0.005, 0.003, and 0.001.

The device according to at least one clause herein, wherein at least one of the patterning coating and the patterning material has an initial sticking probability against the deposition of at least one of: Ag, Mg, ytterbium (Yb), cadmium (Cd), and zinc (Zn), that is no more than the threshold value.

The device according to at least one clause herein, wherein the threshold value has a first threshold value against the deposition of a first deposited material and a second threshold value against the deposition of a second deposited material.

The device according to at least one clause herein, wherein the first deposited material is Ag and the second deposited material is Mg.

The device according to at least one clause herein, wherein the first deposited material is Ag and the second deposited material is Yb.

The device according to at least one clause herein, wherein the first deposited material is Yb and the second deposited material is Mg.

The device according to at least one clause herein, wherein the first threshold value exceeds the second threshold value.

The device according to at least one clause herein, wherein at least one of the patterning coating and the patterning material has a transmittance for EM radiation of at least a threshold transmittance value after being subjected to a vapor flux 1832 of the deposited material.

The device according to at least one clause herein, wherein the threshold transmittance value is measured at a wavelength in the visible spectrum.

The device according to at least one clause herein, wherein the threshold transmittance value is at least one of at least about 60%, 65%, 70%, 75%, 80%, 85%, and 90% of incident EM power transmitted therethrough.

The device according to at least one clause herein, wherein at least one of the patterning coating and the patterning material has a surface energy of at least one of no more than about: 24 dynes/cm, 22 dynes/cm, 20 dynes/cm, 18 dynes/cm, 16 dynes/cm, 15 dynes/cm, 13 dynes/cm, 12 dynes/cm, and 11 dynes/cm.

The device according to at least one clause herein, wherein at least one of the patterning coating and the patterning material has a surface energy that is at least one of at least about: 6 dynes/cm, 7 dynes/cm, and 8 dynes/cm.

The device according to at least one clause herein, wherein at least one of the patterning coating and the patterning material has a surface energy that is at least one of between about: 10-20 dynes/cm, and 13-19 dynes/cm.

The device according to at least one clause herein, wherein at least one of the patterning coating and the patterning material has a refractive index for EM radiation at a wavelength of 550 nm that is at least one of no more than about: 1.55, 1.5, 1.45, 1.43, 1.4, 1.39, 1.37, 1.35, 1.32, and 1.3

The device according to at least one clause herein, wherein at least one of the patterning coating and the patterning material has an extinction coefficient that is no more than about 0.01 for photons at a wavelength that exceeds at least one of about: 600 nm, 500 nm, 460 nm, 420 nm, and 410 nm.

The device according to at least one clause herein, wherein at least one of the patterning coating and the patterning material has an extinction coefficient that is at least one of at least about: 0.05, 0.1, 0.2, 0.5 for EM radiation at a wavelength shorter than at least one of at least about: 400 nm, 390 nm, 380 nm, and 370 nm.

The device according to at least one clause herein, wherein at least one of the patterning coating and the patterning material has a glass transition temperature that is that is at least one of: (i) at least one of at least about: 300° C., 150° C., 130° C., 120° C., and 100° C., and (ii) at least one of no more than about: 30° C., 0° C., −30° C., and −50° C.

The device according to at least one clause herein, wherein the patterning material has a sublimation temperature of at least one of between about: 100-320° C., 120-300° C., 140-280° C., and 150-250° C.

The device according to at least one clause herein, wherein at least one of the patterning coating and the patterning material comprises at least one of a fluorine atom and a silicon atom.

The device according to at least one clause herein, wherein the patterning coating comprises fluorine and carbon.

The device according to at least one clause herein, wherein an atomic ratio of a quotient of fluorine by carbon is at least one of about: 1, 1.5, and 2.

The device according to at least one clause herein, wherein the patterning coating comprises an oligomer.

The device according to at least one clause herein, wherein the patterning coating comprises a compound having a molecular structure containing a backbone and at least one functional group bonded thereto.

The device according to at least one clause herein, wherein the compound comprises at least one of: a siloxane group, a silsesquioxane group, an aryl group, a heteroaryl group, a fluoroalkyl group, a hydrocarbon group, a phosphazene group, a fluoropolymer, and a metal complex.

The device according to at least one clause herein, wherein a molecular weight of the compound is at least one of no more than about: 5,000 g/mol, 4,500 g/mol, 4,000 g/mol, 3,800 g/mol, and 3,500 g/mol.

The device according to at least one clause herein, wherein the molecular weight is at least about: 1,500 g/mol, 1,700 g/mol, 2,000 g/mol, 2,200 g/mol, and 2,500 g/mol.

The device according to at least one clause herein, wherein the molecular weight is at least one of between about: 1,500-5,000 g/mol, 1,500-4,500 g/mol, 1,700-4,500 g/mol, 2,000-4,000 g/mol, 2,200-4,000 g/mol, and 2,500-3,800 g/mol.

The device according to at least one clause herein, wherein a percentage of a molar weight of the compound that is attributable to a presence of fluorine atoms, is at least one of between about: 40-90%, 45-85%, 50-80%, 55-75%, and 60-75%.

The device according to at least one clause herein, wherein fluorine atoms comprise a majority of the molar weight of the compound.

The device according to at least one clause herein, wherein the patterning material comprises an organic-inorganic hybrid material.

The device according to at least one clause herein, wherein the patterning coating has at least one nucleation site for the deposited material.

The device according to at least one clause herein, wherein the patterning coating is supplemented with a seed material that acts as a nucleation site for the deposited material.

The device according to at least one clause herein, wherein the seed material comprises at least one of: a nucleation promoting coating (NPC) material, an organic material, a polycyclic aromatic compound, and a material comprising a non-metallic element selected from at least one of oxygen (O), sulfur (S), nitrogen (N), I carbon (C).

The device according to at least one clause herein, wherein the patterning coating acts as an optical coating.

The device according to at least one clause herein, wherein the patterning coating modifies at least one of a property and a characteristic of EM radiation emitted by the device.

The device according to at least one clause herein, wherein the patterning coating comprises a crystalline material.

The device according to at least one clause herein, wherein the patterning coating is deposited as a non-crystalline material and becomes crystallized after deposition.

The device according to at least one clause herein, wherein the deposited layer comprises a deposited material.

The device according to at least one clause herein, wherein the deposited material comprises an element selected from at least one of: potassium (K), sodium (Na), lithium (Li), barium (Ba), cesium (Cs), ytterbium (Yb), silver (Ag), gold (Au), copper (Cu), aluminum (Al), magnesium (Mg), zinc (Zn), cadmium (Cd), tin (Sn), nickel (Ni), and yttrium (Y).

The device according to at least one clause herein, wherein the deposited material comprises a pure metal.

The device according to at least one clause herein, wherein the deposited material is selected from at least one of pure Ag and substantially pure Ag.

The device according to at least one clause herein, wherein the substantially pure Ag has a purity of at least one of at least about: 95%, 99%, 99.9%, 99.99%, 99.999%, and 99.9995%.

The device according to at least one clause herein, wherein the deposited material is selected from at least one of pure Mg and substantially pure Mg.

The device according to at least one clause herein, wherein the substantially pure Mg has a purity of at least one of at least about: 95%, 99%, 99.9%, 99.99%, 99.999%, or 99.9995%.

The device according to at least one clause herein, wherein the deposited material comprises an alloy.

The device according to at least one clause herein, wherein the deposited material comprises at least one of: an Ag-containing alloy, an Mg-containing alloy, and an AgMg-containing alloy.

The device according to at least one clause herein, wherein the AgMg-containing alloy has an alloy composition that ranges from 1:10 (Ag:Mg) to about 10:1 by volume.

The device according to at least one clause herein, wherein the deposited material comprises at least one metal other than Ag.

The device according to at least one clause herein, wherein the deposited material comprises an alloy of Ag with at least one metal.

The device according to at least one clause herein, wherein the at least one metal is selected from at least one of Mg and Yb.

The device according to at least one clause herein, wherein the alloy is a binary alloy having a composition between about 5-95 vol. % Ag.

The device according to at least one clause herein, wherein the alloy comprises a Yb:Ag alloy having a composition between about 1:20-10:1 by volume.

The device according to at least one clause herein, wherein the deposited material comprises an Mg:Yb alloy.

The device according to at least one clause herein, wherein the deposited material comprises an Ag:Mg:Yb alloy.

The device according to at least one clause herein, wherein the deposited layer comprises at least one additional element.

The device according to at least one clause herein, wherein the at least one additional element is a non-metallic element.

The device according to at least one clause herein, wherein the non-metallic element is selected from at least one of O, S, N, and C.

The device according to at least one clause herein, wherein a concentration of the non-metallic element is at least one of no more than about: 1%, 0.1%, 0.01%, 0.001%, 0.0001%, 0.00001%, 0.000001%, and 0.0000001%.

The device according to at least one clause herein, wherein the deposited layer has a composition in which a combined amount of 0 and C is at least one of no more than about: 10%, 5%, 1%, 0.1%, 0.01%, 0.001%, 0.0001%, 0.00001%, 0.000001%, and 0.0000001%.

The device according to at least one clause herein, wherein the non-metallic element acts as a nucleation site for the deposited material on the NIC.

The device according to at least one clause herein, wherein the deposited material and the underlying layer comprise a common metal.

The device according to at least one clause herein, the deposited layer comprises a plurality of layers of the deposited material.

The device according to at least one clause herein, a deposited material of a first one of the plurality of layers is different from a deposited material of a second one of the plurality of layers.

The device according to at least one clause herein, wherein the deposited layer comprises a multilayer coating.

The device according to at least one clause herein, wherein the multilayer coating is at least one of: Yb/Ag, Yb/Mg, Yb/Mg:Ag, Yb/Yb:Ag, Yb/Ag/Mg, and Yb/Mg/Ag.

The device according to at least one clause herein, wherein the deposited material comprises a metal having a bond dissociation energy of at least one of no more than about: 300 kJ/mol, 200 kJ/mol, 165 kJ/mol, 150 kJ/mol, 100 kJ/mol, 50 kJ/mol, and 20 kJ/mol.

The device according to at least one clause herein, wherein the deposited material comprises a metal having an electronegativity of at least one of no more than about: 1.4, 1.3, and 1.2.

The device according to at least one clause herein, wherein a sheet resistance of the deposited layer is at least one of no more than about: 10Ω/□, 5Ω/□, 1Ω/□, 0.5Ω/□, 0.2Ω/□, and 0.1Ω/□.

The device according to at least one clause herein, wherein the deposited layer is disposed in a pattern defined by at least one region therein that is substantially devoid of a closed coating thereof.

The device according to at least one clause herein, wherein the at least one region separates the deposited layer into a plurality of discrete fragments thereof.

The device according to at least one clause herein, wherein at least two discrete fragments are electrically coupled.

The device according to at least one clause herein, wherein the patterning coating has a boundary defined by a patterning coating edge.

The device according to at least one clause herein, wherein the patterning coating comprises at least one patterning coating transition region and a patterning coating non-transition part.

The device according to at least one clause herein, wherein the at least one patterning coating transition region transitions from a maximum thickness to a reduced thickness.

The device according to at least one clause herein, wherein the at least one patterning coating transition region extends between the patterning coating non-transition part and the patterning coating edge. The device according to at least one clause herein, wherein the patterning coating has an average film thickness in the patterning coating non-transition part that is in a range of at least one of between about: 1-100 nm, 2-50 nm, 3-30 nm, 4-20 nm, 5-15 nm, 5-10 nm, and 1-10 nm.

The device according to at least one clause herein, wherein a thickness of the patterning coating in the patterning coating non-transition part is within at least one of about: 95%, and 90% of the average film thickness of the NIC.

The device according to at least one clause herein, wherein the average film thickness is at least one of no more than about: 80 nm, 60 nm, 50 nm, 40 nm, 30 nm, 20 nm, 15 nm, and 10 nm.

The device according to at least one clause herein, wherein the average film thickness exceeds at least one of about: 3 nm, 5 nm, and 8 nm.

The device according to at least one clause herein, wherein the average film thickness is no more than about 10 nm.

The device according to at least one clause herein, wherein the patterning coating has a patterning coating thickness that decreases from a maximum to a minimum within the patterning coating transition region.

The device according to at least one clause herein, wherein the maximum is proximate to a boundary between the patterning coating transition region and the patterning coating non-transition part.

The device according to at least one clause herein, wherein the maximum is a percentage of the average film thickness that is at least one of about: 100%, 95%, and 90%.

The device according to at least one clause herein, wherein the minimum is proximate to the patterning coating edge.

The device according to at least one clause herein, wherein the minimum is in a range of between about: 0-0.1 nm.

The device according to at least one clause herein, wherein a profile of the patterning coating thickness is at least one of sloped, tapered, and defined by a gradient.

The device according to at least one clause herein, wherein the tapered profile follows at least one of a linear, non-linear, parabolic, and exponential decaying profile.

The device according to at least one clause herein, wherein a non-transition width along a lateral axis of the patterning coating non-transition region exceeds a transition width along the axis of the patterning coating transition region.

The device according to at least one clause herein, wherein a quotient of the non-transition width by the transition width is at least one of at least about: 5, 10, 20, 50, 100, 500, 1,000, 1,500, 5,000, 10,000, 50,000, or 100,000.

The device according to at least one clause herein, wherein at least one of the non-transition width and the transition width exceeds an average film thickness of the underlying layer.

The device according to at least one clause herein, wherein at least one of the non-transition width and the transition width exceeds the average film thickness of the patterning coating.

The device according to at least one clause herein, wherein the average film thickness of the underlying layer exceeds the average film thickness of the patterning coating.

The device according to at least one clause herein, wherein the deposited layer has a boundary defined by a deposited layer edge.

The device according to at least one clause herein, wherein the deposited layer comprises at least one deposited layer transition region and a deposited layer non-transition part.

The device according to at least one clause herein, wherein the at least one deposited layer transition region transitions from a maximum thickness to a reduced thickness.

The device according to at least one clause herein, wherein the at least one deposited layer transition region extends between the deposited layer non-transition part and the deposited layer edge.

The device according to at least one clause herein, wherein the deposited layer has an average film thickness in the deposited layer non-transition part that is in a range of at least one of between about: 1-500 nm, 5-200 nm, 5-40 nm, 10-30 nm, and 10-100 nm.

The device according to at least one clause herein, wherein the average film thickness exceeds at least one of about: 10 nm, 50 nm, and 100 nm.

The device according to at least one clause herein, wherein the average film thickness of is substantially constant thereacross.

The device according to at least one clause herein, wherein the average film thickness exceeds an average film thickness of the underlying layer.

The device according to at least one clause herein, wherein a quotient of the average film thickness of the deposited layer by the average film thickness of the underlying layer is at least one of at least about: 1.5, 2, 5, 10, 20, 50, and 100.

The device according to at least one clause herein, wherein the quotient is in a range of at least one of between about: 0.1-10, and 0.2-40.

The device according to at least one clause herein, wherein the average film thickness of the deposited layer exceeds an average film thickness of the patterning coating.

The device according to at least one clause herein, wherein a quotient of the average film thickness of the deposited layer by the average film thickness of the patterning coating is at least one of at least about: 1.5, 2, 5, 10, 20, 50, and 100.

The device according to at least one clause herein, wherein the quotient is in a range of at least one of between about: 0.2-10, and 0.5-40.

The device according to at least one clause herein, wherein a deposited layer non-transition width along a lateral axis of the deposited layer non-transition part exceeds a patterning coating non-transition width along the axis of the patterning coating non-transition part.

The device according to at least one clause herein, wherein a quotient of the patterning coating non-transition width by the deposited layer non-transition width is at least one of between about: 0.1-10, 0.2-5, 0.3-3, and 0.4-2.

The device according to at least one clause herein, wherein a quotient of the deposited layer non-transition width by the patterning coating non-transition width is at least one of at least: 1, 2, 3, and 4.

The device according to at least one clause herein, wherein the deposited layer non-transition width exceeds the average film thickness of the deposited layer.

The device according to at least one clause herein, wherein a quotient of the deposited layer non-transition width by the average film thickness is at least one of at least about: 10, 50, 100, and 500.

The device according to at least one clause herein, wherein the quotient is no more than about 100,000. The device according to at least one clause herein, wherein the deposited layer has a deposited layer thickness that decreases from a maximum to a minimum within the deposited layer transition region.

The device according to at least one clause herein, wherein the maximum is proximate to a boundary between the deposited layer transition region and the deposited layer non-transition part.

The device according to at least one clause herein, wherein the maximum is the average film thickness.

The device according to at least one clause herein, wherein the minimum is proximate to the deposited layer edge.

The device according to at least one clause herein, wherein the minimum is in a range of between about: 0-0.1 nm.

The device according to at least one clause herein, wherein the minimum is the average film thickness.

The device according to at least one clause herein, wherein a profile of the deposited layer thickness is at least one of sloped, tapered, and defined by a gradient.

The device according to at least one clause herein, wherein the tapered profile follows at least one of a linear, non-linear, parabolic, and exponential decaying profile.

The device according to at least one clause herein, wherein the deposited layer comprises a discontinuous layer in at least a part of the deposited layer transition region.

The device according to at least one clause herein, wherein the deposited layer overlaps the patterning coating in an overlap portion.

The device according to at least one clause herein, wherein the patterning coating overlaps the deposited layer in an overlap portion.

The device according to at least one clause herein, further comprising at least one particle structure disposed on an exposed layer surface of an underlying layer.

The device according to at least one clause herein, wherein the underlying layer is the patterning coating.

The device according to at least one clause herein, wherein the at least one particle structure comprises a particle material.

The device according to at least one clause herein, wherein the particle material is the same as the deposited material.

The device according to at least one clause herein, wherein at least two of the particle material, the deposited material, and a material of which the underlying layer is comprised, comprises a common metal.

The device according to at least one clause herein, wherein the particle material comprises an element selected from at least one of: potassium (K), sodium (Na), lithium (Li), barium (Ba), cesium (Cs), ytterbium (Yb), silver (Ag), gold (Au), copper (Cu), aluminum (Al), magnesium (Mg), zinc (Zn), cadmium (Cd), tin (Sn), nickel (Ni), and yttrium (Y).

The device according to at least one clause herein, wherein the particle material comprises a pure metal.

The device according to at least one clause herein, wherein the particle material is selected from at least one of pure Ag and substantially pure Ag.

The device according to at least one clause herein, wherein the substantially pure Ag has a purity of at least one of at least about: 95%, 99%, 99.9%, 99.99%, 99.999%, and 99.9995%.

The device according to at least one clause herein, wherein the particle material is selected from at least one of pure Mg and substantially pure Mg.

The device according to at least one clause herein, wherein the substantially pure Mg has a purity of at least one of at least about: 95%, 99%, 99.9%, 99.99%, 99.999%, or 99.9995%.

The device according to at least one clause herein, wherein the particle material comprises an alloy.

The device according to at least one clause herein, wherein the particle material comprises at least one of: an Ag-containing alloy, an Mg-containing alloy, and an AgMg-containing alloy.

The device according to at least one clause herein, wherein the AgMg-containing alloy has an alloy composition that ranges from 1:10 (Ag:Mg) to about 10:1 by volume.

The device according to at least one clause herein, wherein the particle material comprises at least one metal other than Ag.

The device according to at least one clause herein, wherein the particle material comprises an alloy of Ag with at least one metal.

The device according to at least one clause herein, wherein the at least one metal is selected from at least one of Mg and Yb.

The device according to at least one clause herein, wherein the alloy is a binary alloy having a composition between about 5-95 vol. % Ag.

The device according to at least one clause herein, wherein the alloy comprises a Yb:Ag alloy having a composition between about 1:20-10:1 by volume.

The device according to at least one clause herein, wherein the particle material comprises an Mg:Yb alloy.

The device according to at least one clause herein, wherein the particle material comprises an Ag:Mg:Yb alloy.

The device according to at least one clause herein, wherein the at least one particle structure comprises at least one additional element.

The device according to at least one clause herein, wherein the at least one additional element is a non-metallic element.

The device according to at least one clause herein, wherein the non-metallic element is selected from at least one of O, S, N, and C.

The device according to at least one clause herein, wherein a concentration of the non-metallic element is at least one of no more than about: 1%, 0.1%, 0.01%, 0.001%, 0.0001%, 0.00001%, 0.000001%, and 0.0000001%.

The device according to at least one clause herein, wherein the at least one particle structure has a composition in which a combined amount of 0 and C is at least one of no more than about: 10%, 5%, 1%, 0.1%, 0.01%, 0.001%, 0.0001%, 0.00001%, 0.000001%, and 0.0000001%.

The device according to at least one clause herein, wherein the at least one particle is disposed at an interface between the patterning coating and at least one covering layer in the device.

The device according to at least one clause herein, wherein the at least one particle is in physical contact with an exposed layer surface of the patterning coating.

The device according to at least one clause herein, wherein the at least one particle structure affects at least one optical property of the device.

The device according to at least one clause herein, wherein the at least one optical property is controlled by selection of at least one property of the at least one particle structure selected from at least one of: a characteristic size, a length, a width, a diameter, a height, a size distribution, a shape, a surface coverage, a configuration, a deposited density, a dispersity, and a composition.

The device according to at least one clause herein, wherein the at least one property of the at least one particle structure is controlled by selection of at least one of: at least one characteristic of the patterning material, an average film thickness of the patterning coating, at least one heterogeneity in the patterning coating, and a deposition environment for the patterning coating, selected from at least one of a temperature, pressure, duration, deposition rate, and deposition process.

The device according to at least one clause herein, wherein the at least one property of the at least one particle structure is controlled by selection of at least one of: at least one characteristic of the particle material, an extent to which the patterning coating is exposed to deposition of the particle material, a thickness of the discontinuous layer, and a deposition environment for the particle material, selected from at least one of a temperature, pressure, duration, deposition rate, and deposition process.

The device according to at least one clause herein, wherein the at least one particle structures are disconnected from one another.

The device according to at least one clause herein, wherein the at least one particle structure forms a discontinuous layer.

The device according to at least one clause herein, wherein the discontinuous layer is disposed in a pattern defined by at least one region therein that is substantially devoid of the at least one particle structure.

The device according to at least one clause herein, wherein a characteristic of the discontinuous layer is determined by an assessment according to at least one criterion selected from at least one of: a characteristic size, length, width, diameter, height, size distribution, shape, configuration, surface coverage, deposited distribution, dispersity, presence of aggregation instances, and extent of such aggregation instances.

The device according to at least one clause herein, wherein the assessment is performed by determining at least one attribute of the discontinuous layer by an applied imaging technique selected from at least one of: electron microscopy, atomic force microscopy, and scanning electron microscopy.

The device according to at least one clause herein, wherein the assessment is performed across an extent defined by at least one observation window.

The device according to at least one clause herein, wherein the at least one observation window is located at at least one of: a perimeter, interior location, and grid coordinate of the lateral aspect.

The device according to at least one clause herein, wherein the observation window corresponds to a field of view of the applied imaging technique.

The device according to at least one clause herein, wherein the observation window corresponds to a magnification level selected from at least one of: 2.00 μm, 1.00 μm, 500 nm, and 200 nm.

The device according to at least one clause herein, wherein the assessment incorporates at least one of: manual counting, curve fitting, polygon fitting, shape fitting, and an estimation technique.

The device according to at least one clause herein, wherein the assessment incorporates a manipulation selected from at least one of: an average, median, mode, maximum, minimum, probabilistic, statistical, and data calculation.

The device according to at least one clause herein, wherein the characteristic size is determined from at least one of: a mass, volume, diameter, perimeter, major axis, and minor axis of the at least one particle structure.

The device according to at least one clause herein, wherein the dispersity is determined from:

$$D = \frac{\overline{S_s}}{\overline{S_n}}$$

where:

$$\overline{S_s} = \frac{\sum_{i=1}^{n} S_i^2}{\sum_{i=1}^{n} S_i}, \quad \overline{S_n} = \frac{\sum_{i=1}^{n} S_i}{n},$$

n is the number of particles in a sample area, $S_i$ is the (area) size of the $i^{th}$ particle, $\overline{S_n}$ is the number average of the particle (area) sizes; and $S_s$ is the (area) size average of the particle (area) sizes.

Accordingly, the specification and the examples disclosed therein are to be considered illustrative only, with a true scope of the disclosure being disclosed by the following numbered claims.

What is claimed is:

1. A semiconductor device having a plurality of layers deposited on a substrate and extending in a first portion and a second portion of at least one lateral aspect defined by a lateral axis thereof, comprising:

an orientation layer comprising an orientation material, disposed on a first exposed layer surface of the device in at least the first portion;

at least one patterning layer comprising a patterning material, disposed on an exposed layer surface of the orientation layer; and at least one deposited layer comprising a deposited material, disposed on a second exposed layer surface of the device in the second portion;

wherein the first portion is substantially devoid of a closed coating of the deposited material.

2. The device of claim 1, further comprising a supporting layer disposed in at least the first portion, wherein an exposed layer surface thereof is the first exposed layer surface.

3. The device of claim 2, wherein the supporting layer is at least one semiconducting layer of an opto-electronic device.

4. The device of claim 1, wherein the orientation layer extends beyond the first portion into at least a part of the second portion.

5. The device of claim 1, wherein the orientation layer is at least one of a closed coating and a discontinuous layer.

6. The device of claim 1, wherein the orientation layer has an average film thickness that is at least one of at least about: 2 nm, 3 nm, 5 nm, and 10 nm.

7. The device of claim 1, wherein the orientation layer has an average film thickness that is substantially constant across its lateral extent.

8. The device of claim 1, wherein the orientation material has a characteristic surface energy that is high relative to a characteristic surface energy of the patterning material.

9. The device of claim 1, wherein at least one of the orientation layer and the orientation material has a surface energy of at least one of at least about: 30 dynes/cm, 35 dynes/cm, 50 dynes/cm, 60 dynes/cm, 70 dynes/cm, 80 dynes/cm, and 100 dynes/cm.

10. The device of claim 1, wherein the orientation material comprises at least one of: a metal, a metallic material, a non-metallic material, a semiconducting material, an insulating material, an organic material, and an inorganic material.

11. The device of claim 10, wherein the orientation layer comprises a plurality of layers of the metallic material.

12. The device of claim 11, wherein the metallic material of at least one of the plurality of layers comprises a metal having a work function that is no more than about: 4 eV.

13. The device of claim 10, wherein the metallic material comprises an element selected from potassium (K), sodium (Na), lithium (Li), barium (Ba), cesium (Cs), ytterbium (Yb), silver (Ag), gold (Au), copper (Cu), aluminum (Al), magnesium (Mg), zinc (Zn), cadmium (Cd), tin (Sn), yttrium (Y), nickel (Ni), titanium (Ti), palladium (Pd), chromium (Cr), iron (Fe), cobalt (Co), zirconium (Zr), platinum (Pt), vanadium (V), niobium (Nb), iridium (Ir), osmium (Os), tantalum (Ta), molybdenum (Mo), and tungsten (W).

14. The device of claim 10, wherein the metallic material comprises a metal oxide.

15. The device of claim 1, wherein the orientation material comprises at least one of: silver (Ag), ytterbium (Yb), a magnesium-Ag alloy (MgAg), copper (Cu), fullerene, aluminum fluoride ($AlF_3$), and molybdenum trioxide ($MoO_3$).

16. The device of claim 1, wherein at least one of the orientation layer and the orientation material is electrically conductive.

17. The device of claim 1, wherein a sheet resistance of the orientation layer is at least one of at least about: 5Ω/□, 8Ω/□, 10Ω/□, 12Ω/□, 15Ω/□, 20Ω/□, 30Ω/□, 50Ω/□, 80Ω/□, and 100Ω/□.

18. The device of claim 1, wherein the at least one patterning layer is a nucleation inhibiting coating.

19. The device of claim 1, wherein the at least one patterning layer is a closed coating.

20. The device of claim 1, wherein the patterning material is substantially devoid of any chemical bonds with the orientation material.

21. The device of claim 1, wherein an interface between the at least one patterning layer and the orientation layer is substantially devoid of chemisorption between the patterning material and the orientation material.

22. The device of claim 1, wherein at least one of the at least one patterning layer and the patterning material has a contact angle with respect to tetradecane of at least one of at least about: 40°, 45°, 50°, 55°, 60°, 65°, and 70°.

23. The device of claim 1, wherein at least one of the at least one patterning layer and the patterning material has a contact angle with respect to water of at least one of no more than about: 15°, 10°, 8°, and 5°.

24. The device of claim 1, wherein the at least one patterning layer has a surface energy of at least one of no more than about: 25 dynes/cm, 21 dynes/cm, 20 dynes/cm, 19 dynes/cm, 18 dynes/cm, 17 dynes/cm, 16 dynes/cm, 15 dynes/cm, 14 dynes/cm, 13 dynes/cm, 12 dynes/cm, 11 dynes/cm, and 10 dynes/cm.

25. The device of claim 1, wherein the at least one patterning layer has a surface energy of at least one of at least about: 6 dynes/cm, 7 dynes/cm, and 8 dynes/cm.

26. The device of claim 1, wherein a surface energy of the orientation layer exceeds a surface energy of the at least one patterning layer.

27. The device of claim 1, wherein an average layer thickness of the patterning layer is at least one of no more than about: 10 nm, 8 nm, 7 nm, 6 nm, and 5 nm.

28. The device of claim 1, wherein an average layer thickness of the patterning layer is at least one of no less than about: 1 nm, 2 nm, 3 nm, 4 nm, and 5 nm.

29. The device of claim 1, wherein a refractive index of the at least one patterning layer is at least one of no more than about: 1.55, 1.5, 1.45, 1.43, 1.4, 1.39, 1.37, 1.35, 1.32, and 1.3.

30. The device of claim 1, wherein a refractive index of the at least one patterning layer is at least one of at least about: 1.35, 1.32, 1.3, and 1.25.

31. The device of claim 1, wherein the at least one patterning layer has a molecular weight of at least one of at least about: 1,200 g/mol, 1,300 g/mol, 1,500 g/mol, 1,700 g/mol, 2,000 g/mol, 2,200 g/mol, and 2,500 g/mol.

32. The device of claim 1, wherein the patterning material has a molecular weight of at least one of no more than about: 5,000 g/mol, 4,500 g/mol, 4,000 g/mol, 3,800 g/mol, and 3,500 g/mol.

33. The device of claim 1, wherein the patterning material has a glass transition temperature of at least one of no more than about: 20° C., 0° C., −20, −30° C., and −50° C.

34. The device of claim 1, wherein the patterning material has a glass transition temperature of at least one of at least about: 100° C., 110° C., 120° C., 130° C., 150° C., 170° C., and 200° C.

35. The device of claim 1, wherein the patterning material has a melting point at atmospheric pressure of at least one of at least about: 100° C., 120° C., 140° C., 160° C., 180° C., and 200° C.

36. The device of claim 1, wherein the patterning material has a sublimation temperature in high vacuum of at least one of between about: 100-320° C., 120-300° C., 140-280° C., and 150-250° C.

37. The device of claim 1, wherein a monomer of the patterning material comprises a monomer backbone and at least one functional group.

38. The device of claim 37, wherein the at least one functional group is bonded to the monomer backbone.

39. The device of claim 38, wherein the monomer comprises at least one linker group bonded to the monomer backbone and the at least one functional group.

40. The device of claim 1, wherein the patterning material comprises an organic-inorganic hybrid material.

41. The device of claim 1, wherein the patterning material comprises at least one of: an oligomer, and a polymer.

42. The device of claim 1, wherein the patterning material comprises a compound having a molecular structure comprising a plurality of moieties.

43. The device of claim 42, wherein a first moiety of the molecular structure of the patterning material is bonded to at least one second moiety thereof.

44. The device of claim 43, wherein the first moiety is bonded to the second moiety by a third moiety.

45. The device of claim 43, wherein a majority of molecules of the patterning material in the at least one patterning layer are oriented such that the first moiety thereof is proximate to an exposed layer surface of the orientation layer and at least one of the at least one second moiety thereof and a terminal group thereof is proximate to an exposed layer surface of the at least one patterning layer.

46. The device of claim 43, wherein a molecule of the patterning material in the at least one patterning layer is oriented such that the first moiety thereof is proximate to an exposed layer surface of the orientation layer and at least one of the at least one second moiety and a terminal group thereof is proximate to an exposed layer surface of the at least one patterning layer, wherein the first moiety has a substantially planar structure defining a plane.

47. The device of claim 46, wherein, when so oriented, the plane of the structure lies substantially parallel to an interface between the orientation layer and the at least one patterning layer.

48. The device of claim 46, wherein, when so oriented, the second moiety is configurable to lie out of plane with respect to the plane of the structure.

49. The device of claim 42, wherein the first moiety has a critical surface tension that exceeds a critical surface tension of the at least one second moiety.

50. The device of claim 43, wherein a quotient of the critical surface tension of the first moiety divided by the critical surface tension of the second moiety is at least one of at least about: 5, 7, 8, 9, 10, 12, 15, 18, 20, 30, 50, 60,80, and 100.

51. The device of claim 43, wherein the critical surface tension of the first moiety exceeds the critical surface tension of the at least one second moiety by at least one of at least about: 50 dynes/cm, 70 dynes/cm, 80 dynes/cm, 100 dynes/cm, 150 dynes/cm, 200 dynes/cm, 250 dynes/cm, 300 dynes/cm, 350 dynes/cm, and 500 dynes/cm.

52. The device of claim 43, wherein the critical surface tension of the first moiety is at least one of at least about: 50 dynes/cm, 70 dynes/cm, 80 dynes/cm, 100 dynes/cm, 150 dynes/cm, 180 dynes/cm, 200 dynes/cm, 250 dynes/cm, and 300 dynes/cm.

53. The device of claim 43, wherein a molecular weight attributable to the first moiety is at least one of at least about: 50 g/mol, 60 g/mol, 70 g/mol, 80 g/mol, 100 g/mol, 120 g/mol, 150 g/mol, and 200 g/mol.

54. The device of claim 43, wherein a molecular weight attributable to the first moiety is at least one of no more than about: 500 g/mol, 400 g/mol, 350 g/mol, 300 g/mol, 250 g/mol, 200 g/mol, 180 g/mol, and 150 g/mol.

55. The device of claim 43, wherein the first moiety comprises at least one of: an aryl group, a heteroaryl group, a conjugated bond, and a phosphazene group.

56. The device of claim 43, wherein the first moiety comprises at least one of: a cyclic structure, a cyclic aromatic structure, an aromatic structure, a caged structure, a polyhedral structure, and a cross-linked structure.

57. The device of claim 43, wherein the first moiety comprises at least one of: a benzene moiety, a naphthalene moiety, a pyrene moiety, and an anthracene moiety.

58. The device of claim 43, wherein the first moiety comprises at least one of: a cyclotriphosphazene moiety and a cyclotetraphosphazene moiety.

59. The device of claim 43, wherein the first moiety is a hydrophilic moiety.

60. The device of claim 43, wherein the critical surface tension of the at least one second moiety is at least one of no more than about: 25 dynes/cm, 21 dynes/cm, 20 dynes/cm, 19 dynes/cm, 18 dynes/cm, 17 dynes/cm, 16 dynes/cm, 15 dynes/cm, 14 dynes/cm, 13 dynes/cm, 12 dynes/cm, 11 dynes/cm, and 10 dynes/cm.

61. The device of claim 43, wherein the at least one second moiety comprises at least one of F and Si.

62. The device of claim 43, wherein the at least one second moiety comprises at least one of a substituted and an unsubstituted fluoroalkyl group.

63. The device of claim 43, wherein the at least one second moiety comprises at least one of: $C_1$-$C_{12}$ linear fluorinated alkyl, $C_1$-$C_{12}$ linear fluorinated alkoxy, $C_3$-$C_{12}$ branched fluorinated cyclic alkyl, $C_3$-$C_{12}$ fluorinated cyclic alkyl, and $C_3$-$C_{12}$ fluorinated cyclic alkoxy.

64. The device of claim 43, wherein the at least one second moiety comprises a siloxane group.

65. The device of claim 43, wherein each moiety of the at least one second moiety comprises a proximal group, bonded to at least one of the first moiety and the third moiety, and a terminal group arranged distal to the proximal group.

66. The device of claim 65, wherein the terminal group comprises at least one of: a $CF_2H$ group, a $CF_3$ group, and a $CH_2CF_3$ group.

67. The device of claim 43, wherein each of the at least one second moieties comprises at least one of: a linear fluoroalkyl group, and a linear fluoroalkoxy group.

68. The device of claim 43, wherein a sum of a molecular weight of each of the at least one second moieties in a compound structure is at least one of at least about: 1,200 g/mol, 1,500 g/mol, 1,700 g/mol, 2,000 g/mol, 2,500 g/mol, and 3,000 g/mol.

69. The device of claim 43, wherein the at least one second moiety comprises a hydrophobic moiety.

70. The device of claim 44, wherein the third moiety is a linker group.

71. The device of claim 44, wherein the third moiety is at least one of: a single bond, O, N, NH, C, CH, $CH_2$, and S.

72. The device of claim 43, wherein the patterning material comprises a cyclophosphazene derivative represented by at least one of Formula (C-2) and (C-3):

Formula (C-2)

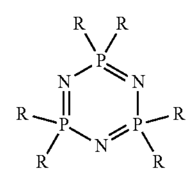

Formula (C-3)

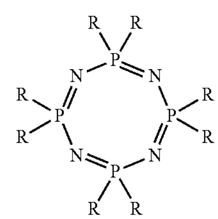

where:

R each independently represents and/or comprises, the second moiety.

73. The device of claim 72, wherein R comprises a fluoroalkyl group.

74. The device of claim 73, wherein the fluoroalkyl group is a $C_1$-$C_{18}$ fluoroalkyl.

75. The device of claim 73, wherein the fluoroalkyl group is represented by the formula:

$$*\text{—}(CH_2)_t(CF_2)_uZ$$

where:

t represents an integer between 1 and 3;

u represents an integer between 5 and 12; and

Z represents at least one of H, deutero (D), and F.

76. The device of claim 1, wherein a minimum value of a range of an average layer thickness of the at least one patterning layer is at least one of at least about: 1 nm, 2 nm, 3 nm, 4 nm, and 5 nm.

77. The device of claim 1, wherein a maximum value of a range of an average layer thickness of the at least one patterning layer is at least one of no more than about: 5 nm, 6 nm, 7 nm, 8 nm, and 10 nm.

78. The device of claim 1, wherein at least one of the at least one patterning layer and the patterning material has an initial sticking probability against deposition of the deposited material, that is at least one of no more than about: 0.3, 0.2, 0.15, 0.1, 0.08, 0.05, 0.03, 0.02, 0.01, 0.008, 0.005, 0.003, 0.001, 0.0008, 0.0005, 0.0003, and 0.0001.

79. The device of claim 1, wherein an average layer thickness of the deposited layer is at least one of at least about: 10 nm, 20 nm, 30 nm, 40 nm, 50 nm, 60 nm, 70 nm, 80 nm, 90 nm, and 100 nm.

80. The device of claim 1, wherein the deposited material comprises at least one common metal as a metallic material of which the orientation material is comprised.

81. The device of claim 1, wherein the deposited material comprises an element selected from at least one of potassium (K), sodium (Na), lithium (Li), barium (Ba), cesium (Cs), ytterbium (Yb), silver (Ag), gold (Au), copper (Cu), aluminum (Al), magnesium (Mg), zinc (Zn), cadmium (Cd), tin (Sn), and yttrium (Y).

82. The device of claim 1, wherein the deposited material comprises an alloy.

* * * * *